US011910707B2

(12) United States Patent
Kim et al.

(10) Patent No.: US 11,910,707 B2
(45) Date of Patent: Feb. 20, 2024

(54) ORGANIC LIGHT-EMITTING DEVICE

(71) Applicant: Samsung Display Co., Ltd., Yongin-si (KR)

(72) Inventors: Myeong-Suk Kim, Yongin-si (KR); Sung-Wook Kim, Yongin-si (KR); Hwan-Hee Cho, Yongin-si (KR); Jin-Soo Hwang, Yongin-si (KR); Chang-Woong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/390,210

(22) Filed: Dec. 23, 2016

(65) Prior Publication Data

US 2017/0186969 A1 Jun. 29, 2017

(30) Foreign Application Priority Data

Dec. 23, 2015 (KR) ........................ 10-2015-0185104
Dec. 23, 2016 (KR) ........................ 10-2016-0177749

(51) Int. Cl.
*H01L 51/54* (2006.01)
*H10K 85/60* (2023.01)
(Continued)

(52) U.S. Cl.
CPC .......... *H10K 85/654* (2023.02); *C09K 11/025* (2013.01); *H10K 85/615* (2023.02);
(Continued)

(58) Field of Classification Search
CPC ... C09K 11/025; C09K 11/06; C09K 2211/00; C09K 2211/10; C09K 2211/1007;
(Continued)

(56) References Cited

U.S. PATENT DOCUMENTS 5,840,217 A 11/1998 Lupo et al.
6,911,551 B2 6/2005 Stössel et al.
(Continued)

FOREIGN PATENT DOCUMENTS

CN 101535256 A 9/2009
CN 102668157 A 9/2012
(Continued)

OTHER PUBLICATIONS

Concise Description of Relevance of the Third-Party Submission, submitted in U.S. Appl. No. 14/856,487, 9 pages.
(Continued)

Primary Examiner — Andrew K Bohaty
(74) Attorney, Agent, or Firm — Lewis Roca Rothgerber Christie LLP

(57) ABSTRACT

According to one or more embodiments, an organic light-emitting device includes: a first electrode; a second electrode; and an organic layer between the first electrode and the second electrode, the organic layer including an emission layer. The organic layer includes a first compound represented by Formula 1 and a second compound represented by one selected from Formulae 2-1 to 2-3:

Formula 1

Formula 2-1

Formula 2-2

(Continued)

-continued

Formula 2-3

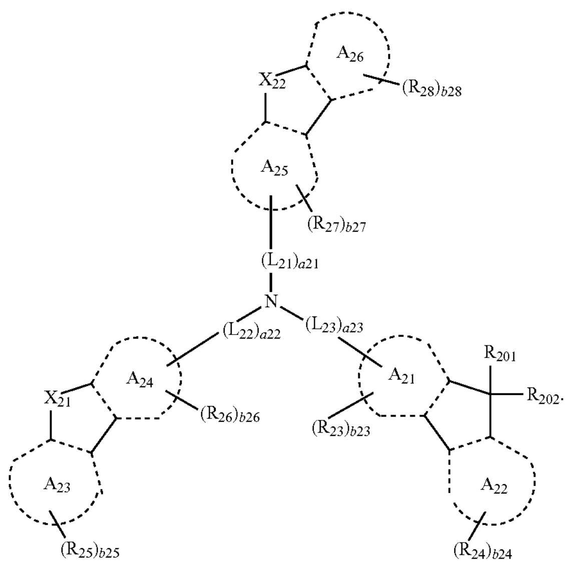

4 Claims, 3 Drawing Sheets

(51) Int. Cl.
*C09K 11/02* (2006.01)
*H10K 50/11* (2023.01)
*H10K 101/10* (2023.01)
*H10K 101/40* (2023.01)

(52) U.S. Cl.
CPC ......... *H10K 85/633* (2023.02); *H10K 85/636* (2023.02); *H10K 85/6572* (2023.02); *H10K 85/6574* (2023.02); *H10K 85/6576* (2023.02); *H10K 50/11* (2023.02); *H10K 2101/10* (2023.02); *H10K 2101/40* (2023.02)

(58) Field of Classification Search
CPC .... C09K 2211/1029; C09K 2211/1044; H01L 51/0032; H01L 51/005; H01L 51/0052; H01L 51/006; H01L 51/0061; H01L 51/0058; H01L 51/0067; H01L 51/0071; H01L 51/0072; H01L 51/0073; H01L 51/0074; H01L 51/50; H01L 51/5012; H01L 51/5016; H01L 51/5056; H01L 27/3211; H01L 2251/5384
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS 7,663,304 B2 2/2010 Fukuoka et al.
7,956,531 B2 * 6/2011 Smith ................ H01L 27/3204 313/505
8,394,510 B2 3/2013 Mizuki et al.
8,679,647 B2 3/2014 Pflumm et al.
8,841,655 B2 9/2014 Okamoto
8,865,323 B2 10/2014 Inoue et al.
8,890,126 B2 11/2014 Ryu et al.
8,932,732 B2 1/2015 Buesing et al.
9,040,172 B2 5/2015 Parham et al.
9,070,885 B2 6/2015 Ono
9,203,043 B2 12/2015 Nishimura et al.
9,831,439 B2 11/2017 Kim et al.
9,871,208 B2 1/2018 Lee et al.
9,972,789 B2 5/2018 Cho et al.
10,622,565 B2 4/2020 Parham et al.
10,818,846 B2 10/2020 Kim et al.
10,930,853 B2 2/2021 Kim et al.
2002/0098379 A1 7/2002 Arakane et al.
2003/0160564 A1 8/2003 Park et al.
2005/0106419 A1 * 5/2005 Endoh ................ H01L 51/5048 428/690
2006/0055305 A1 3/2006 Funahashi et al.
2006/0088728 A1 4/2006 Kwong et al.
2006/0220535 A1 * 10/2006 Nakayama .......... H01L 51/5092 313/504
2007/0231555 A1 10/2007 Tsuji
2007/0252516 A1 11/2007 Kondakova et al.
2008/0124572 A1 5/2008 Mizuki et al.
2009/0309487 A1 12/2009 Royster, Jr. et al.
2010/0001636 A1 1/2010 Yabunouchi
2010/0012931 A1 1/2010 Kato et al.
2010/0046336 A1 2/2010 Takahashi et al.
2010/0187977 A1 7/2010 Kai et al.
2011/0037062 A1 2/2011 Fukumatsu et al.
2011/0248246 A1 10/2011 Ogita et al.
2011/0278555 A1 11/2011 Inoue et al.
2011/0279020 A1 11/2011 Inoue et al.
2012/0001165 A1 1/2012 Komori et al.
2012/0068170 A1 3/2012 Pflumm et al.
2012/0091885 A1 4/2012 Kim et al.
2012/0112169 A1 5/2012 Mizuki et al.
2012/0112174 A1 5/2012 Lee et al.
2012/0138915 A1 6/2012 Nishimura et al.
2012/0153272 A1 6/2012 Fukuzaki
2012/0181518 A1 7/2012 Ogiwara et al.
2012/0203010 A1 8/2012 Matsumoto et al.
2012/0235123 A1 * 9/2012 Lee .................... H01L 51/0072 257/40
2012/0256123 A1 10/2012 Cho et al.
2012/0273764 A1 11/2012 Yu et al.
2012/0305898 A1 12/2012 Okamoto
2013/0075716 A1 3/2013 Nishimura et al.
2013/0105771 A1 5/2013 Ryu et al.
2013/0119354 A1 5/2013 Ma et al.
2013/0256634 A1 10/2013 Cho et al.
2013/0292665 A1 11/2013 Ono
2013/0313536 A1 11/2013 Nishimura et al.
2014/0001446 A1 1/2014 Mizuki et al.
2014/0034943 A1 2/2014 Mizuki et al.
2014/0048784 A1 2/2014 Inoue et al.
2014/0054564 A1 2/2014 Kim et al.
2014/0061609 A1 3/2014 Kim et al.
2014/0070204 A1 3/2014 Nagao et al.
2014/0084270 A1 3/2014 Kato et al.
2014/0131665 A1 5/2014 Xia et al.
2014/0197386 A1 7/2014 Kim et al.
2014/0217393 A1 8/2014 Kato et al.
2014/0225046 A1 8/2014 Jatsch et al.
2014/0275530 A1 9/2014 Jatsch et al.
2014/0299865 A1 * 10/2014 Nishimura .......... H01L 51/0067 257/40
2014/0306207 A1 10/2014 Nishimura et al.
2014/0312331 A1 10/2014 Inoue et al.
2014/0312338 A1 10/2014 Mizutani et al.
2014/0326985 A1 11/2014 Mizuki et al.
2014/0367649 A1 12/2014 Cho et al.
2014/0374711 A1 12/2014 Cho et al.
2015/0001488 A1 1/2015 Min et al.
2015/0060796 A1 3/2015 Kim et al.
2015/0065730 A1 3/2015 Montenegro et al.
2015/0069352 A1 3/2015 Kim et al.
2015/0102301 A1 4/2015 Cho et al.
2015/0115239 A1 4/2015 Pflumm et al.
2015/0155498 A1 6/2015 Ahn et al.
2015/0179953 A1 6/2015 Mujica-Fernaud et al.

(56) References Cited

U.S. PATENT DOCUMENTS

| | | | |
|---|---|---|---|
| 2015/0194622 | A1 | 7/2015 | Yamamoto et al. |
| 2015/0207079 | A1 | 7/2015 | Cho et al. |
| 2015/0236262 | A1 | 8/2015 | Cho et al. |
| 2015/0243897 | A1 | 8/2015 | Montenegro et al. |
| 2015/0280136 | A1 | 10/2015 | Ryu et al. |
| 2015/0303379 | A1 | 10/2015 | Lee et al. |
| 2015/0325795 | A1 | 11/2015 | Lee et al. |
| 2015/0325800 | A1 | 11/2015 | Ito et al. |
| 2015/0349270 | A1 | 12/2015 | Lee et al. |
| 2016/0149139 | A1 | 5/2016 | Xia et al. |
| 2016/0197289 | A1 | 7/2016 | Sado et al. |
| 2016/0260909 | A1 | 9/2016 | Dyatkin et al. |
| 2017/0047527 | A1 | 2/2017 | Lee et al. |
| 2017/0084844 | A1 | 3/2017 | Parham et al. |
| 2017/0117488 | A1 | 4/2017 | Ahn et al. |
| 2017/0207396 | A1 | 7/2017 | Park et al. |
| 2018/0130968 | A1 | 5/2018 | Ikeda |

FOREIGN PATENT DOCUMENTS

| | | | |
|---|---|---|---|
| CN | 102858912 | A | 1/2013 |
| CN | 103328420 | A | 9/2013 |
| CN | 104795503 | A | 7/2015 |
| CN | 104860883 | A | 8/2015 |
| CN | 104903421 | A | 9/2015 |
| CN | 105051011 | A | 11/2015 |
| JP | 2010-34548 | A | 2/2010 |
| JP | 2012-156499 | A | 8/2012 |
| JP | 2014-216576 | A | 11/2014 |
| JP | 2015-167150 | A | 9/2015 |
| KR | 10-2003-0071617 | A | 9/2003 |
| KR | 10-2005-0085046 | A | 8/2005 |
| KR | 10-2005-0086729 | A | 8/2005 |
| KR | 10-2009-0073260 | A | 7/2009 |
| KR | 10-2009-0086057 | | 8/2009 |
| KR | 10-2010-0105099 | A | 9/2010 |
| KR | 10-2011-0007124 | A | 1/2011 |
| KR | 10-2011-0011647 | A | 2/2011 |
| KR | 10-2011-0015836 | | 2/2011 |
| KR | 10-2011-0066766 | A | 6/2011 |
| KR | 10-2011-0071127 | A | 6/2011 |
| KR | 10-2011-0118542 | A | 10/2011 |
| KR | 10-2012-0032572 | A | 4/2012 |
| KR | 10-2012-0038374 | A | 4/2012 |
| KR | 10-2012-0042633 | A | 5/2012 |
| KR | 10-2012-0047706 | A | 5/2012 |
| KR | 10-2012-0057611 | A | 6/2012 |
| KR | 10-2012-0088752 | A | 8/2012 |
| KR | 10-2012-0092550 | A | 8/2012 |
| KR | 10-2012-0127746 | A | 11/2012 |
| KR | 10-2013-0039671 | A | 4/2013 |
| KR | 10-2013-0054205 | A | 5/2013 |
| KR | 10-2013-0109471 | | 10/2013 |
| KR | 10-2013-0115027 | A | 10/2013 |
| KR | 10-2013-0118059 | A | 10/2013 |
| KR | 10-2014-0000259 | A | 1/2014 |
| KR | 10-2014-0006000 | A | 1/2014 |
| KR | 10-2014-0031213 | A | 3/2014 |
| KR | 10-2014-0069199 | A | 6/2014 |
| KR | 10-2014-0073406 | | 6/2014 |
| KR | 10-2014-0073412 | | 6/2014 |
| KR | 10-2014-0074286 | A | 6/2014 |
| KR | 10-2014-0081879 | A | 7/2014 |
| KR | 10-2014-0087883 | A | 7/2014 |
| KR | 10-2014-0092332 | | 7/2014 |
| KR | 10-2014-0094520 | A | 7/2014 |
| KR | 10-2014-0095072 | A | 7/2014 |
| KR | 10-2014-0095491 | A | 8/2014 |
| KR | 10-2014-0096203 | A | 8/2014 |
| KR | 10-2014-0104895 | A | 8/2014 |
| KR | 10-1427605 | B1 | 8/2014 |
| KR | 10-2014-0108637 | | 9/2014 |
| KR | 10-2014-0124654 | A | 10/2014 |
| KR | 10-2014-0133572 | A | 11/2014 |
| KR | 10-2014-0145456 | A | 12/2014 |
| KR | 10-2014-0145887 | A | 12/2014 |
| KR | 10-2014-0145888 | A | 12/2014 |
| KR | 10-2014-0146103 | A | 12/2014 |
| KR | 10-1476231 | B1 | 12/2014 |
| KR | 10-2015-0001101 | A | 1/2015 |
| KR | 10-2015-0006199 | A | 1/2015 |
| KR | 10-2015-0007476 | A | 1/2015 |
| KR | 10-2015-0024735 | A | 3/2015 |
| KR | 10-2015-0034333 | A | 4/2015 |
| KR | 10-2015-0036721 | A | 4/2015 |
| KR | 10-2015-0041652 | A | 4/2015 |
| KR | 10-2015-0042603 | A | 4/2015 |
| KR | 10-2015-0068776 | A | 6/2015 |
| KR | 10-2015-0086721 | | 7/2015 |
| KR | 10-2015-0096593 | A | 8/2015 |
| KR | 10-2015-0124886 | A | 11/2015 |
| WO | WO 2010/107244 | A2 | 9/2010 |
| WO | WO 2010/131855 | A2 | 11/2010 |
| WO | 2011/065136 | A1 | 6/2011 |
| WO | WO 2011/081423 | A2 | 7/2011 |
| WO | 2011/132683 | A1 | 10/2011 |
| WO | 2012/013271 | A1 | 2/2012 |
| WO | WO 2012/026780 | A1 | 3/2012 |
| WO | WO 2012/070233 | A1 | 5/2012 |
| WO | WO 2013/013271 | A1 | 1/2013 |
| WO | WO 2013/088973 | A1 | 6/2013 |
| WO | 2013105747 | A1 | 7/2013 |
| WO | WO 2013/120577 | A1 | 8/2013 |
| WO | WO 2013/157886 | A1 | 10/2013 |
| WO | 2013/187894 | A1 | 12/2013 |
| WO | WO 2014/088284 | A1 | 6/2014 |
| WO | WO 2014/097711 | A1 | 6/2014 |
| WO | WO 2014/141725 | A1 | 9/2014 |
| WO | WO 2015/046916 | A1 | 4/2015 |
| WO | WO 2015/050391 | A1 | 4/2015 |
| WO | 2015/084114 | A1 | 6/2015 |
| WO | WO 2015/082056 | A1 | 6/2015 |
| WO | WO 2015/135625 | A1 | 9/2015 |
| WO | WO 2015/156587 | A1 | 10/2015 |
| WO | WO 2015/167199 | A1 | 11/2015 |
| WO | WO 2015/167259 | A1 | 11/2015 |
| WO | WO 2015/169412 | A1 | 11/2015 |
| WO | 2016/013875 | A1 | 1/2016 |

OTHER PUBLICATIONS

Machine Translation of JP 2010-034548 A. Feb. 12, 2010. (Year: 2010).

Yersin, H., "Highly Efficient OLEDs with Phosphorescent Materials," WILEY-VCH Verlag GmbH & Co. 2008. pp. 311-328.

U.S. Office Action dated Aug. 17, 2017, issued in U.S. Appl. No. 15/183,627 (22 pages).

U.S. Office Action dated Nov. 3, 2017, issued in U.S. Appl. No. 14/856,487 (28 pages).

U.S. Final Office Action dated Dec. 15, 2017, issued in U.S. Appl. No. 15/183,627 (12 pages).

U.S. Office Action dated Apr. 6, 2018, issued in U.S. Appl. No. 15/390,294 (13 pages).

U.S. Office Action dated May 24, 2018, issued in U.S. Appl. No. 15/273,515 (11 pages).

U.S. Advisory Action dated Jun. 14, 2018, issued in U.S. Appl. No. 14/856,487 (4 pages).

U.S. Office Action dated Jul. 17, 2018, issued in U.S. Appl. No. 15/183,627 (14 pages).

EPO Extended Search Report dated Jul. 26, 2017, corresponding to European Patent Application No. 17150355.0 (7 pages).

U.S. Office Action dated Aug. 7, 2018, issued in U.S. Appl. No. 15/293,174 (14 pages).

U.S. Office Action dated Oct. 4, 2018, issued in U.S. Appl. No. 15/182,298 (12 pages).

U.S. Office Action dated Oct. 4, 2018, issued in U.S. Appl. No. 15/372,042 (22 pages).

Machine translation of W0 2011-081423. (Year: 2011).

U.S. Final Office Action dated Jan. 17, 2019, issued in U.S. Appl. No. 15/293,174 (11 pages).

(56) References Cited

OTHER PUBLICATIONS

U.S. Office Action dated Apr. 3, 2019, issued in U.S. Appl. No. 15/273,515 (12 pages).
U.S. Final Office Action dated Apr. 5, 2019, issued in U.S. Appl. No. 14/856,487 (29 pages).
U.S. Office Action dated Apr. 15, 2019, issued in U.S. Appl. No. 15/293,174 (10 pages).
Cosimbescu, Lelia, et al. "Electron Transport Materials: Synthesis, Properties and Device Performance", International Journal of Organic Chemistry, vol. 2, (Year: 2012) 10 pages.
Hu, Jian-Yong, et al.; Synthesis and Photophysical Properties of Pyrene-Based Multiply Conjugated Shaped Light-Emitting Architectures: Toward Efficient Organic-Light Emitting Diodes, InTech Chapter 2, pp. 21-60, dated Jul. 27, 2011.
Office Action issued in U.S. Appl. No. 15/183,627 by the USPTO, dated Dec. 13, 2019, 15 pages.
Office Action issued in U.S. Appl. No. 15/273,515 by the USPTO, dated Jan. 22, 2020, 10 pages.
U.S. Office Action dated Apr. 3, 2020, issued in U.S. Appl. No. 14/856,487 (43 pages).
U.S. Final Office Action dated Jun. 8, 2020, issued in U.S. Appl. No. 15/273,515 (12 pages).
U.S. Office Action dated Nov. 18, 2020, issued in U.S. Appl. No. 15/372,042 (34 pages).
U.S. Final Office Action dated Oct. 16, 2020, issued in U.S. Appl. No. 14/856,487 (35 pages).
Machine translation of WO 2013105747. (Year: 2013).
U.S. Office Action dated Dec. 18, 2020, issued in U.S. Appl. No. 15/273,515 (11 pages).
EPO Office Action dated Mar. 11 2021, issued in European Patent Application No. 17150355.0 (4 pages).
Office Action dated Apr. 29, 2021, issued in U.S. Appl. No. 16/866,460 (14 pages).
U.S. Final Office Action dated May 13, 2021, issued in U.S. Appl. No. 15/273,515 (13 pages).
U.S. Office Action dated Aug. 4, 2021, issued in U.S. Appl. No. 15/273,515 (10 pages).
U.S. Office Action dated Oct. 5, 2021, issued in U.S. Appl. No. 14/856,487 (28 pages).
U.S. Final Office Action dated Jan. 5, 2022, issued in U.S. Appl. No. 15/273,515 (10 pages).
Advisory Action for U.S. Appl. No. 14/856,487, dated Dec. 30, 2020 (6 pages).
Office Action for U.S. Appl. No. 14/856,487, dated Apr. 14, 2022 (18 pages).
Office Action for U.S. Appl. No. 15/273,515, dated Apr. 27, 2022 (10 pages).
Shin et al. "A New N-flourenyl Carbazole Host Material: Synthesis, Physical Properties and Applications for Highly Efficient Phosphorescent Organic Light Emitting Diodes," Organic Electronics 2011, 12(5), 785-793.
U.S. Advisory Action for U.S. Appl. No. 14/856,487, dated Jul. 11, 2022, 4 pages.
U.S. Advisory Action for U.S. Appl. No. 15/293,174, dated Mar. 25, 2019, 3 pages.
U.S. Advisory Action for U.S. Appl. No. 16/866,460, dated Dec. 24, 2020, 3 pages.
U.S. Advisory Action for U.S. Appl. No. 14/856,487, dated Dec. 30, 2020, 6 pages.
U.S. Advisory Action for U.S. Appl. No. 15/182,298, dated Apr. 26, 2019, 2 pages.
U.S. Advisory Action for U.S. Appl. No. 15/183,627, dated Feb. 28, 2018, 4 pages.
U.S. Advisory Action for U.S. Appl. No. 15/183,627, dated Feb. 26, 2020, 5 pages.
U.S. Advisory Action for U.S. Appl. No. 15/183,627, dated Mar. 25, 2019, 6 pages.
U.S. Advisory Action for U.S. Appl. No. 15/273,515, dated Aug. 18, 2020, 3 pages.
U.S. Advisory Action for U.S. Appl. No. 15/273,515, dated Feb. 14, 2019, 3 pages.
U.S. Advisory Action for U.S. Appl. No. 15/273,515, dated Mar. 8, 2022, 3 pages.
U.S. Advisory Action for U.S. Appl. No. 15/273,515, dated Nov. 1, 2019, 3 pages.
U.S. Advisory Action for U.S. Appl. No. 15/372,042, dated Jul. 31, 2020, 3 pages.
U.S. Advisory Action for U.S. Appl. No. 15/372,042, dated May 14, 2019, 3 pages.
U.S. Notice of Allowance for U.S. Appl. No. 16/866,460, dated Jun. 16, 2022, 5 pages.
U.S Notice of Allowance for U.S. Appl. No. 16/866,460, dated Mar. 3, 2022, 5 pages.
U.S. Notice of Allowance for U.S. Appl. No. 16/866,460, dated Nov. 24, 2021, 8 pages.
U.S. Notice of Allowance for U.S. Appl. No. 15/182,298, dated Jun. 24, 2020, 5 pages.
U.S. Notice of Allowance for U.S. Appl. No. 15/182,298, dated Mar. 17, 2020, 5 pages.
U.S. Notice of Allowance for U.S. Appl. No. 15/182,298, dated Nov. 26, 2019, 8 pages.
U.S. Notice of Allowance for U.S. Appl. No. 15/182,298, dated Oct. 15, 2020, 5 pages.
U.S. Notice of Allowance for U.S. Appl. No. 15/293,174, dated Aug. 6, 2019, 8 pages.
U.S, Notice of Allowance for U.S. Appl. No. 15/293,174, dated Feb. 7, 2022, 8 pages.
U.S. Notice of Allowance for U.S. Appl. No. 15/293,174, dated Jan. 23, 2020, 8 pages.
U.S. Notice of Allowance for Application No. 15/293,174, dated Jul. 21, 2020, 8 pages.
U.S. Notice of Allowance for U.S. Appl. No. 15/293,174, dated Jan. 25, 2021, 8 pages.
U.S. Notice of Allowance for U.S. Appl. No. 15/293,174, dated Jun. 10, 2021, 8 pages.
U.S. Notice of Allowance for U.S. Appl. No. 15/293,174, dated May 5, 2020, 8 pages.
U.S. Notice of Allowance for U.S. Appl. No. 15/293,174, dated May 18, 2022, 8 pages.
U.S. Notice of Allowance for U.S. Appl. No. 15/293,174, dated Oct. 17, 2019, 8 pages.
U.S. Notice of Allowance for U.S. Appl. No. 15/293,174, dated Oct. 5, 2021, 8 pages.
U.S. Office Action for U.S. Appl. No. 16/866,460 dated Nov. 10, 2020, 29 pages.
U.S. Office Action for U.S. Appl. No. 16/866,460, dated Jun. 12, 2020, 13 pages.
U.S. Office Action for U.S. Appl. No. 16/866,460, dated Oct. 8, 2021, 7 pages.
U.S. Office Action for U.S. Appl. No. 14/856,487, dated Mar. 15, 2018, 20 pages.
U.S. Office Action for U.S. Appl. No. 14/856,487, dated Sep. 11, 2018, 18 pages.
U.S. Office Action for U.S. Appl. No. 15/182,298, dated Feb. 15, 2019, 11 pages.
U.S. Office Action for U.S. Appl. No. 15/182,298, dated Jun. 17, 2019, 11 pages.
U.S Office Action for U.S. Appl. No. 15/183,627, dated Jan. 14, 2019, 12 pages.
U.S. Office Action for U.S. Appl. No. 15/183,627, dated Jun. 23, 2020, 13 pages.
U.S. Office Action for U.S. Appl. No. 15/183,627, dated Nov. 23, 2020, 10 pages.
U.S. Office Action for U.S. Appl. No. 15/273,515, dated Nov. 21, 2018, 13 pages.
U.S. Office Action for U.S. Appl. No. 15/273,515, dated Sep. 12, 2019, 12 pages.
U.S. Office Action for U.S. Appl. No. 15/372,042, dated Jun. 9, 2021, 17 pages.
U.S. Office Action for U.S. Appl. No. 15/372,042, dated Mar. 7, 2019, 27 pages.

(56) References Cited

OTHER PUBLICATIONS

U.S. Office Action for U.S. Appl. No. 15/372,042, dated May 12, 2020, 19 pages.
U.S. Office Action for U.S. Appl. No. 15/372,042, dated Nov. 15, 2019, 20 pages.
U.S. Office Action for U.S. Appl. No. 17/155,893, dated May 9, 2022, 12 pages.
U.S. Restriction Requirement for U.S. Appl. No. 15/182,298, dated May 14, 2018, 5 pages.
Advisory Action for U.S. Appl. No. 17/155,893 dated Nov. 1, 2022, 3 pages.
Final Office Action for U.S. Appl. No. 17/155,893 dated Aug. 25, 2022, 11 pages.
Final Office Action for U.S. Appl. No. 15/273,515 dated Oct. 6, 2022, 11 pages.
Notice of Allowance for U.S. Appl. No. 15/293,174 dated Sep. 7, 2022, 5 pages.
Notice of Allowance for U.S. Appl. No. 16/866,460 dated Oct. 17, 2022, 5 pages.
Office Action for U.S. Appl. No. 14/856,487 dated Dec. 1, 2022, 29 pages.
Advisory Action for U.S. Appl. No. 15/273,515 dated Dec. 14, 2022, 3 pages.
Notice of Allowance for U.S. Appl. No. 15/293,174 dated Jan. 12, 2023, 5 pages.
Office Action for U.S. Appl. No. 17/155,893 dated Dec. 20, 2022, 12 pages.
Office Action for U.S. Appl. No. 17/177,049 dated Dec. 27, 2022, 18 pages.
U.S. Office Action dated Mar. 2, 2023, issued in U.S. Appl. No. 15/273,515 (10 pages).
Ahn et al. The positional effect of arylamines on pyrene core in a blue fluorescent dopant significantly affecting the performance of organic light emitting diodes. Dyes and Pigments, 2022, 205, 110505. (Year: 2022).
Cho et al. Anthracene-dibenzofuran based electron transport type hosts for long lifetime multiple resonance pure blue OLEDs. Organic Electronics, 2022, 105, 106501. (Year: 2022).
U.S. Final Office Action dated Jun. 9, 2023, issued in U.S. Appl. No. 17/177,049 (13 pages).
U.S. Final Office Action dated Jun. 14, 2023, issued in U.S. Appl. No. 14/856,487 (30 pages).
Application JP2015-139245. filed Jul. 10, 2015. (Year: 2015).
Machine Translation of Application JP2015-139245. filed Jul. 10, 2015. (Year: 2015).
U.S. Final Office Action dated Aug. 30, 2023, issued in U.S. Appl. No. 15/273,515 (11 pages).
U.S. Advisory Action dated Aug. 31, 2023, issued in U.S. Appl. No. 14/856,487 (4 pages).
U.S. Office Action dated Sep. 19, 2023, issued in U.S. Appl. No. 17/177,049 (14 pages).
U.S. Office Action dated Nov. 24, 2023, issued in U.S. Appl. No. 15/273,515 (10 pages).

* cited by examiner

ORGANIC LIGHT-EMITTING DEVICE

CROSS-REFERENCE TO RELATED APPLICATIONS

This application claims priority to and the benefit of Korean Patent Applications No. 10-2015-0185104, filed on Dec. 23, 2015, and 10-2016-0177749, filed on Dec. 23, 2016, in the Korean Intellectual Property Office, the disclosure of which is incorporated herein in its entirety by reference.

BACKGROUND

1. Field

One or more embodiments of the present disclosure relate to an organic light-emitting device.

2. Description of the Related Art

Organic light-emitting devices are self-emission devices that have wide viewing angles, high contrast ratios, short response times, and/or excellent luminance, driving voltage, and/or response speed characteristics, and may produce full color images.

For example, an organic light-emitting device may include a first electrode on a substrate, and a hole transport region, an emission layer, an electron transport region, and a second electrode, which are sequentially formed on the first electrode. Holes injected from the first electrode may move toward the emission layer through the hole transport region, and electrons injected from the second electrode may move toward the emission layer through the electron transport region. Carriers, such as the holes and the electrons, may then recombine in the emission layer to generate excitons. When the excitons drop from an excited state to a ground state, light is emitted.

SUMMARY

An aspect according to one or more embodiments of the present disclosure is directed toward an organic light-emitting device.

Additional aspects will be set forth in part in the description which follows and, in part, will be apparent from the description, or may be learned by practice of the presented embodiments.

According to one or more embodiments, an organic light-emitting device includes:

a first electrode;

a second electrode; and an organic layer between the first electrode and the second electrode, the organic layer including an emission layer;

wherein the organic layer includes a first compound represented by Formula 1 and a second compound represented by one selected from Formulae 2-1 to 2-3:

Formula 1

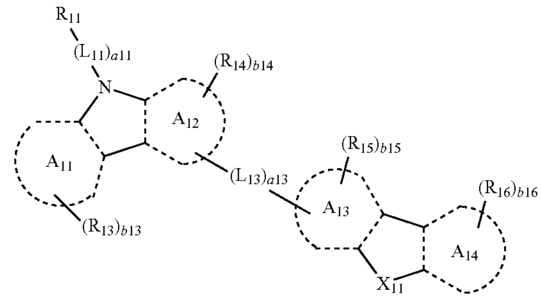

Formula 2-1

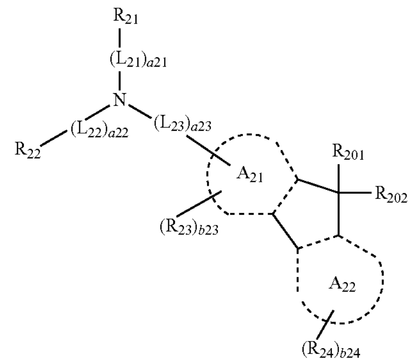

Formula 2-2

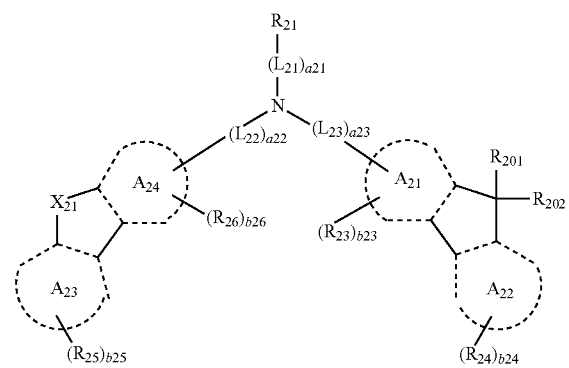

Formula 2-3

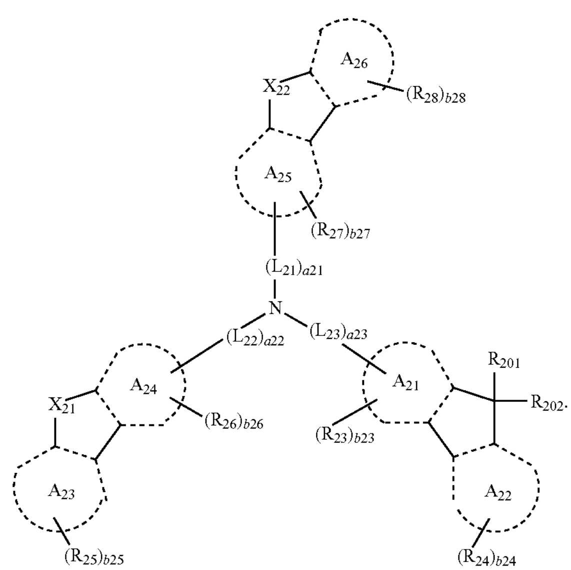

-continued

Formula 9

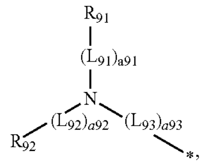

wherein, in Formulae 1, 2-1 to 2-3, and 9, $A_{11}$ to $A_{14}$ and $A_{21}$ to $A_{26}$ are each independently selected from a $C_5$-$C_{20}$ carbocyclic group and a $C_1$-$C_{20}$ heterocyclic group, $X_{11}$ is selected from O, S, $N[(L_{12})_{a12}$-$R_{12}]$, $C[(L_{12})_{a12}$-$R_{12}][R_{17}]$, $Si[(L_{12})_{a12}$-$R_{12}][R_{17}]$, $P[(L_{12})_{a12}$-$R_{12}]$, $B[(L_{12})_{a12}$-$R_{12}]$, and $P(=O)[(L_{12})_{a12}$-$R_{12}]$, $X_{21}$ is selected from $C(R_{203})(R_{204})$, $Si(R_{203})(R_{204})$, O, and S, $X_{22}$ is selected from $C(R_{205})(R_{206})$, $Si(R_{205})(R_{206})$, O, and S, $L_{11}$ to $L_{13}$, $L_{21}$ to $L_{23}$, and $L_{91}$ to $L_{93}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 to a13, a21 to a23, and a91 to a93 are each independently selected from 0, 1, 2, 3, 4, and 5, $R_{11}$, $R_{12}$, $R_{91}$, and $R_{92}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{21}$ and $R_{22}$ are each independently selected from a group represented by Formula 9, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group, $R_{13}$ to $R_{17}$, $R_{23}$ to $R_{28}$, and $R_{201}$ to $R_{206}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, $R_{201}$ and $R_{202}$ are optionally linked to form a saturated or unsaturated ring; $R_{203}$ and $R_{204}$ are optionally linked to form a saturated or unsaturated ring, and $R_{205}$ and $R_{206}$ are optionally linked to form a saturated or unsaturated ring, $Q_1$ to $Q_3$ are each independently selected from hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, b13 to b16 and b23 to b28 are each independently selected from 1, 2, 3, and 4, and

* indicates a binding site to a neighboring atom.

According to one or more embodiments, an organic light-emitting device includes:

a substrate having a first sub-pixel region, a second sub-pixel region, and a third sub-pixel region;

a plurality of first electrodes, one on each of the first sub-pixel region, the second sub-pixel region, and the third sub-pixel region on the substrate;

a second electrode facing the plurality of first electrodes; and an organic layer between the first electrode and the second electrode, the organic layer including an emission layer, wherein the organic layer includes a first compound represented by Formula 1 and a second compound represented by one selected from Formulae 2-1 to 2-3.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
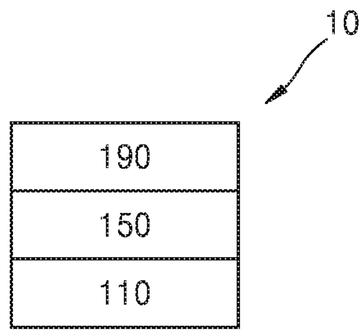
FIG. 1 is a diagram schematically illustrating a structure of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments of the present disclosure are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the inventive concept allows for various changes and numerous embodiments, particular embodiments will be illustrated in the drawings and described in more detail in the written description. Effects, features, and a method of achieving the inventive concept will be obvious by referring to exemplary embodiments of the inventive concept with reference to the accompanying drawings. The inventive concept may, however, be embodied in many different forms and should not be construed as being limited to the embodiments set forth herein.

Hereinafter, the inventive concept will be described in more detail by explaining exemplary embodiments of the inventive concept with reference to the accompanying drawings. Like reference numerals in the drawings denote like elements, and thus their description will not be repeated.

In the embodiments described in the present specification, an expression utilized in the singular encompasses the expression of the plural, unless it has a clearly different meaning in the context.

In the present specification, it is to be understood that the terms such as "including," "having," and/or "comprising" are intended to indicate the presence of the stated features or components, and are not intended to preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layer(s), region(s), or component(s) may be present.

Sizes of components in the drawings may be exaggerated for convenience of explanation. In other words, since sizes and thicknesses of components in the drawings are arbitrarily illustrated for convenience of explanation, the following embodiments of the present disclosure are not limited thereto.

As used herein, the expression "(an organic layer) includes at least one first compound" may refer to a case where "(an organic layer) may include one first compound represented by Formula 1, or two or more different first compounds represented by Formula 1".

As used herein, the term "an organic layer" refers to a single and/or a plurality of layers between a first electrode and a second electrode in an organic light-emitting device. A material included in an "organic layer" may include other materials (such as inorganic materials) besides an organic material.

An organic light-emitting device according to an embodiment of the present inventive concept may include: a first electrode; a second electrode; and an organic layer between the first electrode and the second electrode, the organic layer including an emission layer, wherein the organic layer may include a first compound represented by Formula 1 and a second compound represented by one selected from Formulae 2-1 to 2-3:

Formula 1

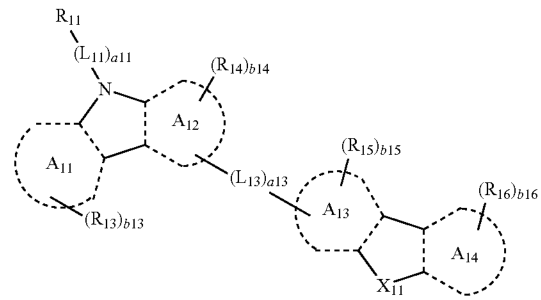

Formula 2-1

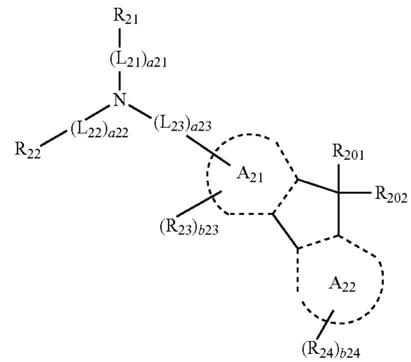

Formula 2-2

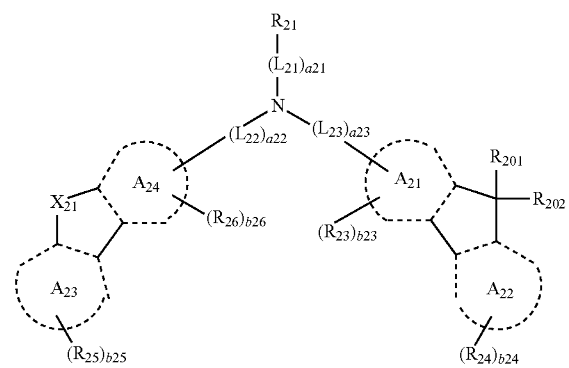

Formula 2-3

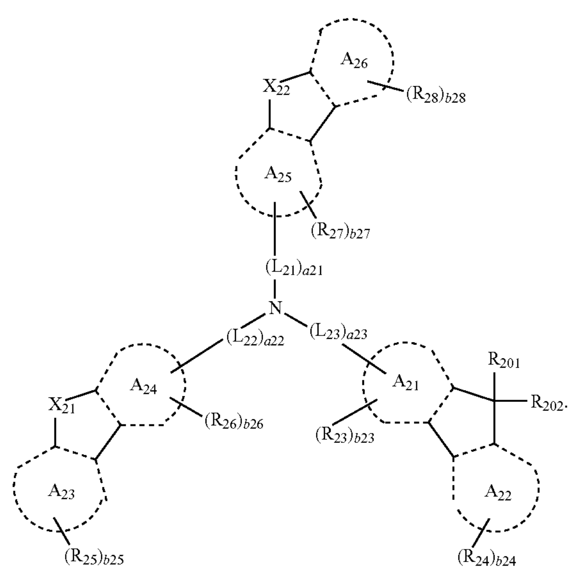

-continued

Formula 9

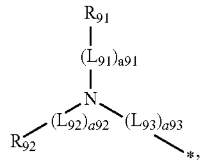

In Formulae 1, 2-1 to 2-3, and 9, $A_{11}$ to $A_{14}$ and $A_{21}$ to $A_{26}$ may each independently be selected from a $C_5$-$C_{20}$ carbocyclic group and a $C_1$-$C_{20}$ heterocyclic group, $X_{11}$ may be selected from O, S, N[$(L_{12})_{a12}$-$R_{12}$], C[$(L_{12})_{a12}$-$R_{12}$][$R_{17}$], Si[$(L_{12})_{a12}$-$R_{12}$][$R_{17}$], P[$(L_{12})_{a12}$-$R_{12}$], B[$(L_{12})_{a12}$-$R_{12}$], and P(═O)[$(L_{12})_{a12}$-$R_{12}$], $X_{21}$ may be selected from C($R_{203}$)($R_{204}$), Si($R_{203}$)($R_{204}$), O, and S, and $X_{22}$ may be selected from C($R_{205}$)($R_{206}$), Si($R_{205}$)($R_{206}$), O, and S, $L_{11}$ to $L_{13}$, $L_{21}$ to $L_{23}$, and $L_{91}$ to $L_{93}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 to a13, a21 to a23, and a91 to a93 may each independently be selected from 0, 1, 2, 3, 4, and 5, $R_{11}$, $R_{12}$, $R_{91}$, and $R_{92}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{21}$ and $R_{22}$ may each independently be selected from a group represented by Formula 9, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, and a substituted or unsubstituted $C_1$-$C_{60}$ heteroaryl group, $R_{13}$ to $R_{17}$, $R_{23}$ to $R_{28}$, and $R_{201}$ to $R_{206}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), $R_{201}$ and $R_{202}$ may be optionally bound to each other to form a saturated or unsaturated ring; $R_{203}$ and $R_{204}$ may be optionally bound to each other to form a saturated or unsaturated ring; and $R_{205}$ and $R_{206}$ may be optionally bound to each other to form a saturated or unsaturated ring, $Q_1$ to $Q_3$ may each independently be selected from hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, b13 to b16 and b23 to b28 may each independently be selected from 1, 2, 3, and 4, and

* indicates a binding site to a neighboring atom.

For example, in Formulae 1 and 2-1 to 2-3, $A_{11}$ to $A_{14}$ and $A_{21}$ to $A_{26}$ may each independently be selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a benzofuran group, a benzothiophene group, a dibenzofuran group, a dibenzothiophene group, and a carbazole group, but embodiments of the present disclosure are not limited thereto.

In various embodiments, in Formula 1, $A_{11}$ to $A_{14}$ may each independently be selected from a benzene group, a naphthalene group, a pyridine group, a pyrimidine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, and a quinazoline group, but embodiments of the present disclosure are not limited thereto.

In various embodiments, in Formula 1, $A_{11}$ and $A_{14}$ may each independently be selected from a benzene group, a naphthalene group, a pyridine group, a pyrimidine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, and a quinazoline group, and $A_{12}$ and $A_{13}$ may each independently be a benzene group, but embodiments of the present disclosure are not limited thereto.

In various embodiments, in Formula 1, $A_{11}$ and $A_{14}$ may each independently be selected from a benzene group and a naphthalene group, and $A_{12}$ and $A_{13}$ may each independently be a benzene group, but embodiments of the present disclosure are not limited thereto.

For example, in Formulae 2-1 to 2-3, $A_{21}$ to $A_{26}$ may each independently be selected from a benzene group and a naphthalene group, but embodiments of the present disclosure are not limited thereto.

In various embodiments, in Formulae 1 and 2-1 to 2-3, $A_{11}$ to $A_{14}$ and $A_{21}$ to $A_{26}$ may each independently be a benzene group, but embodiments of the present disclosure are not limited thereto.

For example, in Formula 1, $X_{11}$ may be selected from O, S, N[$(L_{12})_{a12}$-$R_{12}$], C[$(L_{12})_{a12}$-$R_{12}$]($R_{17}$), Si[$(L_{12})_{a12}$-$R_{12}$]($R_{17}$), P[$(L_{12})_{a12}$-$R_{12}$], B[$(L_{12})_{a12}$-$R_{12}$], and P(═O)[$(L_{12})_{a12}$-$R_{12}$], $R_{12}$ and $R_{17}$ may be optionally bound to each other to form a saturated or unsaturated ring, but embodiments of the present disclosure are not limited thereto.

In various embodiments, in Formula 1, $X_{11}$ may be selected from O, S, $N[(L_{12})_{a12}-R_{12}]$, and $C[(L_{12})_{a12}-R_{12}](R_{17})$, but embodiments of the present disclosure are not limited thereto.

For example, in Formulae 2-1 to 2-3, $X_{21}$ may be $C(R_{203})(R_{204})$, and $X_{22}$ may be selected from $C(R_{205})(R_{206})$, O, and S;

$X_{21}$ may be O, and $X_{22}$ may be selected from O and S; or $X_{21}$ may be S, and $X_{22}$ may be S, but embodiments of the present disclosure are not limited thereto.

For example, in Formulae 1, 2-1 to 2-3, and 9, $L_{11}$ to $L_{13}$, $L_{21}$ to $L_{23}$, and $L_{91}$ to $L_{93}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a benzocarbazolylene group, and a dibenzocarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, and $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments of the present disclosure are not limited thereto.

In various embodiments, in Formulae 1, 2-1 to 2-3, and 9, $L_{11}$ to $L_{13}$, $L_{21}$ to $L_{23}$, and $L_{91}$ to $L_{93}$ may each independently be selected from the group consisting of:

a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, a dibenzothiophenylene group, and a dibenzosilolylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, a dibenzothiophenylene group, and a dibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments of the present disclosure are not limited thereto.

In various embodiments, in Formulae 1, 2-1 to 2-3, and 9, $L_{11}$ to $L_{13}$, $L_{21}$ to $L_{23}$, and $L_{91}$ to $L_{93}$ may each independently be a group represented by one of Formulae 4-1 to 4-31, but embodiments of the present disclosure are not limited thereto:

4-1

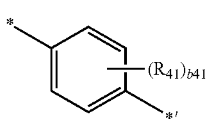

4-2

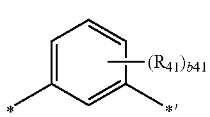

4-3

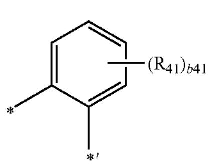

4-4

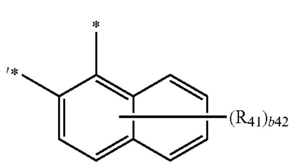

-continued 4-5

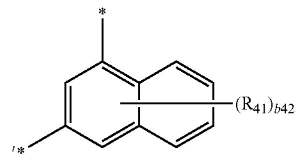

4-6

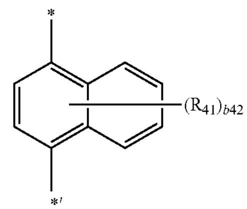

4-7

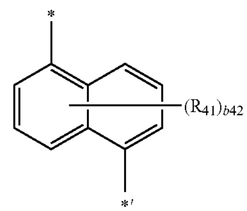

4-8

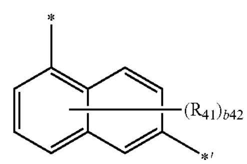

4-9

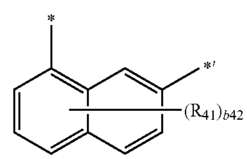

4-10

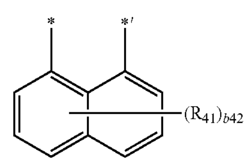

4-11

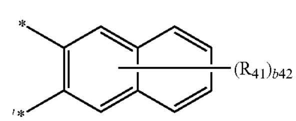

4-12

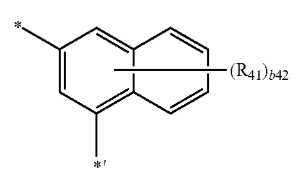

4-13

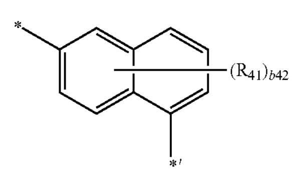

-continued
4-14
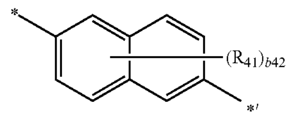
4-15
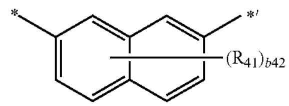
4-16
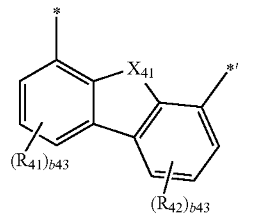
4-17
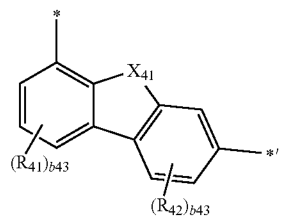
4-18
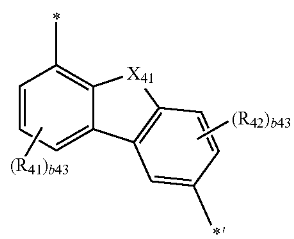
4-19
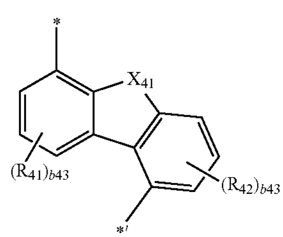
4-20
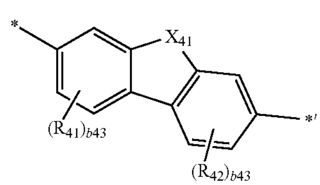
4-21
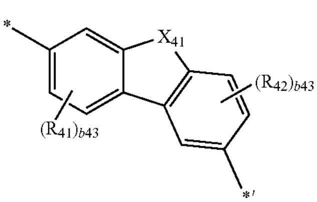
-continued
4-22
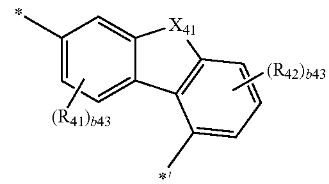
4-23
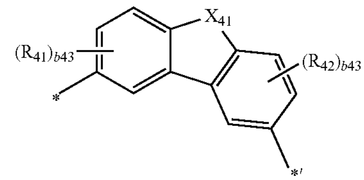
4-24
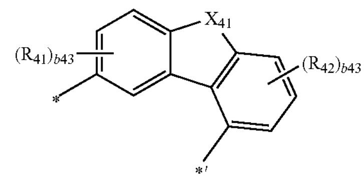
4-25
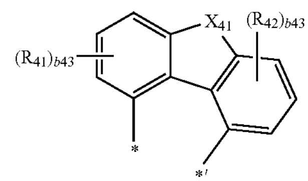
4-26
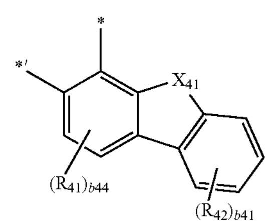
4-27
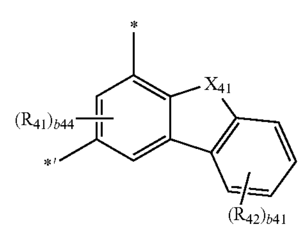
4-28
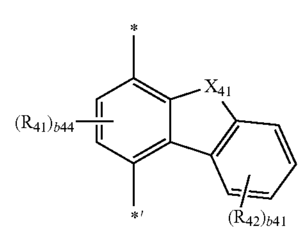

-continued 4-29

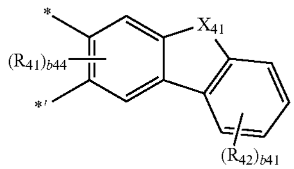

4-30

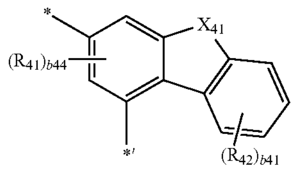

4-31

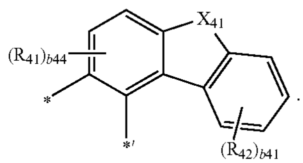

In Formulae 4-1 to 4-31, $X_{41}$ may be selected from O, S, $N(R_{43})$, $C(R_{43})(R_{44})$, and $Si(R_{43})(R_{44})$, $R_{41}$, $R_{42}$, and $R_{43}$-$R_{44}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, b41 may be selected from 1, 2, 3, and 4, b42 may be selected from 1, 2, 3, 4, 5, and 6, b43 may be selected from 1, 2, and 3, b44 may be selected from 1 and 2, and

* and *' each independently indicate a binding site to a neighboring atom.

In various embodiments, in Formulae 4-1 to 4-31, $X_{41}$ may be selected from O, S, and $C(R_{43})(R_{44})$, and $R_{41}$ to $R_{44}$ may each independently be selected from hydrogen, deuterium, —F, a cyano group, a methyl group, an ethyl group, an n-propyl group, a tert-butyl group, a phenyl group, and a naphthyl group, but embodiments of the present disclosure are not limited thereto.

For example, in Formulae 1, 2-1 to 2-3, and 9, a11 to a13, a21 to a23, and a91 to a93 may each independently be selected from 0, 1, and 2, but embodiments of the present disclosure are not limited thereto.

For example, in Formulae 1 and 9, $R_{11}$, $R_{12}$, $R_{91}$, and $R_{92}$ may each independently be selected from the group consisting of:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_{31})(Q_{32})$, and $—Si(Q_{31})(Q_{32})(Q_{33})$; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from a $C_6$-$C_{60}$ aryl group and a $C_1$-$C_{60}$ heteroaryl group, each substituted with at least one selected from deuterium, —F, —Cl, —Br, —I, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, $—N(Q_{21})(Q_{22})$, and $—Si(Q_{21})(Q_{22})(Q_{23})$, $Q_{31}$ to $Q_{33}$ and $Q_{21}$ to $Q_{23}$ may each independently be selected from a $C_1$-$C_{60}$ alkyl group and a $C_6$-$C_{60}$ aryl group, but embodiments of the present disclosure are not limited thereto.

In various embodiments, in Formulae 1 and 9, $R_{11}$, $R_{12}$, $R_{91}$, and $R_{92}$ may each independently be selected from the group consisting of:

a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolizinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxazinyl group, and a phenothiazinyl group;

a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolizinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxazinyl group, and a phenothiazinyl group, each substituted with at least one selected from deuterium, —F, —Cl, —Br, —I, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), and —Si($Q_{31}$)($Q_{32}$)($Q_{33}$); and a phenyl group, a biphenyl group, a terphenyl group, a naphthyl group, an anthracenyl group, a triphenylenyl group, a phenanthrenyl group, a pyrenyl group, a chrysenyl group, a fluorenyl group, a benzofluorenyl group, a carbazolyl group, a dibenzofuranyl group, a dibenzothiophenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyridopyrimidinyl group, a pyrazinopyrazinyl group, a pyrrolyl group, a thiophenyl group, a thiazolyl group, an oxazolyl group, a thiadiazolyl group, an oxadiazolyl group, an imidazolyl group, a triazolyl group, an indolyl group, an indolizinyl group, a benzthiazolyl group, a benzoxazolyl group, a benzimidazolyl group, a naphthoimidazolyl group, an imidazopyridinyl group, an imidazopyrimidinyl group, an imidazoquinolinyl group, an imidazoisoquinolinyl group, a pyrrolopyrimidinyl group, a benzofuranyl group, a benzothiophenyl group, a thianthrenyl group, a phenoxathinyl group, a dibenzodioxinyl group, a phenoxazinyl group, and a phenothiazinyl group, each substituted with at least a substituent selected from a phenyl group, a biphenyl group, a terphenyl group, a naphthyl group, a pyridinyl group, a pyrimidinyl group, a pyridazinyl group, and a triazinyl group, each (of the above disclosed substituents is further) substituted with at least one selected from deuterium, —F, —Cl, —Br, —I, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), and —Si($Q_{21}$)($Q_{22}$)($Q_{23}$), and $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, but embodiments of the present disclosure are not limited thereto.

In various embodiments, in Formulae 1 and 9, $R_{11}$, $R_{12}$, $R_{91}$, and $R_{92}$ may each independently be a group represented by one selected from Formulae 5-1 to 5-71, but embodiments of the present disclosure are not limited thereto:

5-1

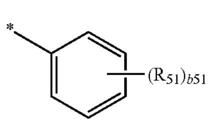

-continued 5-2

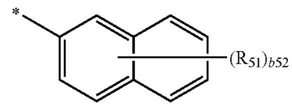

5-3

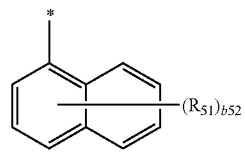

5-4

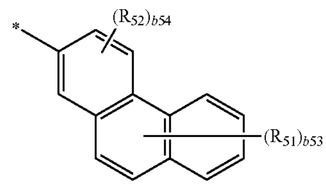

5-5

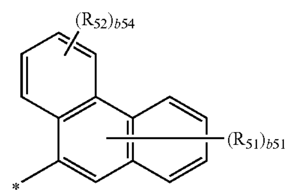

5-6

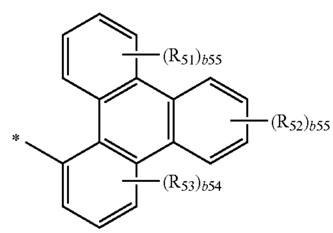

5-7

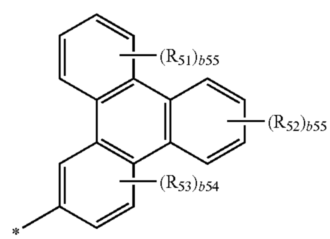

5-8

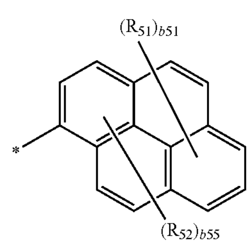

5-9

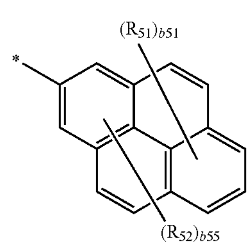

-continued
5-10
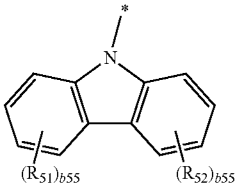
5-11
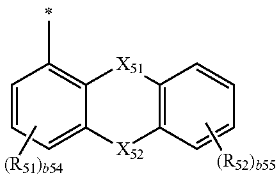
5-12
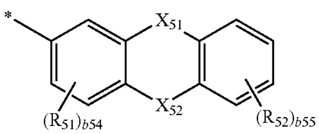
5-13
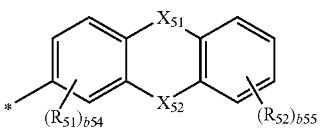
5-14
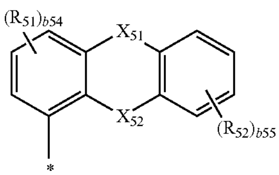
5-15
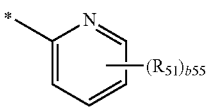
5-16
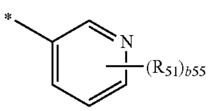
5-17
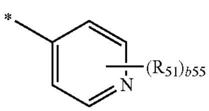
5-18
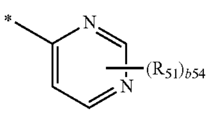
5-19
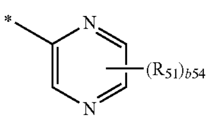
5-20
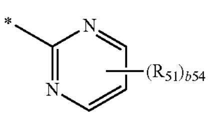
-continued
5-21
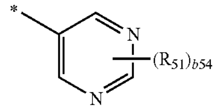
5-22
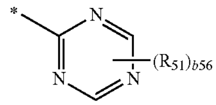
5-23
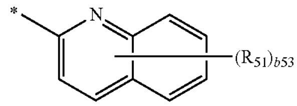
5-24
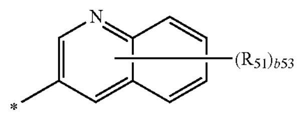
5-25
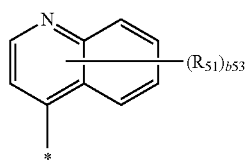
5-26
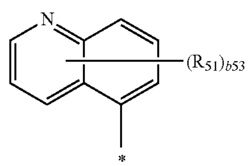
5-27
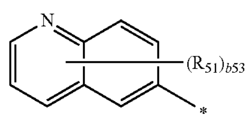
5-28
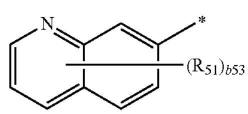
5-29
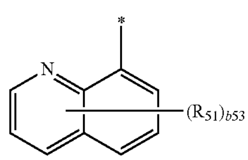
5-30
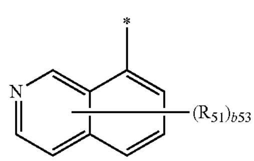
5-31
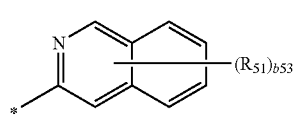

-continued
5-32
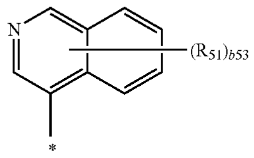
5-33
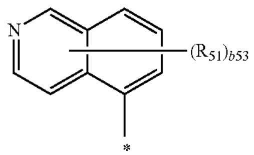
5-34
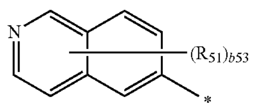
5-35
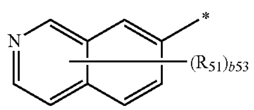
5-36
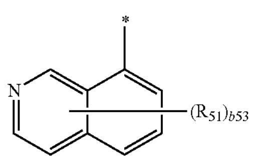
5-37
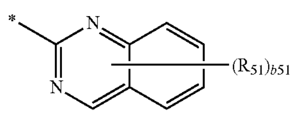
5-38
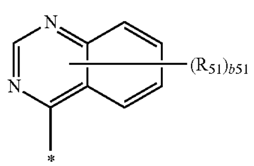
5-39
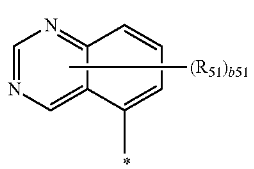
5-40
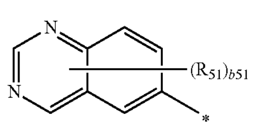
5-41
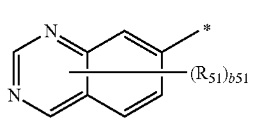
-continued
5-42
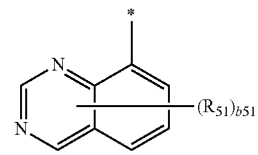
5-43
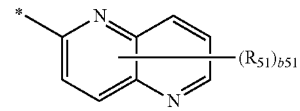
5-44
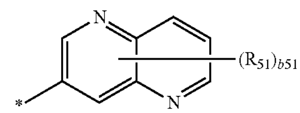
5-45
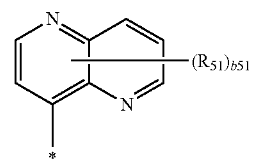
5-46
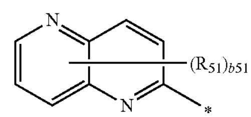
5-47
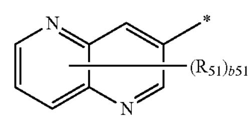
5-48
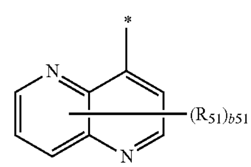
5-49
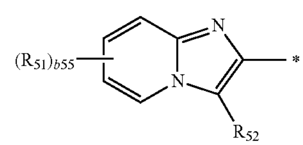
5-50
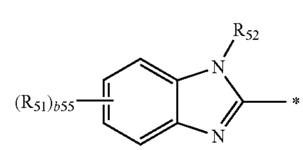
5-51
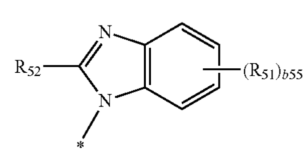
5-52
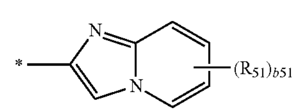

-continued
5-53
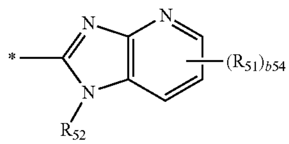
5-54
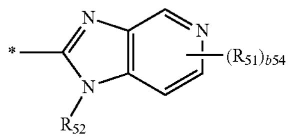
5-55
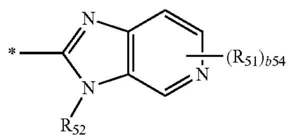
5-56
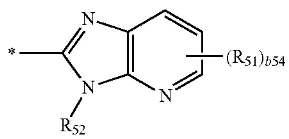
5-57
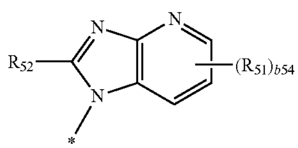
5-58
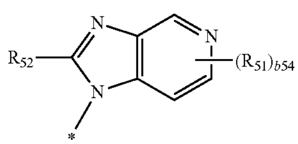
5-59
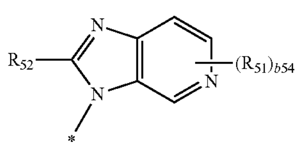
5-60
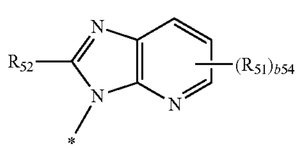
5-61
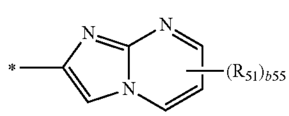
5-62
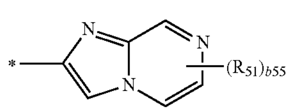
5-63
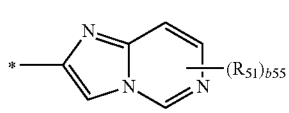
-continued
5-64
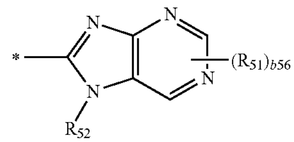
5-65
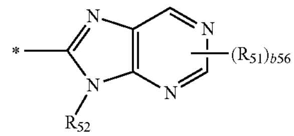
5-66
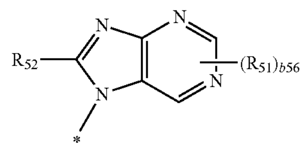
5-67
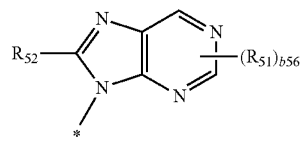
5-68
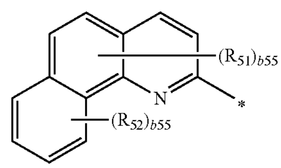
5-69
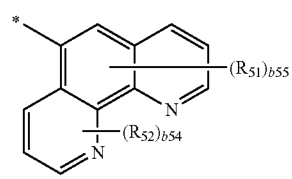
5-70
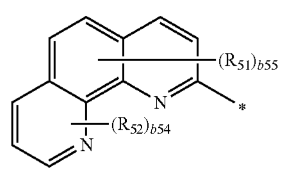
5-71
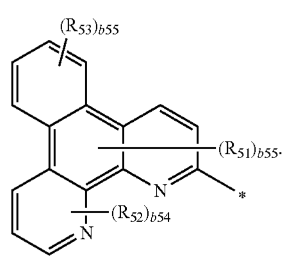
In Formulae 5-1 to 5-71,
$X_{51}$ may be selected from a single bond, $N(R_{54})$, $C(R_4)(R_{55})$, O, and S,
$X_{52}$ may be selected from $N(R_{56})$, $C(R_{56})(R_{57})$, O, and S,
$R_{51}$ to $R_{57}$ may each independently be selected from the group consisting of:
hydrogen, deuterium, —F, —Cl, —Br, —I, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), and —Si($Q_{31}$)($Q_{32}$)($Q_{33}$); and a phenyl group, a biphenyl group, a terphenyl group, a naphthyl group, a pyridinyl group, a pyrimidinyl group, a pyridazinyl group, and a triazinyl group, each substituted with at least one selected from deuterium, —F, —Cl, —Br, —I, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), and —Si($Q_{21}$)($Q_{22}$)($Q_{23}$), $Q_{21}$ to $Q_{23}$ and $Q_{31}$ to $Q_{33}$ may each independently be selected from a methyl group, an ethyl group, a phenyl group, a biphenyl group, a terphenyl group, and a naphthyl group, b51 may be selected from 1, 2, 3, 4, and 5, b52 may be selected from 1, 2, 3, 4, 5, 6, and 7, b53 may be selected from 1, 2, 3, 4, 5, and 6, b54 may be selected from 1, 2, and 3, b55 may be selected from 1, 2, 3, and 4, b56 may be selected from 1 and 2, and

* indicates a binding site to a neighboring atom.

For example, in Formulae 2-1 to 2-3, $R_{21}$ and $R_{22}$ may each independently be selected from the group consisting of:

the group represented by Formula 9, a $C_6$-$C_{60}$ aryl group, and a $C_1$-$C_{60}$ heteroaryl group; and a $C_6$-$C_{60}$ aryl group and a $C_1$-$C_{60}$ heteroaryl group, each substituted with at least one selected from deuterium, —F, —Cl, —Br, —I, a $C_1$-$C_{60}$ alkyl group, a $C_1$-$C_{60}$ alkoxy group, a $C_6$-$C_{60}$ aryl group, and a $C_1$-$C_{60}$ heteroaryl group, but embodiments of the present disclosure are not limited thereto.

In various embodiments, in Formulae 2-1 to 2-3, $R_{21}$ and $R_{22}$ may each independently be selected from the group consisting of:

the group represented by Formula 9, a phenyl group, a biphenyl group, a terphenyl group, a naphthyl group, an anthracenyl group, a triphenylenyl group, a phenanthrenyl group, a pyrenyl group, a chrysenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyrrolyl group, a thiophenyl group, a thiazolyl group, an oxazolyl group, a thiadiazolyl group, an oxadiazolyl group, an imidazolyl group, a triazolyl group, an indolyl group, a benzthiazolyl group, a benzoxazolyl group, and a benzimidazolyl group; and a phenyl group, a biphenyl group, a terphenyl group, a naphthyl group, an anthracenyl group, a triphenylenyl group, a phenanthrenyl group, a pyrenyl group, a chrysenyl group, a pyridinyl group, a pyrazinyl group, a pyrimidinyl group, a pyridazinyl group, a triazinyl group, a tetrazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, a phenanthrolinyl group, a benzophenanthrolinyl group, a pyrrolyl group, a thiophenyl group, a thiazolyl group, an oxazolyl group, a thiadiazolyl group, an oxadiazolyl group, an imidazolyl group, a triazolyl group, an indolyl group, a benzthiazolyl group, a benzoxazolyl group, and a benzimidazolyl group, each substituted with at least one selected from a $C_6$-$C_{60}$ aryl group and a $C_1$-$C_{60}$ heteroaryl group; but embodiments of the present disclosure are not limited thereto.

In various embodiments, in Formulae 2-1 to 2-3, $R_{21}$ and $R_{22}$ may each independently be selected from the group represented by Formula 9 and a group represented by any of Formulae 6-1 to 6-15, but embodiments of the present disclosure are not limited thereto:

6-1

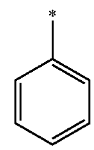

6-2

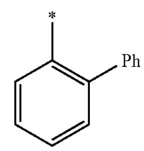

6-3

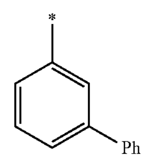

6-4

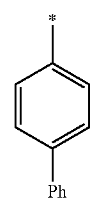

6-5

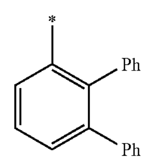

6-6

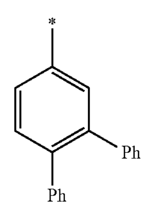

6-7

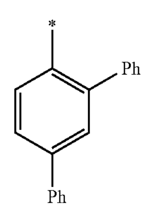

6-8

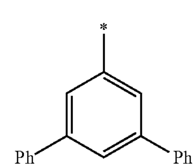

-continued 6-9

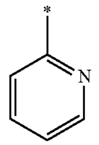

6-10

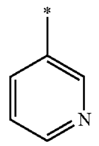

6-11

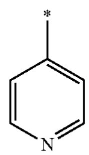

6-12

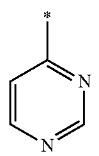

6-13

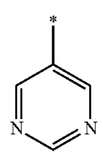

6-14

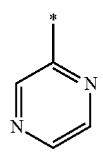

6-15

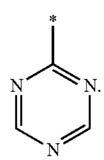

In Formulae 6-1 to 6-15,

Ph denotes a phenyl group, and

* indicates a binding site to a neighboring atom.

For example, in Formulae 1 and 2-1 to 2-3, $R_{13}$ to $R_{17}$, $R_{23}$ to $R_{28}$, and $R_{201}$ to $R_{206}$ may each independently be selected from the group consisting of:

hydrogen, deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$);

a $C_1$-$C_{60}$ alkyl group and a $C_1$-$C_{60}$ alkoxy group, each substituted with at least one selected from deuterium, —F, —Cl, —Br, —I, a cyano group, and a nitro group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a cyano group, a nitro group, a methyl group, a methoxy group, a phenyl group, a naphthyl group, and —Si($CH_3$)$_3$, $R_{201}$ and $R_{202}$ may be optionally bound to each other to form a saturated or unsaturated ring; $R_{203}$ and $R_{204}$ may be optionally bound to each other to form a saturated or unsaturated ring; and $R_{205}$ and $R_{206}$ may be optionally bound to each other to form a saturated or unsaturated ring;

$Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In various embodiments, in Formulae 1 and 2-1 to 2-3, $R_{13}$ to $R_{17}$, $R_{23}$ to $R_{28}$, and $R_{201}$ to $R_{206}$ may each independently be selected from the group consisting of:

hydrogen, deuterium, —F, a methyl group, an ethyl group, an n-propyl group, an iso-propyl group, an n-butyl group, an iso-butyl group, a sec-butyl group, a tert-butyl group, a methoxy group, an ethoxy group, —$CF_3$, —$OCF_3$, a phenyl group, a biphenyl group, a terphenyl group, a naphthyl group, a phenoxy group, a pyridinyl group, a pyrimidinyl group, a pyridazinyl group, a triazinyl group, a carbazolyl group, a fluorenyl group, a dibenzofuranyl group, a dibenzothiophenyl group, —N($Q_1$)($Q_2$), and —Si($Q_1$)($Q_2$)($Q_3$); and a phenyl group, a biphenyl group, a terphenyl group, and a naphthyl group, each substituted with at least one selected from deuterium, —F, —Cl, —Br, —I, a cyano group, a nitro group, a methyl group, a methoxy group, a phenyl group, a naphthyl group, and —Si($CH_3$)$_3$, $R_{201}$ and $R_{202}$ may be optionally bound to each other to form a saturated or unsaturated ring; $R_{203}$ and $R_{204}$ may be optionally bound to each other to form a saturated or unsaturated ring; and $R_{205}$ and $R_{206}$ may be optionally bound to each other to form a saturated or unsaturated ring, $Q_1$ to $Q_3$ may each independently be selected from a methyl group, an ethyl group, a phenyl group, a biphenyl group, a terphenyl group, and a naphthyl group, but embodiments of the present disclosure are not limited thereto.

For example, in Formulae 2-1 to 2-3, $R_{201}$ and $R_{202}$, $R_{203}$ and $R_{204}$, or $R_{205}$ and $R_{206}$ may be bound to each other to form a group represented by one selected from Formulae 7-1 to 7-3, but embodiments of the present disclosure are not limited thereto:

7-1

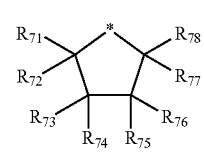

7-2

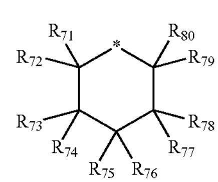

-continued 7-3

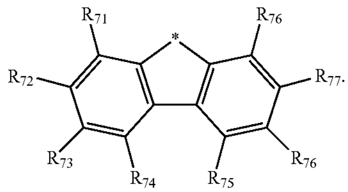

In Formulae 7-1 to 7-3, $R_{71}$ to $R_{80}$ may each independently be selected from the group consisting of:

hydrogen, deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_1$)($Q_2$), and —Si($Q_1$)($Q_2$)($Q_3$);

a $C_1$-$C_{60}$ alkyl group and a $C_1$-$C_{60}$ alkoxy group, each substituted with at least one selected from deuterium, —F, —Cl, —Br, —I, a cyano group, and a nitro group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a cyano group, a nitro group, a methyl group, a methoxy group, a phenyl group, a naphthyl group, and —Si($CH_3$)$_3$, $Q_1$ to $Q_3$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* indicates a carbon atom bound with $R_{201}$ and $R_{202}$, a carbon atom bound with $R_{203}$ and $R_{204}$, or a carbon atom bound with $R_{205}$ and $R_{206}$.

For example, in Formula 7-1 to 7-3, $R_{71}$ to $R_{80}$ may each independently be selected from the group consisting of:

hydrogen, deuterium, —F, a methyl group, an ethyl group, an n-propyl group, an iso-propyl group, an n-butyl group, an iso-butyl group, a sec-butyl group, a tert-butyl group, a methoxy group, an ethoxy group, —$CF_3$, —$OCF_3$, a phenyl group, a biphenyl group, a terphenyl group, a naphthyl group, a phenoxy group, a pyridinyl group, a pyrimidinyl group, a pyridazinyl group, a triazinyl group, a carbazolyl group, a fluorenyl group, a dibenzofuranyl group, a dibenzothiophenyl group, —N($Q_1$)($Q_2$), and —Si($Q_1$)($Q_2$)($Q_3$); and a phenyl group, a biphenyl group, a terphenyl group, and a naphthyl group, each substituted with at least one selected from deuterium, —F, —Cl, —Br, —I, a cyano group, a nitro group, a methyl group, a methoxy group, a phenyl group, a naphthyl group, and —Si($CH_3$)$_3$, $Q_1$ to $Q_3$ may each independently be selected from a methyl group, an ethyl group, a phenyl group, a biphenyl group, a terphenyl group, and a naphthyl group, but embodiments of the present disclosure are not limited thereto.

In an embodiment, the first compound represented by Formula 1 may be represented by Formula 1-1, but embodiments of the present disclosure are not limited thereto:

Formula 1-1

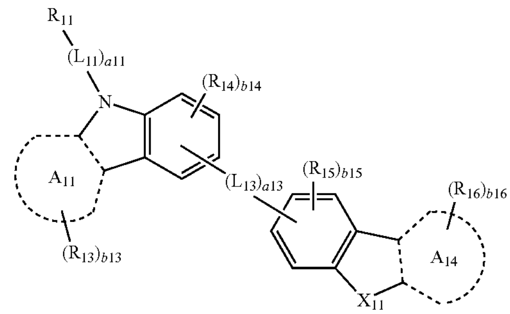

In Formula 1-1, $A_{11}$, $A_{14}$, $X_{11}$, $L_{11}$, $L_{13}$, $a_{11}$, $a_{13}$, $R_{11}$, $R_{13}$ to $R_{16}$, and b13 to b16 may each independently be understood by referring to the descriptions thereof in Formula 1.

In various embodiments, the first compound represented by Formula 1 may be represented by Formula 1-11, but embodiments of the present disclosure are not limited thereto:

Formula 1-11

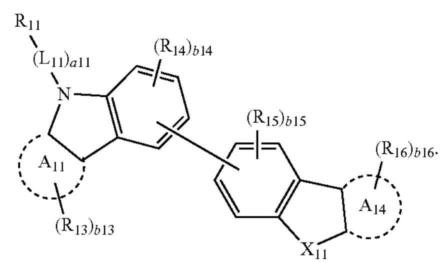

In Formula 1-11, $A_{11}$, $A_{14}$, $X_{11}$, $L_{11}$, a11, $R_{11}$, $R_{13}$ to $R_{16}$, and b13 to b16 may each independently be understood by referring to the descriptions thereof in Formula 1.

For example, in Formula 1-11, $A_{11}$ and $A_{14}$ may each independently be selected from a benzene group and a naphthalene group, $X_{11}$ may be selected from O, S, N[($L_{12}$)$_{a12}$-$R_{12}$], and C[($L_{12}$)$_{a12}$-$R_{12}$]($R_{17}$), $L_{11}$ and $L_{12}$ may each independently be a group represented by one selected from Formulae 4-1 to 4-31, a11 and a12 may each independently be selected from 0, 1, and 2, $R_{11}$ and $R_{12}$ may each independently be a group represented by one selected from Formulae 5-1 to 5-71, $R_{13}$ to $R_{17}$ may each independently be selected form the group consisting of:

hydrogen, deuterium, —F, a methyl group, an ethyl group, an n-propyl group, an iso-propyl group, an n-butyl group, an iso-butyl group, a sec-butyl group, a tert-butyl group, a methoxy group, an ethoxy group, —$CF_3$, —$OCF_3$, a phenyl group, a biphenyl group, a terphenyl group, a naphthyl group, a phenoxy group, a pyridinyl group, a pyrimidinyl group, a pyridazinyl group, a triazinyl group, a carbazolyl group, a fluorenyl group, a dibenzofuranyl group, a dibenzothiophenyl group, —N($Q_1$)($Q_2$), and —Si($Q_1$)($Q_2$)($Q_3$); and a phenyl group, a biphenyl group, a terphenyl group, and a naphthyl group, each substituted with at least one selected from deuterium, —F, —Cl, —Br, —I, a cyano group, a nitro group, a methyl group, a methoxy group, a phenyl group, a naphthyl group, and —$Si(CH_3)_3$, $Q_1$ to $Q_3$ may each independently be selected from a methyl group, an ethyl group, a phenyl group, a biphenyl group, a terphenyl group, and a naphthyl group, b13 to b16 may each independently be selected from 1, 2, 3, and 4, but embodiments of the present disclosure are not limited thereto.

In an embodiment, the second compound represented by one selected from Formulae 2-1 to 2-3 may be represented by one selected from Formulae 2-11, 2-21, and 2-31, but embodiments of the present disclosure are not limited thereto:

Formula 2-11

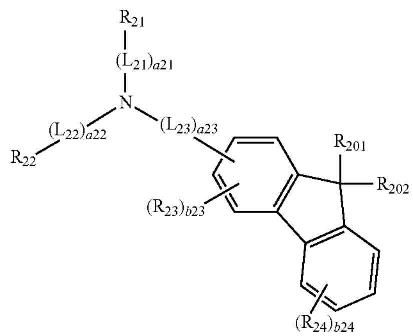

Formula 2-21

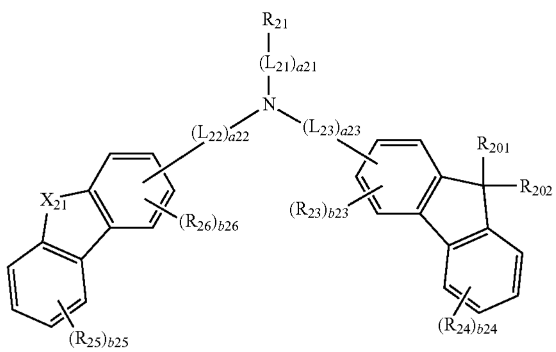

Formula 2-31

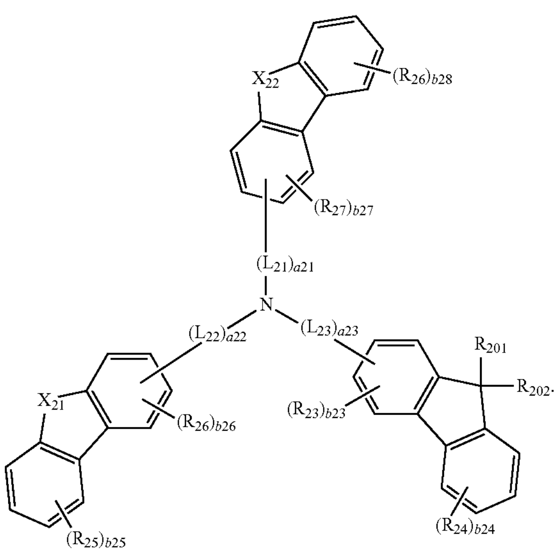

In Formulae 2-11, 2-21, and 2-31, $X_{21}$, $X_{22}$, $L_{21}$ to $L_{23}$, a21 to a23, $R_{21}$ to $R_{28}$, b23 to b28, $R_{201}$ and $R_{202}$ may each independently be understood by referring to the descriptions thereof in Formulae 2-1 to 2-3.

For example, in Formulae 2-11, 2-21, and 2-31, $X_{21}$ may be $C(R_{203})(R_{204})$, and $X_{22}$ may be selected from $C(R_{205})(R_{206})$, O, and S; $X_{21}$ may be O, and $X_{22}$ may be selected from O and S; or $X_{21}$ may be S, and $X_{22}$ may be S, $L_{21}$ to $L_{23}$ may each independently be a group represented by one selected from Formulae 4-1 to 4-31, a21 to a23 may each independently be selected from 0, 1, and 2, $R_{21}$ and $R_{22}$ may each independently be selected from the group represented by Formula 9 and a group represented by any of Formulae 6-1 to 6-15, $R_{23}$ to $R_{28}$ and $R_{201}$ to $R_{206}$ may each independently be selected from the group consisting of:

hydrogen, deuterium, —F, a methyl group, an ethyl group, an n-propyl group, an iso-propyl group, an n-butyl group, an iso-butyl group, a sec-butyl group, a tert-butyl group, a methoxy group, an ethoxy group, —$CF_3$, —$OCF_3$, a phenyl group, a biphenyl group, a terphenyl group, a naphthyl group, a phenoxy group, a pyridinyl group, a pyrimidinyl group, a pyridazinyl group, a triazinyl group, a carbazolyl group, a fluorenyl group, a dibenzofuranyl group, a dibenzothiophenyl group, —$N(Q_1)(Q_2)$, and —$Si(Q_1)(Q_2)(Q_3)$; and a phenyl group, a biphenyl group, a terphenyl group, and a naphthyl group, each substituted with at least one selected from deuterium, —F, —Cl, —Br, —I, a cyano group, a nitro group, a methyl group, a methoxy group, a phenyl group, a naphthyl group, and —$Si(CH_3)_3$, $R_{201}$ and $R_{202}$ may be optionally bound to each other to form a saturated or unsaturated ring; $R_{203}$ and $R_{204}$ may be optionally bound to each other to form a saturated or unsaturated ring; and $R_{205}$ and $R_{206}$ may be optionally bound to each other to form a saturated or unsaturated ring, $Q_1$ to $Q_3$ may each independently be selected from a methyl group, an ethyl group, a phenyl group, a biphenyl group, a terphenyl group, and a naphthyl group, and b23 to b28 may each independently be selected from 1, 2, 3, and 4, but embodiments of the present disclosure are not limited thereto.

In an embodiment, the first compound represented by Formula 1 may be selected from Compounds A-101 to A-221 and B-101 to B-230, but embodiments of the present disclosure are not limited thereto:

A-101
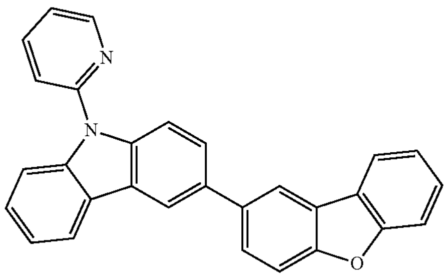
A-102
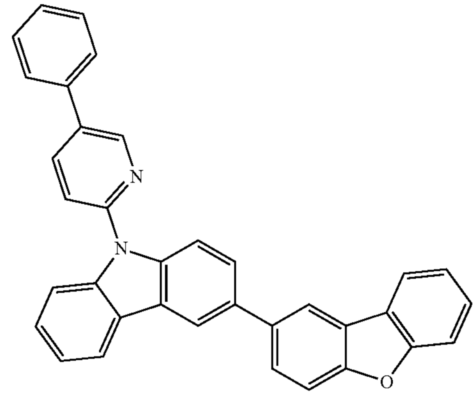
A-103
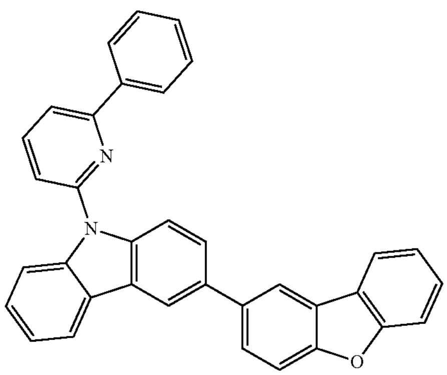
A-104
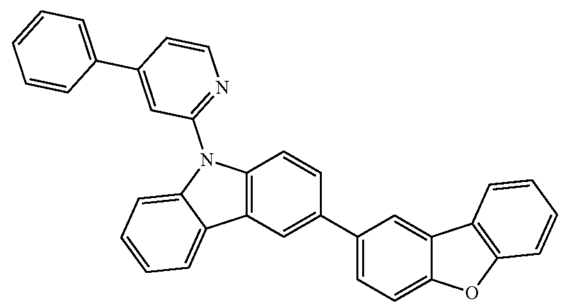
A-105
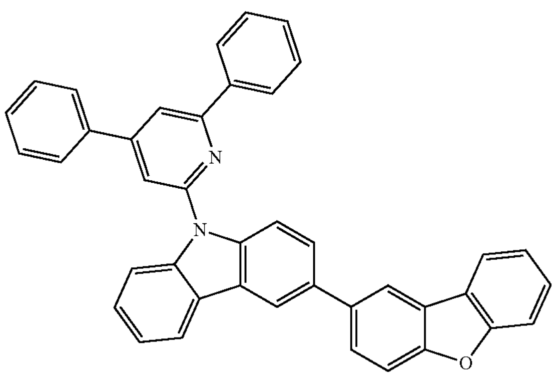
A-106
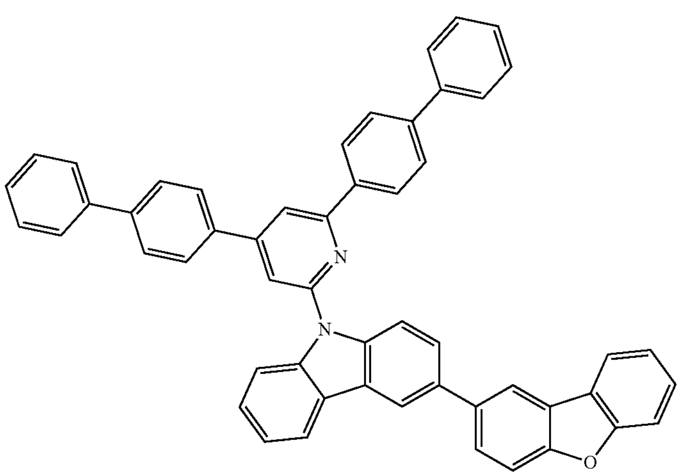

-continued
A-107
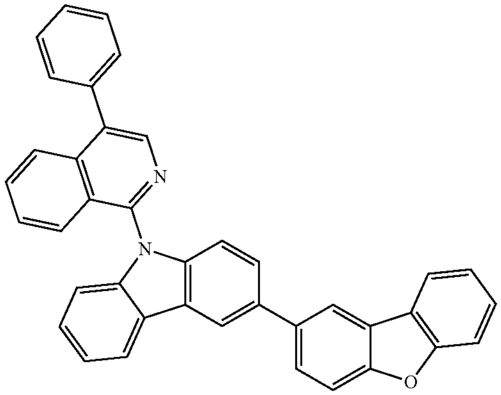
A-108
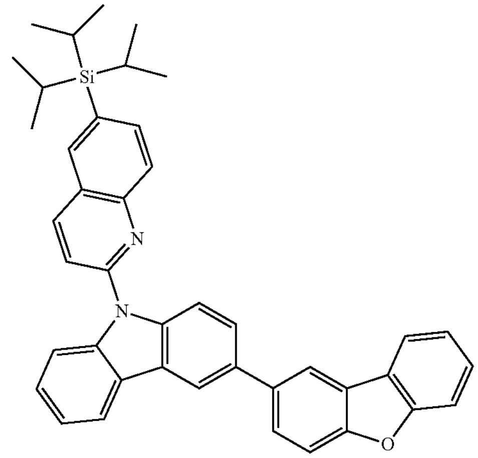
A-109
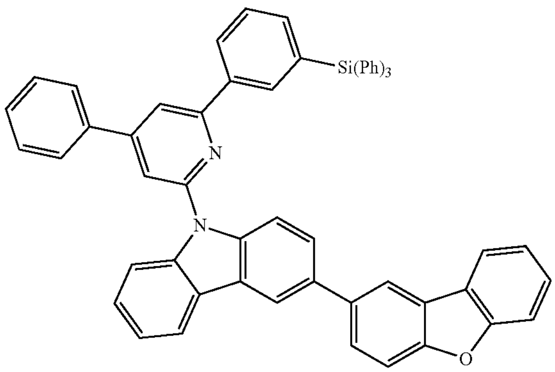
A-110
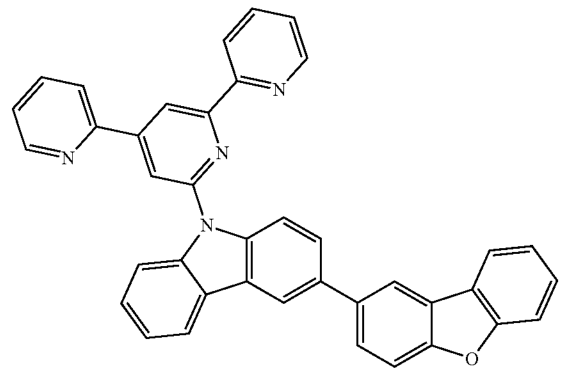
A-111
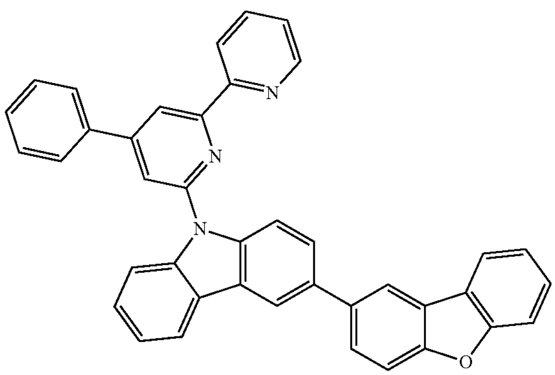
A-112
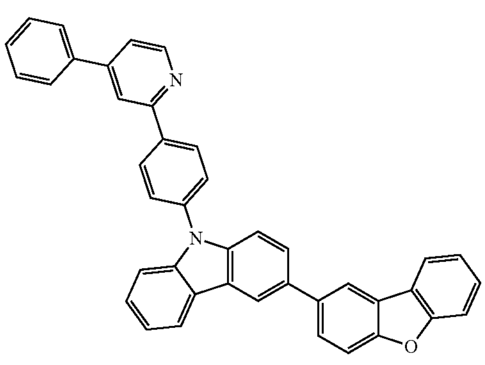
A-113
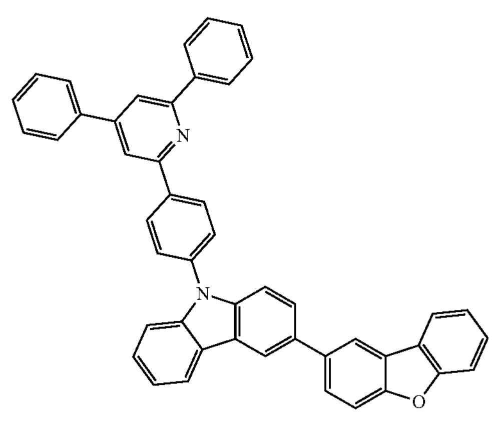

-continued
A-114
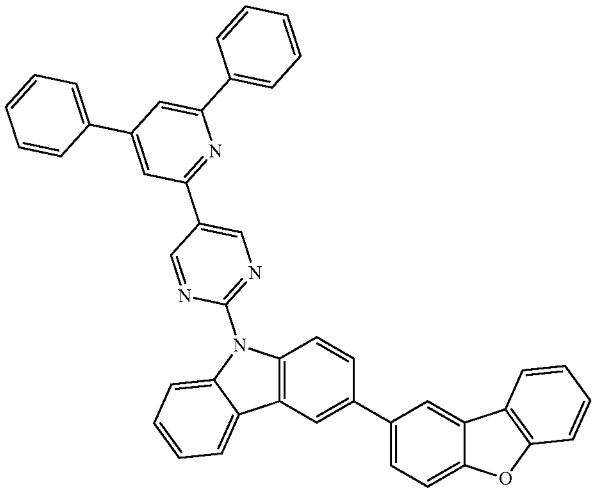
A-115
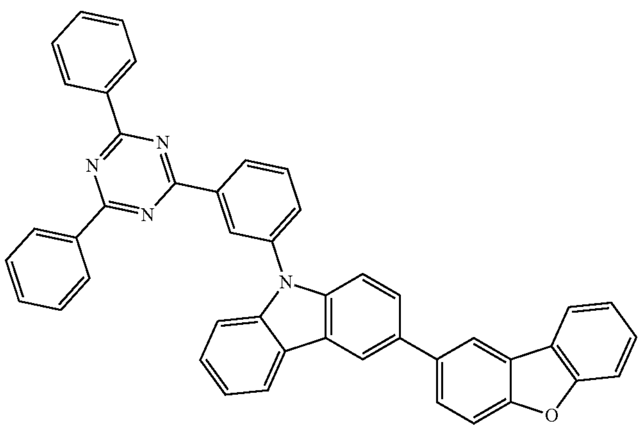
A-116
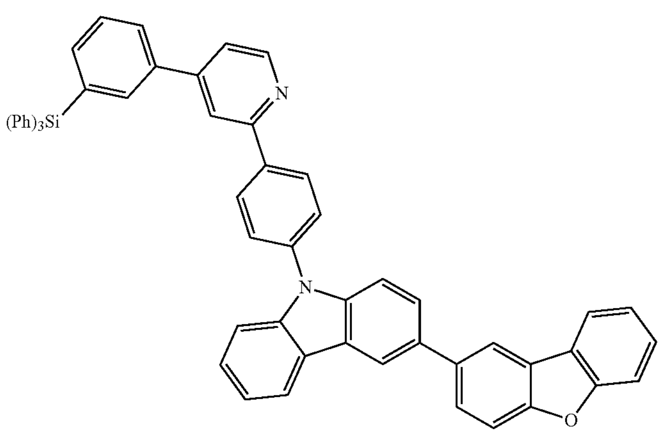

-continued
A-117
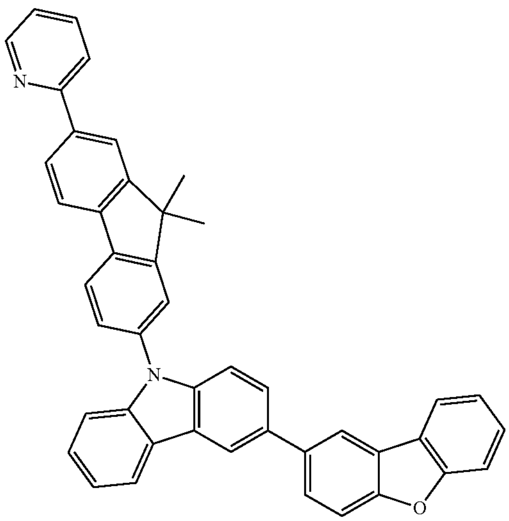
A-118
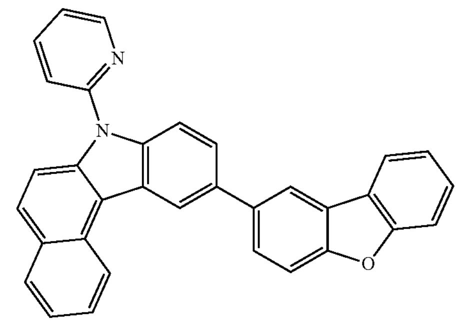
A-119
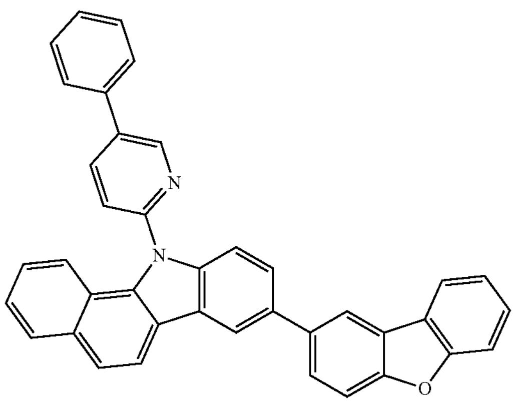
A-120
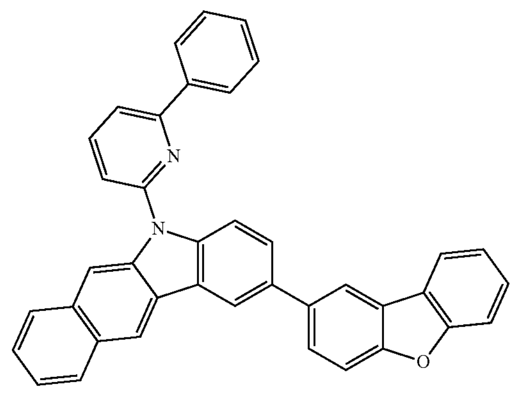
A-121
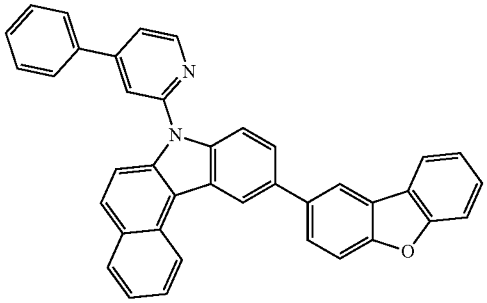
A-122
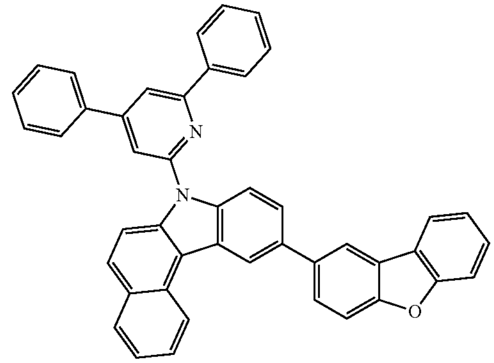

-continued
A-123
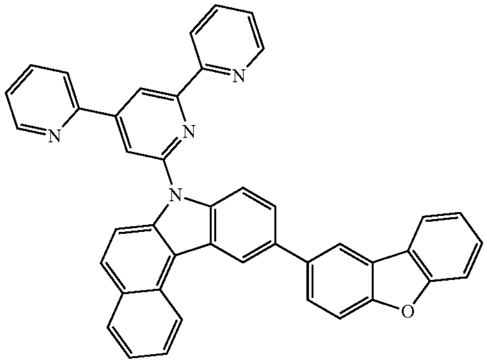
A-124
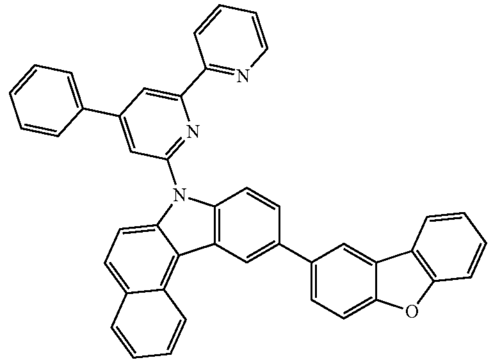
A-125
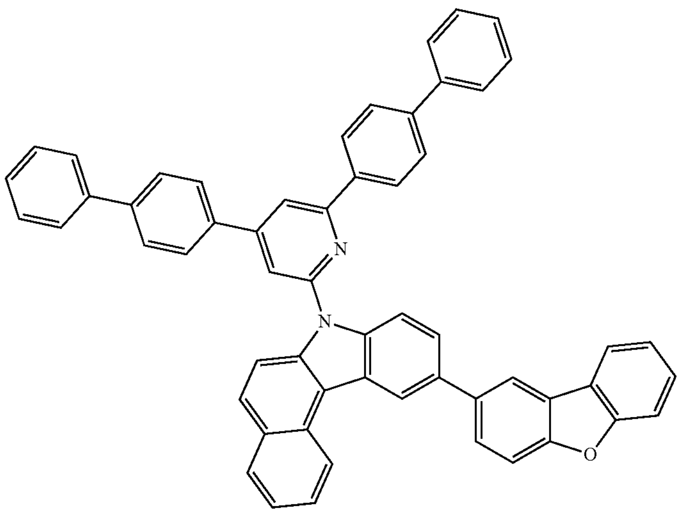
A-126
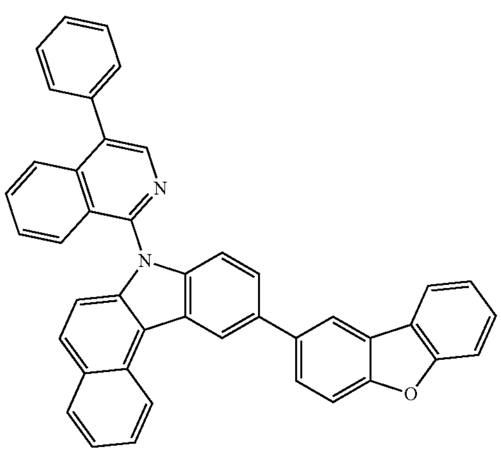
A-127
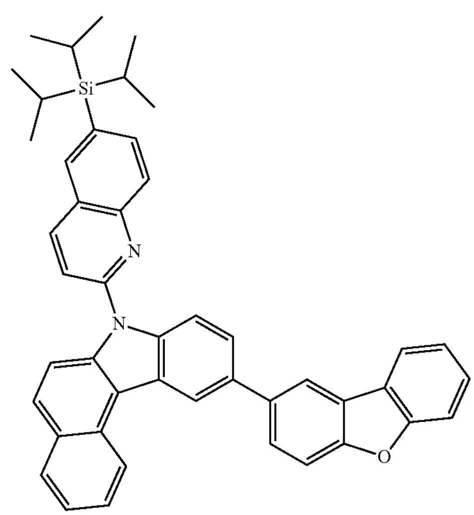

-continued
A-128
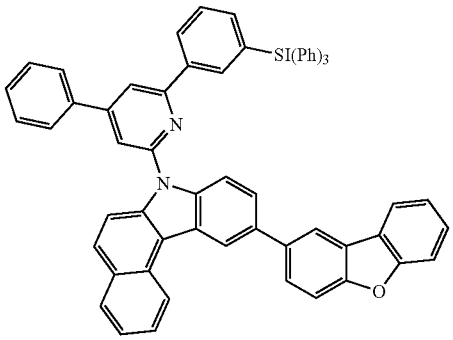
A-129
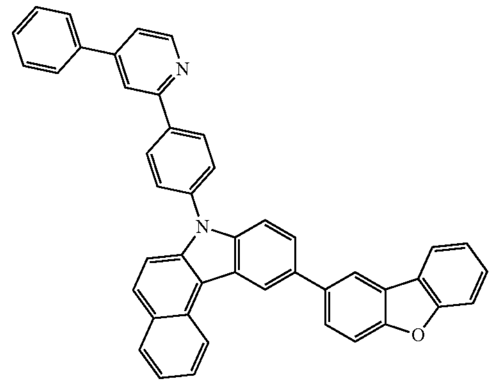
A-130
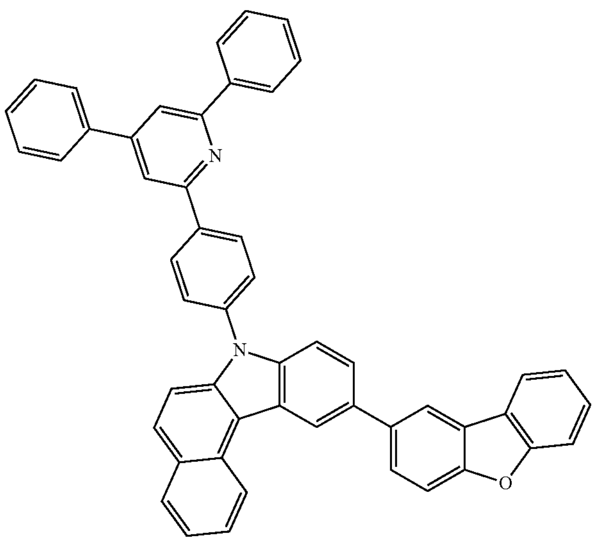
A-131
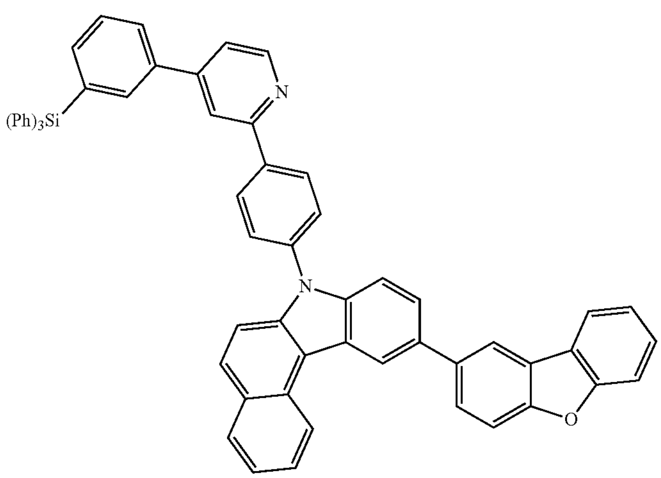

-continued
A-132
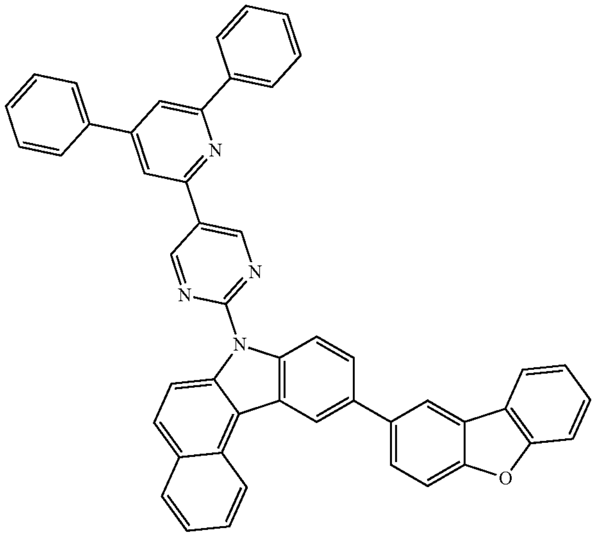
A-133
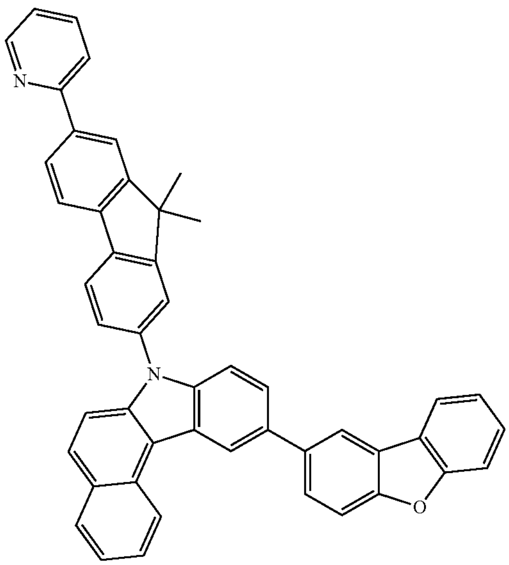
A-134
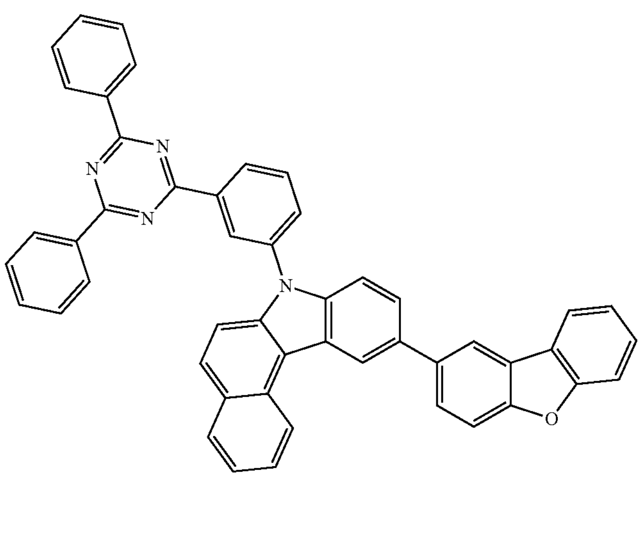

-continued
A-135
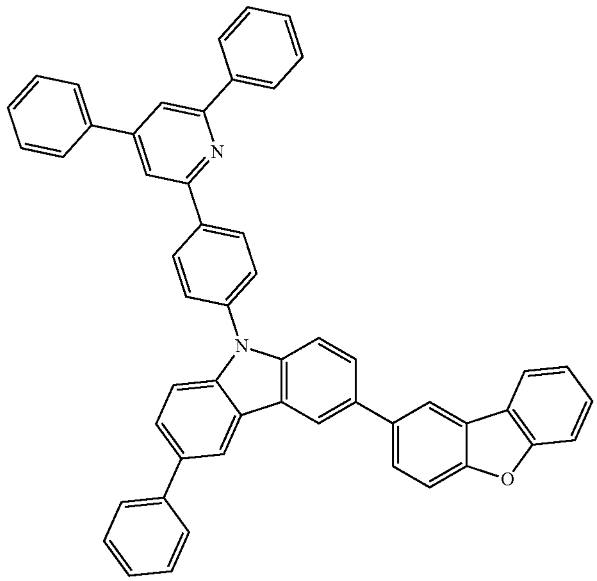
A-136
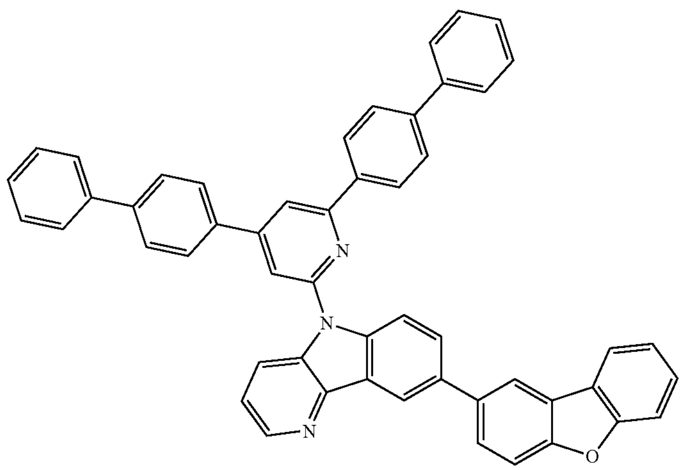
A-137
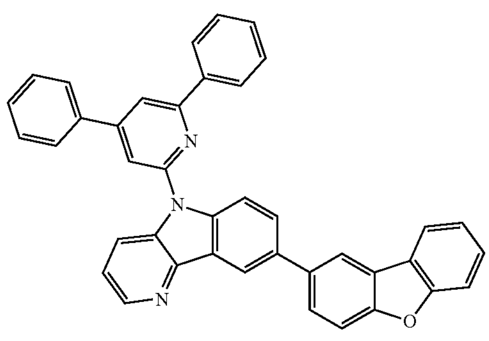
A-138
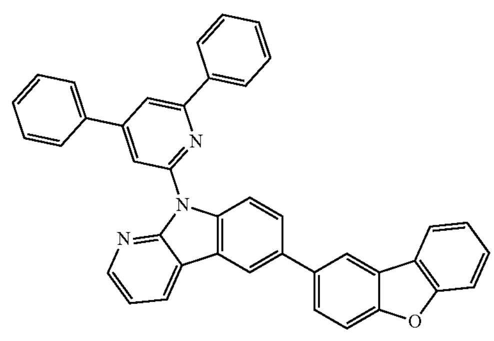

-continued
A-139
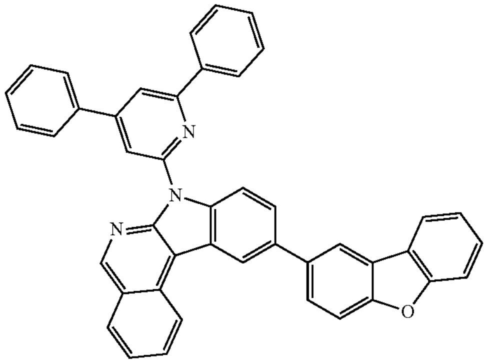
A-140
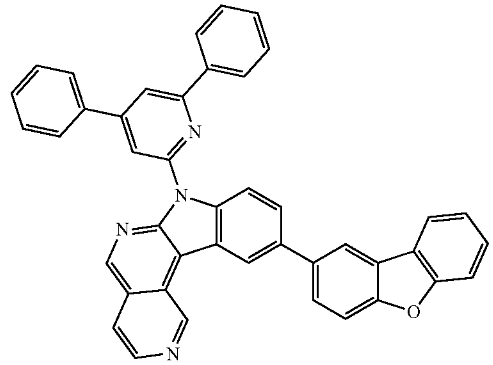
A-141
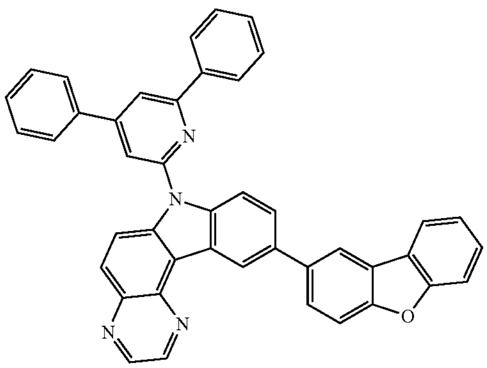
A-142
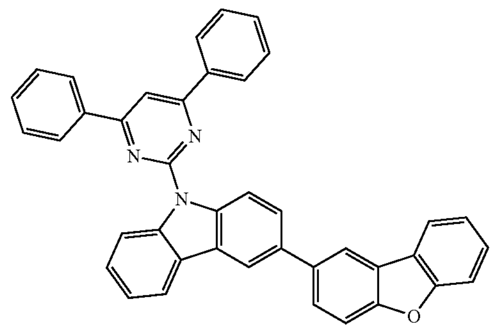
A-143
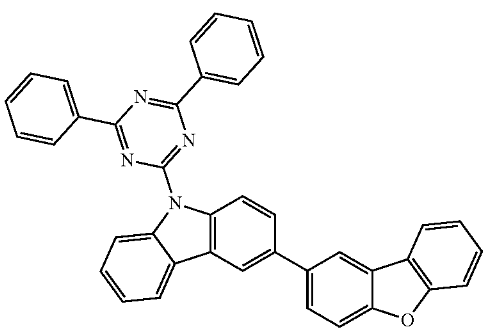
A-144
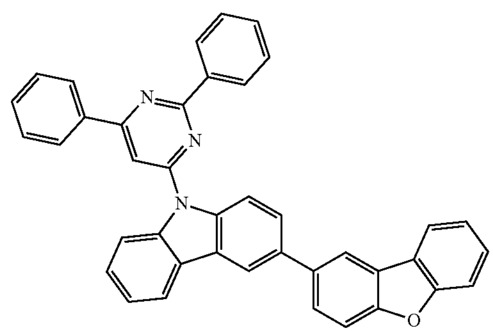
A-145
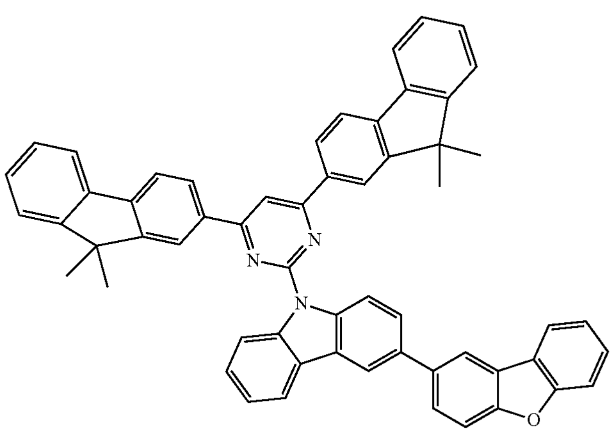

-continued
A-146
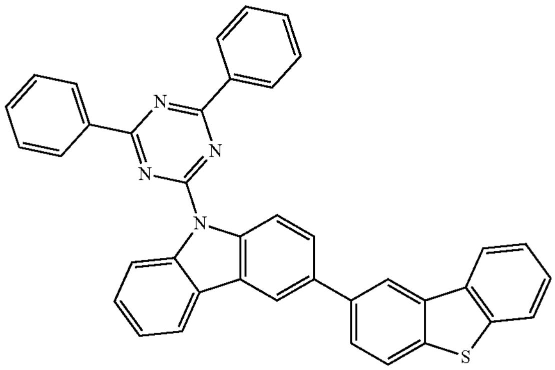
A-147
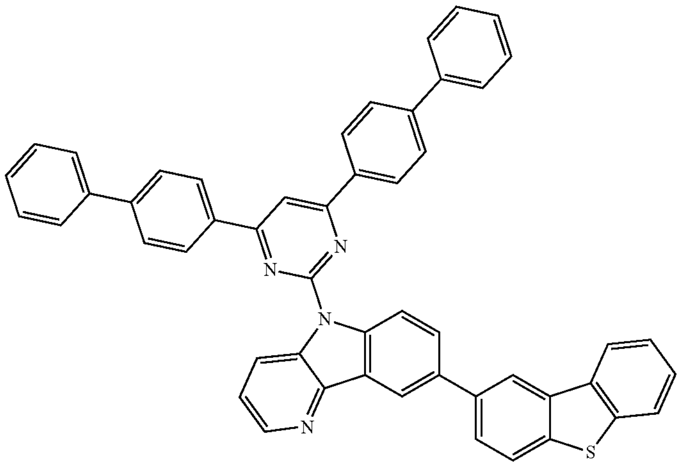
A-148
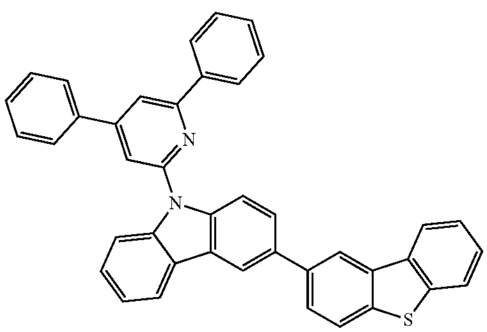
A-149
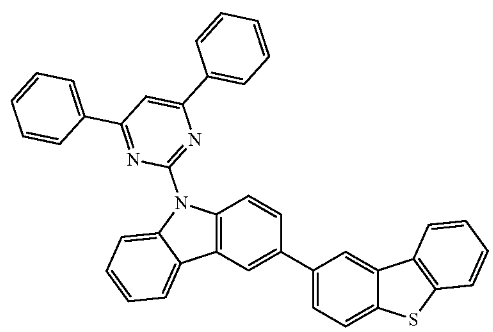
A-150
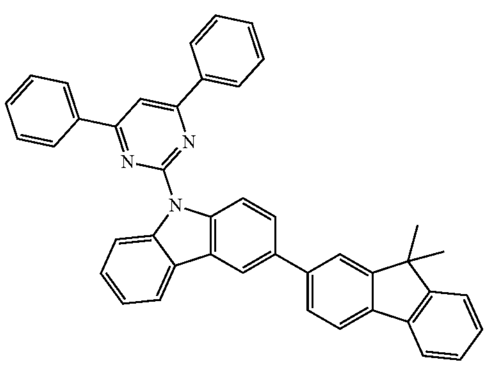
A-151
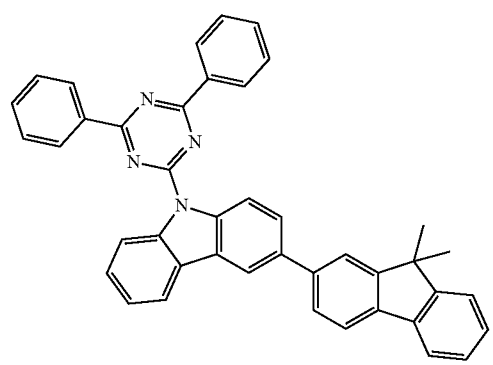

-continued
A-152
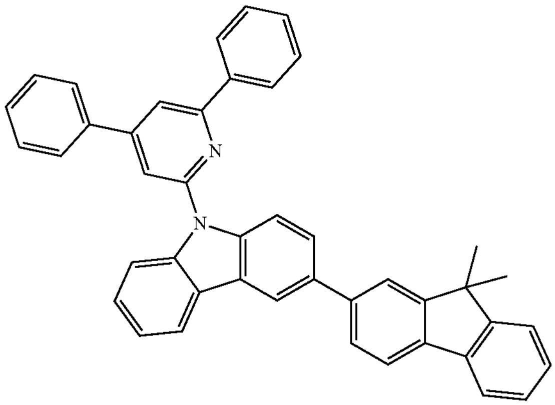
A-153
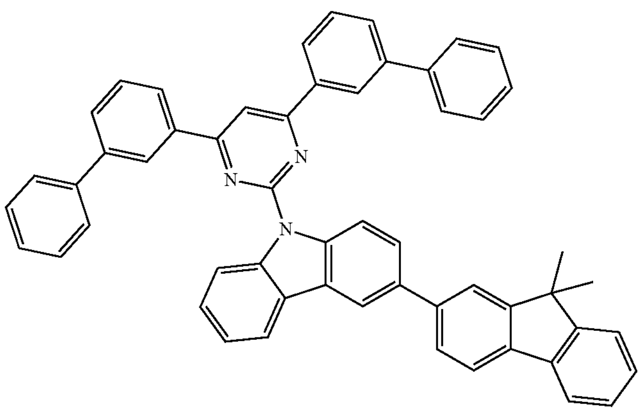
A-154
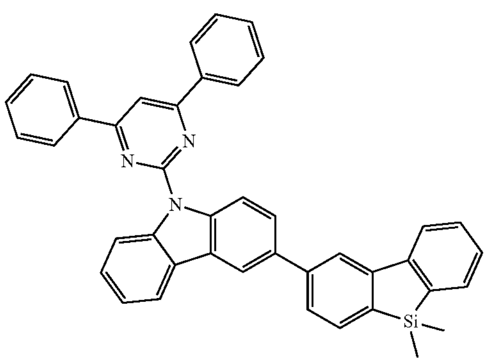
A-155
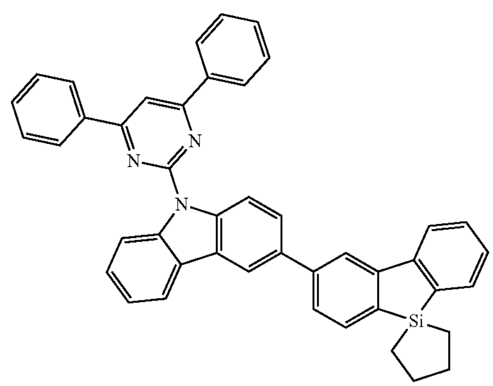
A-156
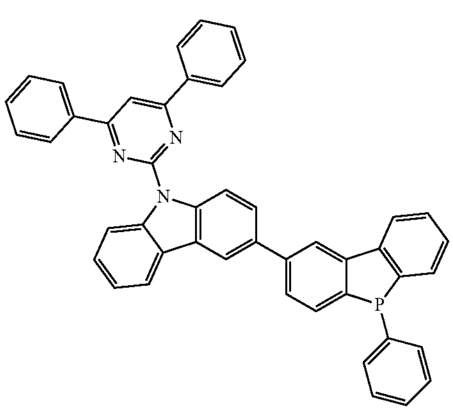
A-157
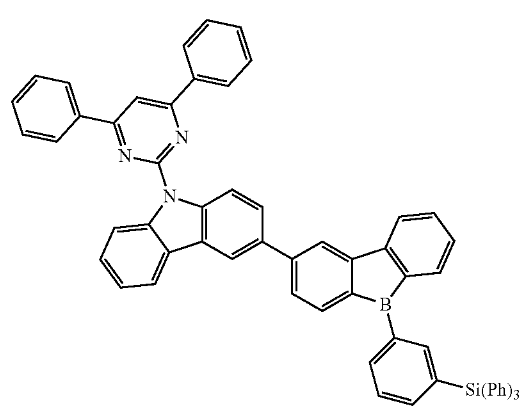

-continued
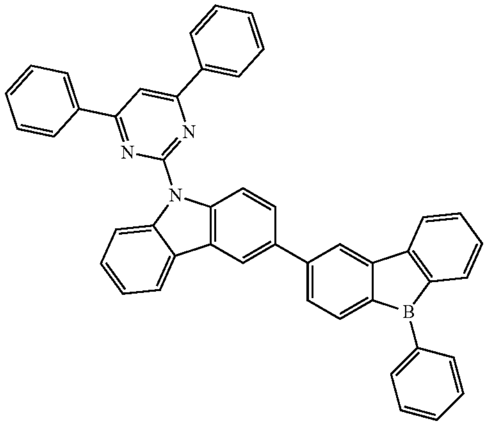
A-158
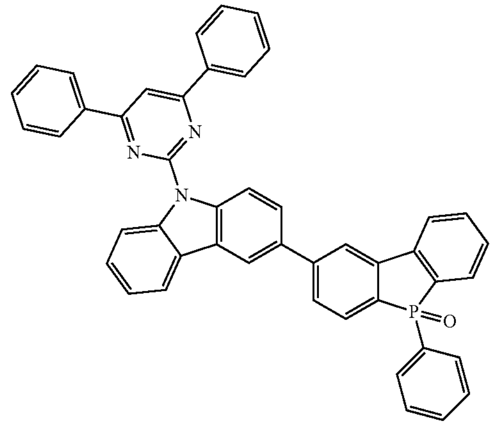
A-159
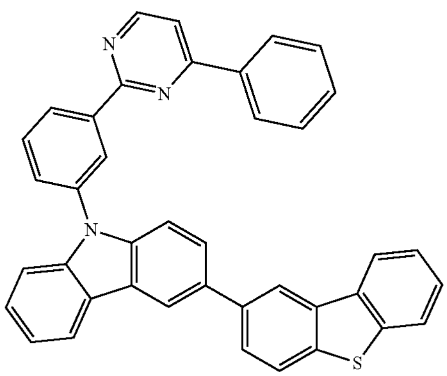
A-160
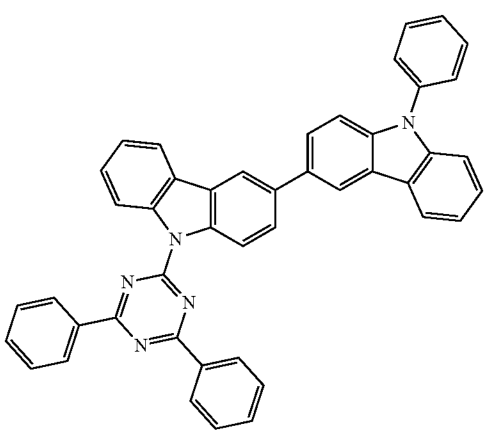
A-161
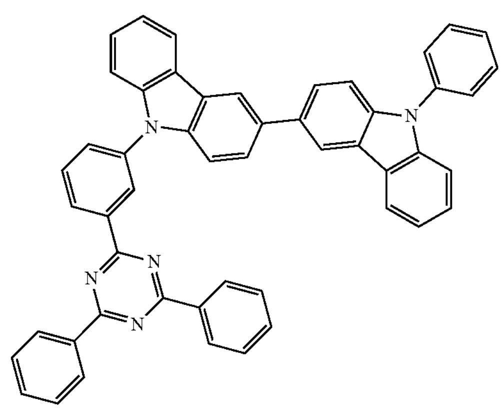
A-162

-continued
A-163
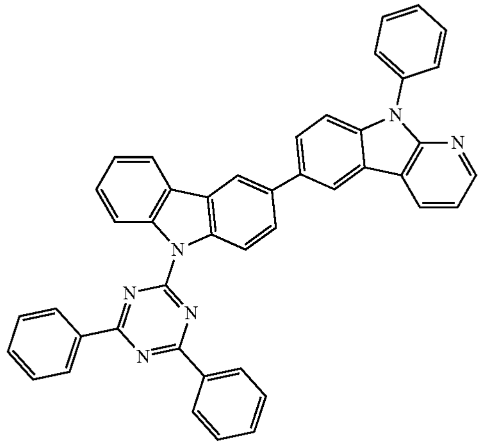
A-164
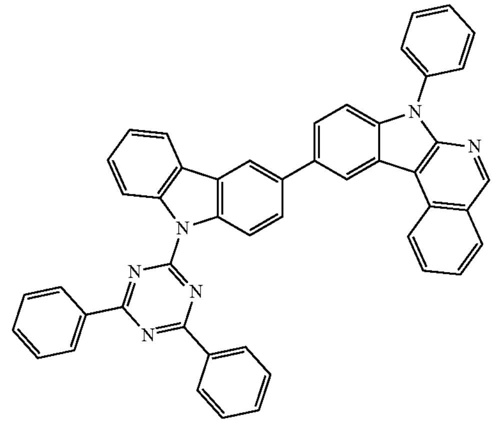
A-165
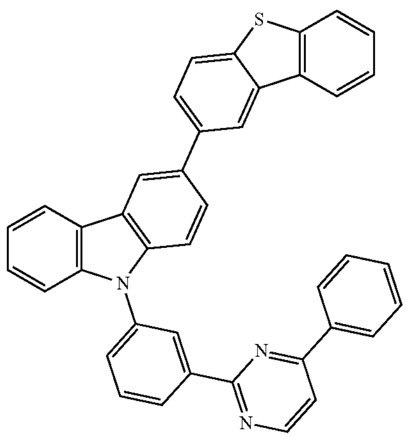
A-166
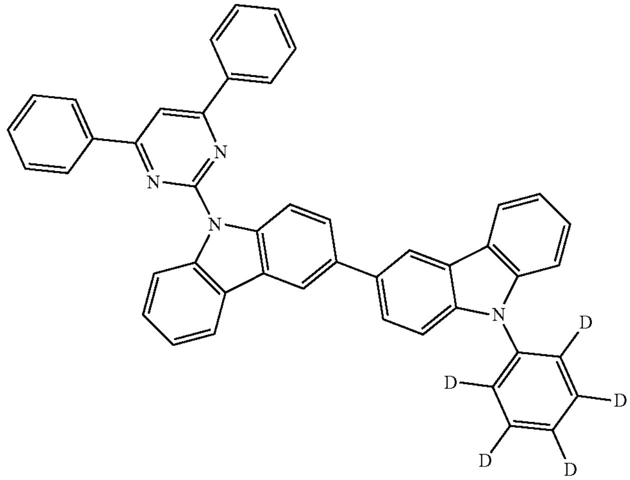

-continued
A-167
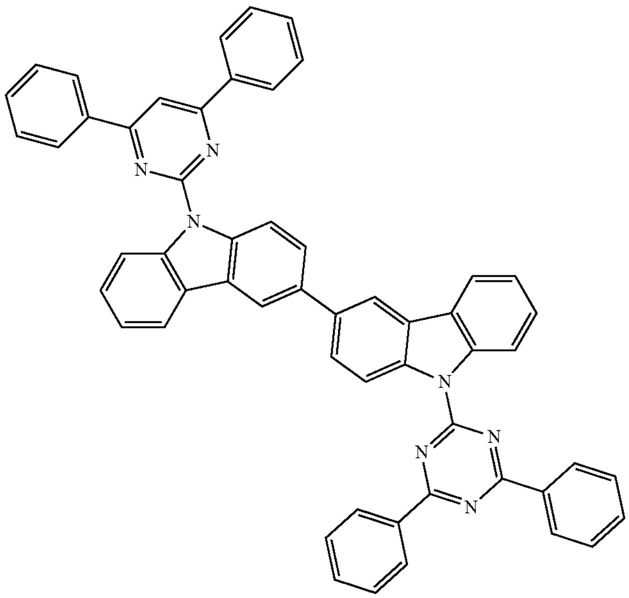
A-168
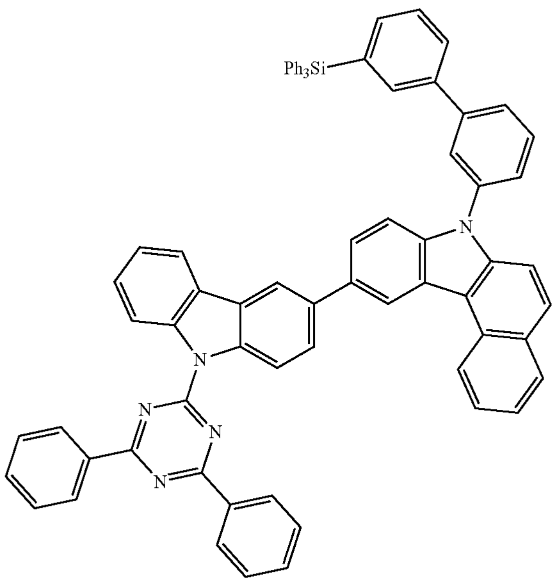
A-169
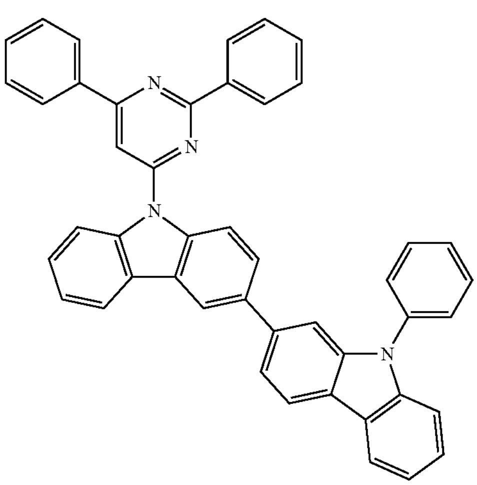
A-170
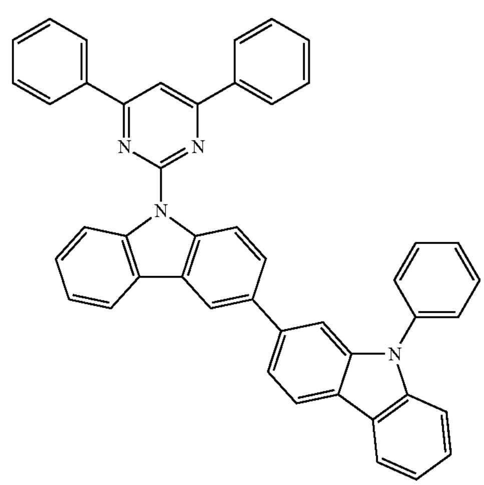

-continued
A-171
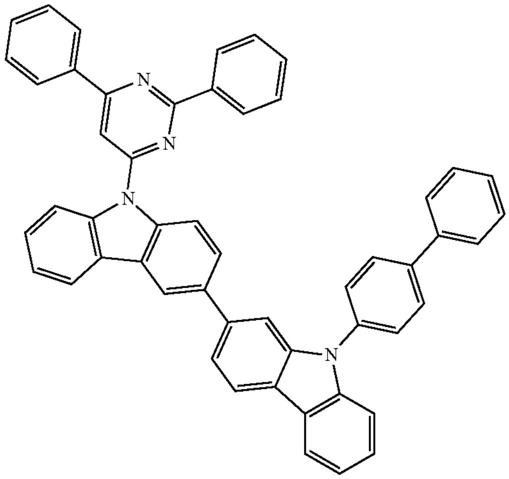
A-172
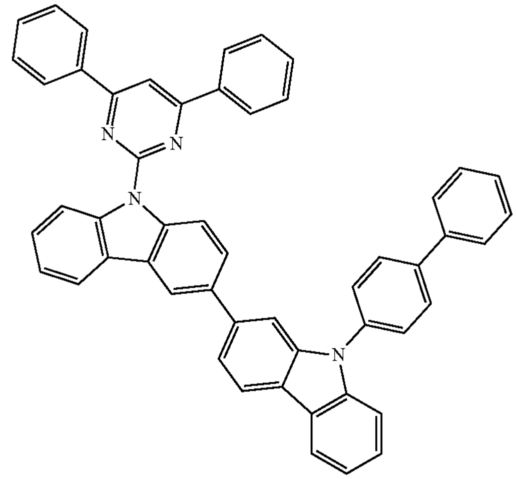
A-173
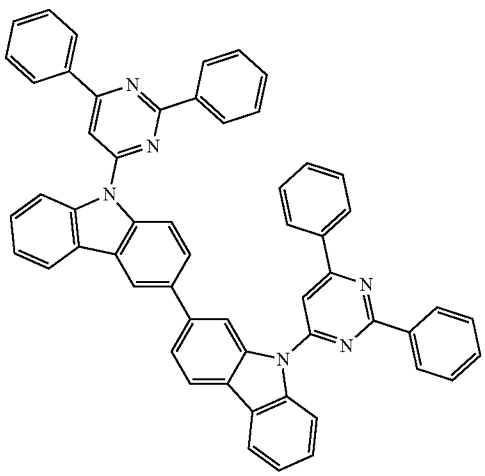
A-174
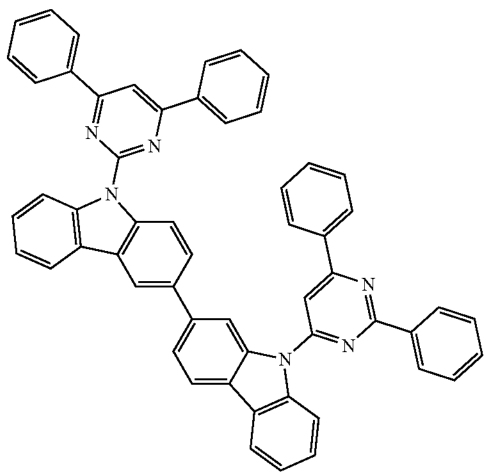
A-175
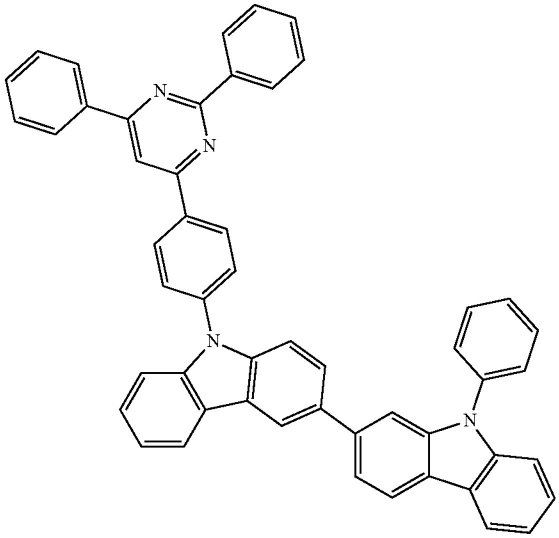

-continued
A-176
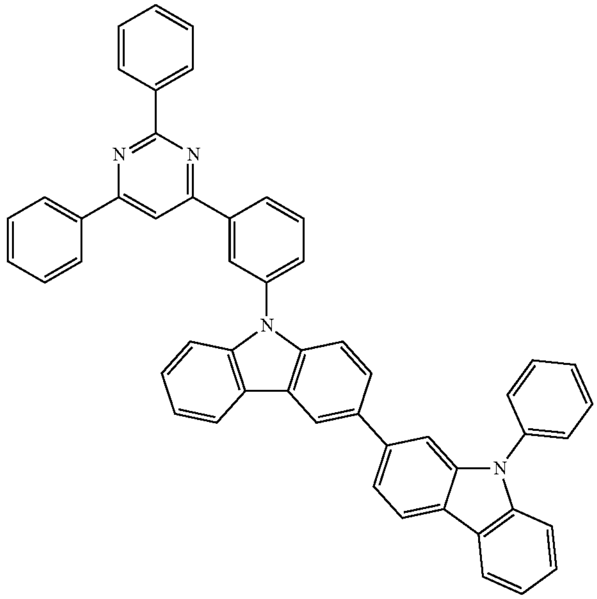
A-177
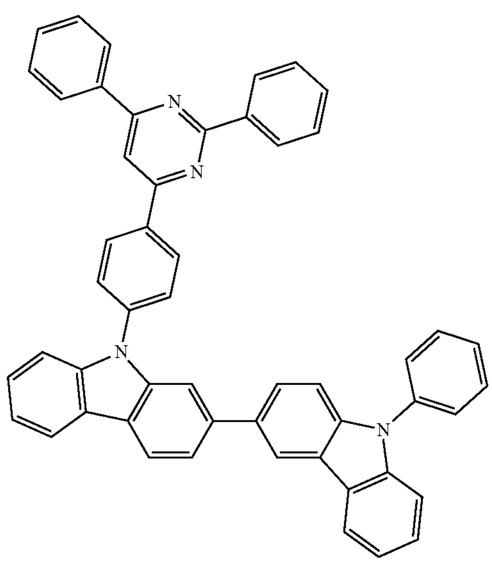
A-178
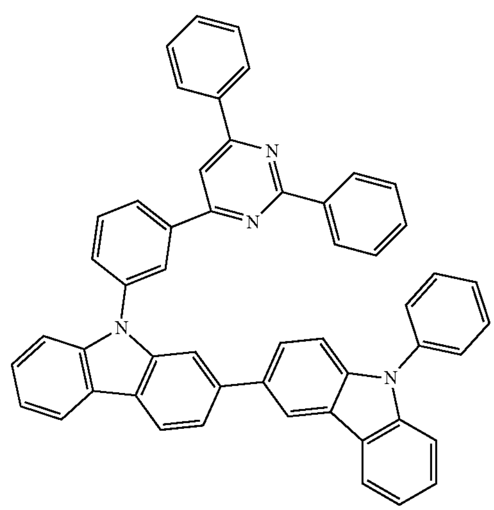

-continued
A-179
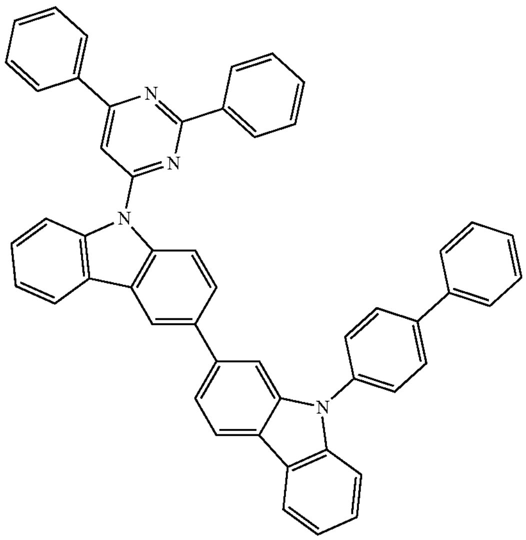
A-180
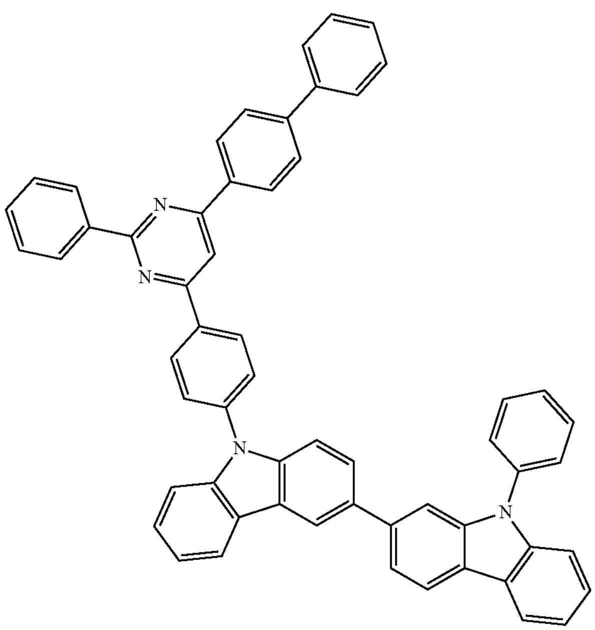

-continued
A-181
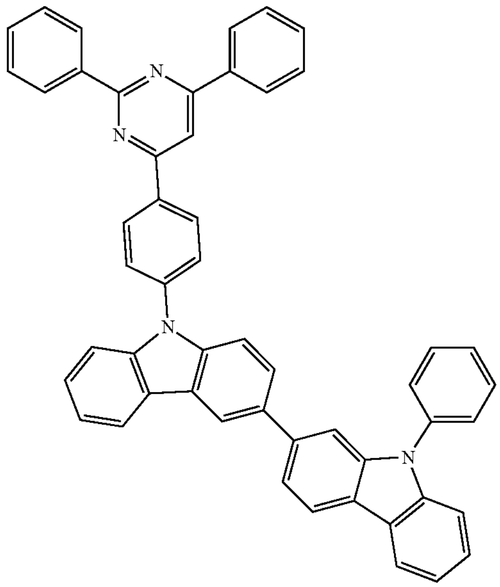
A-182
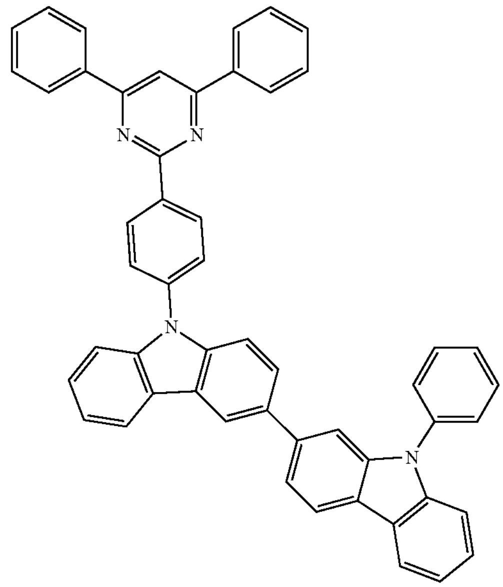
A-183
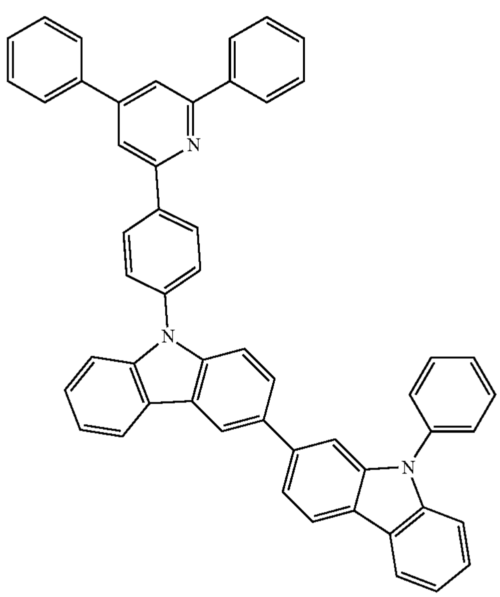
A-184
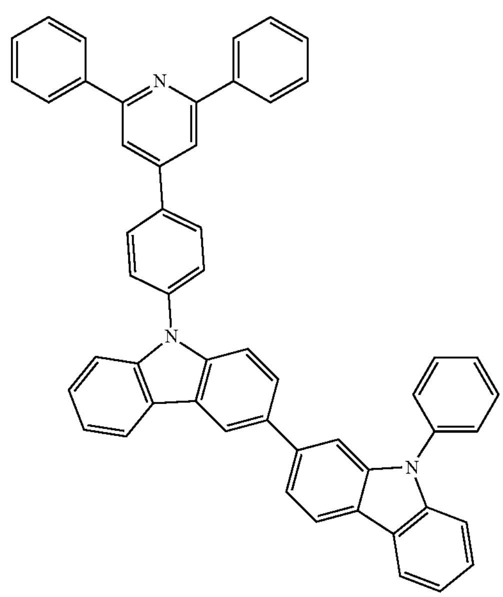

-continued
A-185
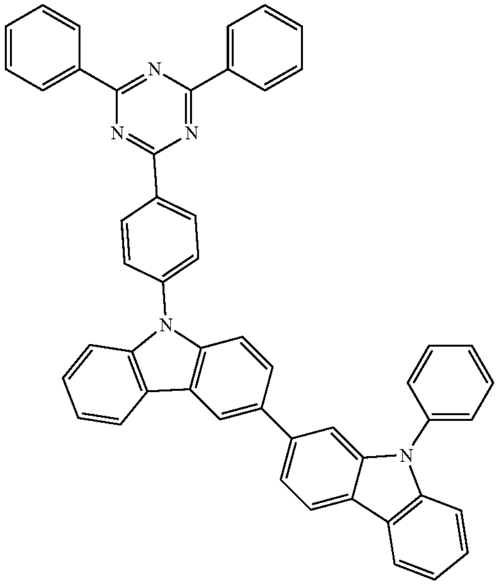
A-186
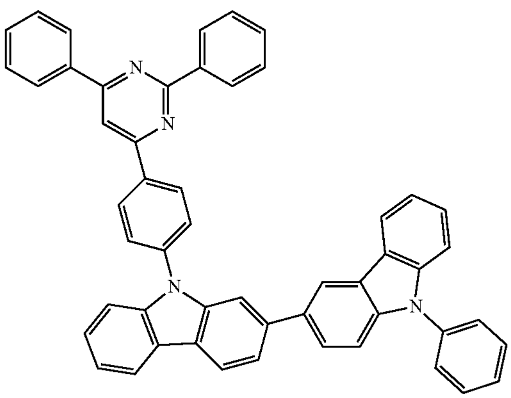
A-187
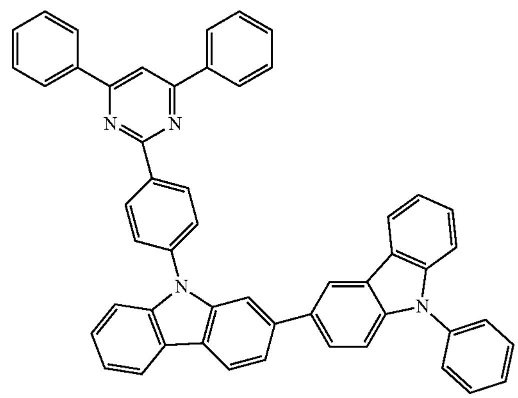
A-188
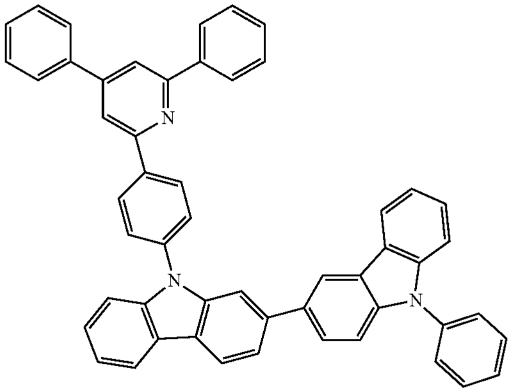
A-189
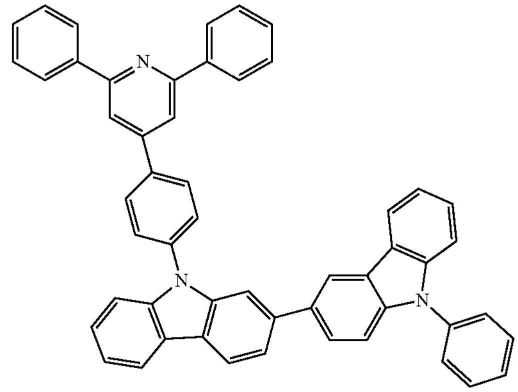

-continued
A-190
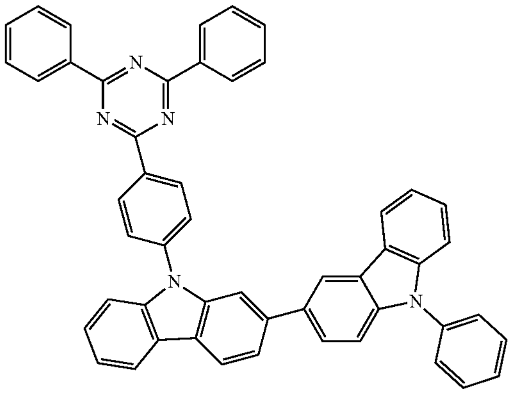
A-191
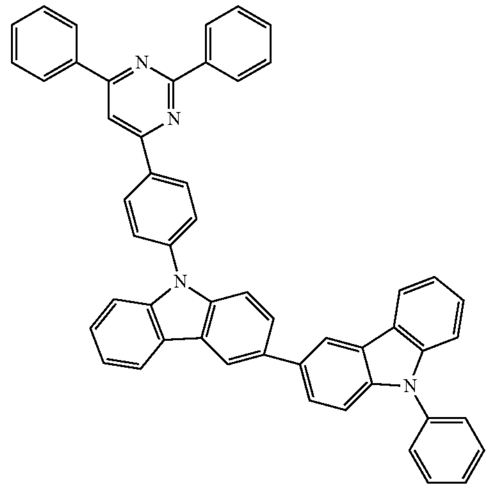
A-192
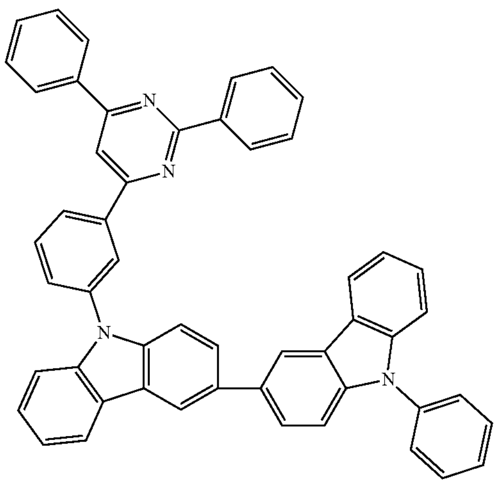
A-193
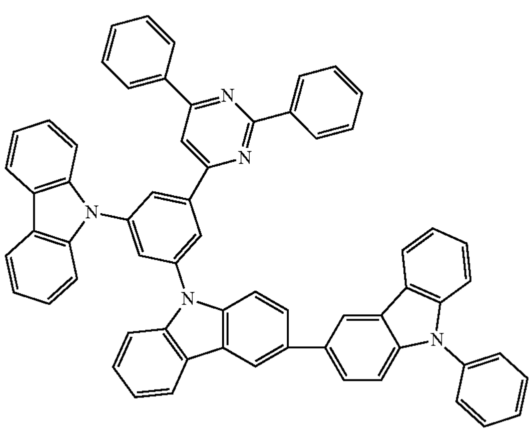
A-194
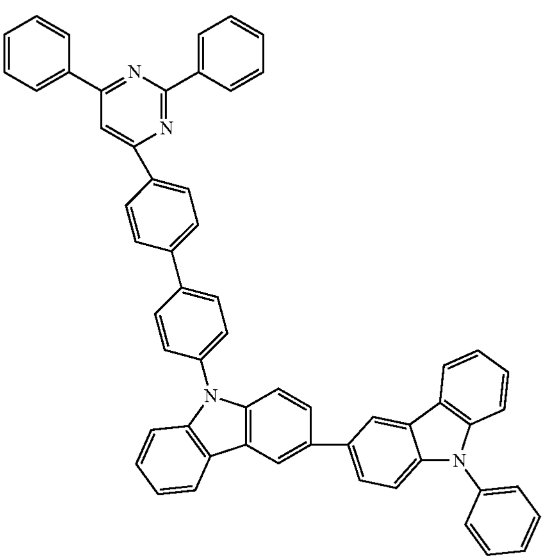

-continued
A-195
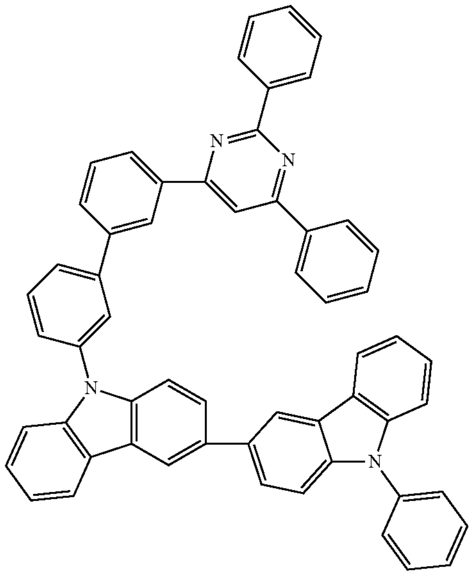
A-196
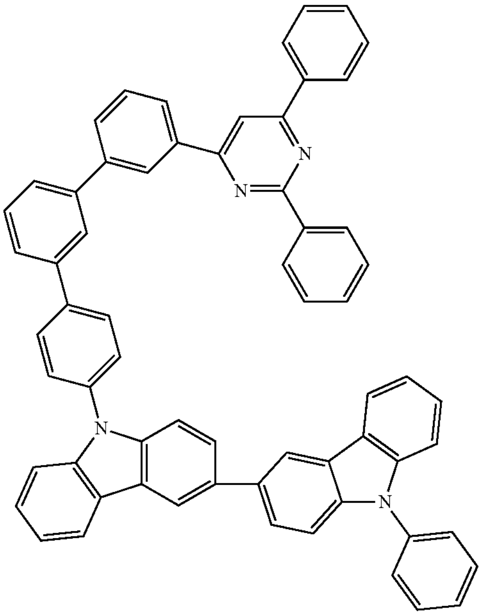
A-197
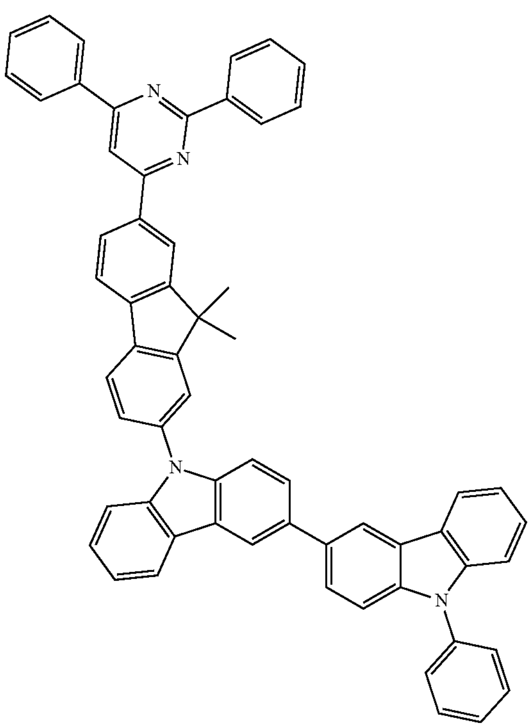

-continued
A-198
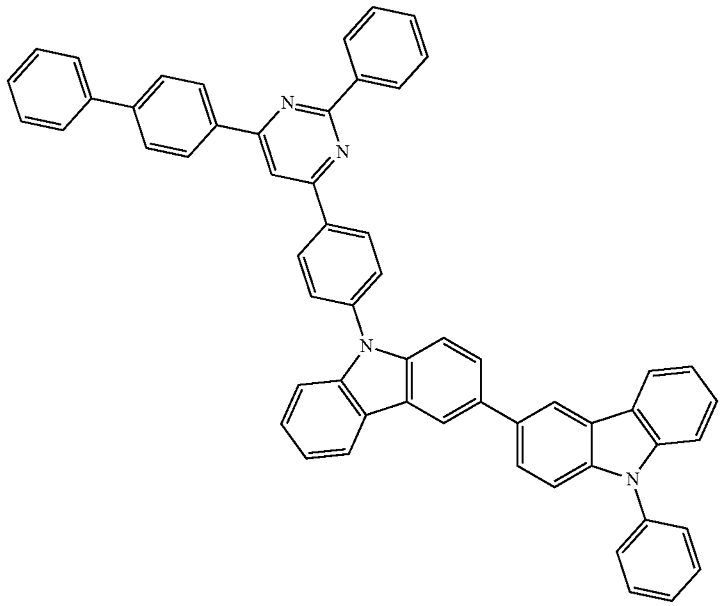
A-199
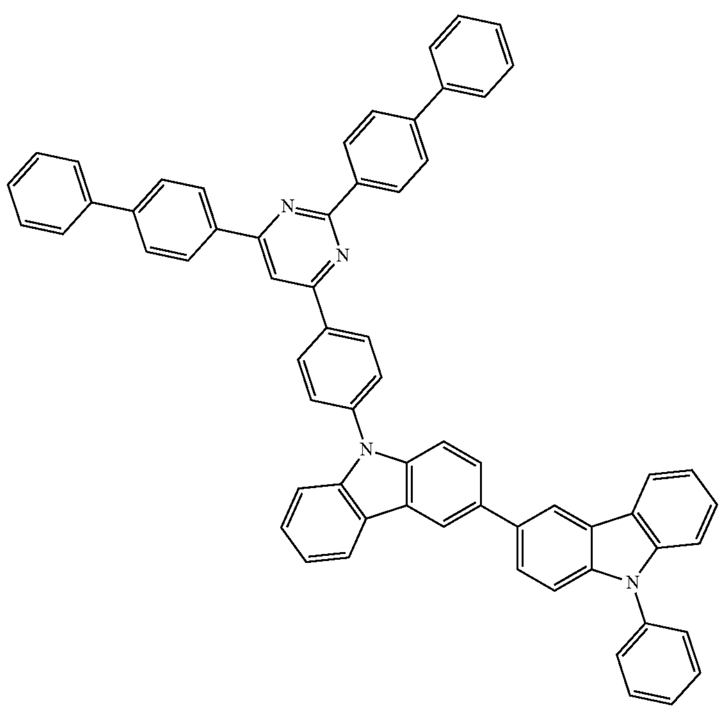

-continued
A-200
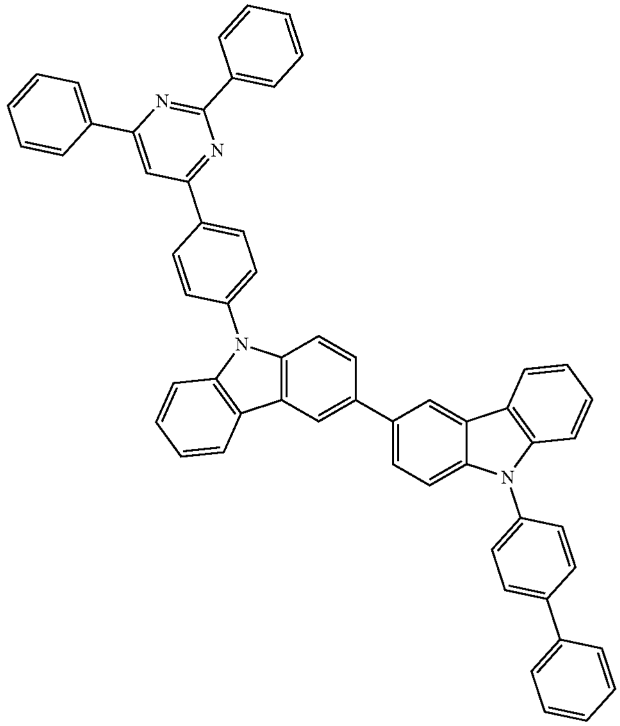
A-201
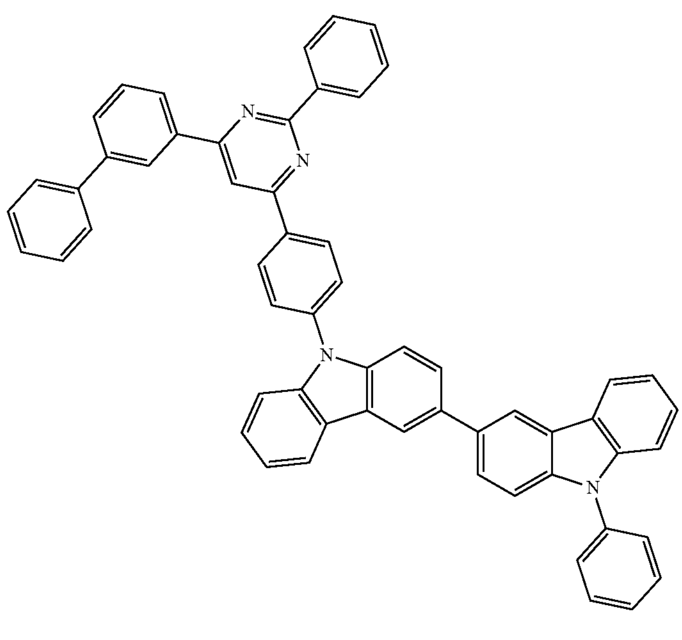

-continued
A-202
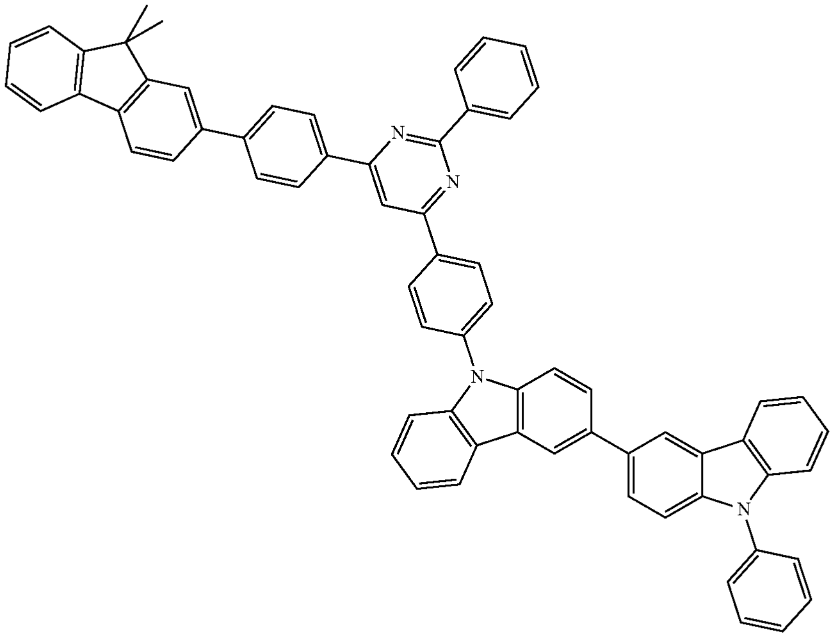
A-203
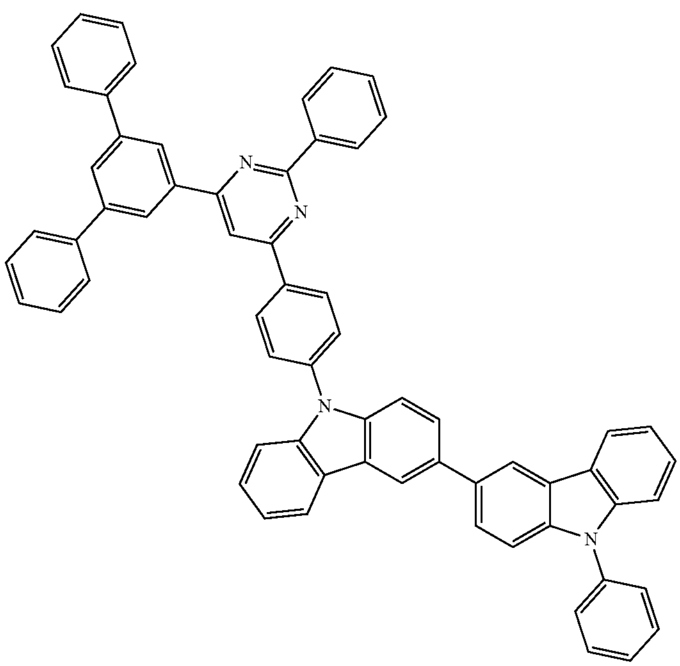

-continued
A-204
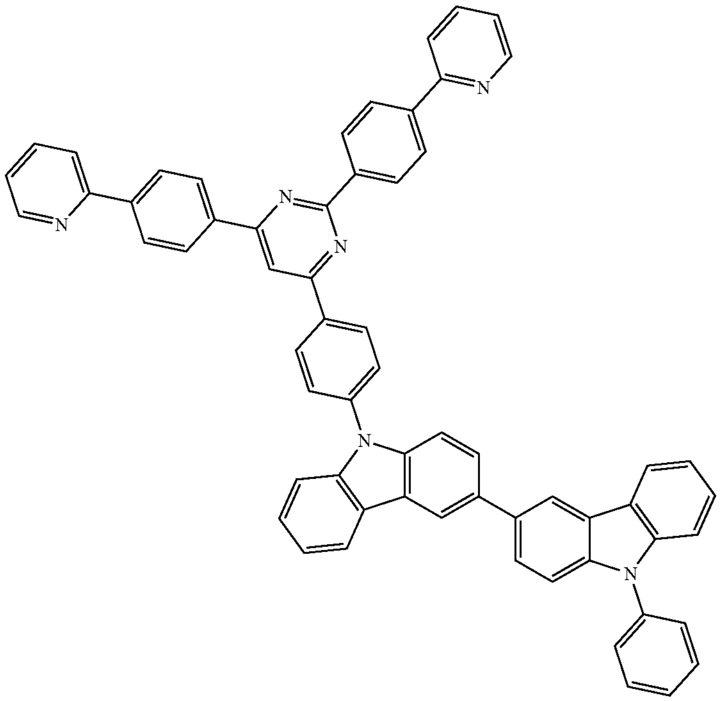
A-205
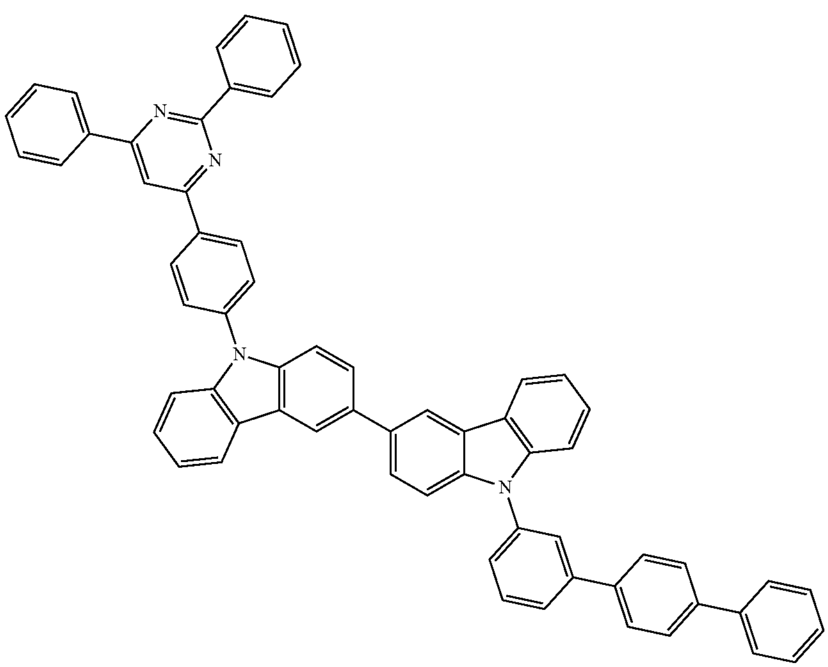

-continued
A-206
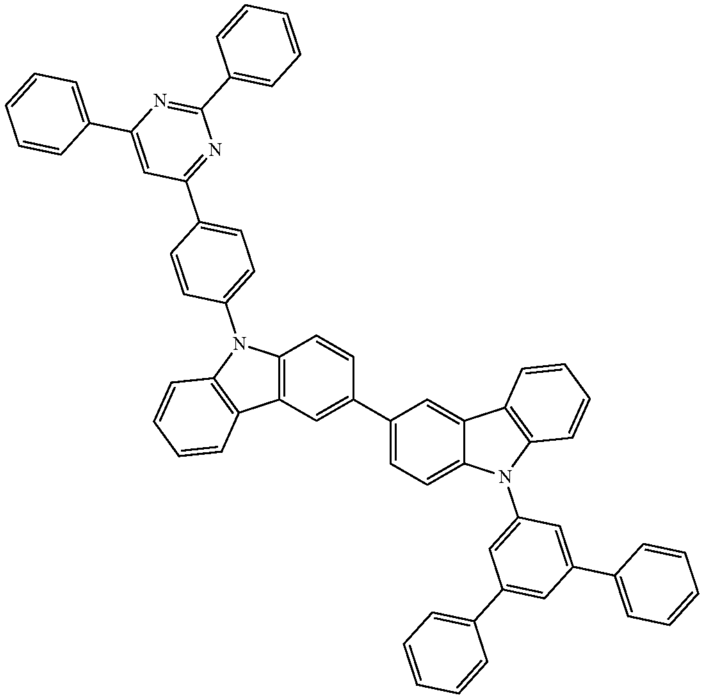
A-207
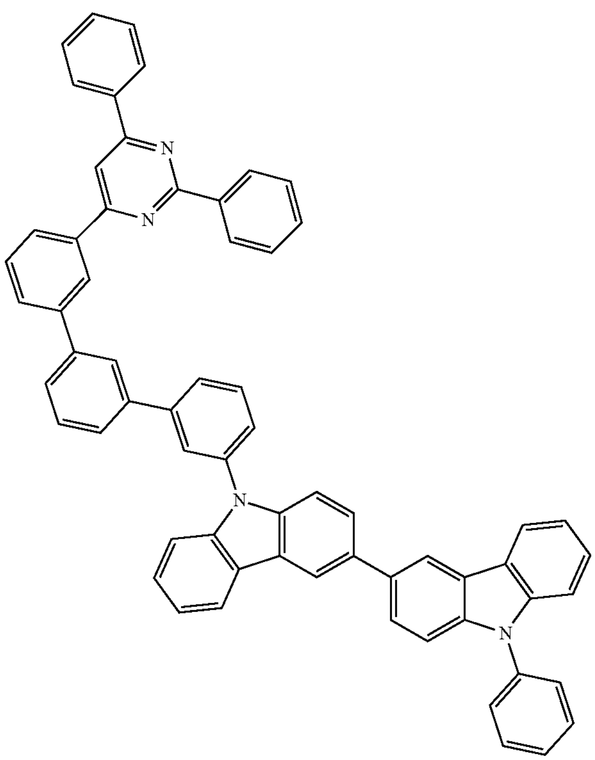

-continued
A-208
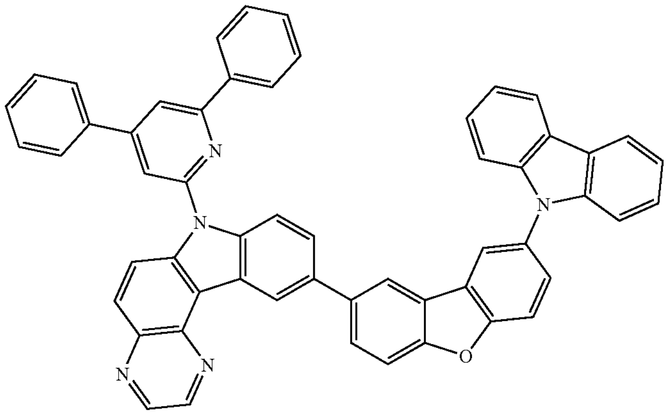
A-209
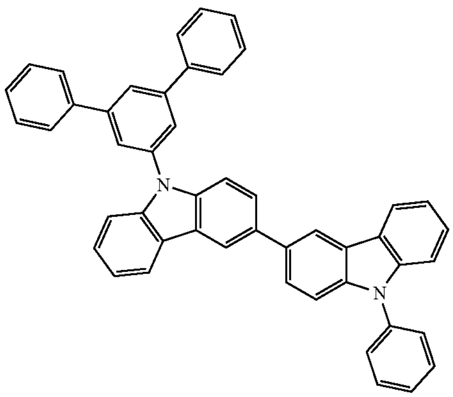
A-210
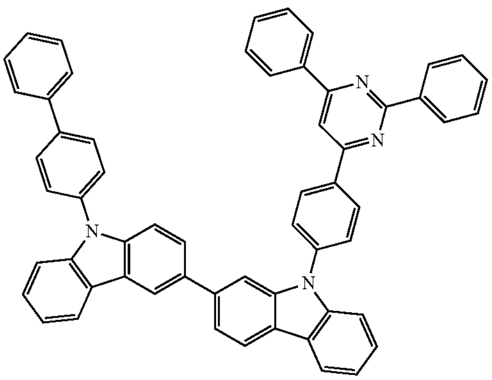
A-211
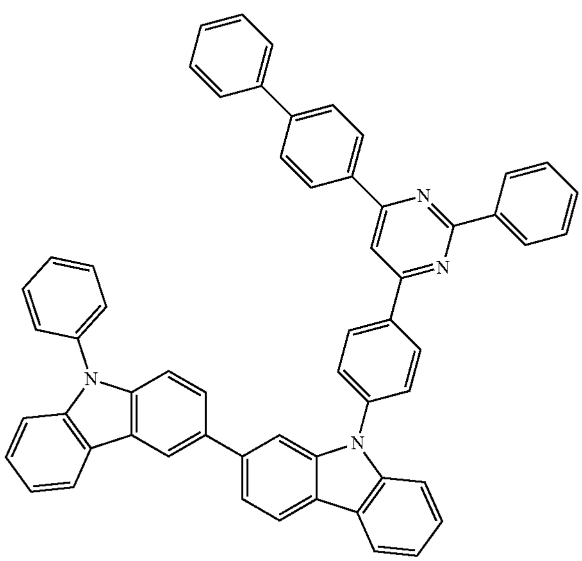

-continued
A-212
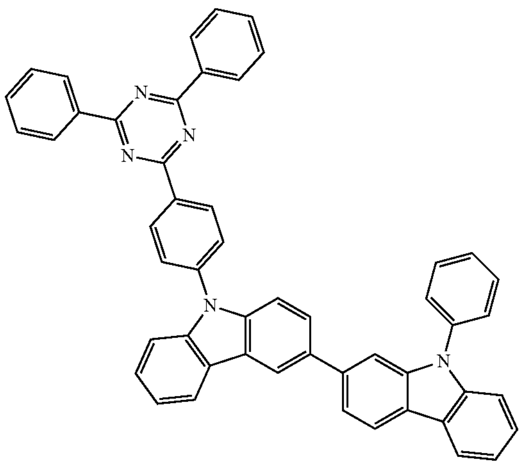
A-213
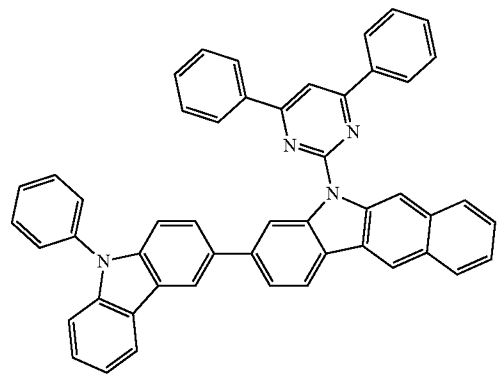
A-214
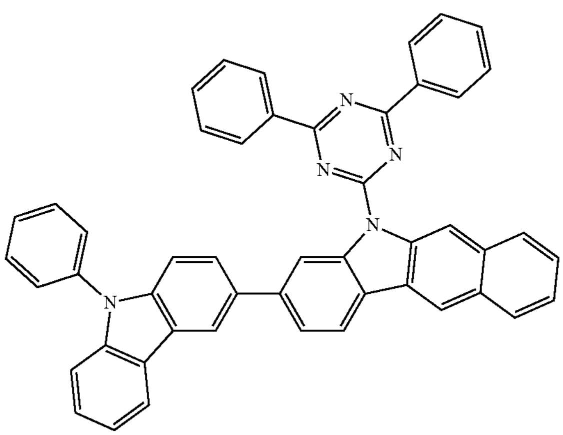
A-215
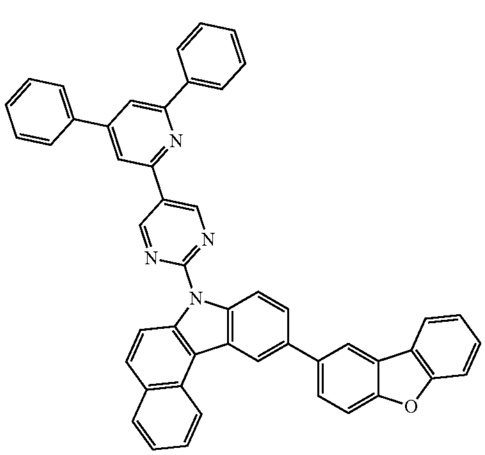
A-216
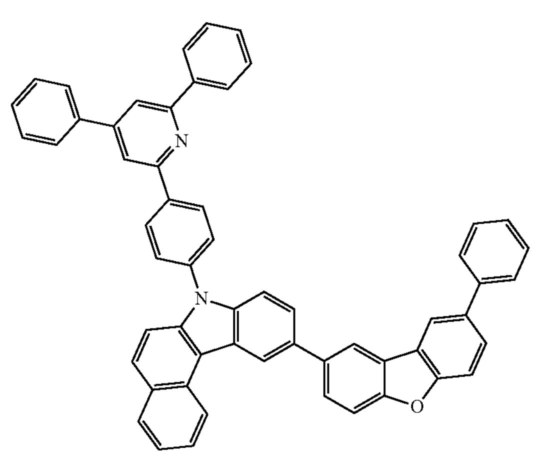

-continued
A-217
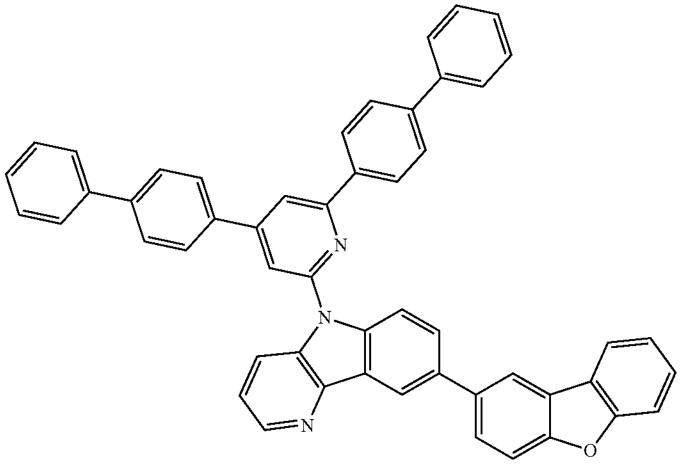
A-218
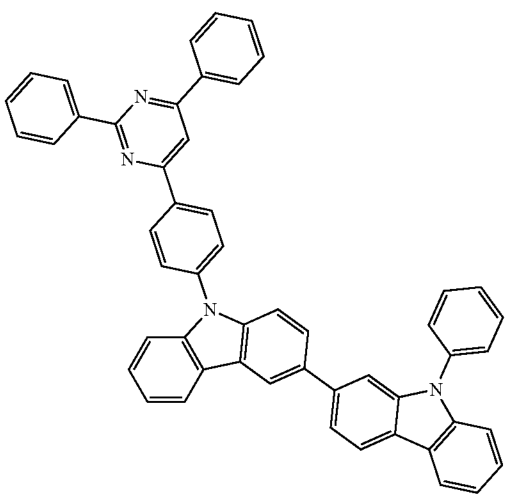
A-219
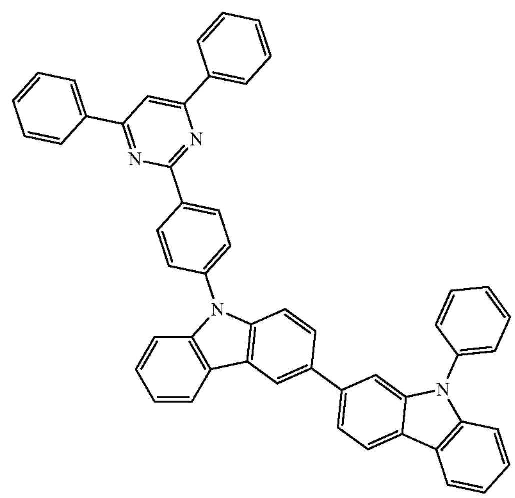
A-220
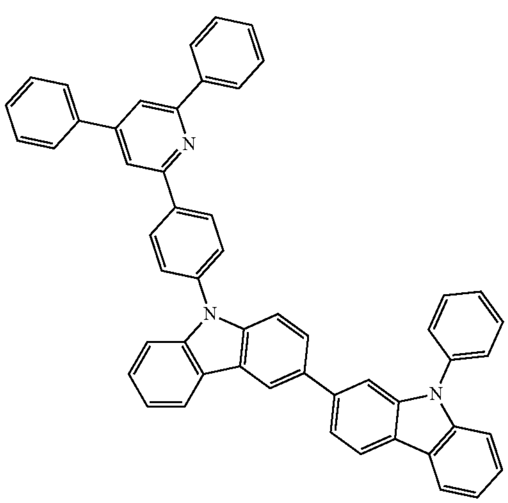
A-221
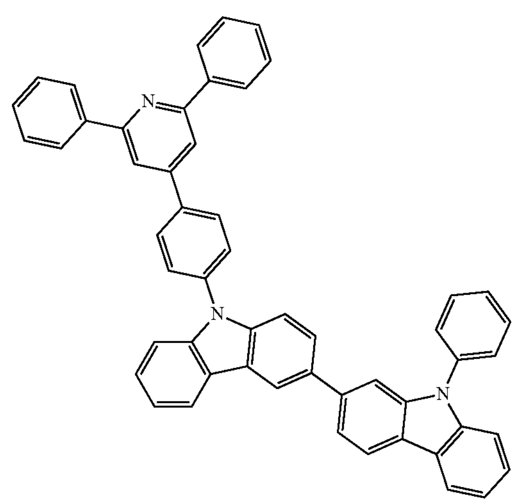

B-101
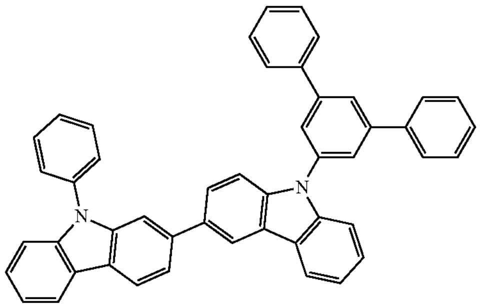
B-102
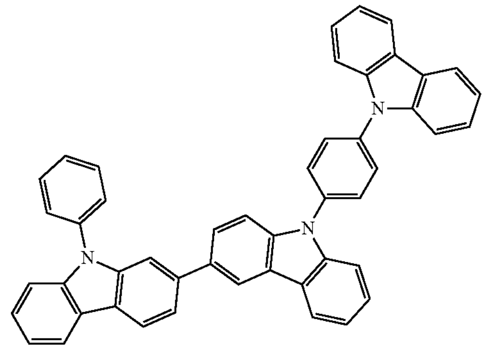
B-103
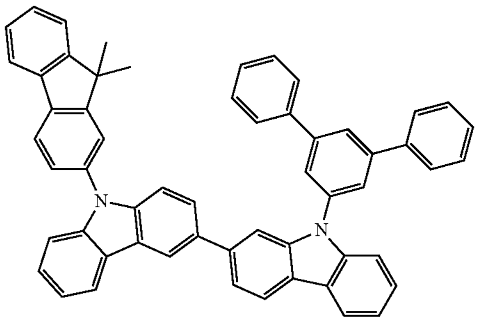
B-104
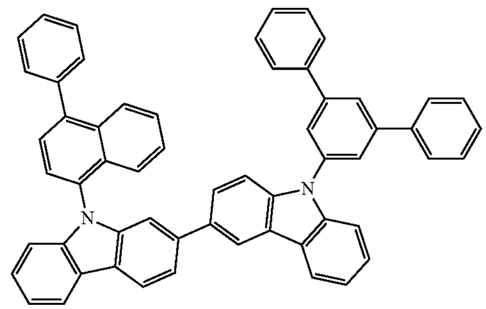
B-105
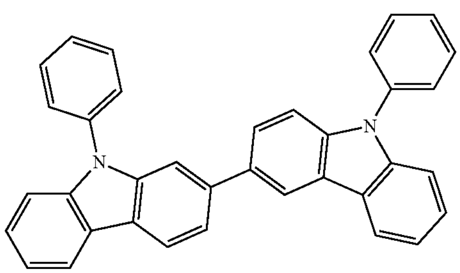
B-106
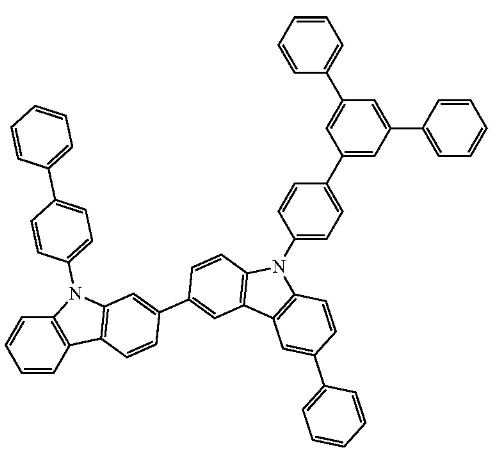
B-107
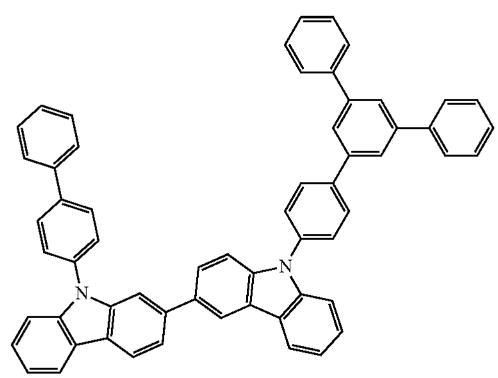

-continued
B-108
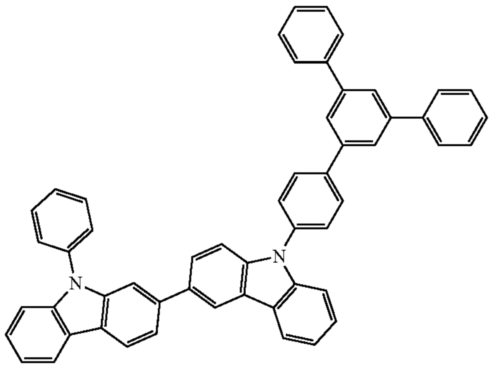
B-109
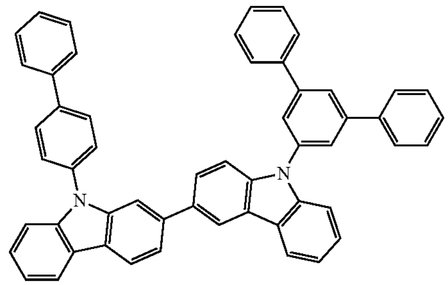
B-110
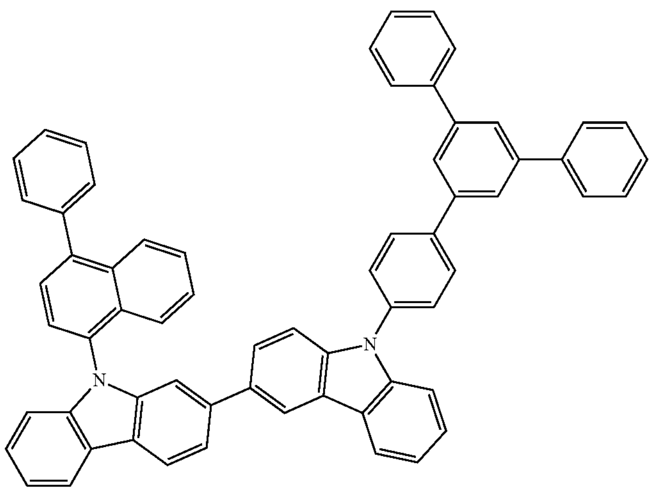
B-111
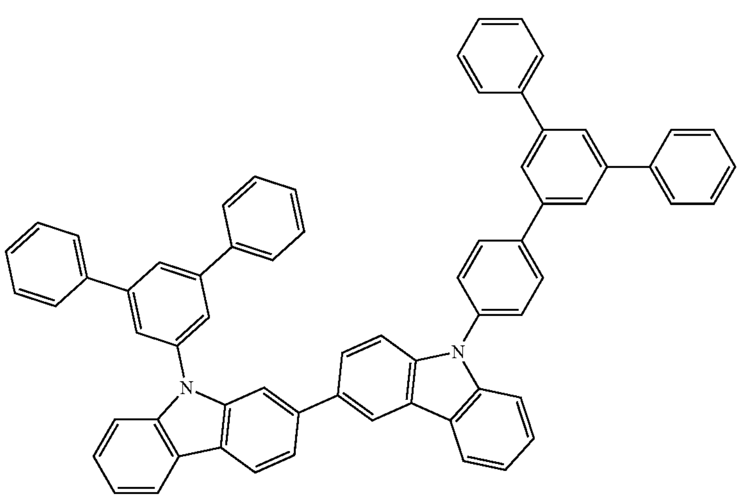

-continued
B-112
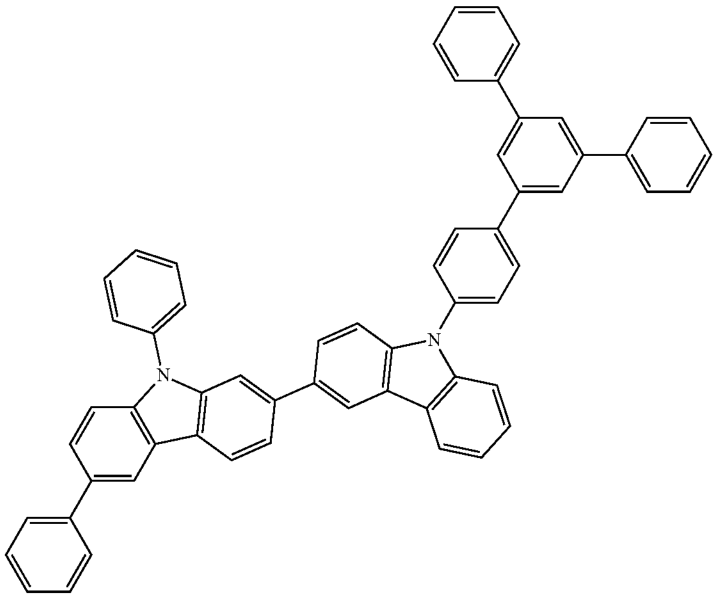
B-113
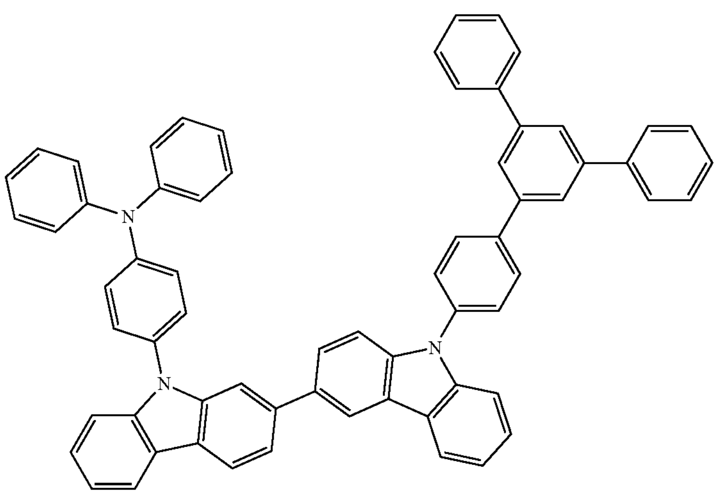
B-114
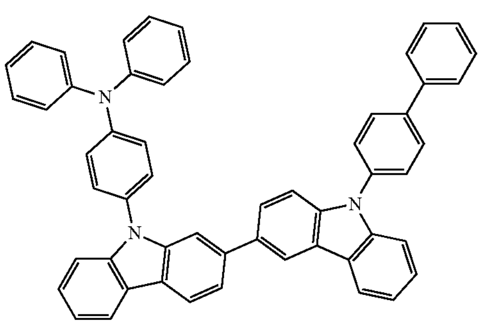
B-115
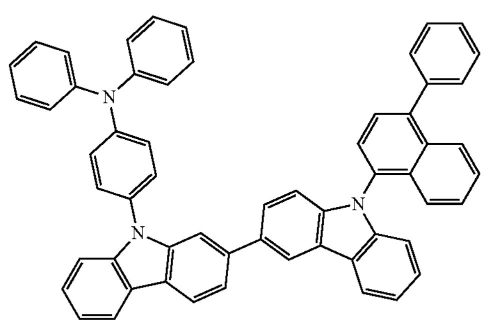

-continued
B-116
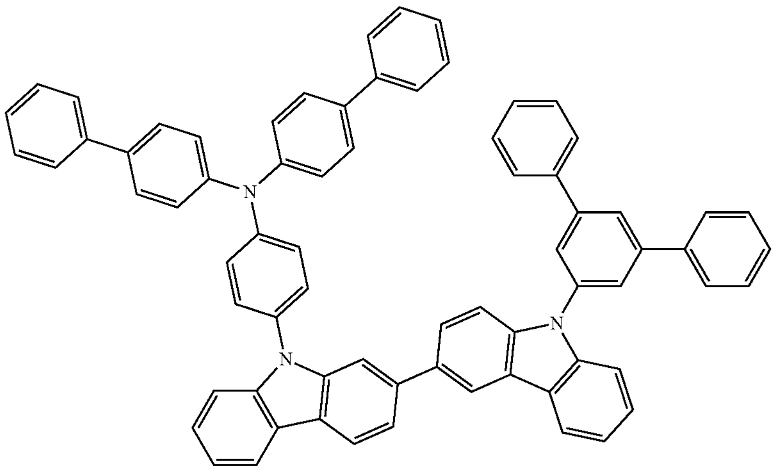
B-117
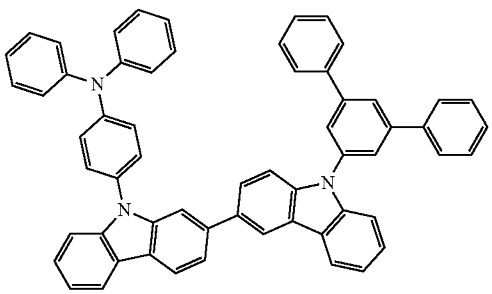
B-118
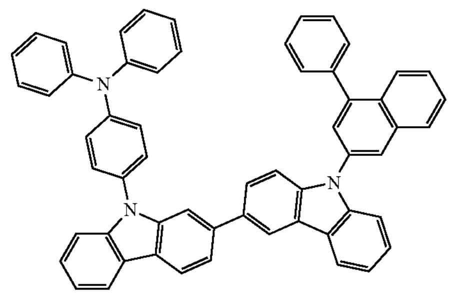
B-119
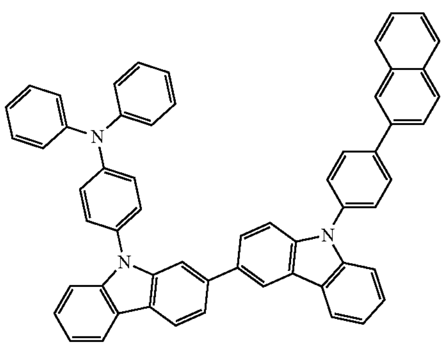
B-120
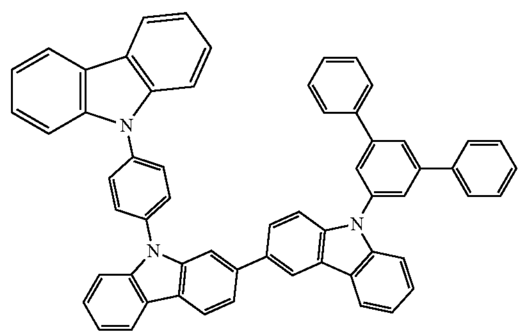
B-121
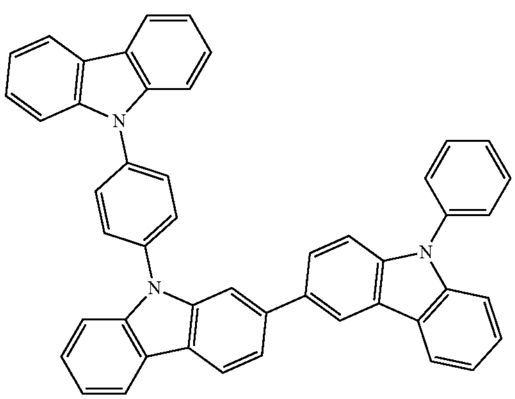

-continued
B-122
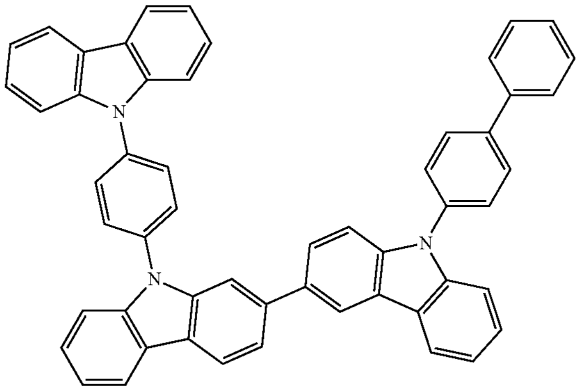
B-123
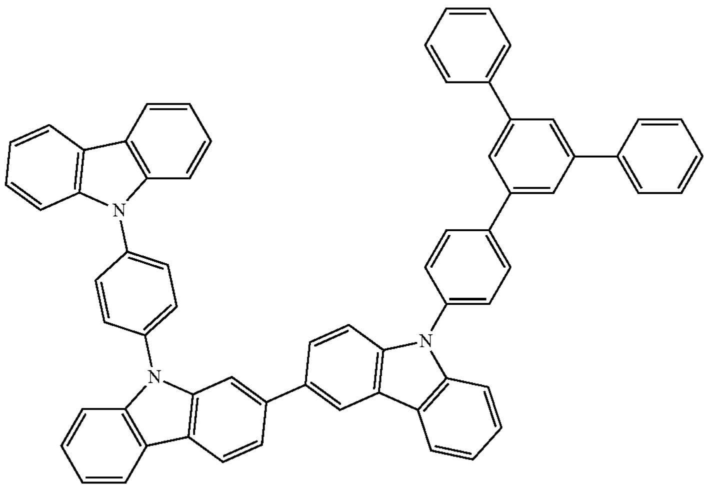
B-124
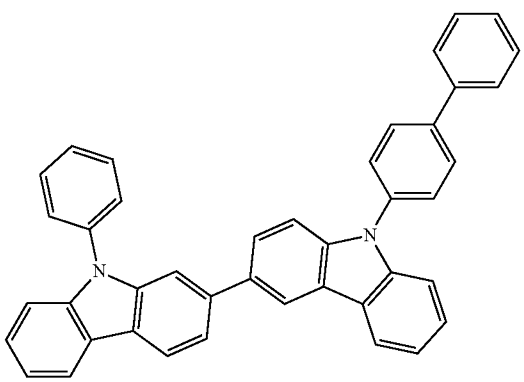
B-125
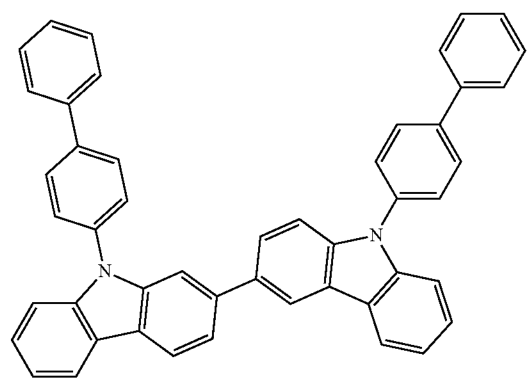
B-126
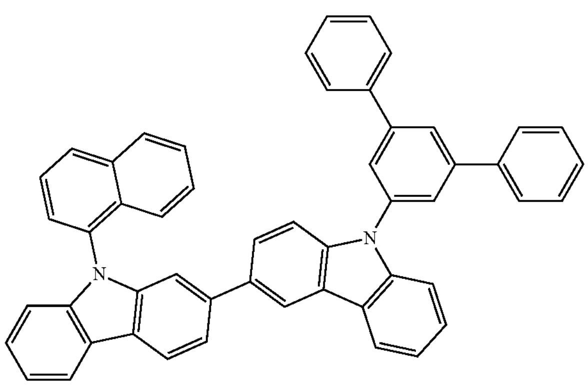

-continued
B-127
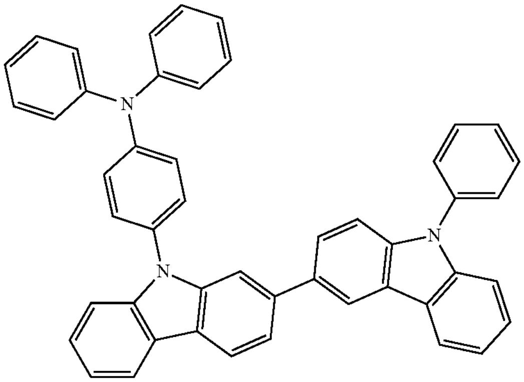
B-128
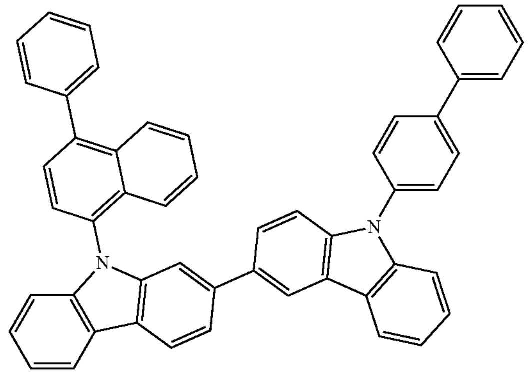
B-129
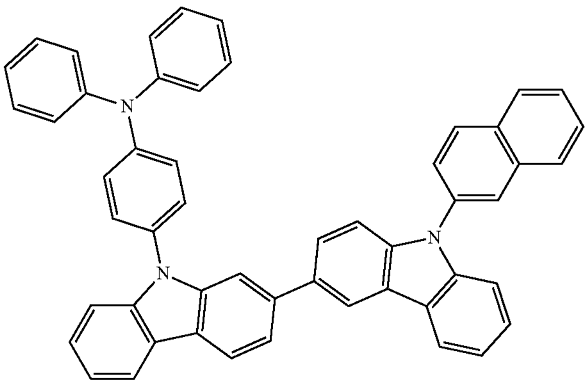
B-130
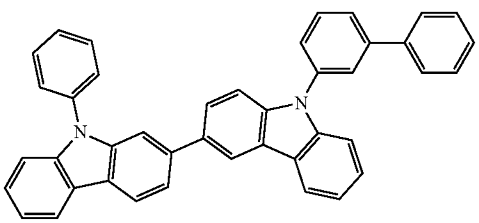
B-131
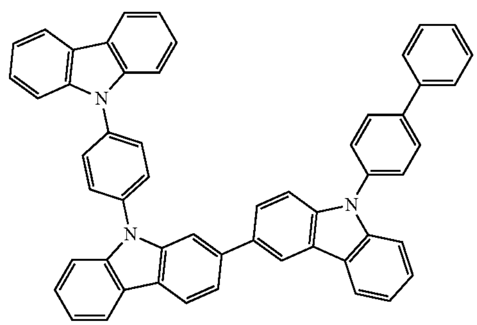
B-132
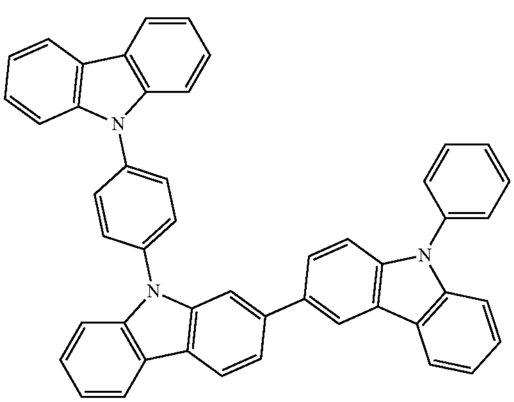

-continued
B-133
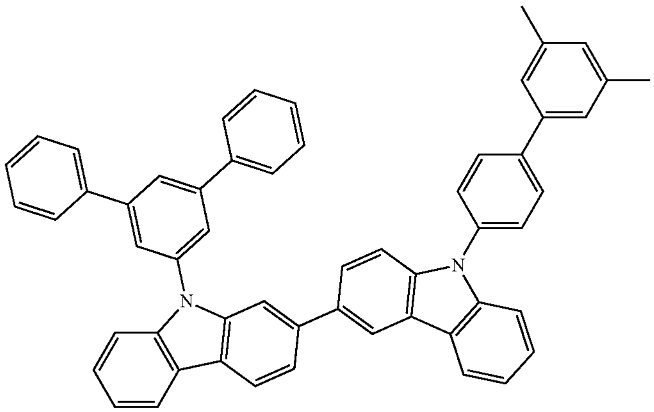
B-134
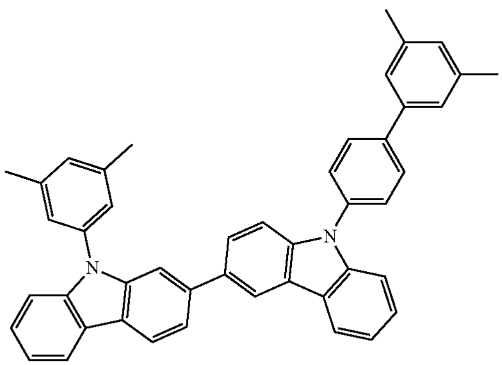
B-135
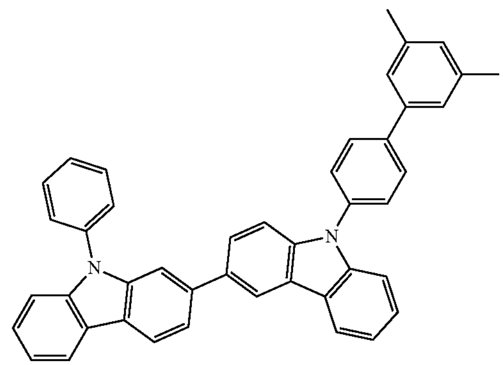
B-136
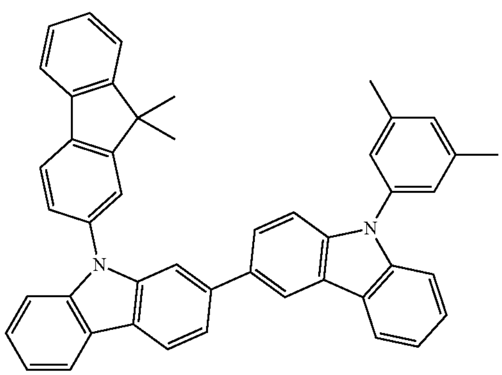
B-137
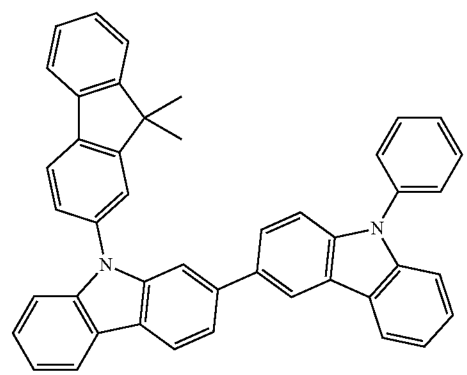
B-138
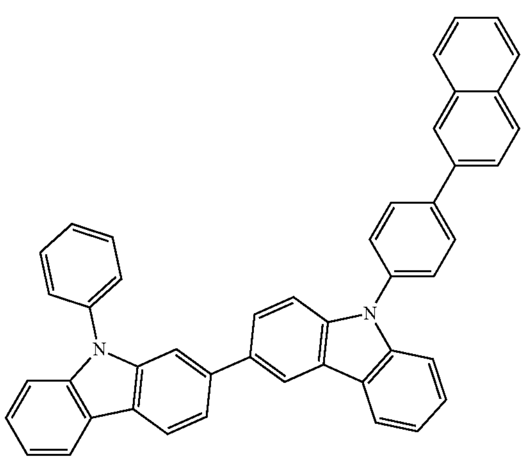

-continued
B-139
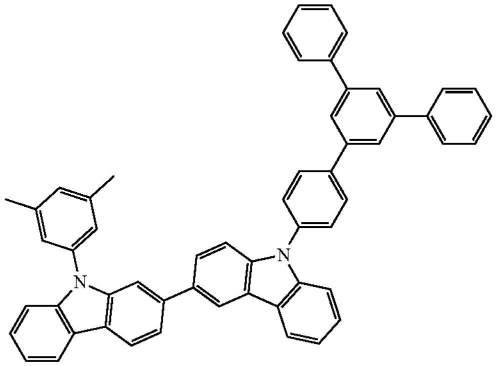
B-140
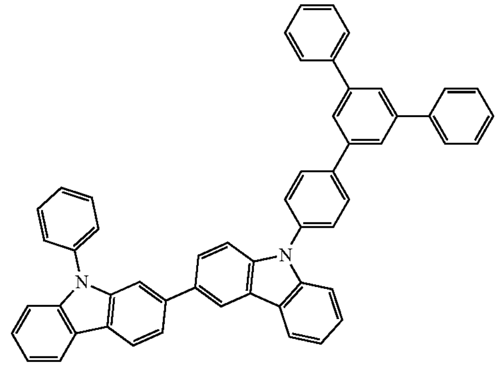
B-141
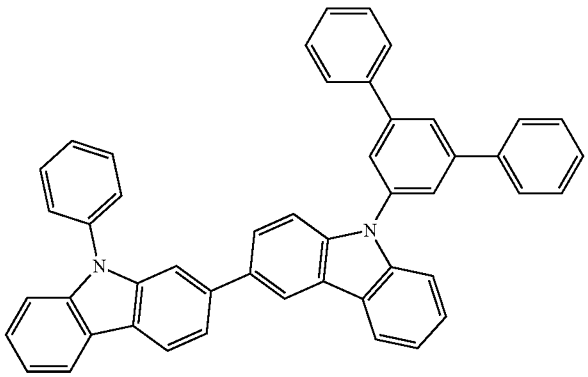
B-142
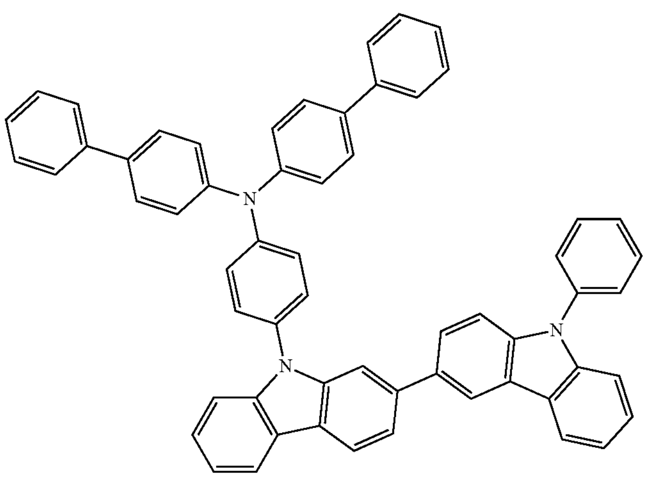
B-143
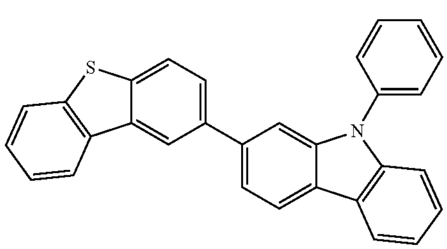
B-144
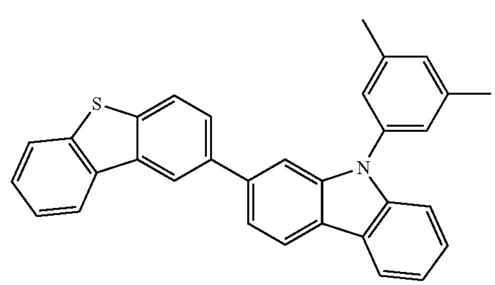

-continued
B-145
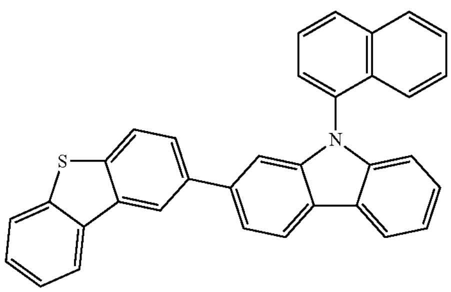
B-146
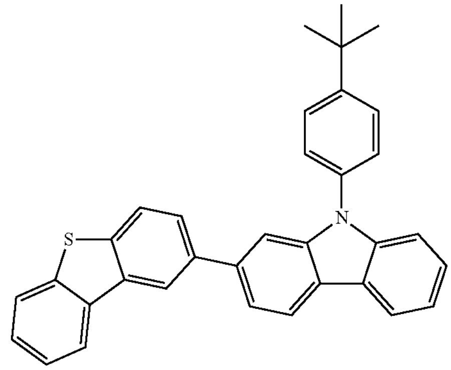
B-147
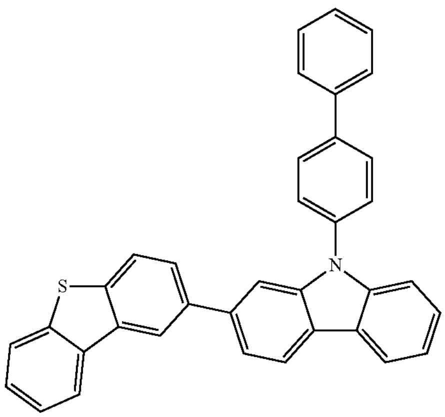
B-148
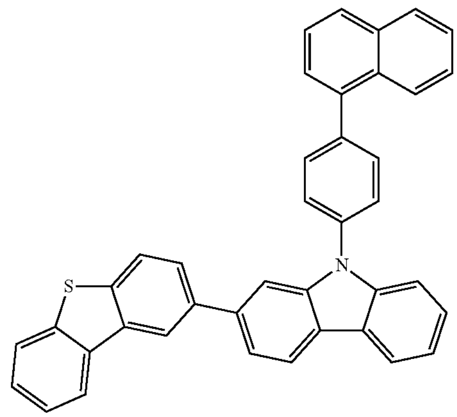
B-149
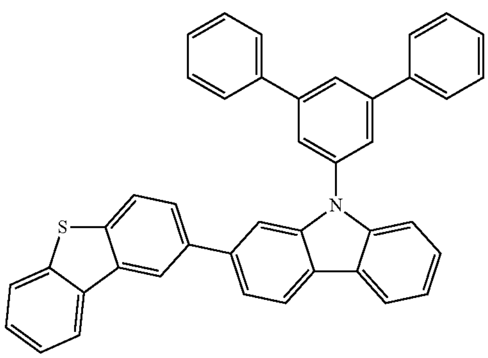
B-150
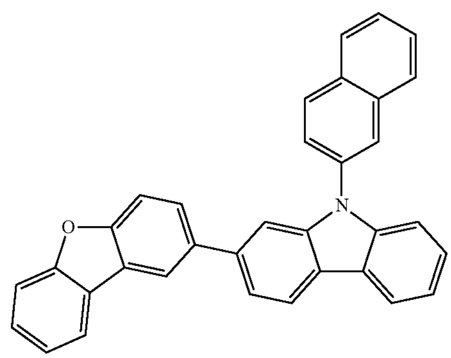
B-151
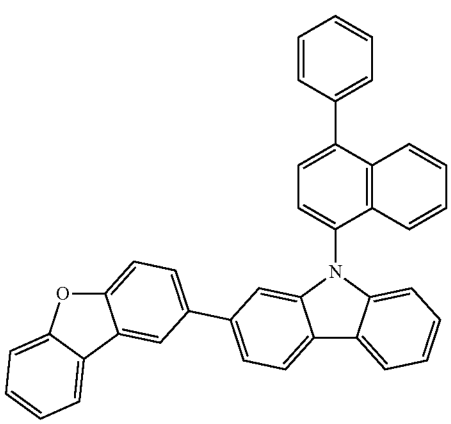
B-152
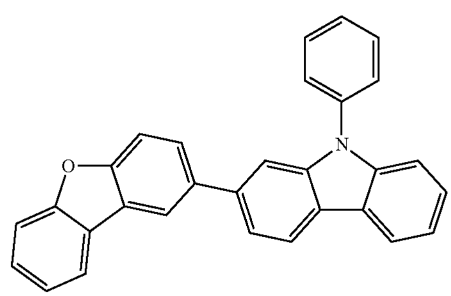

-continued
B-153
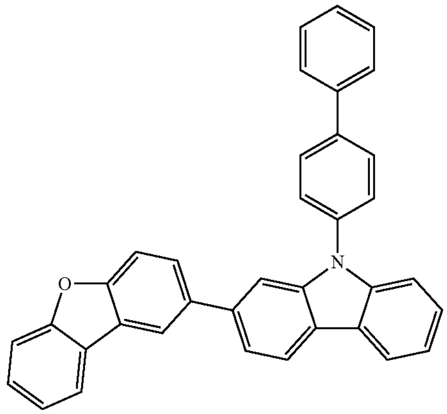
B-154
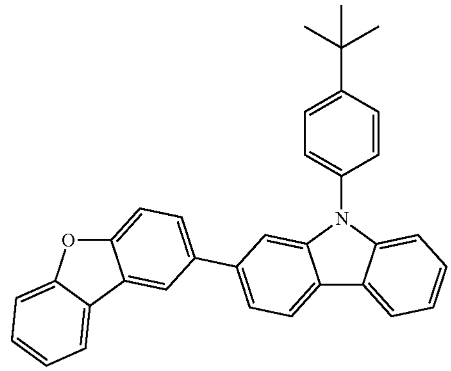
B-155
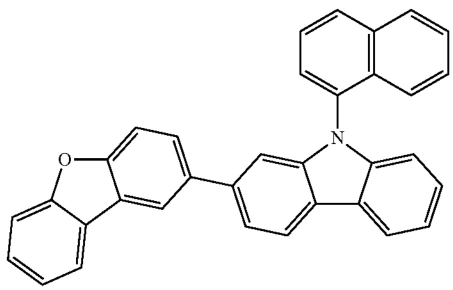
B-156
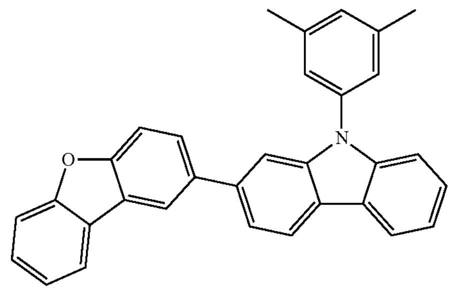
B-157
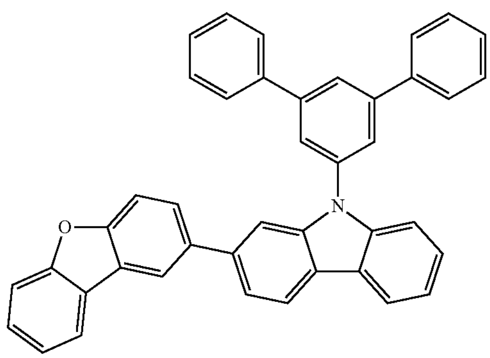
B-158
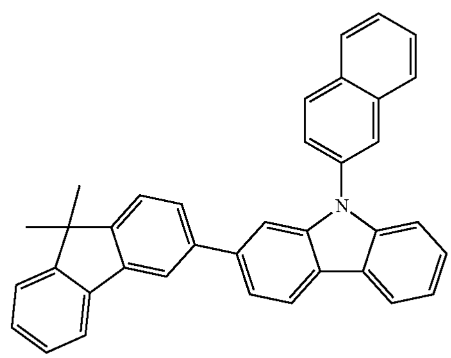
B-159
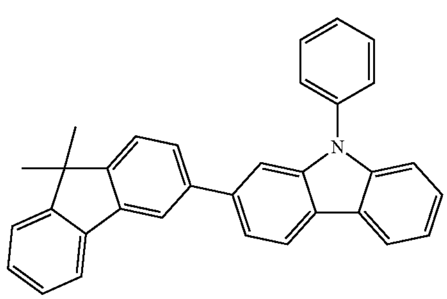
B-160
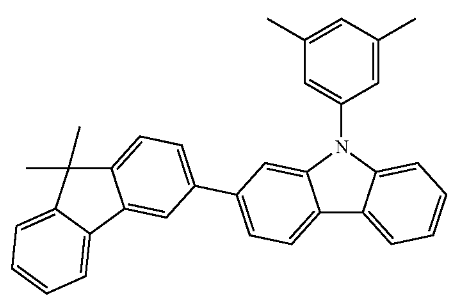

-continued
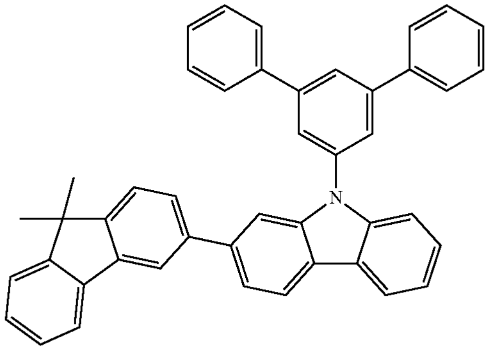
B-161
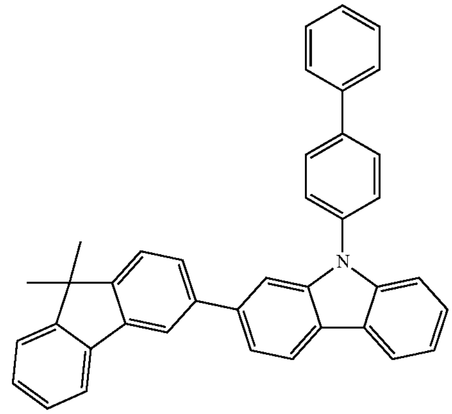
B-162
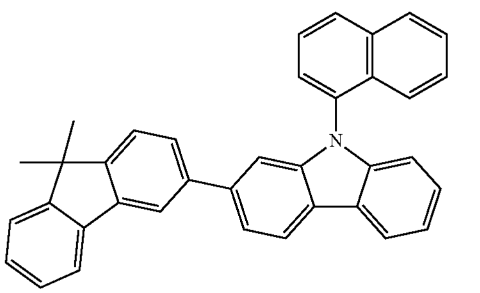
B-163
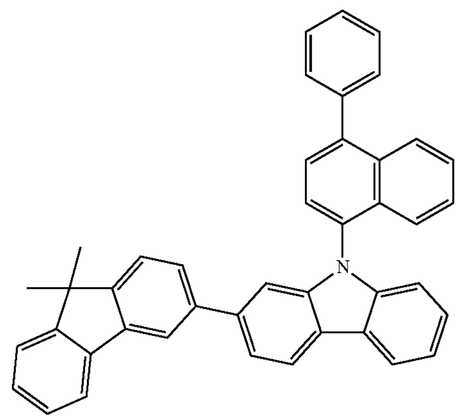
B-164
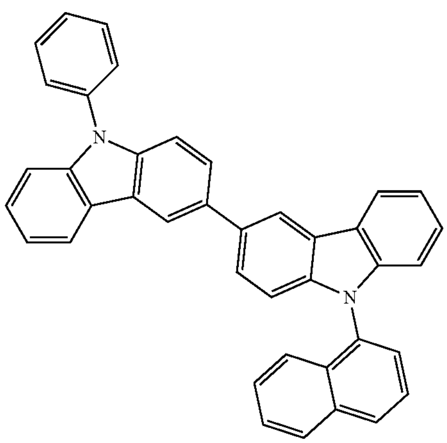
B-165
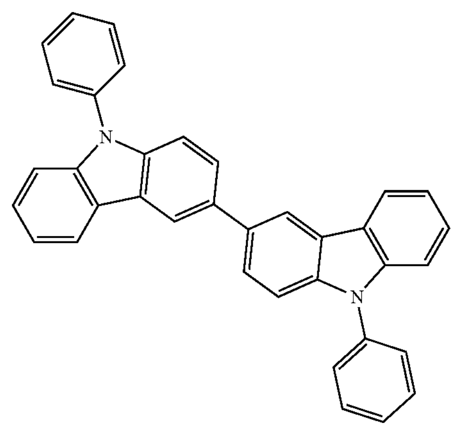
B-166
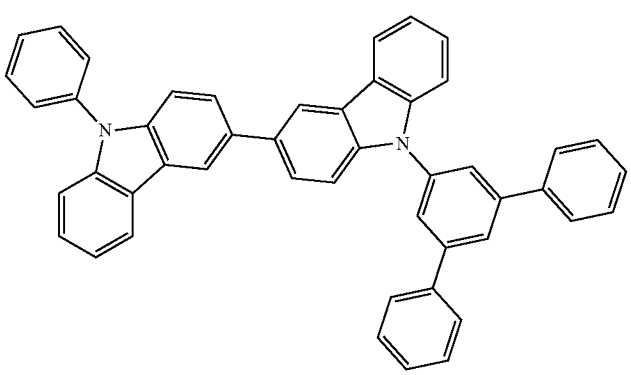
B-167

-continued
B-168
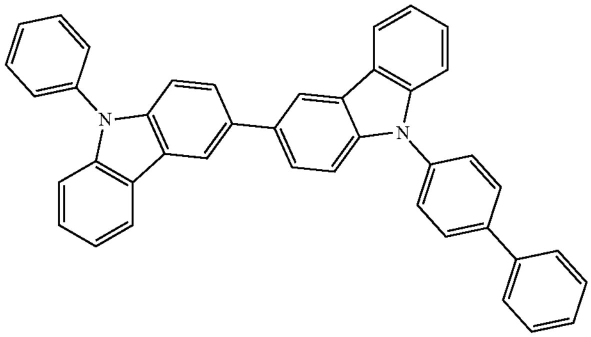
B-169
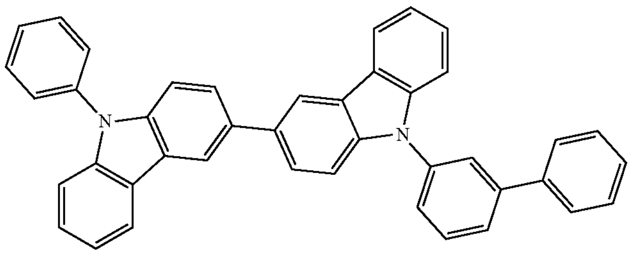
B-170
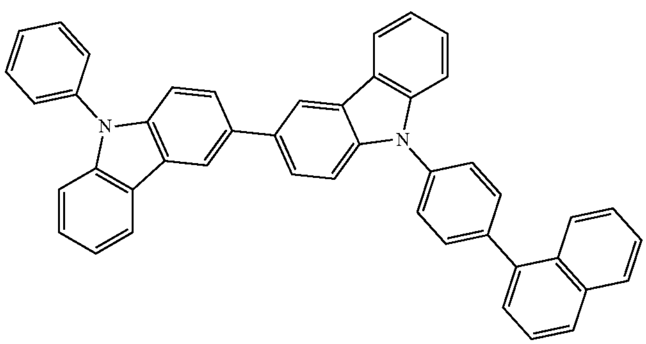
B-171
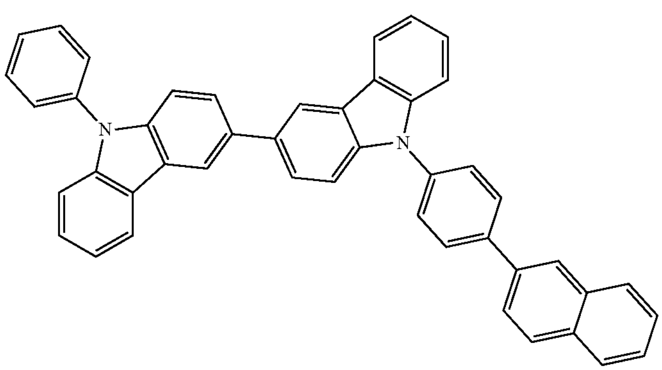

-continued
B-172
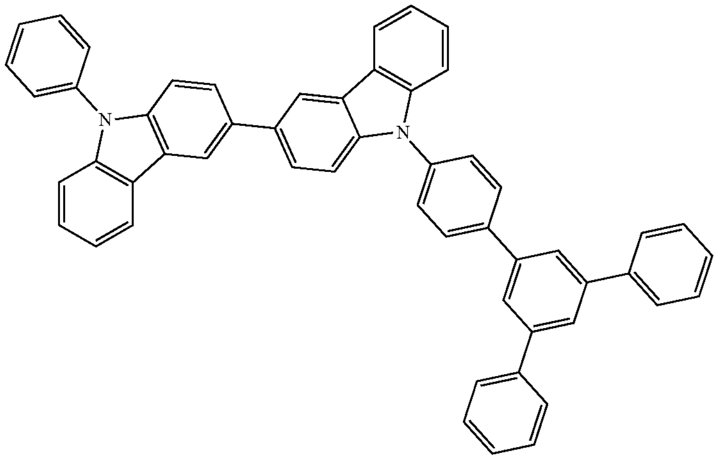
B-173
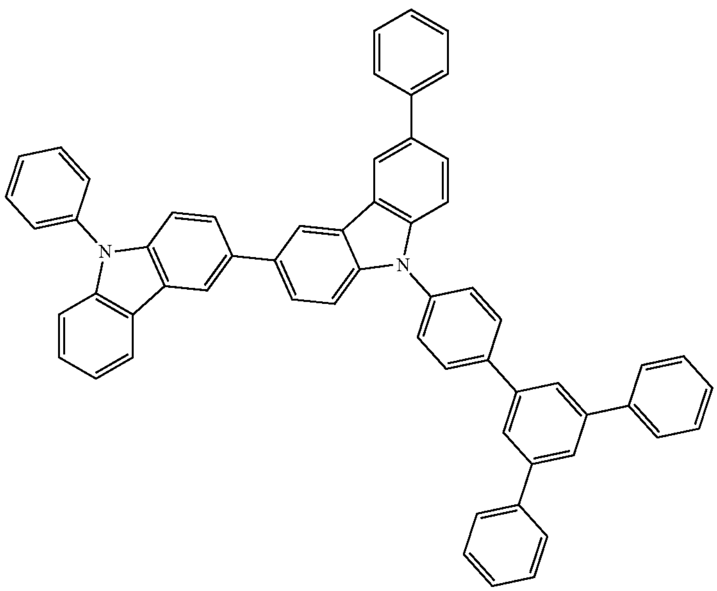
B-174
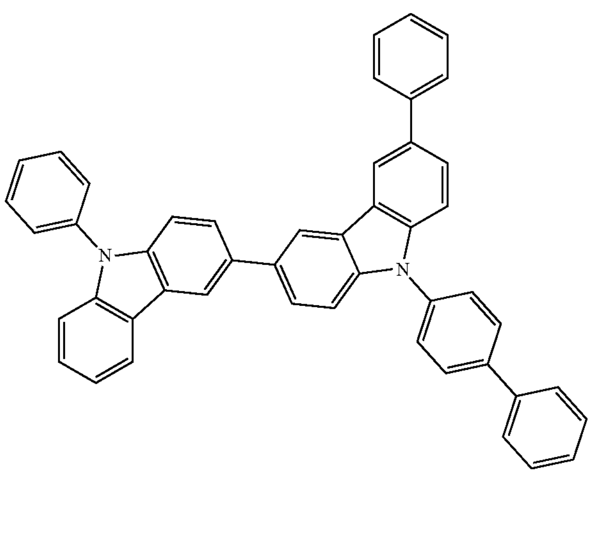

-continued
B-175
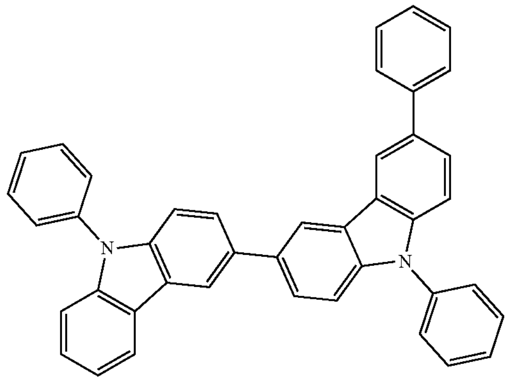
B-176
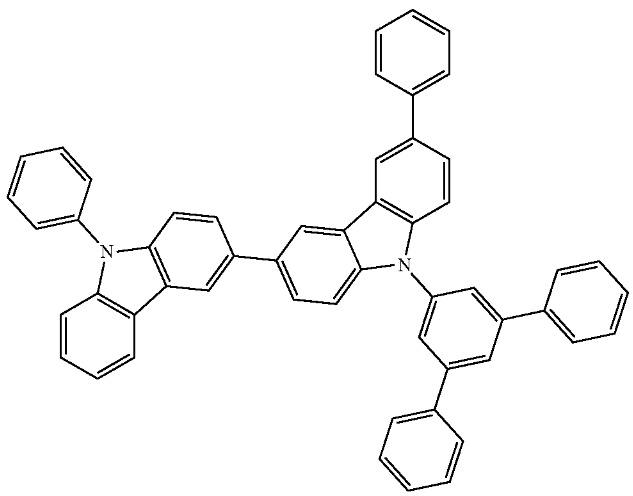
B-177
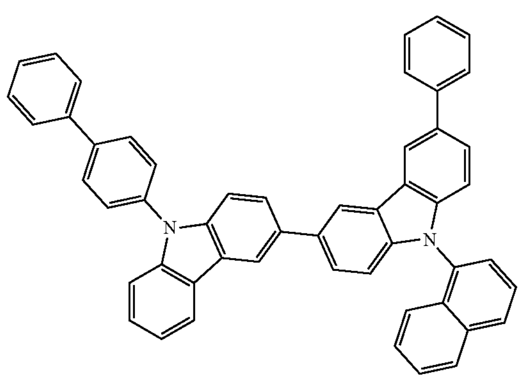
B-178
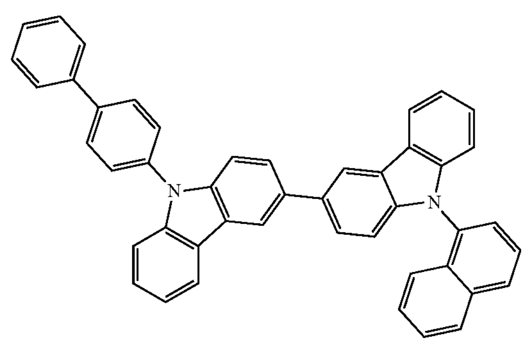
B-179
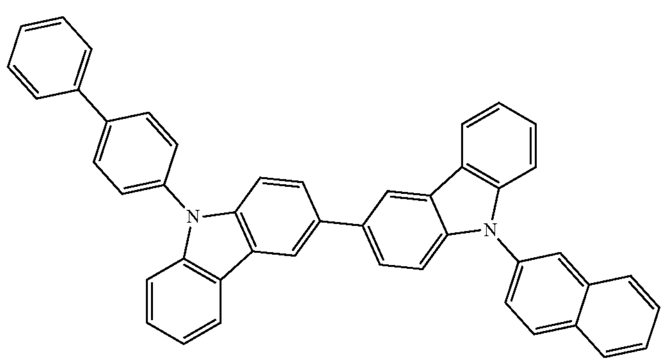

-continued
B-180
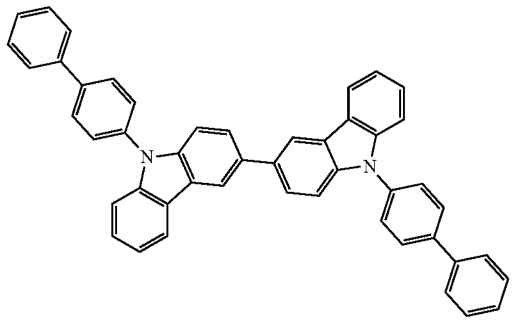
B-181
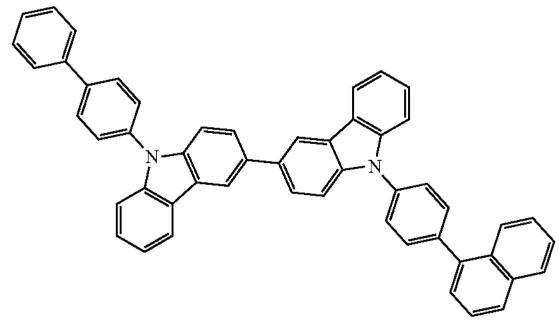
B-182
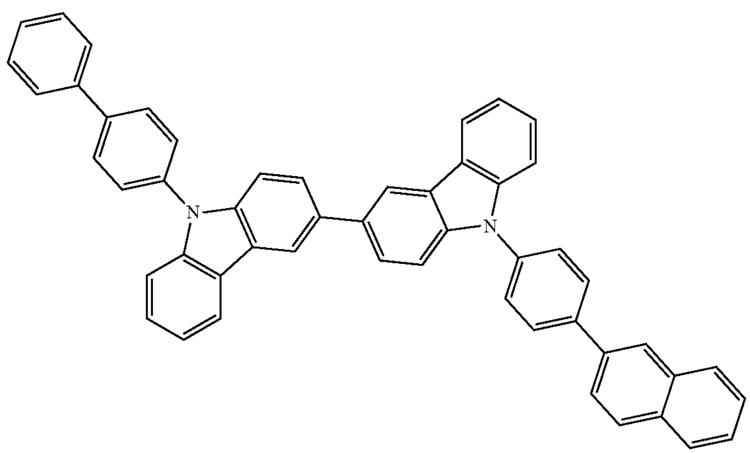
B-183
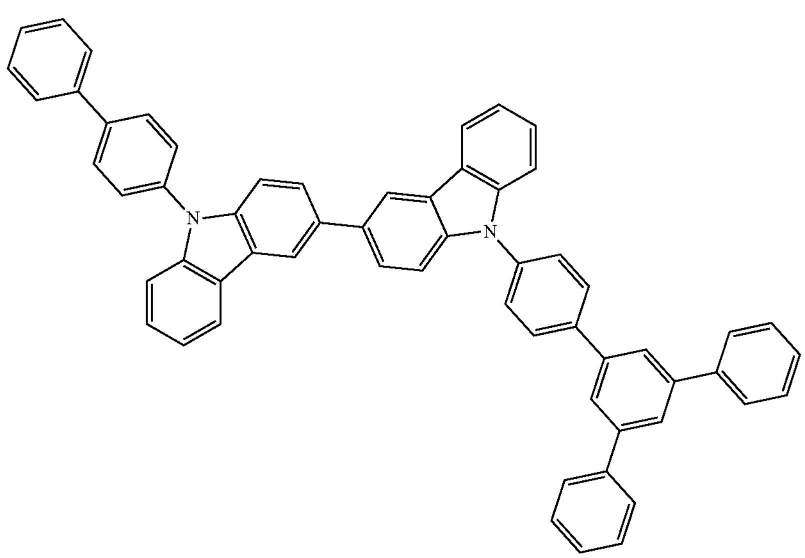

-continued
B-184
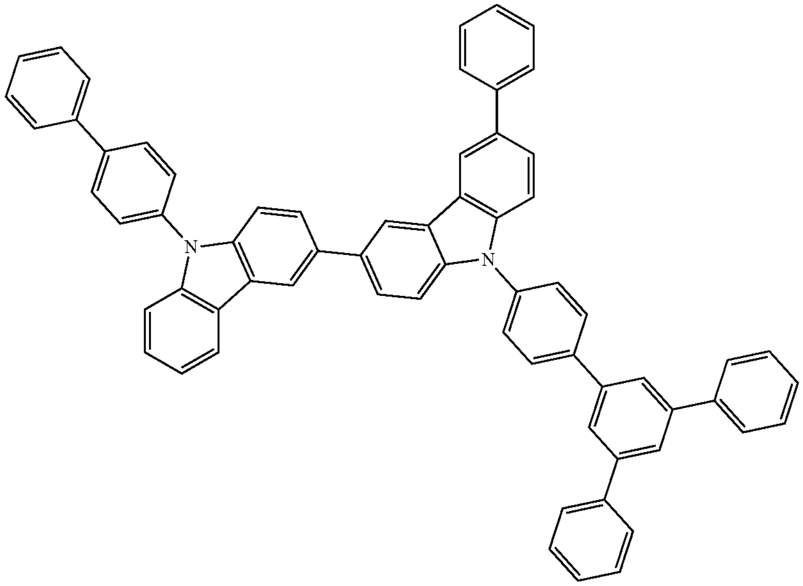
B-185
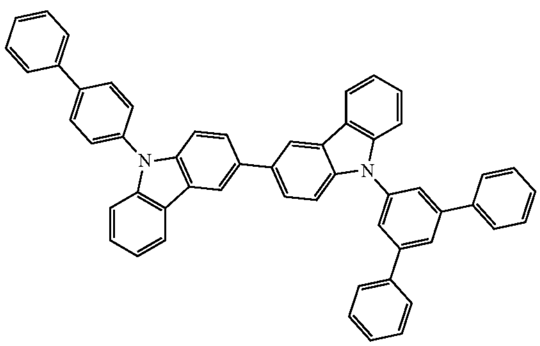
B-186
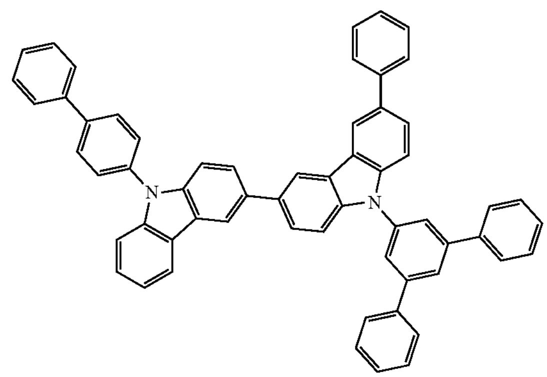
B-187
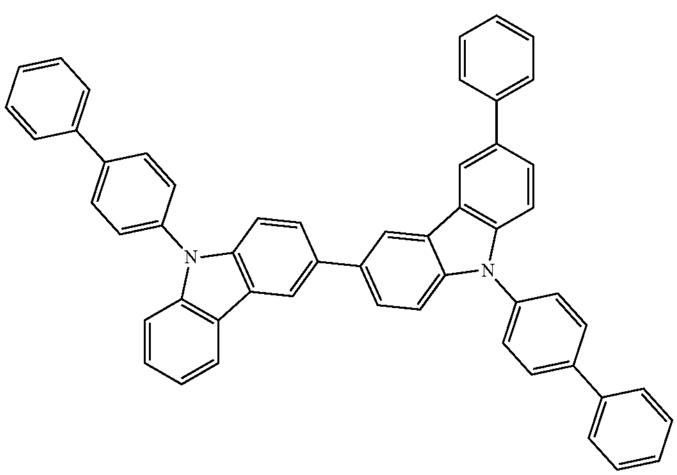

-continued
B-188
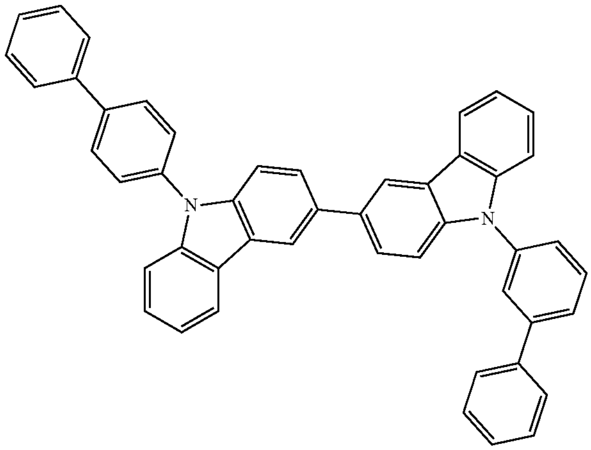
B-189
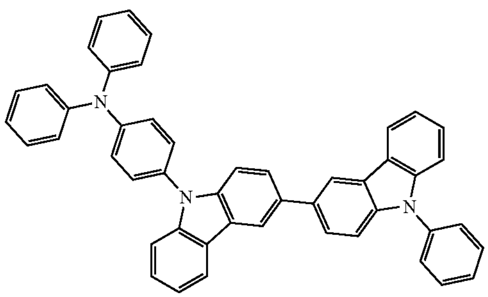
B-190
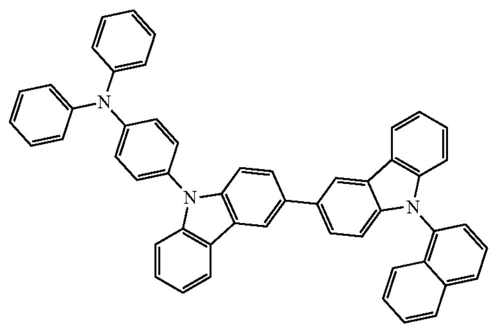
B-191
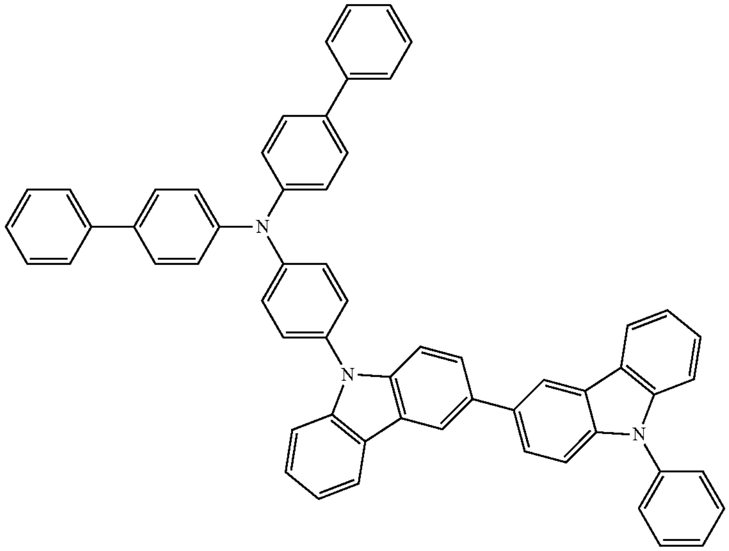

-continued
B-192
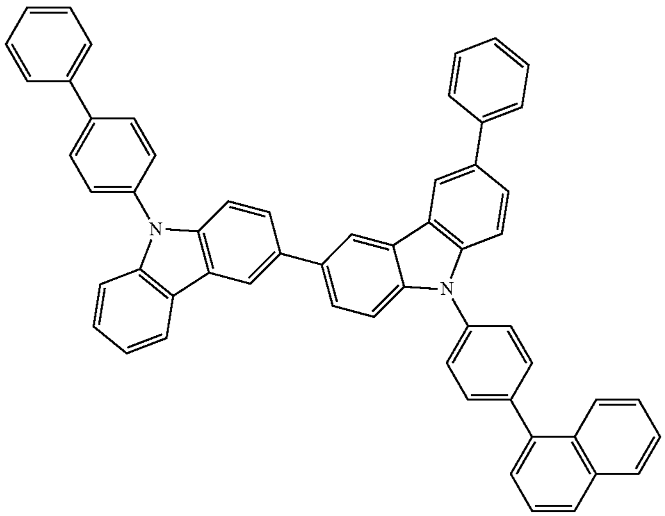
B-193
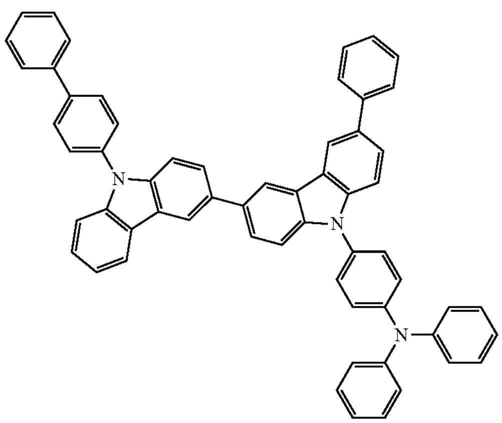
B-194
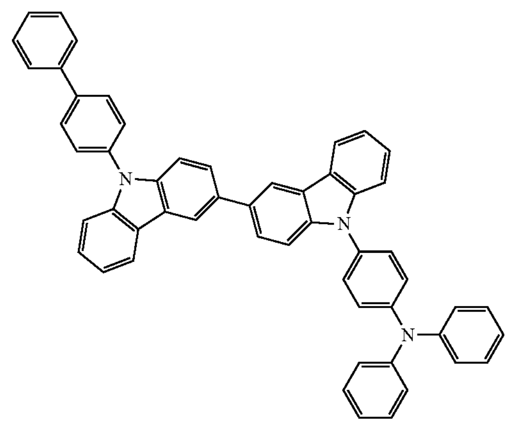
B-195
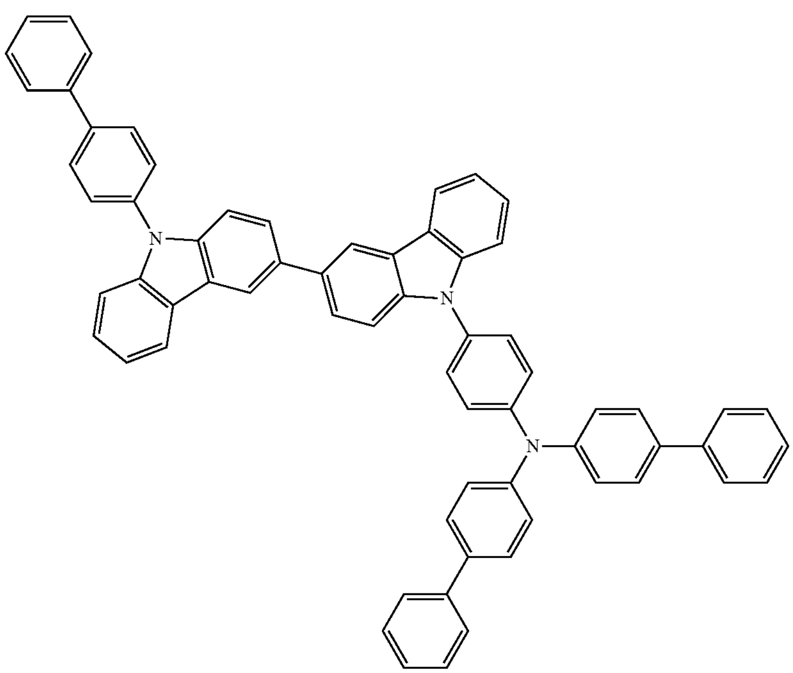

-continued
B-196
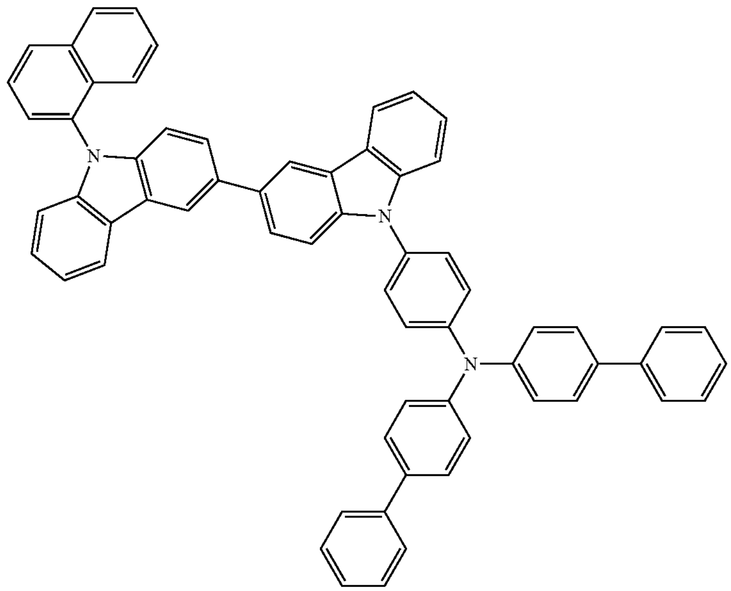
B-197
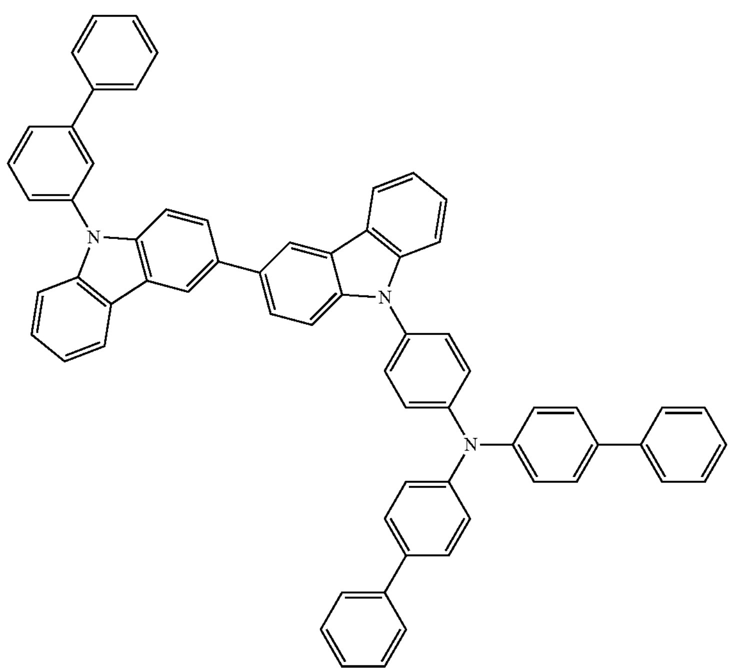

-continued
B-198
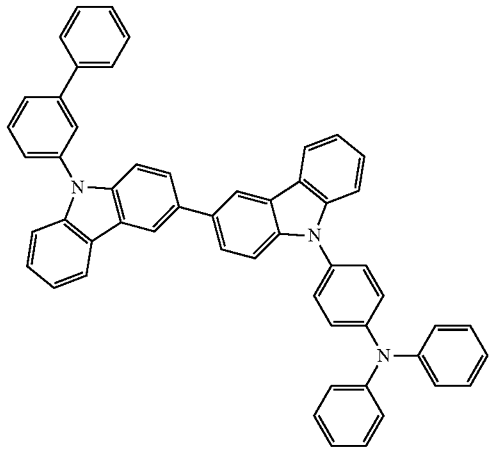
B-199
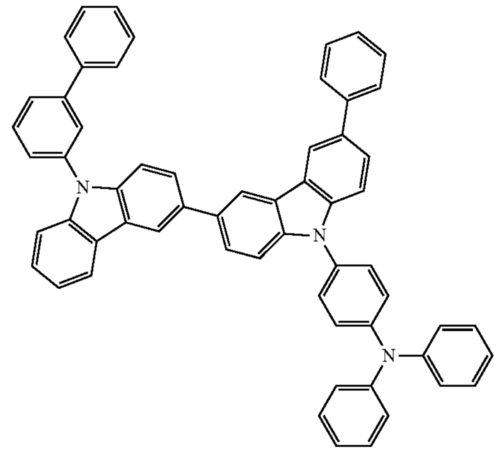
B-200
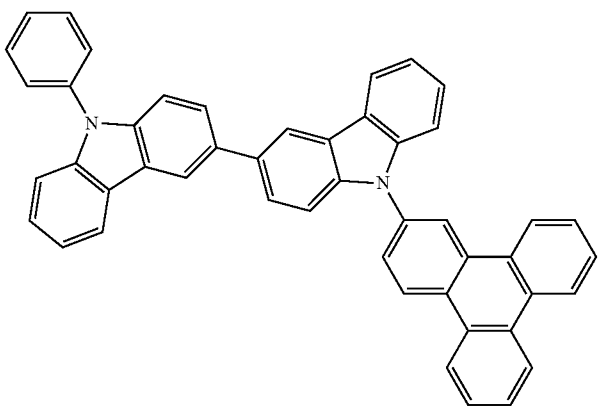
B-201
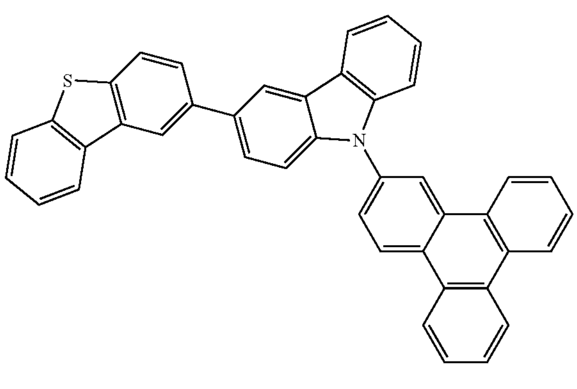

-continued
B-202
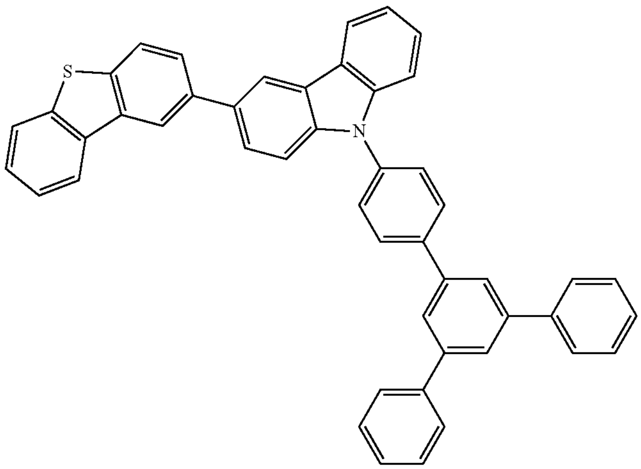
B-203
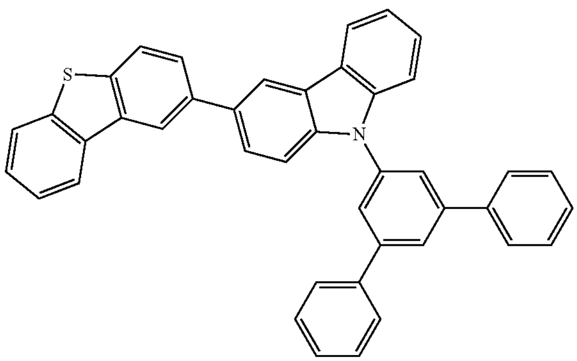
B-204
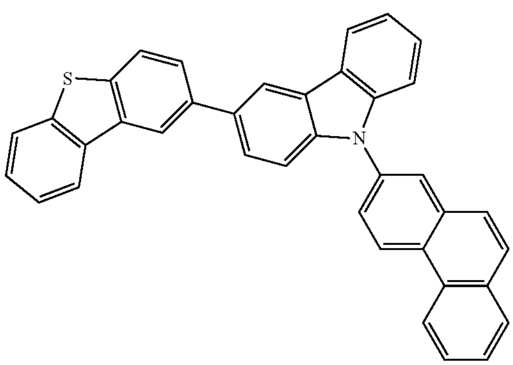
B-205
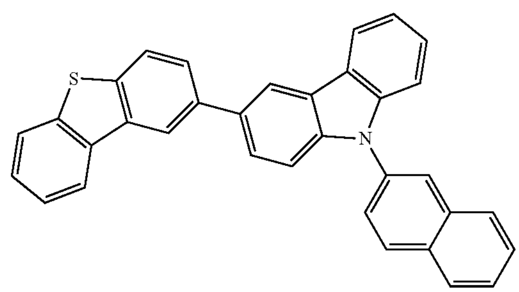
B-206
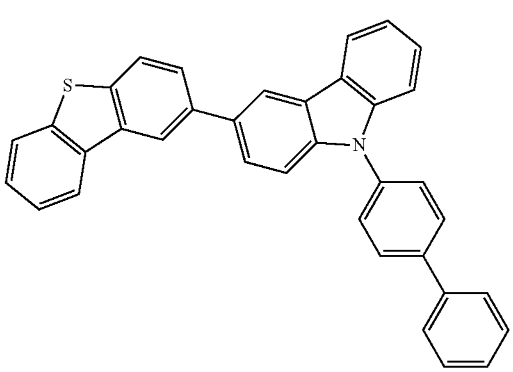
B-207
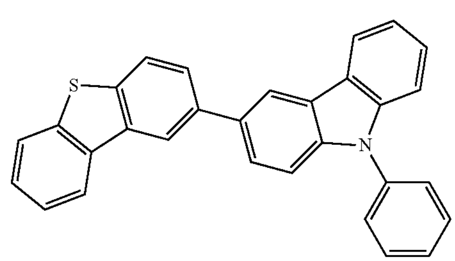

-continued
B-208
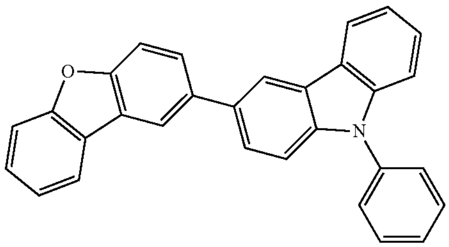
B-209
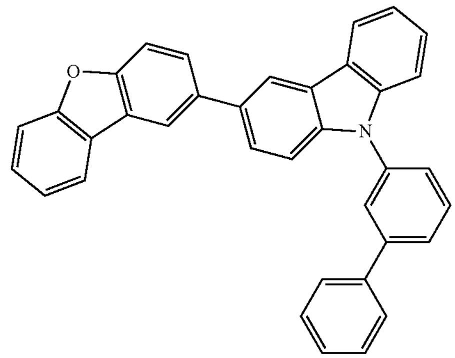
B-210
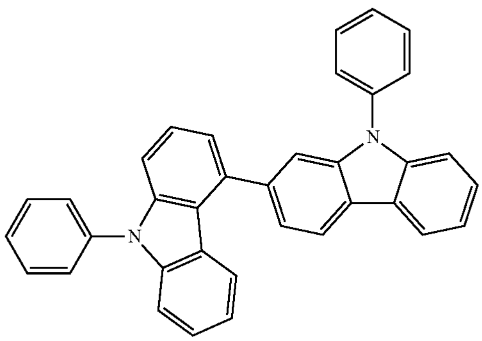
B-211
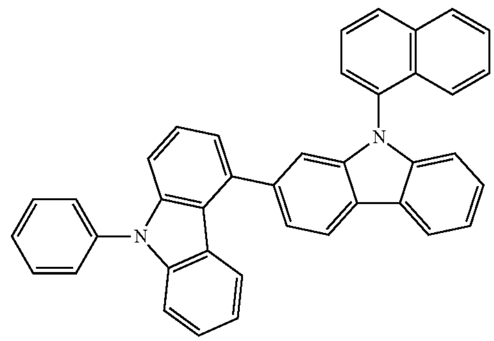
B-212
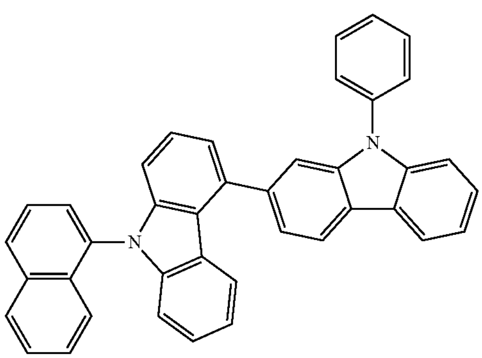
B-213
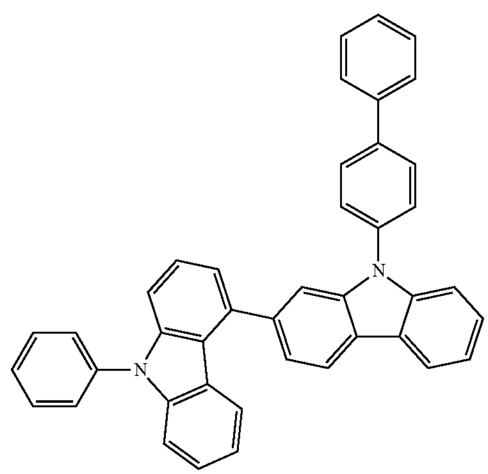
B-214
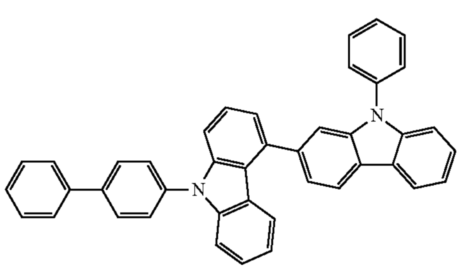
B-215
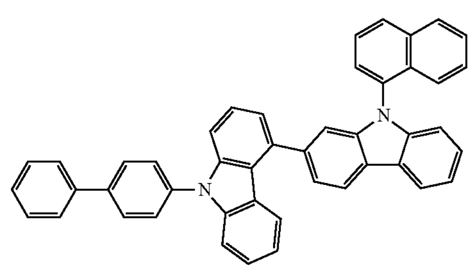

-continued
B-216
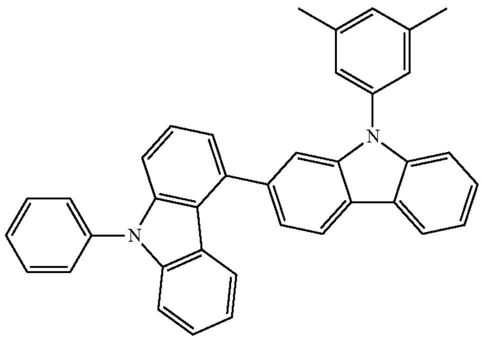
B-217
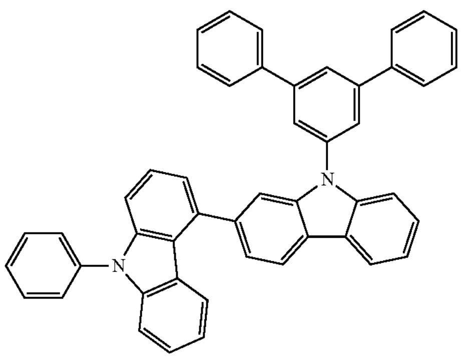
B-218
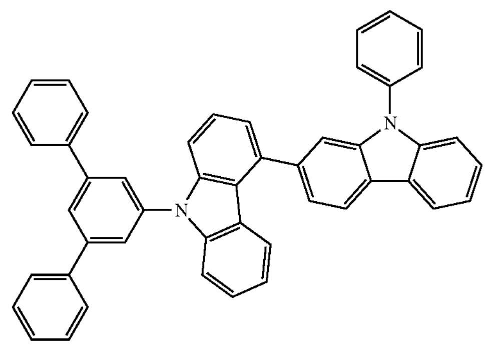
B-219
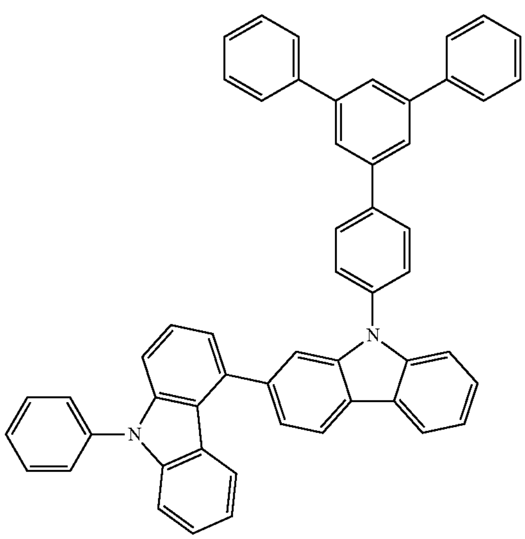
B-220
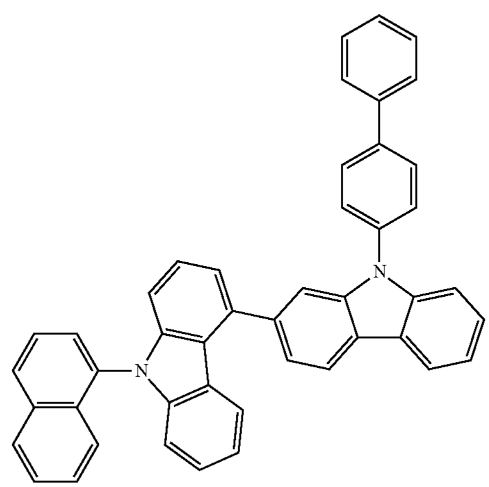

-continued
B-221
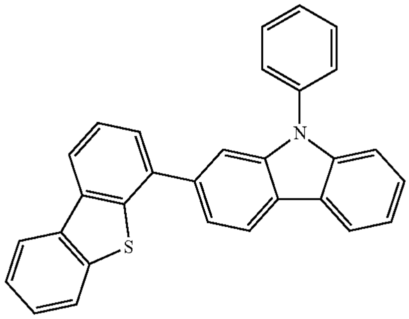
B-222
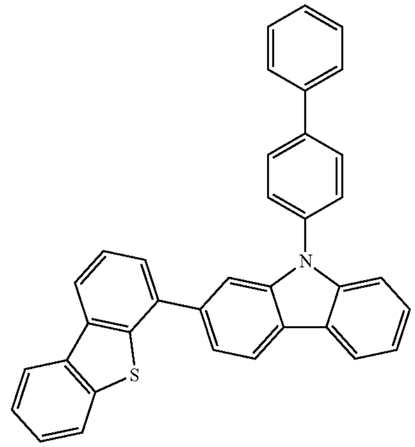
B-223
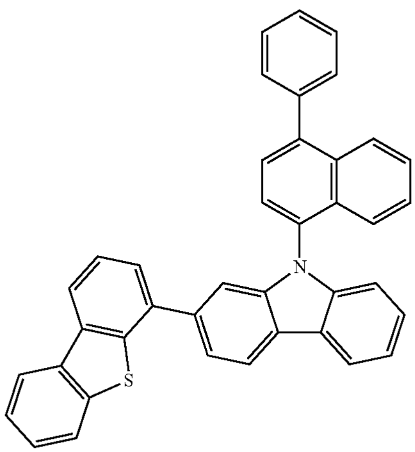
B-224
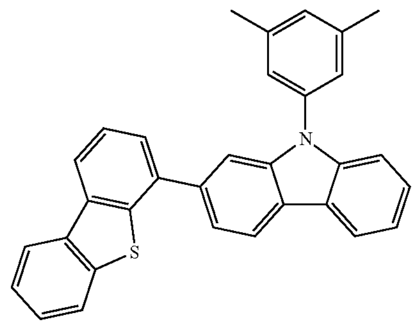
B-225
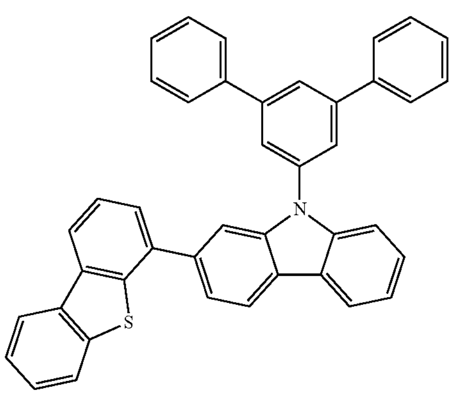
B-226
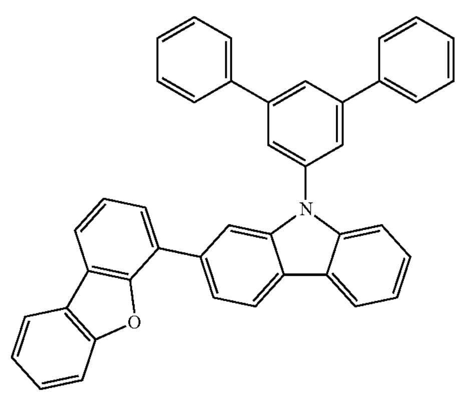

-continued
B-227
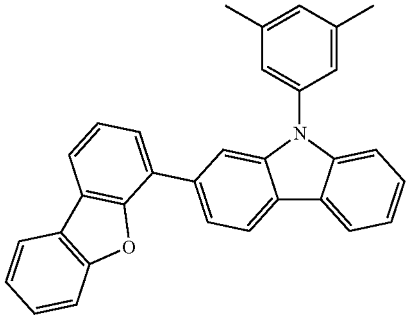
B-228
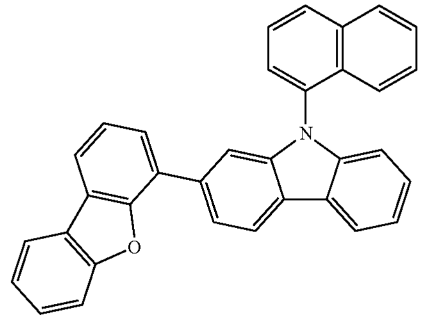
B-229
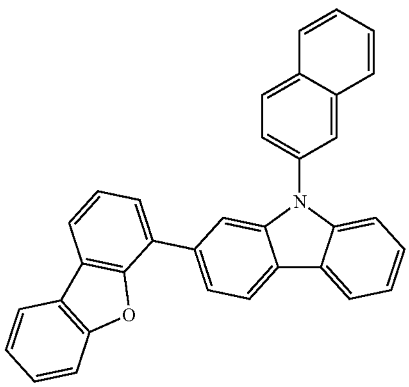
B-230
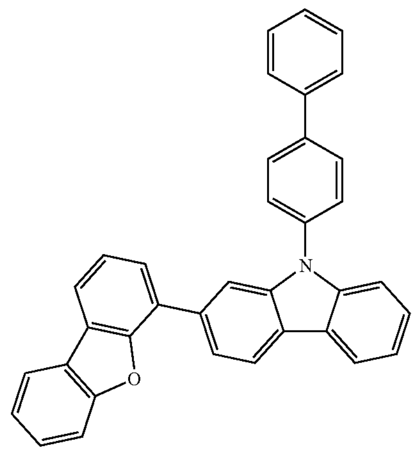
In an embodiment, the second compound represented by one selected from Formulae 2-1 to 2-3 may be selected from Compounds E-101 to E-270, but embodiments of the present disclosure are not limited thereto:
E-101
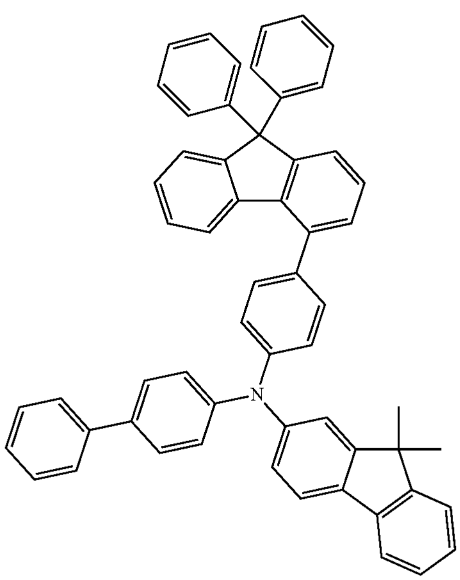
-continued
E-102
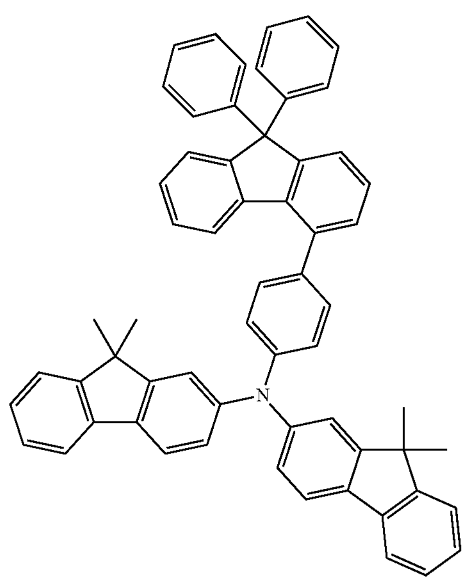

-continued
E-103
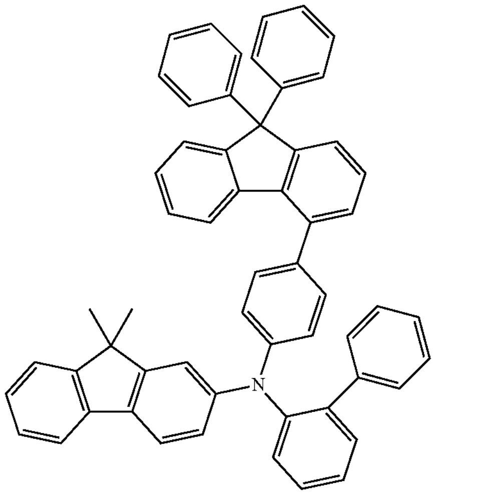
E-104
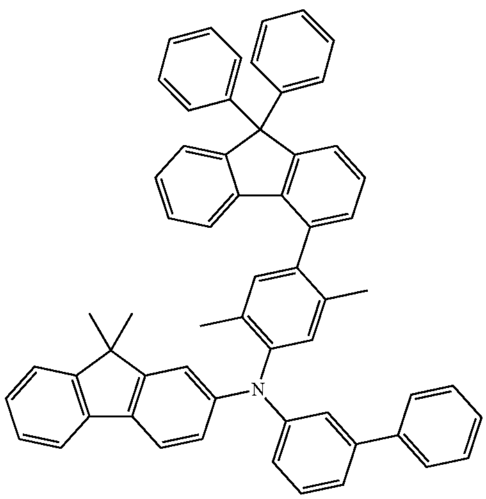
E-105
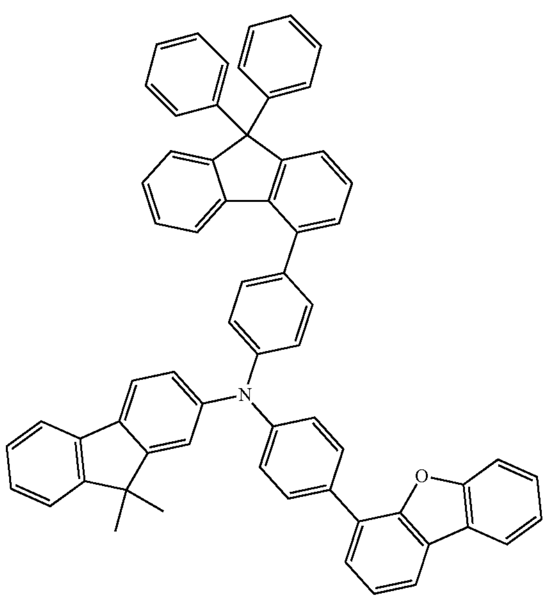
-continued
E-106
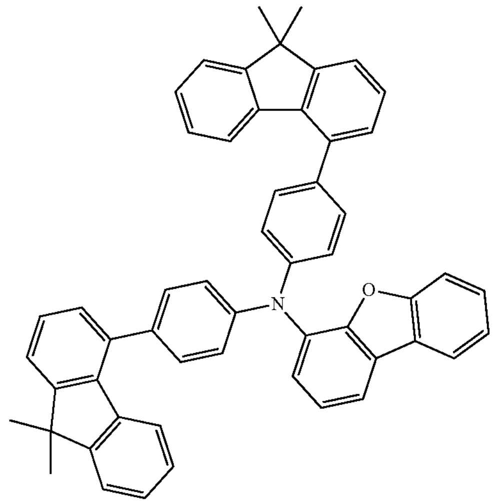
E-107
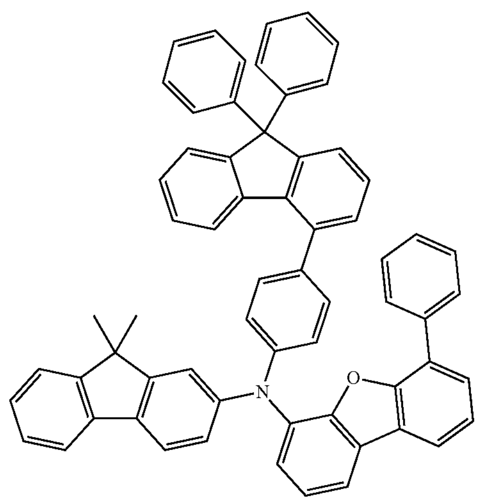
E-108
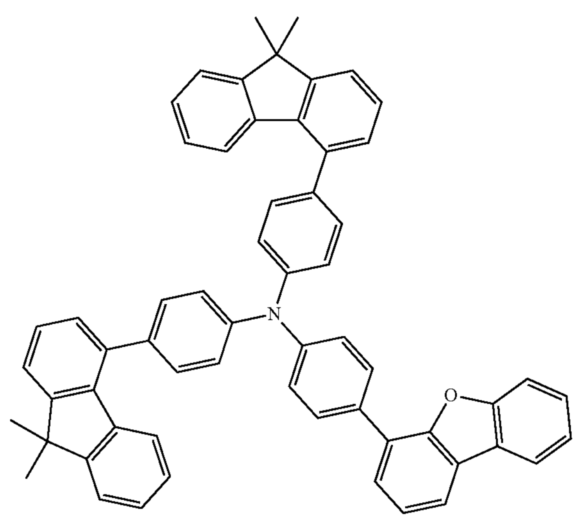

-continued
E-109
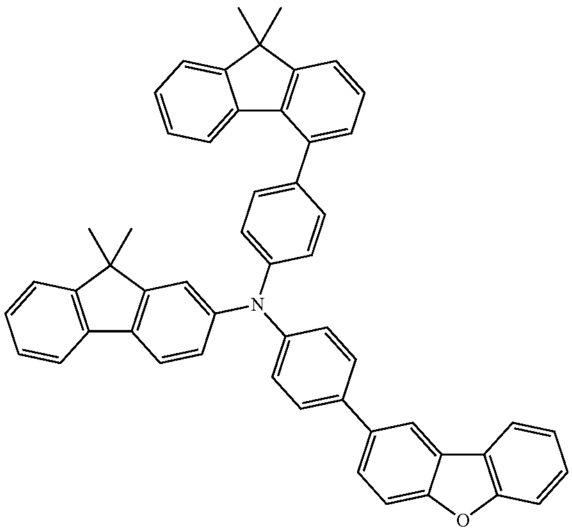
E-110
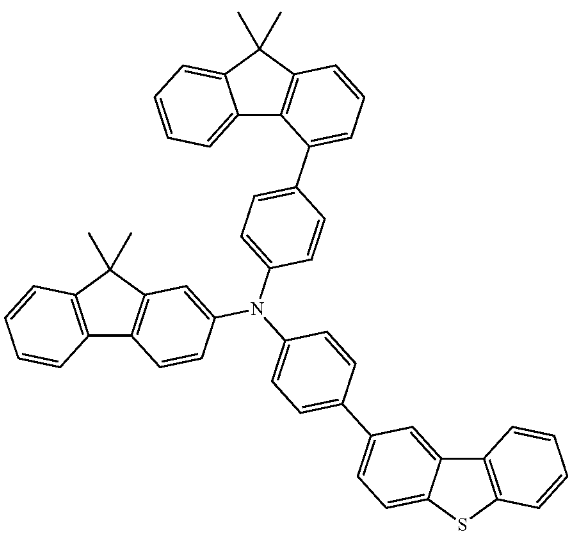
E-111
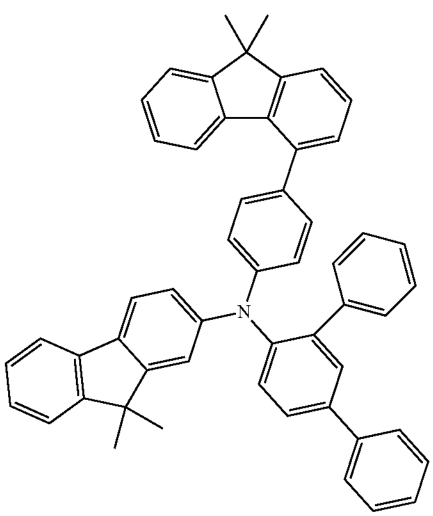
-continued
E-112
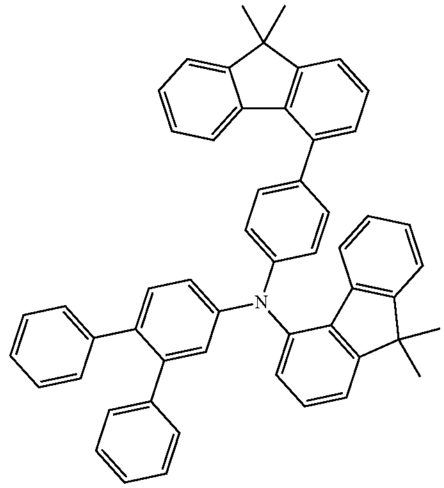
E-113
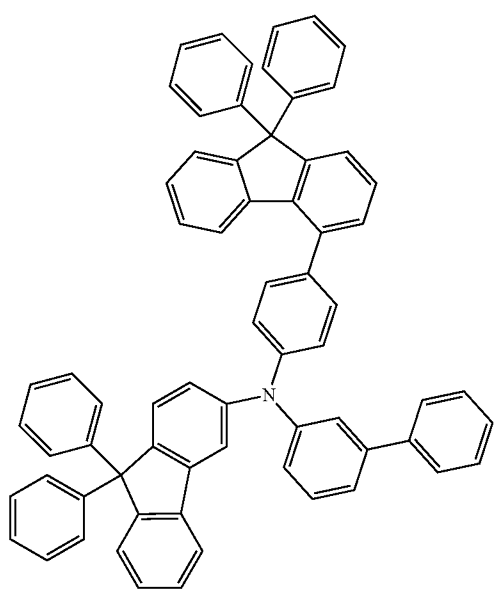

-continued
E-114
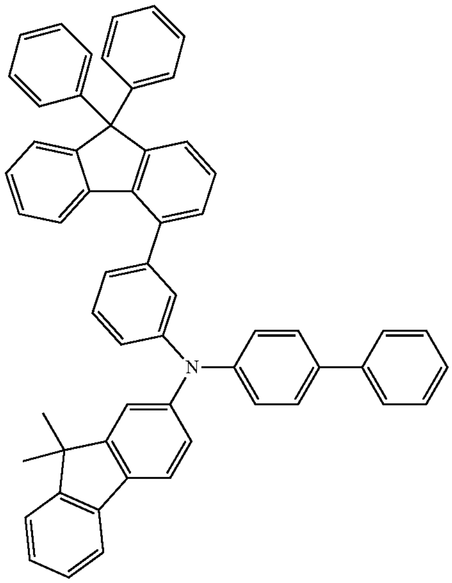
E-115
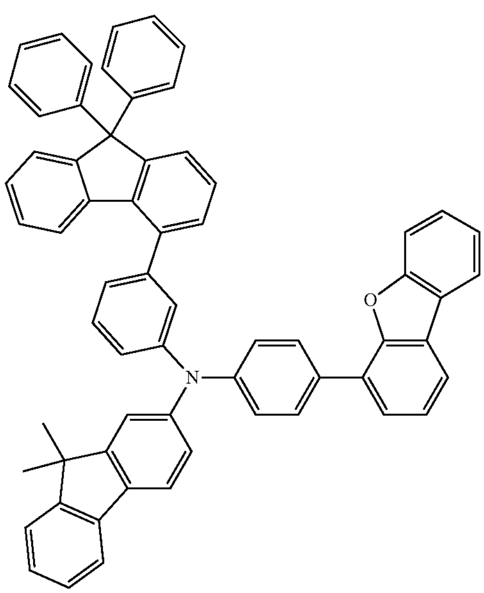
-continued
E-116
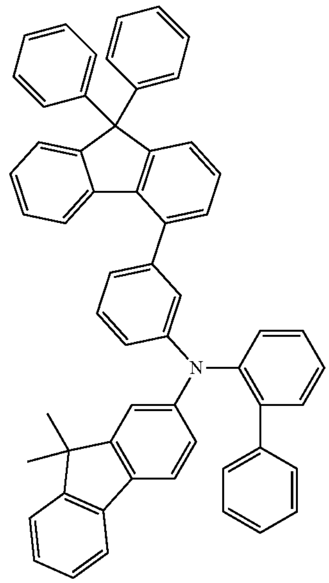
E-117
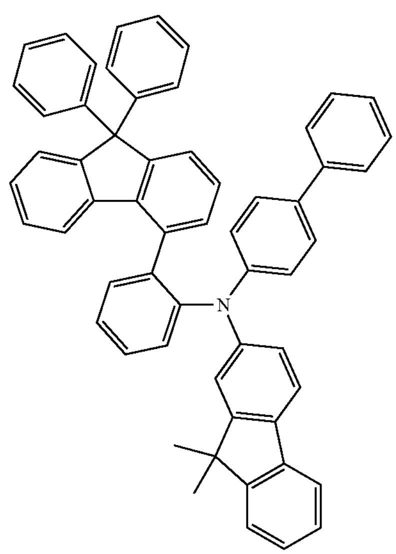

-continued
E-118
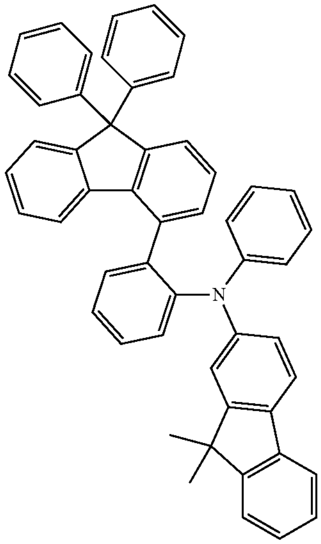
E-119
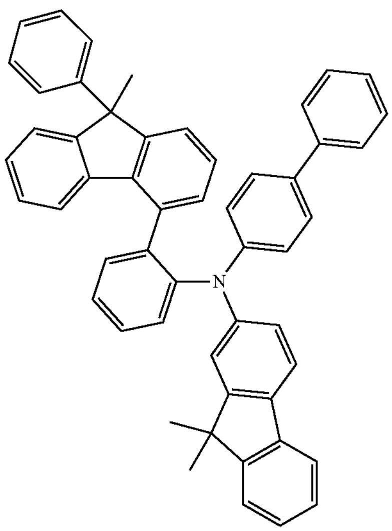
E-120
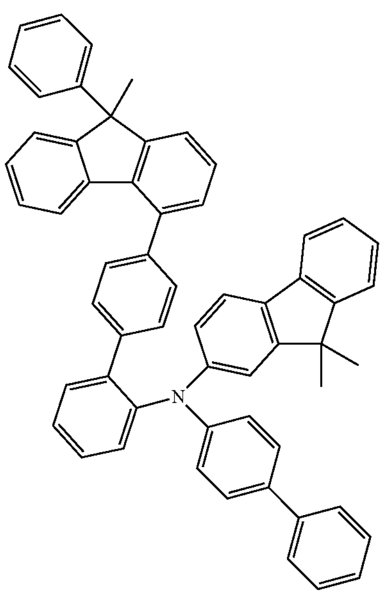
-continued
E-121
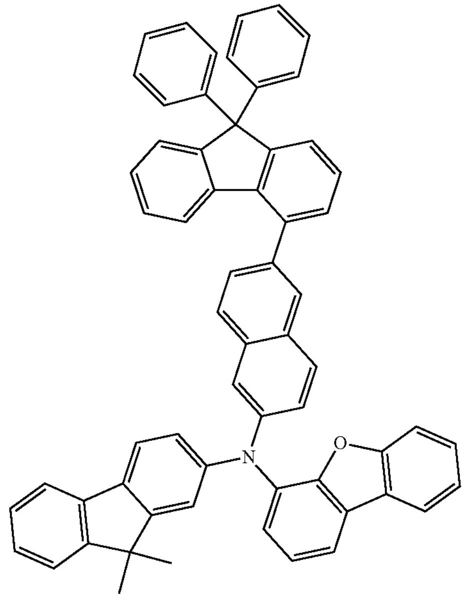
E-122
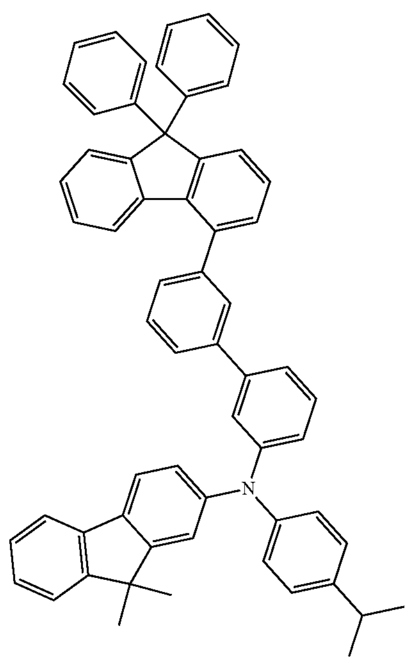

-continued
E-123
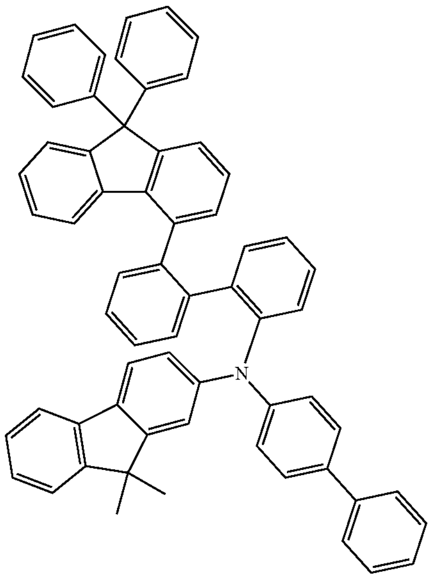
E-124
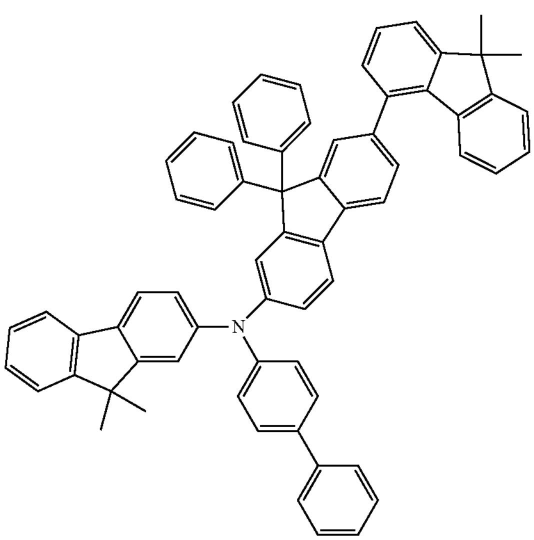
-continued
E-125
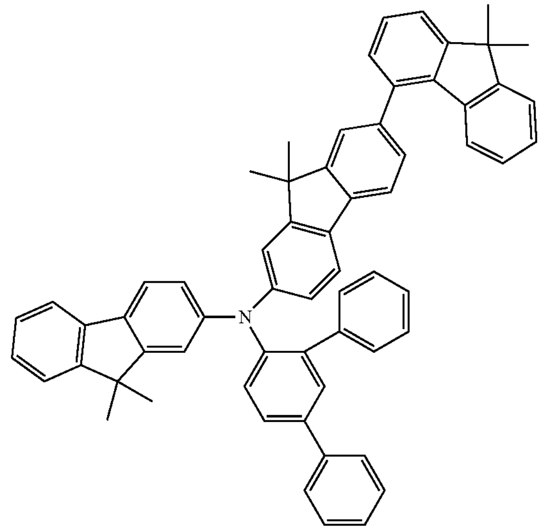
E-126
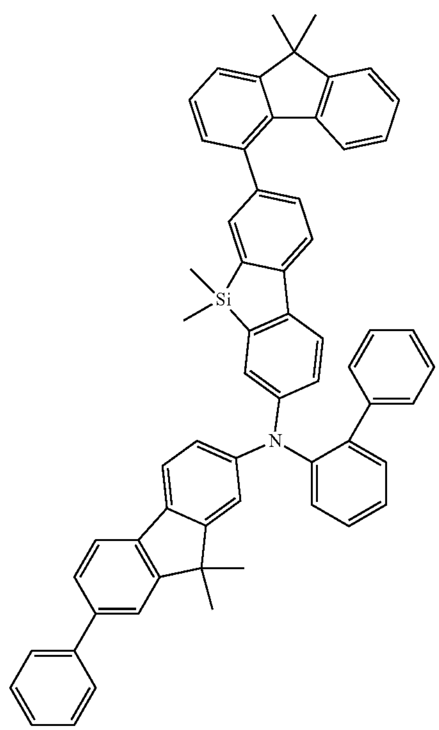

-continued
E-127
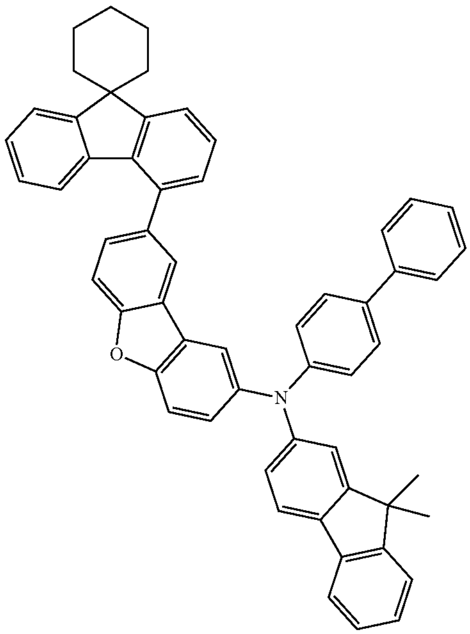
E-128
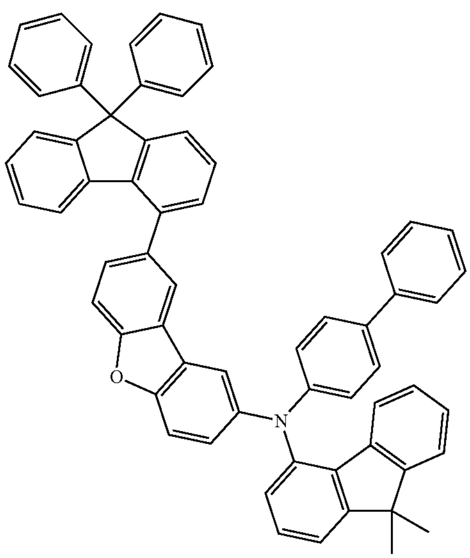
-continued
E-129
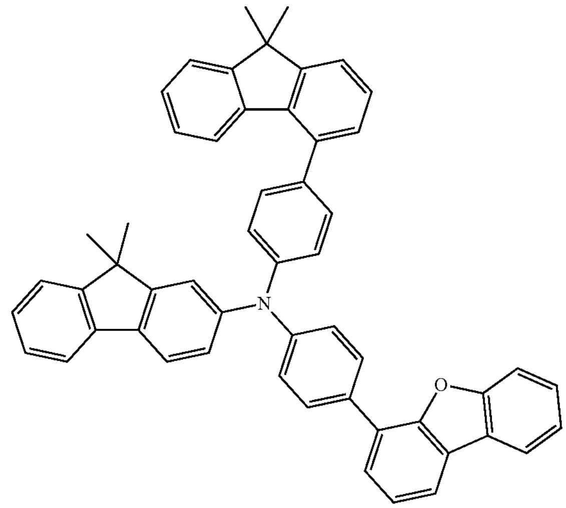
E-130
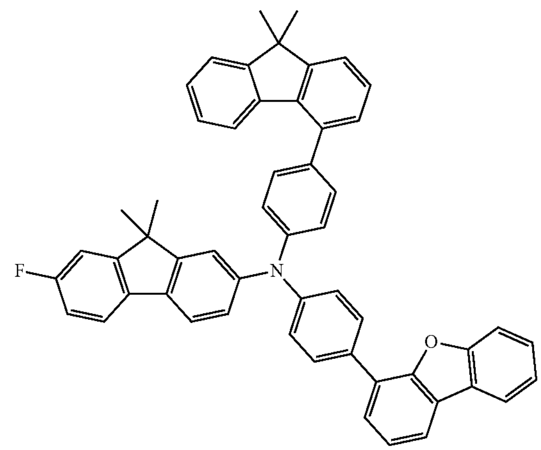
E-131
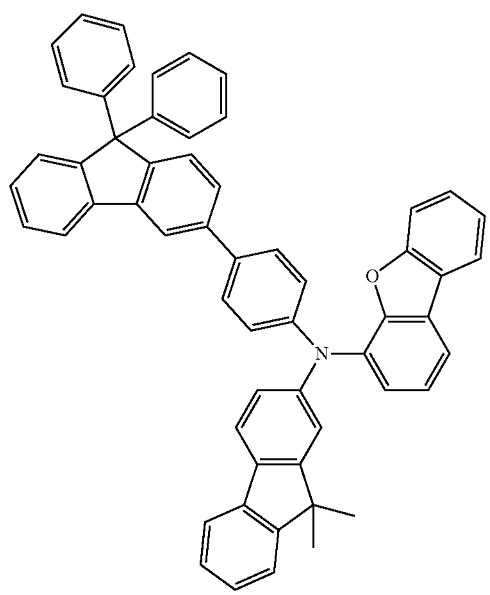

E-132
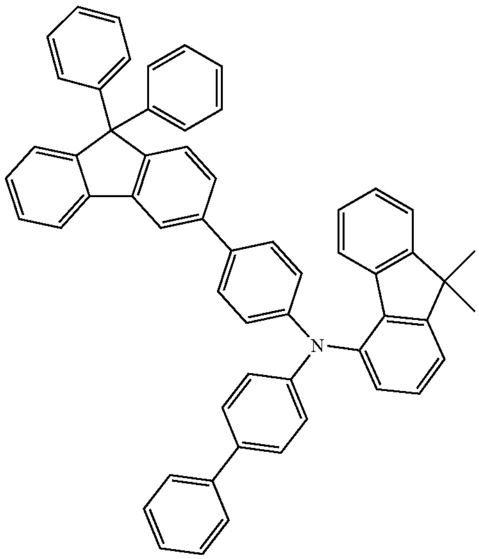
E-133
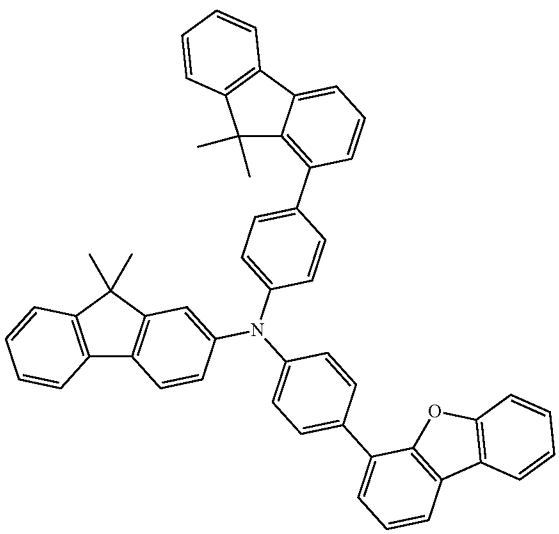
E-134
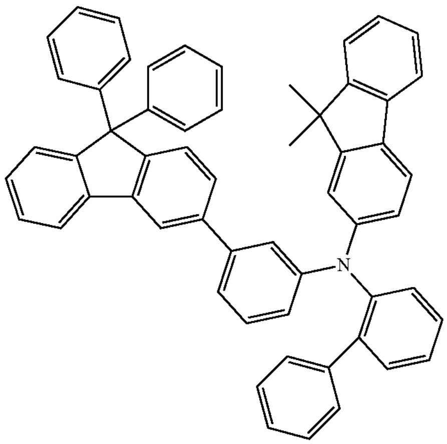
E-135
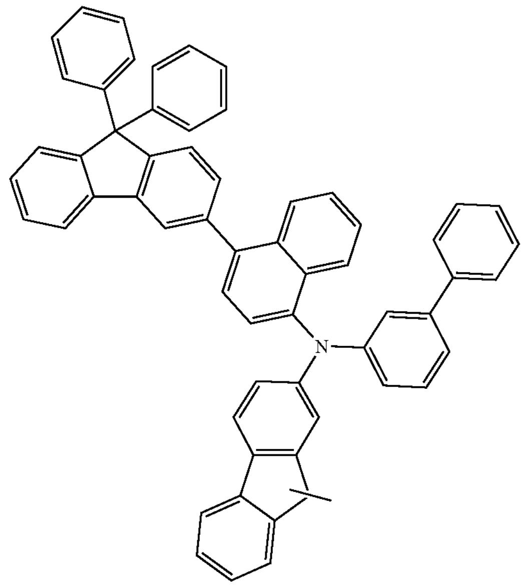
E-136
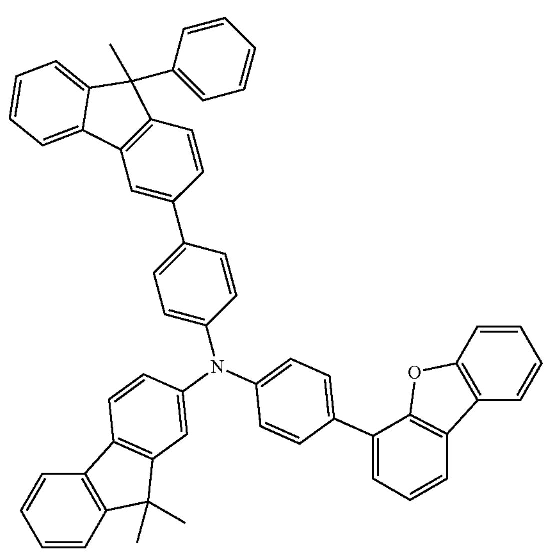

-continued
E-137
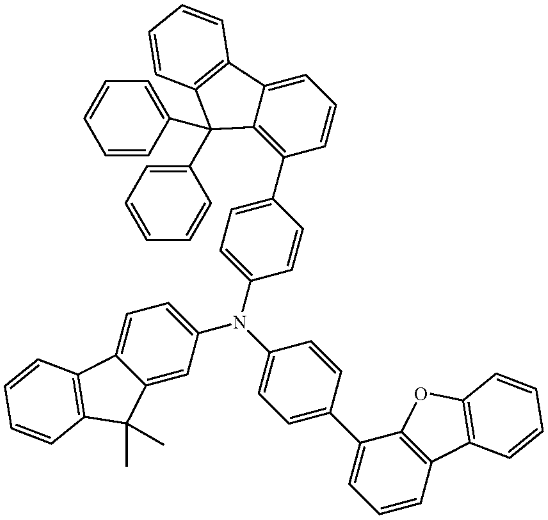
E-138
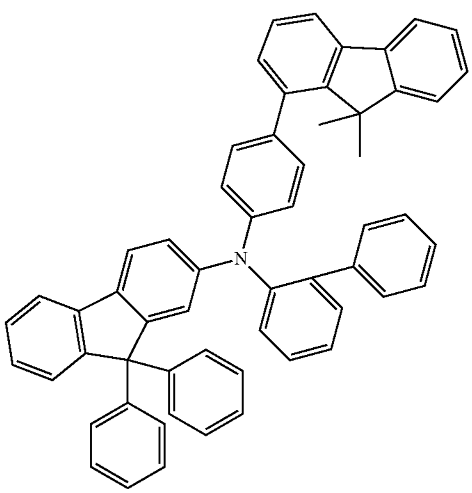
E-139
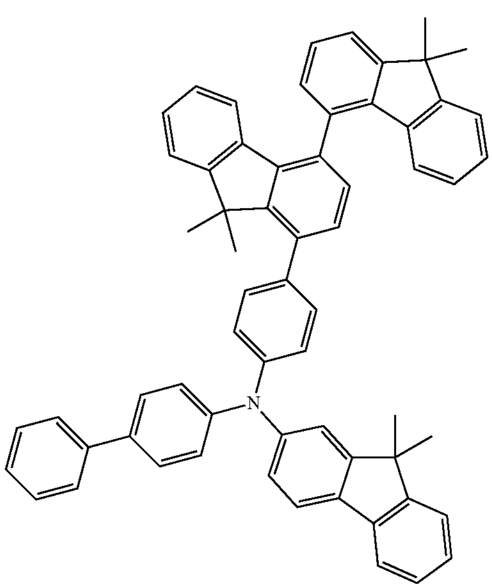
-continued
E-140
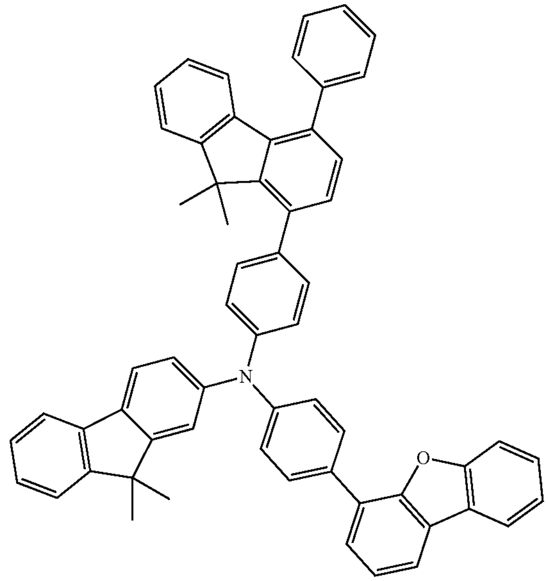
E-141
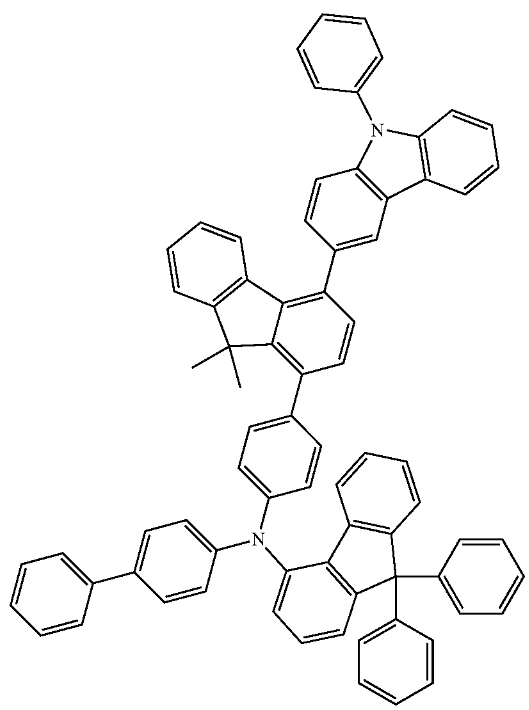

-continued
E-142
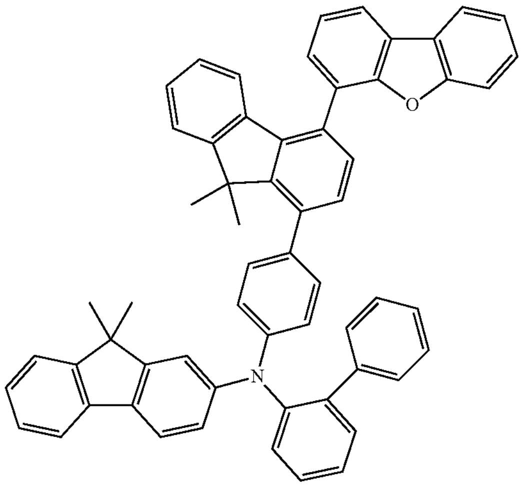
E-143
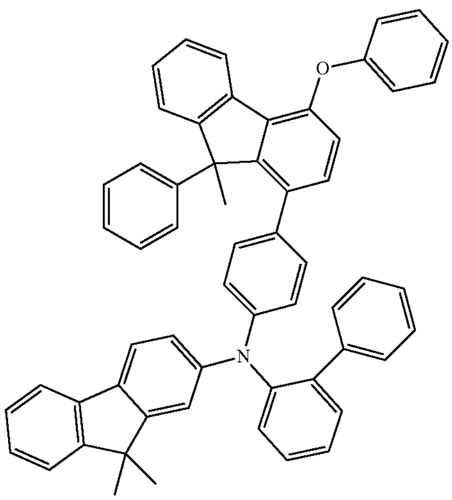
E-144
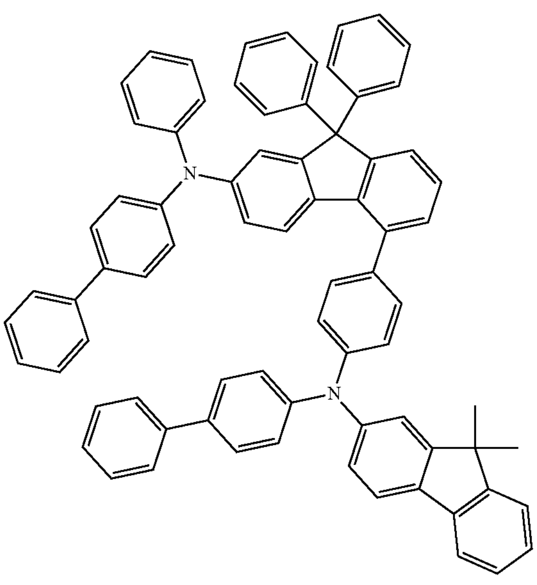
-continued
E-145
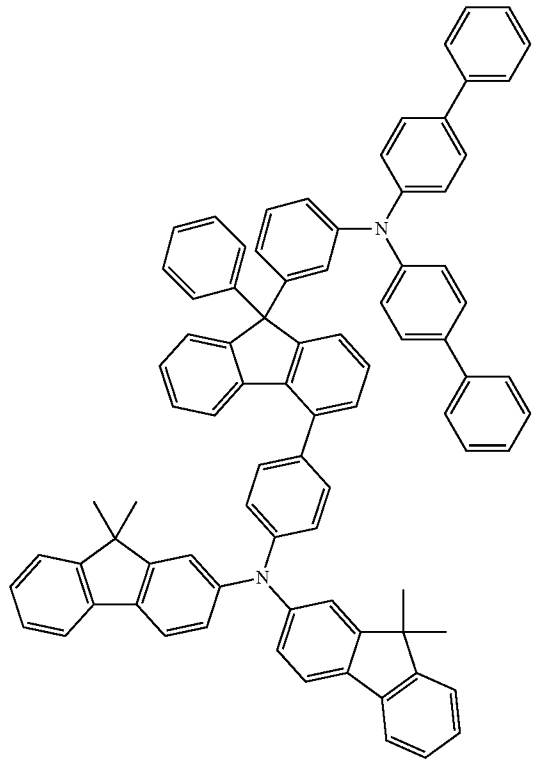
E-146
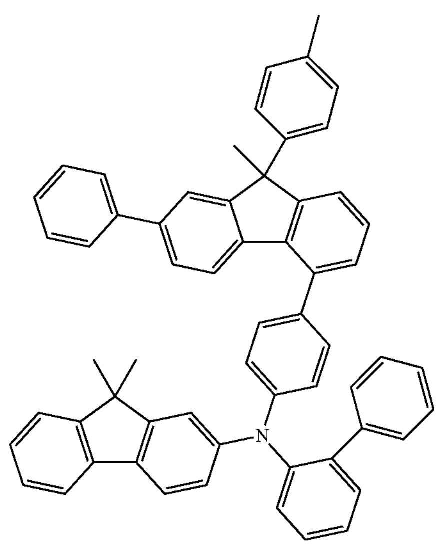

-continued
E-147
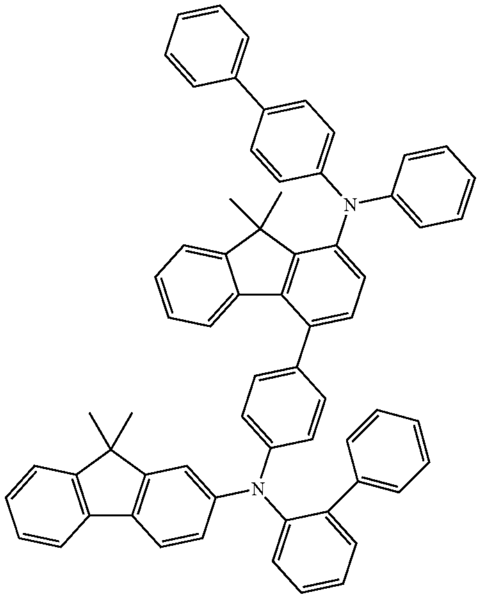
E-148
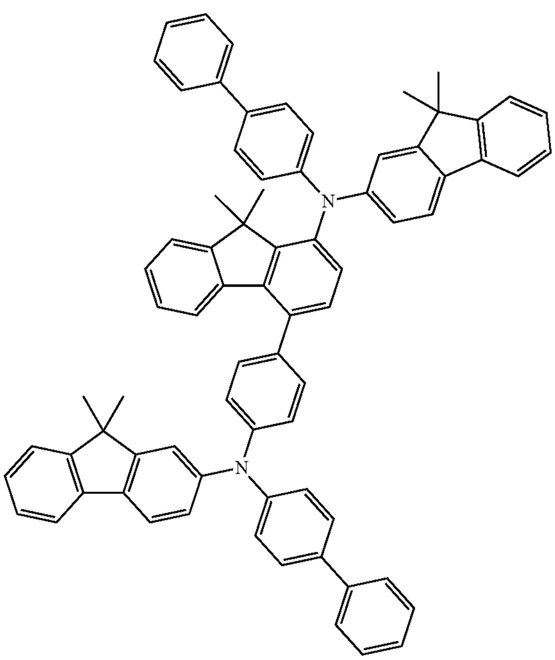
-continued
E-149
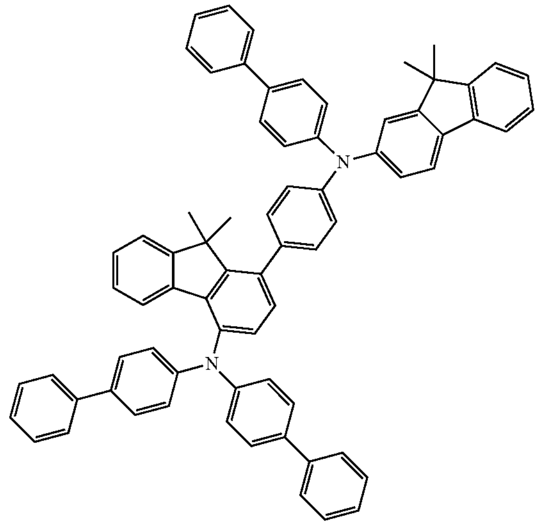
E-150
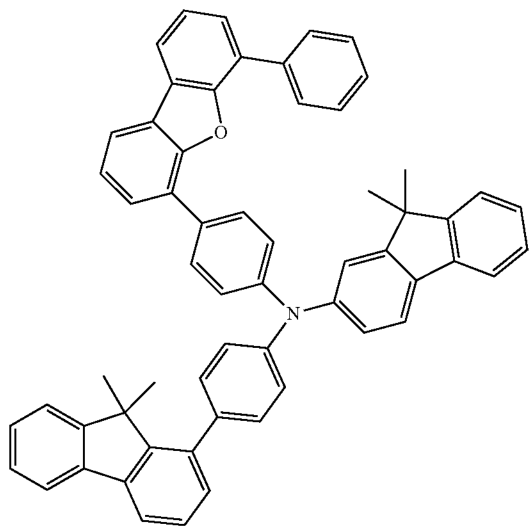
E-151
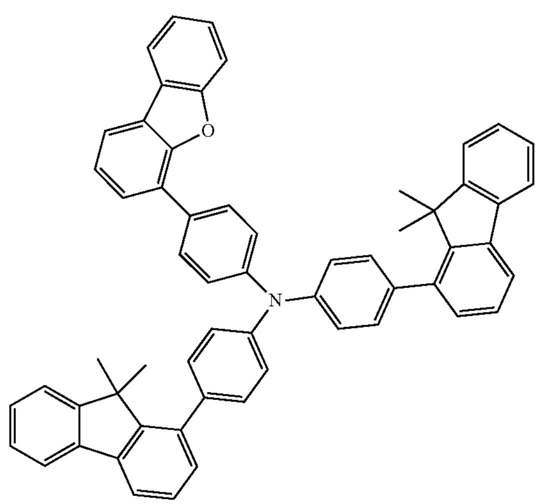

-continued
E-152
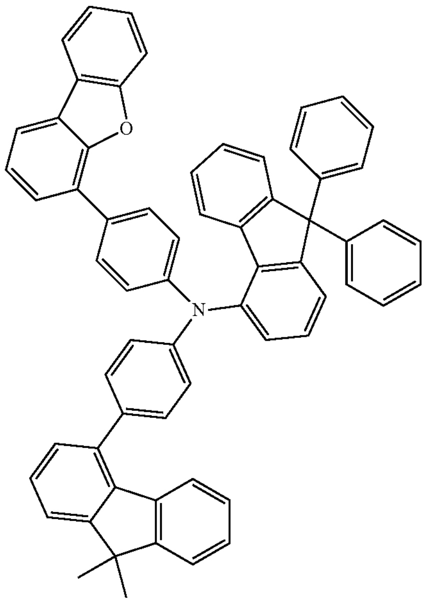
E-153
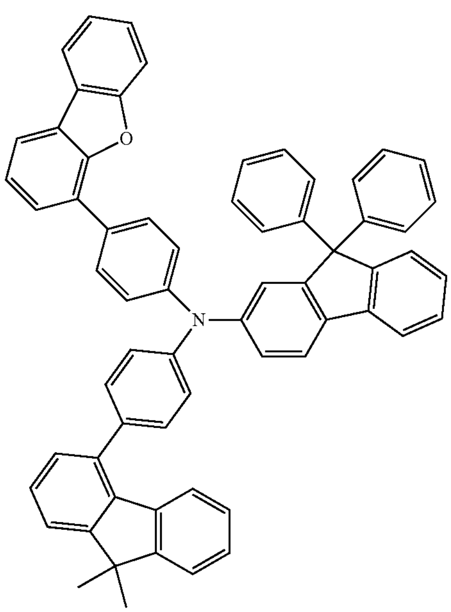
-continued
E-154
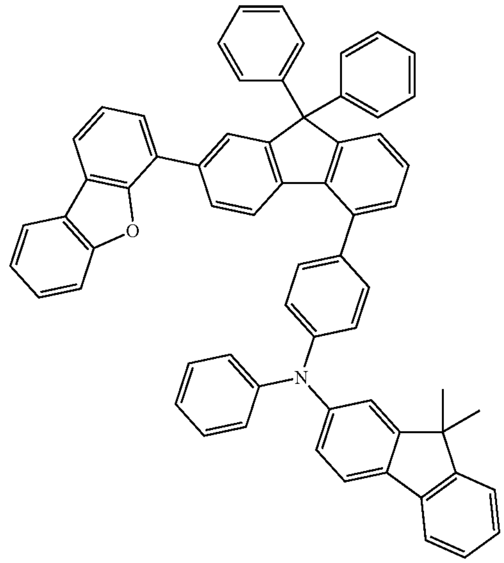
E-155
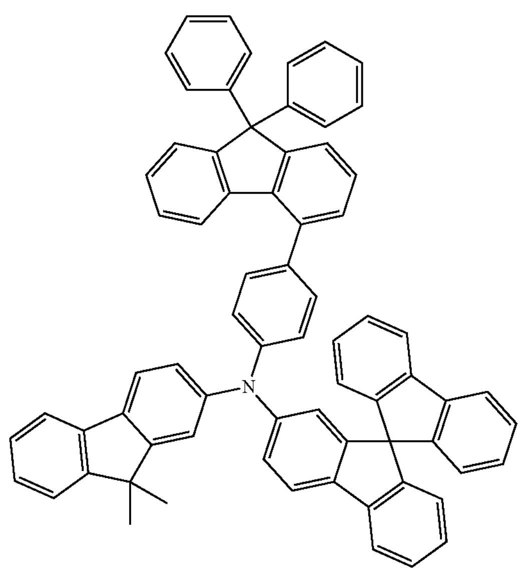

-continued
E-156
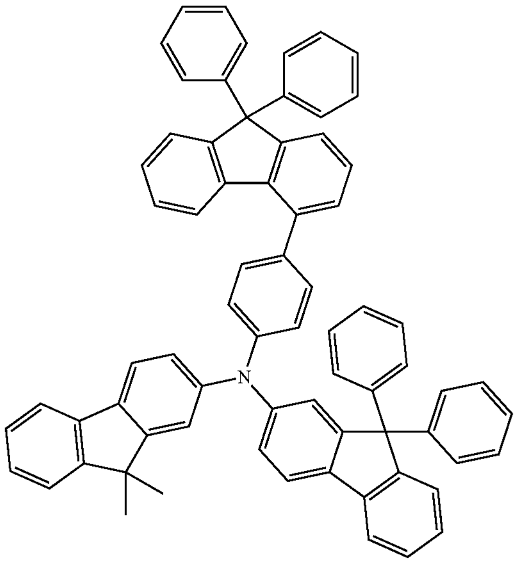
E-157
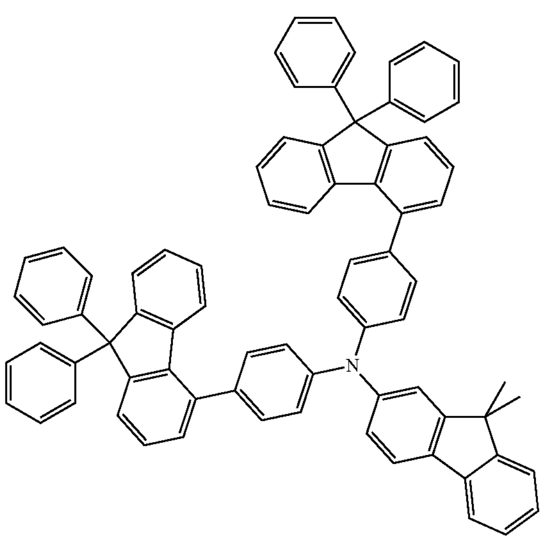
-continued
E-158
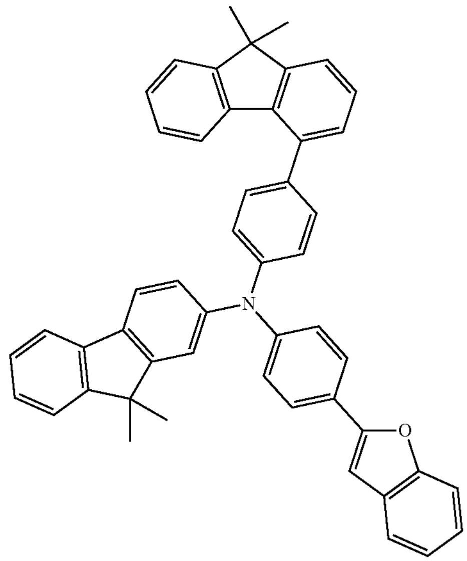
E-159
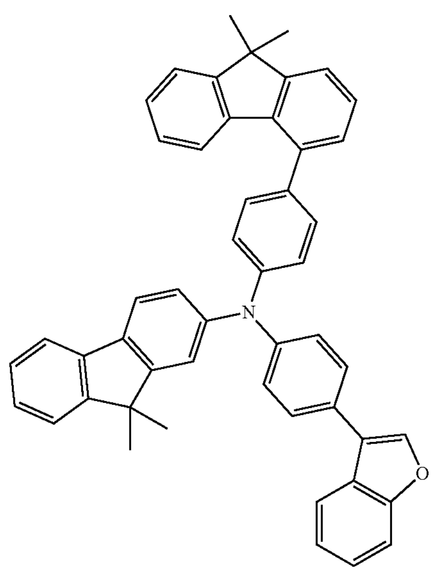

E-160
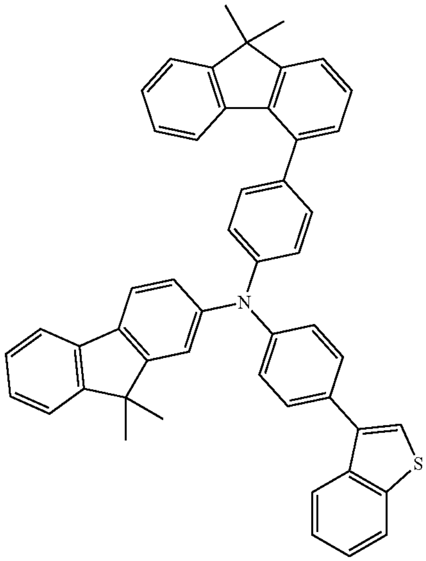
E-161
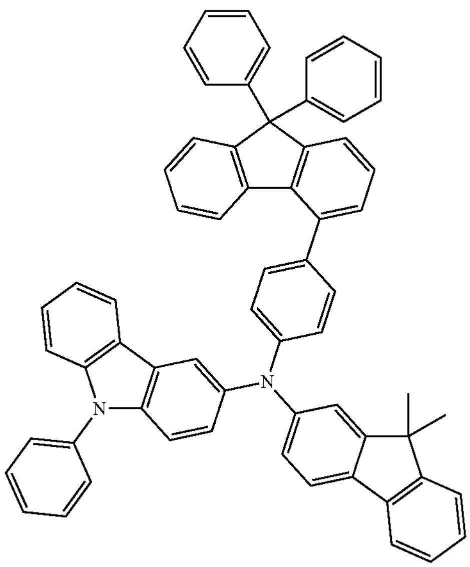
E-162
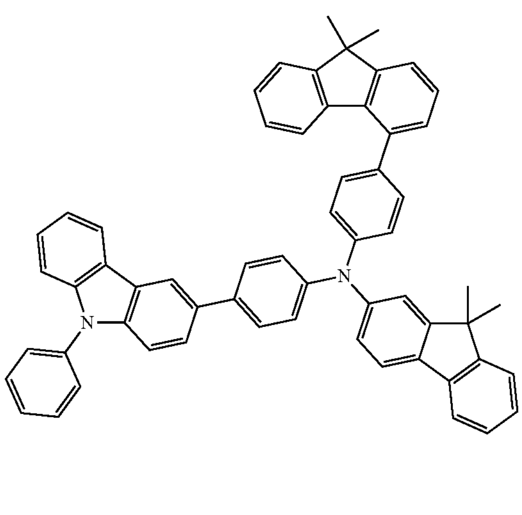
E-163
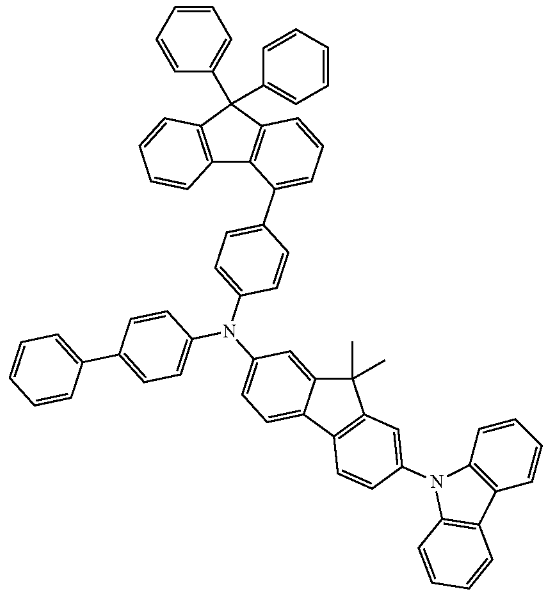
E-164
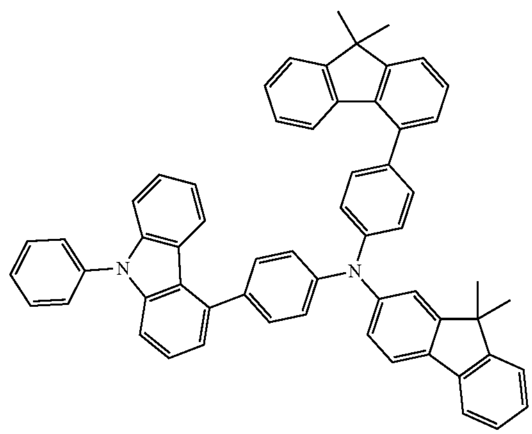
E-165
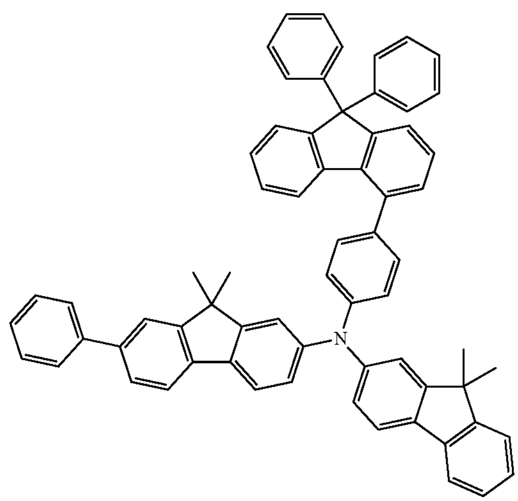

-continued
E-166
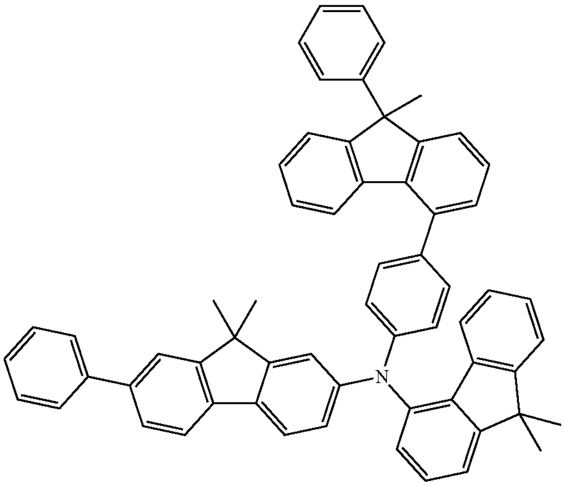
E-167
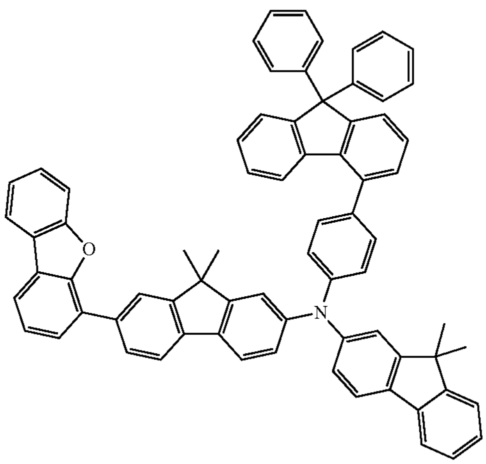
E-168
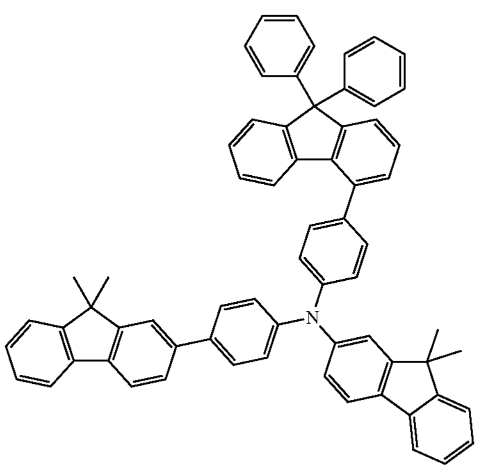
-continued
E-169
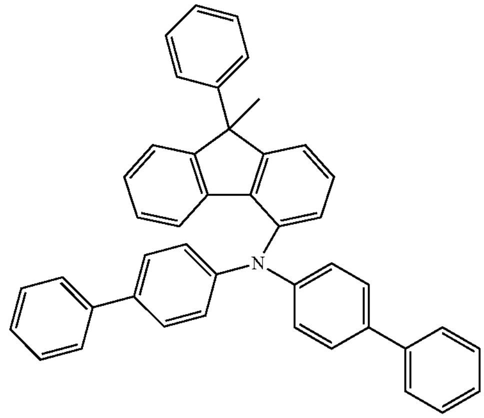
E-170
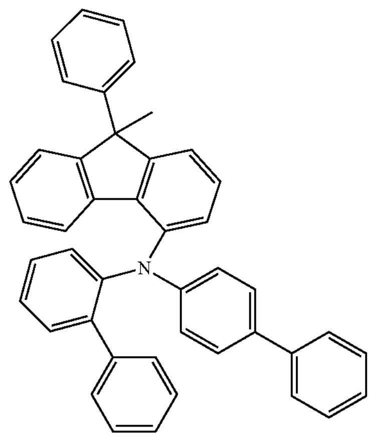
E-171
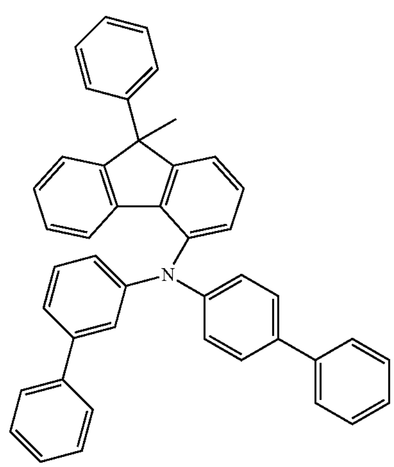

-continued
E-172
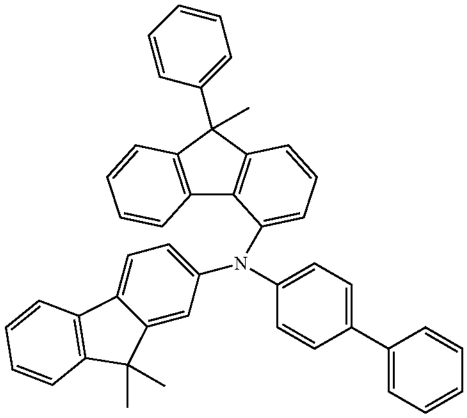
E-173
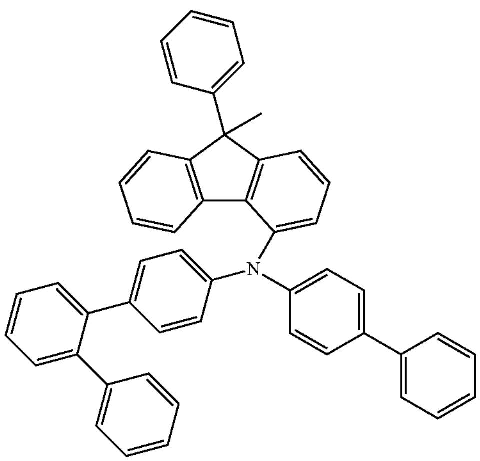
E-174
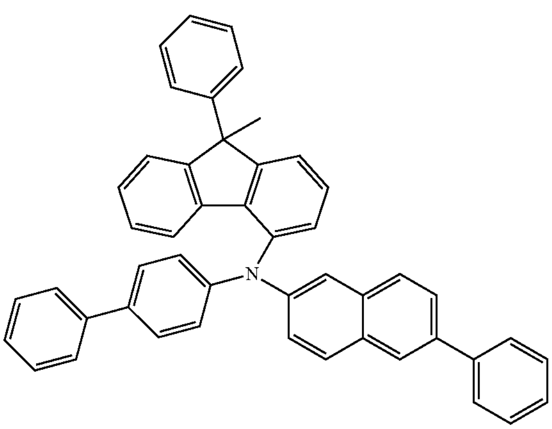
-continued
E-175
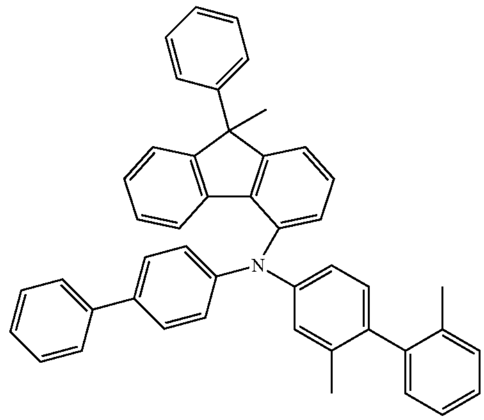
E-176
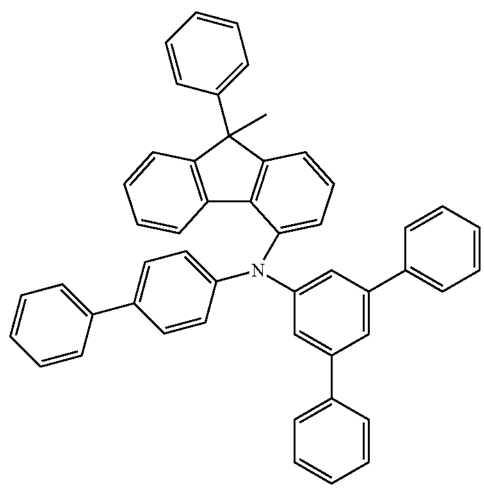
E-177
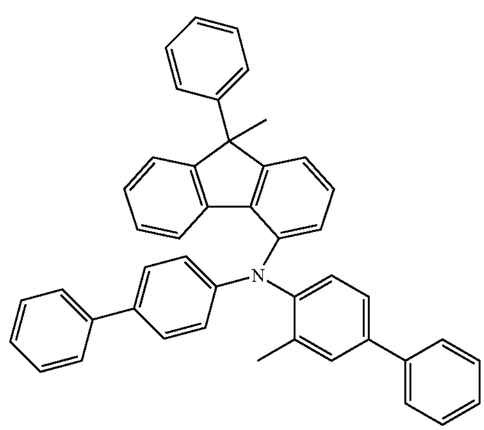

-continued
E-178
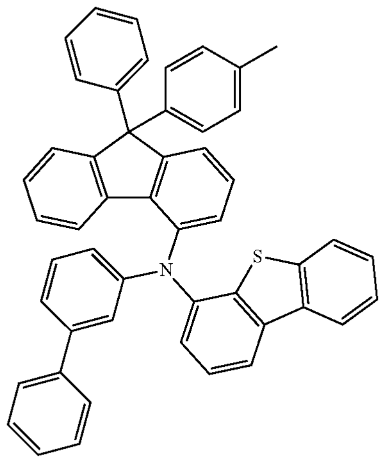
E-179
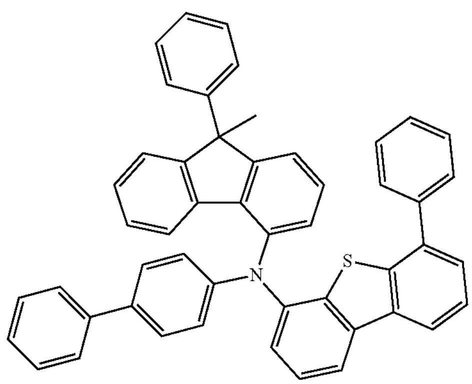
E-180
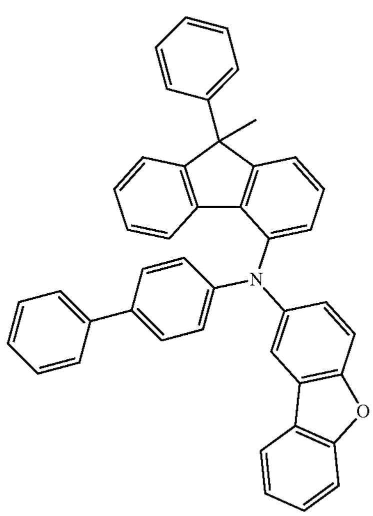
-continued
E-181
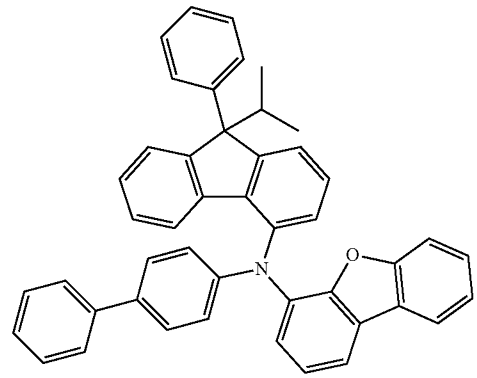
E-182
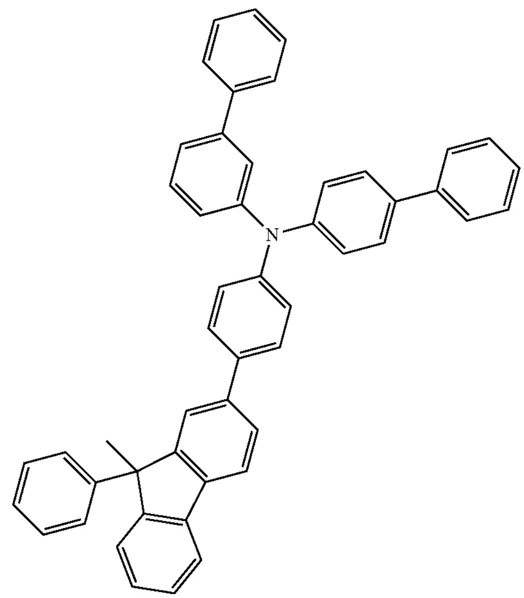
E-183
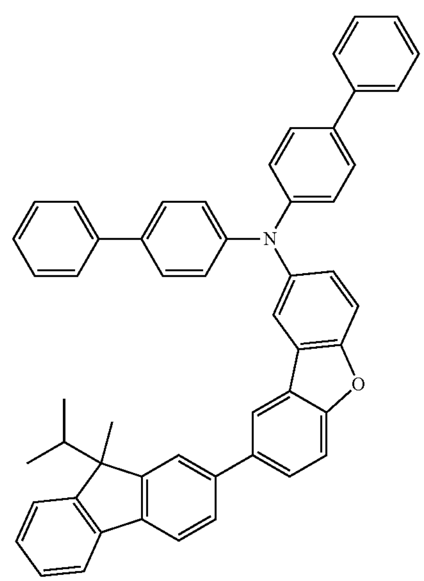

-continued
E-184
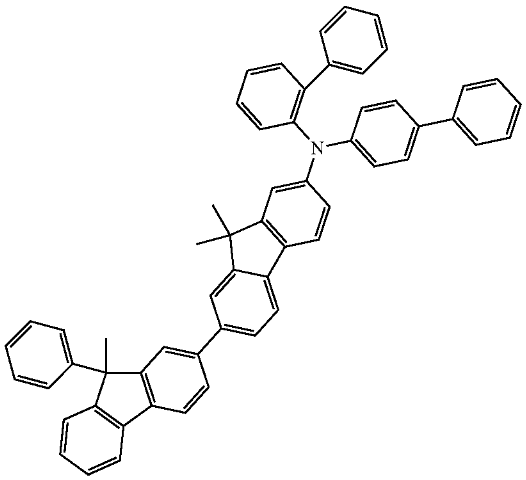
E-185
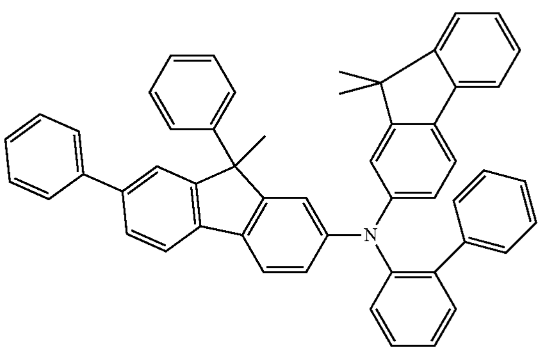
E-186
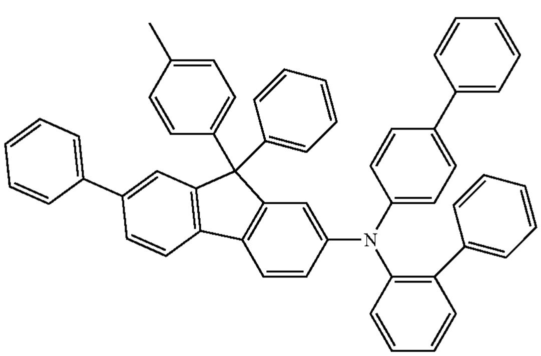
-continued
E-187
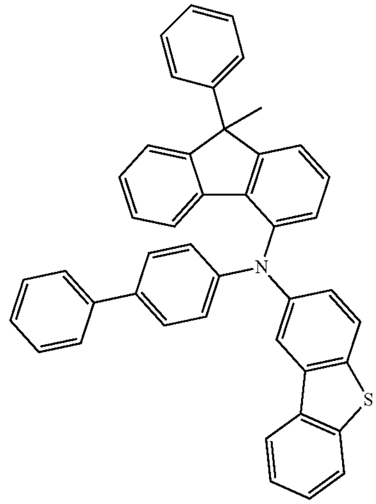
E-188
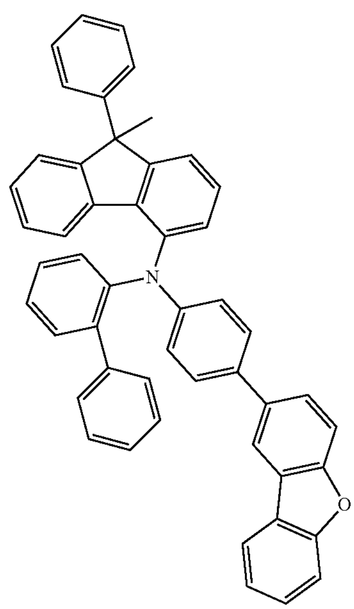

-continued
E-189
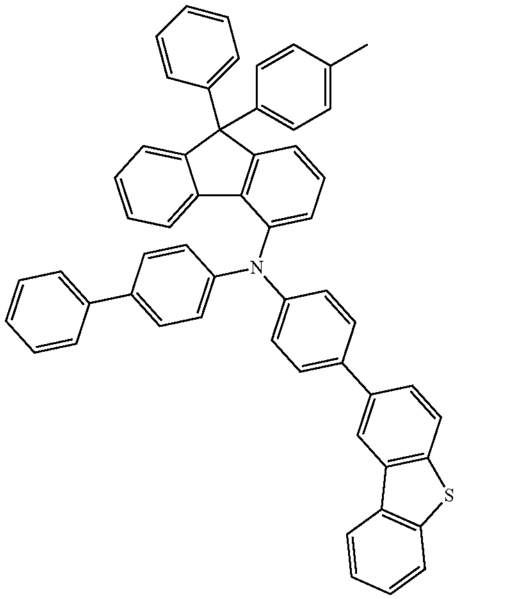
E-190
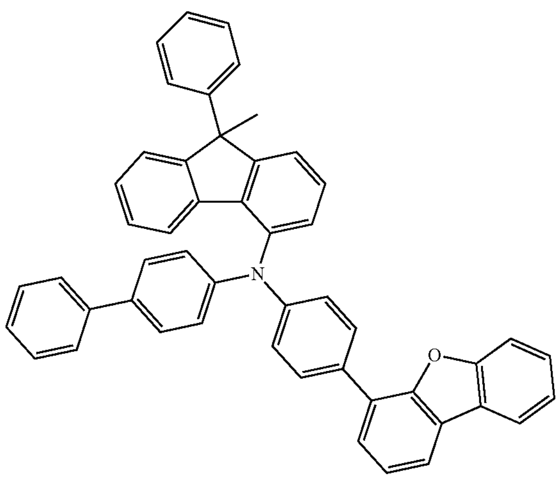
E-191
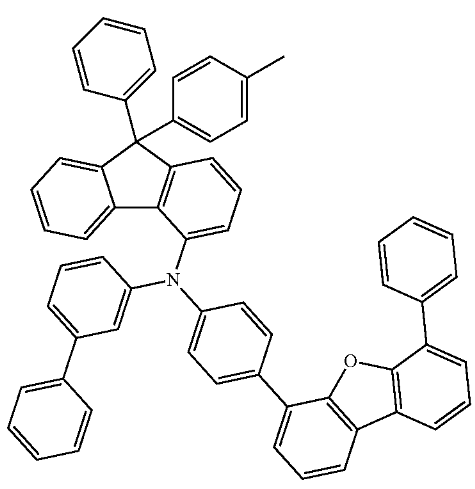
-continued
E-192
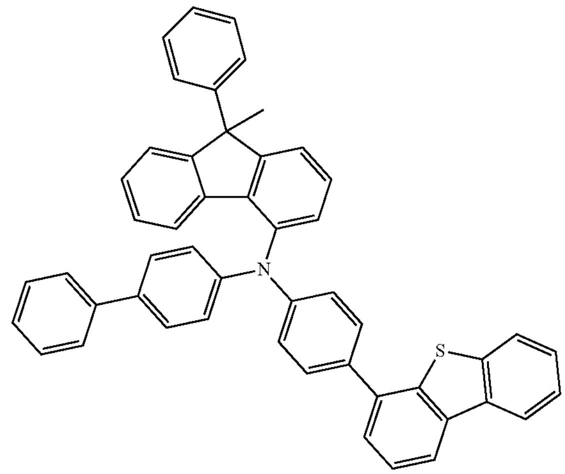
E-193
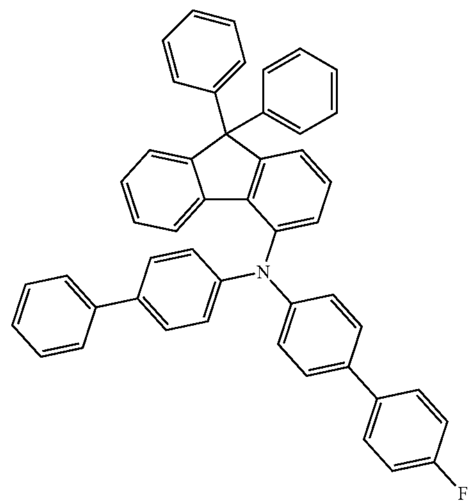
E-194
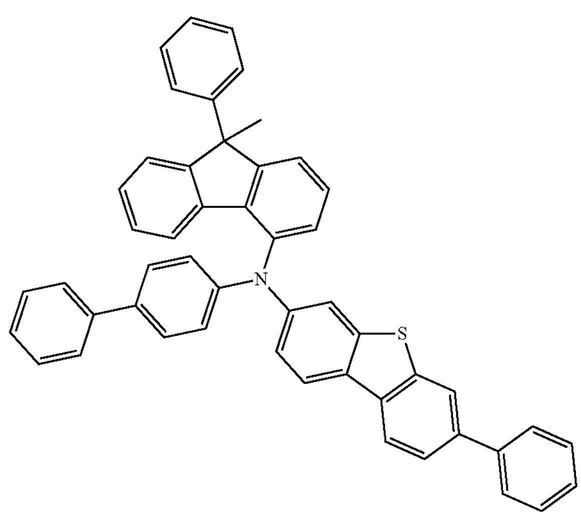

-continued
E-195
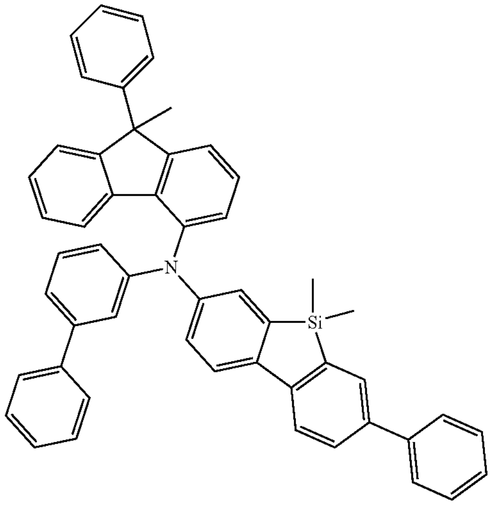
E-196
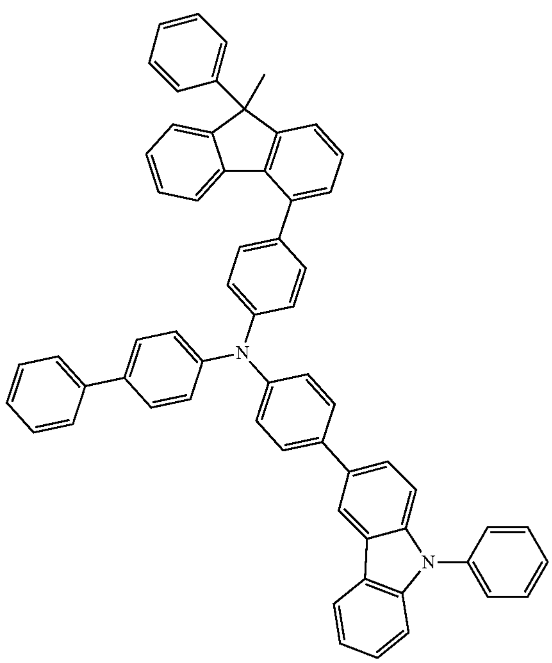
-continued
E-197
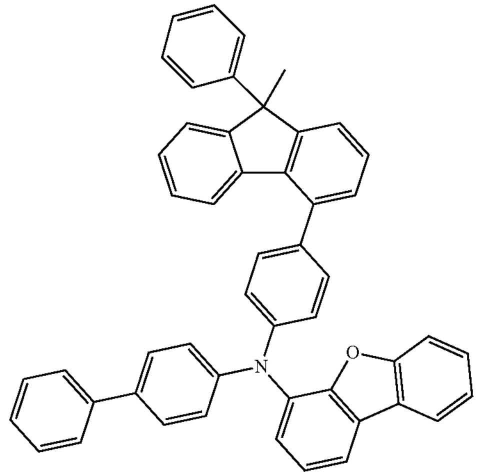
E-198
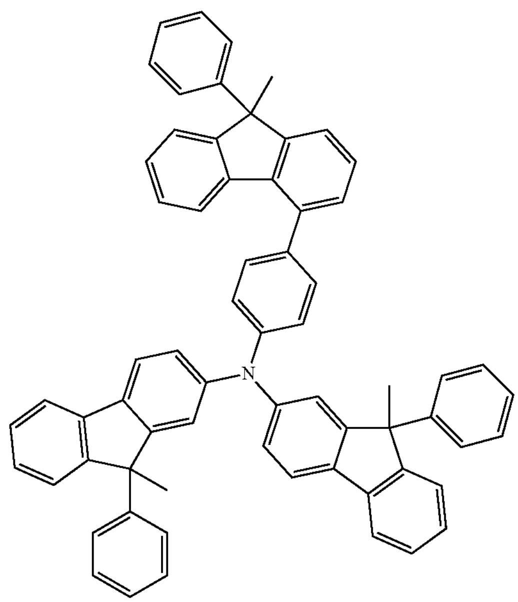
E-199
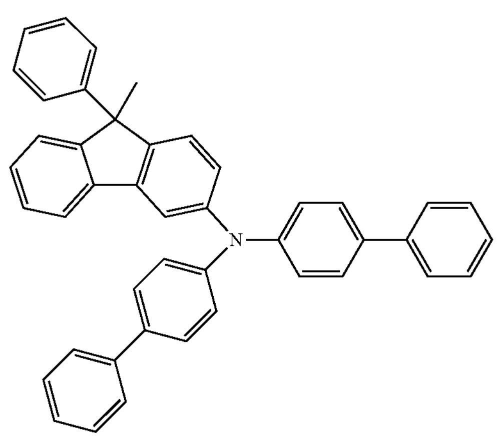

-continued
E-200
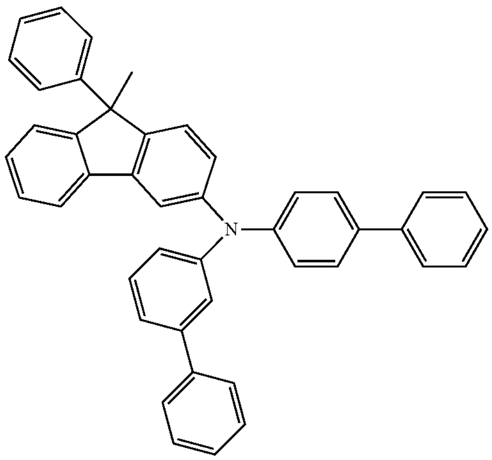
E-201
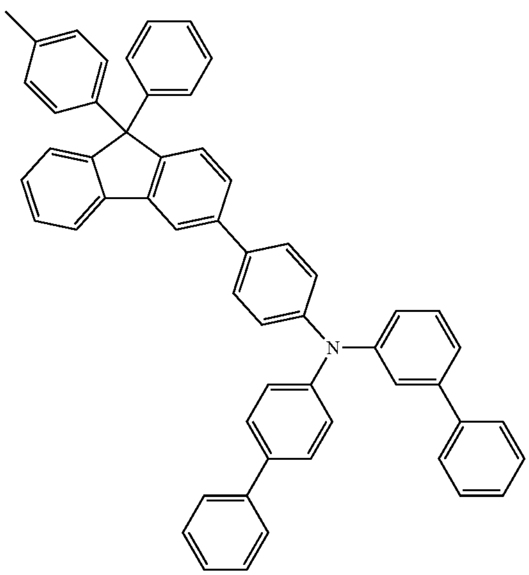
E-202
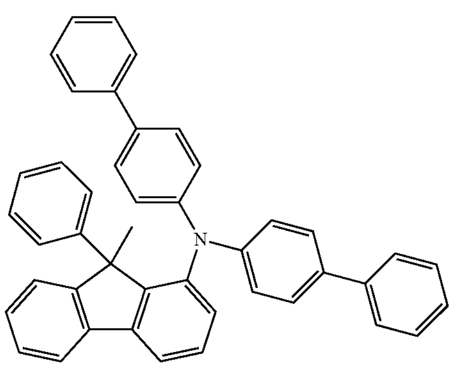
-continued
E-203
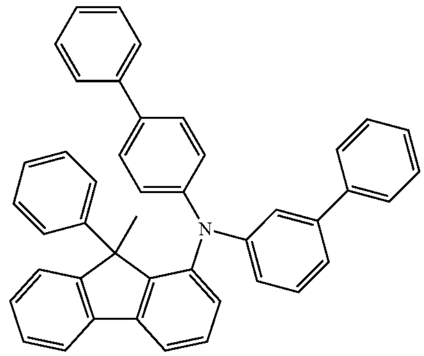
E-204
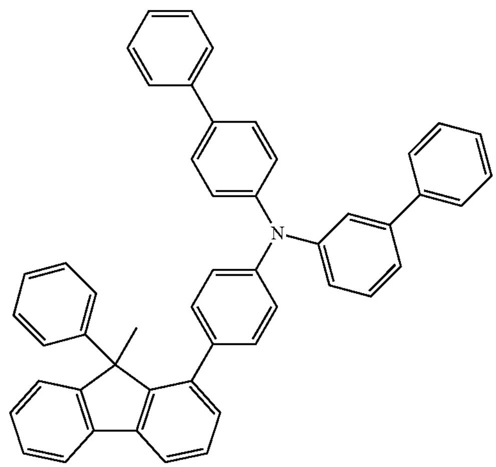
E-205
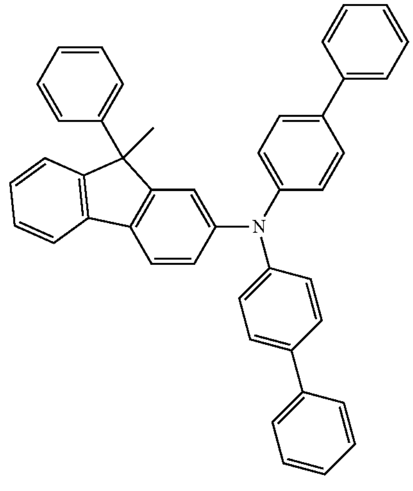

-continued
E-206
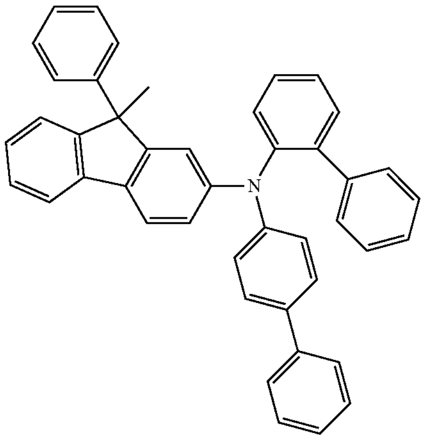
E-207
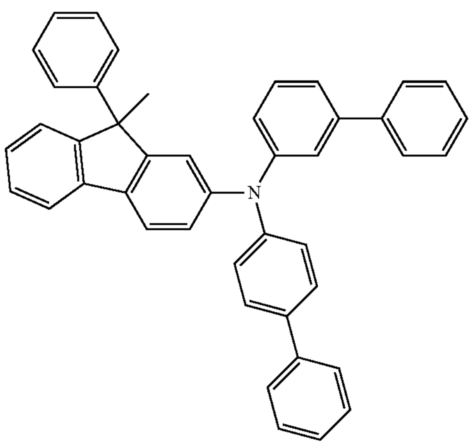
E-208
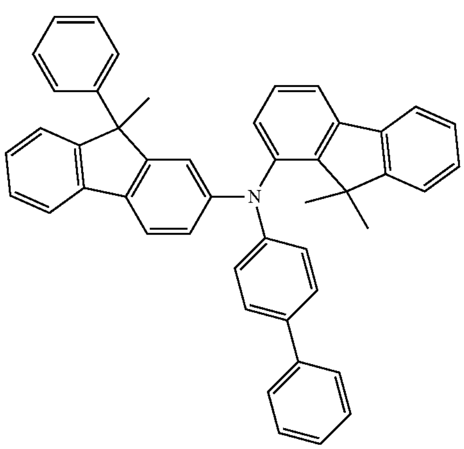
-continued
E-209
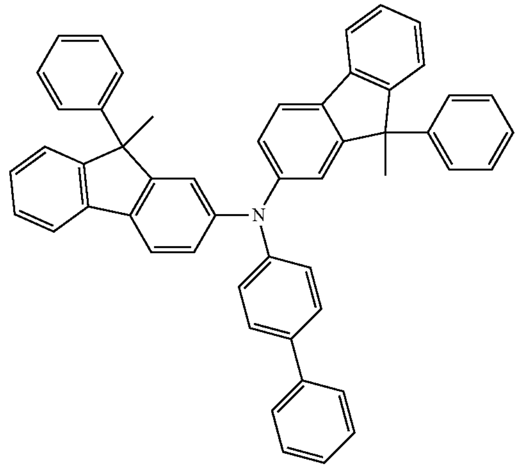
E-210
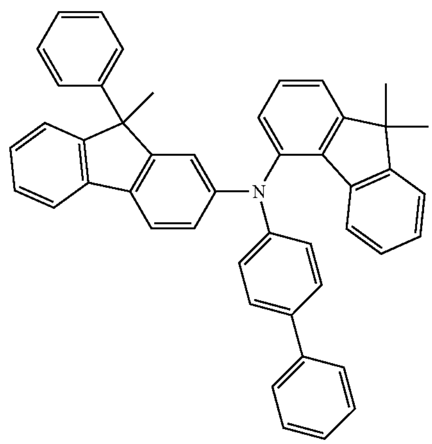
E-211
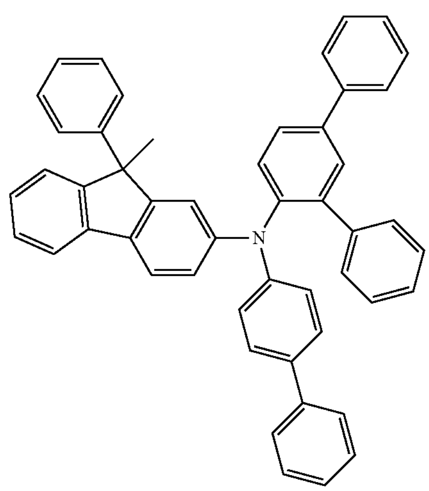

-continued
E-212
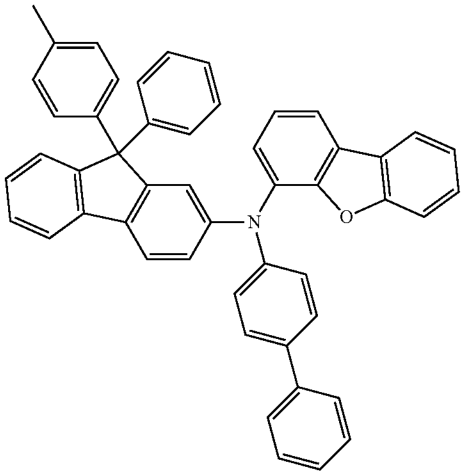
E-213
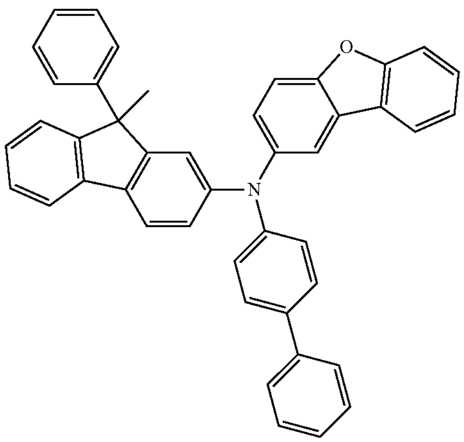
E-214
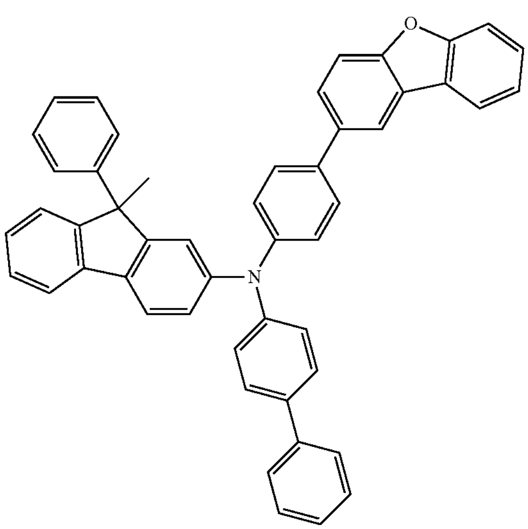
-continued
E-215
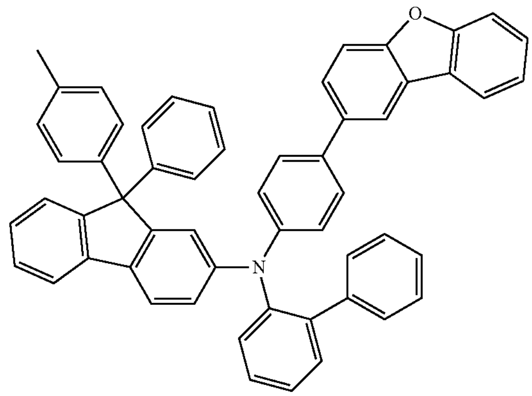
E-216
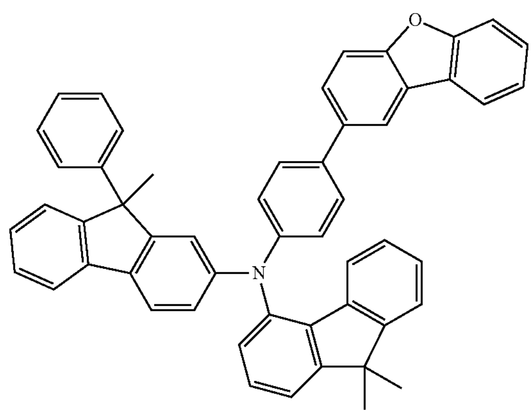
E-217
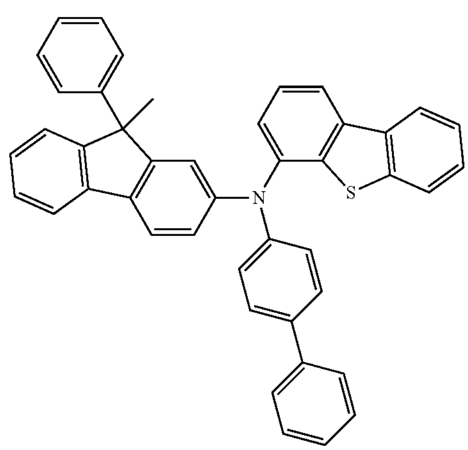

-continued
E-218
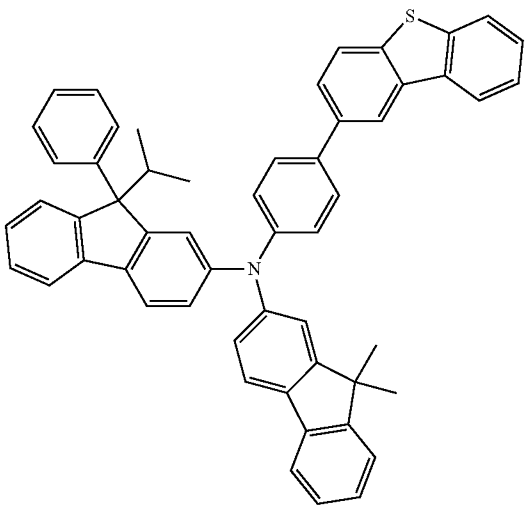
E-219
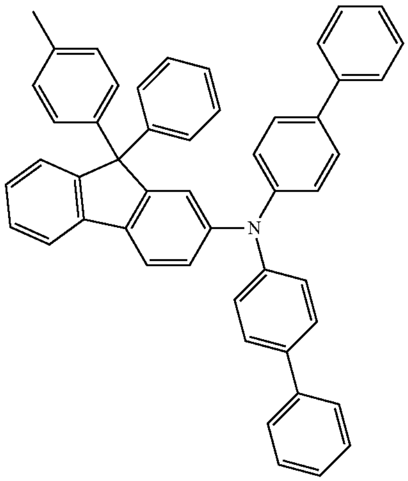
E-220
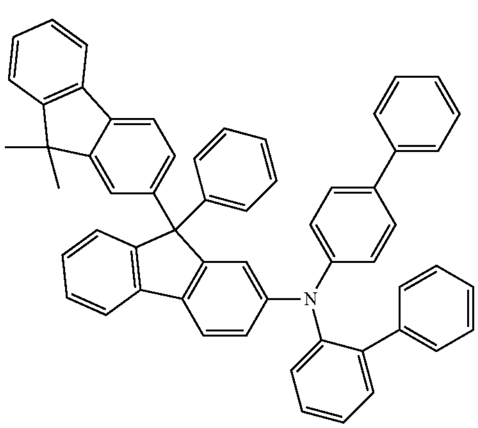
-continued
E-221
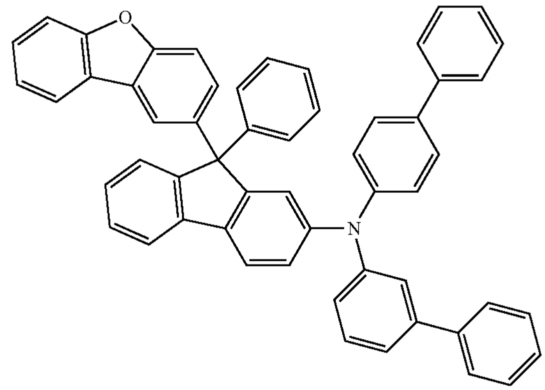
E-222
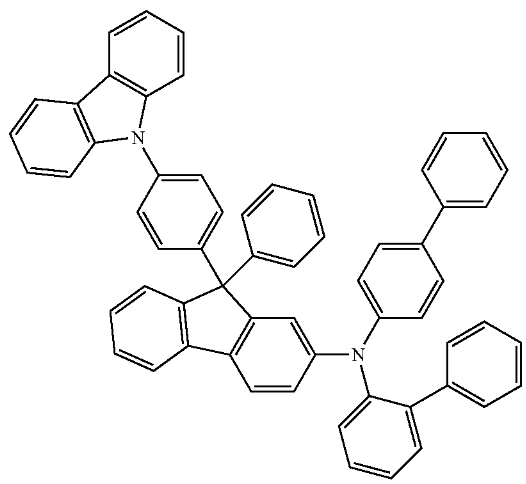
E-223
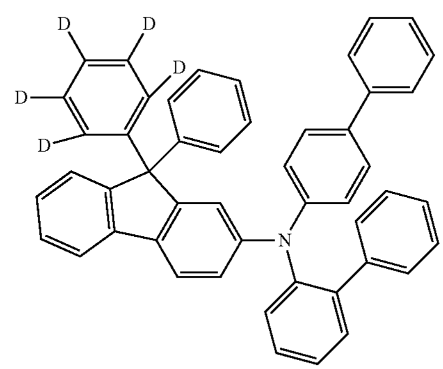

E-224
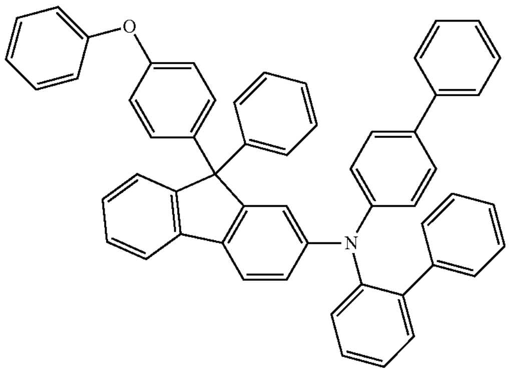
E-225
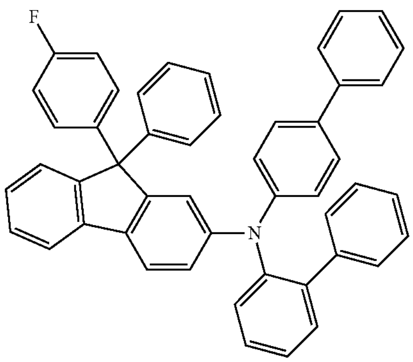
E-226
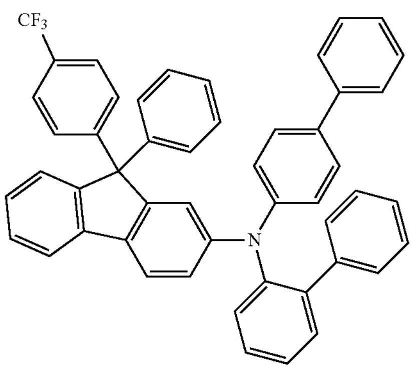
E-227
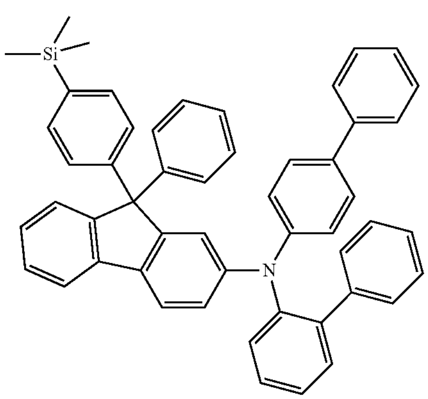
E-228
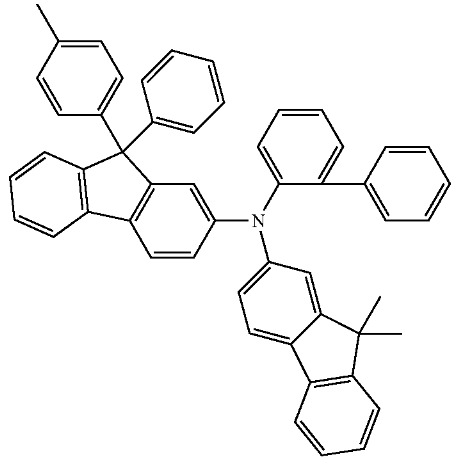
E-229
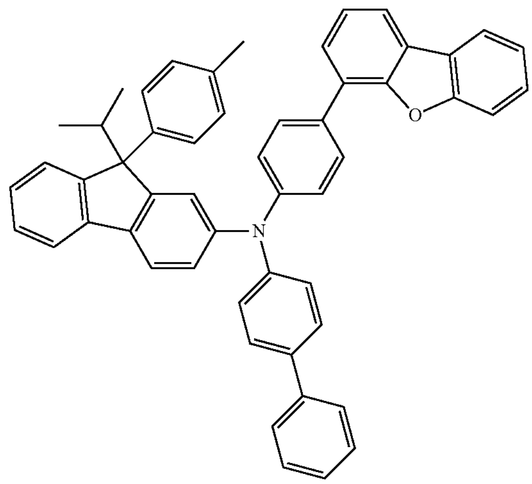
E-230
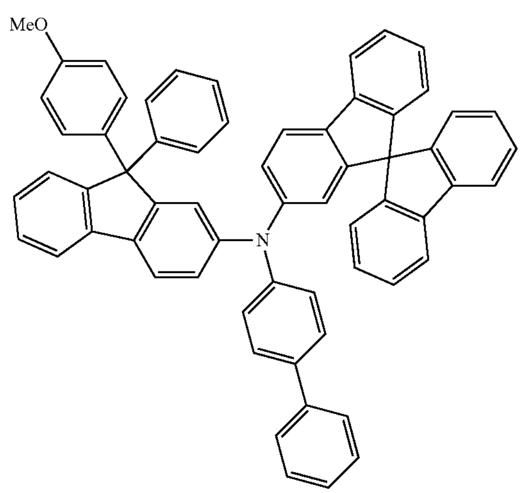

-continued
E-231
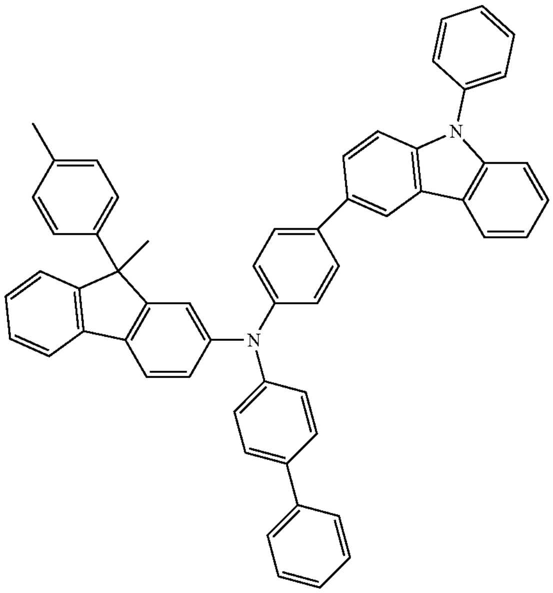
E-232
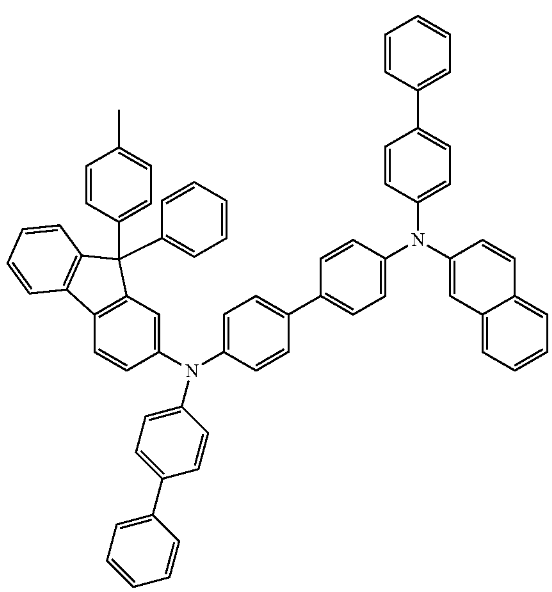
-continued
E-233
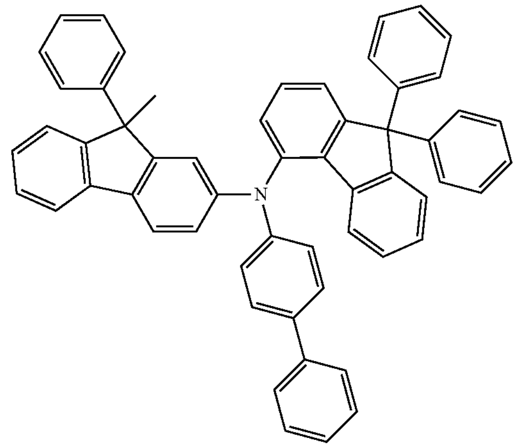
E-234
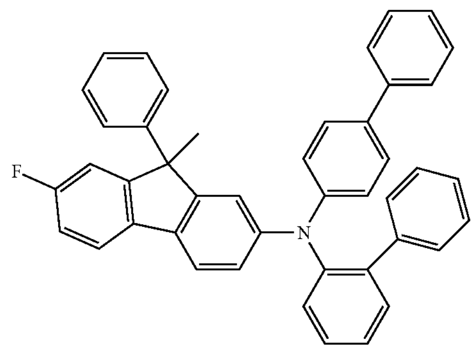
E-235
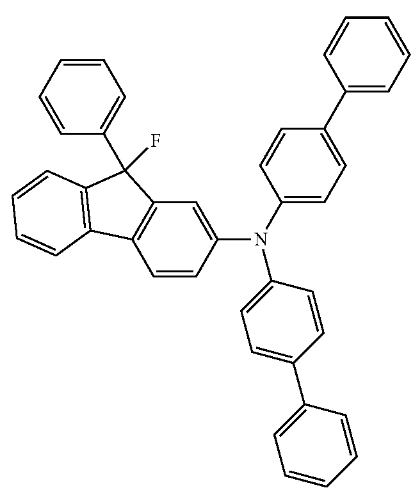

E-236
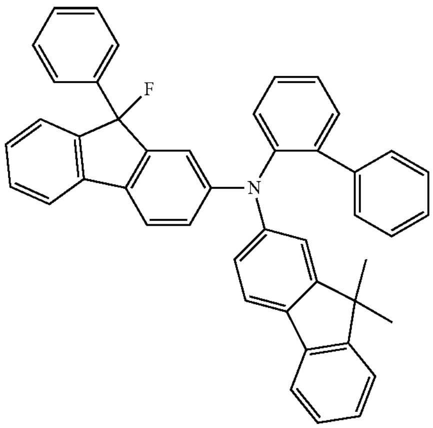
E-237
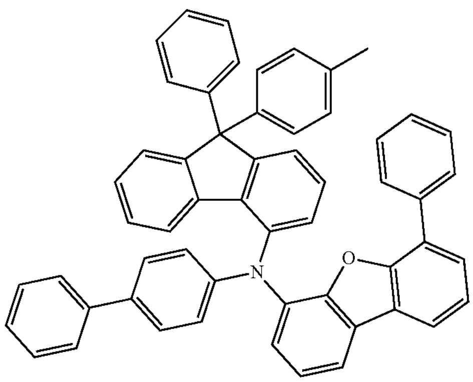
E-238
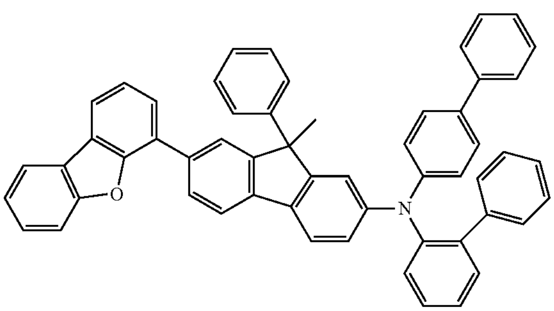
E-239
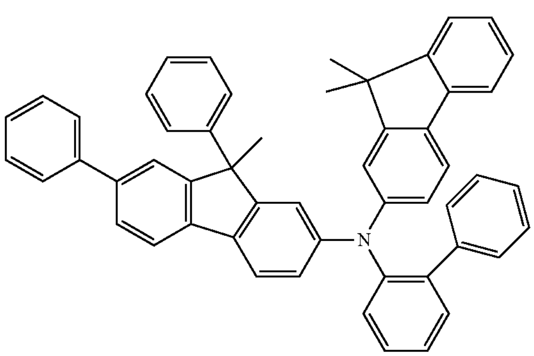
E-240
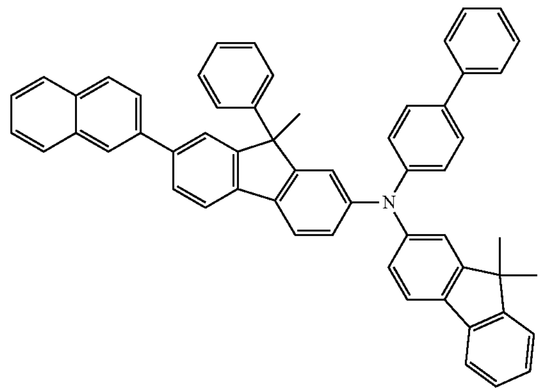
E-241
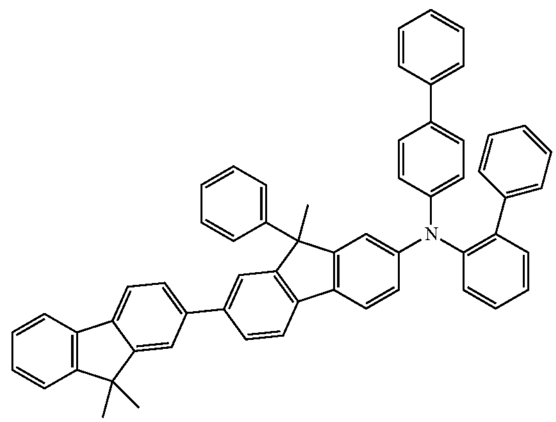
E-242
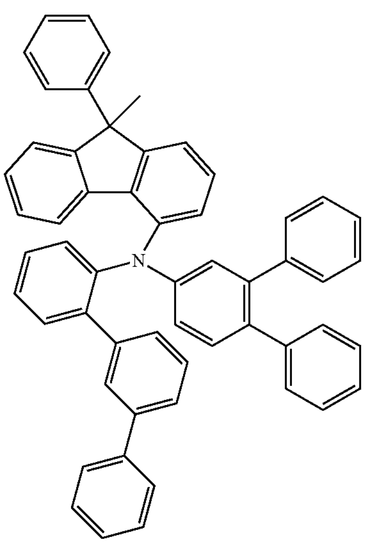

E-243
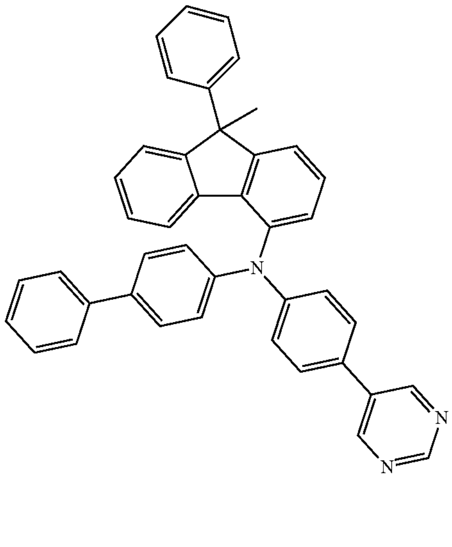
E-244
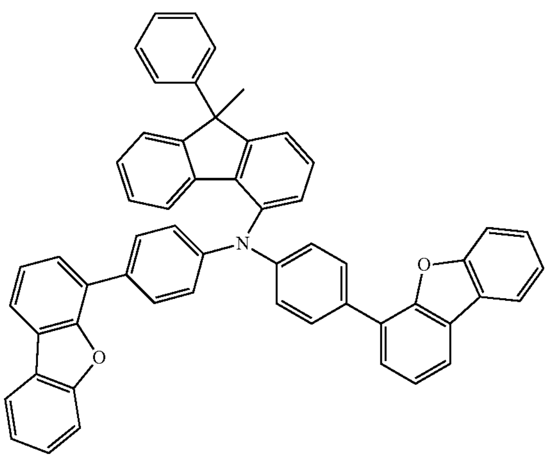
E-245
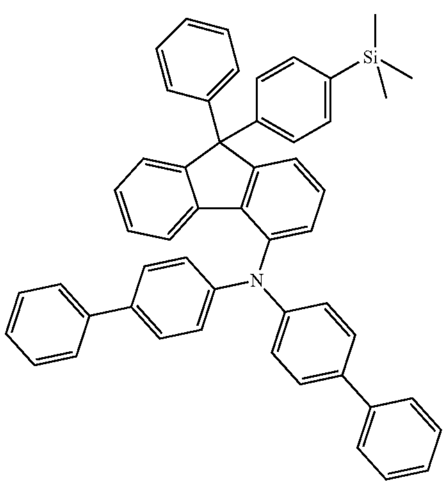
E-246
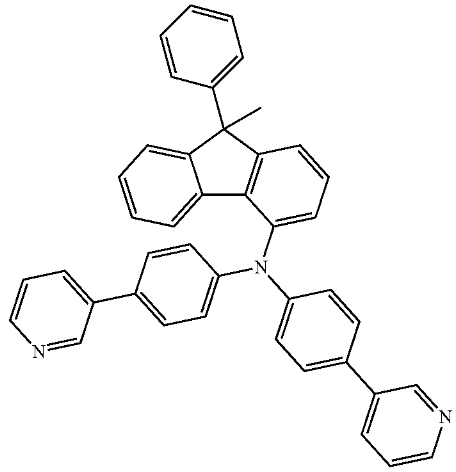
E-247
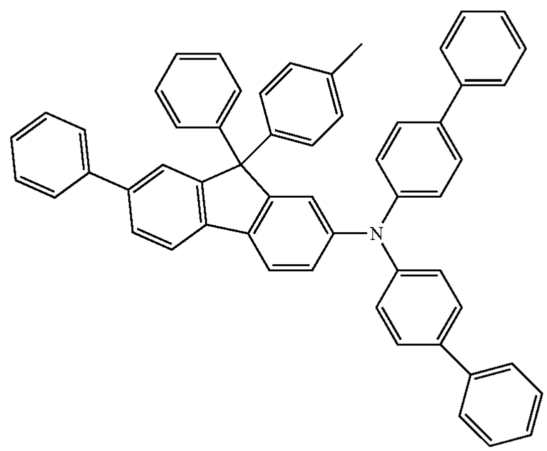
E-248
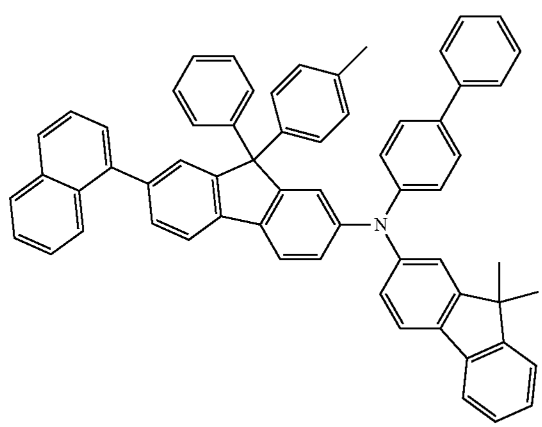

-continued
E-249
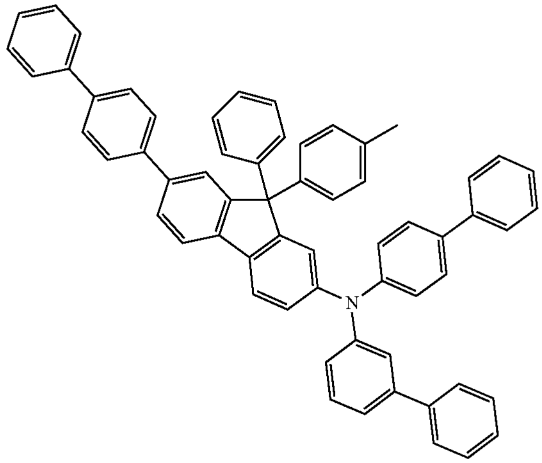
E-250
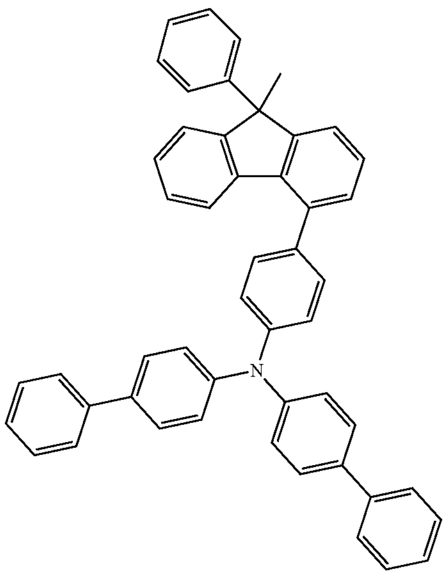
E-251
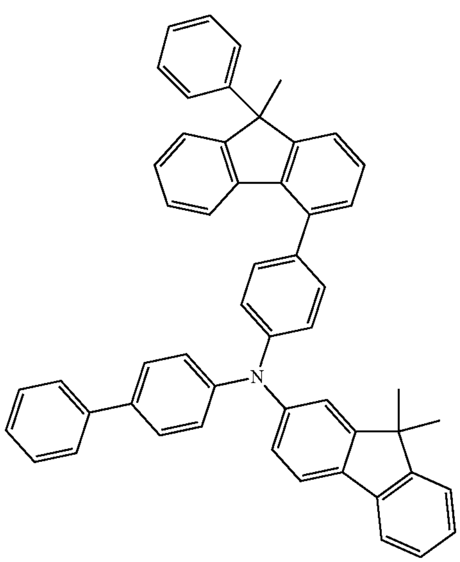
-continued
E-252
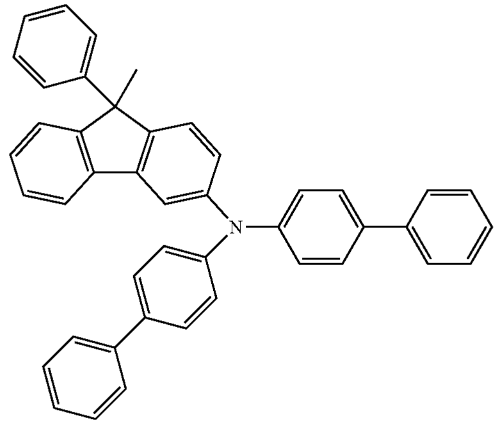
E-253
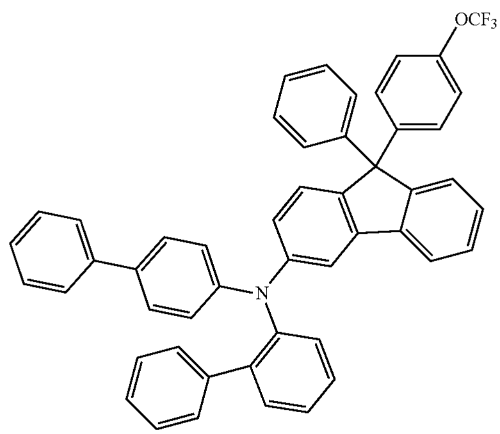
E-254
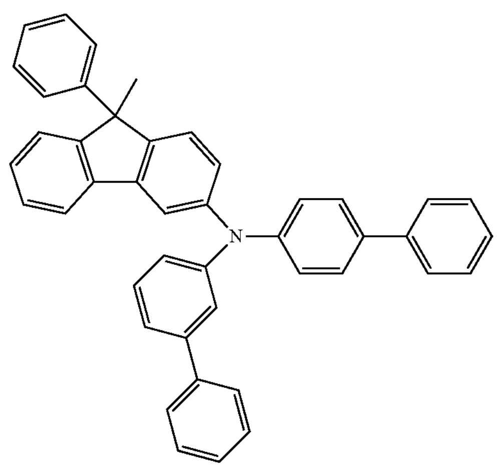

E-255
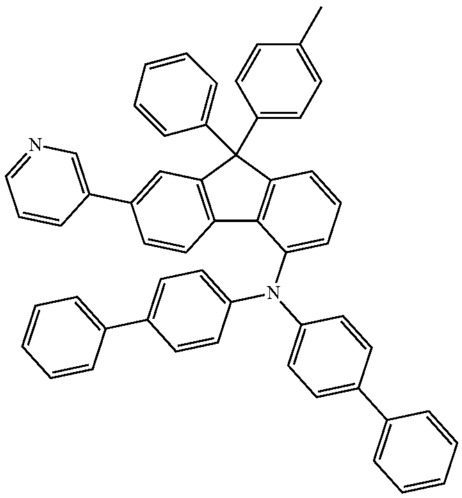
E-256
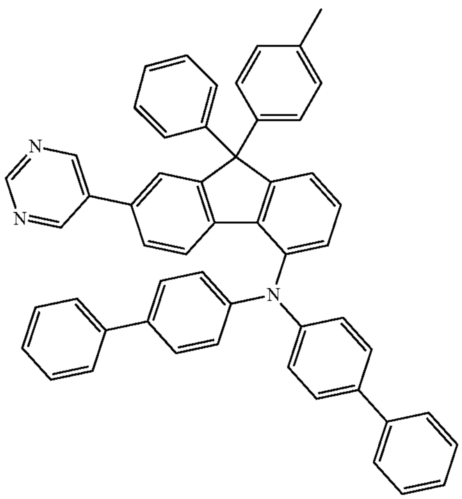
E-257
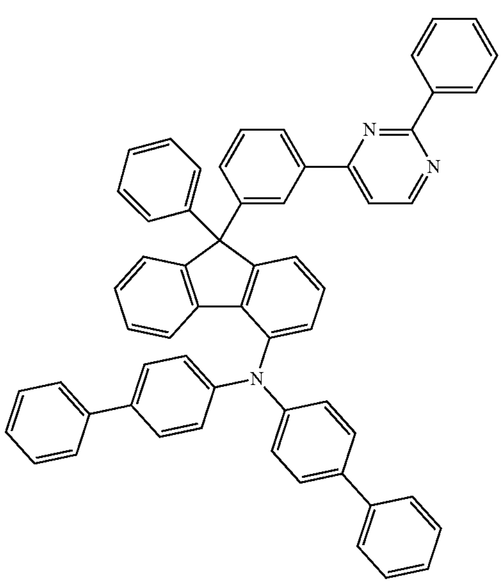
E-258
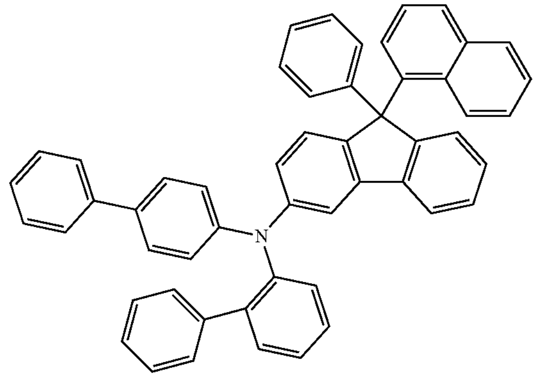
E-259
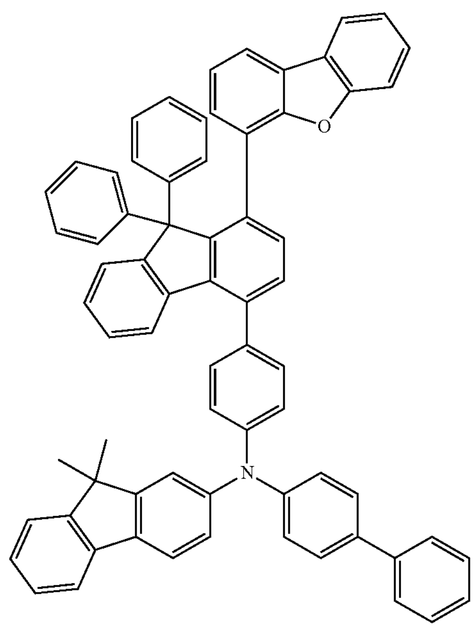

-continued
E-260
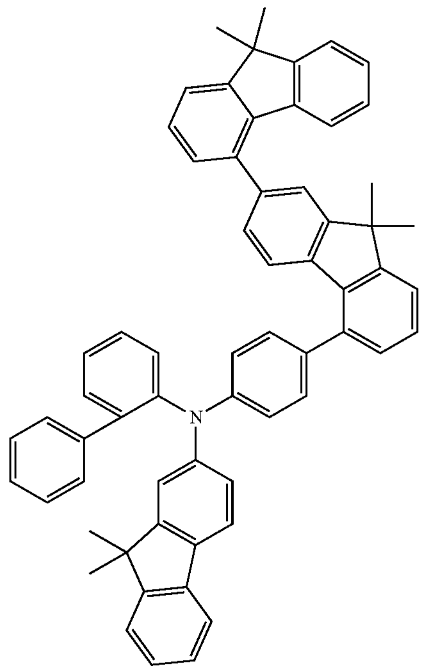
E-261
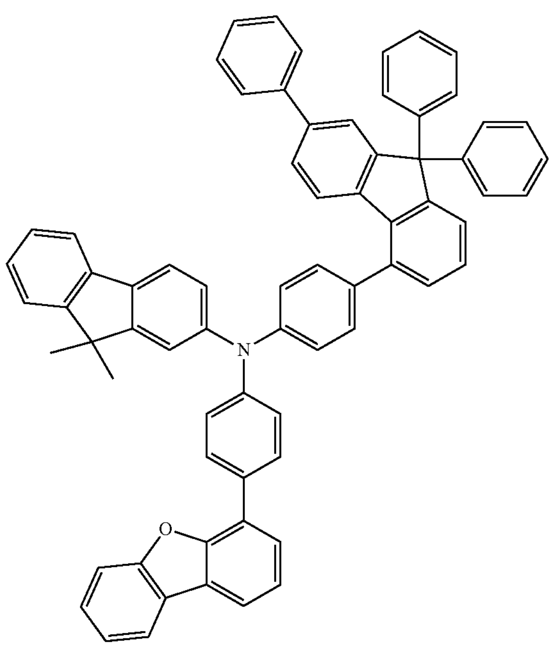
-continued
E-262
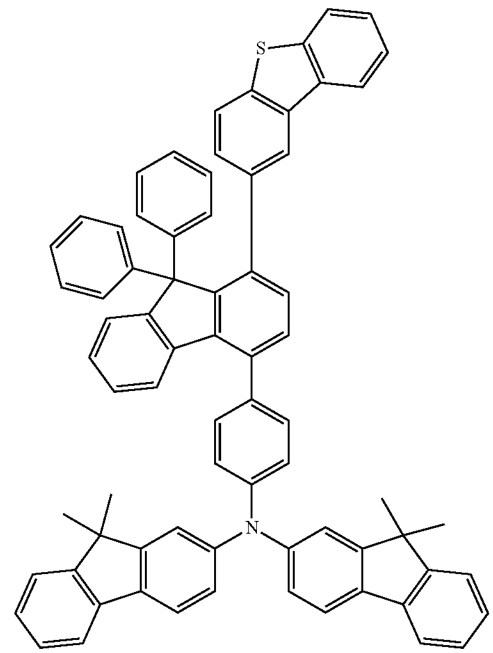
E-263
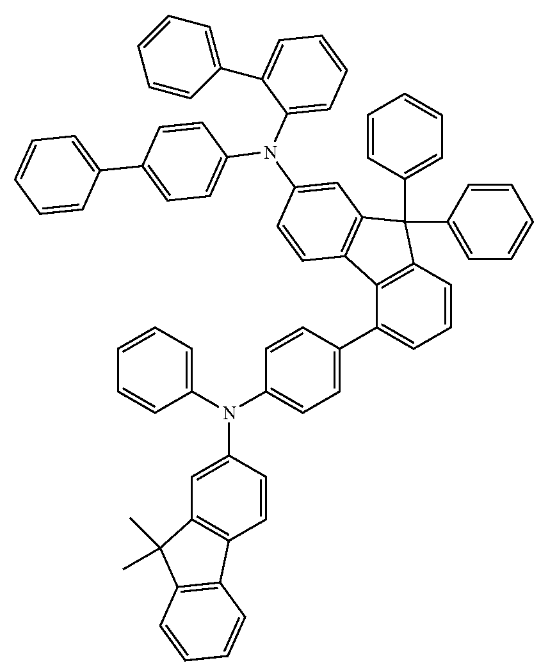

-continued
E-264
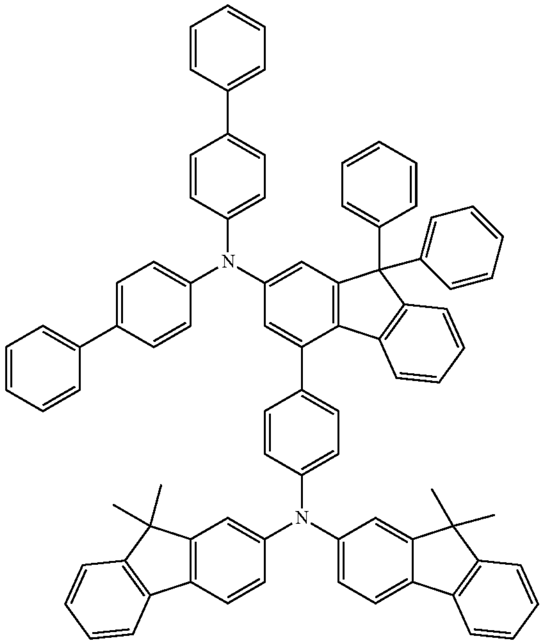
E-265
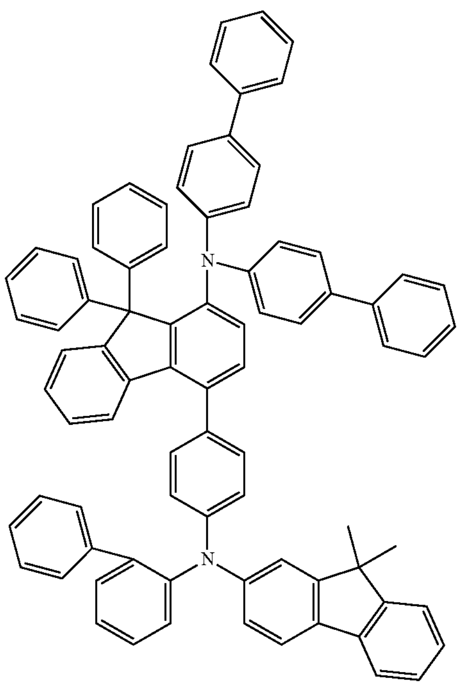
-continued
E-266
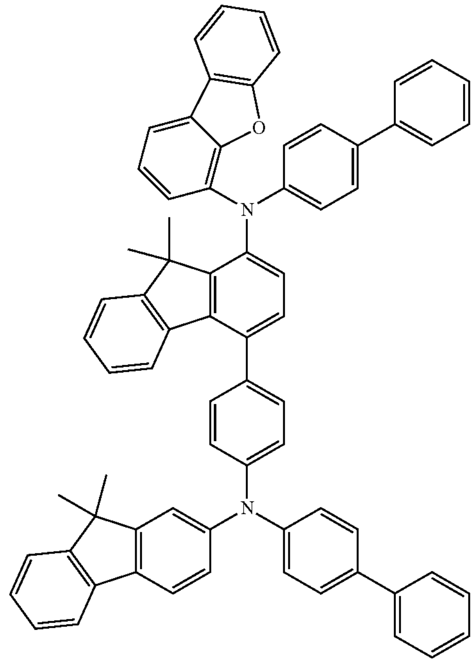
E-267
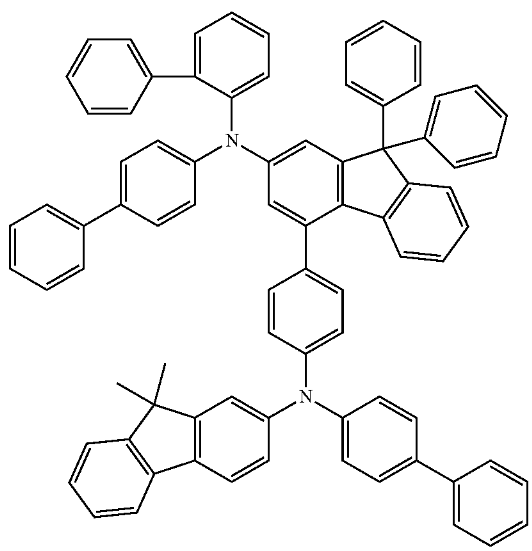

-continued

E-268

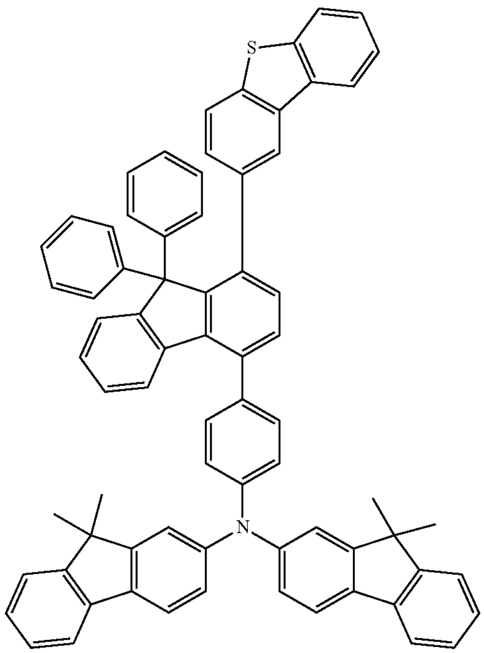

E-269

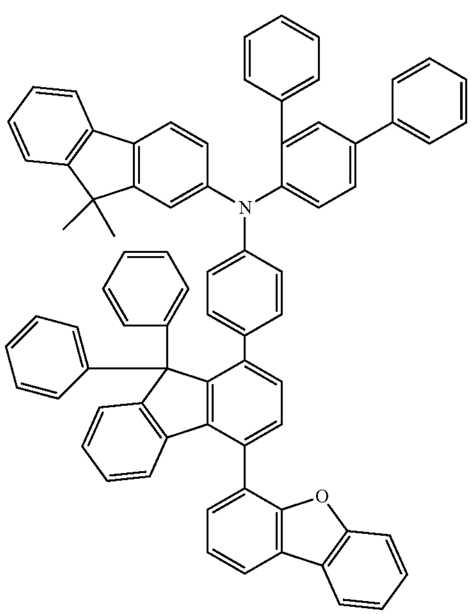

-continued

E-270

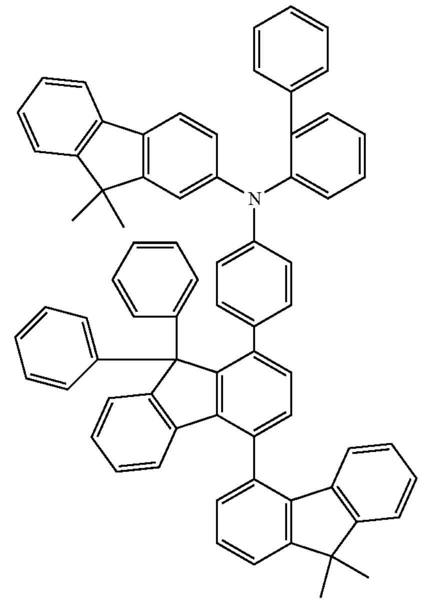

The first compound represented by Formula 1 and the second compound-represented by one selected from Formulae 2-1 to 2-3 may have fast electron transport characteristics and relatively high triplet energy levels, and thus, these compounds may enable effective energy deliver to a dopant included in the emission layer. In addition, the first compound represented by Formula 1 may serve as a suitable host for phosphorescent emission (in more detail, the first compound may have a higher triplet energy level than that of a phosphorescent dopant generally utilized in the art), and thus excitons may be effectively generated in the emission layer in the organic light-emitting device including the first compound, thereby exhibiting high efficiency.

However, in the organic light-emitting device including the first compound represented by Formula 1 in the emission layer, there may be an electron leak to a hole transport region from the emission layer unless the organic light-emitting device includes an appropriate hole transport region. Such an electron leak may cause an increase in currents and voltages, thereby significantly reducing the efficiency of the organic light-emitting device.

When the hole transport region includes the second compound represented by one selected from Formulae 2-1 to 2-3, the electron leak to the hole transport region from the emission layer may be reduced or minimized, and accordingly, most of the excitons generated in the emission layer may contribute to light emission, thereby improving the efficiency of the organic light-emitting device. In addition, although materials for forming the organic layer may undergo deterioration caused by electrons, the deterioration may be reduced. In this regard, the amount of current needed to exhibit the same luminance may be also reduced, thereby improving the lifespan of the organic light-emitting device.

Description of FIG. 1

FIG. 1 is a diagram schematically illustrating a cross section of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 according to an embodiment will be described in connection with FIG. 1.

First Electrode 110

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by, for example, depositing or sputtering a material for forming the first electrode 110 on the substrate. When the first electrode 110 is an anode, the material for forming the first electrode 110 may be selected from materials with a high work function.

The first electrode 110 may be a reflective electrode, a semi-transmissive electrode, or a transmissive electrode. When the first electrode 110 is a transmissive electrode, the material for forming the first electrode 110 may be selected from indium tin oxide (ITO), indium zinc oxide (IZO), tin oxide ($SnO_2$), zinc oxide (ZnO), and combinations thereof, but embodiments of the present disclosure are not limited thereto. In various embodiments, when the first electrode 110 is a semi-transmissive electrode or a reflective electrode, the material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 may be disposed on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer (HIL), a hole transport layer (HTL), an emission auxiliary layer, and an electron blocking layer (EBL).

For example, the hole transport region may have a single-layered structure including a single layer including a plurality of different materials, or a multi-layered structure having a structure of hole injection layer/hole transport layer, a structure of hole injection layer/hole transport layer/emission auxiliary layer, a structure of hole injection layer/emission auxiliary layer, a structure of hole transport layer/emission auxiliary layer, or a structure of hole injection layer/hole transport layer/electron blocking layer, wherein for each structure, constituting layers are sequentially stacked from the first electrode 110 in each stated order, but the structure of the hole transport region is not limited thereto.

The hole transport region may further include, in addition to the second compound represented by one selected from Formulae 2-1 to 2-3, at least one selected from m-MTDATA, TDATA, 2-TNATA, NPB(NPD), β-NPB, TPD, Spiro-TPD, Spiro-NPB, methylated-NPB, TAPC, HMTPD, 4,4',4"-tris (N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (Pani/PSS), a compound represented by Formula 201, and a compound represented by Formula 202:

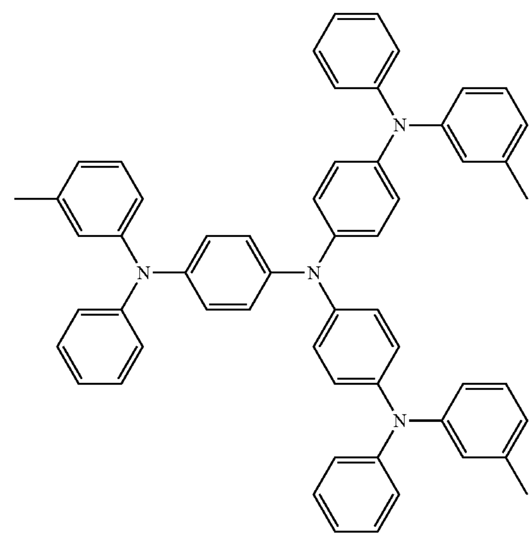

m-MTDATA

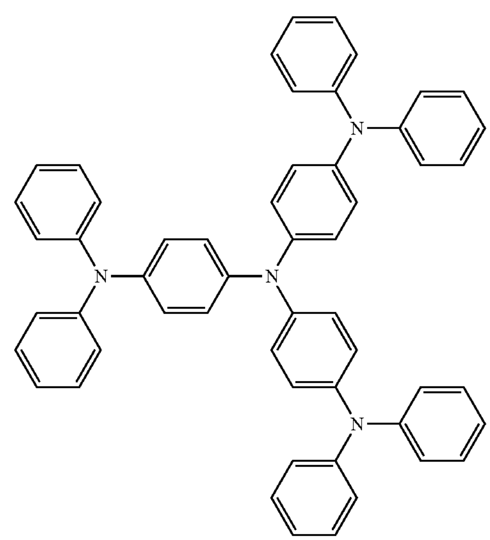

TDATA

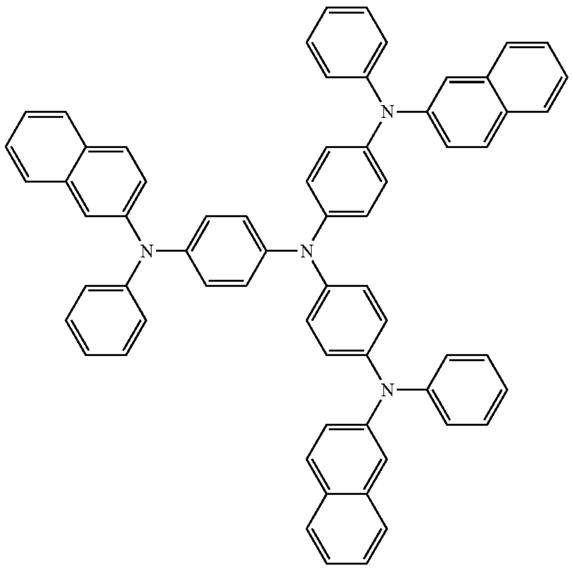
2-TNATA
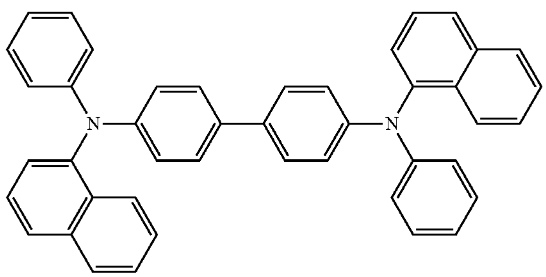
NPB
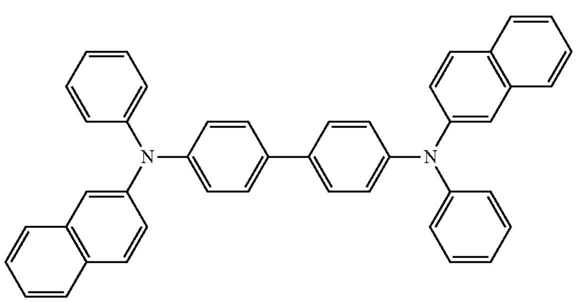
β-NPB
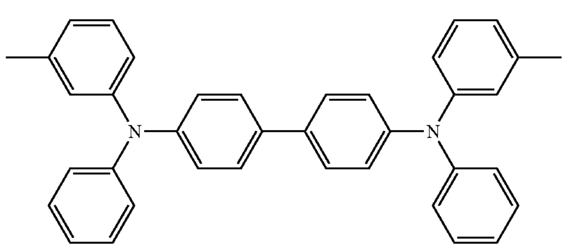
TPD
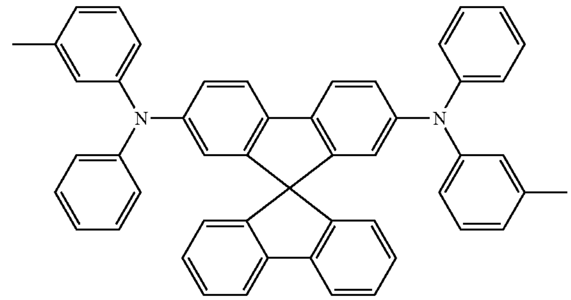
Spiro-TPD
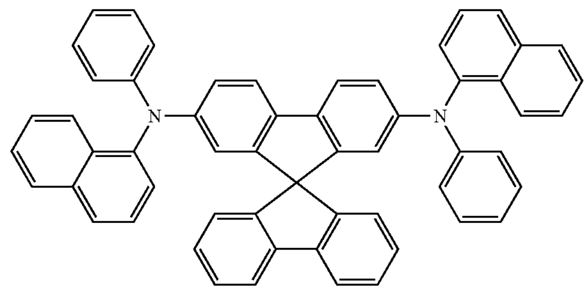
Spiro-NPB
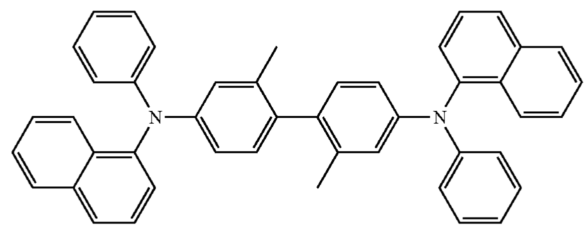
methylated NPB
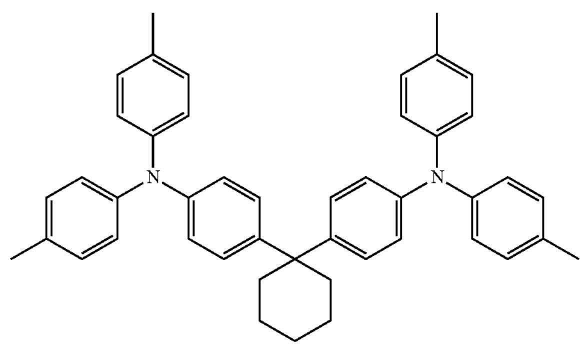
TAPC
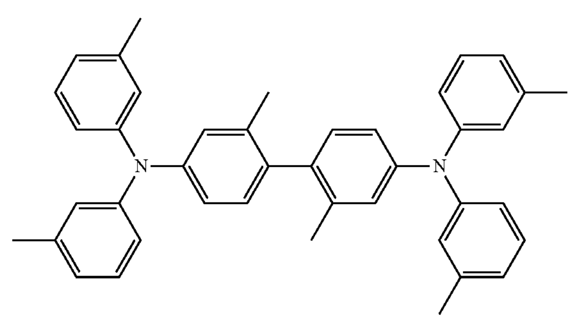
HMTPD -continued Formula 201

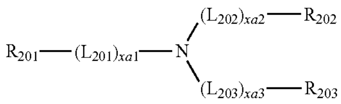

Formula 202

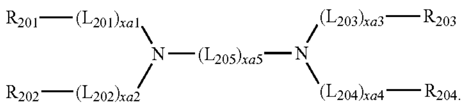

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may be optionally linked to each other via a single bond, a dimethyl-methylene group, or a diphenyl-methylene group, and $R_{203}$ and $R_{204}$ may be optionally linked to each other via a single bond, a dimethyl-methylene group, or a diphenyl-methylene group.

In an embodiment, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xa1 to xa4 may each independently be 0, 1, or 2.

In various embodiments, xa5 may be 1, 2, 3, or 4.

In various embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be understood by referring to the descriptions thereof in the present specification.

In various embodiments, in Formula 201, at least one selected from $R_{201}$ to $R_{203}$ may be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In various embodiments, in Formula 202, i) $R_{201}$ and $R_{202}$ may be linked to each other via a single bond, and/or ii) $R_{203}$ and $R_{204}$ may be linked to each other via a single bond.

In various embodiments, in Formula 202, at least one selected from $R_{201}$ to $R_{204}$ may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In an embodiment, the compound represented by Formula 201 may be represented by Formula 201A:

Formula 201A

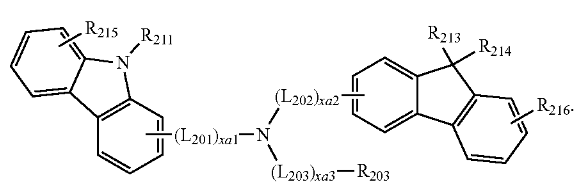

For example, the compound represented by Formula 201 may be represented by Formula 201A(1), but embodiments of the present disclosure are not limited thereto:

Formula 201A(1)

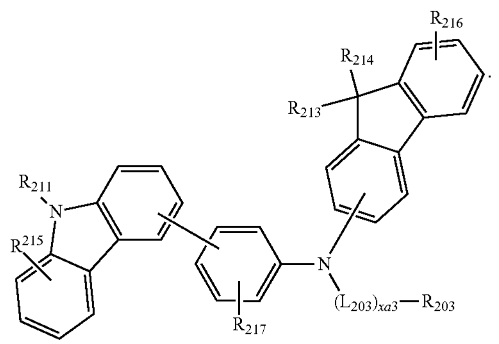

In various embodiments, the compound represented by Formula 201 may be represented by Formula 201A-1, but embodiments of the present disclosure are not limited thereto:

Formula 201A-1

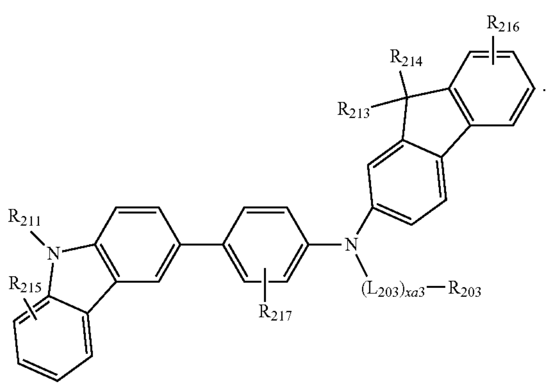

In an embodiment, the compound represented by Formula 202 may be represented by Formula 202A:

Formula 202A

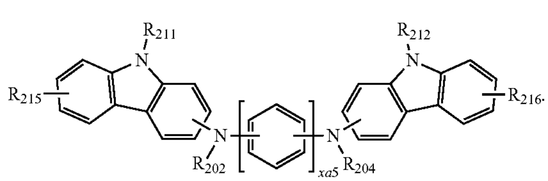

In various embodiments, the compound represented by Formula 202 may be represented by Formula 202A-1:

Formula 202A-1

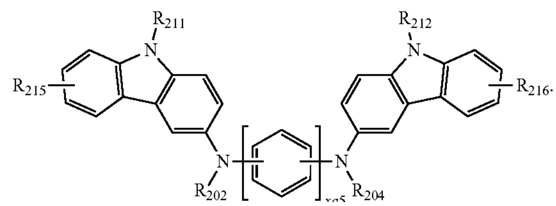

In Formulae 201A, 201A(1), 201A-1, 202A, and 202A-1, $L_{201}$ to $L_{203}$, xa1 to xa3, xa5, and $R_{202}$ to $R_{204}$ may each independently be understood by referring to the descriptions thereof in the present specification, $R_{211}$ and $R_{212}$ may each independently be understood by referring to the description of $R_{203}$ in the present specification, and $R_{213}$ to $R_{217}$ may each independently be selected from: hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an embodiment, the hole transport region may include at least one compound selected from Compounds HT1 to HT39, but embodiments of the present disclosure are not limited thereto:

HT1
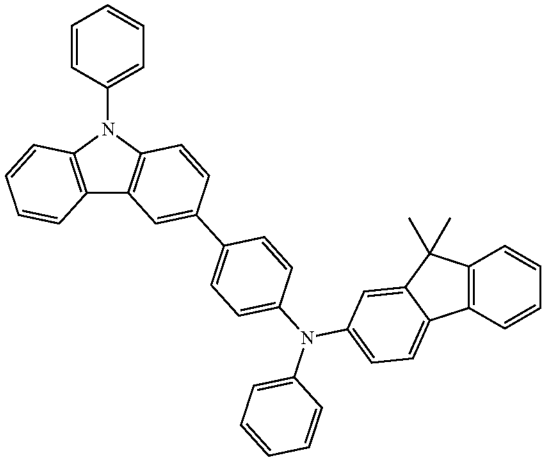
HT2
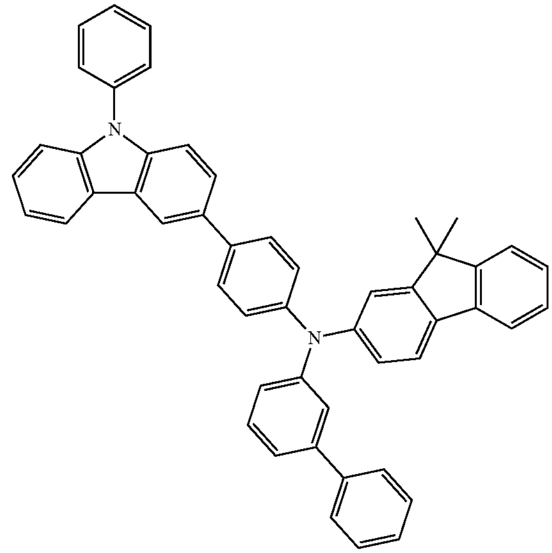
HT3
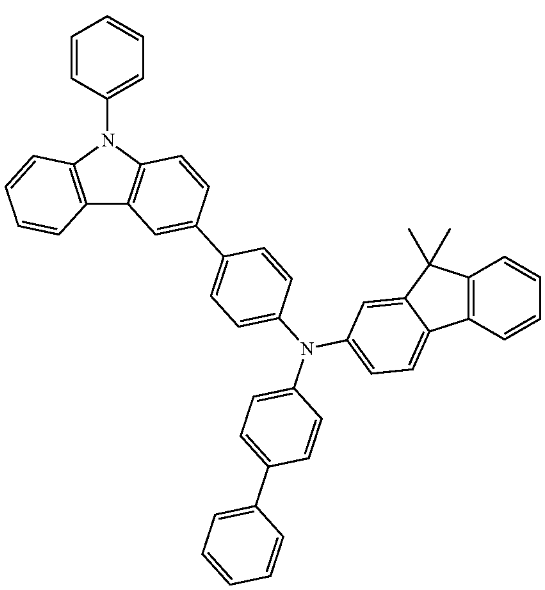
HT4
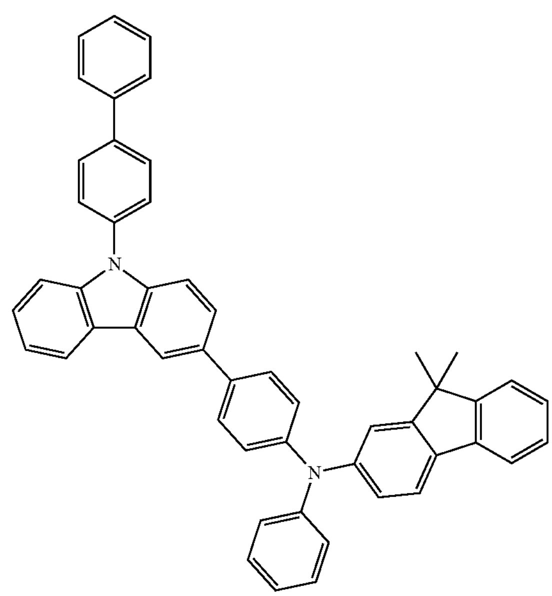

-continued
HT5
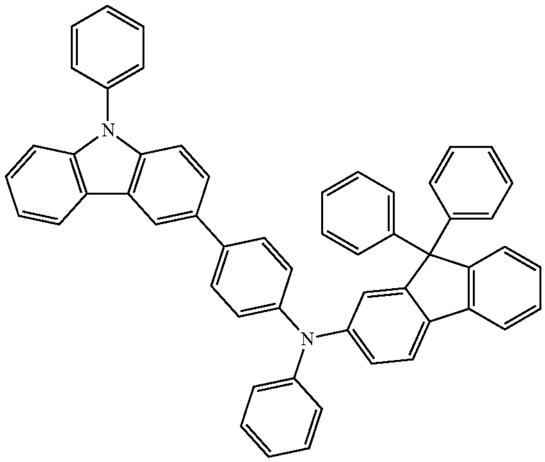
HT6
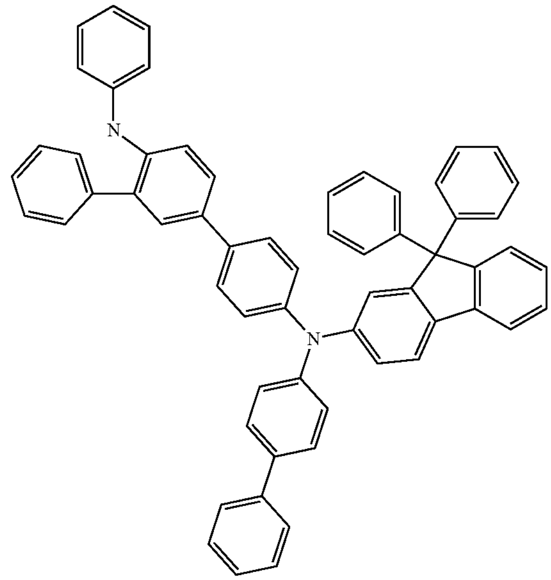
HT7
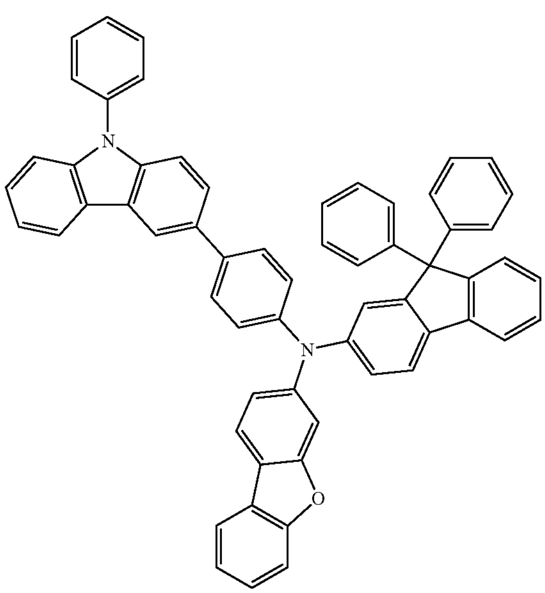
HT8
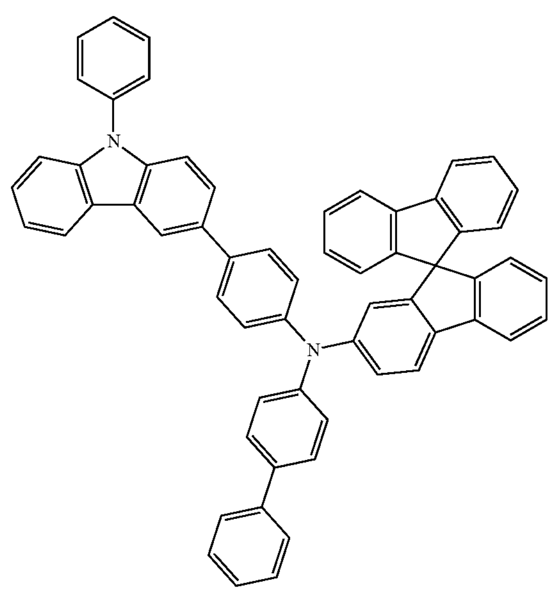

-continued
HT9
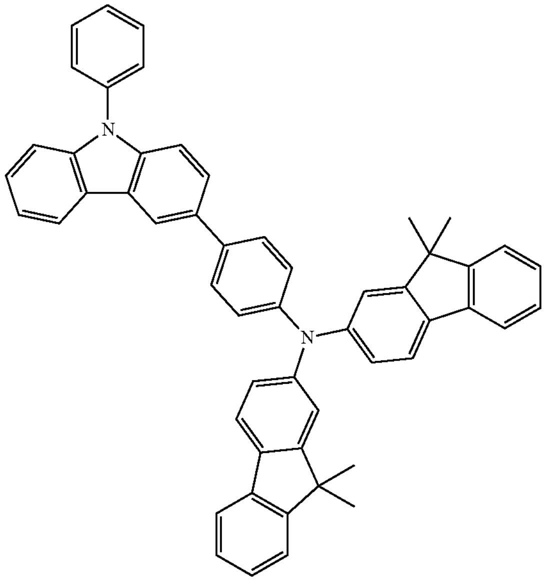
HT10
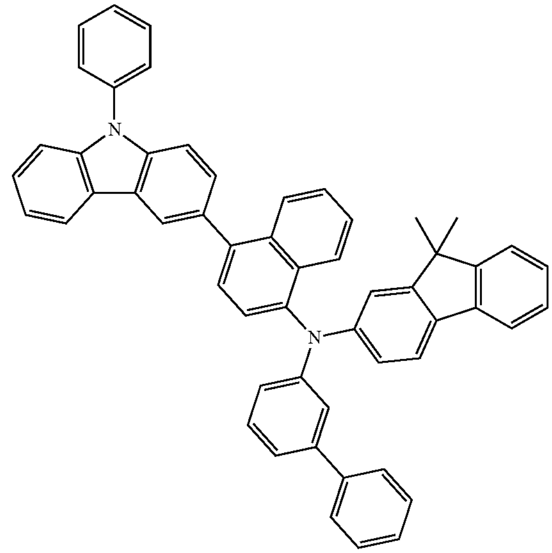
HT11
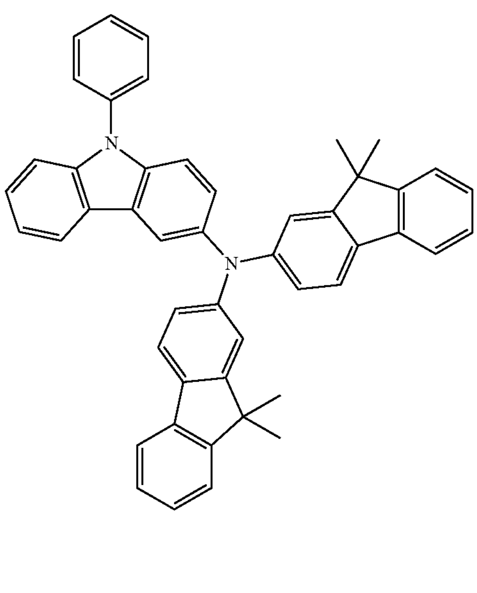
HT12
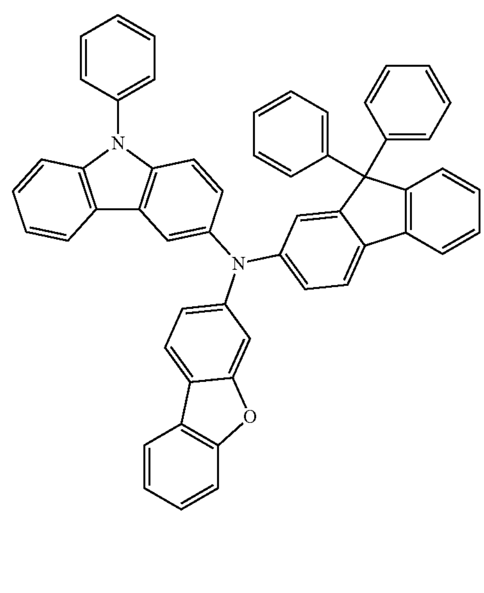

-continued
HT13
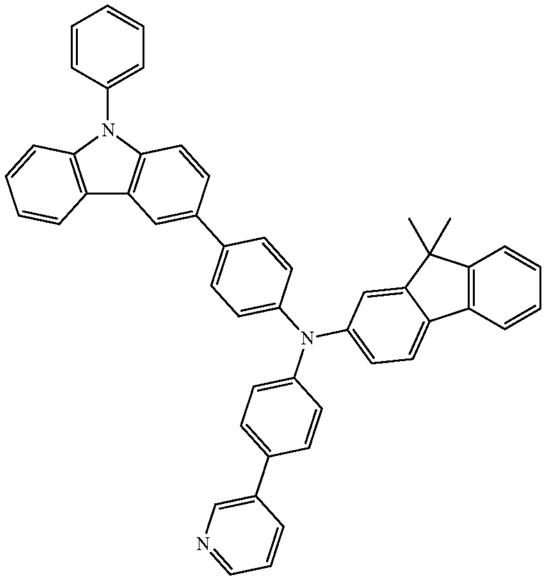
HT14
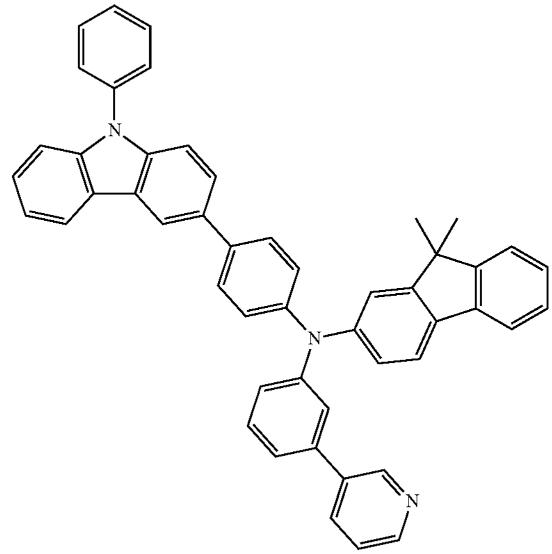
HT15
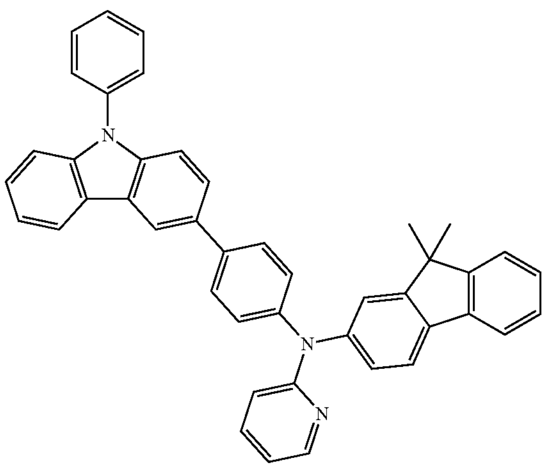
HT16
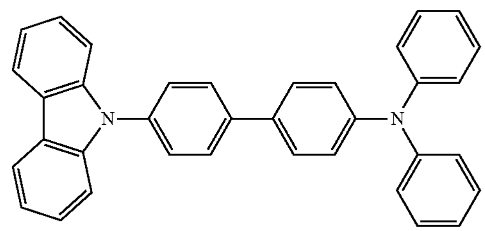
HT17
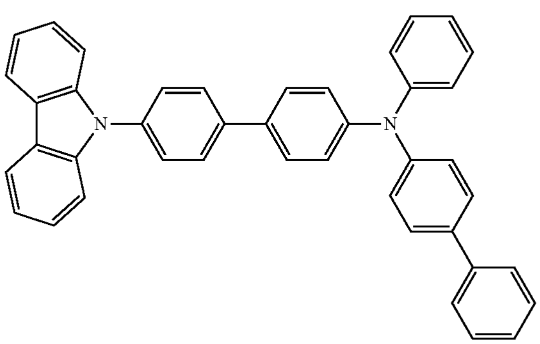
HT18
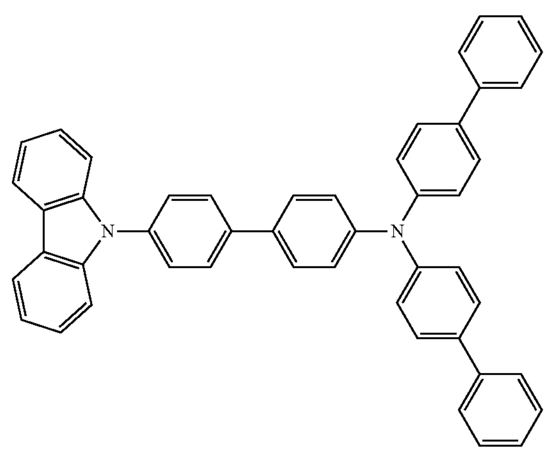

-continued
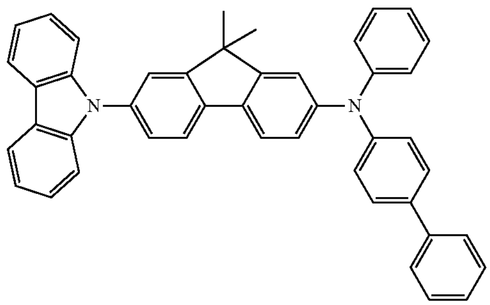
HT19
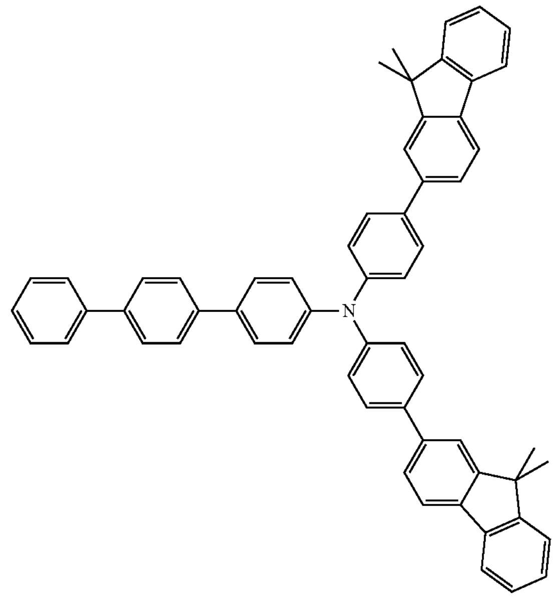
HT20
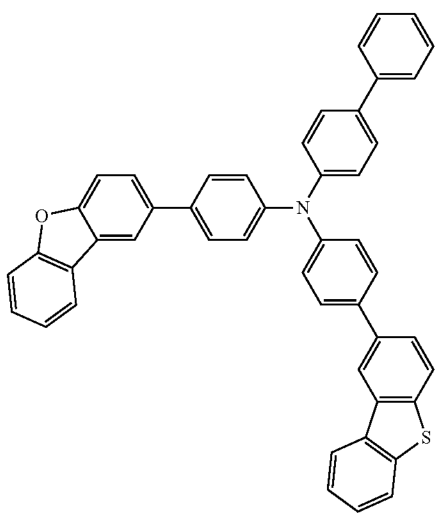
HT21
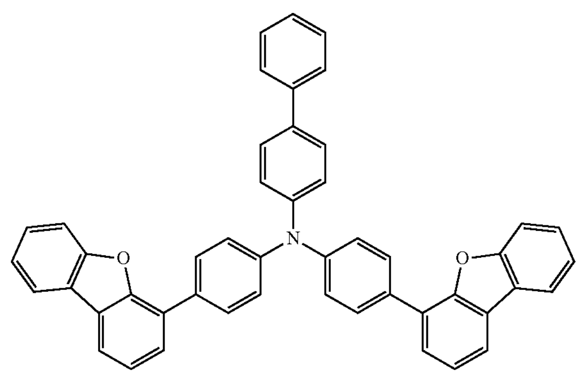
HT22
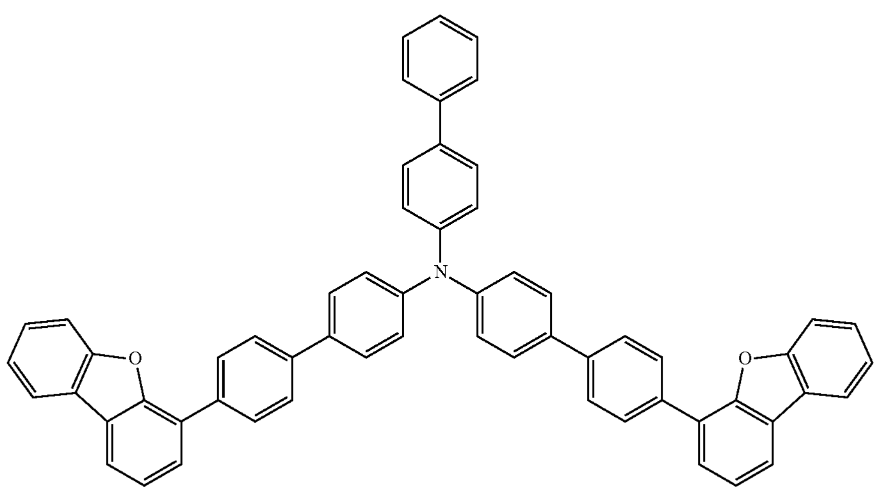
HT23

-continued
HT24
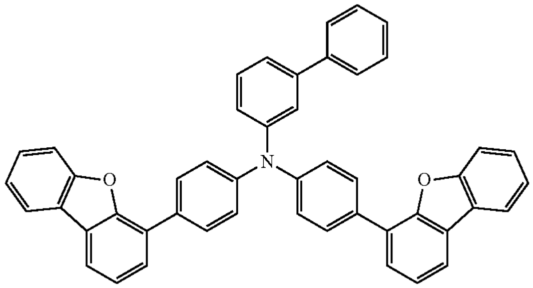
HT25
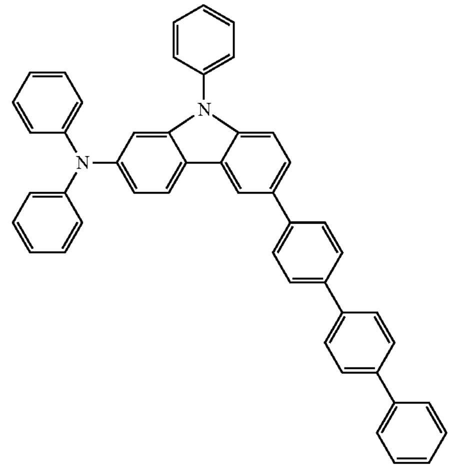
HT26
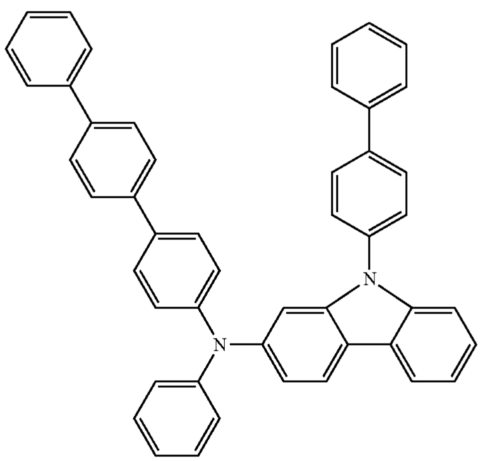
HT27
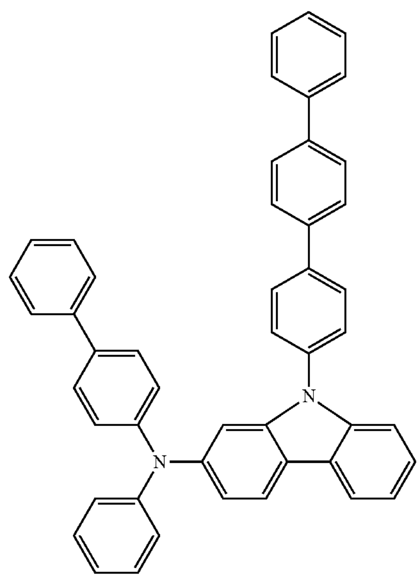
HT28
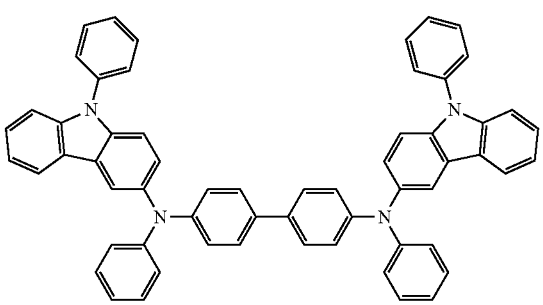
HT29
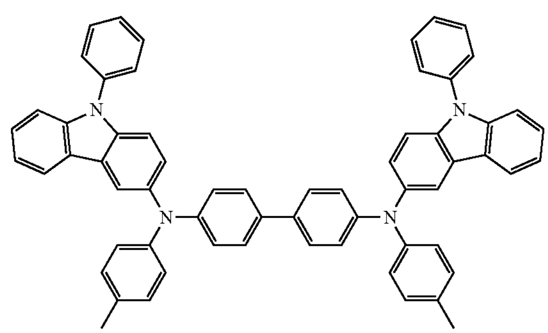

-continued
HT30
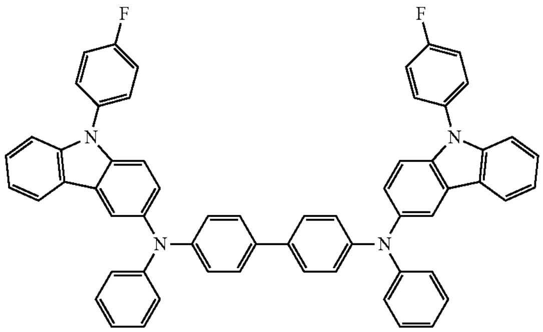
HT31
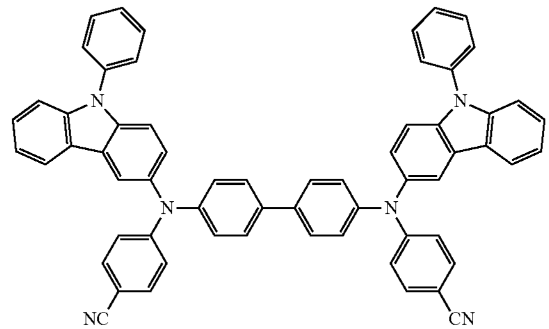
HT32
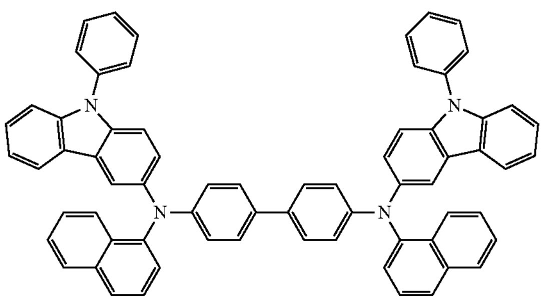
HT33
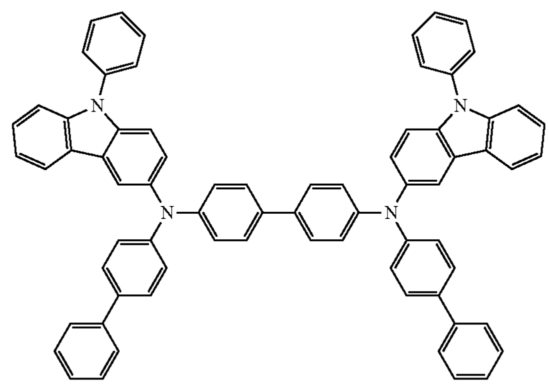
HT34
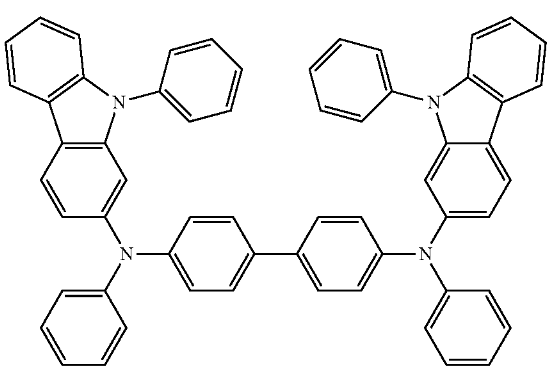
HT35
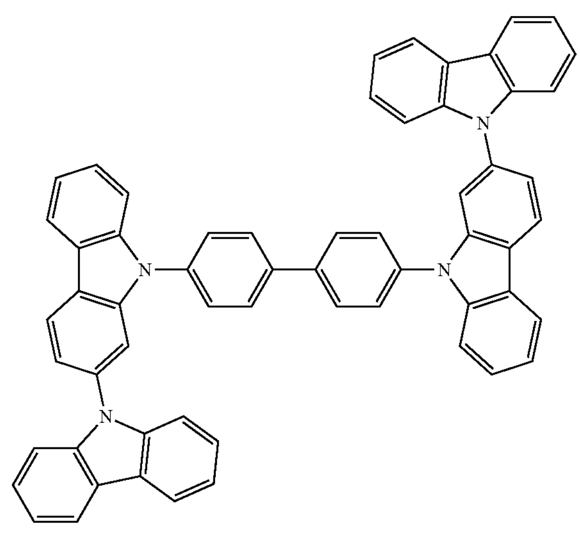

-continued

HT36

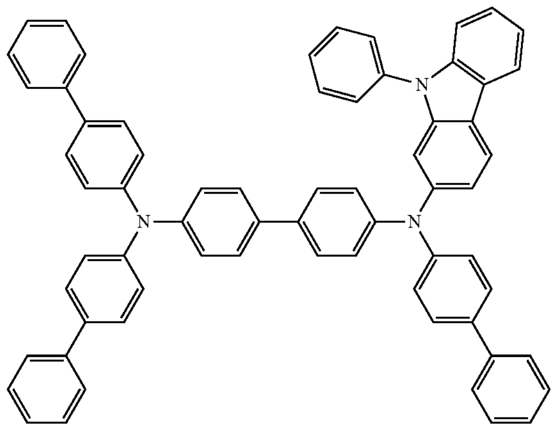

HT37

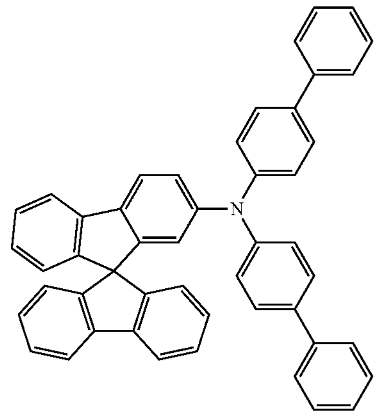

HT38

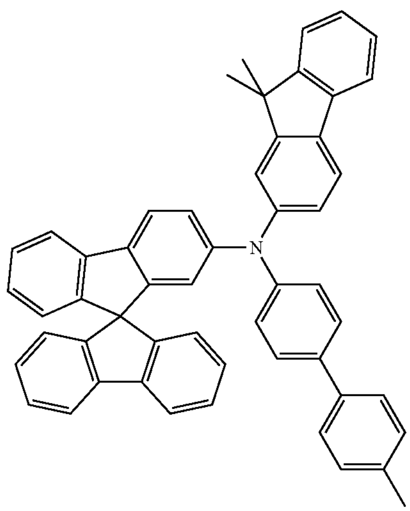

HT39

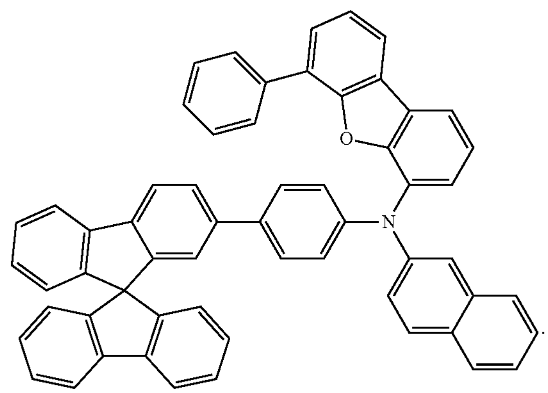

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 9,000 Å, and for example, about 100 Å to about 1,000 Å, and the thickness of the hole transport layer may be in a range of about 50 Å to about 2000 Å, and for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted from the emission layer, and the electron blocking layer may block the flow of electrons from the electron transport region. The emission auxiliary layer and the electron blocking layer may include the materials as described above. For example, the emission auxiliary layer may include the second compound represented by one selected from Formulae 2-1 to 2-3.

A thickness of the emission auxiliary layer may be in a range of about 10 Å to about 2,000 Å, for example, about 50 Å to about 1,000 Å. When the thickness of the emission auxiliary layer is within these ranges, satisfactory hole transporting ability may be obtained without a substantial increase in driving voltage.

P-Dopant

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In an embodiment, a lowest unoccupied molecular orbital (LUMO) of the p-dopant may be about −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from the group consisting of:

quinone derivatives, such as tetracyanoquinodimethane (TCNQ) and/r 2,3,5,6-tetrafluoro-7,7,8,8-tetracyanoquinodimethane (F4-TCNQ);

metal oxides, such as a tungsten oxide and/or a molybdenum oxide;

1,4,5,8,9,11-hexaazatriphenylene-hexacarbonitrile (HAT-CN); and a compound represented by Formula 221, but embodiments of the present disclosure are not limited thereto:

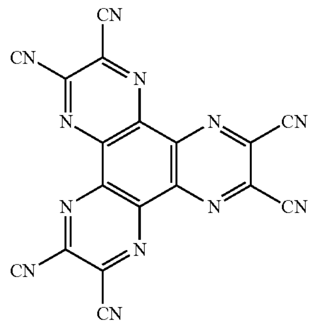
HAT-CN

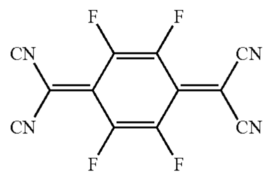
F4-TCNQ

Formula 221

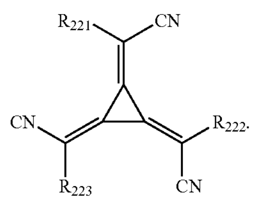

In Formula 221, $R_{221}$ to $R_{223}$ may each independently be selected from: a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, or a blue emission layer, according to an individual sub pixel. In various embodiments, the emission layer may have a stacked structure of two or more layers selected from a red emission layer, a green emission layer, and a blue emission layer, in which the two or more layers contact each other or are separated from each other. In various embodiments, the emission layer may include two or more materials selected from a red-light emission material, a green-light emission material, and a blue-light emission material, in which the two or more materials are mixed with each other in a single layer to emit white light.

The emission layer may include a host and a dopant. The dopant may include at least one selected from a phosphorescent dopant and a fluorescent dopant.

In the emission layer, the host may include the first compound represented by Formula 1, and the dopant may include a phosphorescent dopant, but embodiments of the present disclosure are not limited thereto.

In the emission layer, an amount of the dopant may be, in general, in a range of about 0.01 to about 30 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host in Emission Layer

The host may further include, in addition to the first compound represented by Formula 1, a compound represented by Formula 301:

$$[Ar_{301}]_{xb11}\text{-}[(L_{301})_{xb1}\text{-}R_{301}]_{xb21}. \quad \text{Formula 301}$$

In an embodiment, in Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer selected from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), xb21 may be an integer selected from 1 to 5, $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In various embodiment, in Formula 301, $Ar_{301}$ may be selected from the group consisting of:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In various embodiments, when xb11 in Formula 301 is two or more, two or more $Ar_{301}$(s) may be linked to each other via a single bond.

In various embodiments, the compound represented by Formula 301 may be represented by Formula 301-1 or 301-2:

benzothiophene group, a dibenzothiophene group, a naphthothiophene group, a benzonaphthothiophene group, and a dinaphthothiophene group, $X_{301}$ may be O, S, or N—[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), xb22 and xb23 may each independently be 0, 1, or 2, $L_{301}$, xb1, $R_{301}$, and $Q_{31}$ to $Q_{33}$ may each independently be understood by referring to the descriptions thereof in the present specification, $L_{302}$ to $L_{304}$ may each independently be the same as described in connection with $L_{301}$ in Formula 301, Xb2 to xb4 may each independently be the same as described in connection with xb1 in Formula 301, and $R_{302}$ to $R_{304}$ may each independently be the same as described in connection with $R_{301}$ in Formula 301.

For example, in Formulae 301, 301-1, and 301-2, $L_{301}$ to $L_{304}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofura- Formula 301-1

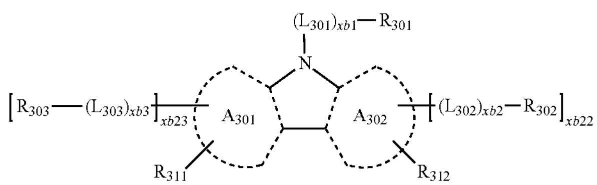

Formula 301-2

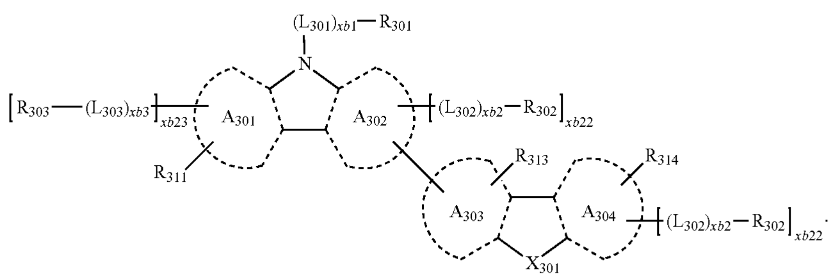

In Formulae 301-1 to 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a nylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be understood by referring to the descriptions thereof in the present specification.

In various embodiments, in Formulae 301, 301-1, and 301-2, $R_{301}$ to $R_{304}$ may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be understood by referring to the descriptions thereof in the present specification.

In various embodiments, the host may include an alkaline earth-metal complex. For example, the host may be selected from a Be complex (for example, Compound H55), a Mg complex, and a Zn complex.

In various embodiments, the host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, however, embodiments of the present disclosure are not limited thereto:

H1

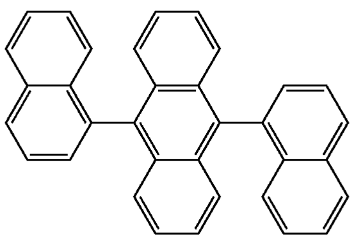

H2

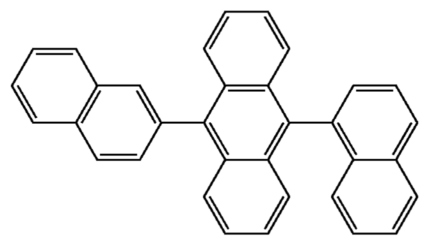

H3

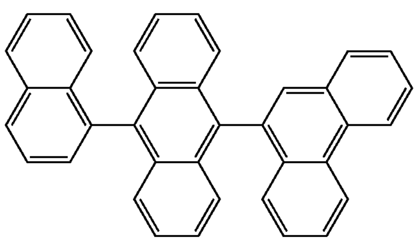

H4

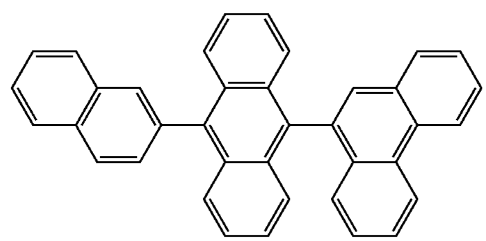

H5

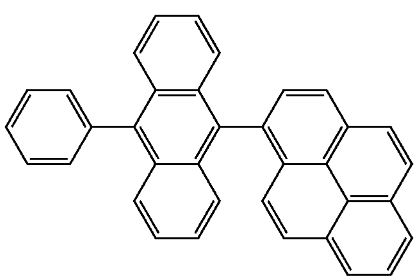

H6

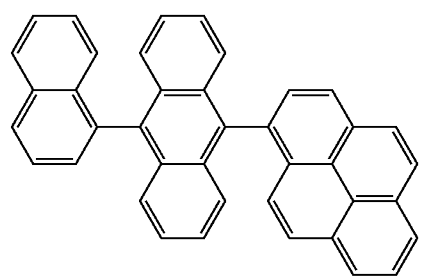

H7

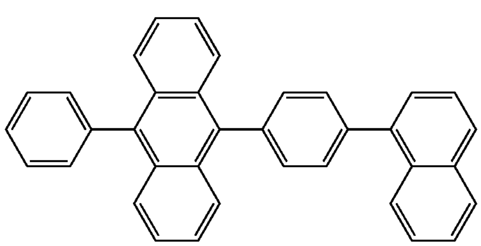

H8

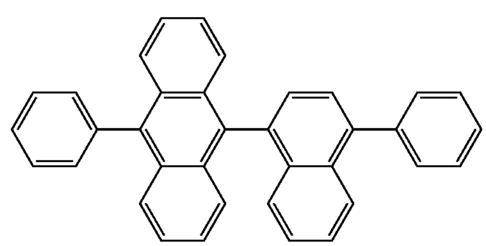

-continued
H9
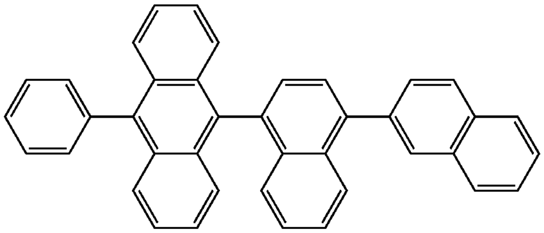
H10
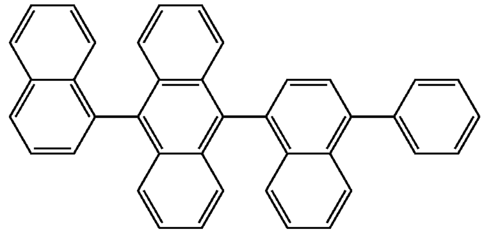
H11
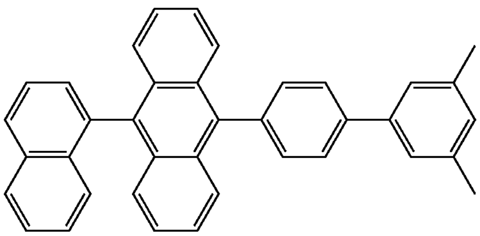
H12
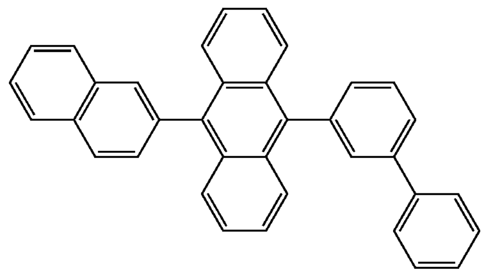
H13
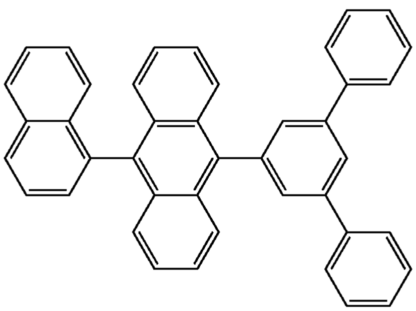
H14
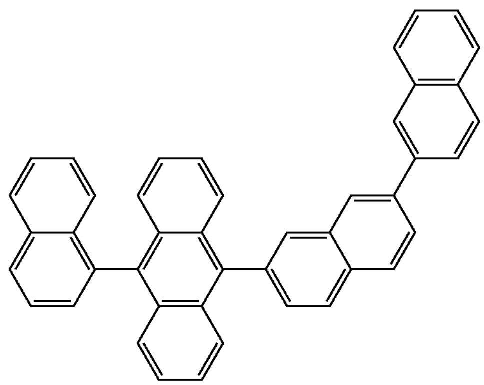
H15
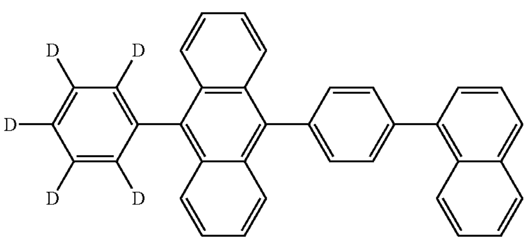
H16
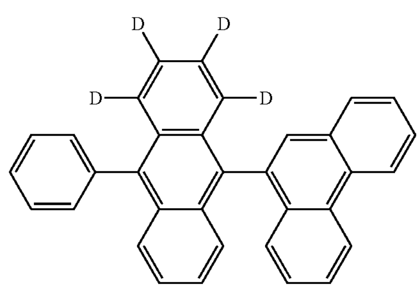
H17
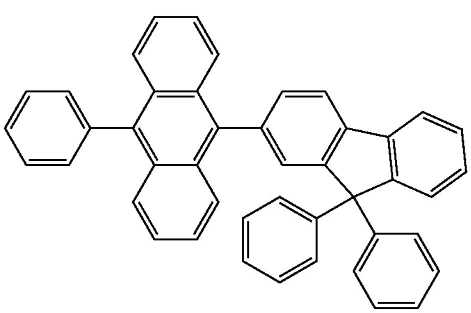
H18
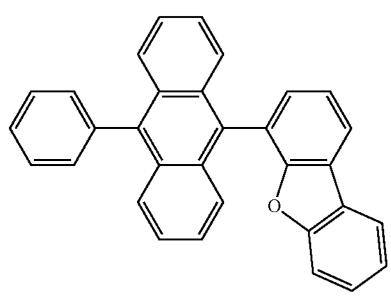

-continued
H19
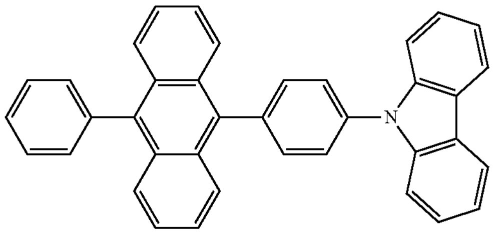
H20
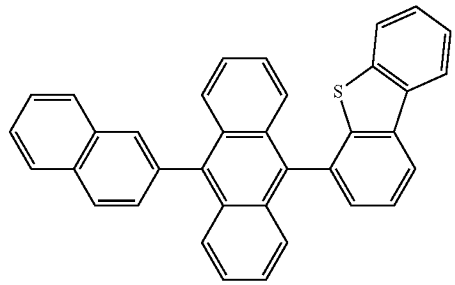
H21
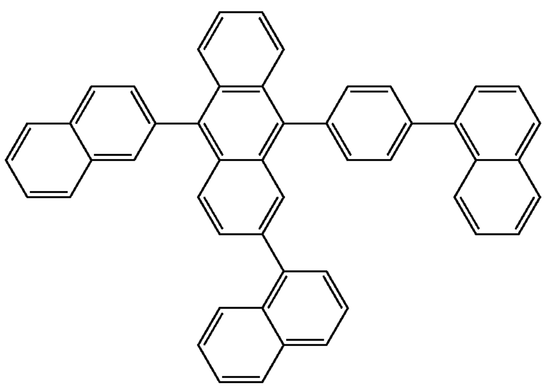
H22
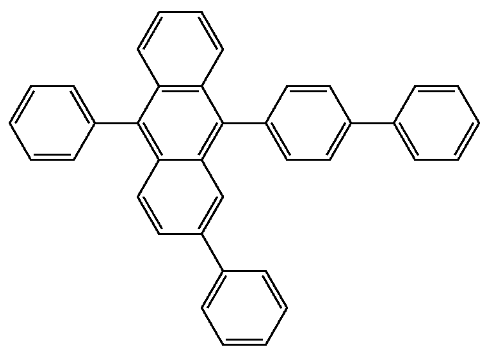
H23
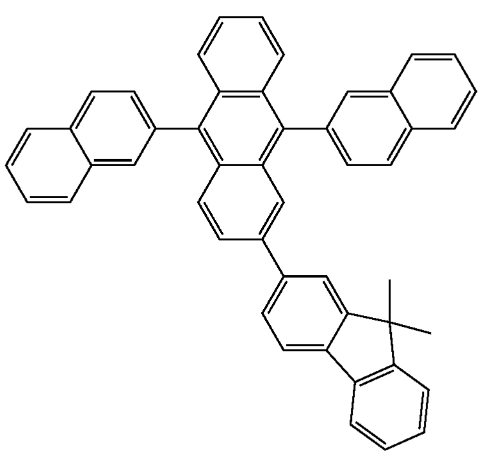
H24
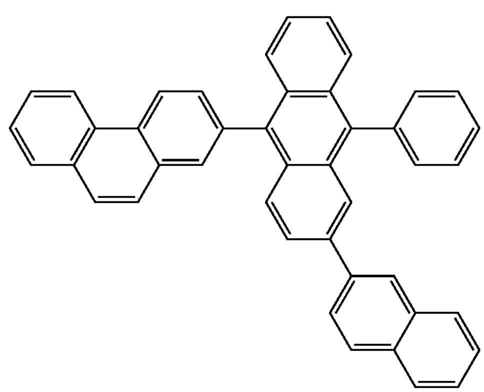

-continued
H25
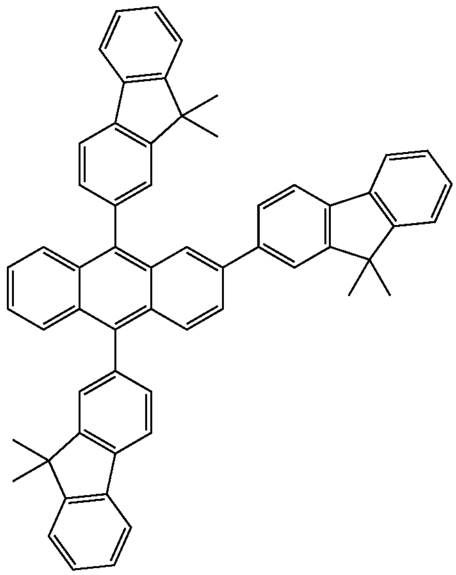
H26
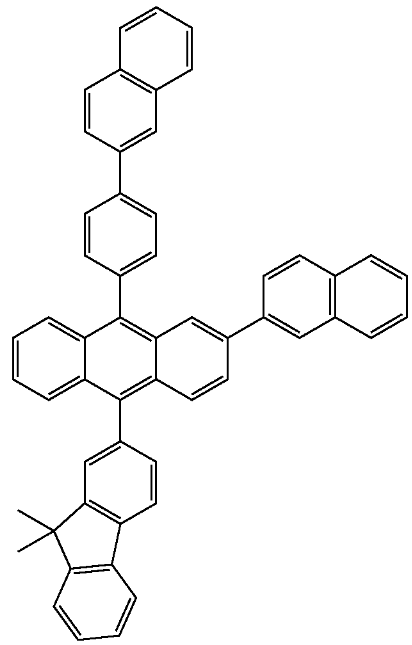
H27
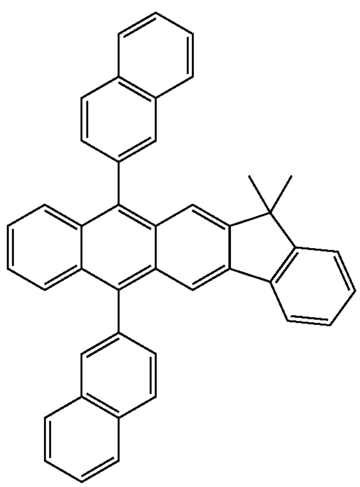
H28
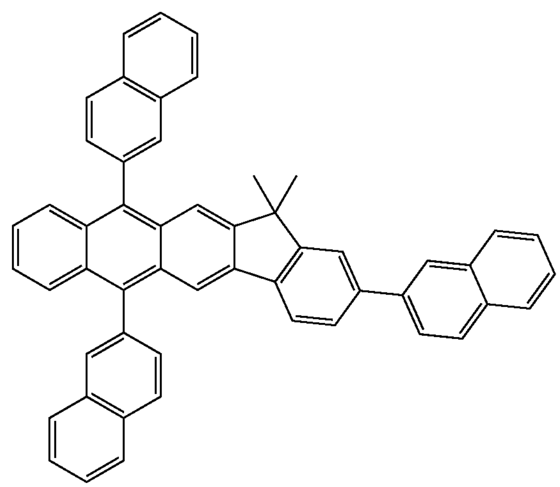
H29
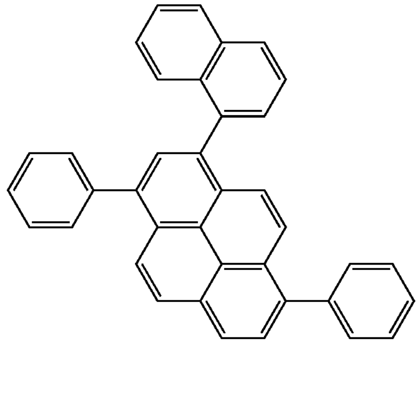
H30
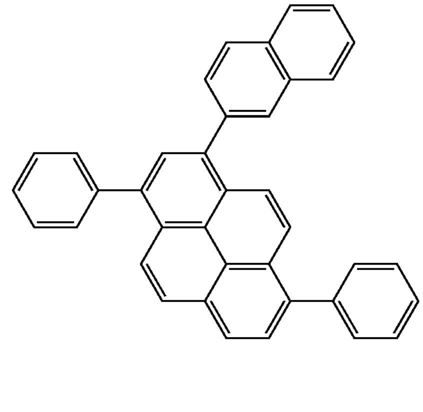

-continued
H31
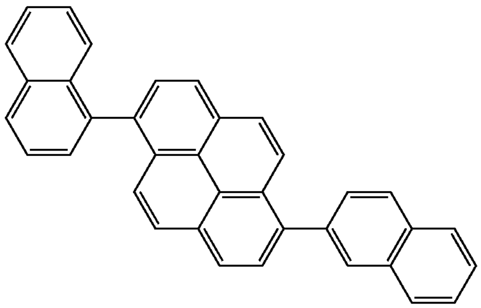
H32
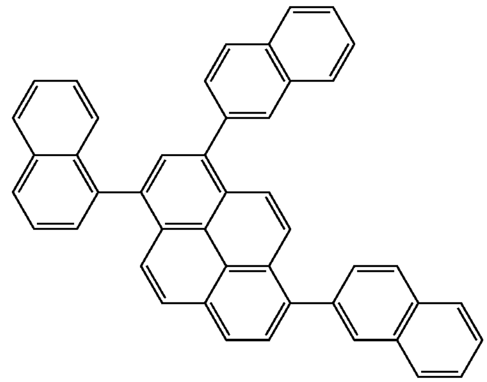
H33
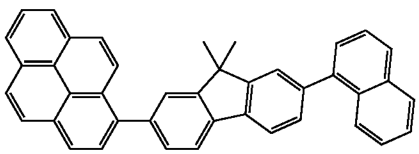
H34
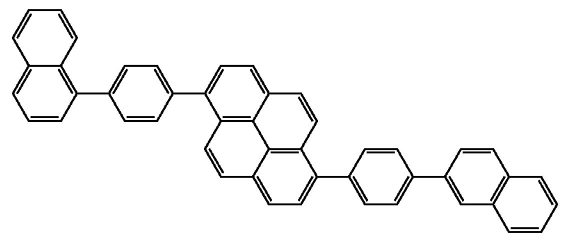
H35
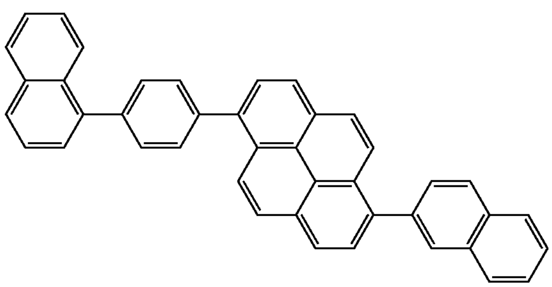
H36
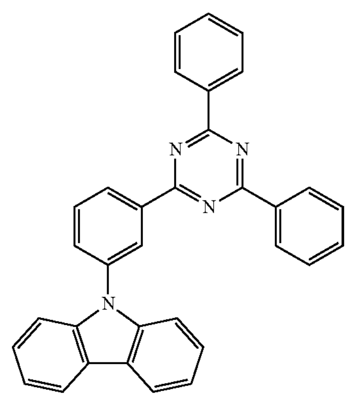
H37
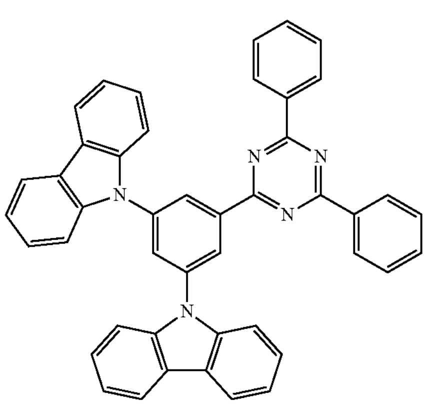
H38
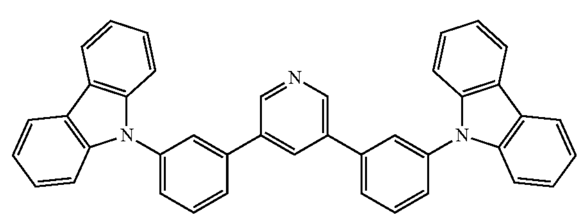

-continued
H39
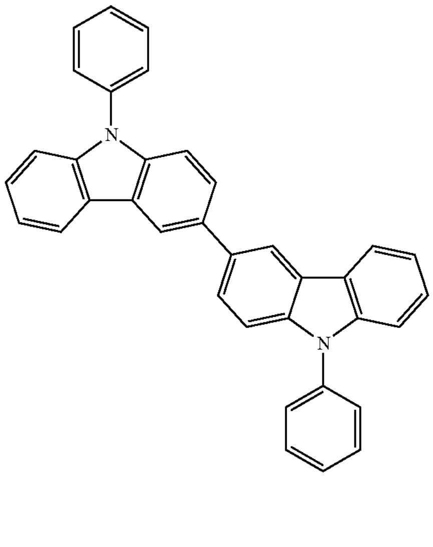
H40
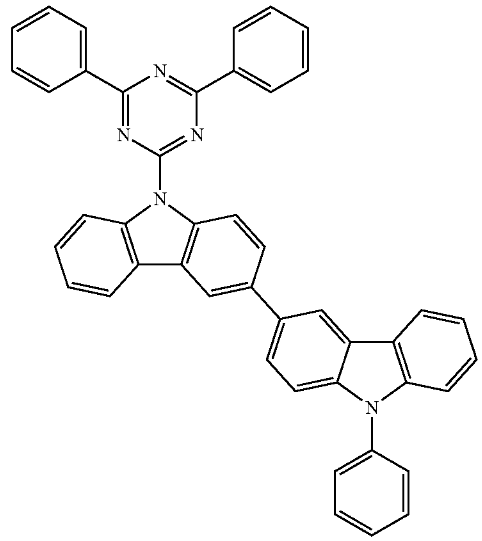
H41
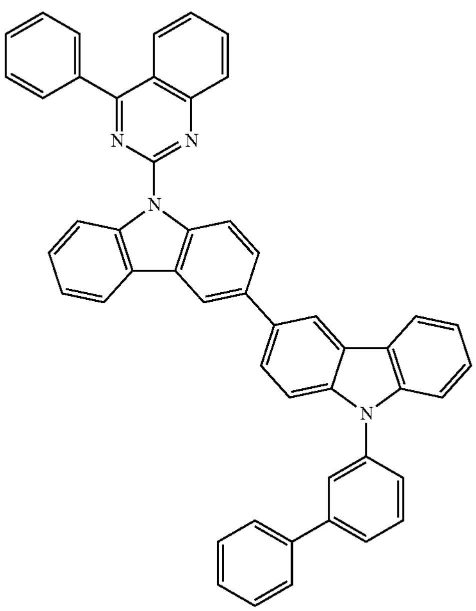
H42
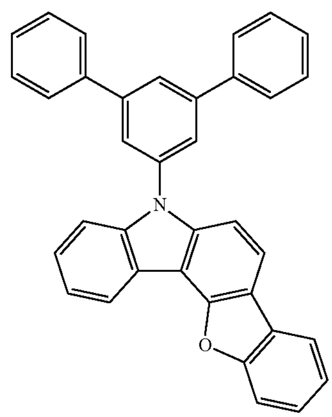
H43
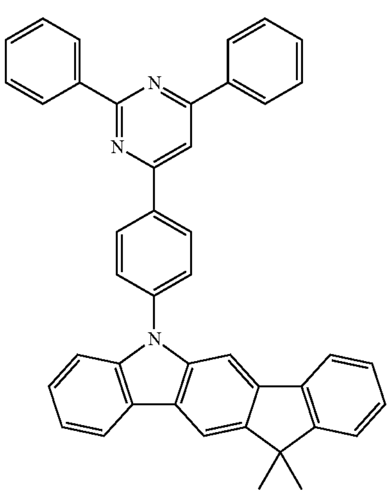
H44
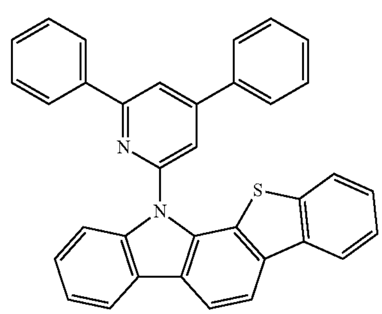

-continued
H45
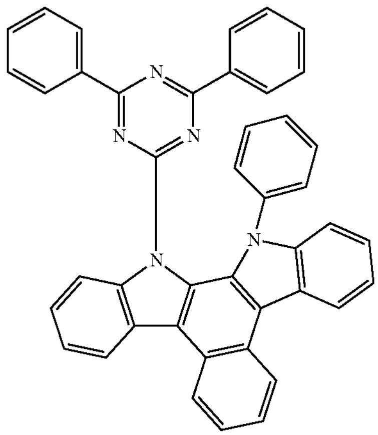
H46
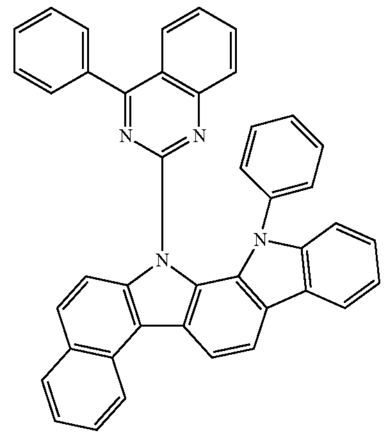
H47
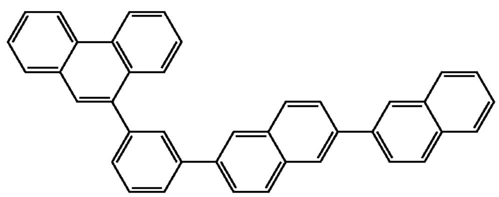
H48
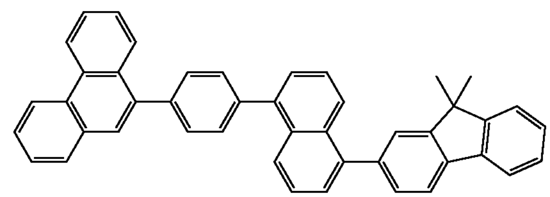
H49
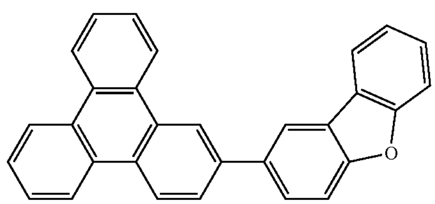
H50
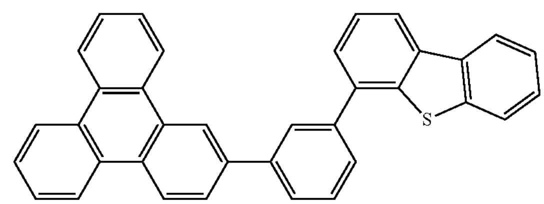
H51
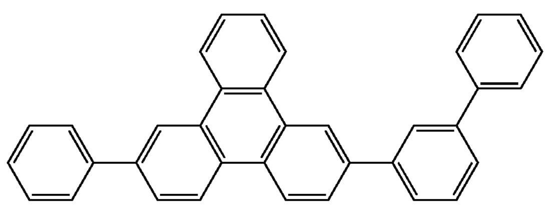
H52
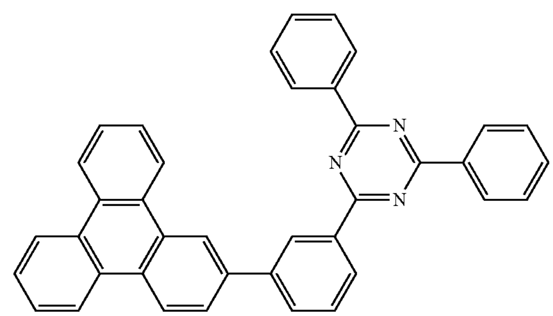
H53
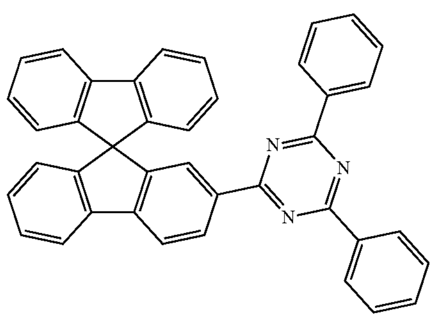
H54
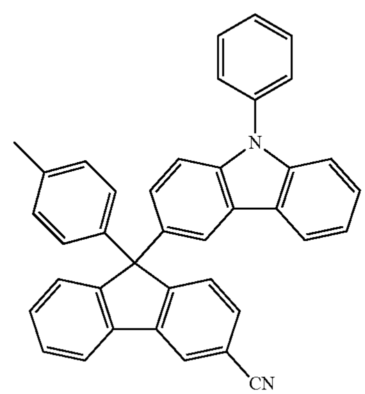

-continued

H55

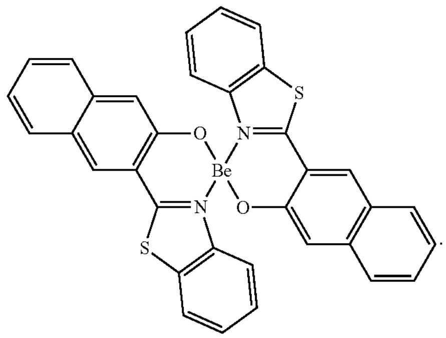

Phosphorescent Dopant Included in Emission Layer in Organic Layer 150

The phosphorescent dopant may include an organometallic complex represented by Formula 401:

Formula 401

$$M(L_{401})_{xc1}(L_{402})_{xc2}$$

Formula 402

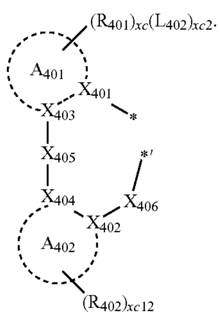

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be a ligand represented by Formula 402, xc1 may be 1, 2, or 3, wherein, when xc1 is two or more, two or more $L_{401}$(s) may be identical to or different from each other, $L_{402}$ may be an organic ligand, xc2 may be an integer selected from 0 to 4, wherein, when xc2 is two or more, two or more $L_{402}$(s) may be identical to or different from each other, $X_{401}$ to $X_{404}$ may each independently be nitrogen or carbon, $X_{401}$ and $X_{403}$ may be linked to each other via a single bond or a double bond, and $X_{402}$ and $X_{404}$ may be linked to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(═O)—*', *—N($Q_{411}$)-*', *—C($Q_{411}$)($Q_{412}$)-*', *—C($Q_{411}$)=C($Q_{412}$)-*', *-($Q_{411}$)=*', or *═C=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 may each independently indicate a binding site to M of Formula 401.

In an embodiment, in Formula 402, $A_{401}$ and $A_{402}$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In various embodiments, in Formula 402, i) $X_{401}$ may be nitrogen, and $X_{402}$ may be carbon, or ii) $X_{401}$ and $X_{402}$ may both be nitrogen.

In various embodiments, in Formula 402, $R_{401}$ and $R_{402}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In various embodiments, when xc1 in Formula 401 is two or more, two $L_{401}$(s) in the two or more $L_{401}$(s) may be optionally linked to each other via $X_{407}$, which is a linking group, two $A_{402}$(S) in the two or more $L_{401}$(s) may be optionally linked to each other via $X_{408}$, which is a linking group (see Compounds PD1 to PD4 and PD7). In various embodiments, $X_{407}$ and $X_{408}$ may each independently be a single bond, *—O—*', *—S—*', *—C(═O)—*', *—N($Q_{413}$)-*', *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

In Formula 401, $L_{402}$ may be a monovalent, divalent, or trivalent organic ligand. For example, in Formula 401, $L_{402}$ may be selected from a halogen ligand, a diketone ligand (for example, acetylacetonate), a carboxylic acid ligand (for example, picolinate), —C(═O), an isontrile ligand, —CN, and a phosphorus ligand (for example, phosphine and/or phosphite), but embodiments of the present disclosure are not limited thereto.

In various embodiments, the phosphorescent dopant may be, for example, selected from Compounds PD1 to PD27, but embodiments of the present disclosure are not limited thereto:

PD1

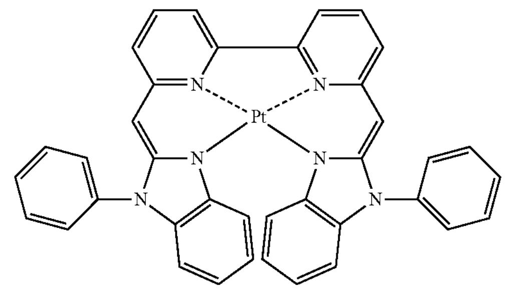

PD2

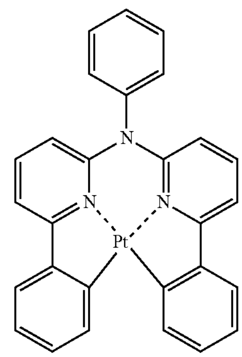

PD3

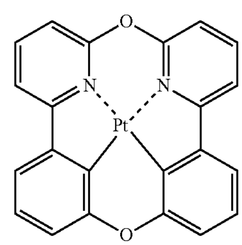

PD4

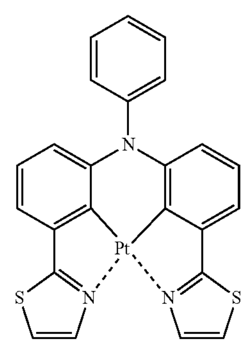

PD5

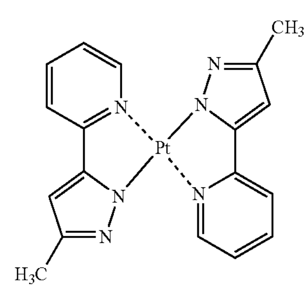

-continued
PD6
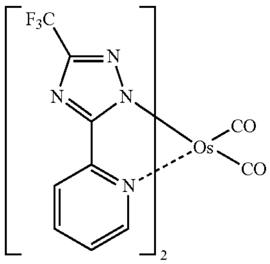
PD7
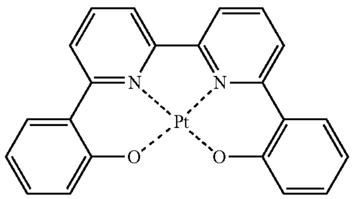
PD8
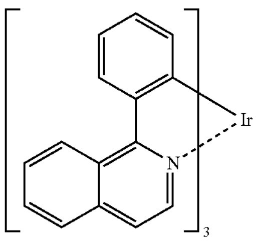
PD9
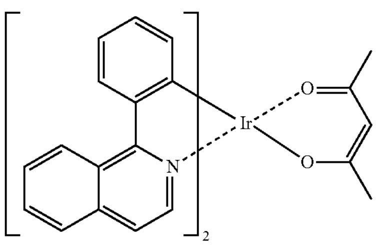
PD10
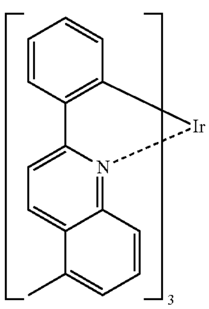
PD11
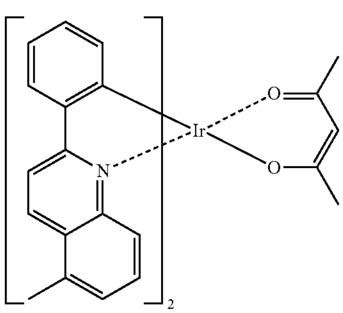
-continued
PD12
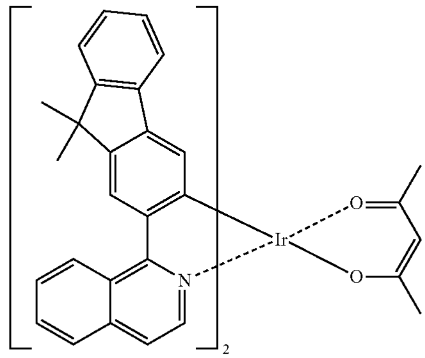
PD13
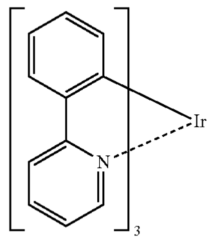
PD14
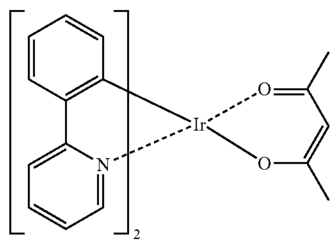
PD15
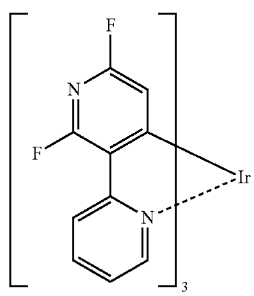
PD16
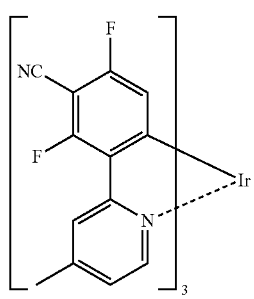

-continued
PD17
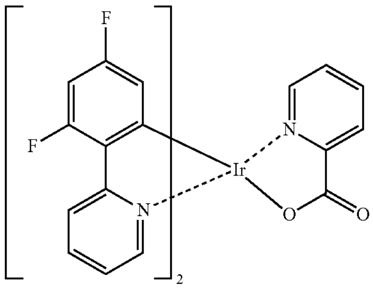
PD18
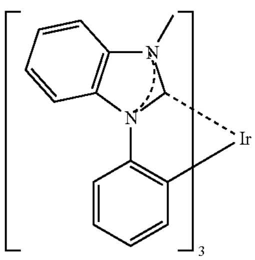
PD19
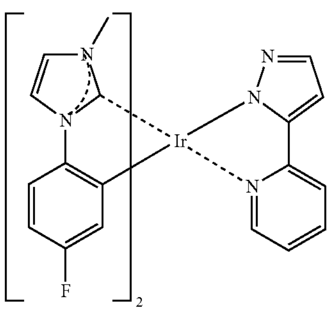
PD20
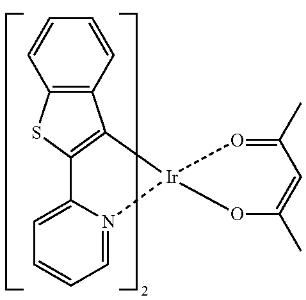
PD21
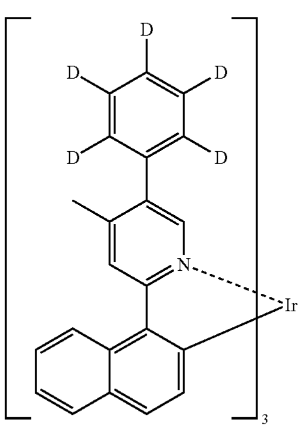
-continued
PD22
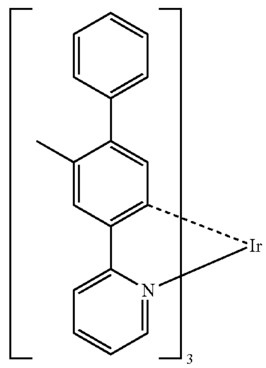
PD23
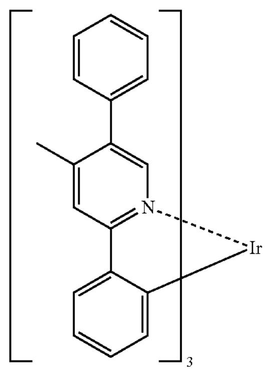
PD24
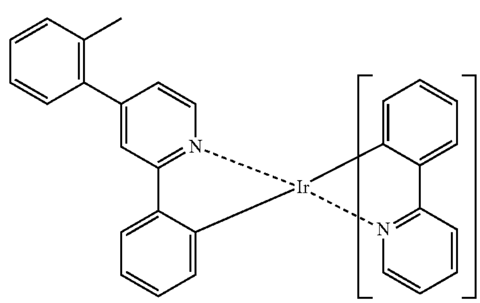
PD25
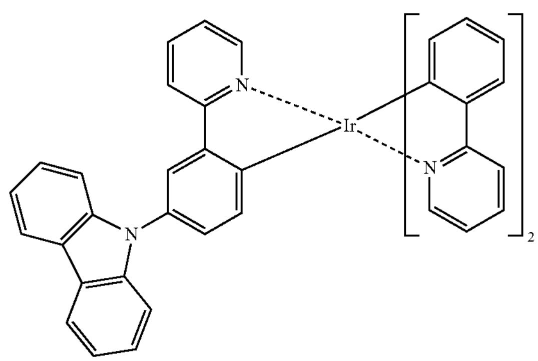

-continued

PD26

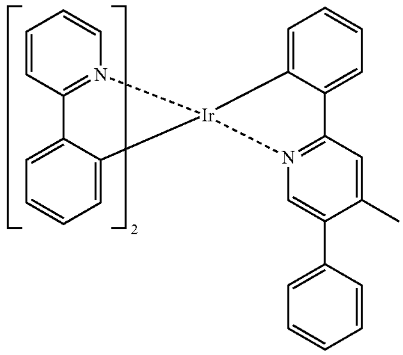

PD27

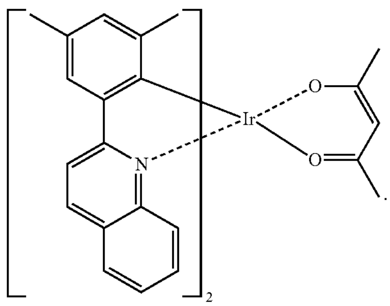

Fluorescent Dopant in Emission Layer

The fluorescent dopant may include an arylamine compound or a styrylamine compound.

The fluorescent dopant may include a compound represented by Formula 501:

Formula 501

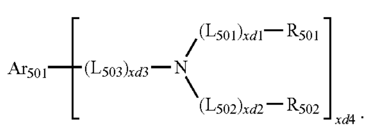

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer selected from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In an embodiment, in Formula 501, $Ar_{501}$ may be selected from the group consisting of:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In various embodiments, in Formula 501, $L_{501}$ to $L_{503}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In various embodiments, in Formula 501, $R_{501}$ and $R_{502}$ may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, in Formula 501, xd4 may be 2, but embodiments of the present disclosure are not limited thereto.

For example, the fluorescent dopant may be selected from Compounds FD1 to FD22:

FD1

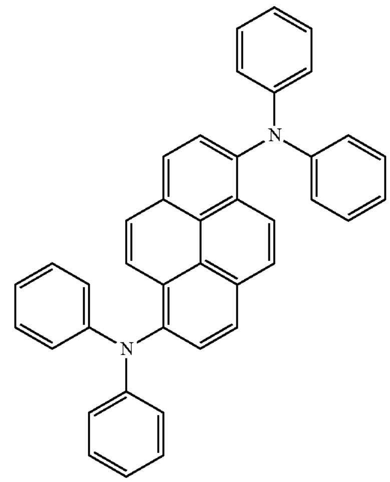

FD2

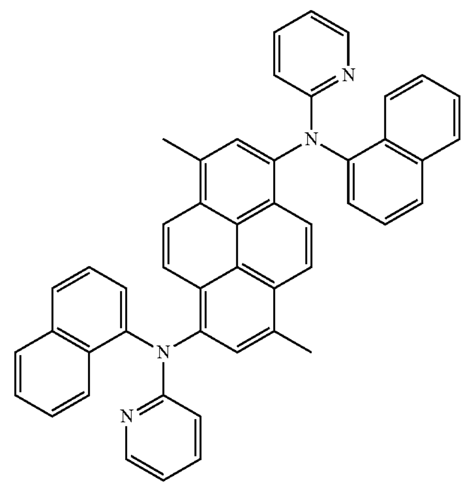

FD3

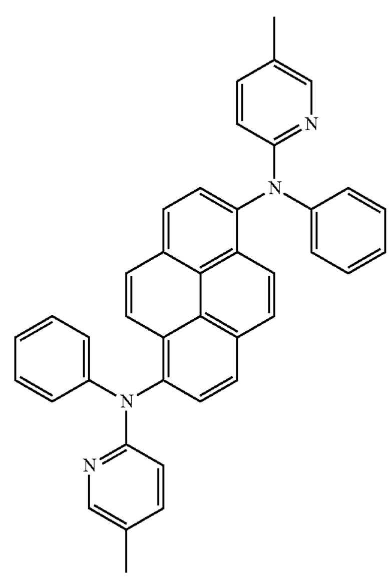

-continued
FD4
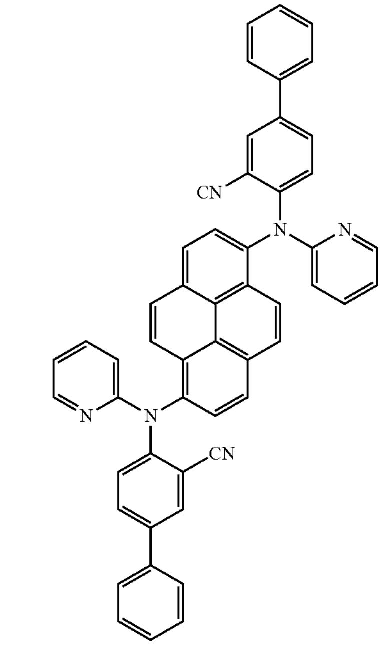
FD5
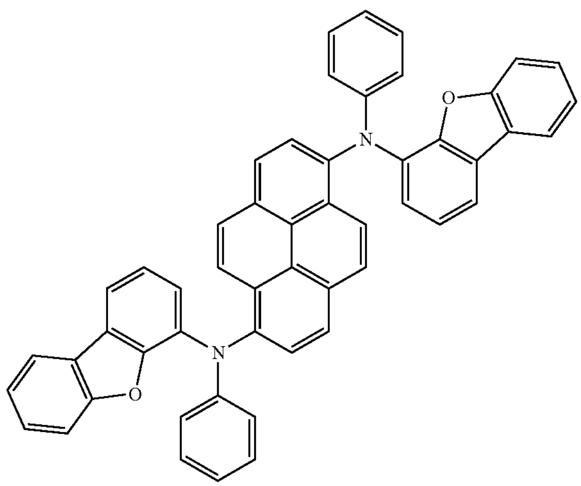
FD6
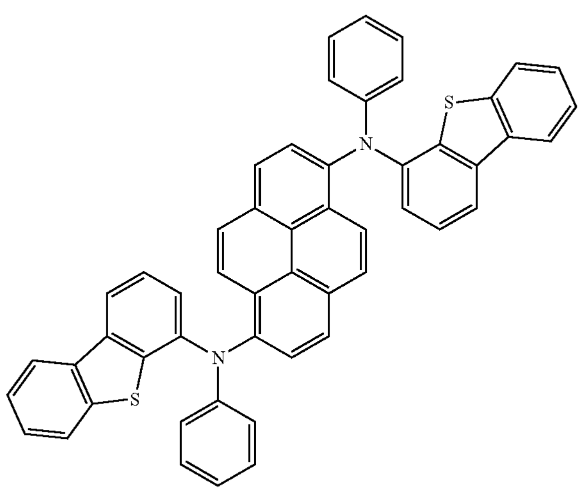
-continued
FD7
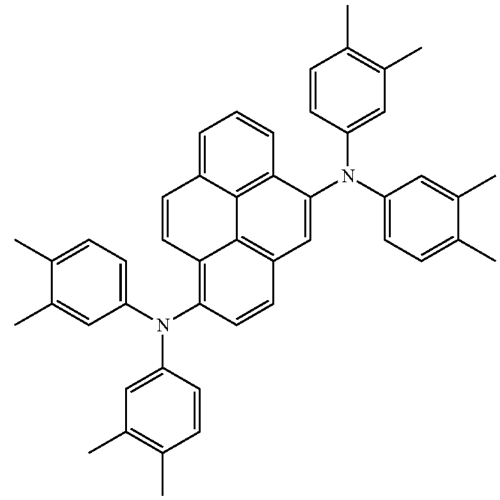
FD8
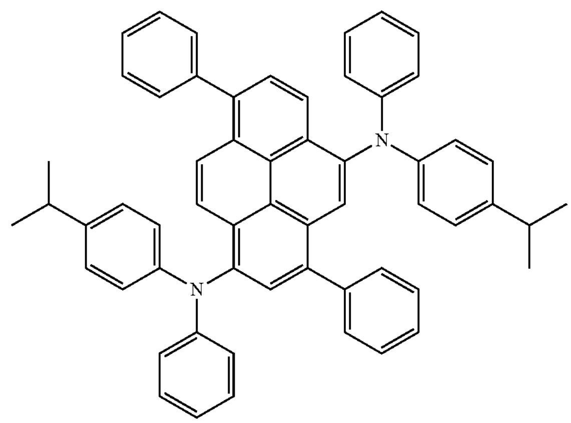
FD9
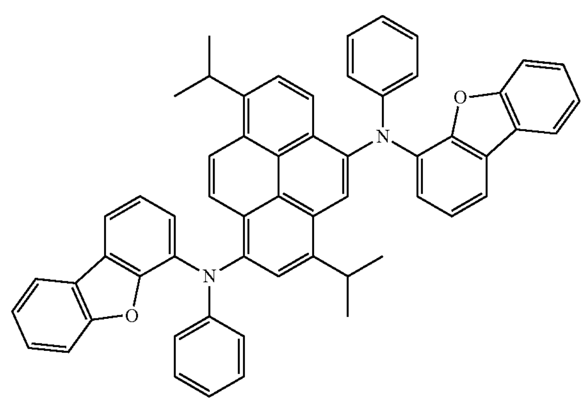

FD10
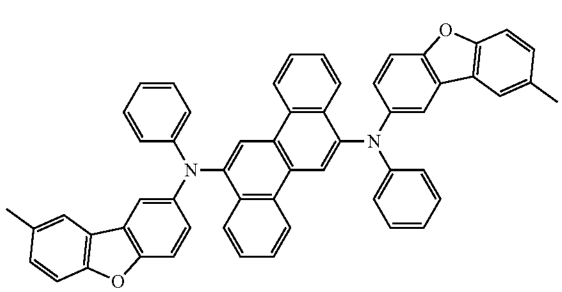
FD11
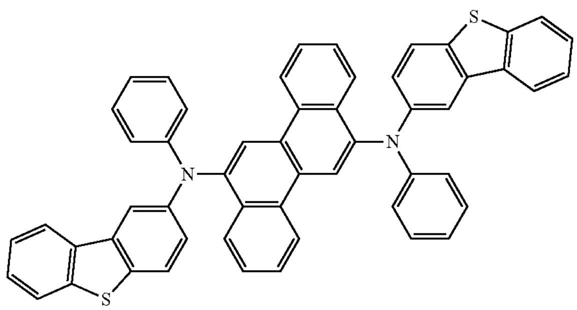
FD12
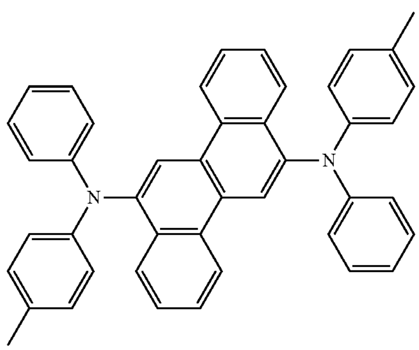
FD13
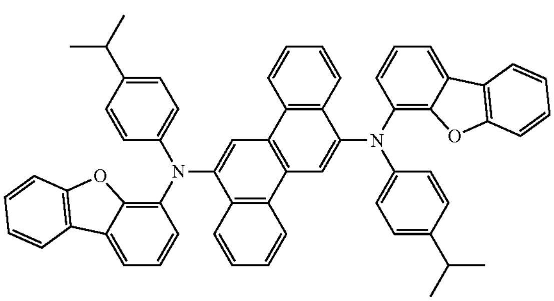
FD14
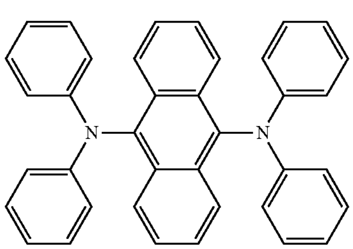
FD15
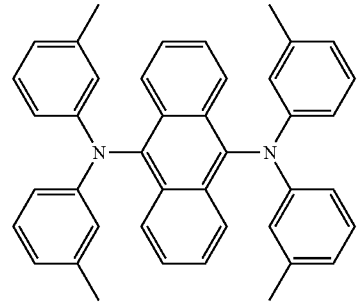
FD16
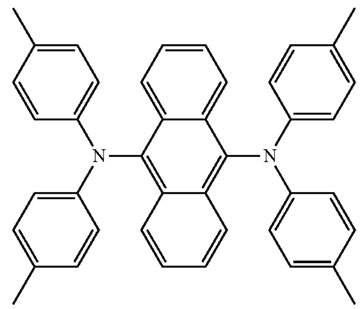
FD17
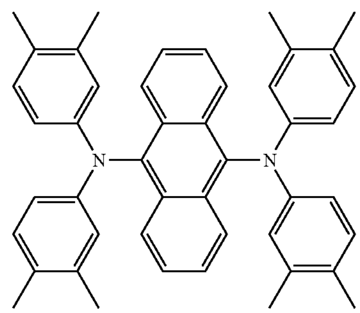
FD18
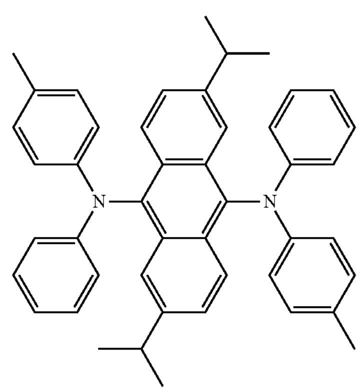

-continued
FD19
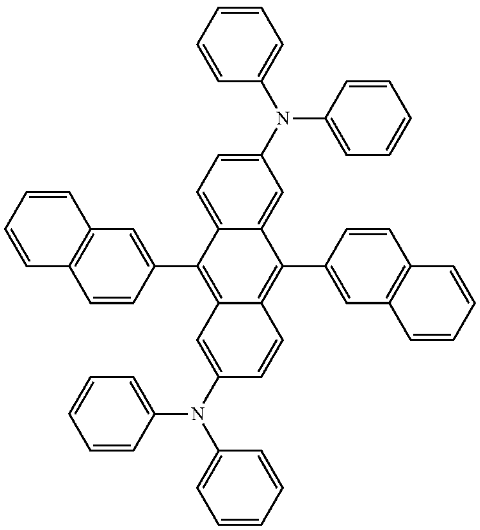
FD20
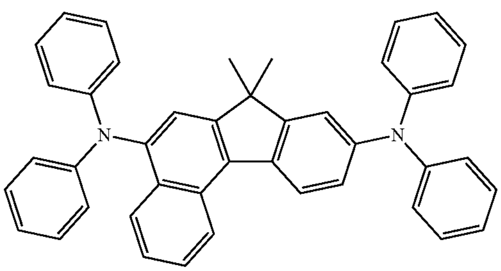
-continued
FD21
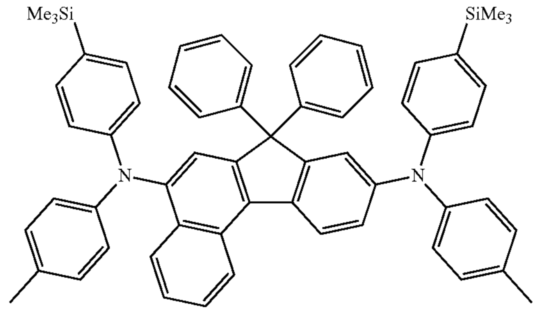
FD22
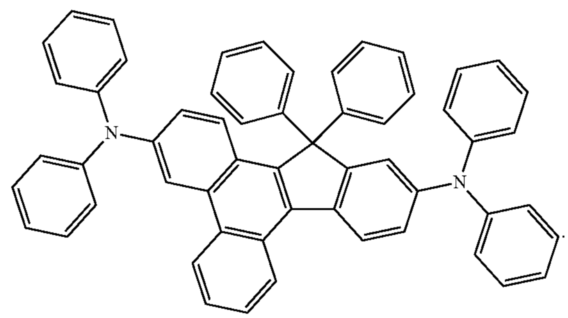
In various embodiments, the fluorescent dopant may be selected from the compounds illustrated below, but embodiments of the present disclosure are not limited thereto:
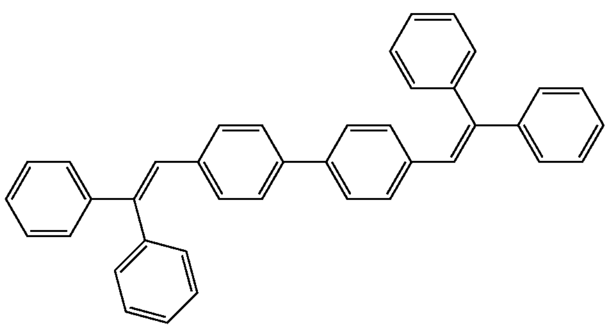
DPVBi
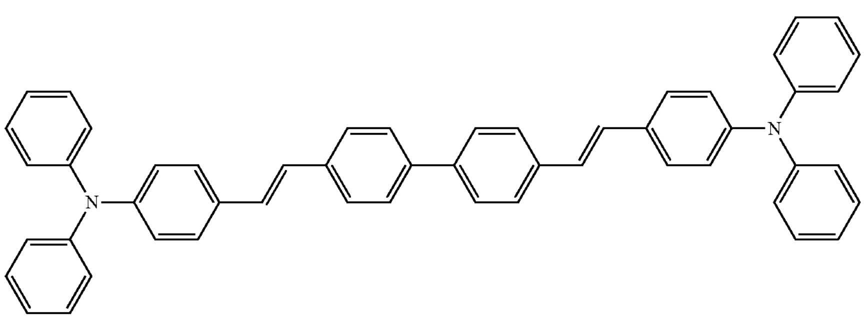
DPAVBi -continued

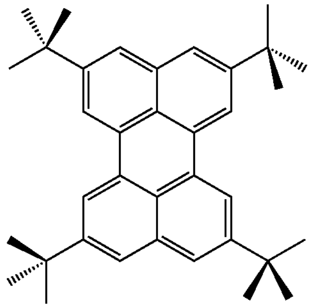
TBPe

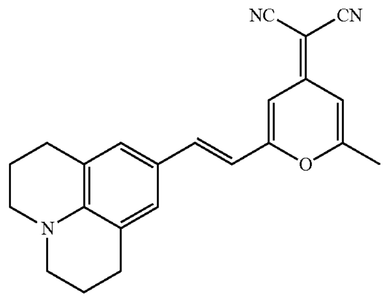
DCM

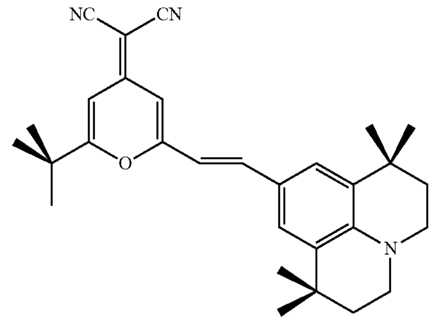
DCJTB

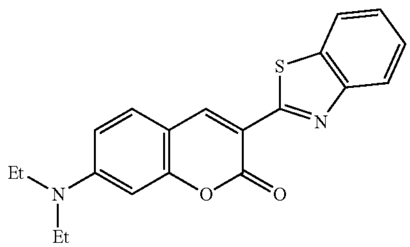
Coumarin 6

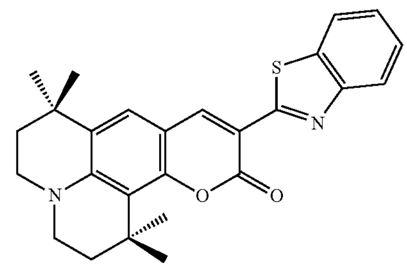
C545T

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein for each structure, constituting layers are sequentially stacked from the emission layer in each stated order, but the structure of the electron transport region is not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered hetero-monocyclic group having at least one *—N=*' moiety, ii) a hetero-polycyclic group in which two or more 5-membered to 7-membered hetero-monocyclic groups each having at least one *—N=*' moiety are condensed with each other, or iii) a hetero-polycyclic group in which at least one of 5-membered to 7-membered hetero-monocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, thiadiazol, an imidazopyridine, an imidazopyrimidine, and an azacarbazole, but embodiments of the present disclosure are not limited thereto.

For example, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(═O)($Q_{601}$), —S(═O)$_2$($Q_{601}$), and —P(═O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer selected from 1 to 5.

In an embodiment, at least one of $Ar_{601}$ in the number of xe11 and $R_{601}$ in the number of xe21 may include the π electron-depleted nitrogen-containing ring.

In an embodiment, in Formula 601, ring $Ar_{601}$ may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), and —P(═O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In an embodiment, when xe11 in Formula 601 is two or more, two or more $Ar_{601}$(s) may be linked to each other via a single bond.

In various embodiments, $Ar_{601}$ in Formula 601 may be an anthracene group.

In various embodiments, the compound represented by Formula 601 may be represented by Formula 601-1:

Formula 601-1

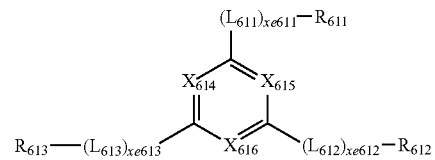

In Formula 601-1, $X_{614}$ may be N or C($R_{614}$), $X_{615}$ may be N or C($R_{615}$), and $X_{616}$ may be N or C($R_{616}$), wherein at least one selected from $X_{614}$ to $X_{616}$ may be nitrogen, $L_{611}$ to $L_{613}$ may each independently be the same as described in connection with $L_{601}$ above, xe611 to xe613 may each independently be the same as described in connection with xe1 above, $R_{611}$ to $R_{613}$ may each independently be the same as described in connection with $R_{601}$ above, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_{611}$ to $L_{613}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In various embodiments, in Formulae 601 and 601-1, xe1 and xe611 to xe613 may each independently be 0, 1, or 2.

In various embodiments, in Formulae 601 and 601-1, $R_{601}$ and $R_{611}$ to $R_{613}$ may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(═O)$_2$(Q$_{601}$), and —P(═O)(Q$_{601}$)(Q$_{602}$), and Q$_{601}$ and Q$_{602}$ may each independently be understood by referring to the descriptions thereof in the present specification.

In an embodiment, the electron transport region may include at least one compound selected from Compounds ET1 to ET36, but embodiments of the present disclosure are not limited thereto:

ET1

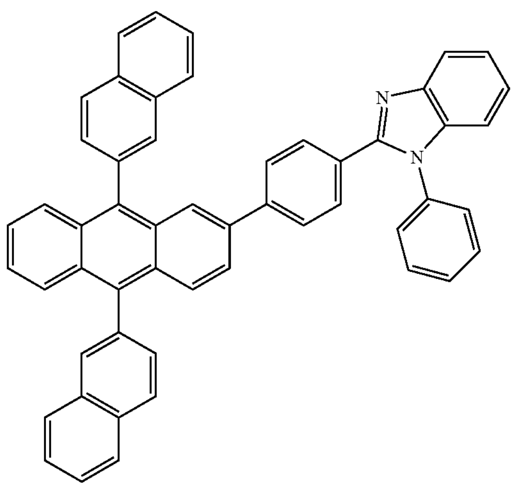

ET2

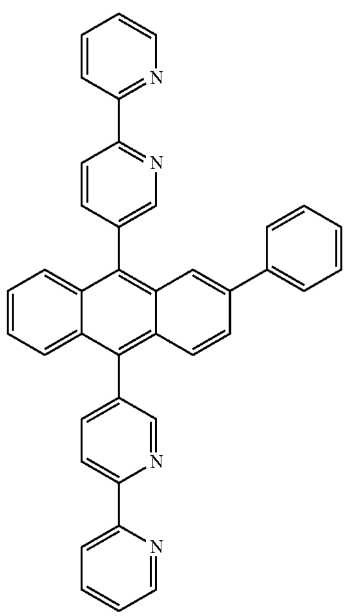

-continued

ET3

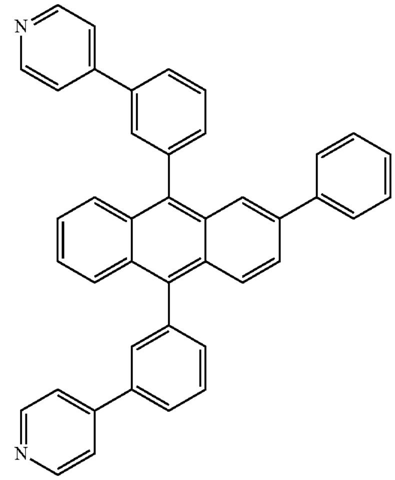

ET4

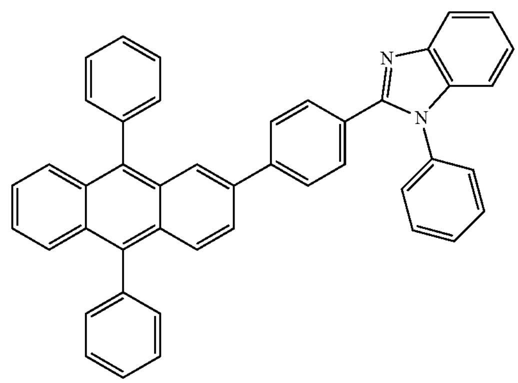

ET5

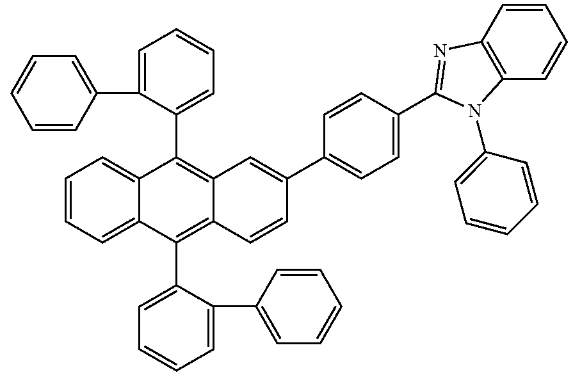

-continued
ET6
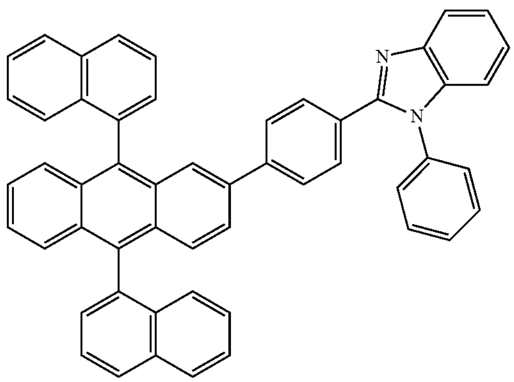
ET7
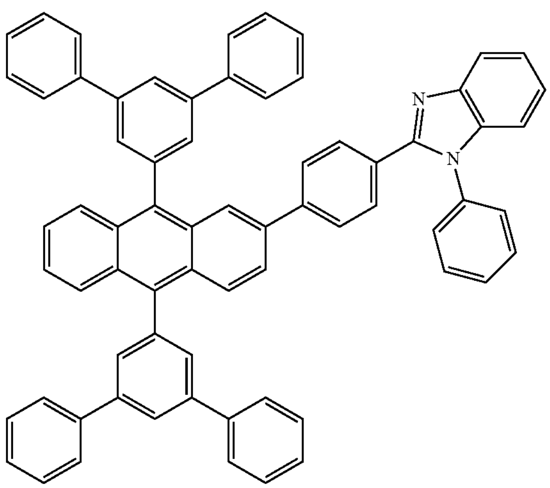
ET8
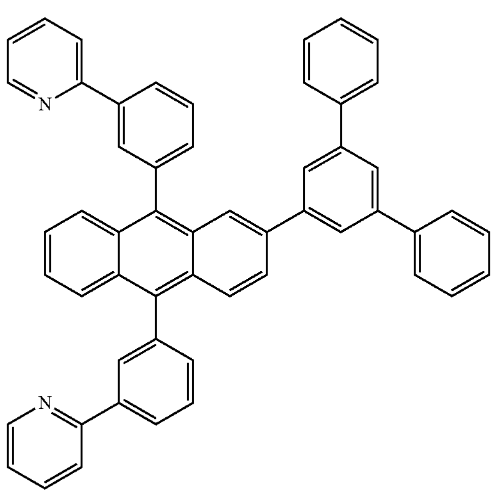
-continued
ET9
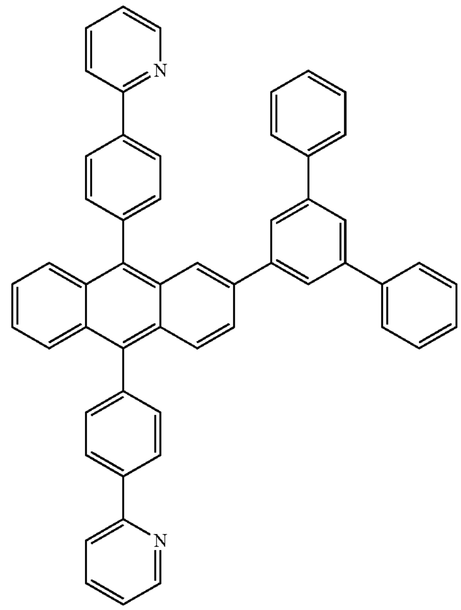
ET10
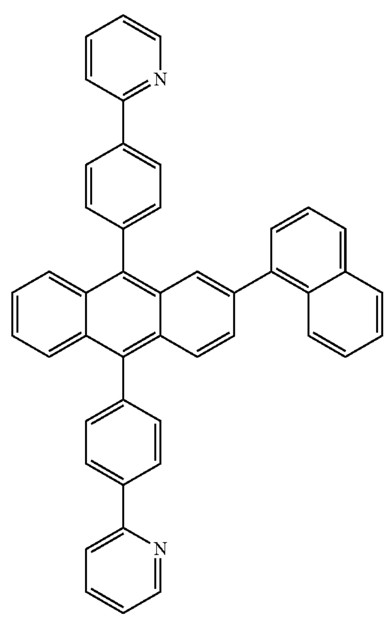

ET11
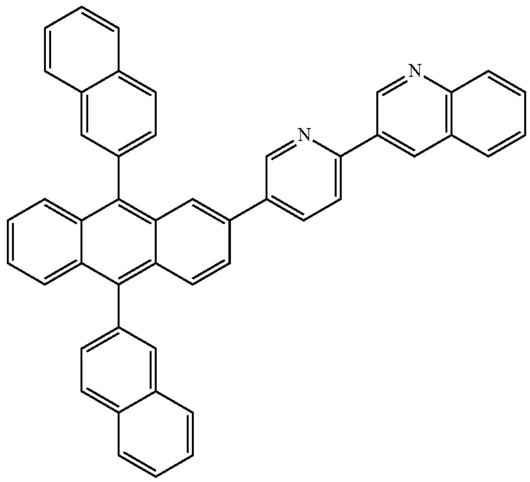
ET12
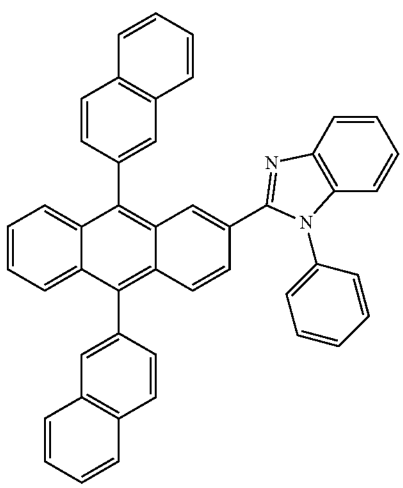
ET13
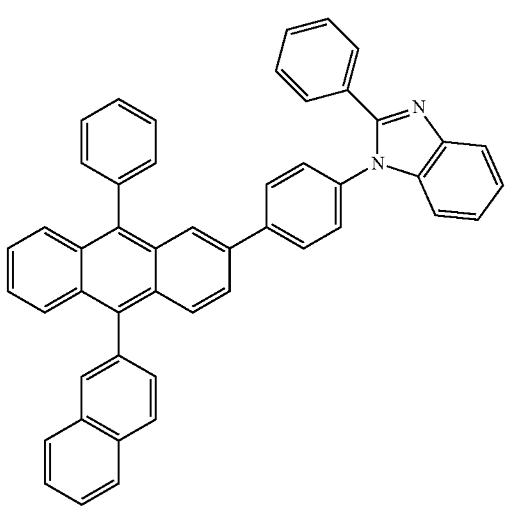
ET14
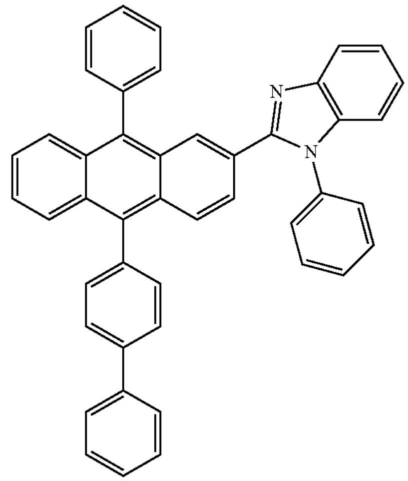
ET15
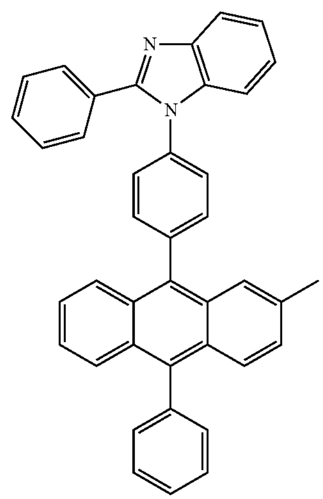
ET16
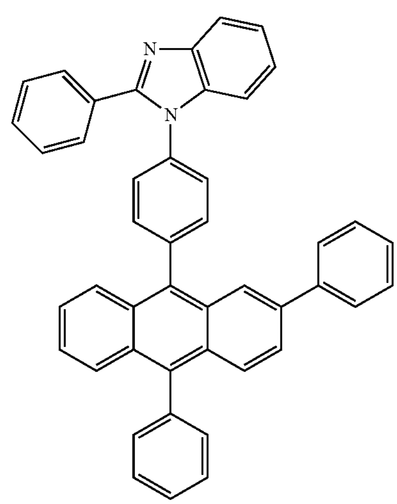

-continued
ET17
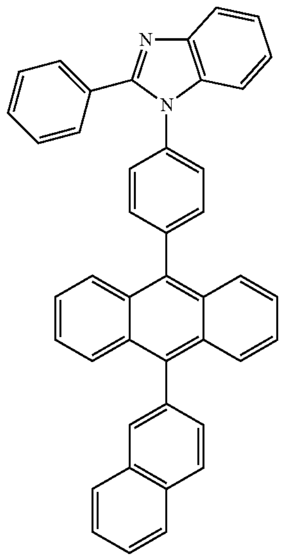
ET18
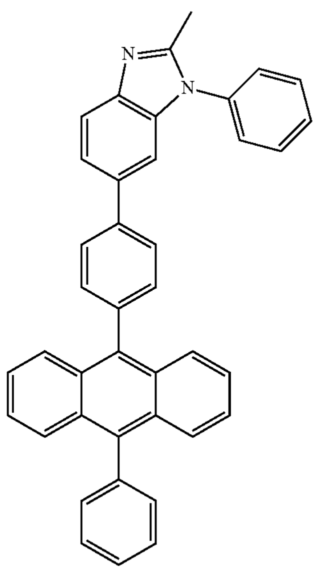
ET19
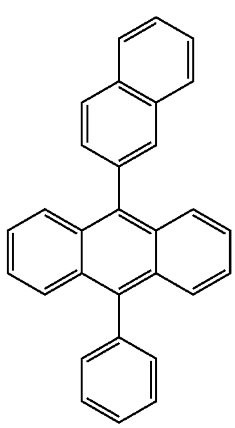
-continued
ET20
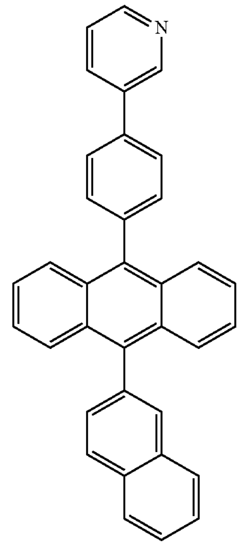
ET21
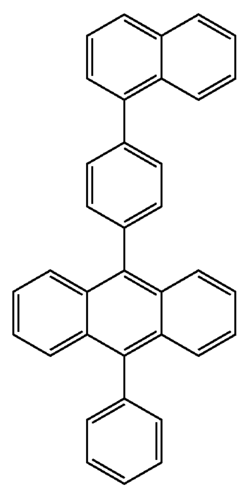
ET22
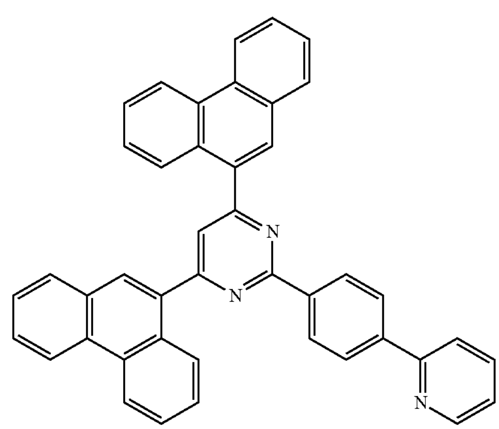

-continued
ET23
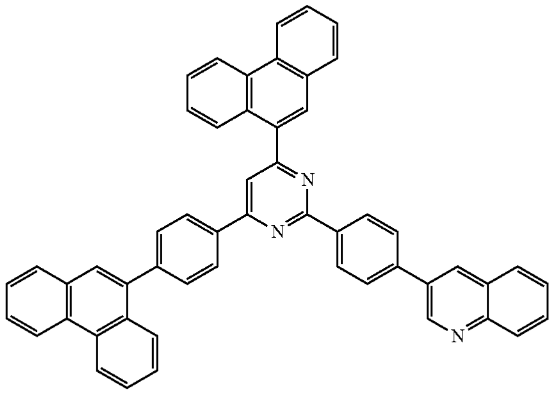
ET24
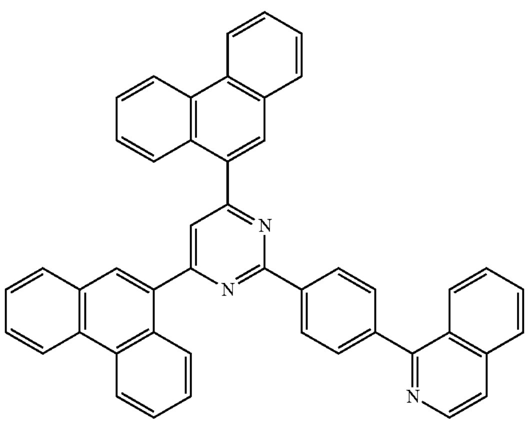
ET25
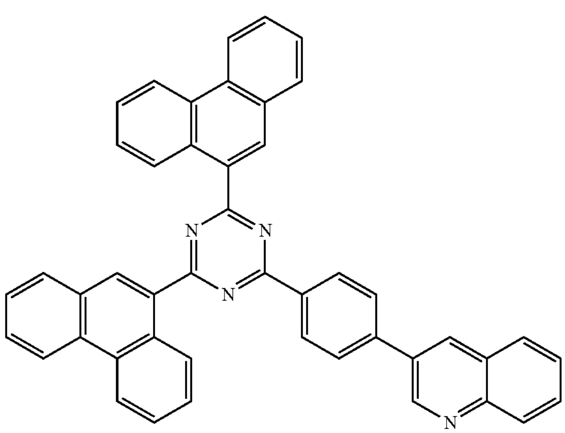
-continued
ET26
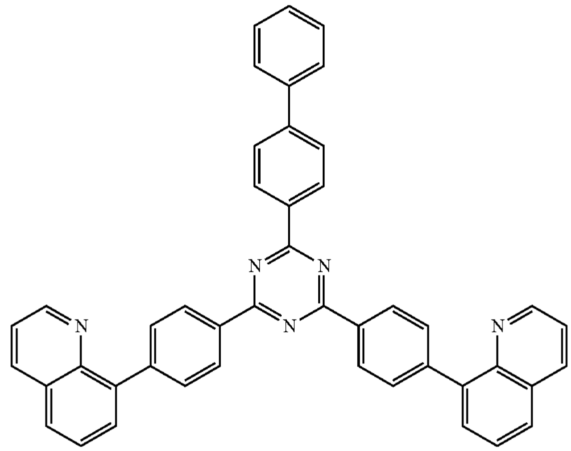
ET27
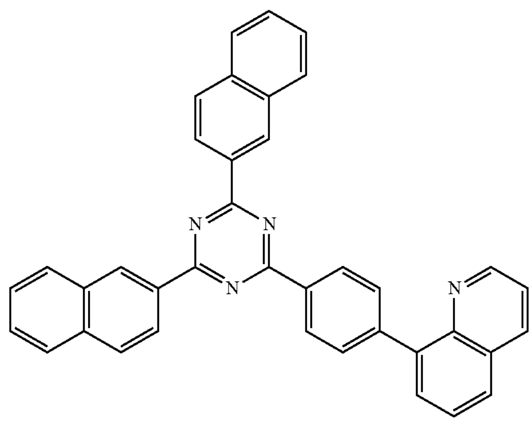
ET28
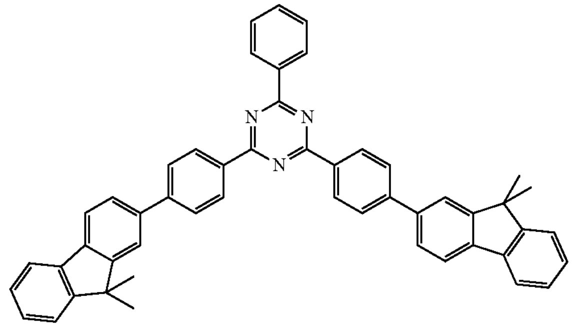

-continued
ET29
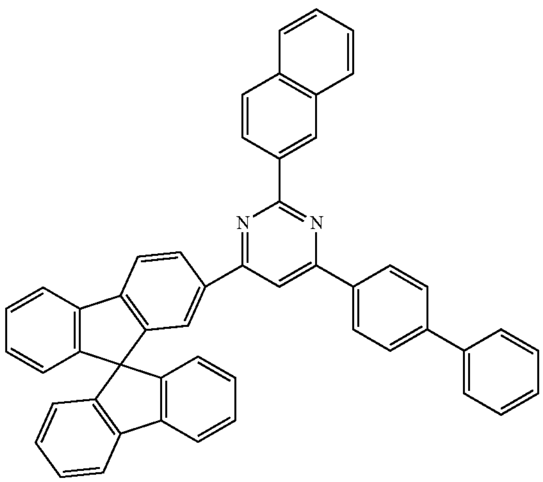
ET30
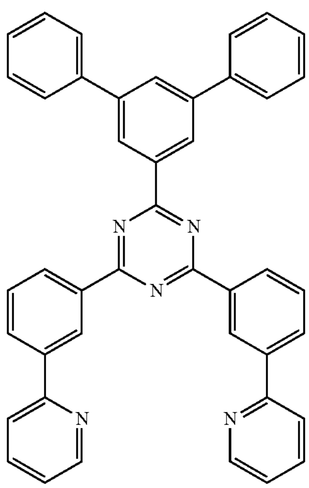
ET31
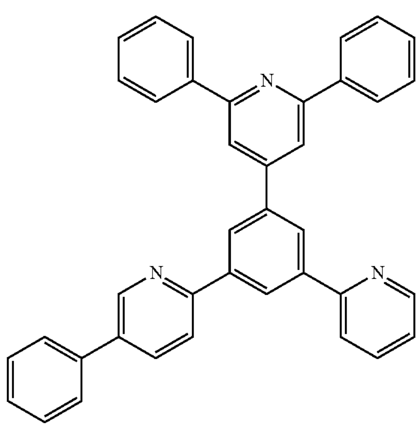
-continued
ET32
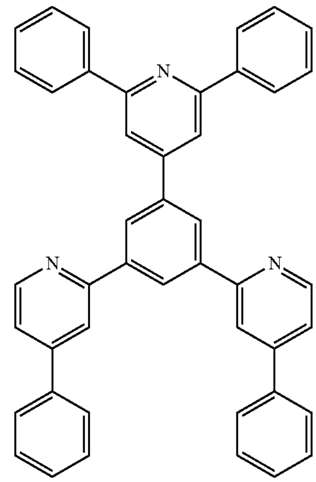
ET33
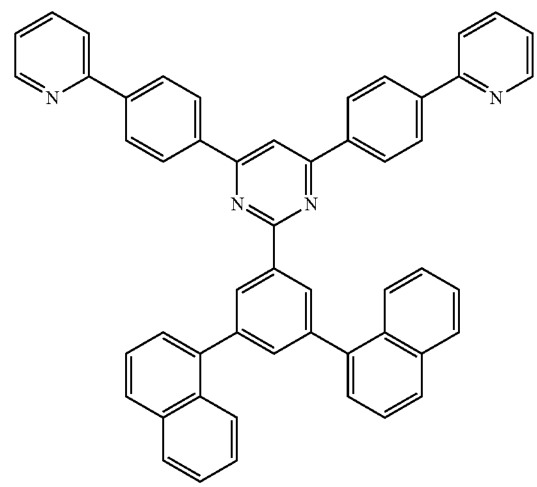
ET34
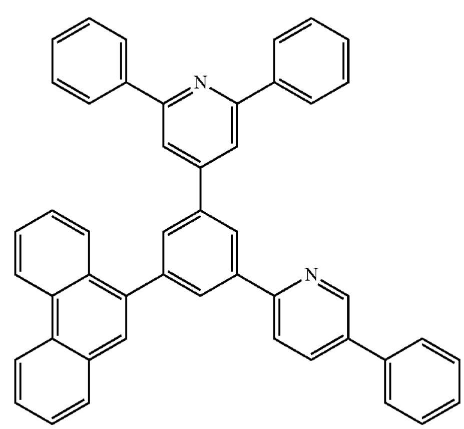

-continued

ET35

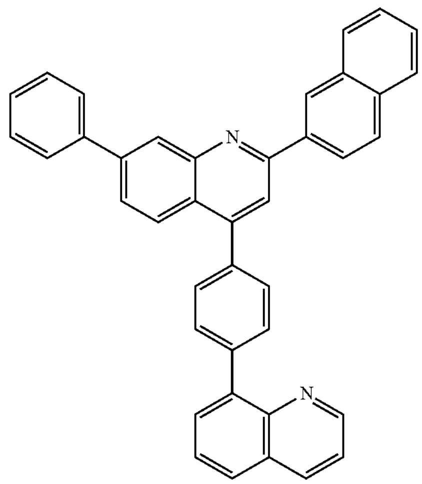

ET36

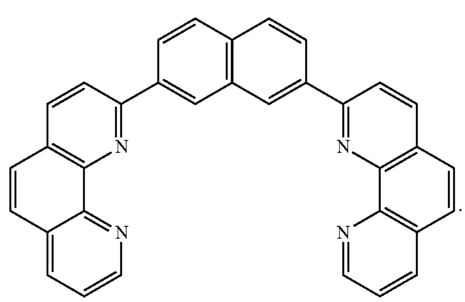

In various embodiments, the electron transport region may include at least one compound selected from 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), and NTAZ:

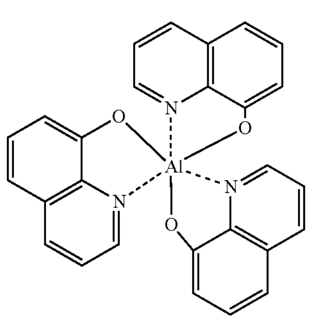

$Alq_3$

-continued

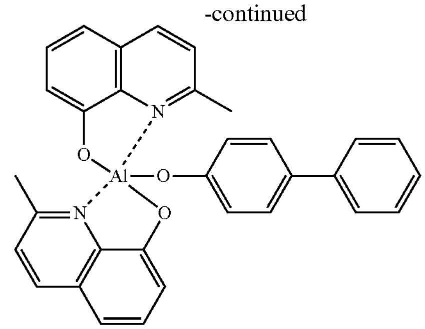

BAlq

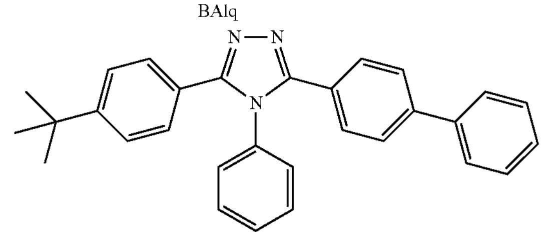

TAZ

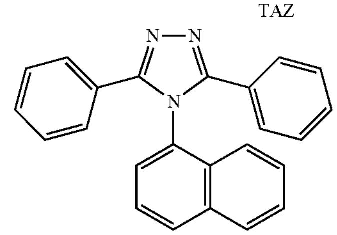

NTAZ

A thickness of the buffer layer, the hole blocking layer, and/or the electron control layer may each independently be in a range of about 20 Å to about 1,000 Å, for example, about 30 Å to about 300 Å. When the thickness of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the ranges described above, the electron transport layer may have satisfactory electron transporting characteristics without a substantial increase in driving voltage.

The electron transport region (for example, the electron transport layer in the electron transport region) may further include, in addition to the materials described above, a metal-containing material.

The metal-containing material may include at least one selected from an alkaline metal complex and an alkaline earth-metal complex. The alkaline metal complex may include a metal ion selected from an Li ion, a Na ion, a K ion, a Rb ion, and a Cs ion, and the alkaline earth-metal complex may include a metal ion selected from a Be ion, a Mg ion, a Ca ion, an Sr ion, and a Ba ion. A ligand coordinated with the metal ion of the alkaline metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

ET-D1

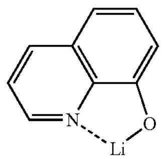

ET-D2

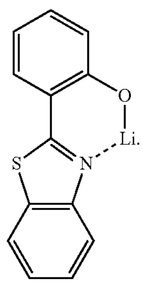

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkaline metal, an alkaline earth-metal, a rare-earth-metal, an alkaline metal compound, an alkaline earth-metal compound, a rare-earth-metal compound, an alkaline metal complex, an alkaline earth-metal complex, a rare-earth-metal complex, or a combination thereof.

The alkaline metal may be selected from Li, Na, K, Rb, and Cs. In an embodiment, the alkaline metal may be Li, Na, or Cs. In various embodiments, the alkaline metal may be Li or Cs, but embodiments of the present disclosure are not limited thereto.

The alkaline earth metal may be selected from Mg, Ca, Sr, and Ba.

The rare-earth metal may be selected from Sc, Y, Ce, Tb, Yb, Gd, and Tb.

The alkaline metal compound, the alkaline earth-metal compound, and the rare-earth metal compound may be selected from oxides and halides (for example, fluorides, chlorides, bromides, or iodines) of the alkaline metal, the alkaline earth-metal, and the rare-earth metal.

The alkaline metal compound may be selected from alkaline metal oxides, such as $Li_2O$, $Cs_2O$, and/or $K_2O$, and alkaline metal halides, such as LiF, NaF, CsF, KF, LiI, NaI, CsI, and/or KI. In an embodiment, the alkaline metal compound may be selected from LiF, $Li_2O$, NaF, LiI, NaI, CsI, and KI, but embodiments of the present disclosure are not limited thereto.

The alkaline earth-metal compound may be selected from alkaline earth-metal compounds, such as BaO, SrO, CaO, $Ba_xSr_{1-x}O$ (where $0<x<1$), and/or $Ba_xCa_{1-x}O$ (where $0<x<1$). For example, the alkaline earth-metal compound may be selected from BaO, SrO, and CaO, but embodiments of the present disclosure are not limited thereto.

The rare-earth metal compound may be selected from $YbF_3$, $ScF_3$, $ScO_3$, $Y_2O_3$, $Ce_2O_3$, $GdF_3$, and $TbF_3$. For example, the In an embodiment, the rare-earth metal compound may be selected from $YbF_3$, $ScF_3$, $TbF_3$, $YbI_3$, $ScI_3$, and $TbI_3$, but embodiments of the present disclosure are not limited thereto.

The alkaline metal complex, the alkaline earth-metal complex, and the rare-earth metal complex may include an ion of the alkaline metal, the alkaline earth-metal, and the rare-earth metal, and a ligand coordinated with a metal ion of the alkaline metal complex, the alkaline earth-metal complex, and the rare-earth metal complex may each independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

The electron injection layer may include (e.g., consist of) the alkaline metal, the alkaline earth metal, the rare-earth metal, the alkaline metal compound, the alkaline earth-metal compound, the rare-earth metal compound, the alkaline metal complex, the alkaline earth-metal complex, the rare-earth metal complex, or a combination thereof. In various embodiments, the electron injection layer may further include an organic material. When the electron injection layer further includes an organic material, the alkaline metal, the alkaline earth metal, the rare-earth metal, the alkaline metal compound, the alkaline earth-metal compound, the rare-earth metal compound, the alkaline metal complex, the alkaline earth-metal complex, the rare-earth metal complex, or the combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, the electron injection layer may have satisfactory electron injecting characteristics without a substantial increase in driving voltage.

Second Electrode 190

The second electrode 190 may be disposed on the organic layer 150 having such a structure described above. The second electrode 190 may be a cathode which is an electron injection electrode, and in this regard, a material for forming the second electrode 190 may be selected from a metal, an alloy, an electrically conductive compound, and a mixture thereof, which have a relatively low work function.

The second electrode 190 may include at least one selected from Li, Ag, Mg, Al, Al—Li, Ca, Mg—In, Mg—Ag, ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
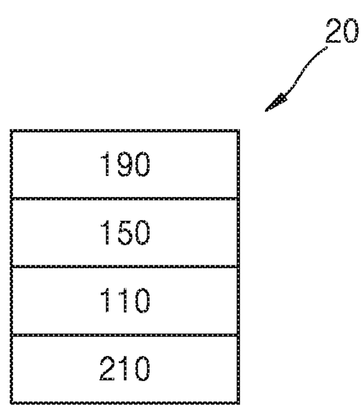
FIG. 2 is a diagram schematically illustrating a structure of an organic light-emitting device according to another embodiment.
Figure 3:
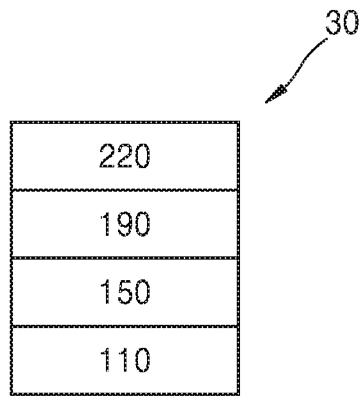
FIG. 3 is a diagram schematically illustrating a structure of an organic light-emitting device according to another embodiment.
Figure 4:
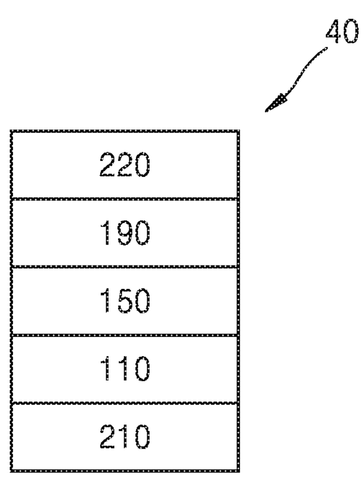
FIG. 4 is a diagram schematically illustrating a structure of an organic light-emitting device according to another embodiment.

Descriptions of FIGS. 2 to 4

An organic light-emitting device 20 of FIG. 2 includes a first capping layer 210, a first electrode 110, an organic layer 150, and a second electrode 190, which are sequentially stacked in this stated order, an organic light-emitting device 30 of FIG. 3 includes a first electrode 110, an organic layer 150, a second electrode 190, and a second capping layer 220, which are sequentially stacked in this stated order, and an organic light-emitting device 40 of FIG. 4 includes a first capping layer 210, a first electrode 110, an organic layer 150, a second electrode 190, and a second capping layer 220, which are sequentially stacked in this stated order.

Regarding FIGS. 2 to 4, the first electrode 110, the organic layer 150, and the second electrode 190 may each independently be understood by referring to the descriptions thereof presented in connection with FIG. 1.

In the organic layer 150 of each of the organic light-emitting devices 20 and 40, light generated in the emission layer may pass through the first electrode 110, which is a semi-transmissive electrode or a transmissive electrode, and the first capping layer 210 toward the outside, and in the organic layer 150 of each of the organic light-emitting devices 30 and 40, light generated in the emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may include at least one material selected from a carbocyclic compound, a heterocyclic compound, an amine-based compound, a porphine derivative, a phthalocyanine derivative, a naphthalocyanine derivative, an alkaline metal complex, and an alkaline earth-based complex. The carbocyclic compound, the heterocyclic compound, and the amine-based compound may be optionally substituted with a substituent containing at least one element selected from O, N, S, Se, Si, F, Cl, Br, and I.

In an embodiment, at least one selected from the first capping layer 210 and the second capping layer 220 may include an amine-based compound.

In various embodiments, at least one selected from the first capping layer 210 and the second capping layer 220 may include the compound represented by Formula 201 or the compound represented by Formula 202.

In various embodiments, at least one selected from the first capping layer 210 and the second capping layer 220 may include a compound selected from Compounds HT28 to HT33 and Compounds CP1 to CP5, but embodiments of the present disclosure are not limited thereto:

CP1

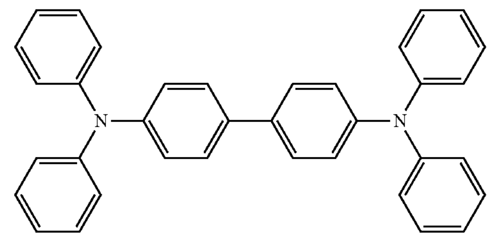

CP2

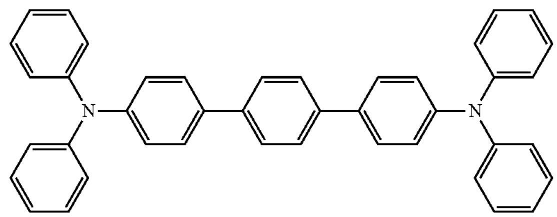

CP3

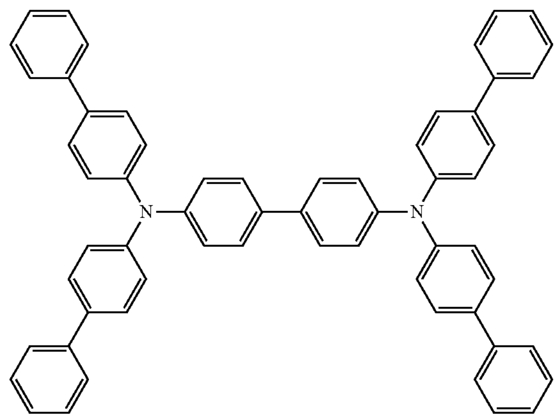

CP4

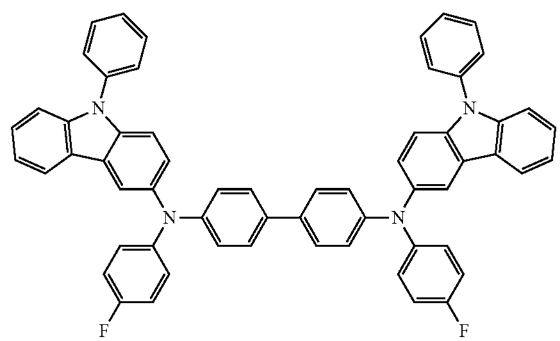

CP5

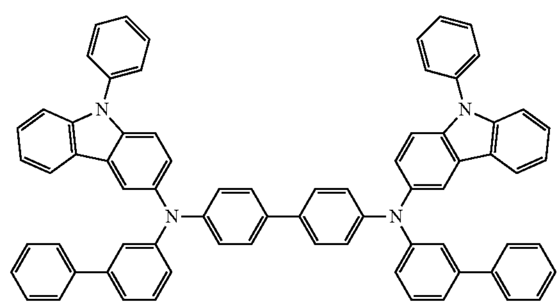

Hereinbefore, the organic light-emitting device according to an embodiment has been described in connection with FIGS. 1 to 4. However, embodiments of the present disclosure are not limited thereto.

Layers constituting the hole transport region, the emission layer, and layers constituting the electron transport region may each independently be formed in a certain region by utilizing one or more suitable methods selected from vacuum deposition, spin coating, casting, langmuir-blodgett (LB) deposition, ink-jet printing, laser-printing, and laser-induced thermal imaging (LITI).

When layers constituting the hole transport region, the emission layer, and layers constituting the electron transport region are each independently formed by vacuum deposition, the vacuum deposition may be, for example, performed at a deposition temperature of about 100° C. to about 500° C., at a vacuum degree of about $10^{-8}$ to about $10^{-3}$ torr, and at a deposition rate of about 0.01 to about 100 Å/sec by taking into account a compound to be included in a layer to be formed, and a structure of the layer to be formed.

When layers constituting the hole transport region, the emission layer, and layers constituting the electron transport region are each independently formed by spin coating, the spin coating may be, for example, performed at a coating speed of about 2,000 rpm to about 5,000 rpm and at a heat treatment temperature of about 80° C. to 200° C. by taking into account a compound to be included in a layer to be formed, and a structure of the layer to be formed.

Full Color Organic Light-Emitting Device

Figure 5:
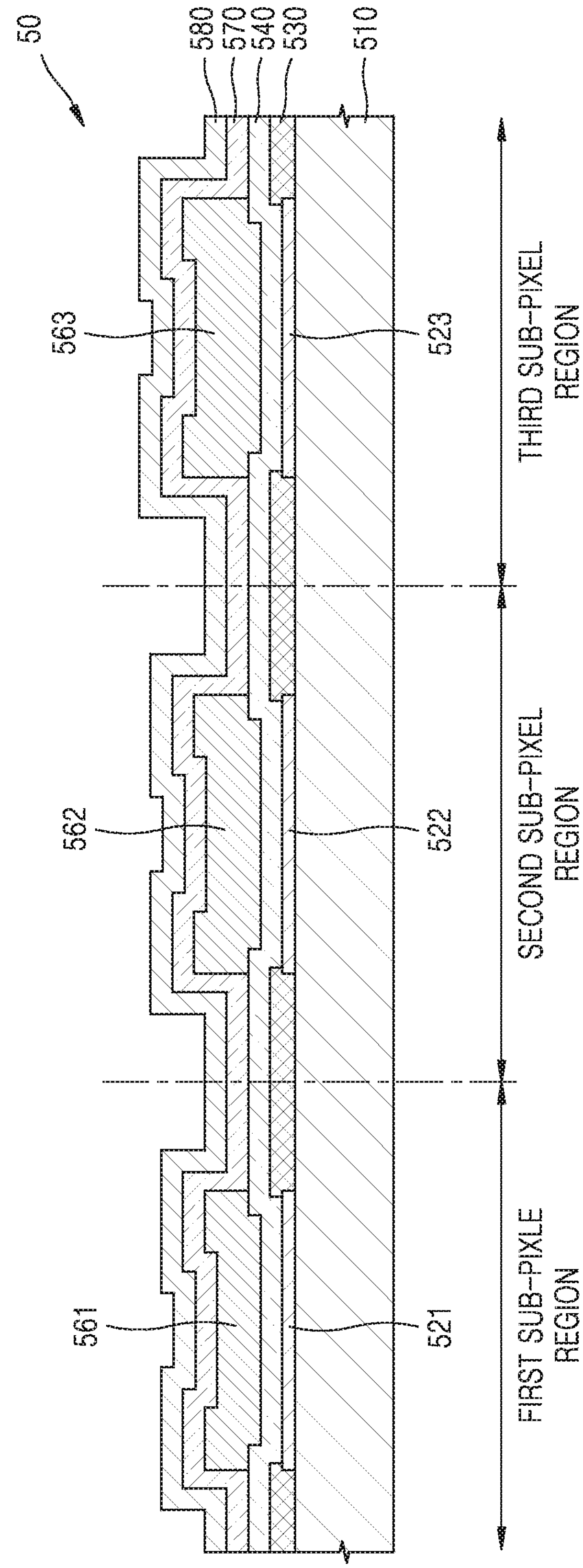
FIG. 5 is a diagram schematically illustrating a structure of a full color organic light-emitting device according to an embodiment.

FIG. 5 is a diagram schematically illustrating a cross section of a full color light-emitting device according to an embodiment.

Referring to FIG. 5, an organic light-emitting device 50 includes a substrate 510 that is partitioned into a first sub-pixel region, a second sub-pixel region, and a third sub-pixel region.

A first sub-pixel is formed in the first sub-pixel region, a second sub-pixel is formed in the second sub-pixel region, and a third sub-pixel is formed in the third sub-pixel region.

A plurality of first electrodes 521, 522, and 523 are each disposed respectively in the first sub-pixel region, the second sub-pixel region, and the third sub-pixel region of the substrate 510. That is, the first electrode 521 is disposed in the first sub-pixel region, the first electrode 522 is disposed in the second sub-pixel region, and the first electrode 523 is disposed in the third sub-pixel region.

A hole transport region 540 is disposed on the plurality of the first electrodes 521, 522, and 523. The hole transport region 540 may be formed as a common layer over the plurality of the first electrodes 521, 522, and 523. The hole transport region 540 may include a first hole transport region that is formed in the first sub-pixel region, a second transport region that is formed in the second sub-pixel region, and a third hole transport region that is formed in the third sub-pixel region. For example, the hole transport region 540 may include the second compound represented by one selected from Formulae 2-1 to 2-3. In more detail, the second compound represented by one selected from Formulae 2-1 to 2-3 may be in i) only one region selected from the first hole transport region, the second hole transport region, and the third hole transport region, ii) two regions selected from the first hole transport region, the second hole transport region, and the third hole transport region, or iii) all regions of the first hole transport region, the second hole transport region, and the third hole transport region.

The hole transport region 540 may include at least a hole transport layer and an emission auxiliary layer (the hole transport region 540 may include a hole injection layer, a hole transport layer, and an emission auxiliary layer, or may include a hole transport layer and an emission auxiliary layer), wherein the hole transport layer is disposed between the first electrode and the emission auxiliary layer, and the emission auxiliary layer includes the second compound, but embodiments of the present disclosure are not limited thereto.

The second compound represented by one selected from Formulae 2-1 to 2-3 may be understood by referring to the description thereof presented above in the present specification.

A plurality of emission layers including a first emission layer 561, a second emission layer 562, and a third emission layer 563 is formed on the hole transport region 540. The first emission layer 561 is formed in the first sub-pixel region and emits a first color light, the second emission layer 562 is formed in the second sub-pixel region and emits a second color light, and the third emission layer 563 is formed in the third sub-pixel region and emits a third color light.

For example, at least one selected from the first emission layer 561, the second emission layer 562, and the third emission layer 563 may include the first compound represented by Formula 1, but embodiments of the present disclosure are not limited thereto The first compound represented by Formula 1 may be understood by referring to the description thereof presented above in the present specification The first color light may be red light, the second color light may be green light, and the third color light may be blue light. The first color light, the second color light, and the third color light may be mixed with each other to emit white light For example, i) the first color light may be emitted by a red phosphorescent dopant, ii) the second color light may be emitted by a green phosphorescent dopant, and iii) the third color light may be emitted by a blue fluorescent dopant, but embodiments of the present disclosure are not limited thereto. For example, the third color light may be emitted by a blue phosphorescent dopant.

For example, the first emission layer 561 may include the first compound represented by Formula 1, and the first hole transport region may include the second compound represented by one selected from Formulae 2-1 to 2-3, but embodiments of the present disclosure are not limited thereto.

For example, the second emission layer 562 may include the first compound represented by Formula 1, and the second hole transport region may include the second compound represented by one selected from Formulae 2-1 to 2-3, but embodiments of the present disclosure are not limited thereto.

An electron transport region 570 is disposed over the plurality of the emission layers 561, 562, and 563. The electron transport region 570 may be formed as a common layer over the plurality of the emission layers 561, 562, and 563. The electron transport region 570 may include an electron transport layer and an electron injection layer that are sequentially stacked from the plurality of the emission layers 561, 562, and 563 in this stated order.

A second electrode 580 is formed as a common layer on the electron transport region 570.

As used herein, the term “common layer” refers to a layer formed entirely over the first sub-pixel region, the second sub-pixel region, and the third sub-pixel region, rather than being patterned according to the first sub-pixel region, the second sub-pixel region, and the third sub-pixel region.

A pixel insulating layer 530 is formed along edges of the plurality of the first electrodes 521, 522, and 523. The pixel insulating layer 530 defines a pixel region, and may include various suitable organic insulating materials (for example, a silicon-based material), inorganic insulating materials, or organic/inorganic composite insulating materials.

The first electrodes 521, 522, and 523, the hole transport region 540, the emission layers 561, 562, and 563, the electron transport region 570, and the second electrode 580 may each independently be understood by referring to the descriptions thereof presented in connection with FIG. 1.

The organic light-emitting device 50 may be included in a flat panel display device including a thin film transistor. The thin film transistor may include a gate electrode, source and drain electrodes, a gate insulating film, and an active layer, and one of the source and drain electrodes may electrically contact the first electrodes 521, 522, and 523 of the organic light-emitting device 50. The active layer may include crystalline silicon, amorphous silicon, organic semiconductor, oxide semiconductor, and/or the like, but embodiments of the present disclosure are not limited thereto.

Hereinbefore, the organic light-emitting device 50 has been described with reference to FIG. 5, but embodiments of the present disclosure are not limited thereto. For example, the third emission layer 563 may be formed as a common layer as being extended to the first sub-pixel region and the second sub-pixel region. In addition, the third sub-pixel region may not include the third auxiliary layer. In addition, only one of the first auxiliary layer and the second auxiliary layer may be utilized.

General Definition of Substituents

A "$C_1$-$C_{60}$ alkyl group," as used herein, refers to a linear or branched aliphatic saturated hydrocarbon monovalent group having 1 to 60 carbon atoms, and examples thereof include a methyl group, an ethyl group, a propyl group, an isobutyl group, a sec-butyl group, a ter-butyl group, a pentyl group, an iso-amyl group, and a hexyl group. A "$C_1$-$C_{60}$ alkylene group," as used herein, refers to a divalent group having substantially the same structure as the $C_1$-$C_{60}$ alkyl group.

A "$C_2$-$C_{60}$ alkenyl group," as used herein, refers to a hydrocarbon group having at least one carbon-carbon double bond at one or more positions along the hydrocarbon chain (e.g., in the middle or at either terminal end of the $C_2$-$C_{60}$ alkyl group), and examples thereof include an ethenyl group, a propenyl group, and a butenyl group. A "$C_2$-$C_{60}$ alkenylene group," as used herein, refers to a divalent group having substantially the same structure as the $C_2$-$C_{60}$ alkenyl group.

A "$C_2$-$C_{60}$ alkynyl group," as used herein, refers to a hydrocarbon group having at least one carbon-carbon triple bond at one or more positions along the hydrocarbon chain (e.g., in the middle or at either terminal end of the $C_2$-$C_{60}$ alkyl group), and examples thereof include an ethynyl group and a propynyl group. A "$C_2$-$C_{60}$ alkynylene group," as used herein, refers to a divalent group having substantially the same structure as the $C_2$-$C_{60}$ alkynyl group.

A "$C_1$-$C_{60}$ alkoxy group," as used herein, refers to a monovalent group represented by —$OA_{101}$ (where $A_{101}$ is the $C_1$-$C_{60}$ alkyl group), and examples thereof include a methoxy group, an ethoxy group, and an isopropyloxy group.

A "$C_3$-$C_{10}$ cycloalkyl group," as used herein, refers to a monovalent saturated hydrocarbon monocyclic saturated group having 3 to 10 carbon atoms, and examples thereof include a cyclopropyl group, a cyclobutyl group, a cyclopentyl group, a cyclohexyl group, and a cycloheptyl group. A "$C_3$-$C_{10}$ cycloalkylene group," as used herein, may refer to a divalent group having substantially the same structure as the $C_3$-$C_{10}$ cycloalkyl group.

A "$C_1$-$C_{10}$ heterocycloalkyl group," as used herein, refers to a monovalent saturated monocyclic group having at least one heteroatom selected from N, O, P, Si and S as a ring-forming atom in addition to 1 to 10 carbon atoms, and examples thereof include a 1,2,3,4-oxatriazolidinyl group, a tetrahydrofuranyl group, and a tetrahydrothiophenyl group. A "$C_1$-$C_{10}$ heterocycloalkylene group," as used herein, refers to a divalent group having substantially the same structure as the $C_1$-$C_{10}$ heterocycloalkyl group.

A "$C_3$-$C_{10}$ cycloalkenyl group," as used herein, refers to a monovalent unsaturated monocyclic group that has 3 to 10 carbon atoms and at least one carbon-carbon double bond in the ring thereof and does not have aromaticity, and examples thereof include a cyclopentenyl group, a cyclohexenyl group, and a cycloheptenyl group. A "$C_3$-$C_{10}$ cycloalkenylene group," as used herein, refers to a divalent group having substantially the same structure as the $C_3$-$C_{10}$ cycloalkenyl group.

A "$C_1$-$C_{10}$ heterocycloalkenyl group," as used herein, refers to a monovalent monocyclic group that has at least one heteroatom selected from N, O, P, Si, and S as a ring-forming atom in addition to 1 to 10 carbon atoms, and at least one carbon-carbon double bond in the ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. A "$C_1$-$C_{10}$ heterocycloalkenylene group," as used herein, refers to a divalent group having substantially the same structure as the $C_1$-$C_{10}$ heterocycloalkenyl group.

A "$C_6$-$C_{60}$ aryl group," as used herein, refers to a monovalent group having an aromatic system having 6 to 60 carbon atoms, and a "$C_6$-$C_{60}$ arylene group," as used herein, refers to a divalent group having an aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused to each other or may be linked with each other via a single bond.

A "$C_1$-$C_{60}$ heteroaryl group," as used herein, refers to a monovalent group having a cyclic aromatic system that has at least one heteroatom selected from N, O, Si, P, and S as a ring-forming atom in addition to 1 to 60 carbon atoms. A "$C_1$-$C_{60}$ heteroarylene group," as used herein, refers to a divalent group having an aromatic system that has at least one heteroatom selected from N, O, P, and S as a ring-forming atom in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused to each other or may be linked with each other via a single bond.

A "$C_6$-$C_{60}$ aryloxy group," as used herein, refers to a group represented by —$OA_{102}$ (where $A_{102}$ is the $C_6$-$C_{60}$ aryl group), and a "$C_6$-$C_{60}$ arylthio group," as used herein, refers to a group represented by —$SA_{103}$ (where $A_{103}$ is the $C_6$-$C_{60}$ aryl group).

A "monovalent non-aromatic condensed polycyclic group," as used herein, refers to a monovalent group that has two or more rings condensed to each other, has only carbon atoms as ring-forming atoms (for example, 8 to 60 carbon atoms), and has non-aromaticity in the entire molecular structure. An example of the monovalent non-aromatic condensed polycyclic group includes a fluorenyl group. A "divalent non-aromatic condensed polycyclic group," as used herein, refers to a divalent group having substantially the same structure as the monovalent non-aromatic condensed polycyclic group.

A "monovalent non-aromatic condensed heteropolycyclic group," as used herein, refers to a monovalent group that has two or more rings condensed to each other, has at least one heteroatom selected from N, O, Si, P, and S as a ring-forming atom, in addition to carbon atoms (for example, 1 to 60 carbon atoms), and has non-aromaticity in the entire molecular structure. An example of the monovalent non-aromatic condensed heteropolycyclic group includes a carbazolyl group. A "divalent non-aromatic condensed heteropolycyclic group," as used herein, refers to a divalent group having substantially the same structure as the monovalent non-aromatic condensed heteropolycyclic group.

A "$C_5$-$C_{60}$ carbocyclic group," as used herein, refers to a monocyclic or polycyclic group having 5 to 60 carbon atoms in which the ring-forming atoms include only carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In various embodiments, depending on the number of substituents connected to the $C_5$-$C_{60}$ carbocyclic group, the $C_5$-$C_{60}$ carbocyclic group may be a trivalent group or a quadrivalent group.

A "$C_1$-$C_{60}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon atom (the number of carbon in the $C_1$-$C_{60}$ heterocyclic group may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph," as used herein, refers to phenyl group, the term "Me," as used herein, refers to a methyl group, the term "Et," as used herein, refers to an ethyl group, the term "ter-Bu" or "$Bu^t$," as used herein, refers to a tert-butyl group, and the term "OMe," as used herein, refers to a methoxy group.

The term "biphenyl group," as used herein, refers to "a phenyl group substituted with a phenyl group". The "biphenyl group" belongs to "a substituted phenyl group" having a "$C_6$-$C_{60}$ aryl group" as a substituent.

The term "terphenyl group," as used herein, refers to "a phenyl group substituted with a biphenyl group". The "terphenyl group" belongs to "a substituted phenyl group" having "a $C_6$-$C_{60}$ aryl group substituted with a $C_6$-$C_{60}$ aryl group".

* and *', as used herein, unless defined otherwise, each indicate a binding site to a neighboring atom in a corresponding formula.

Hereinafter, a compound according to one or more embodiments and an organic light-emitting device according to one or more embodiments will be described in more detail with reference to the Synthesis Examples and Examples. The phrase "B was utilized instead of A" utilized in describing Synthesis Examples refers to that an identical number of molar equivalents of B was utilized in place of molar equivalents of A.

Hereinafter, an organic light-emitting device according to an embodiment is described in more detail with reference to the Synthesis Example and Examples. However, the organic light-emitting device is not limited thereto.

EXAMPLES

Example 1

An anode was prepared by cutting a glass substrate, on which ITO/Ag/ITO having a thickness of 70 Å/1,000 Å/70 Å was formed, to a size of 50 mm×50 mm×0.4 mm, ultrasonically cleaning the glass substrate by utilizing isopropyl alcohol and pure water for 10 minutes each, and then irradiating UV light for 10 minutes thereto and exposing to ozone to clean. Then, the anode was loaded into a vacuum deposition apparatus.

Compound HT28 was vacuum-deposited on the ITO anode of the glass substrate to form a hole injection layer having a thickness of 700 Å, and then, Compound NPB was vacuum-deposited on the hole injection layer to form a hole transport layer having a thickness of 500 Å. Subsequently, Compound E-221 was vacuum-deposited on the hole transport layer to form an emission auxiliary layer having a thickness of 700 Å, thereby forming a hole transport region.

Compound A-134 (as a host) and PD27 (as a dopant) were co-deposited on the hole transport region at a weight ratio of 100:3 to form an emission layer having a thickness of 400 Å.

ET1 and LiQ were deposited on the emission layer at a ratio of 1:1 to form an electron transport layer having a thickness of 360 Å. Then, Mg and Ag were vacuum-deposited on electron transport layer at a weight ratio of 9:1 to form a cathode having a thickness of 120 Å, thereby completing the manufacturing of an organic light-emitting device.

Examples 2 to 4 and Comparative Examples 1 to 3

Organic light-emitting devices were manufactured in substantially the same manner as in Example 1, except that compounds shown in Table 1 were utilized in the formation of the emission auxiliary layer and emission layer.

TABLE 1

| | Host | Material for forming emission auxiliary layer |
|---|---|---|
| Example 1 | A-134 | E-221 |
| Example 2 | A-213 | E-133 |
| Example 3 | A-134 | E-101 |
| Example 4 | A-213 | E-115 |
| Comparative Example 1 | A-134 | NPB |
| Comparative Example 2 | A-213 | NPB |
| Comparative Example 3 | A | B |

A

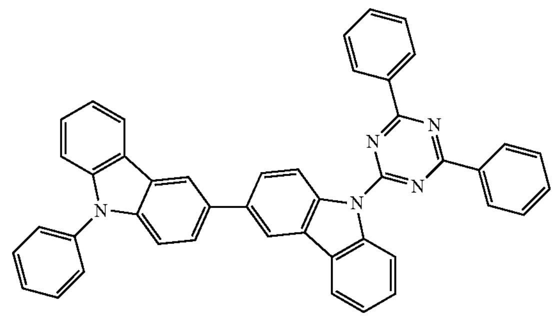

B

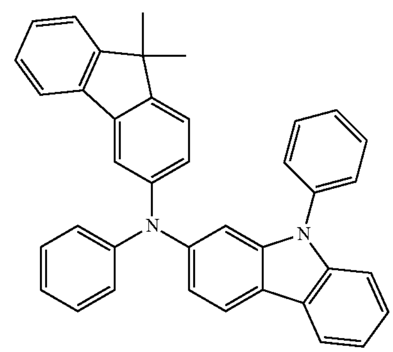

Example 5

An anode was preparing by cutting a glass substrate, on which ITO/Ag/ITO having a thickness of 70 Å/1,000 Å/70 Å was deposited, to a size of 50 mm×50 mm×0.4 mm, ultrasonically cleaning the glass substrate by utilizing isopropyl alcohol and pure water for 10 minutes each, and then irradiating UV light for 10 minutes thereto and exposing to ozone to clean. Then, the anode was loaded into a vacuum deposition apparatus.

Compound HT28 was vacuum-deposited on the ITO anode of the glass substrate to form a hole injection layer having a thickness of 700 Å, and then, Compound NPB was vacuum-deposited on the hole injection layer to form a hole transport layer having a thickness of 500 Å. Subsequently, Compound E-101 was vacuum-deposited on the hole transport layer to form an emission auxiliary layer having a thickness of 350 Å, thereby forming a hole transport region.

Compound A-115 (as a host) and PD26 (as a dopant) were co-deposited on the hole transport region at a weight ratio of 100:10 to form an emission layer having a thickness of 400 Å.

ET1 and LiQ were deposited on the emission layer at a ratio of 1:1 to form an electron transport layer having a thickness of 360 Å. Then, Mg and Ag were vacuum-deposited on the electron transport layer at a weight ratio of 9:1 to form a cathode having a thickness of 120 Å, thereby completing the manufacture of an organic light-emitting device.

Examples 6 to 16 and Comparative Examples 4 to 8

Organic light-emitting devices were manufactured in substantially the same manner as in Example 5, except that compounds shown in Table 2 were utilized in the formation of the emission auxiliary layer and emission layer.

TABLE 2

| | Host | Material for forming emission auxiliary layer |
|---|---|---|
| Example 5 | A-115 | E-101 |
| Example 6 | A-149 | E-133 |
| Example 7 | A-153 | E-101 |
| Example 8 | A-187 | E-133 |
| Example 9 | A-115 | E-133 |
| Example 10 | A-149 | E-101 |
| Example 11 | A-153 | E-133 |
| Example 12 | A-187 | E-101 |
| Example 13 | A-115 | E-105 |
| Example 14 | A-149 | E-205 |
| Example 15 | A-153 | E-154 |
| Example 16 | A-187 | E-107 |
| Comparative Example 4 | A-115 | NPB |
| Comparative Example 5 | A-149 | NPB |
| Comparative Example 6 | A-153 | NPB |
| Comparative Example 7 | A-187 | NPB |
| Comparative Example 8 | A | B |

A

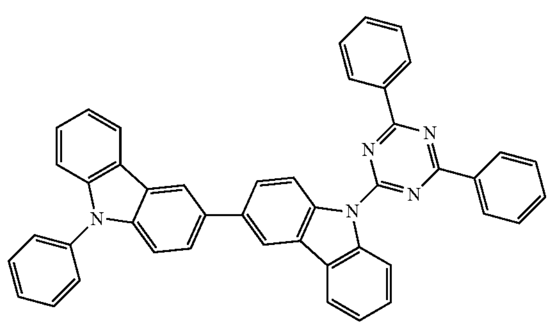

B

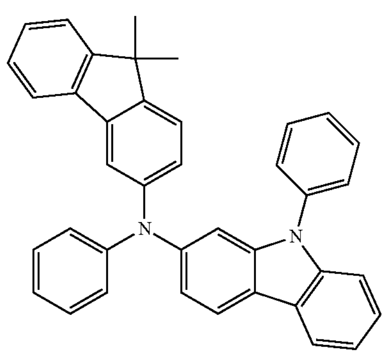

Evaluation Example

The driving voltage, current density, efficiency, and lifespan of the organic light-emitting devices manufactured in Examples 1 to 16 and Comparative Examples 1 to 8 were evaluated utilizing a Keithley 236 source-measure unit (SMU) and a PR650 luminance meter. Here, the lifespan results were obtained by measuring the time at which the luminance of an organic light-emitting device was 97% of the initial luminance. The results are shown in Tables 3 and 4.

TABLE 3

| | Host | Material for forming emission auxiliary layer | Driving voltage (V) | Current density ($mA/cm^2$) | Efficiency (cd/A) | Lifespan (hours) |
|---|---|---|---|---|---|---|
| Example 1 | A-134 | E-221 | 4.0 | 10.0 | 38.4 | 453 |
| Example 2 | A-213 | E-133 | 4.2 | 10.0 | 39.3 | 462 |
| Example 3 | A-134 | E-101 | 4.1 | 10.0 | 38.6 | 442 |
| Example 4 | A-213 | E-115 | 4.3 | 10.0 | 39.5 | 455 |
| Comparative Example 1 | A-134 | NPB | 4.0 | 10.0 | 28.2 | 273 |
| Comparative Example 2 | A-213 | NPB | 4.1 | 10.0 | 29.3 | 297 |
| Comparative Example 3 | A | B | 4.0 | 10.0 | 36.8 | 340 |

TABLE 4

| | Host | Material for forming emission auxiliary layer | Driving voltage (V) | Current density ($mA/cm^2$) | Efficiency (cd/A) | Lifespan (hours) |
|---|---|---|---|---|---|---|
| Example 5 | A-115 | E-101 | 4.0 | 10.0 | 95.0 | 124 |
| Example 6 | A-149 | E-133 | 4.2 | 10.0 | 94.2 | 131 |
| Example 7 | A-153 | E-101 | 4.2 | 10.0 | 96.1 | 138 |
| Example 8 | A-187 | E-133 | 4.2 | 10.0 | 94.6 | 118 |
| Example 9 | A-115 | E-133 | 4.1 | 10.0 | 95.2 | 125 |
| Example 10 | A-149 | E-101 | 4.3 | 10.0 | 94.0 | 130 |
| Example 11 | A-153 | E-133 | 4.2 | 10.0 | 95.3 | 126 |
| Example 12 | A-187 | E-101 | 4.3 | 10.0 | 94.5 | 137 |
| Example 13 | A-115 | E-105 | 4.1 | 10.0 | 96.2 | 136 |
| Example 14 | A-149 | E-205 | 4.3 | 10.0 | 95.5 | 120 |
| Example 15 | A-153 | E-154 | 4.3 | 10.0 | 94.4 | 116 |
| Example 16 | A-187 | E-107 | 4.3 | 10.0 | 94.8 | 128 |
| Comparative Example 4 | A-115 | NPB | 4.1 | 10.0 | 74.5 | 74 |
| Comparative Example 5 | A-149 | NPB | 4.1 | 10.0 | 76.1 | 72 |
| Comparative Example 6 | A-153 | NPB | 4.2 | 10.0 | 77.5 | 83 |
| Comparative Example 7 | A-187 | NPB | 4.3 | 10.0 | 75.8 | 85 |
| Comparative Example 8 | A | B | 4.0 | 10.0 | 88.3 | 97 |

Referring to the results of Tables 3 and 4, it was confirmed that the organic light-emitting devices manufactured in Examples 1 to 16 exhibited excellent efficiency and lifespan, as compared with the organic light-emitting devices manufactured in Comparative Examples 1 to 8.

As described above, an organic light-emitting device according to one or more embodiment may have high efficiency and long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting device comprising:

a first electrode;

a second electrode; and an organic layer between the first electrode and the second electrode, the organic layer comprising an emission layer and a hole transport region between the emission layer and the first electrode, wherein the emission layer consists of one host and one or more dopants, the one host consisting of a first compound selected from Compounds A-101 to A-221 and B-101 to B-230, the hole transport region comprises an emission auxiliary layer on the emission layer, a hole transport layer directly on the emission auxiliary layer, and a hole injection layer on the hole transport layer, the emission auxiliary layer comprises a second compound selected from Compounds E-104 to E-113, E-115, E-118, E-120, E-122 to E-128, E-130, E-135, E-137 to E-157, E-159 to E-168, and E-259 to E-270:

A-101

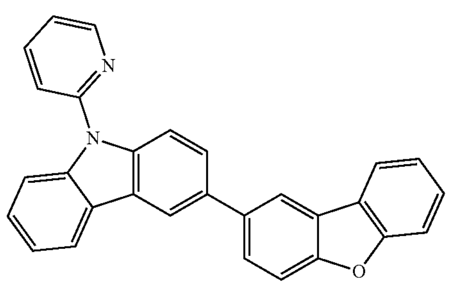

A-102

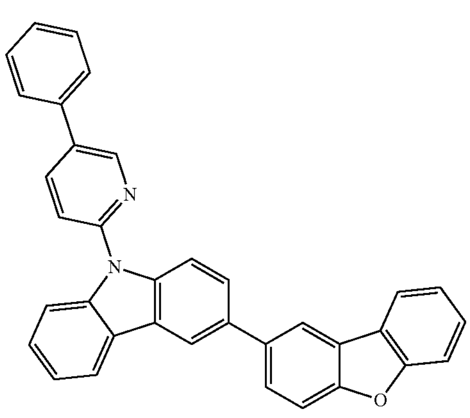

-continued

A-103

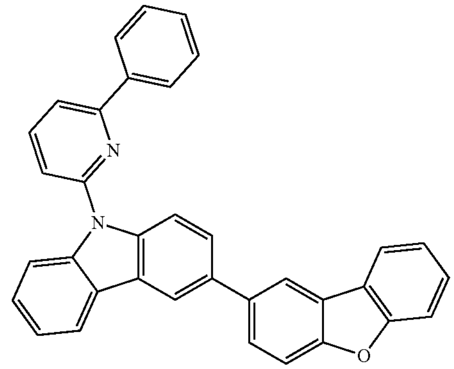

A-104

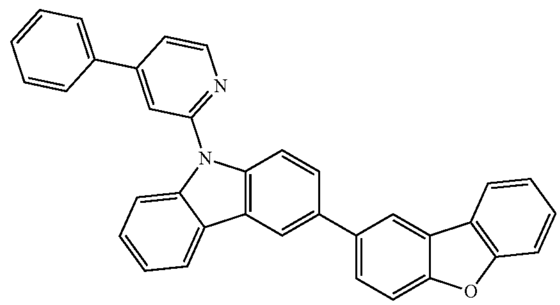

A-105

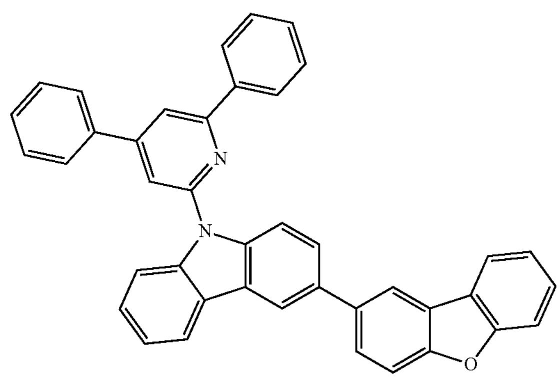

A-106

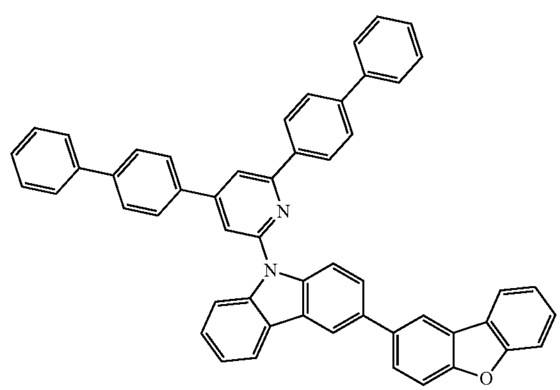

-continued
A-107
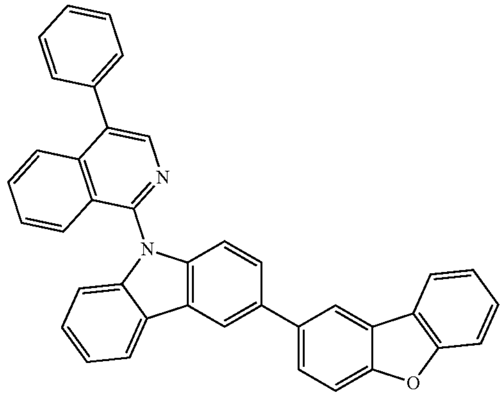
A-108
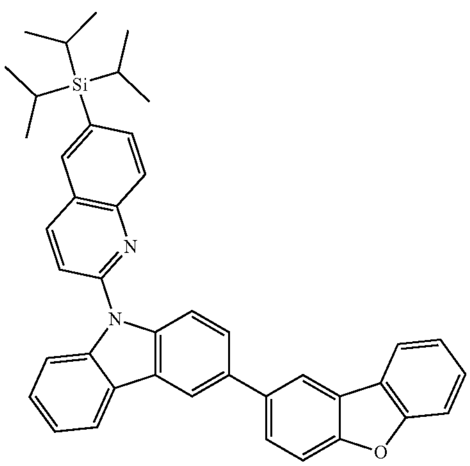
A-109
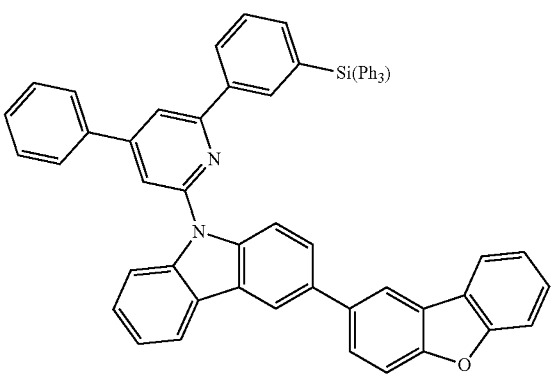
A-110
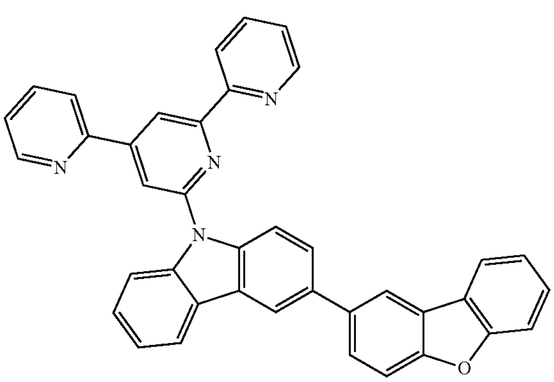
-continued
A-111
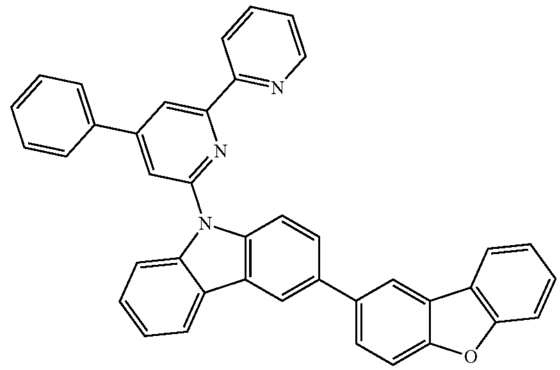
A-112
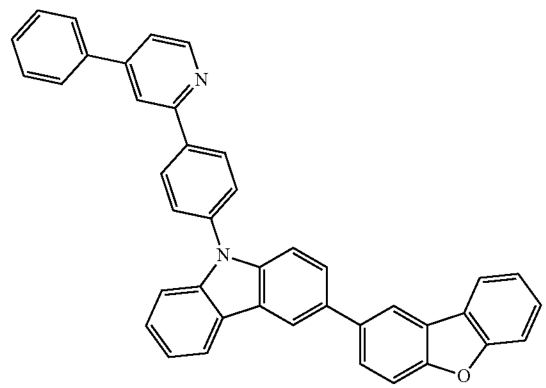
A-113
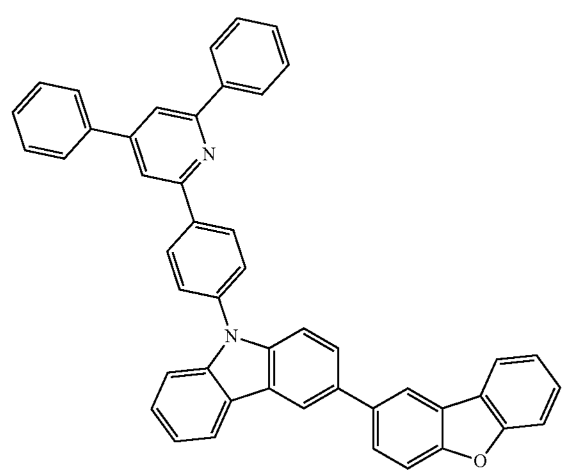

-continued
A-114
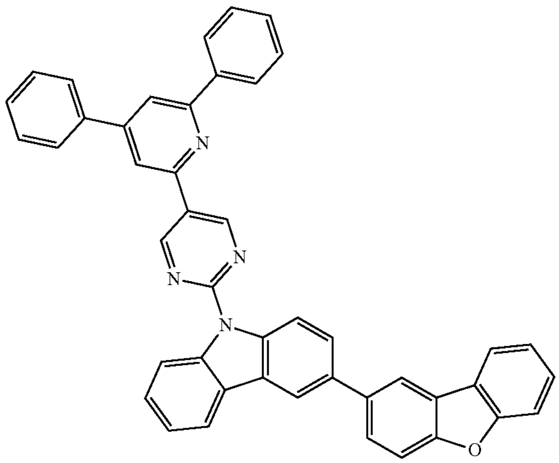
A-115
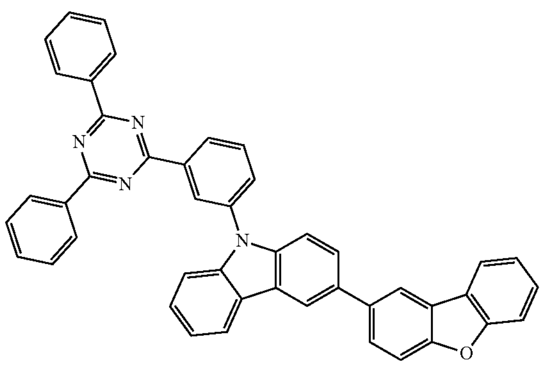
A-116
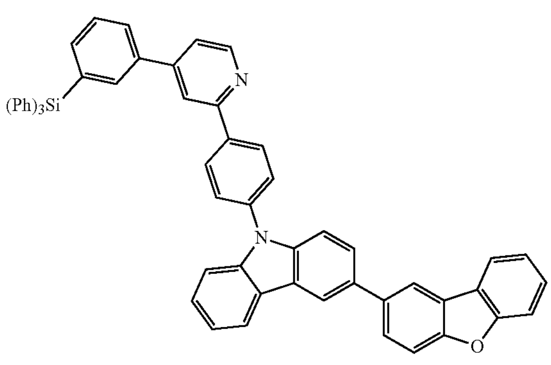
-continued
A-117
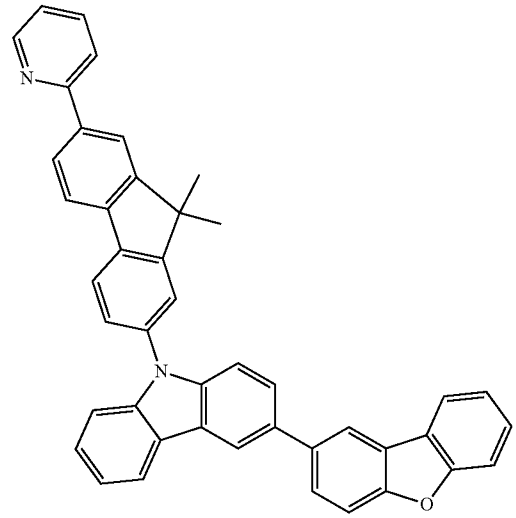
A-118
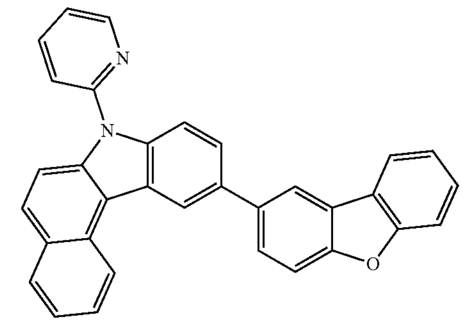
A-119
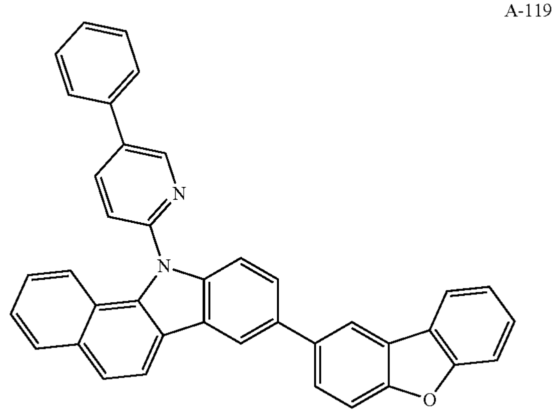
A-120
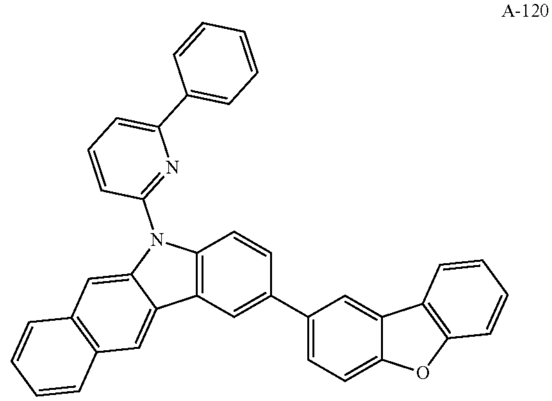

A-121
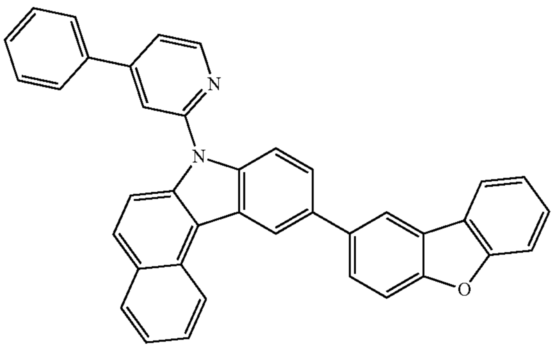
A-122
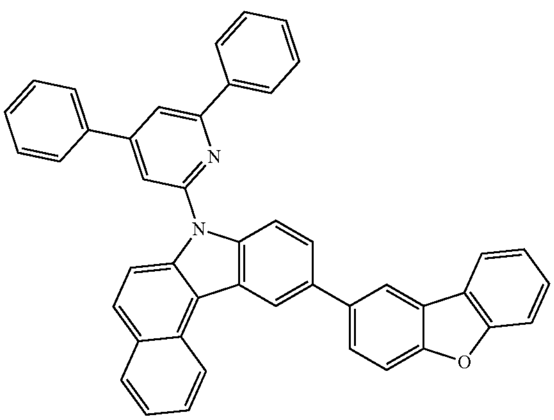
A-123
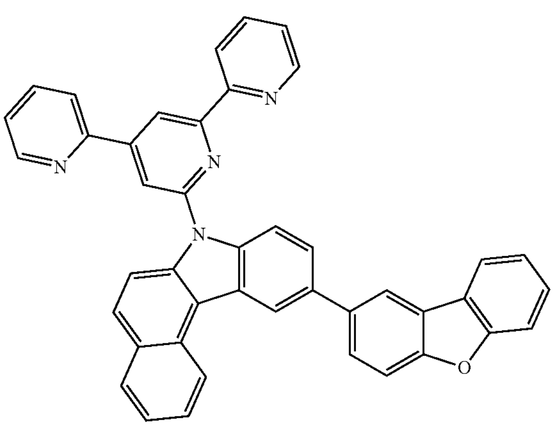
A-124
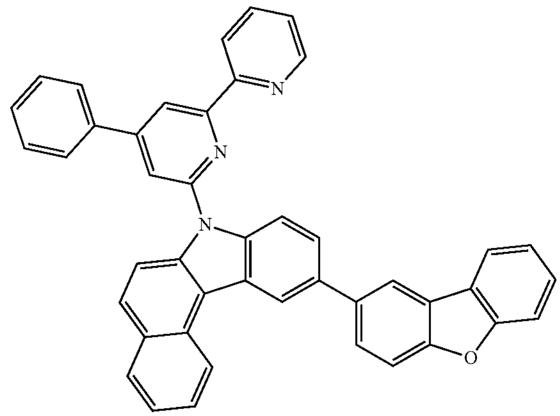
A-125
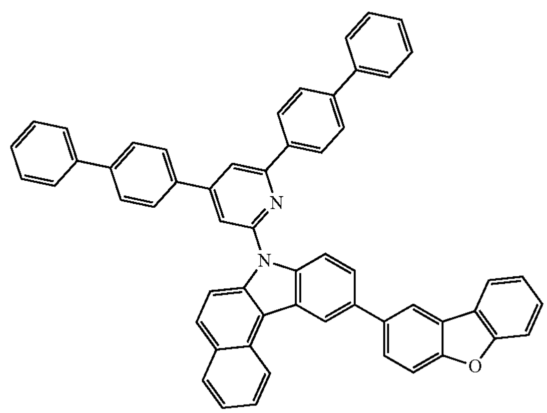
A-126
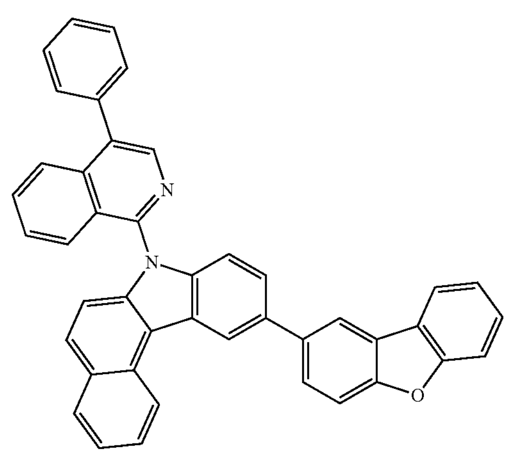

-continued
A-127
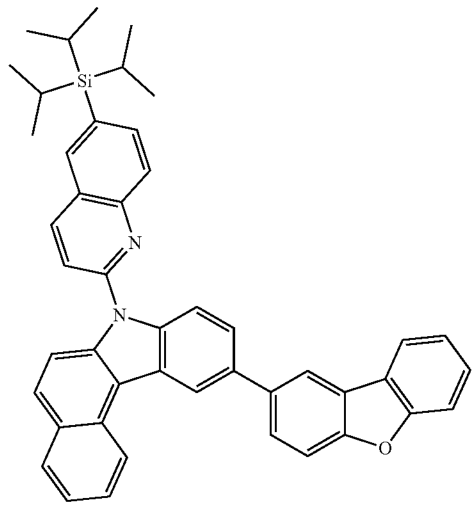
A-128
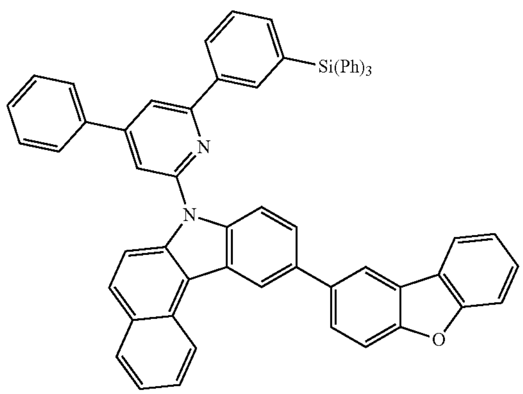
A-129
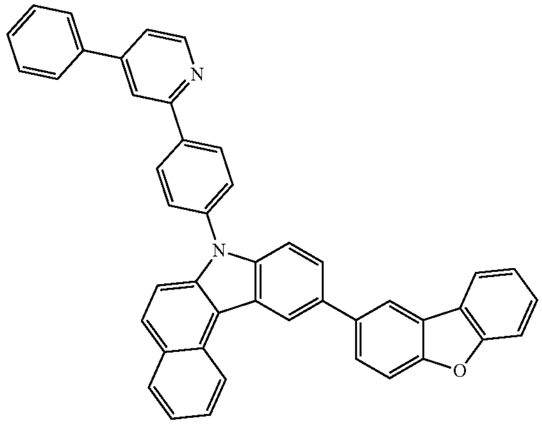
-continued
A-130
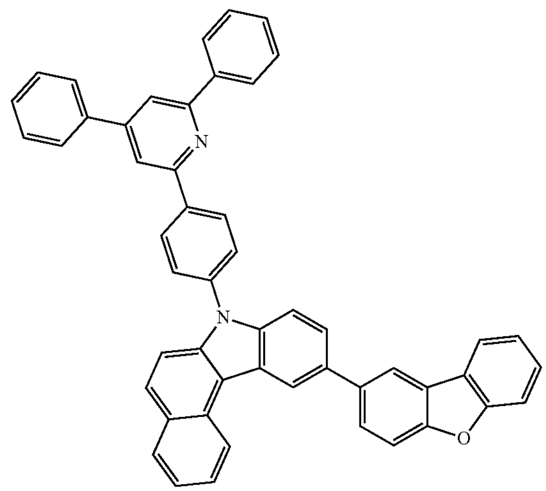
A-131
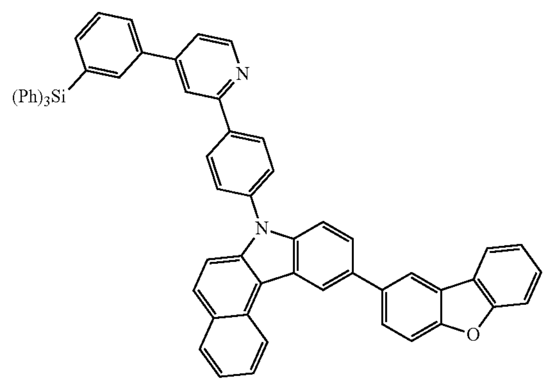
A-132
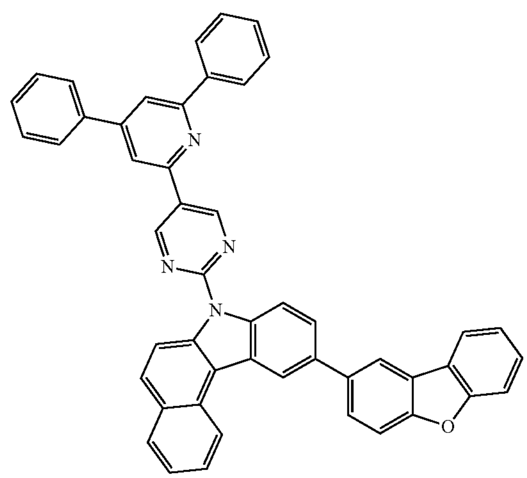

-continued
A-133
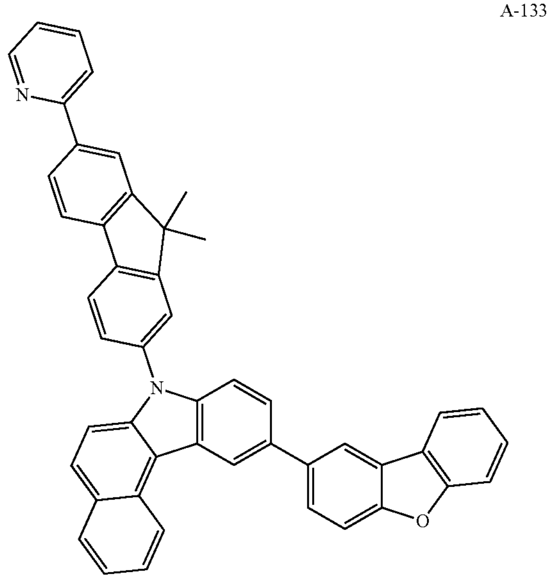
A-134
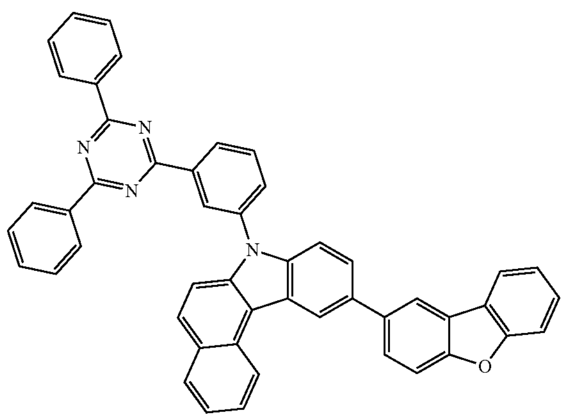
A-135
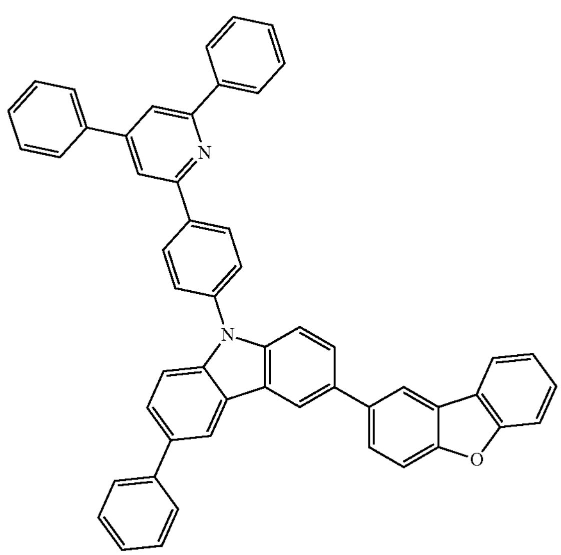
-continued
A-136
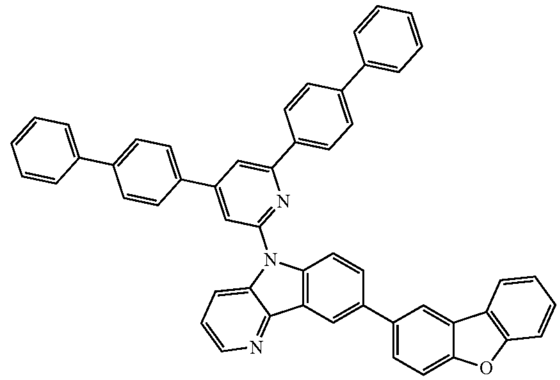
A-137
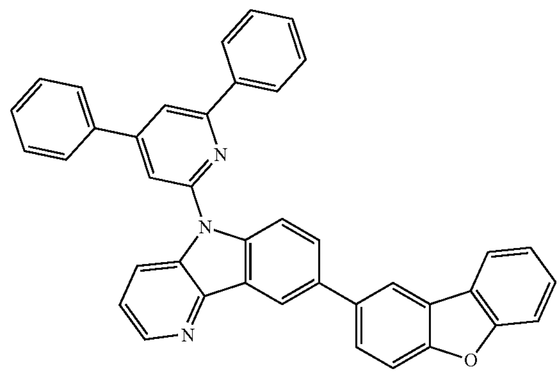
A-138
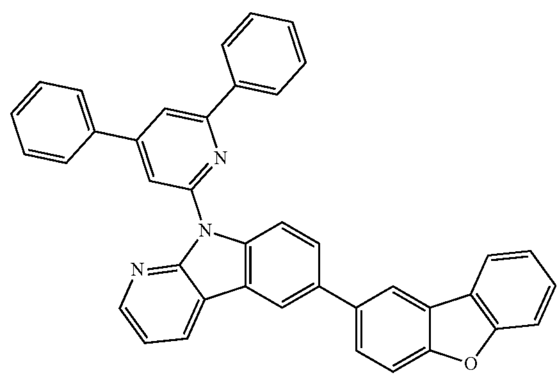
A-139
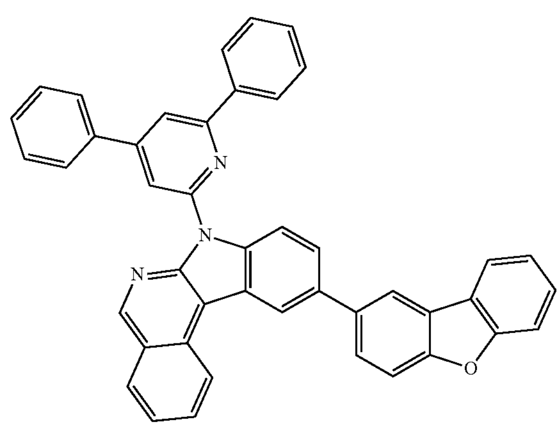

-continued
A-140
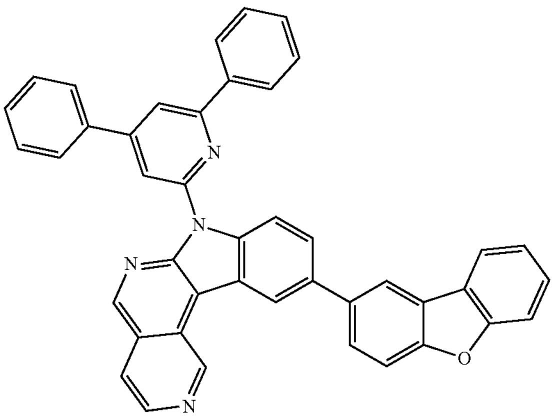
A-141
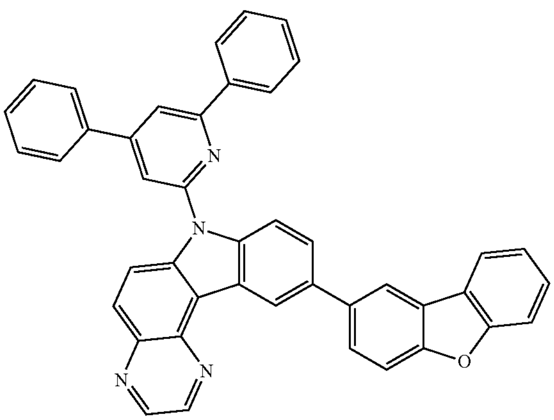
A-142
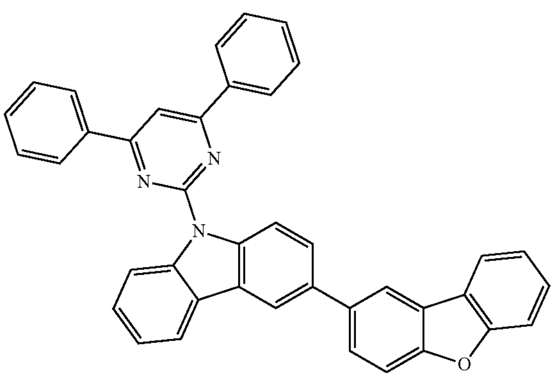
A-143
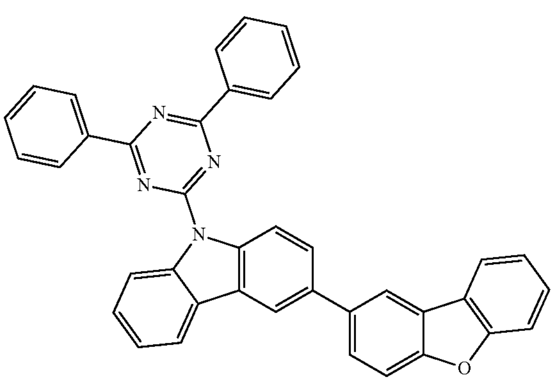
-continued
A-144
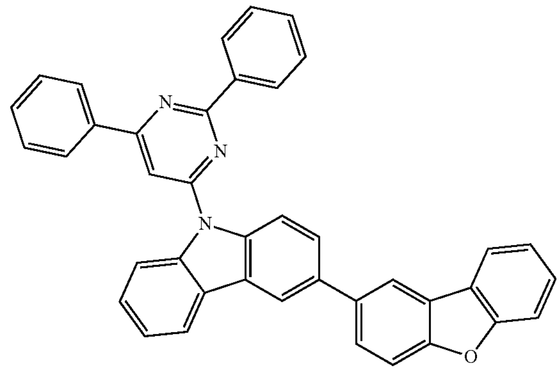
A-145
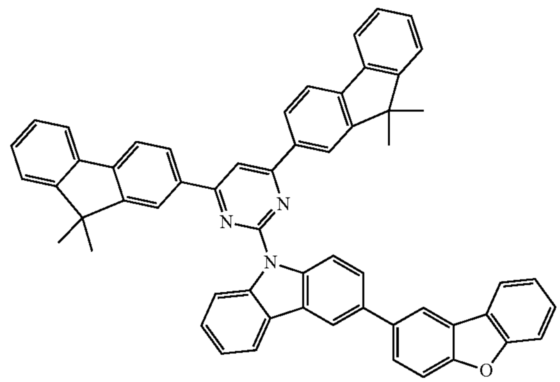
A-146
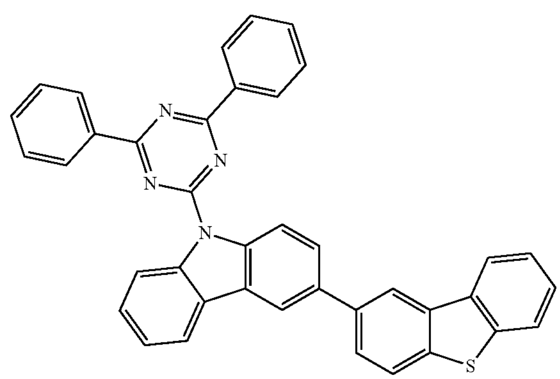
A-147
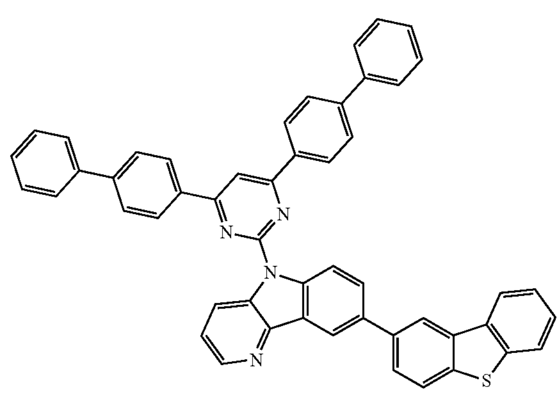

-continued
A-148
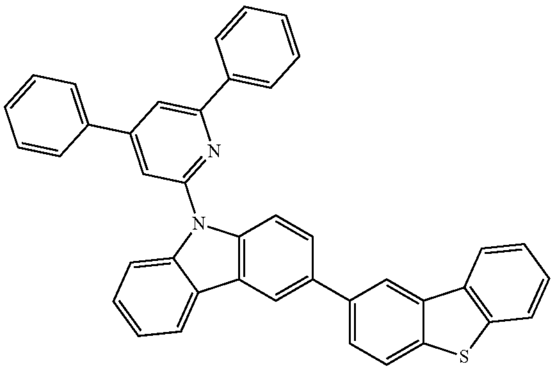
A-149
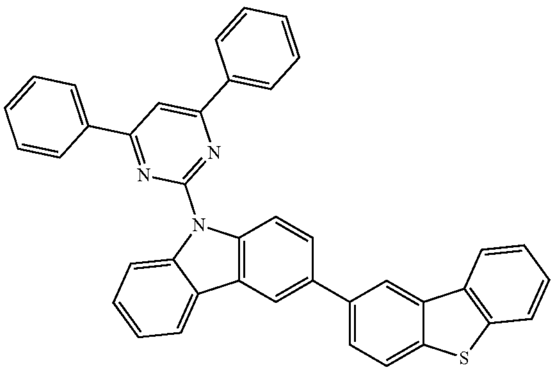
A-150
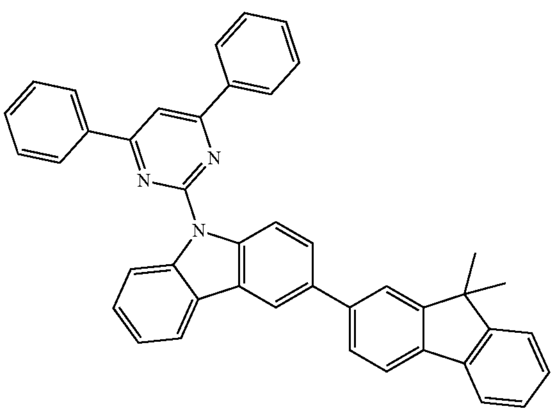
A-151
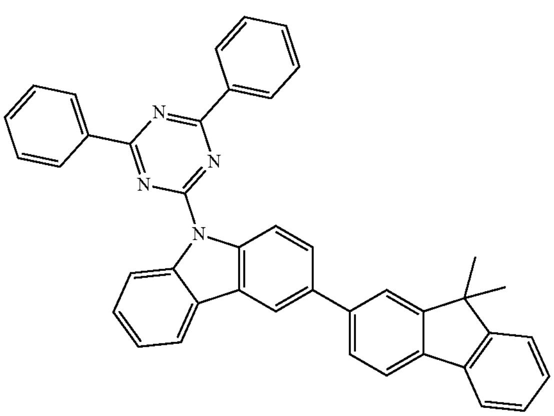
-continued
A-152
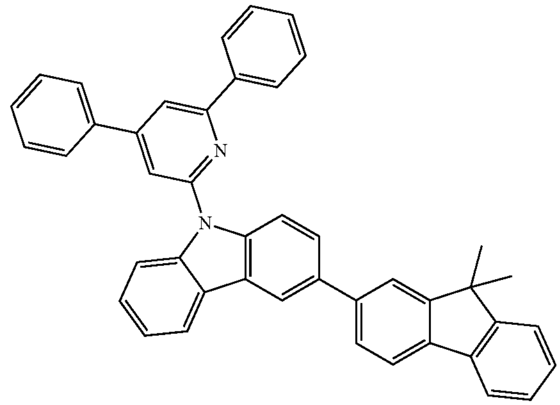
A-153
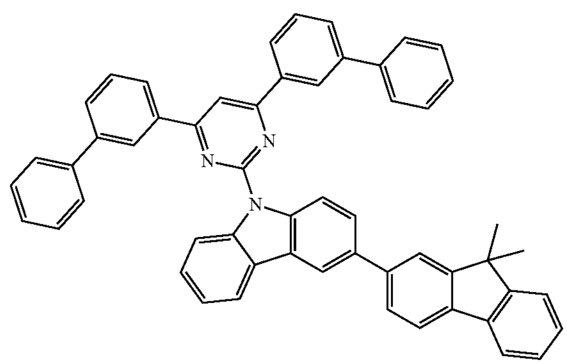
A-154
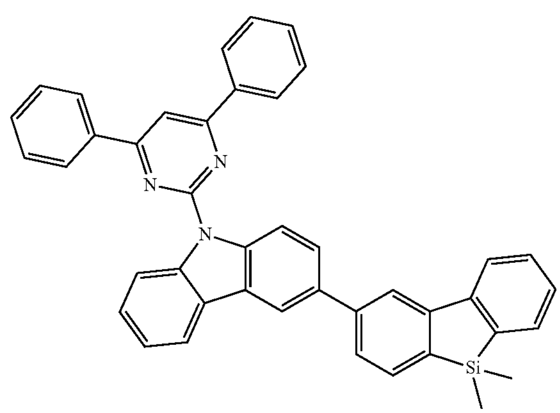

-continued
A-155
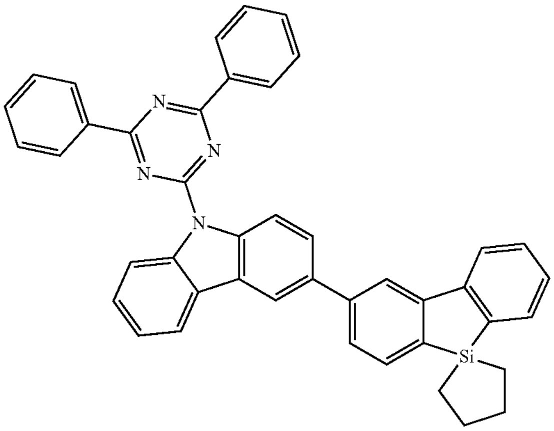
A-156
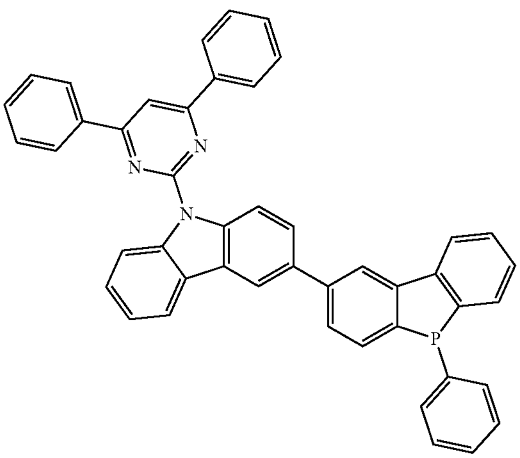
A-157
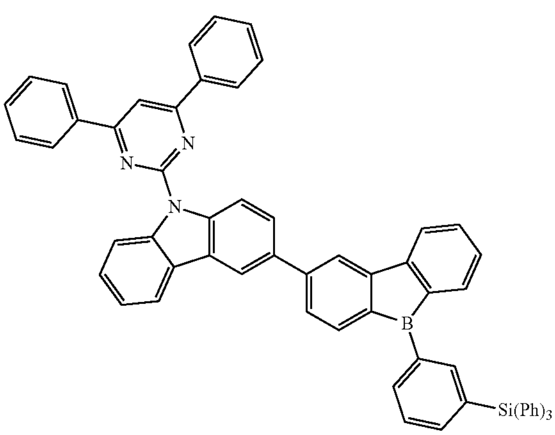
-continued
A-158
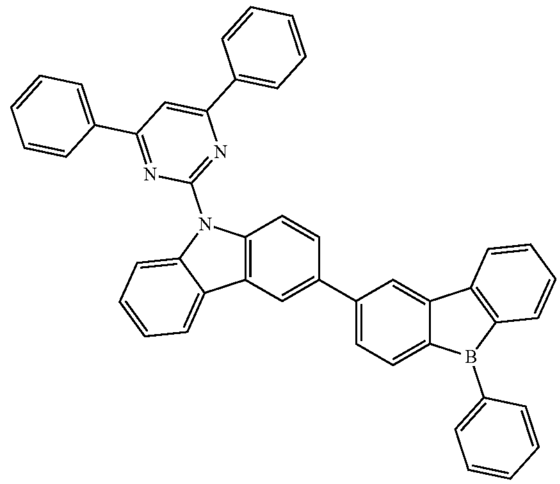
A-159
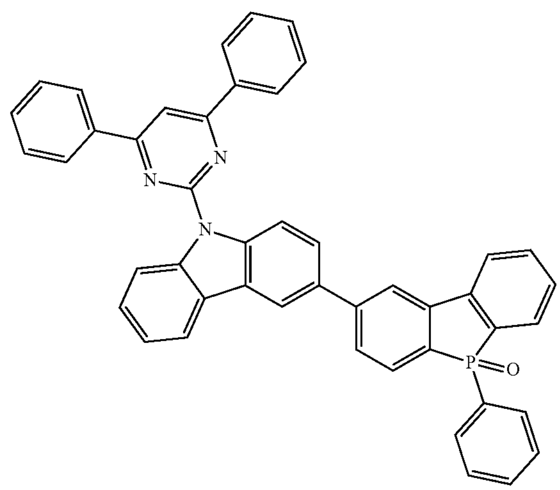
A-160
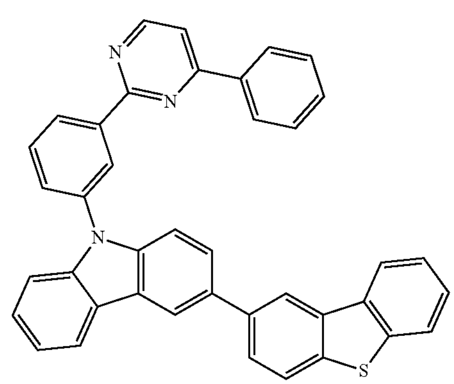

-continued
A-161
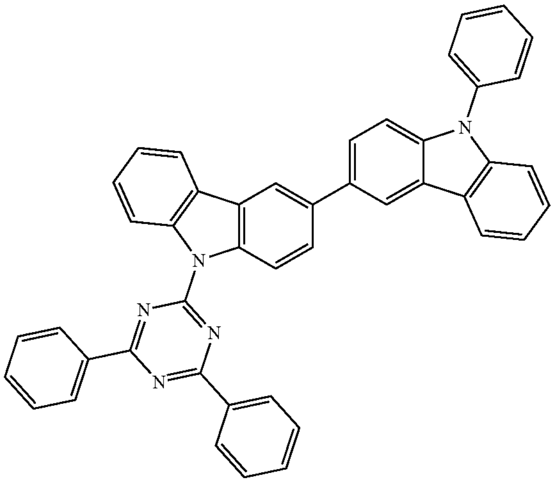
A-162
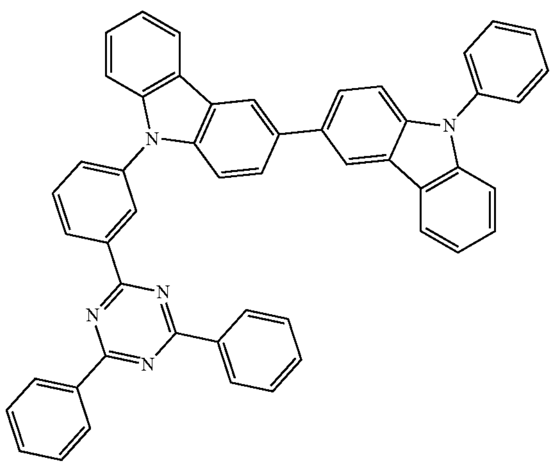
A-163
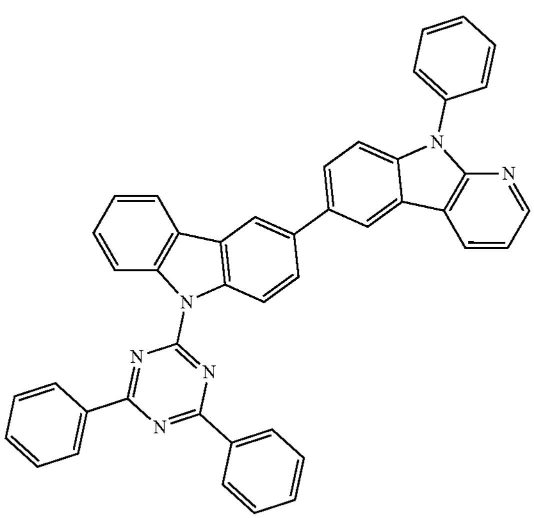
-continued
A-164
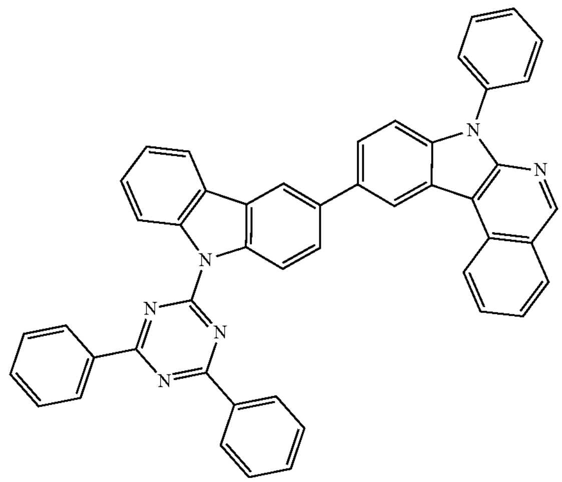
A-165
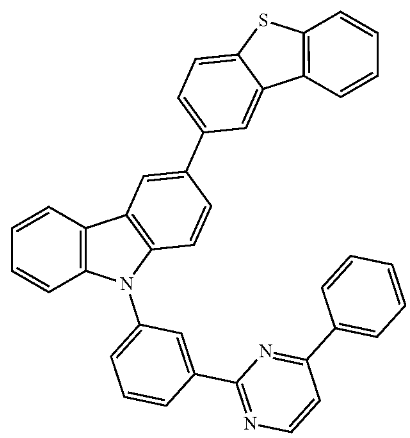
A-166
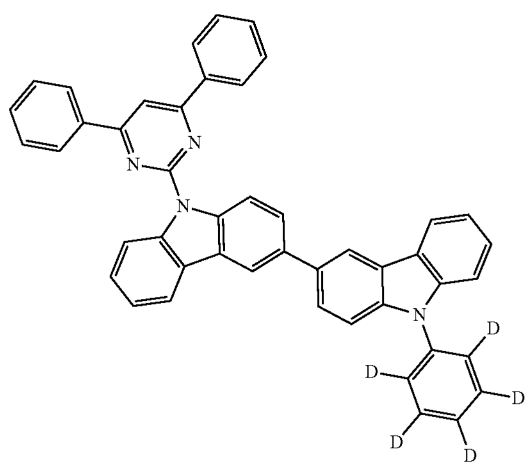

-continued
A-167
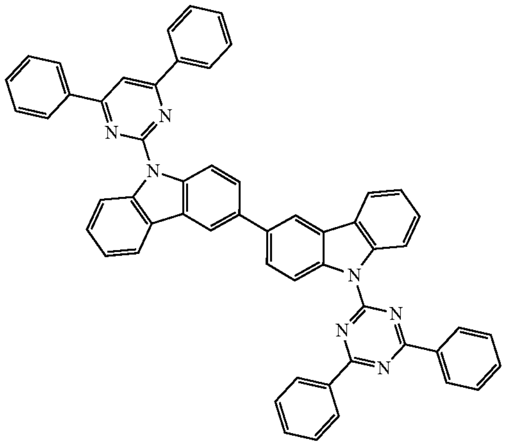
A-168
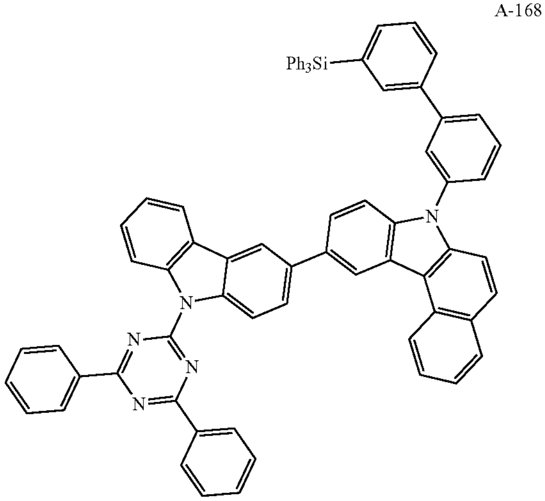
A-169
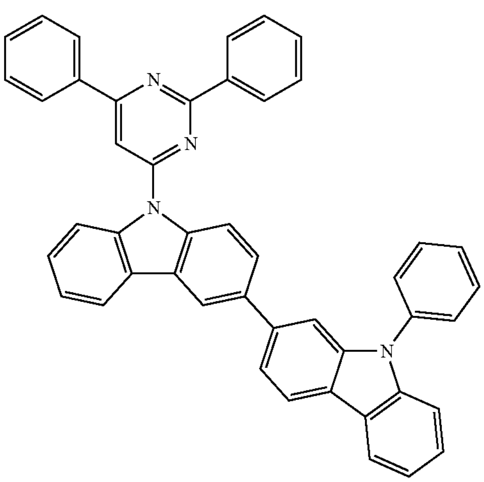
-continued
A-170
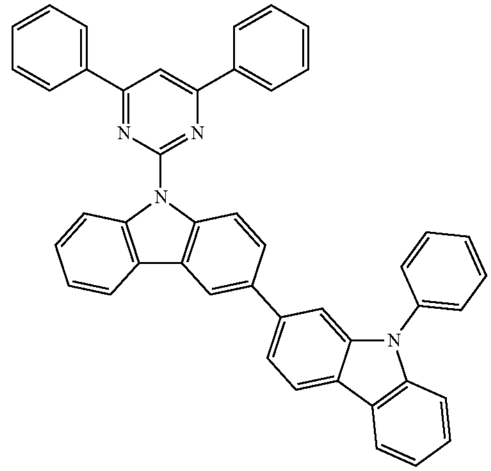
A-171
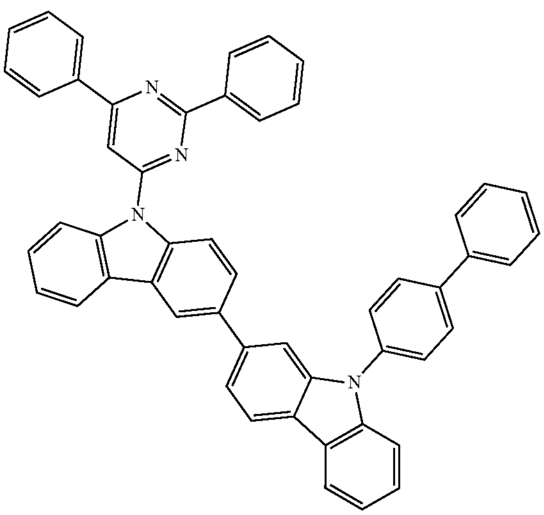
A-172
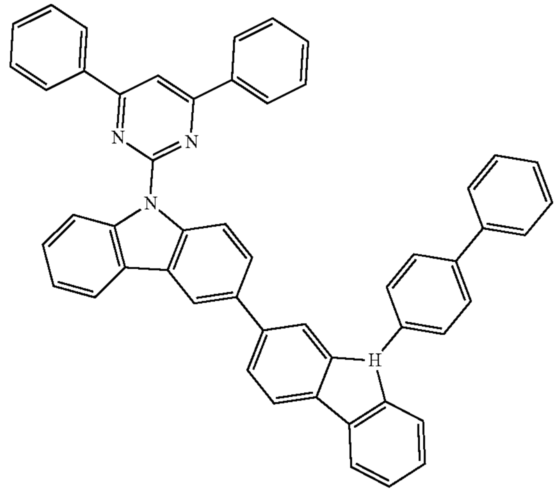

-continued
A-173
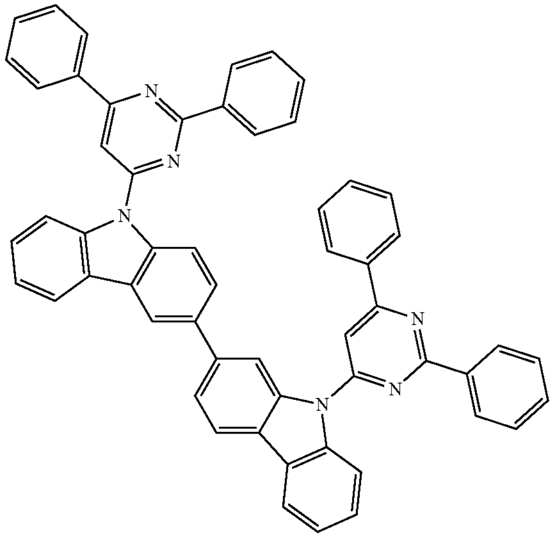
A-174
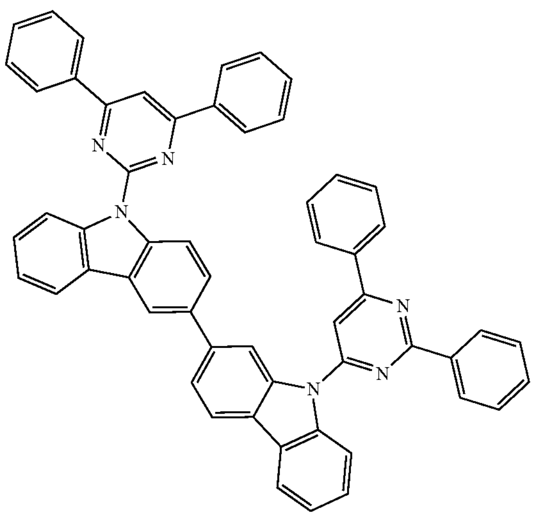
A-175
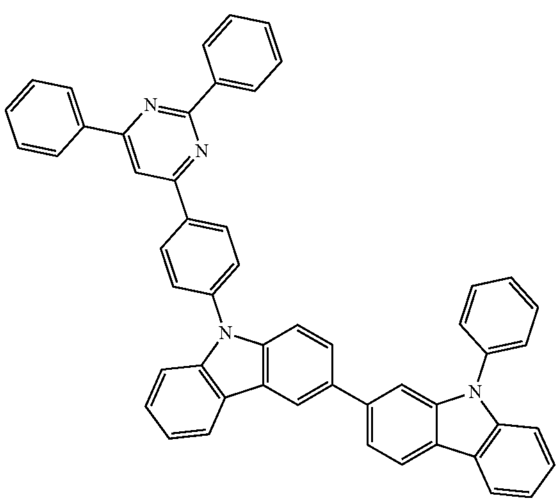
-continued
A-176
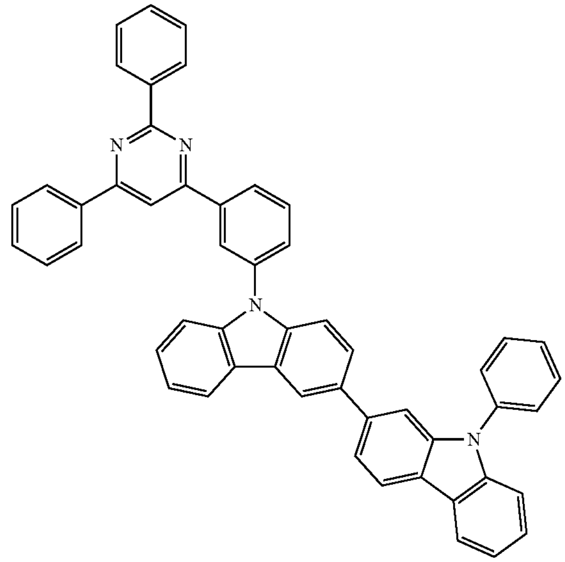
A-177
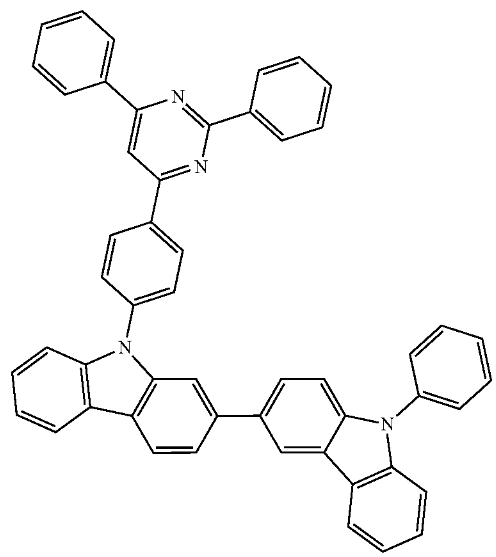
A-178
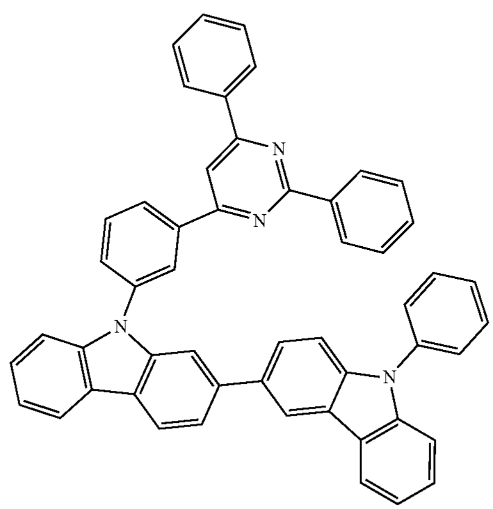

-continued
A-179
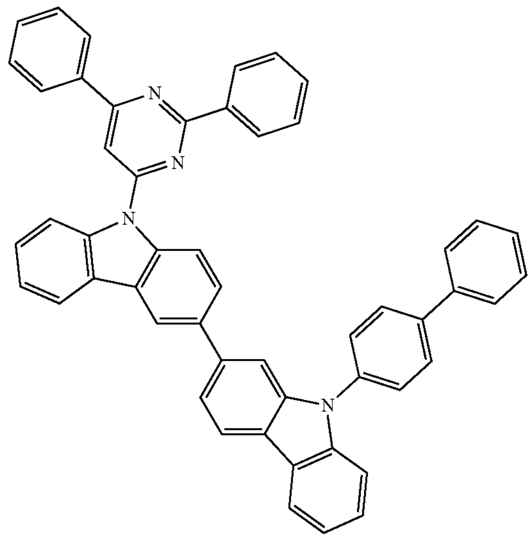
A-180
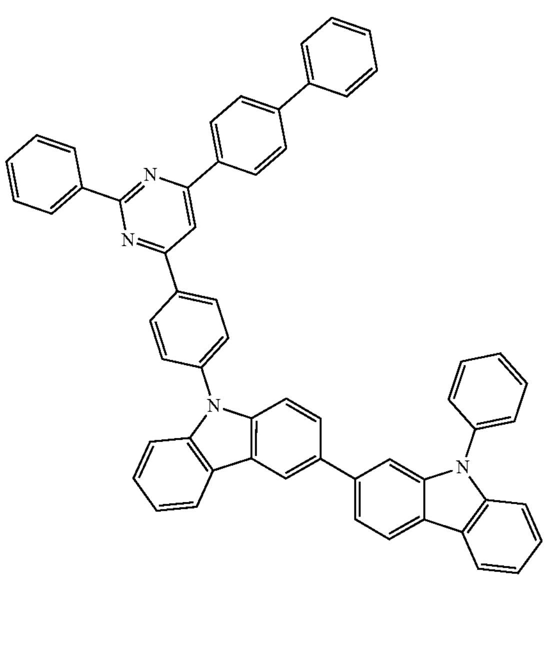
-continued
A-181
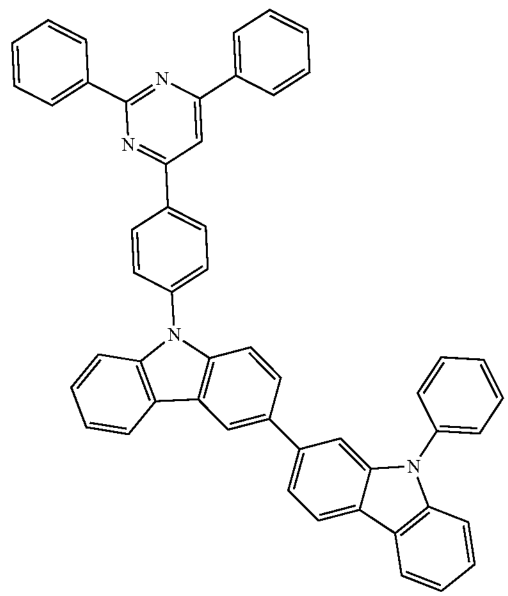
A-182
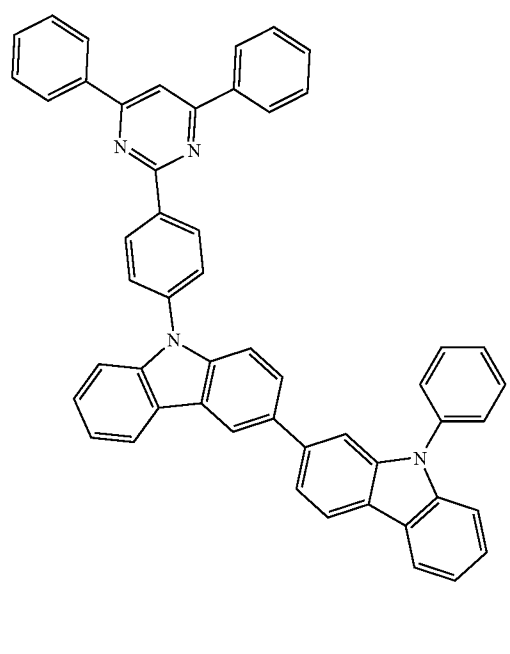

A-183
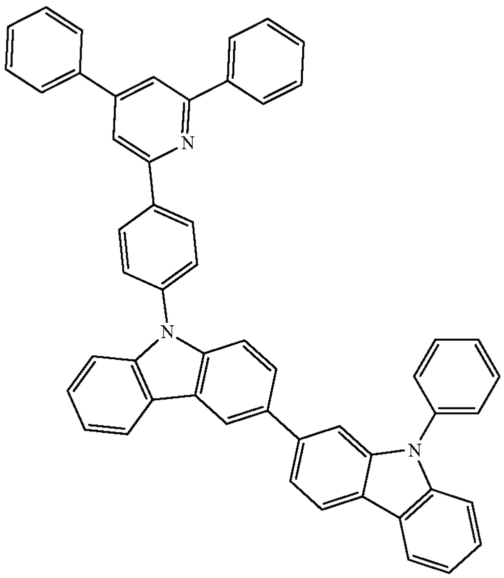
A-184
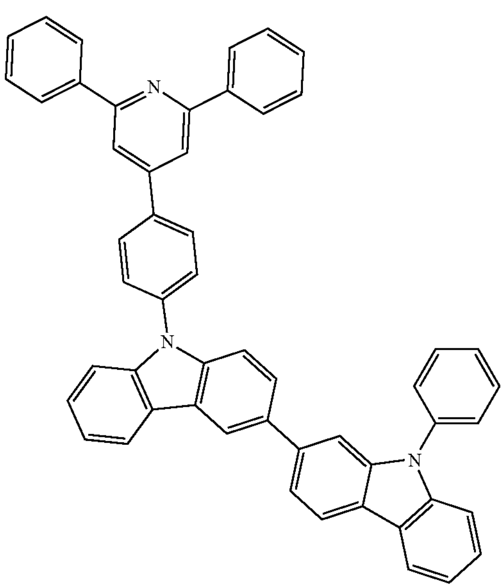
A-185
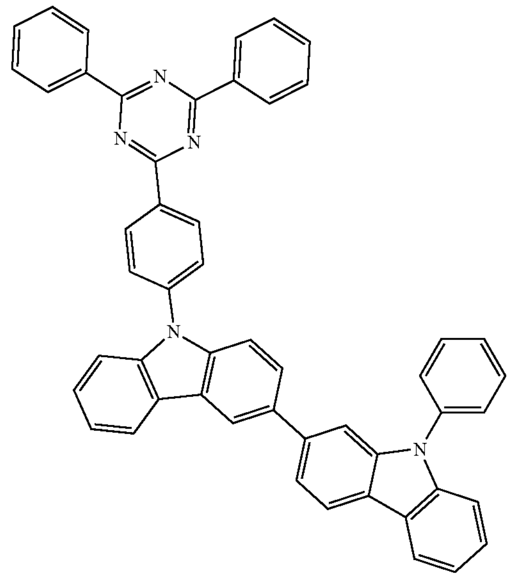
A-186
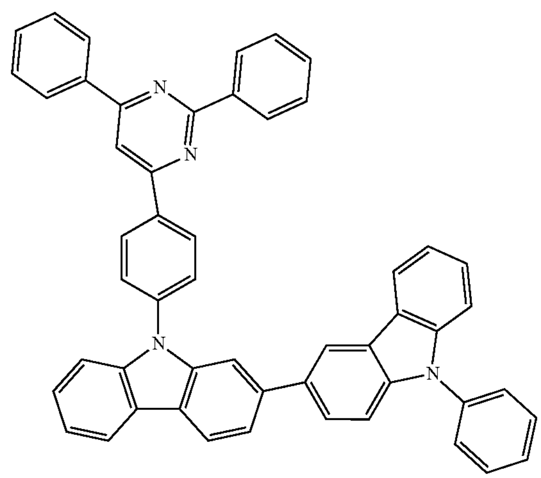
A-187
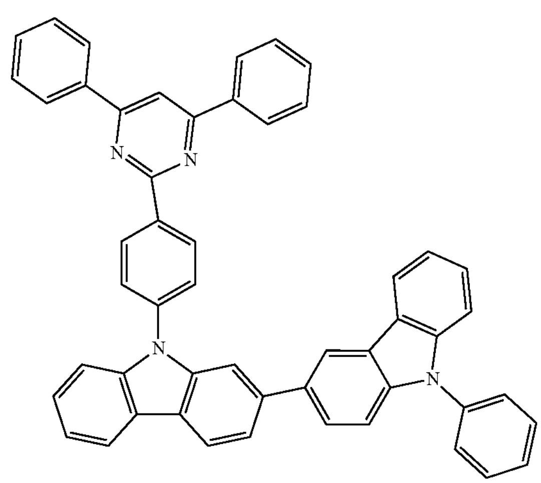

-continued
A-188
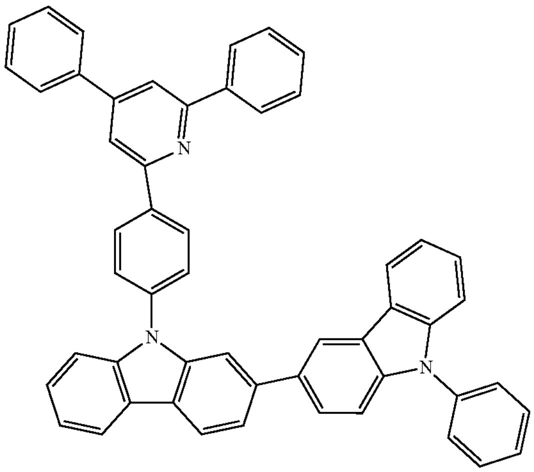
A-189
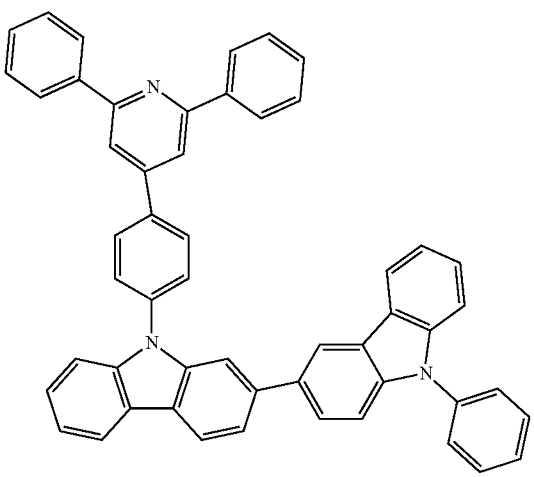
A-190
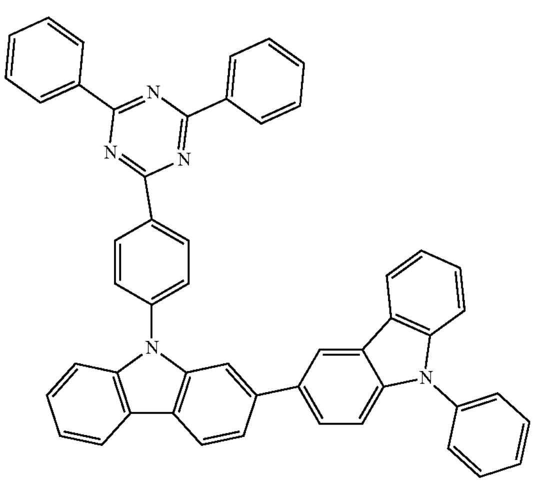
-continued
A-191
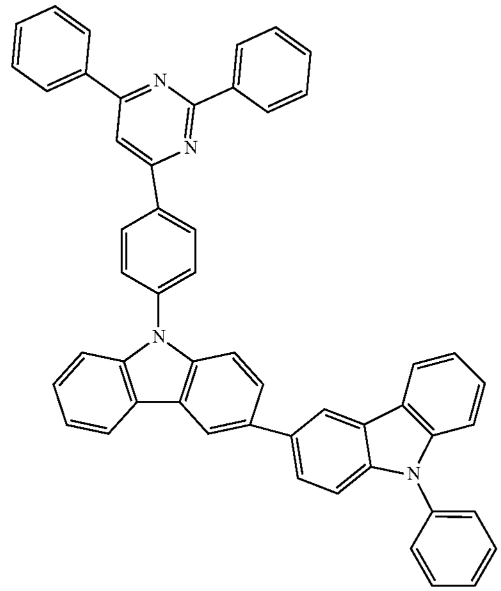
A-192
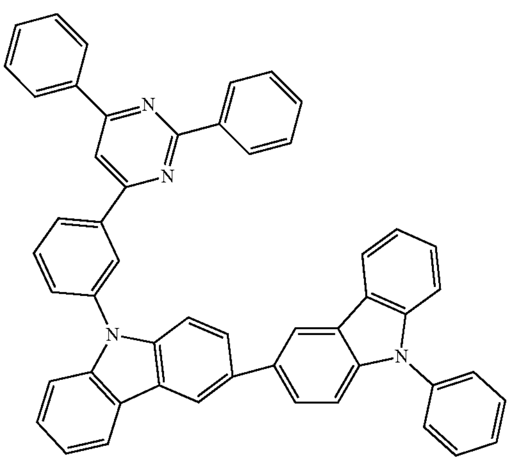
A-193
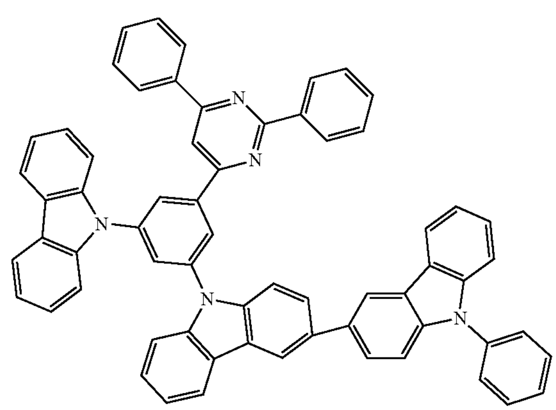

-continued
A-194
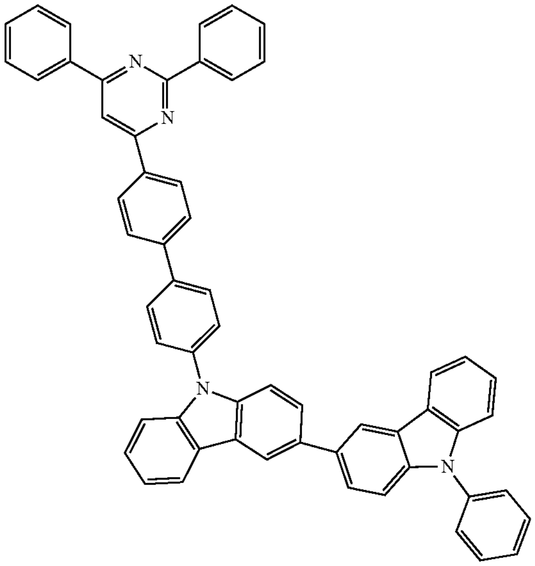
A-195
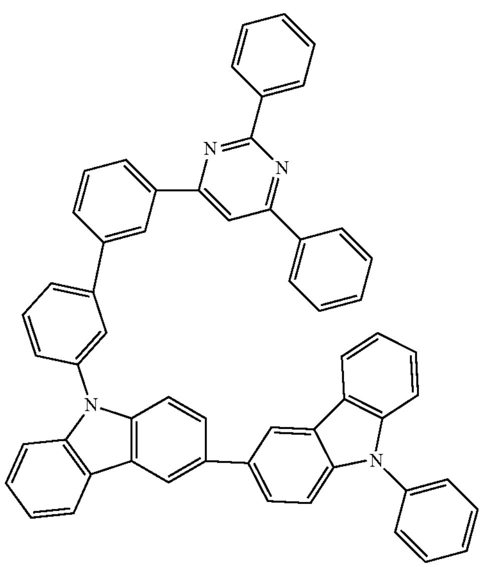
-continued
A-196
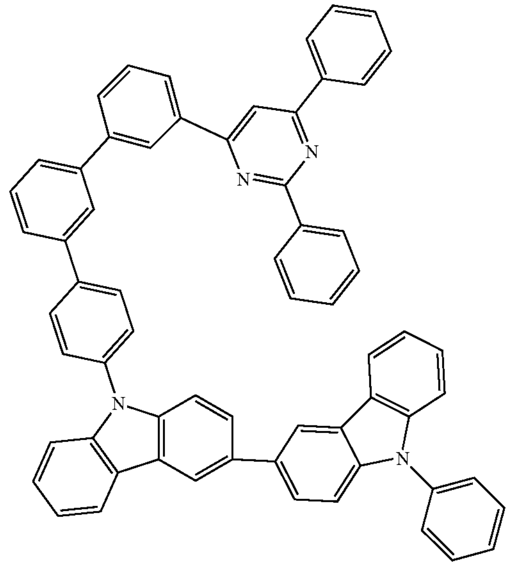
A-197
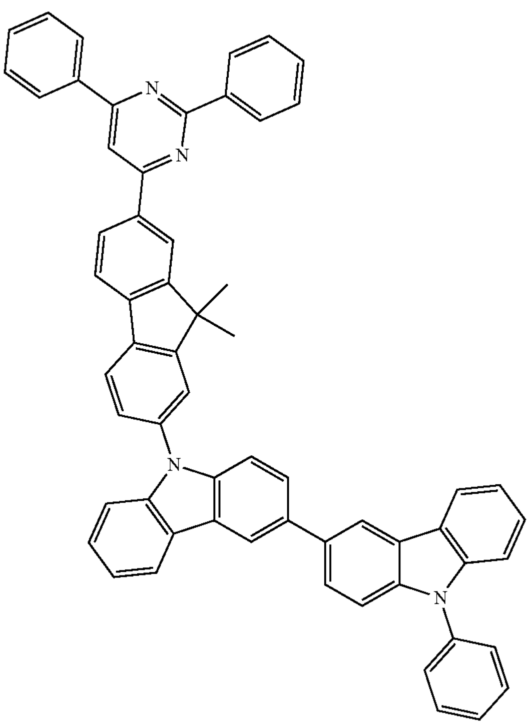

-continued
A-198
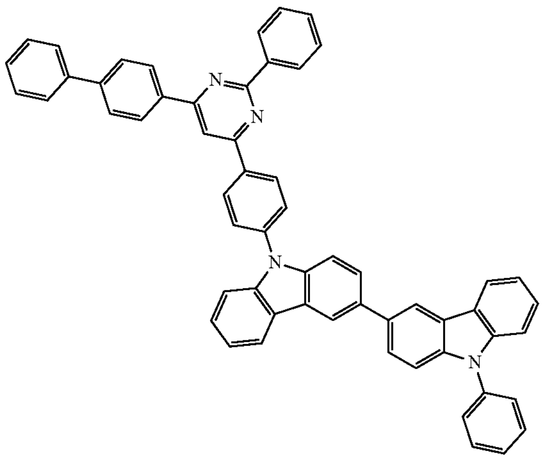
A-199
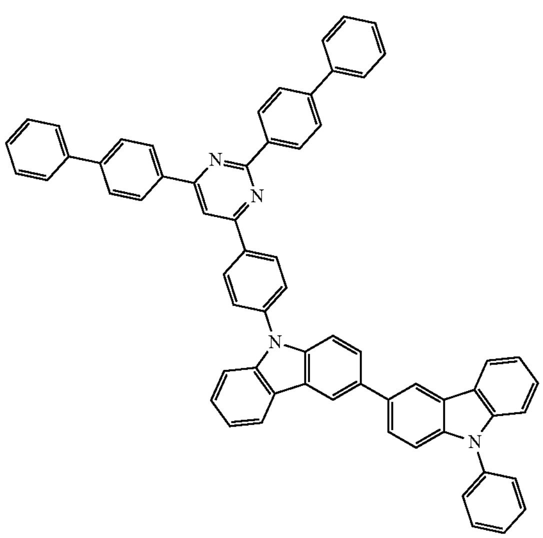
-continued
A-200
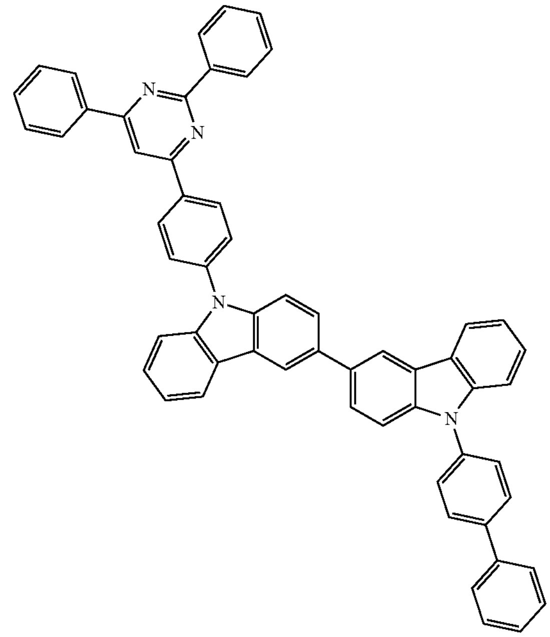
A-201
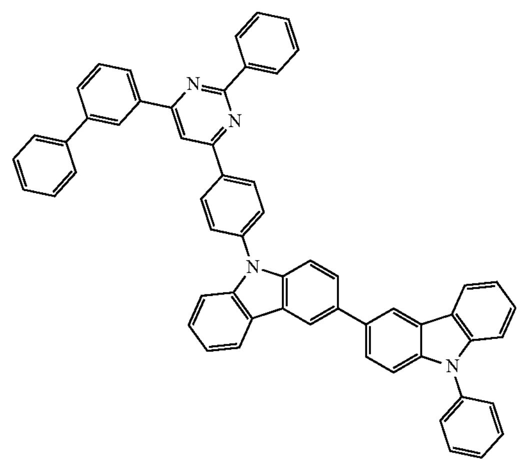
A-202
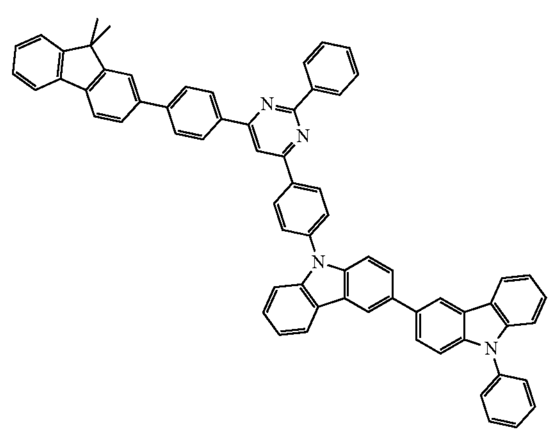

-continued
A-203
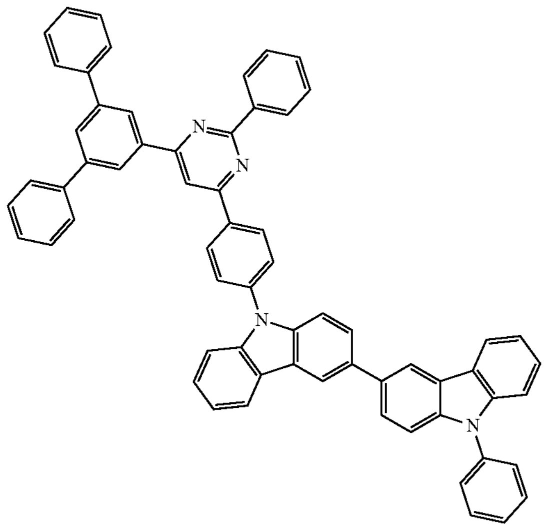
A-204
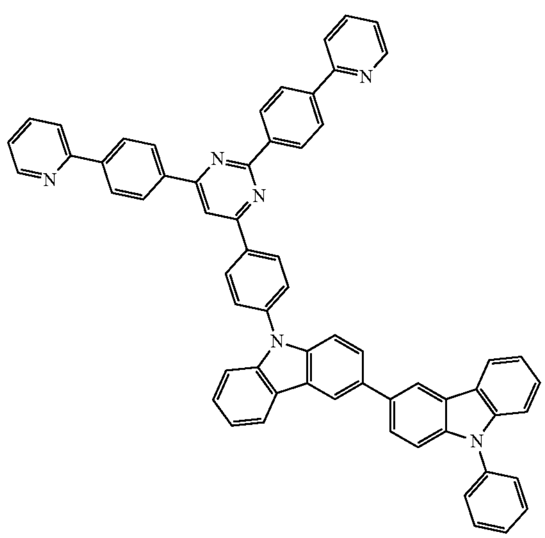
A-205
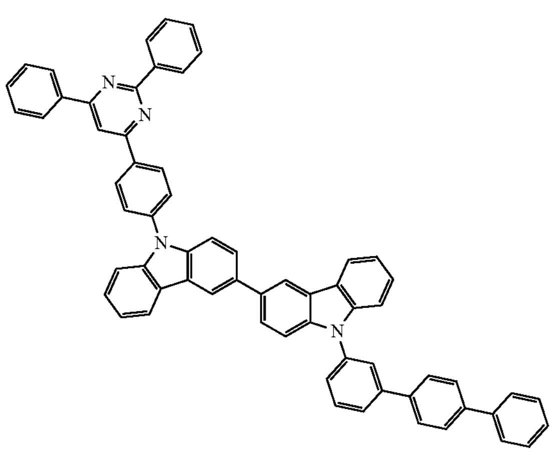
-continued
A-206
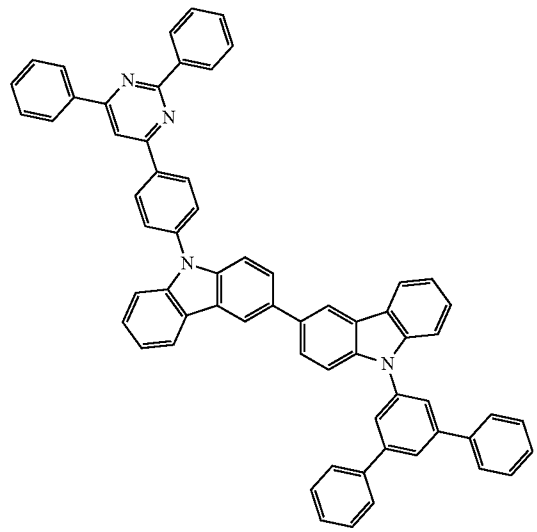
A-207
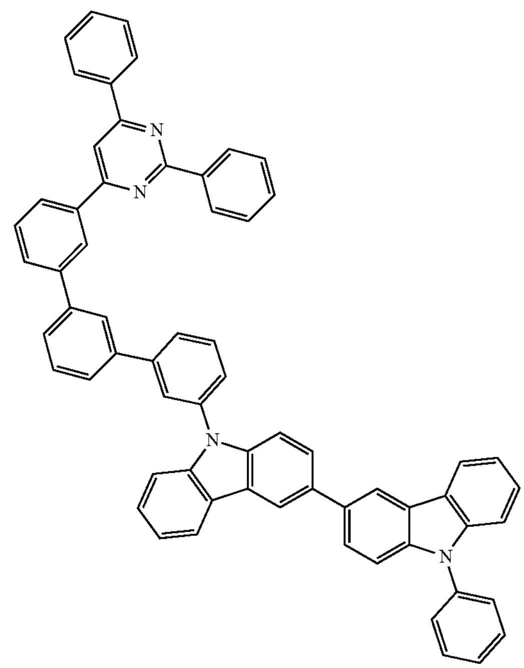
A-208
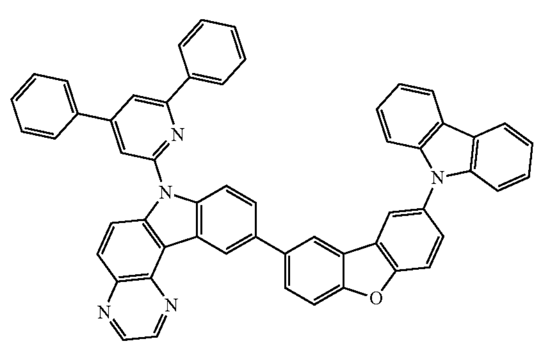

-continued
A-209
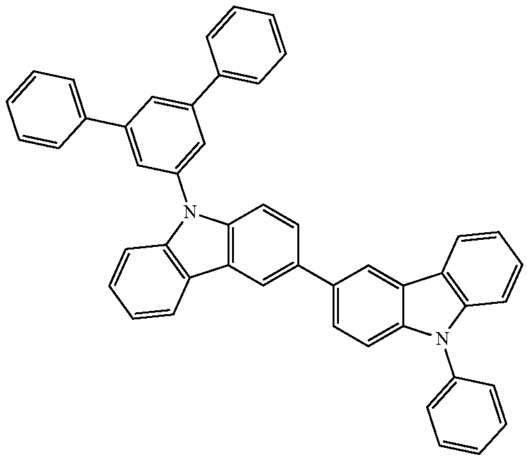
A-210
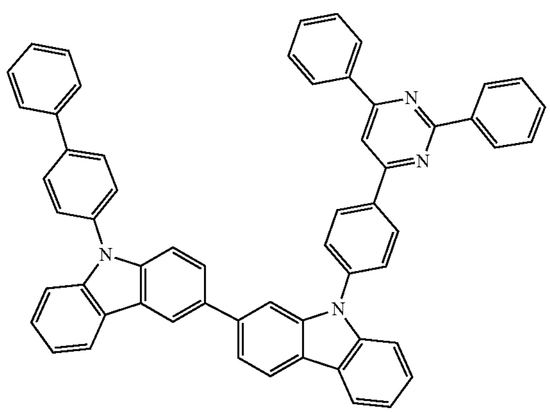
A-211
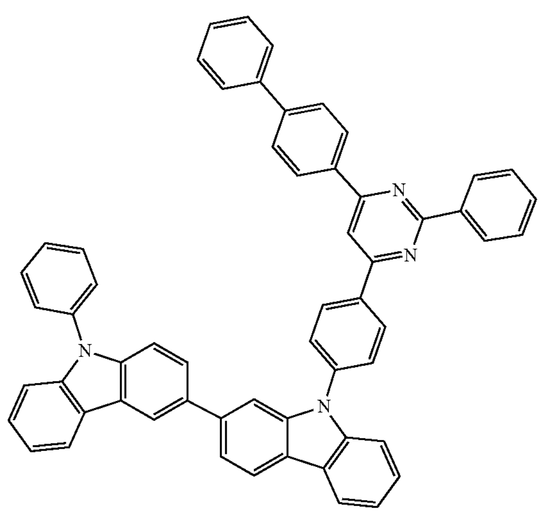
-continued
A-212
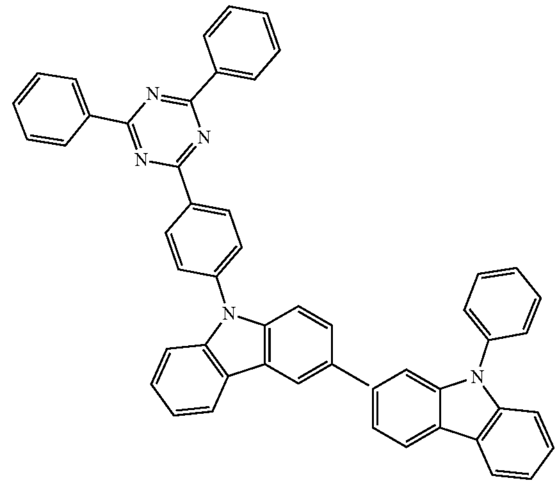
A-213
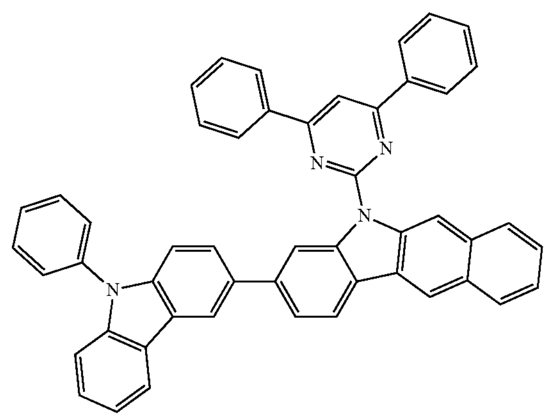
A-214
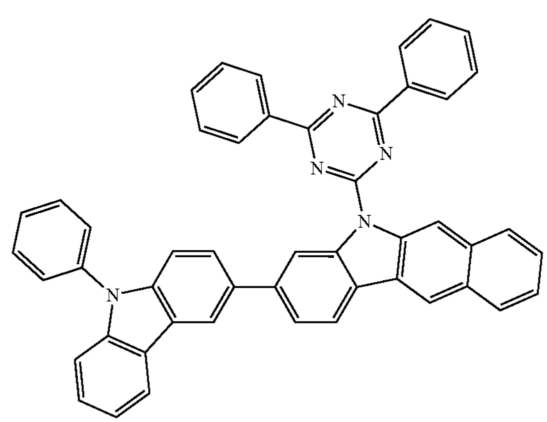

-continued
A-215
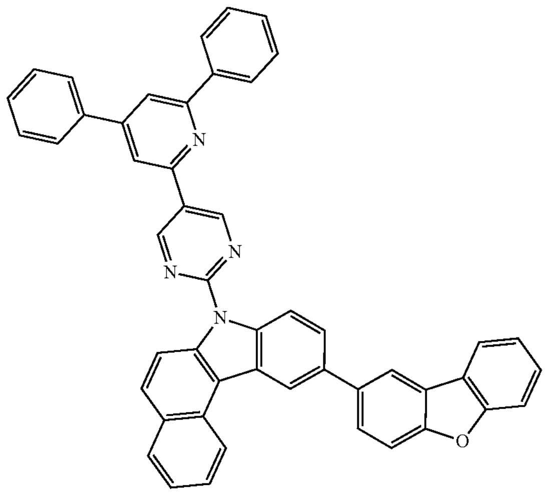
A-216
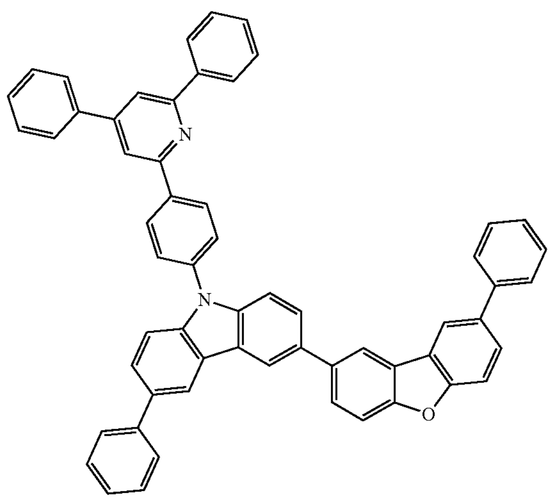
A-217
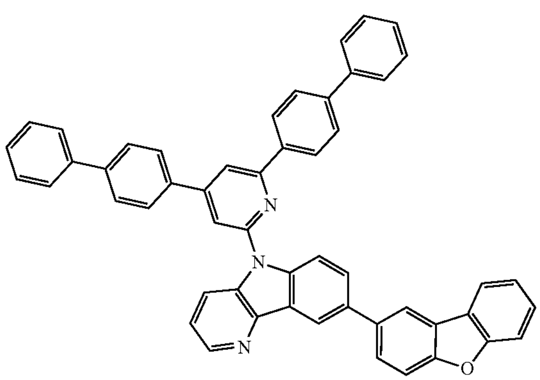
-continued
A-218
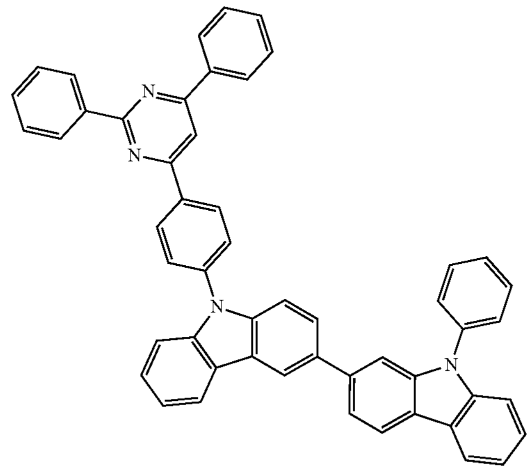
A-219
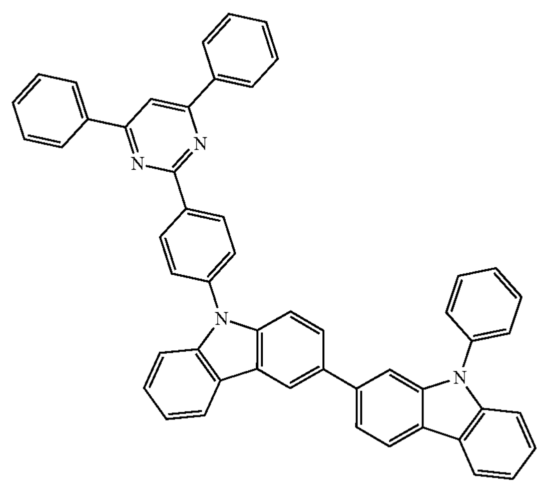
A-220
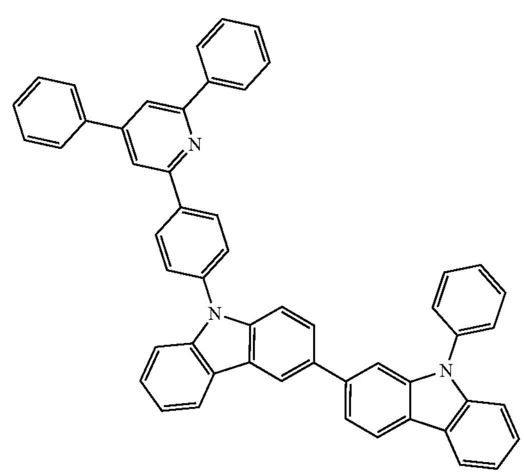

-continued
A-221
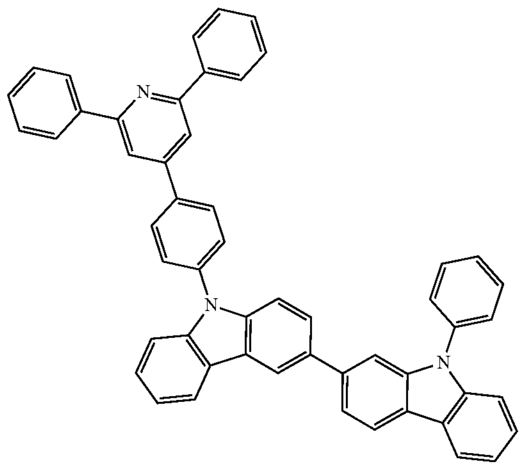
B-101
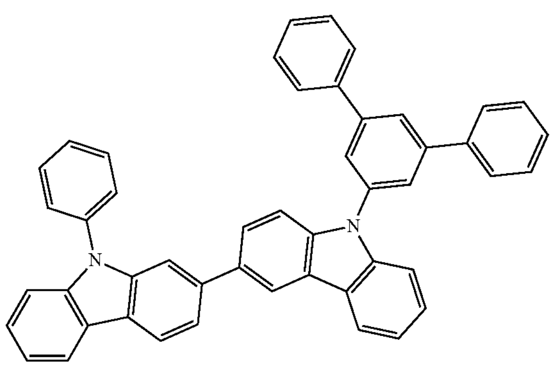
B-102
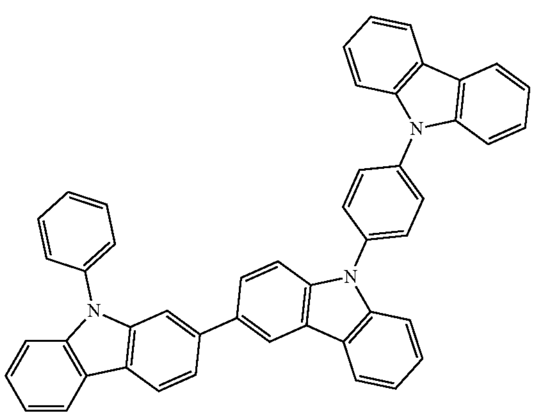
-continued
B-103
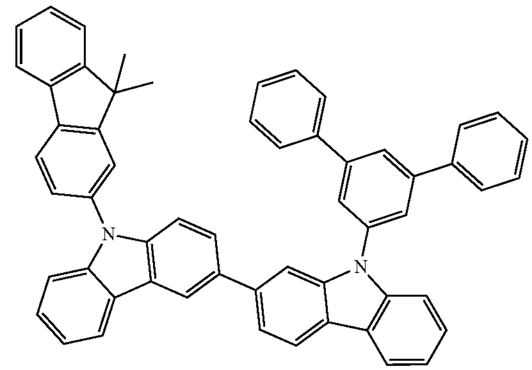
B-104
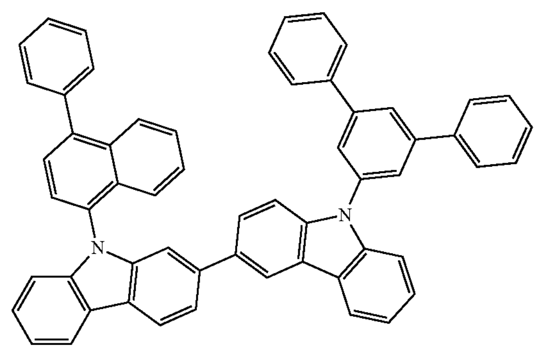
B-105
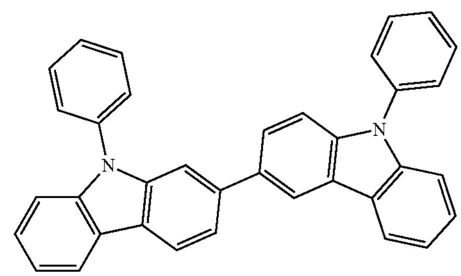
B-106
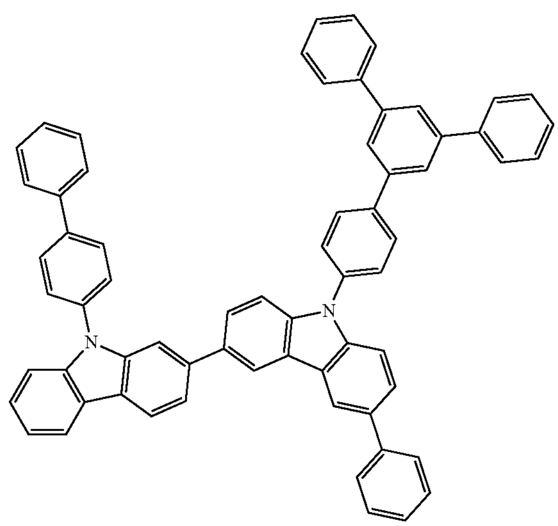

-continued
B-107
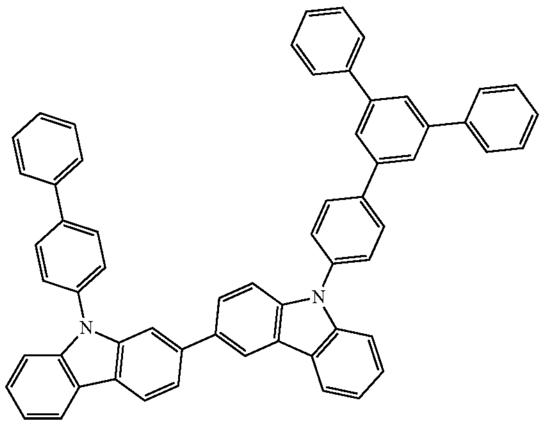
B-108
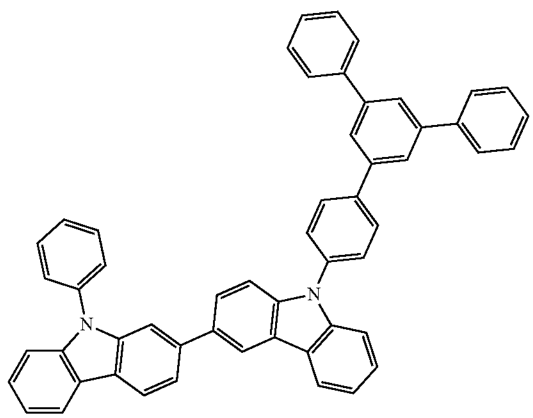
B-109
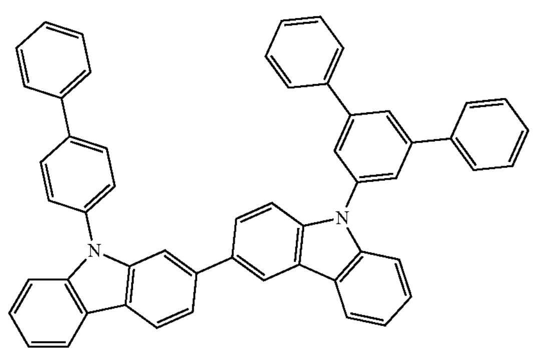
-continued
B-110
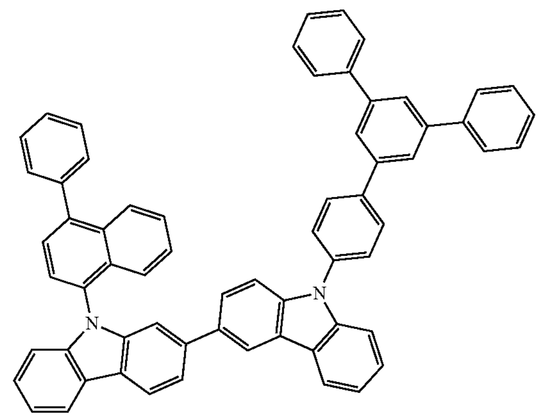
B-111
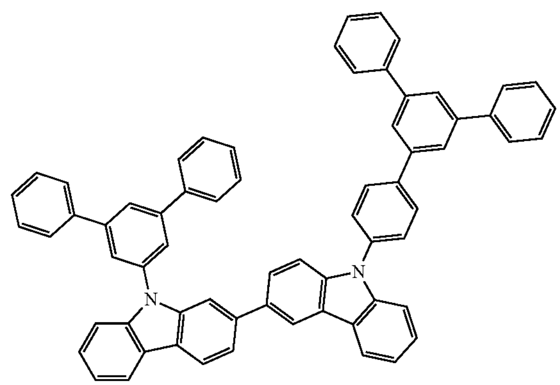
B-112
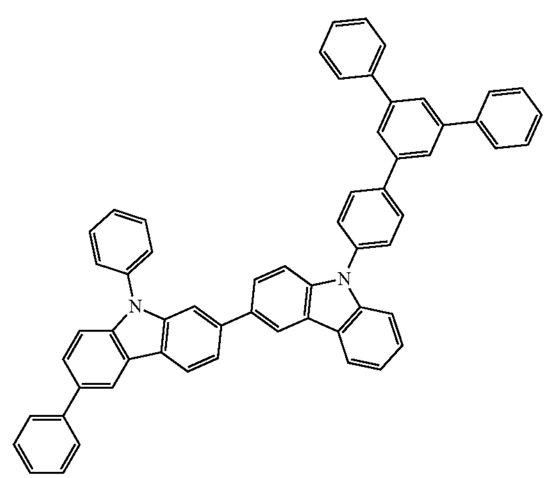

B-113
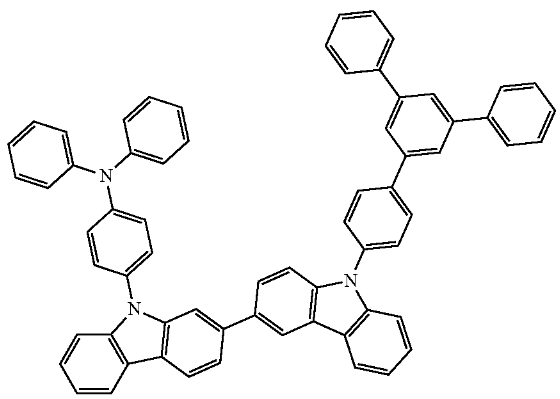
B-114
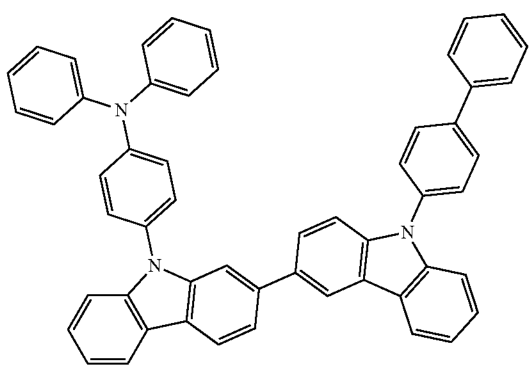
B-115
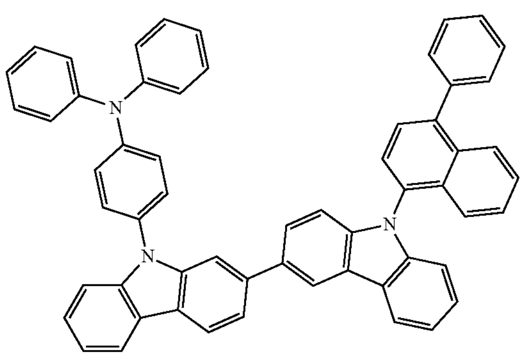
B-116
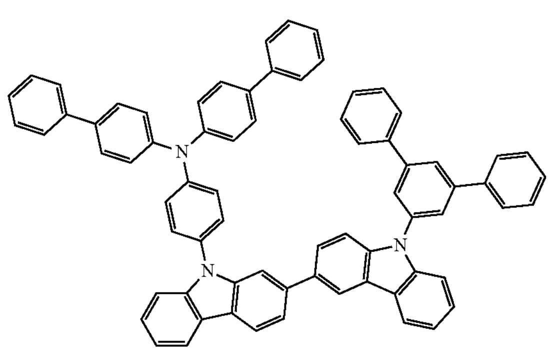
B-117
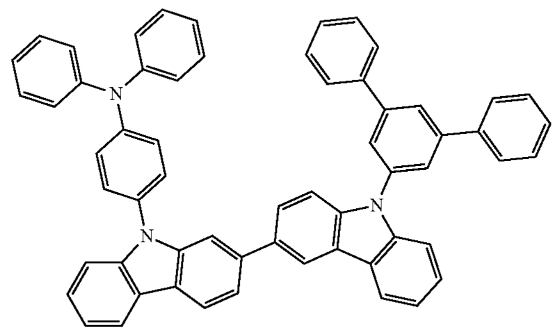
B-118
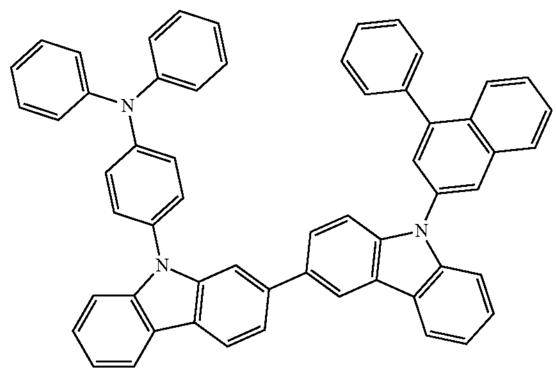
B-119
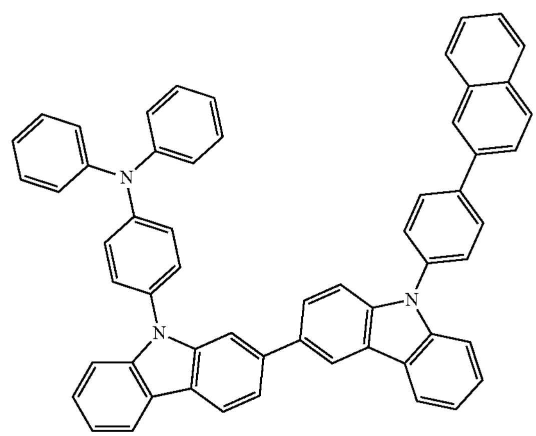
B-120
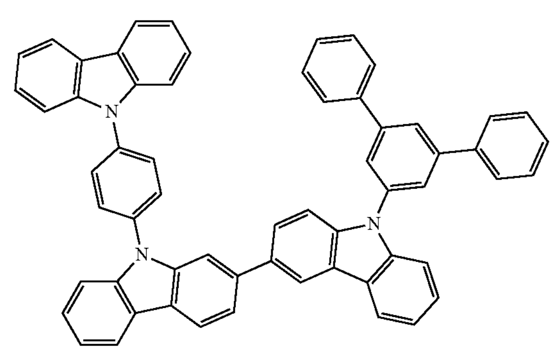

B-121
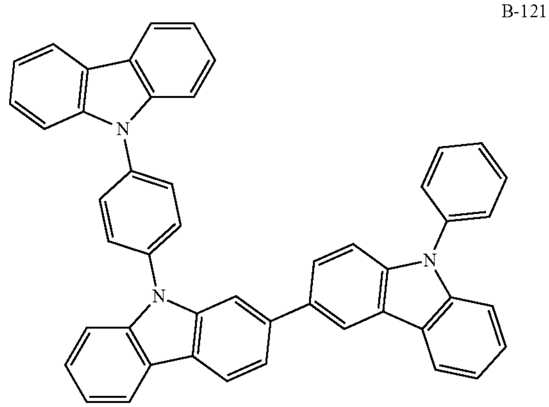
B-122
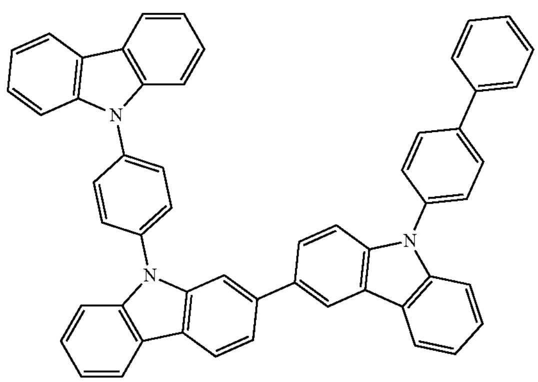
B-123
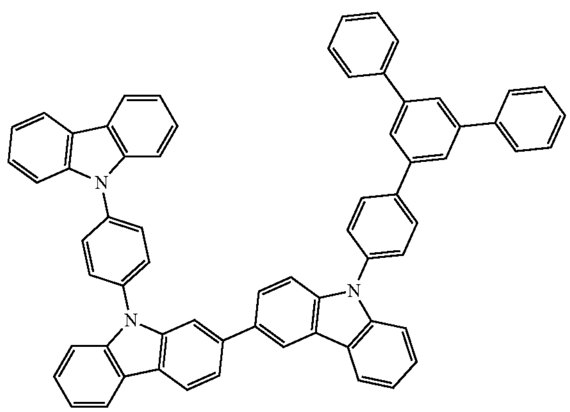
B-124
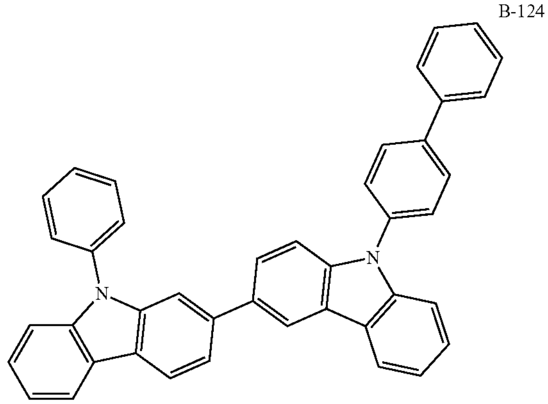
B-125
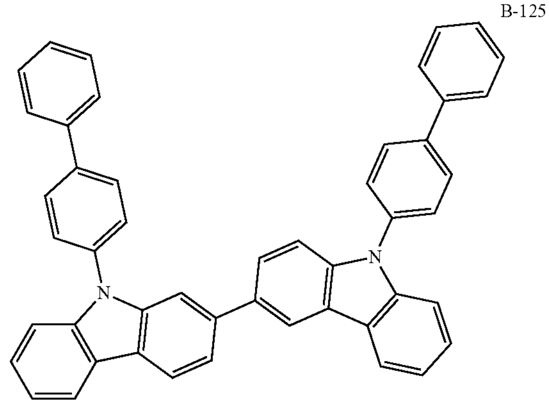
B-126
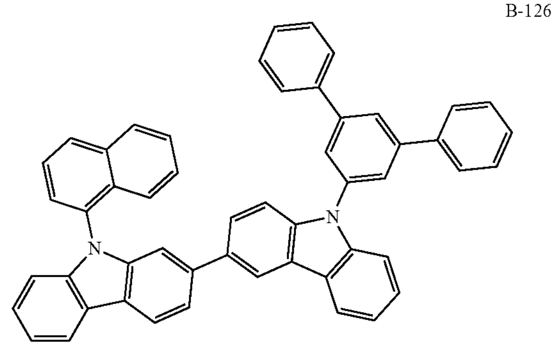
B-127
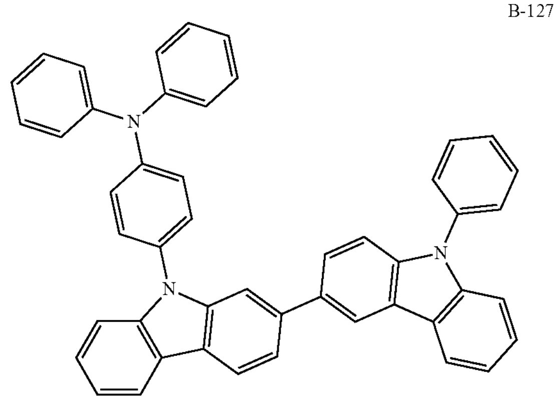
B-128
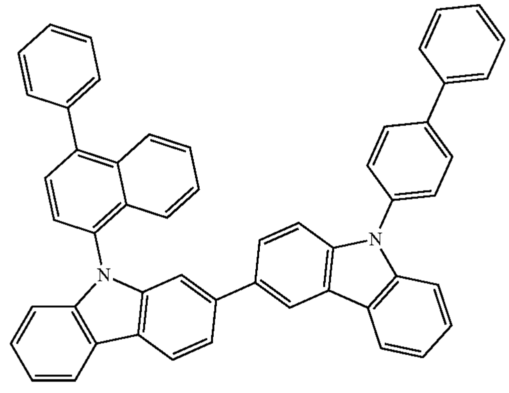

-continued
B-129
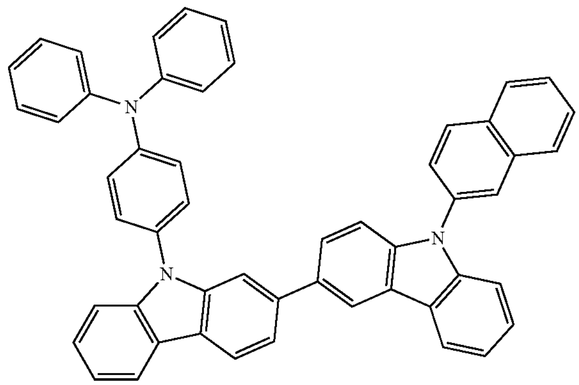
B-130
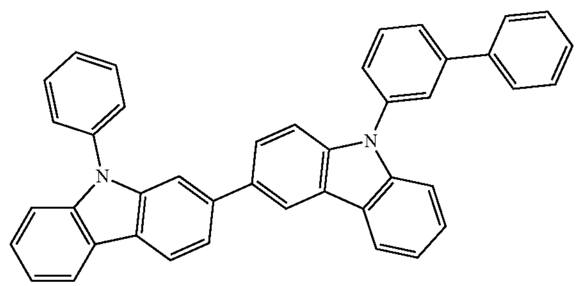
B-131
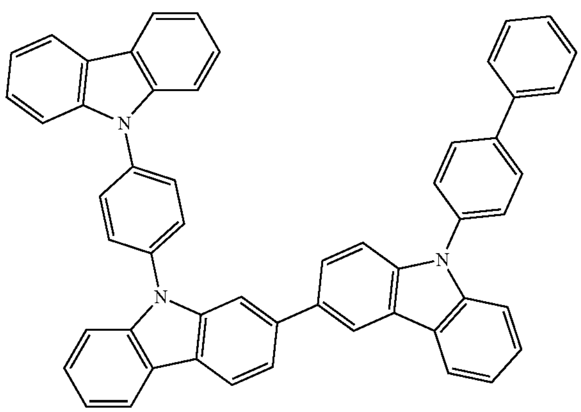
B-132
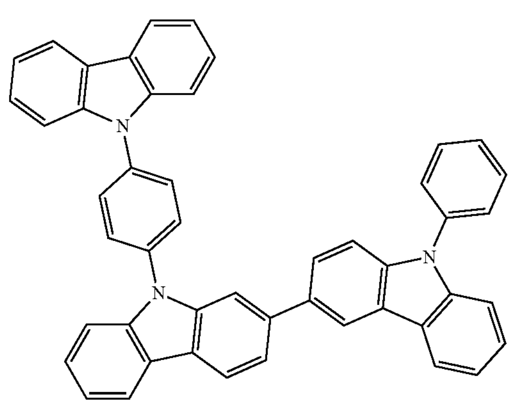
-continued
B-133
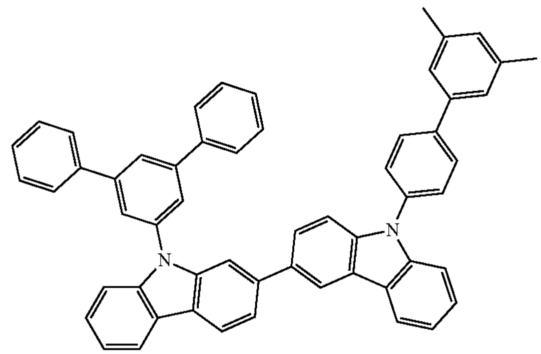
B-134
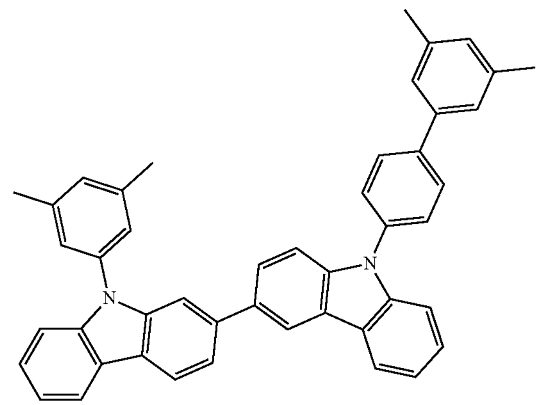
B-135
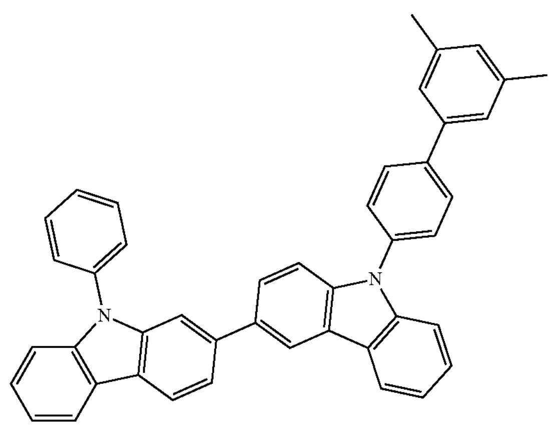
B-136
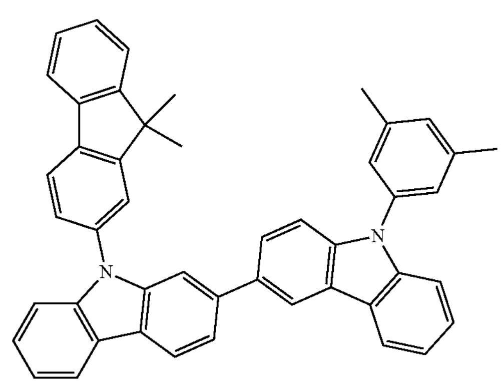

-continued
B-137
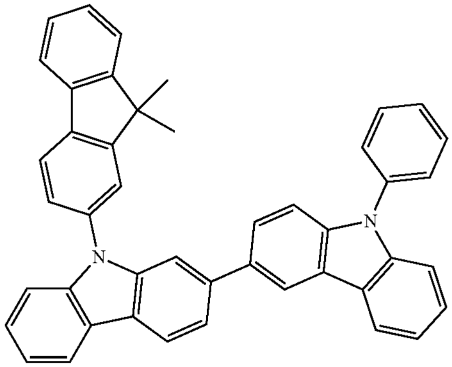
B-138
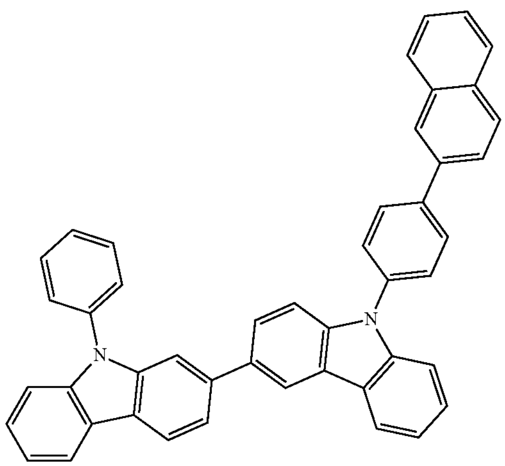
B-139
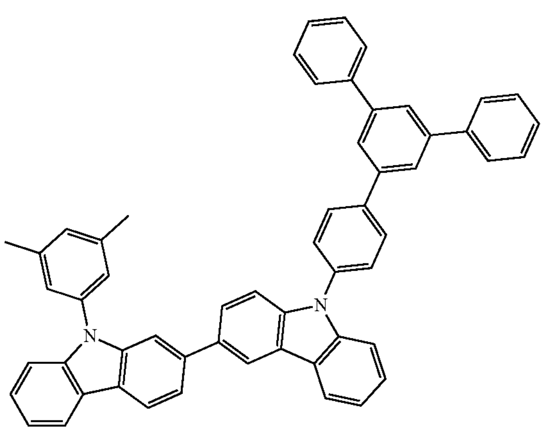
-continued
B-140
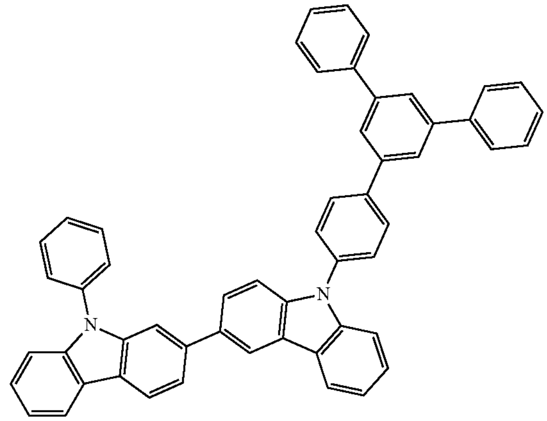
B-141
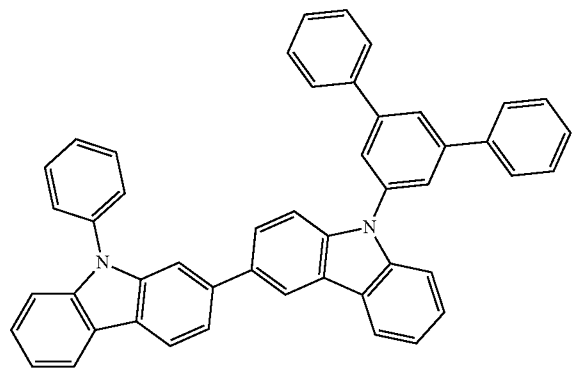
B-142
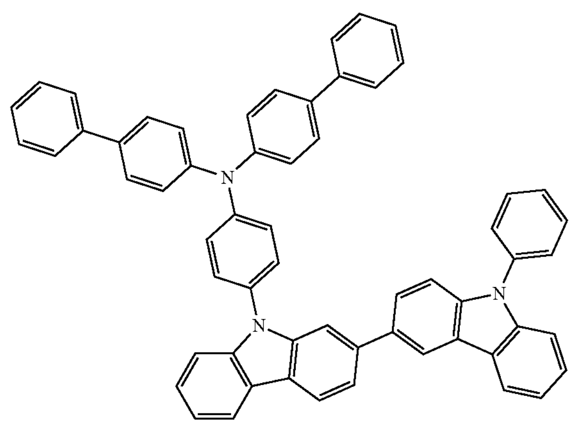
B-143
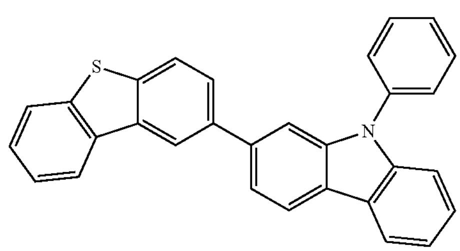

-continued
B-144
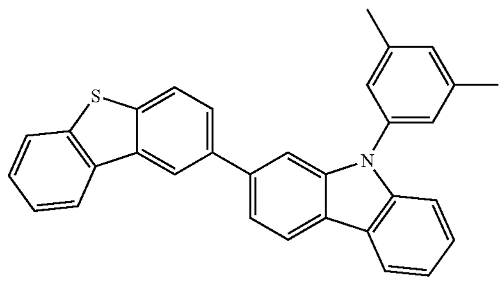
B-145
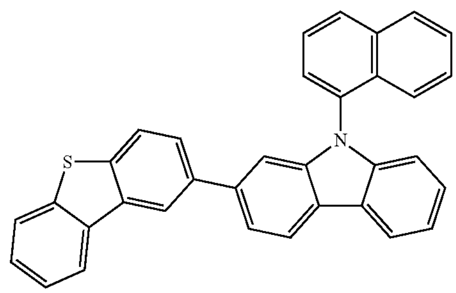
B-146
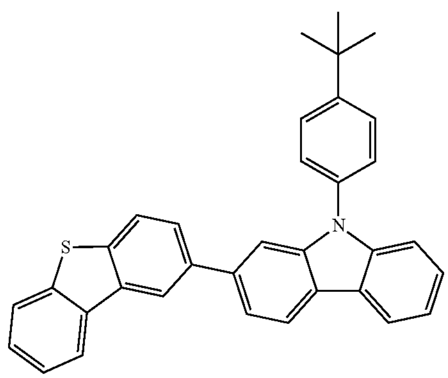
B-147
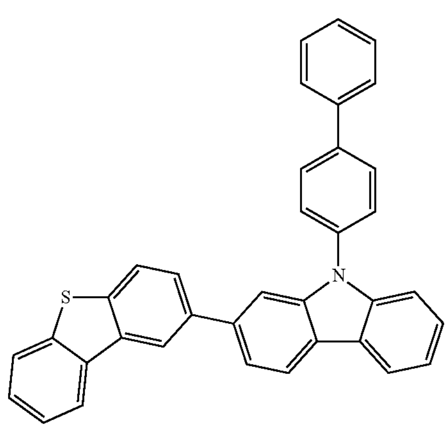
-continued
B-148
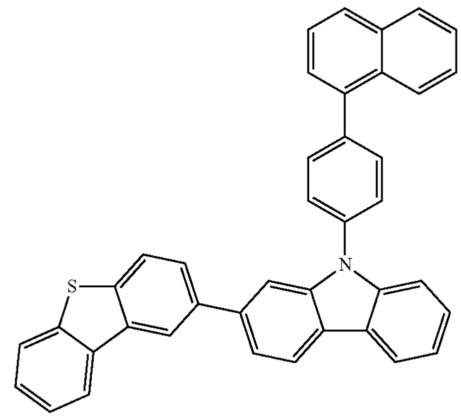
B-149
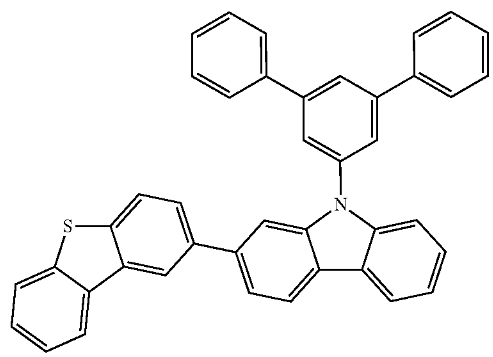
B-150
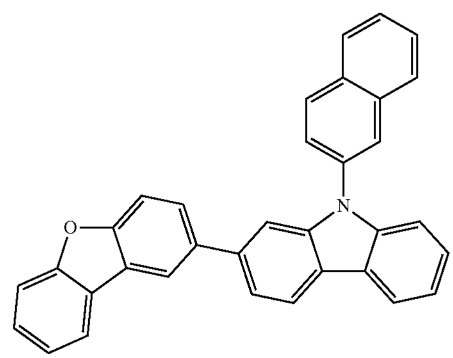
B-151
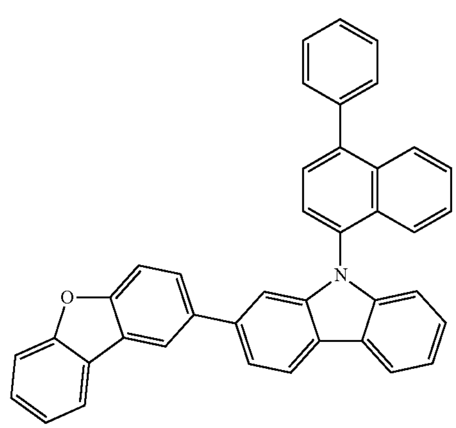

-continued
B-152
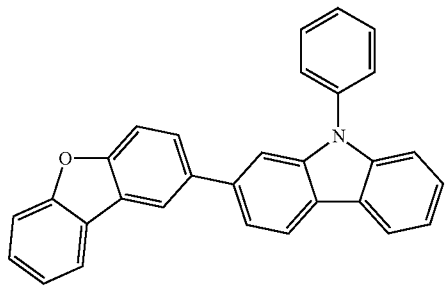
B-153
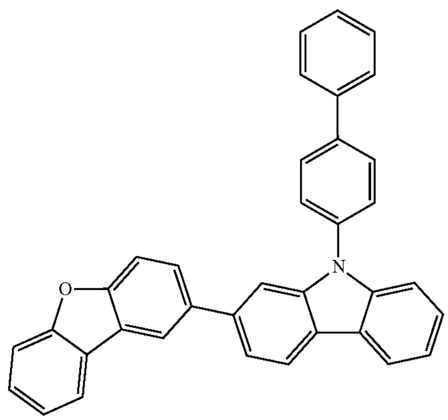
B-154
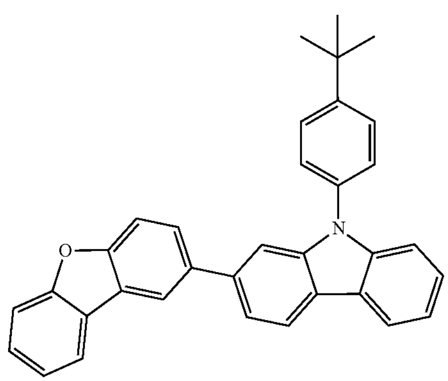
B-155
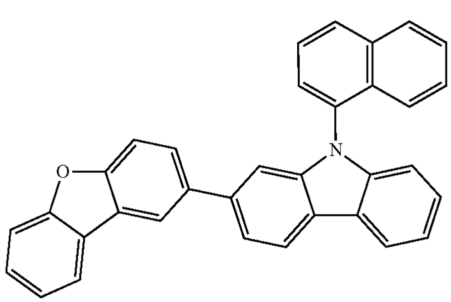
-continued
B-156
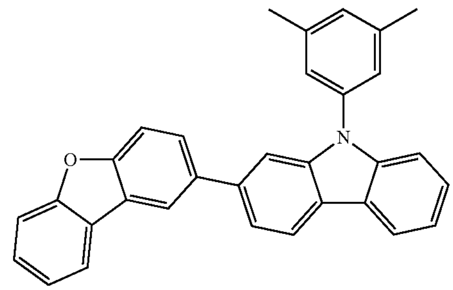
B-157
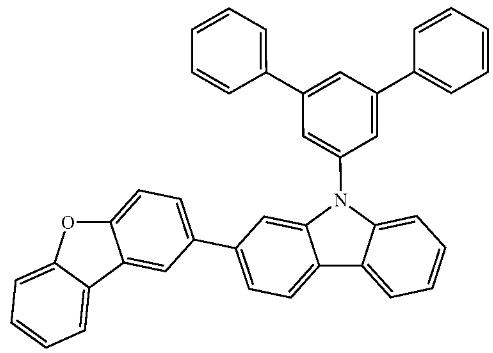
B-158
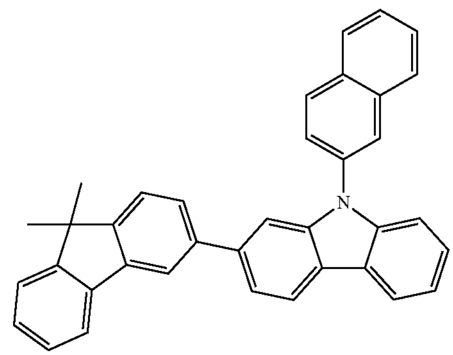
B-159
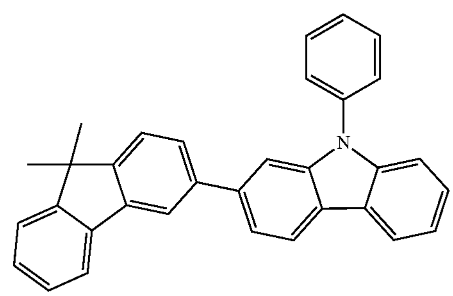
B-160
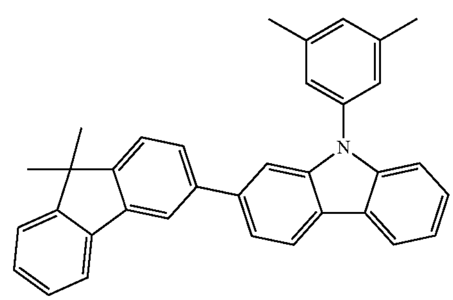

-continued
B-161
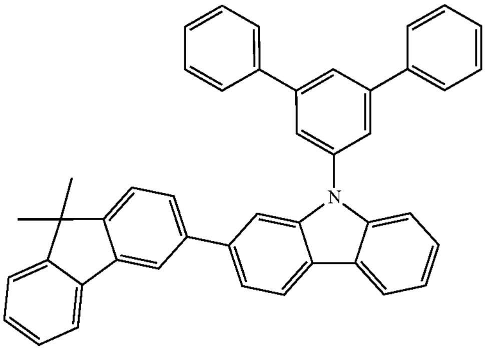
B-162
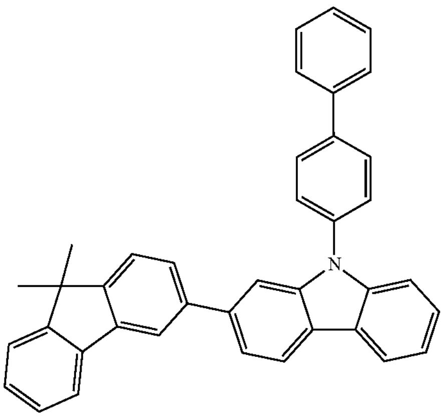
B-163
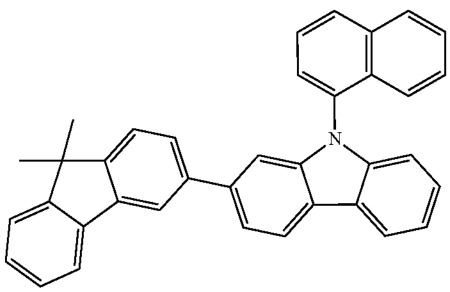
B-164
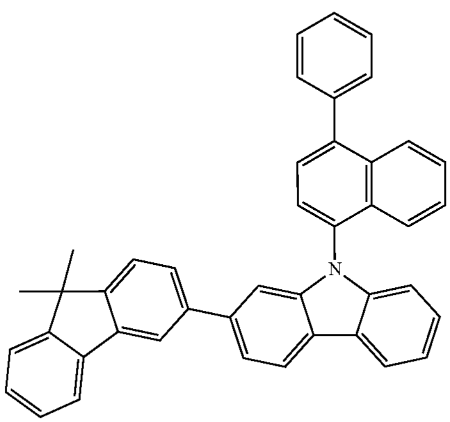
-continued
B-165
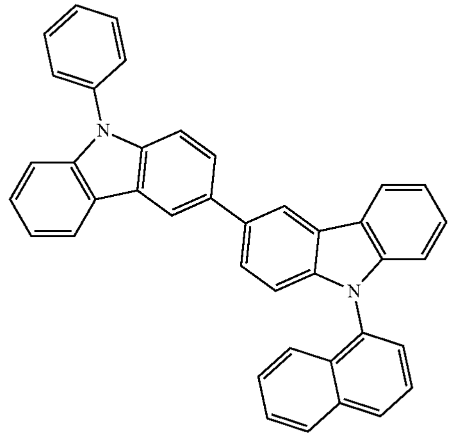
B-166
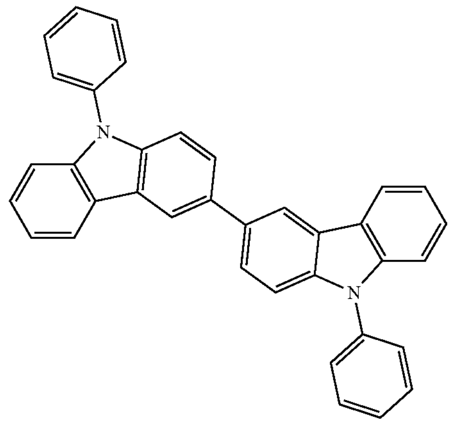
B-167
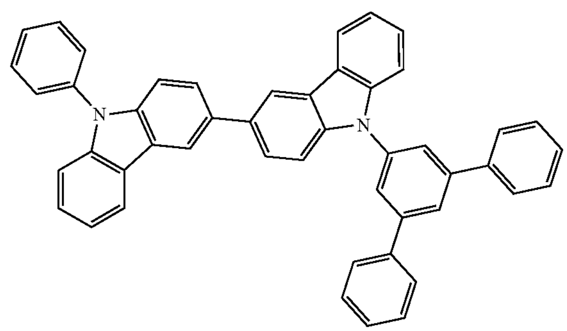
B-168
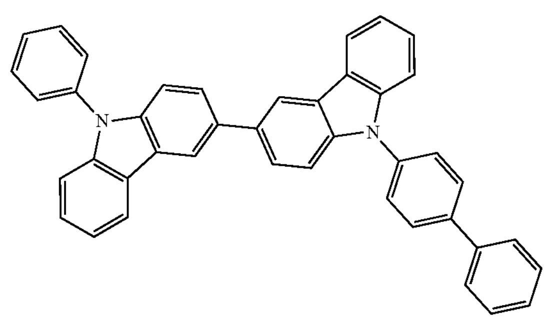

-continued
B-169
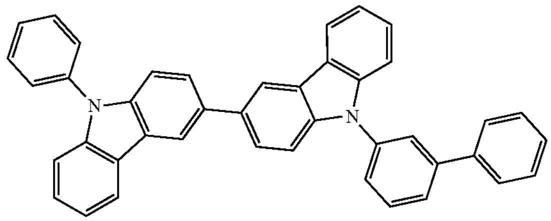
B-170
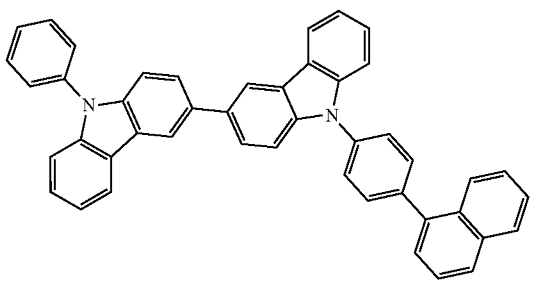
B-171
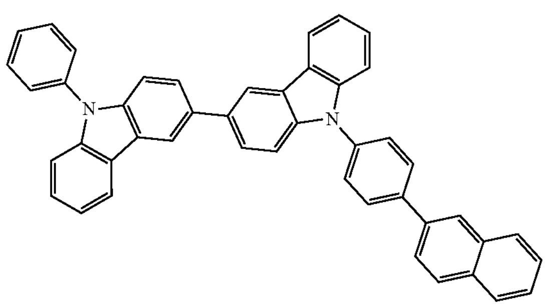
B-172
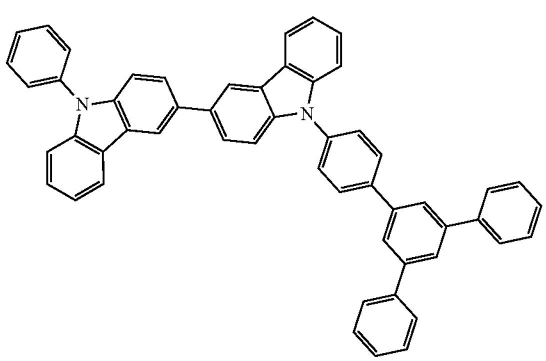
-continued
B-173
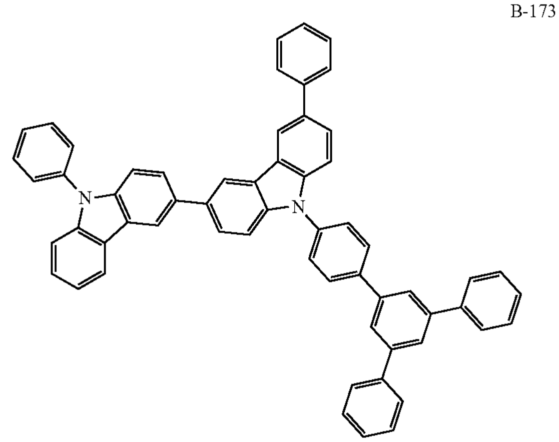
B-174
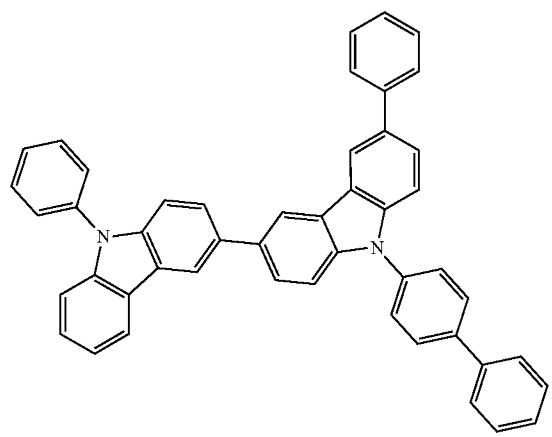
B-175
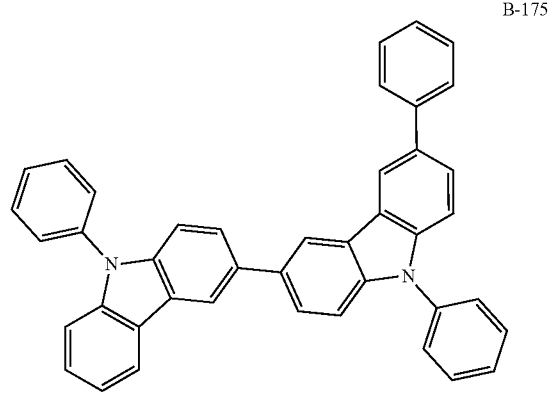

-continued
B-176
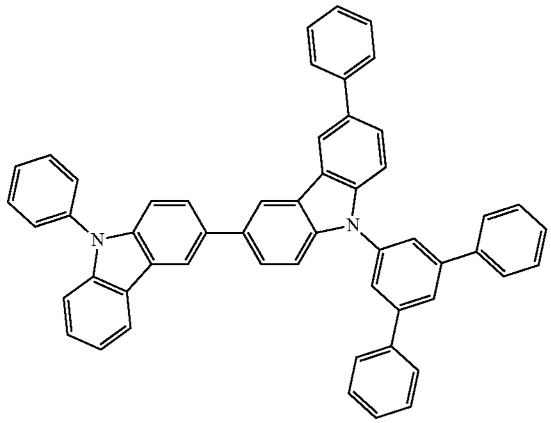
B-177
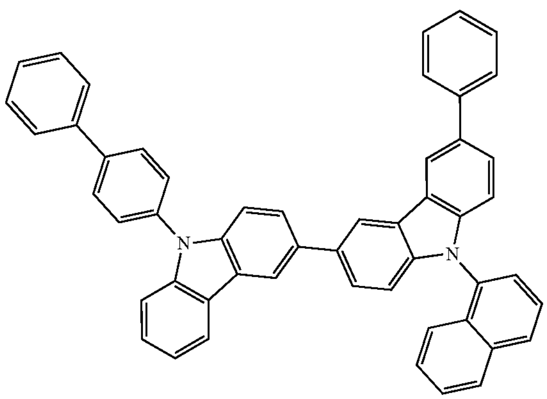
B-178
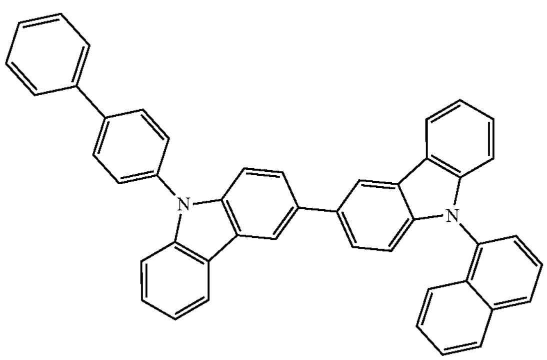
B-179
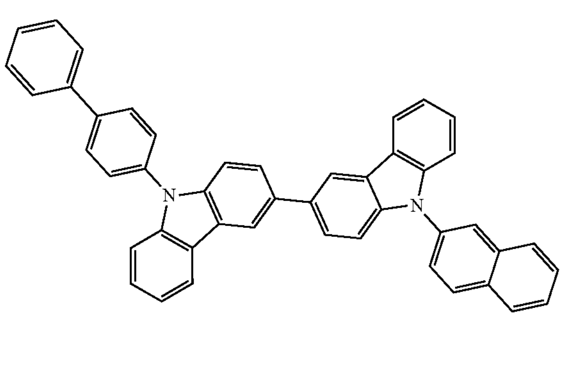
-continued
B-180
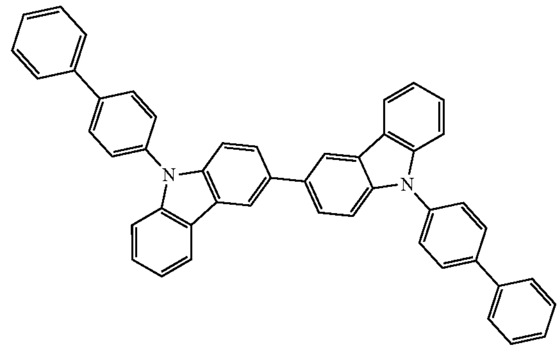
B-181
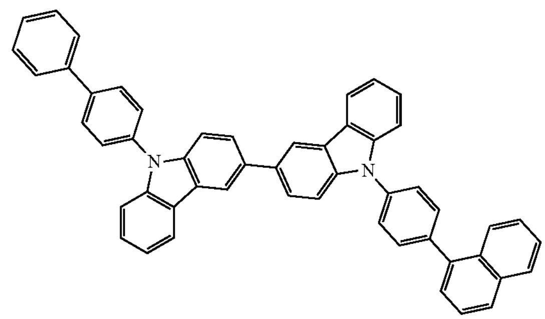
B-182
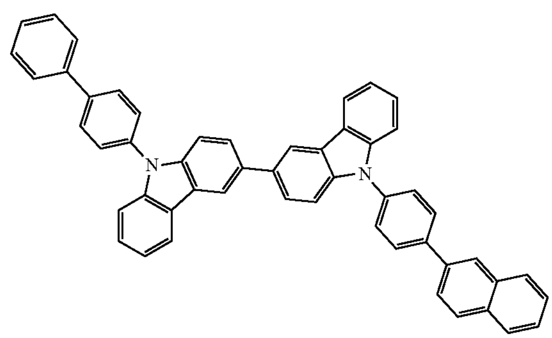
B-183
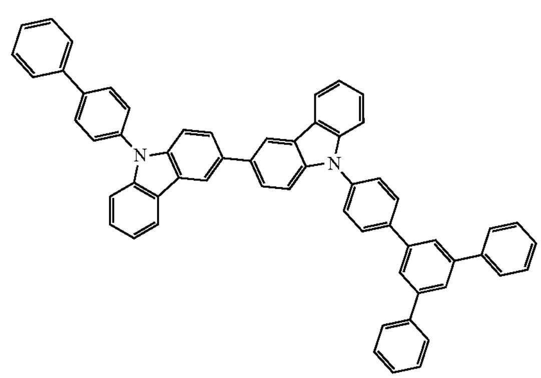

-continued
B-184
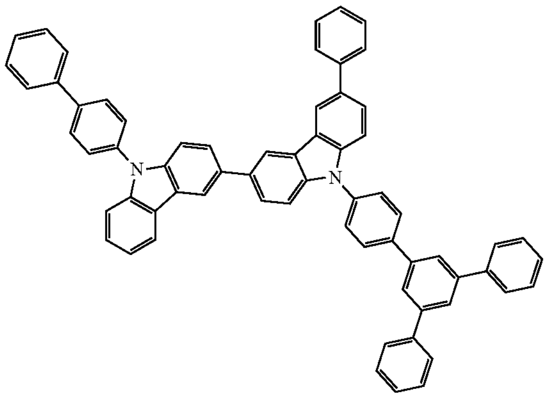
B-185
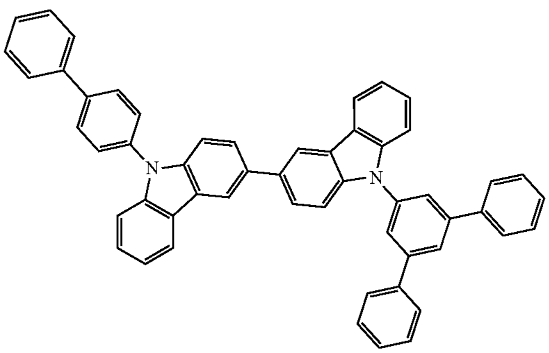
B-186
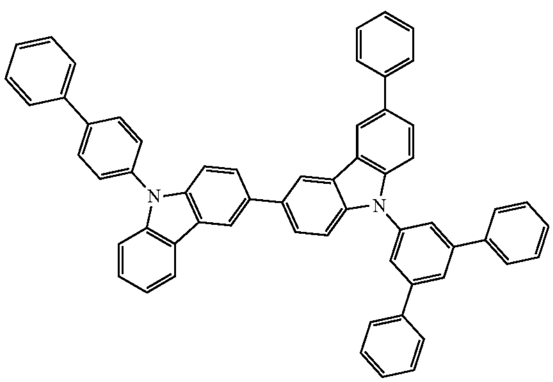
B-187
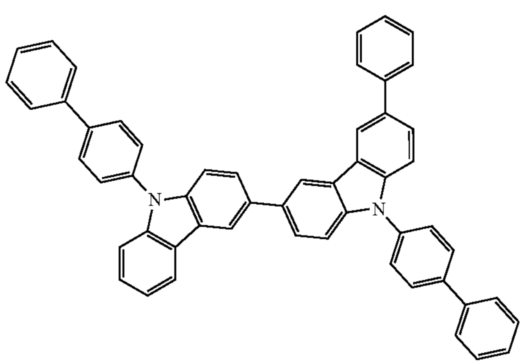
-continued
B-188
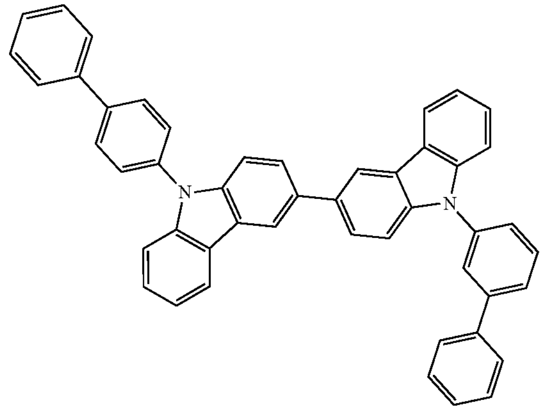
B-189
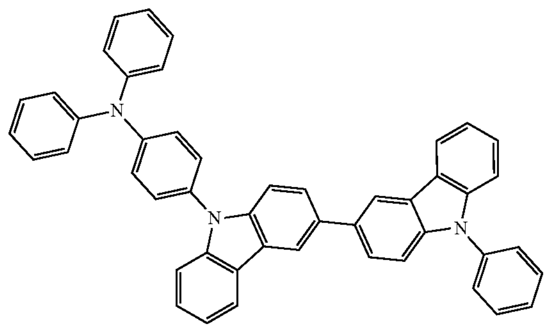
B-190
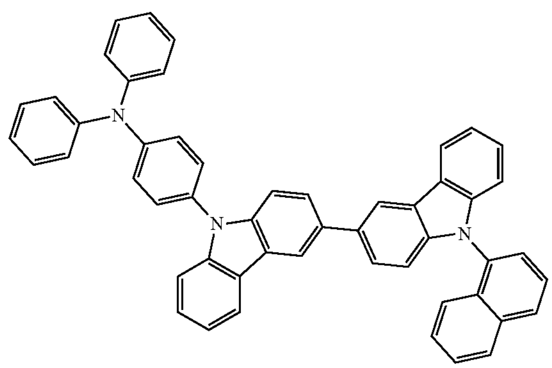
B-191
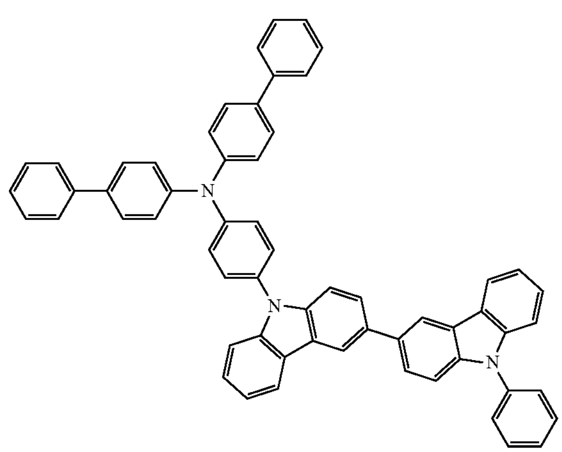

-continued
B-192
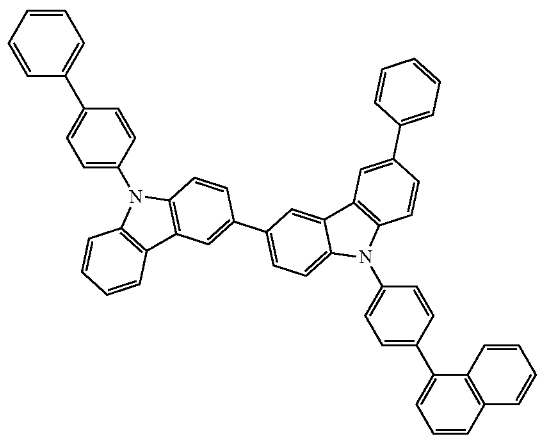
B-193
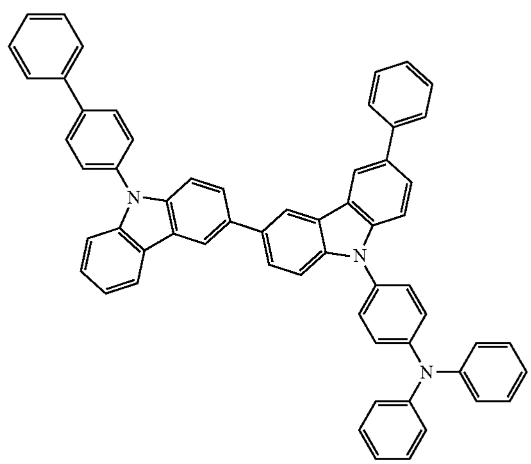
B-194
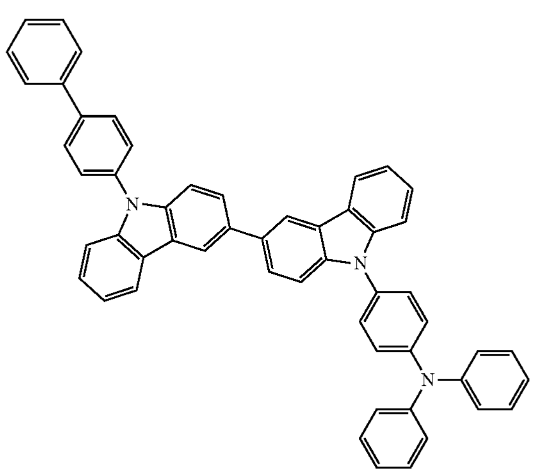
-continued
B-195
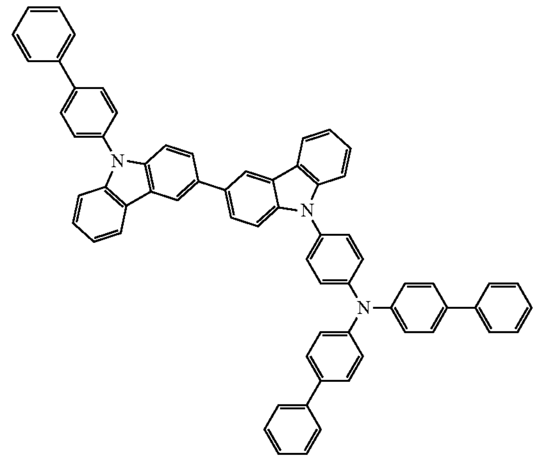
B-196
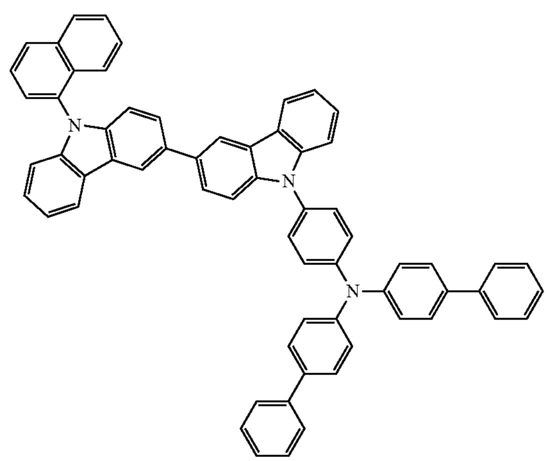
B-197
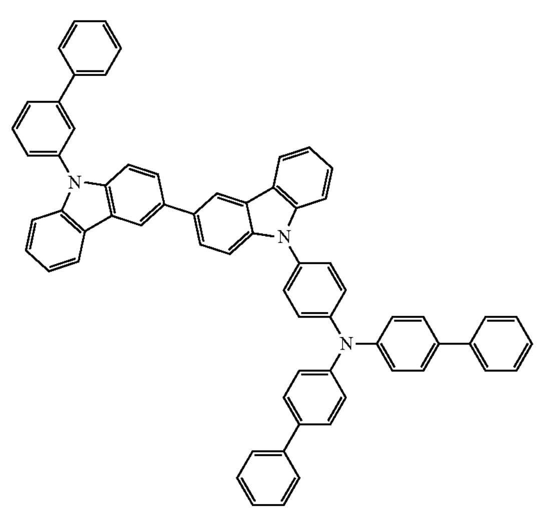

B-198
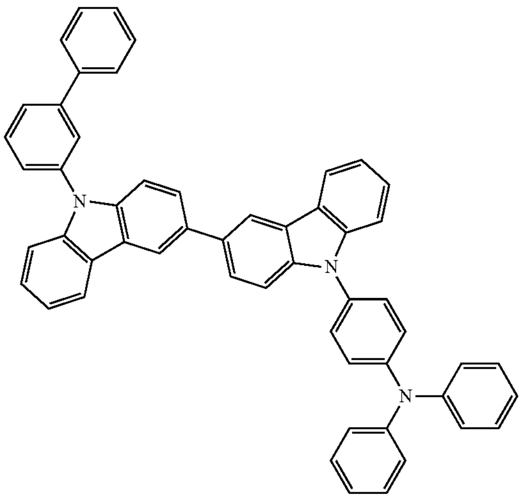
B-199
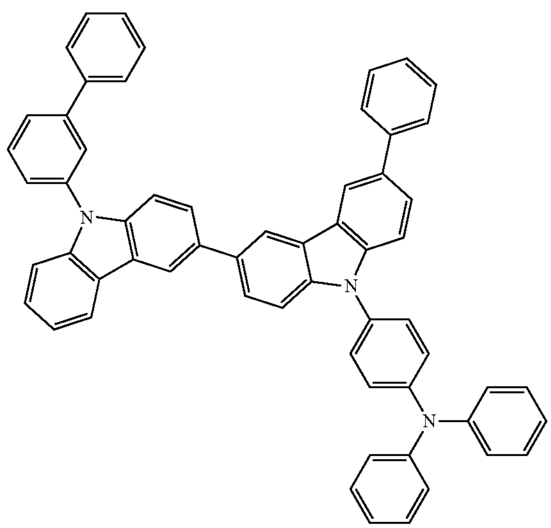
B-200
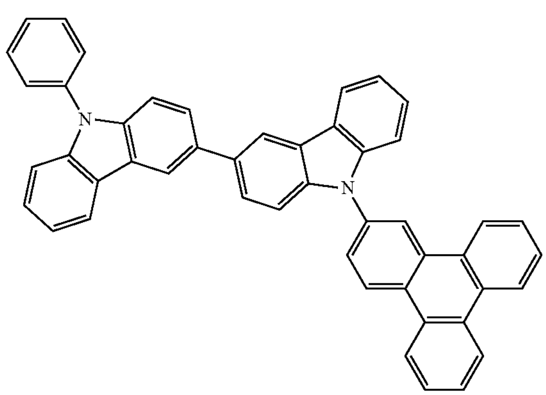
B-201
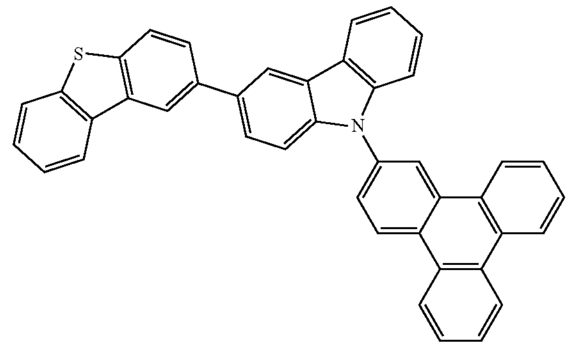
B-202
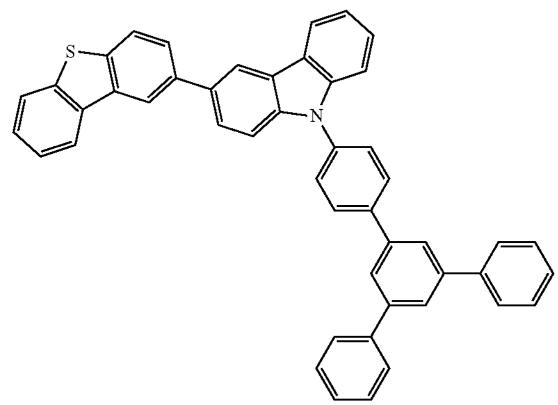
B-203
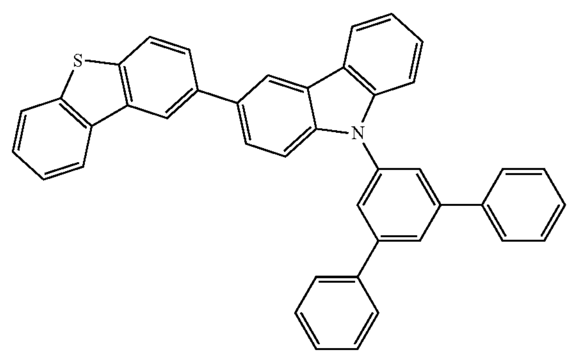
B-204
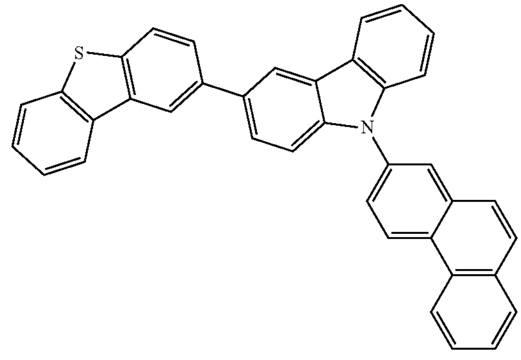

-continued
B-205
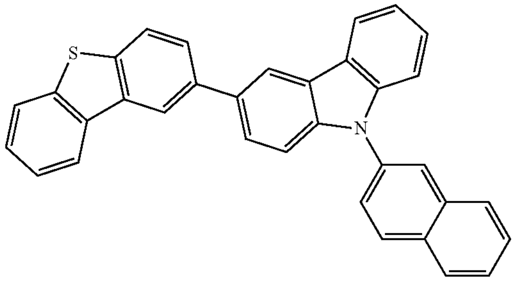
B-206
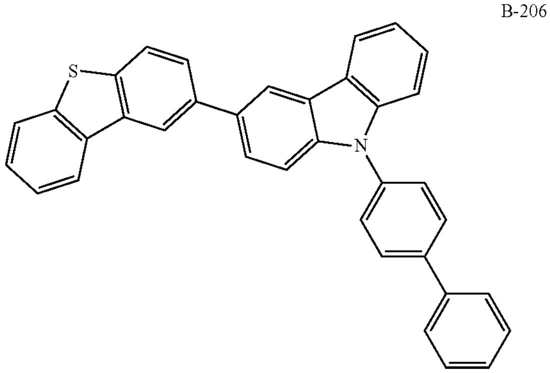
B-207
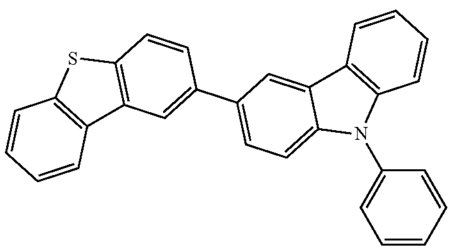
B-208
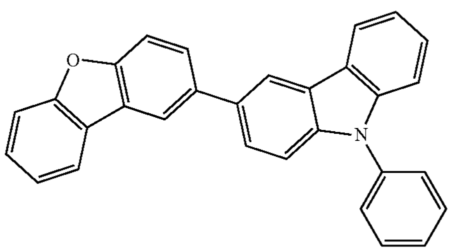
B-209
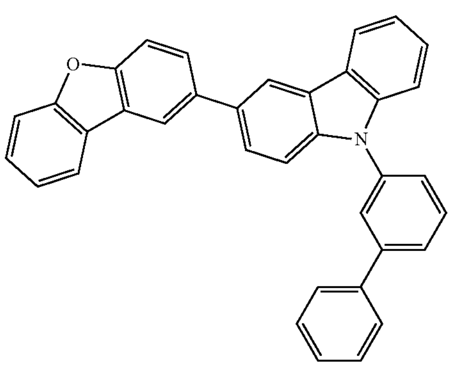
-continued
B-210
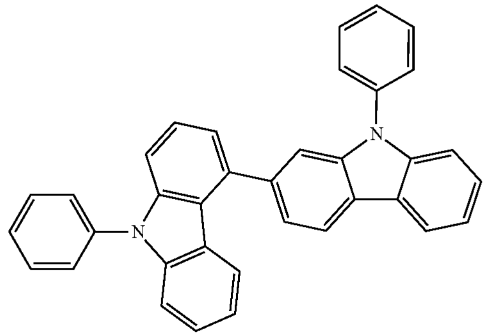
B-211
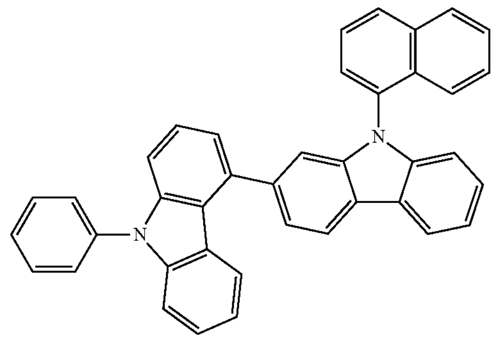
B-212
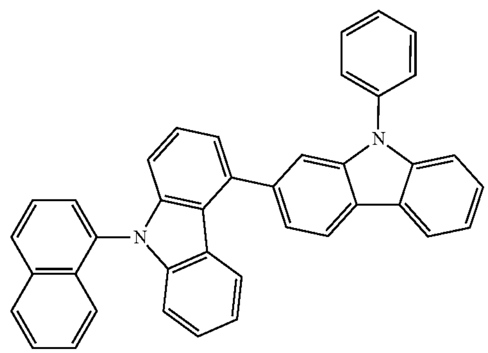
B-213
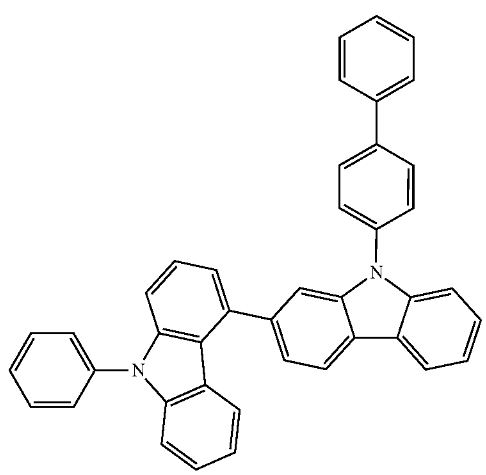

-continued
B-214
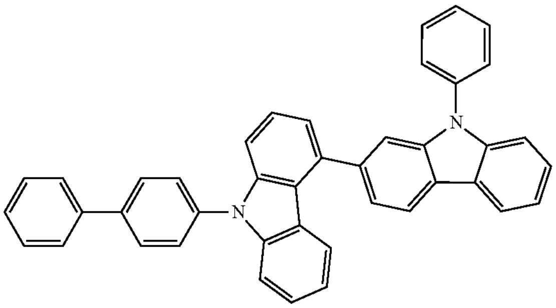
B-215
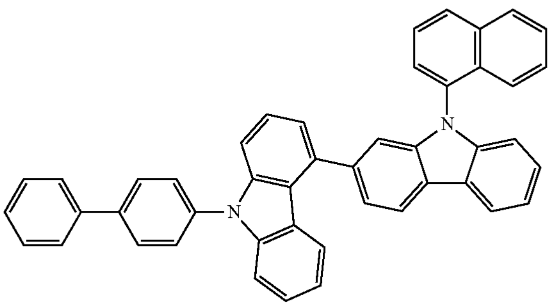
B-216
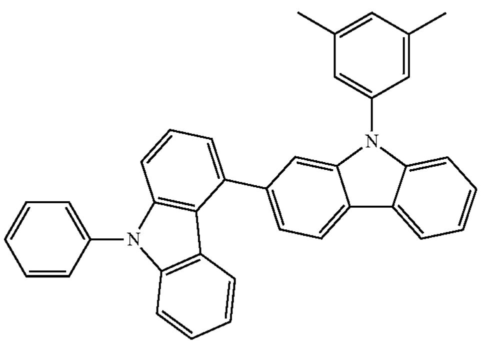
B-217
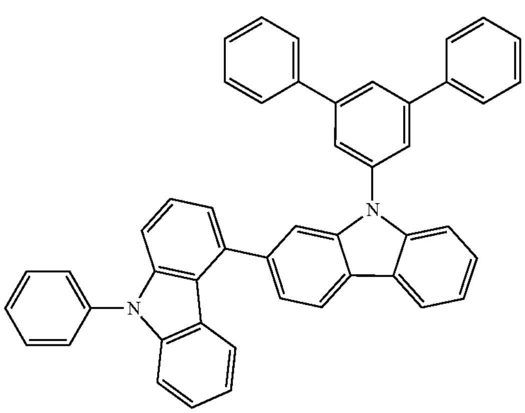
-continued
B-218
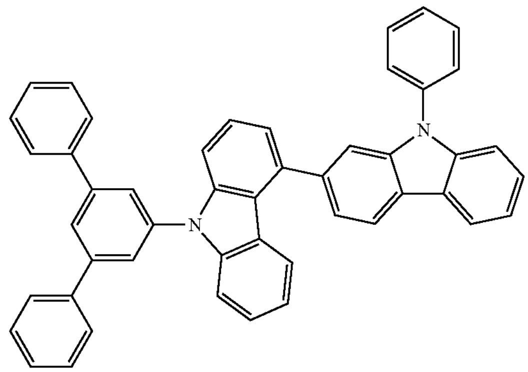
B-219
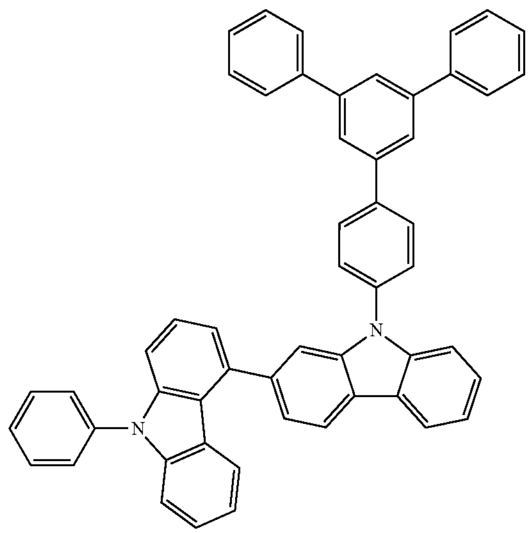
B-220
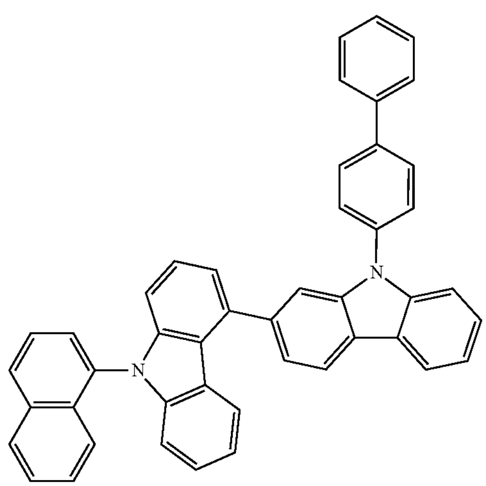

-continued
B-221
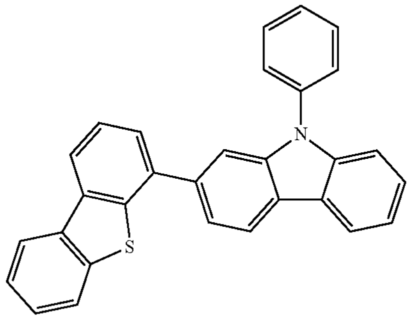
B-222
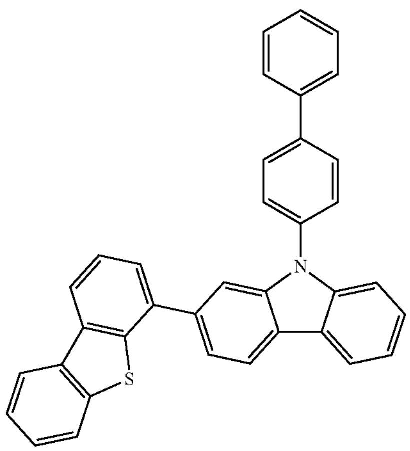
B-223
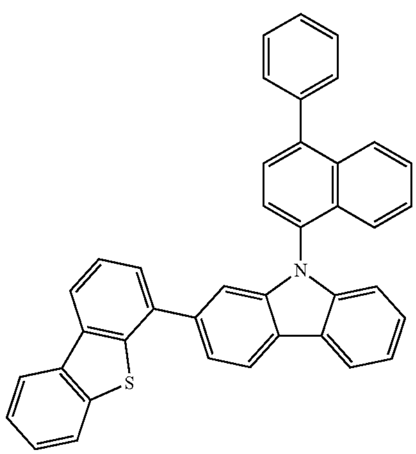
B-224
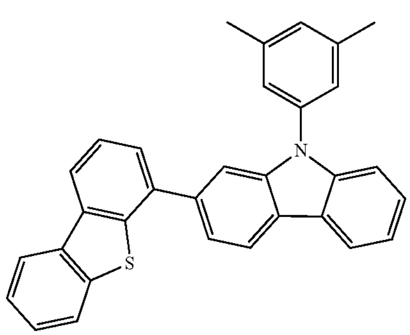
-continued
B-225
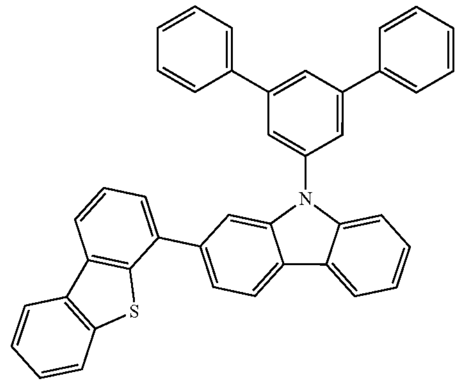
B-226
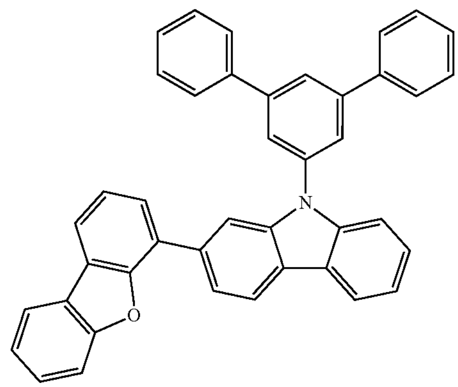
B-227
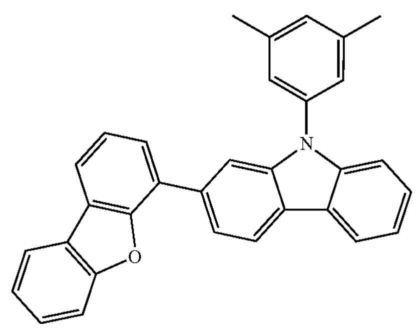
B-228
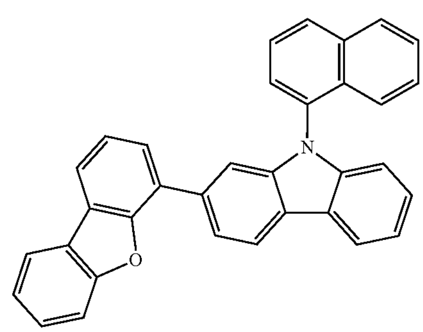

-continued
B-229
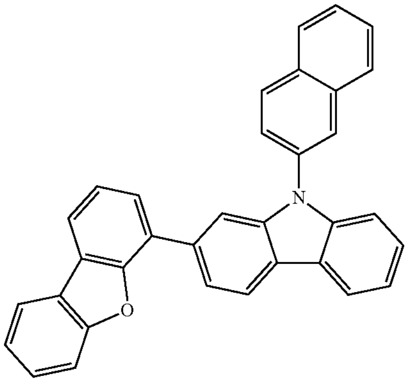
B-230
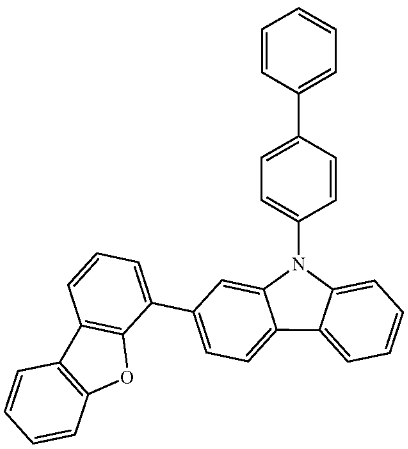
E-104
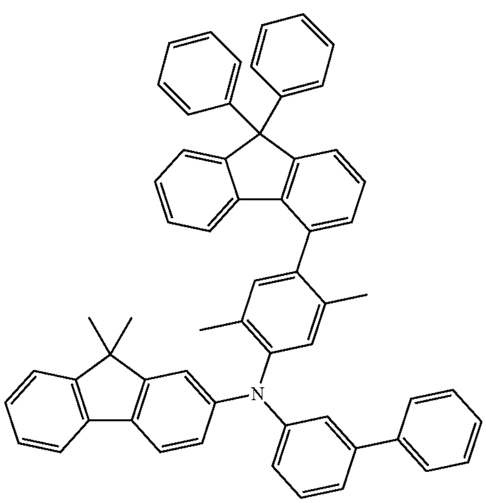
-continued
E-105
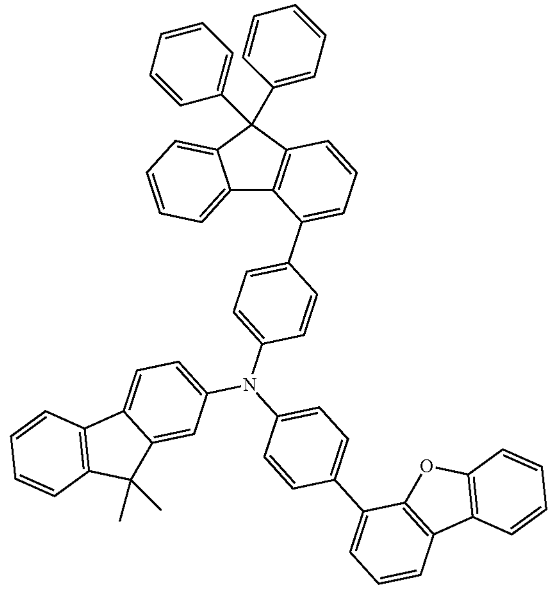
E-106
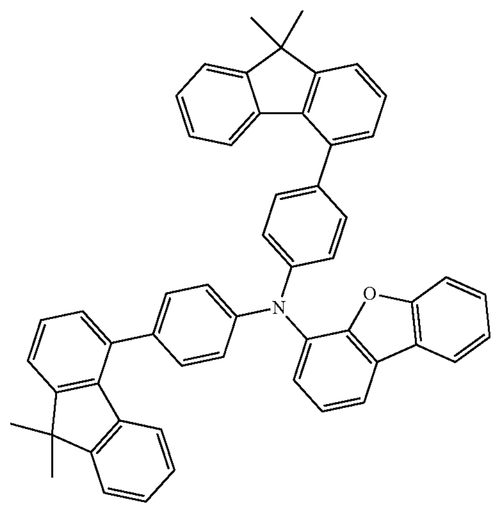
E-107
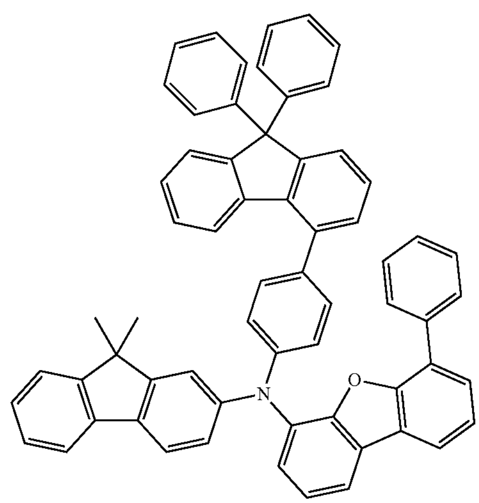

-continued
E-108
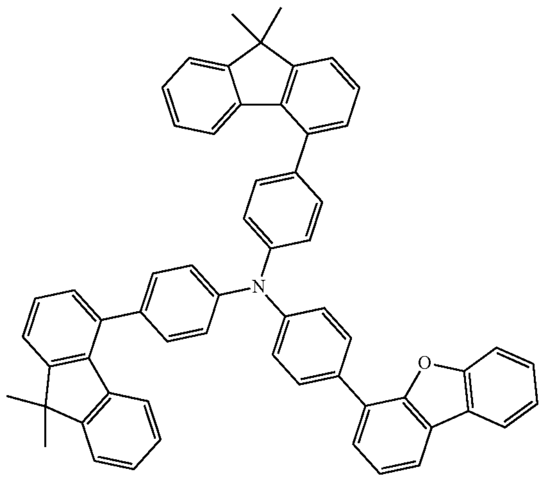
E-109
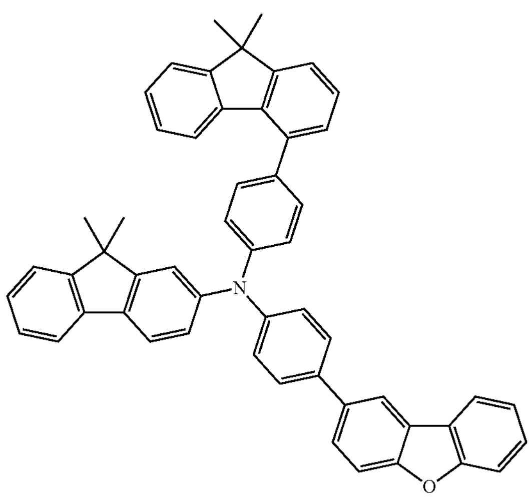
E-110
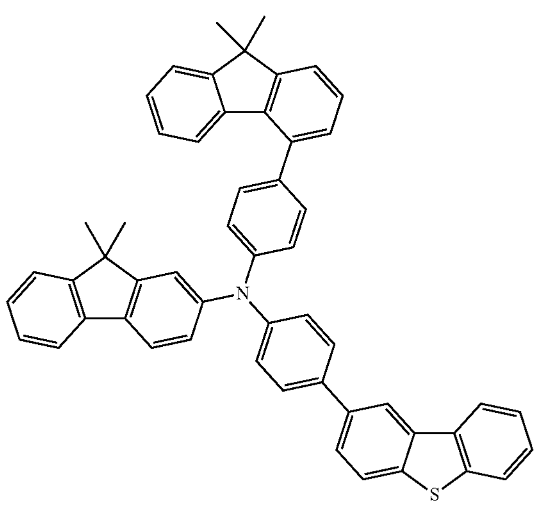
-continued
E-111
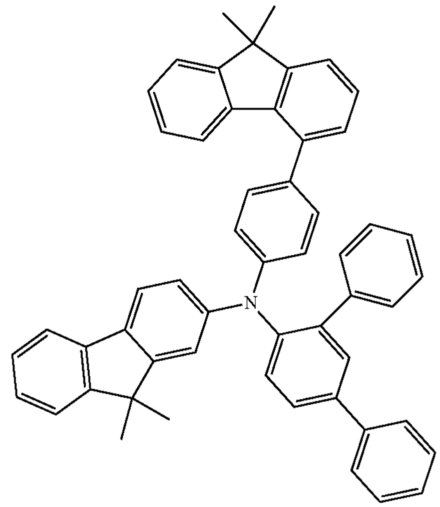
E-112
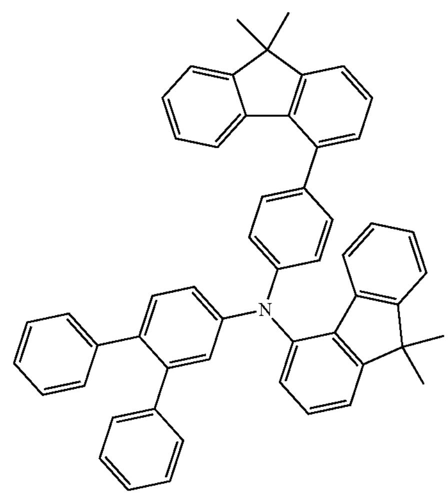
E-113
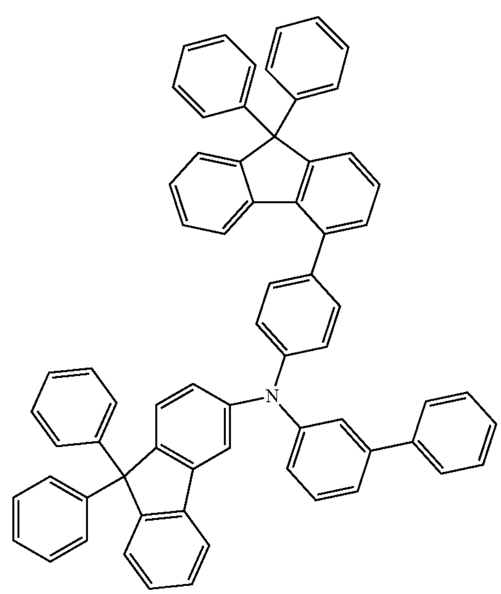

-continued
E-115
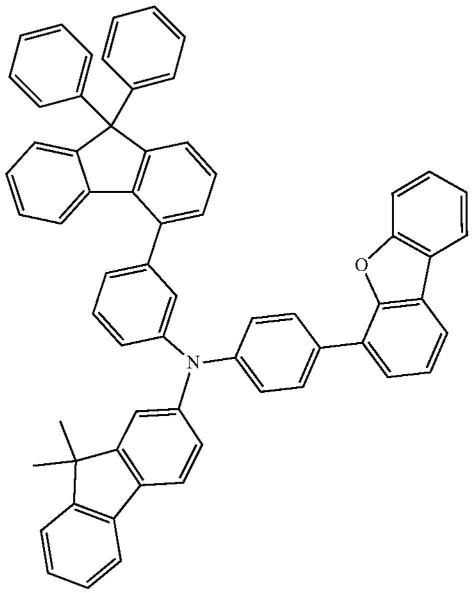
E-118
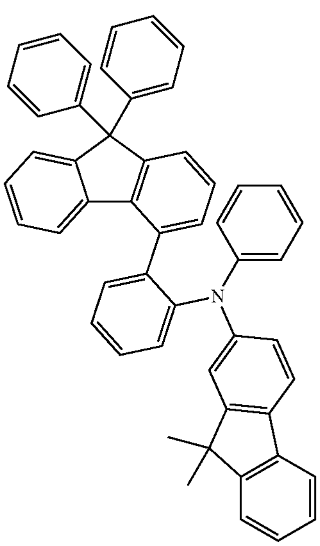
-continued
E-120
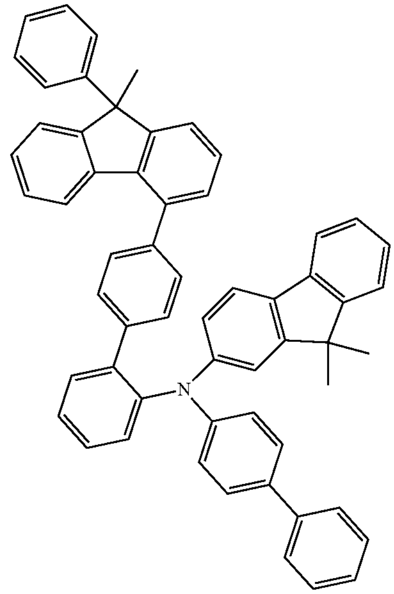
E-122
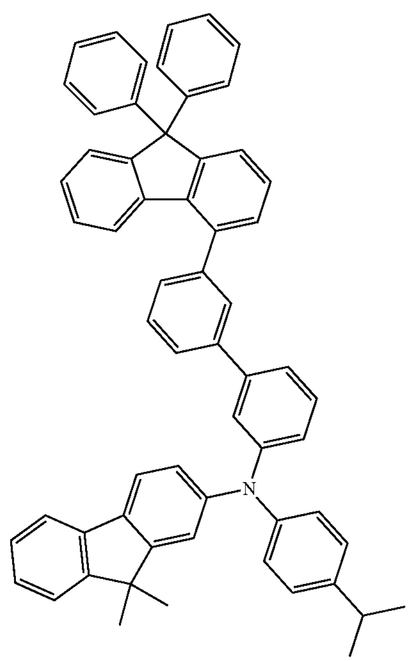

-continued
E-123
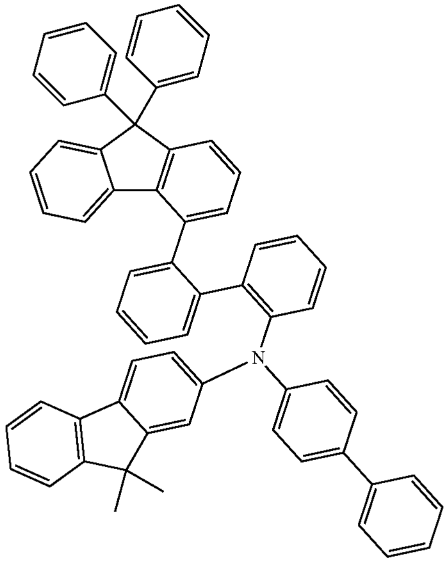
E-124
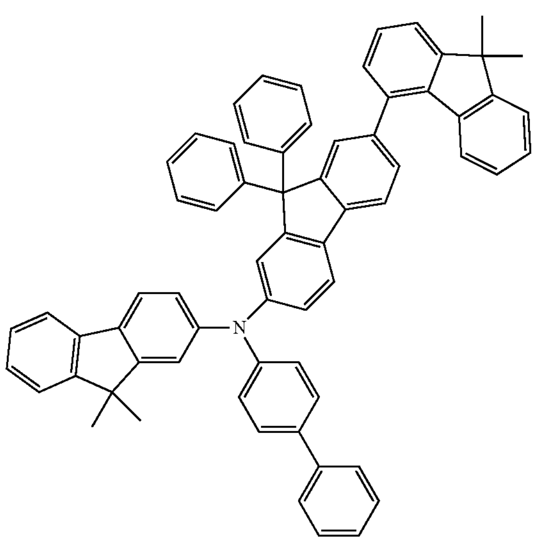
-continued
E-125
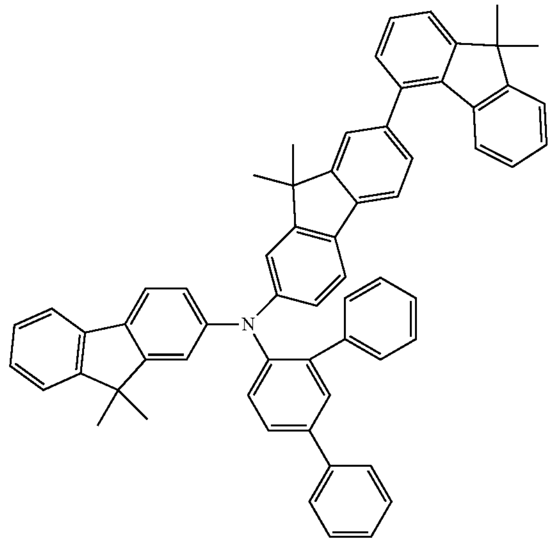
E-126
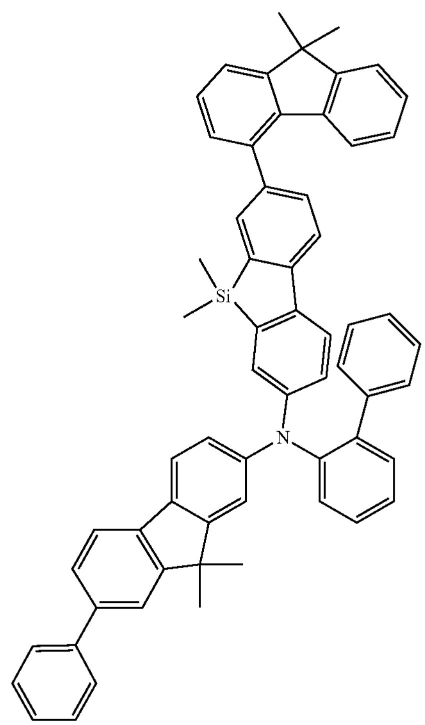

-continued
E-127
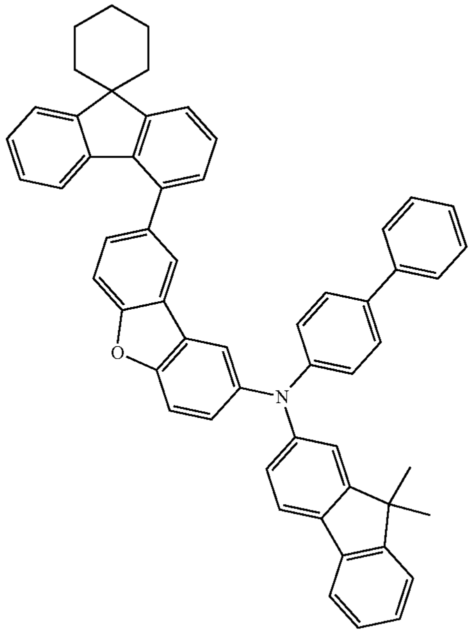
E-128
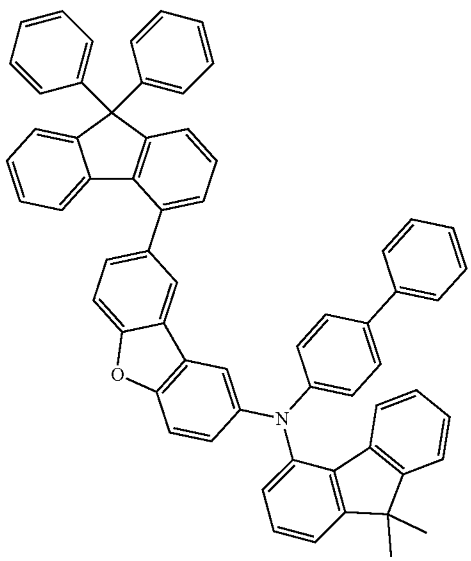
E-130
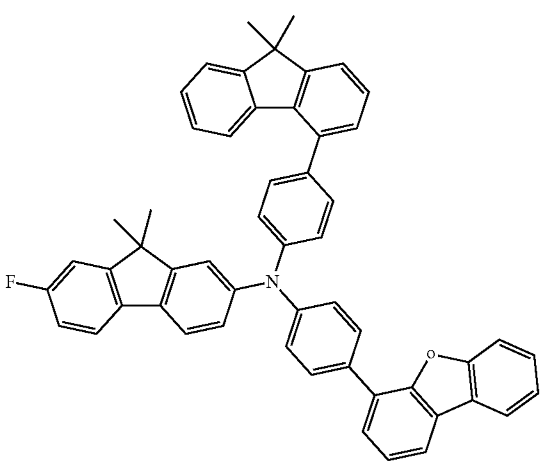
-continued
E-135
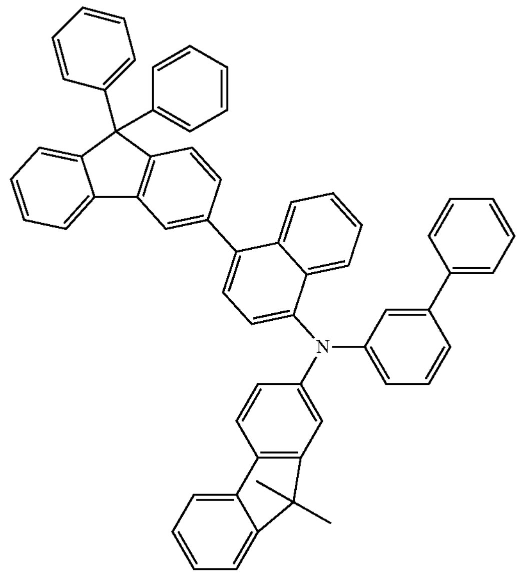
E-137
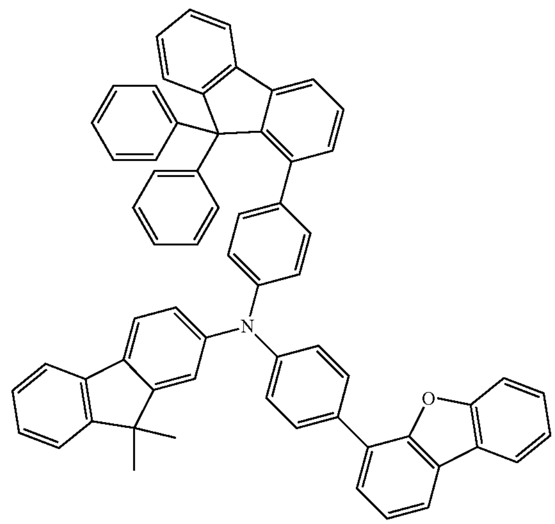
E-138
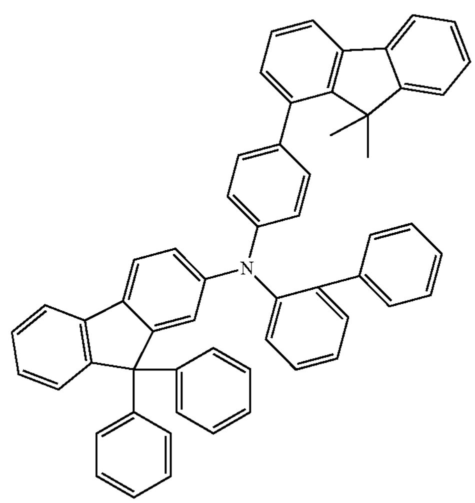

-continued
E-139
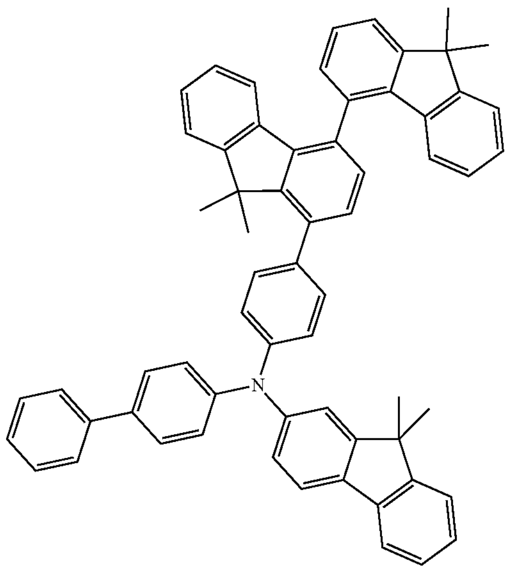
E-140
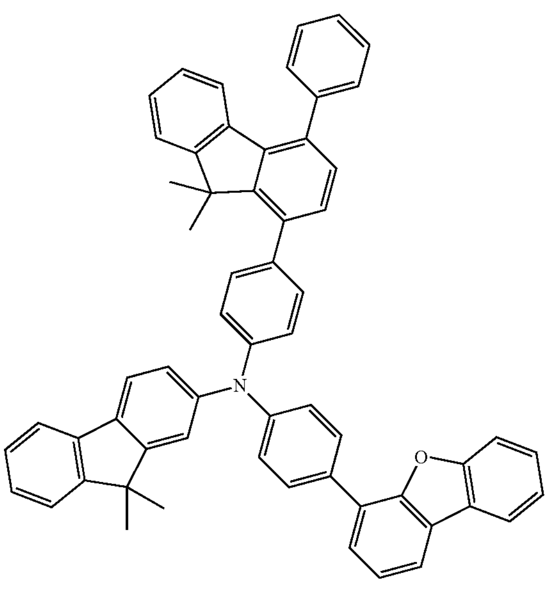
-continued
E-141
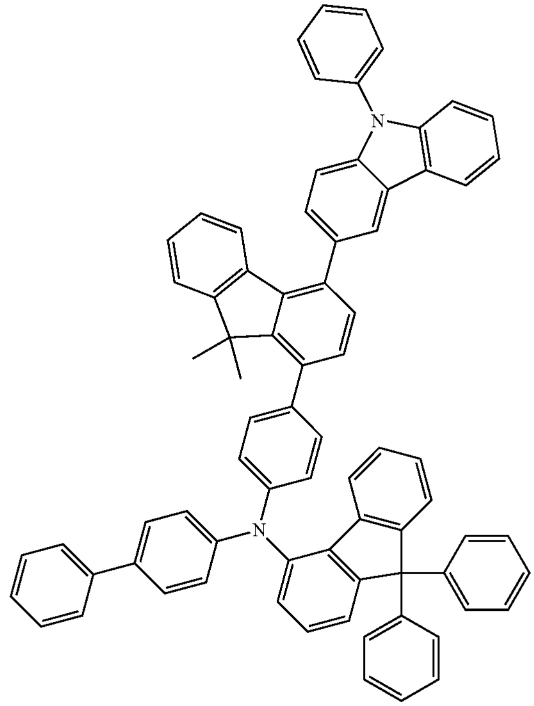
E-142
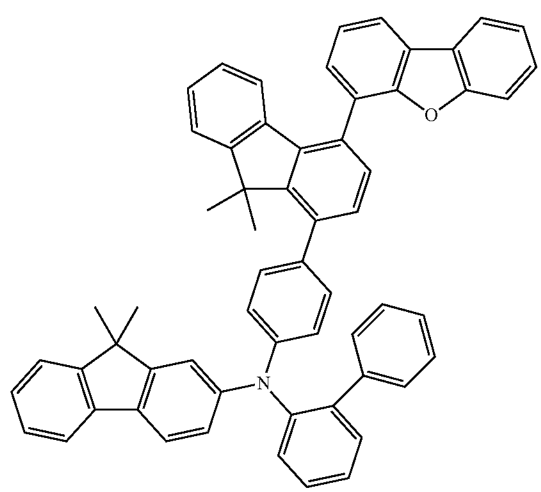

-continued
E-143
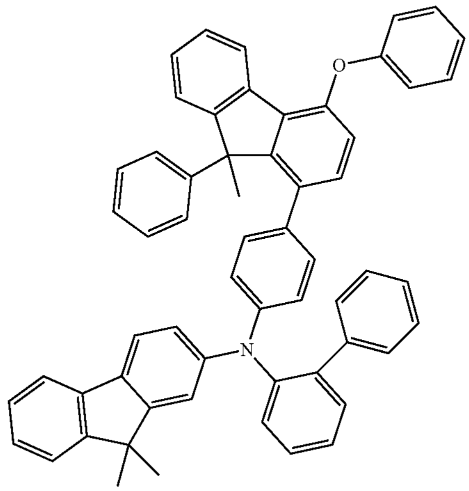
E-144
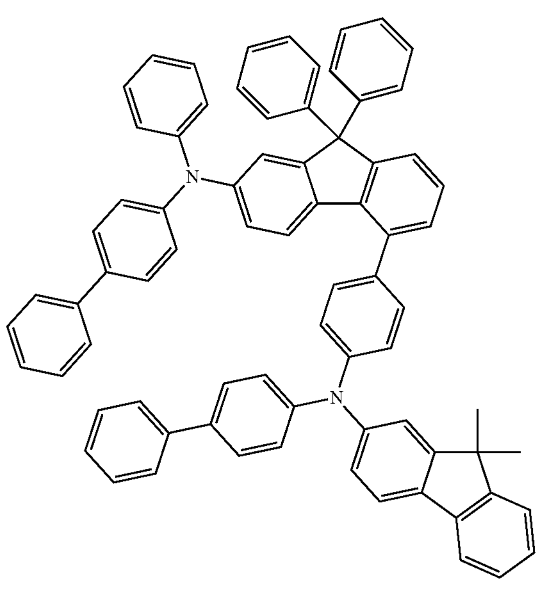
-continued
E-145
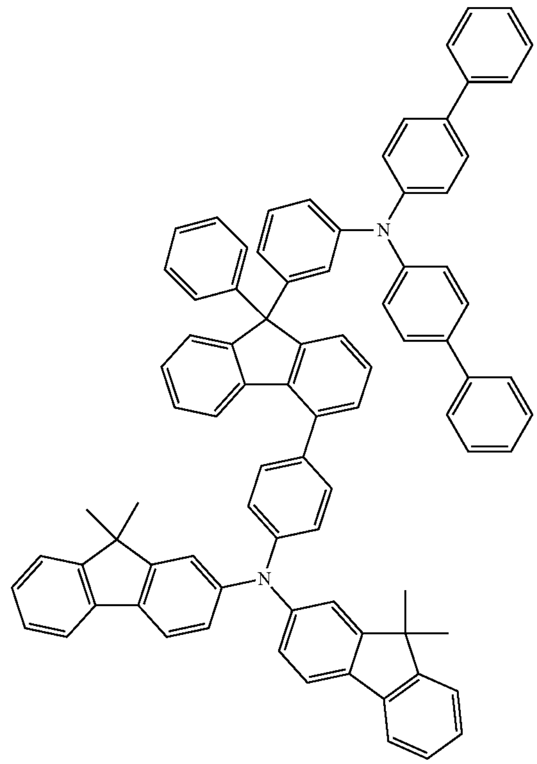
E-146
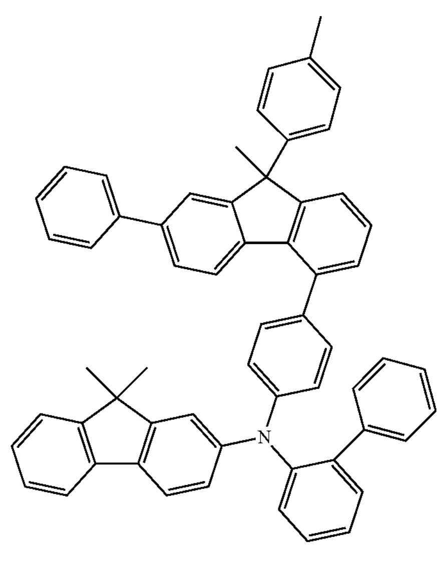

-continued
E-147
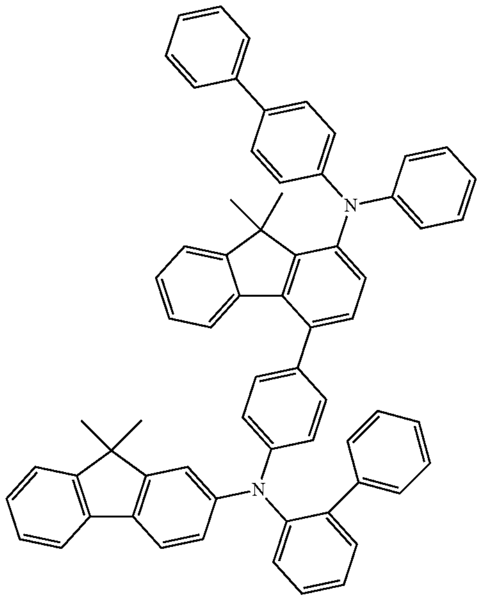
E-148
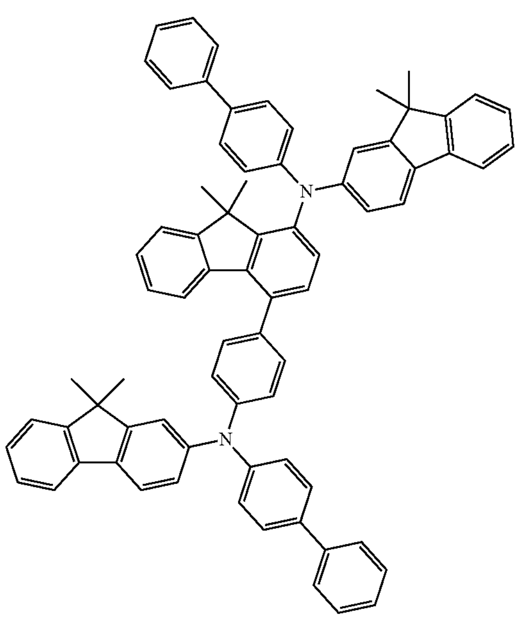
-continued
E-149
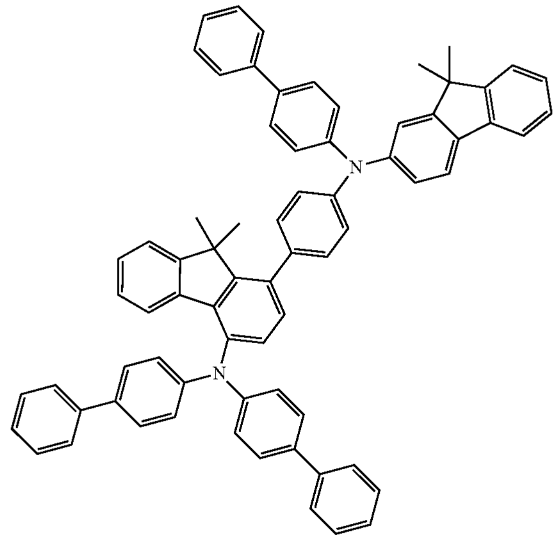
E-150
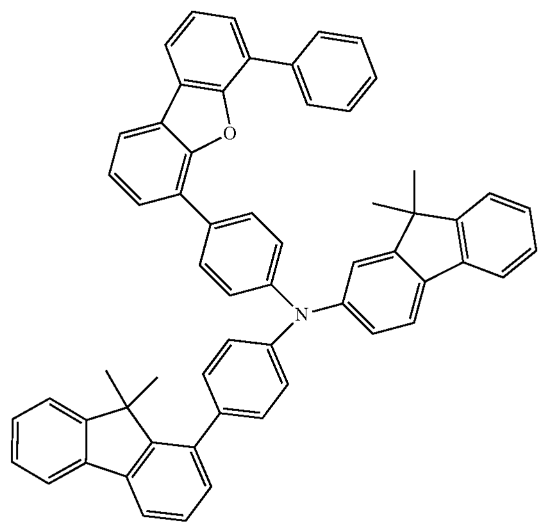
E-151
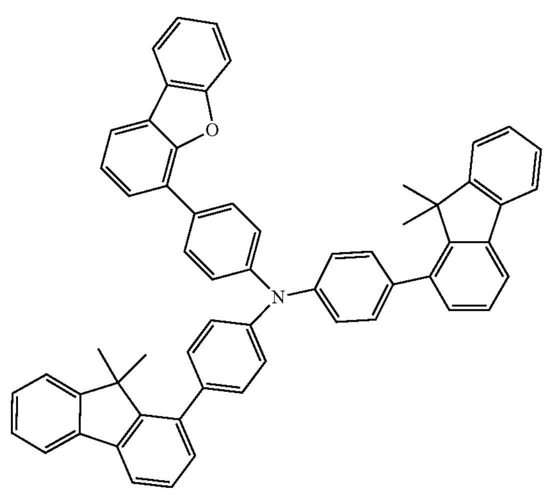

-continued
E-152
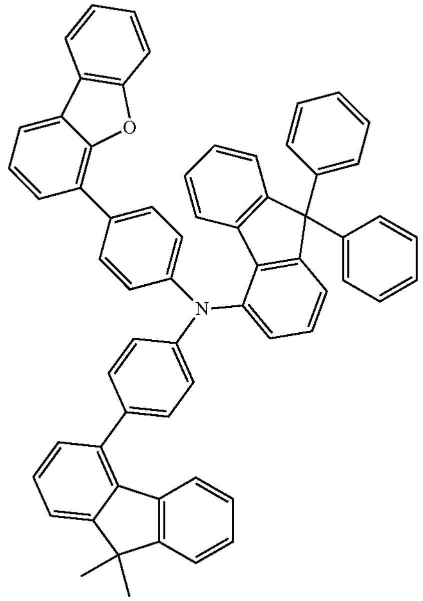
E-153
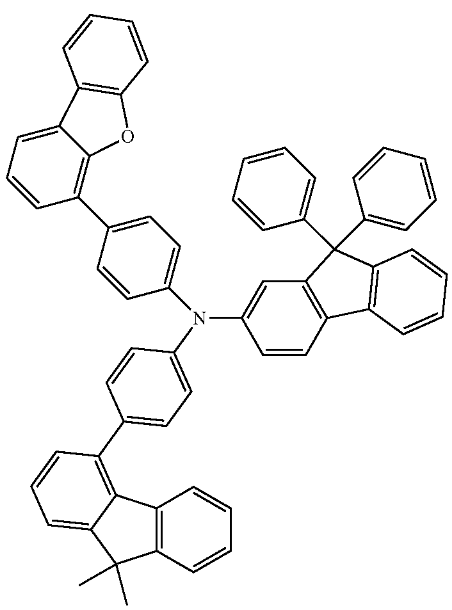
-continued
E-154
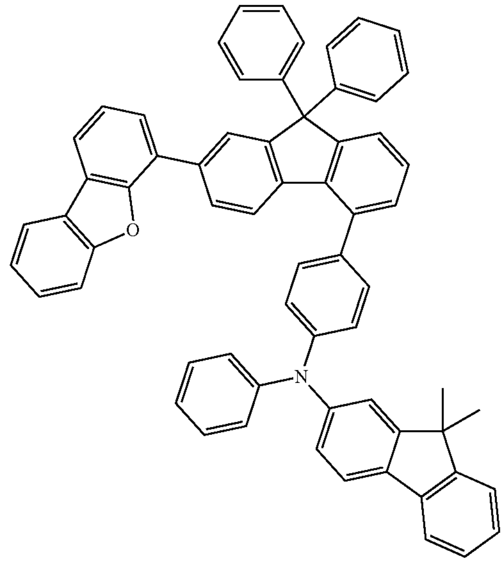
E-155
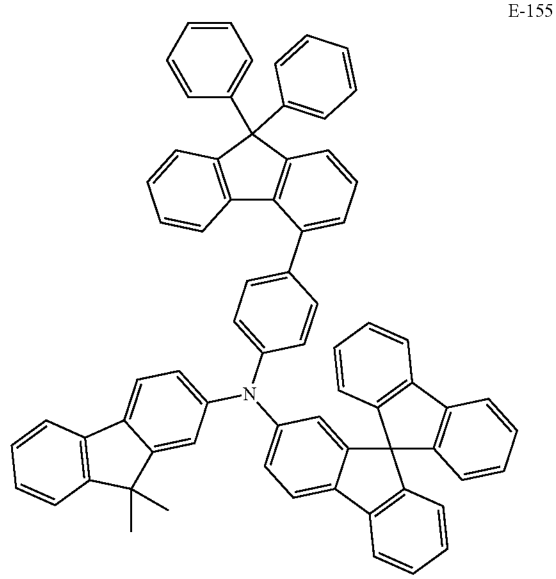

-continued
E-156
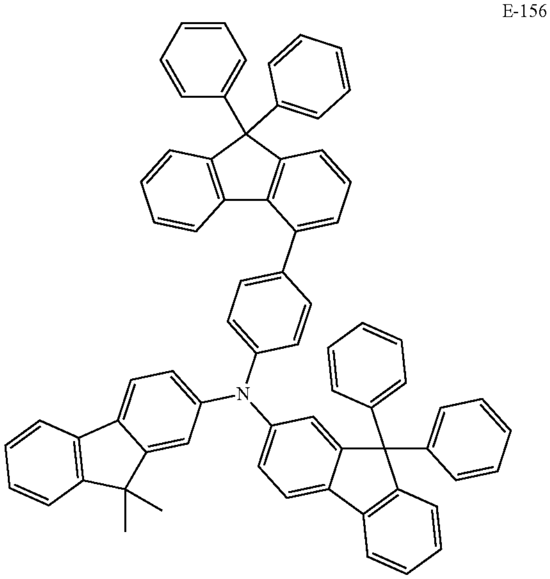
E-157
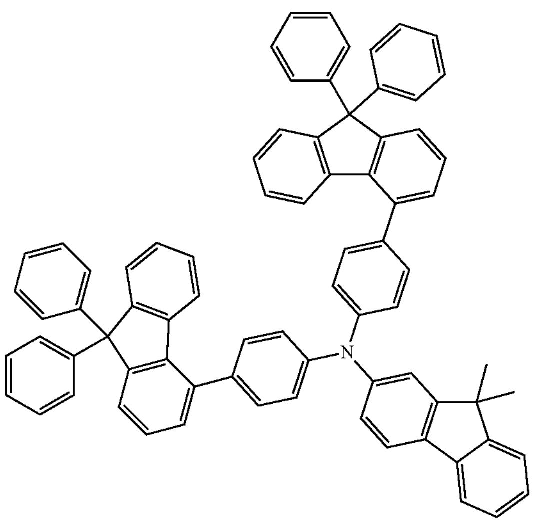
E-159
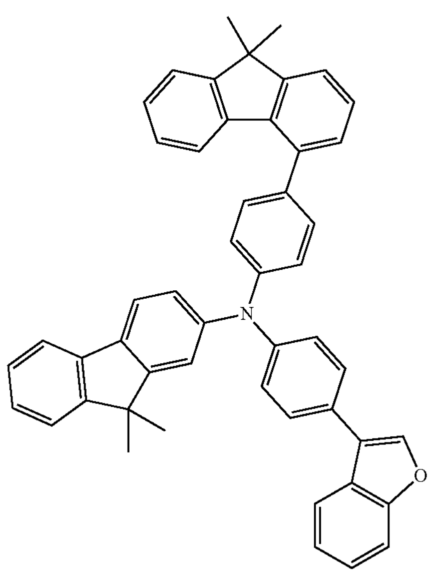
-continued
E-160
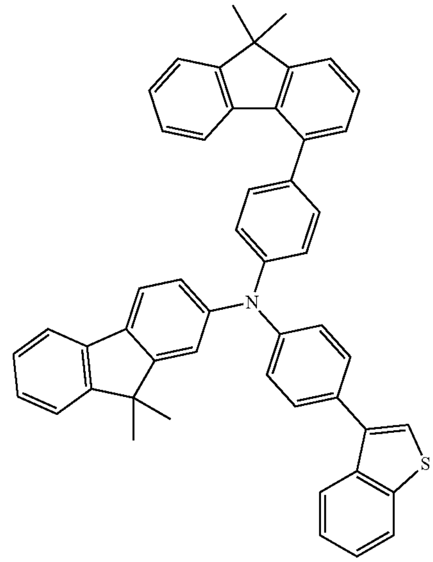
E-161
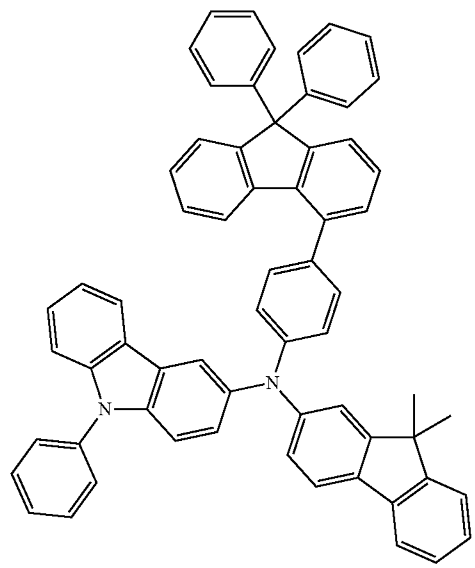
E-162
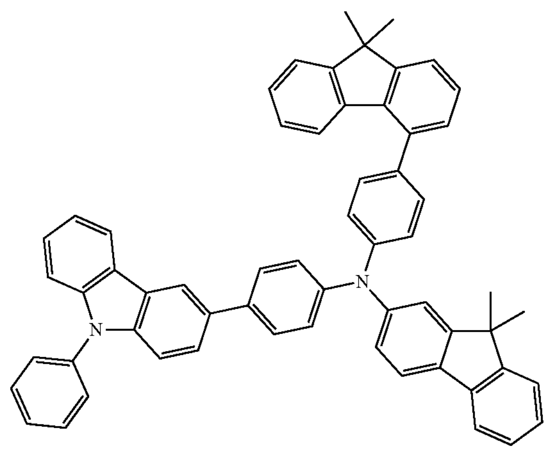

-continued
E-163
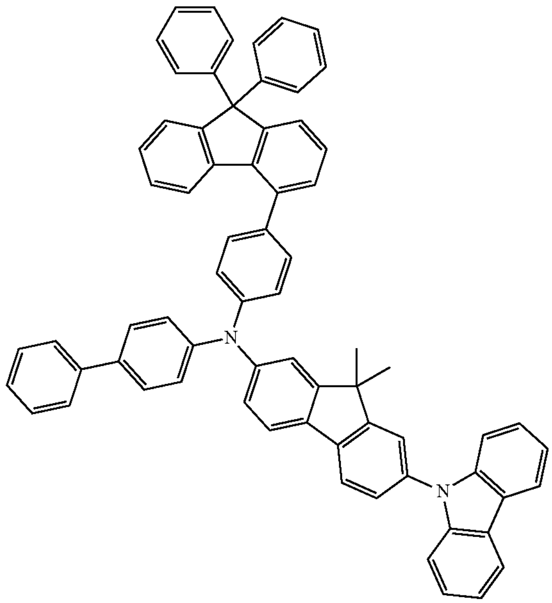
E-164
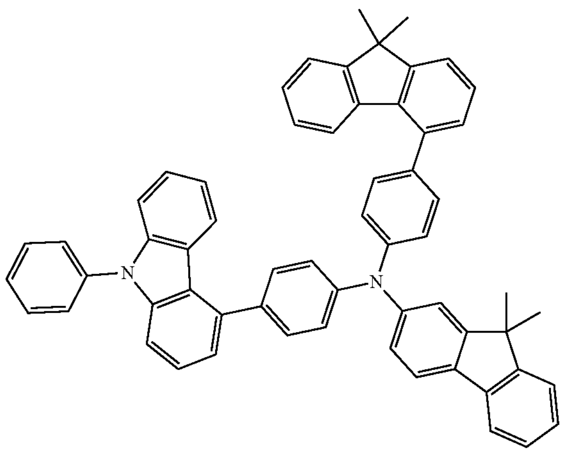
E-165
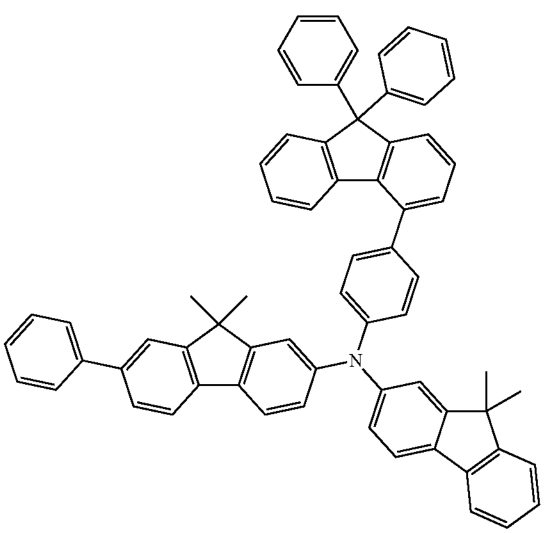
-continued
E-166
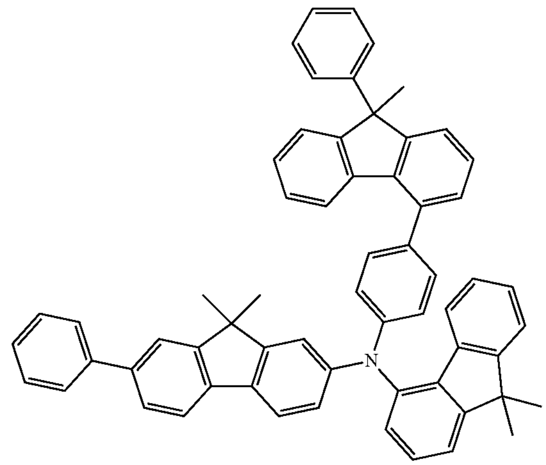
E-167
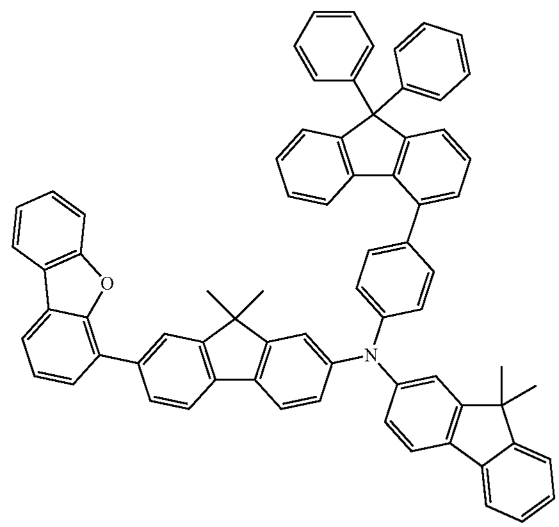
E-168
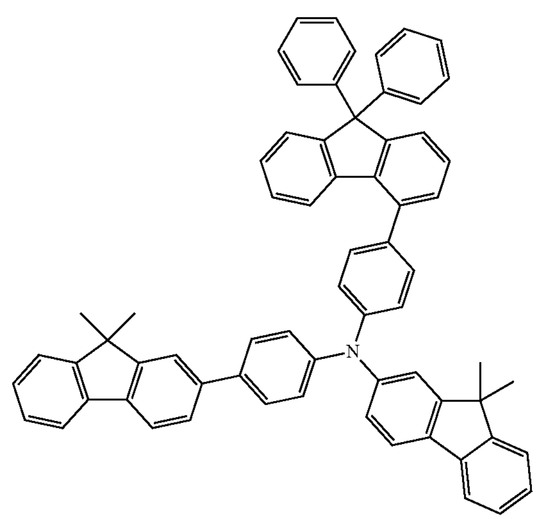

-continued
E-259
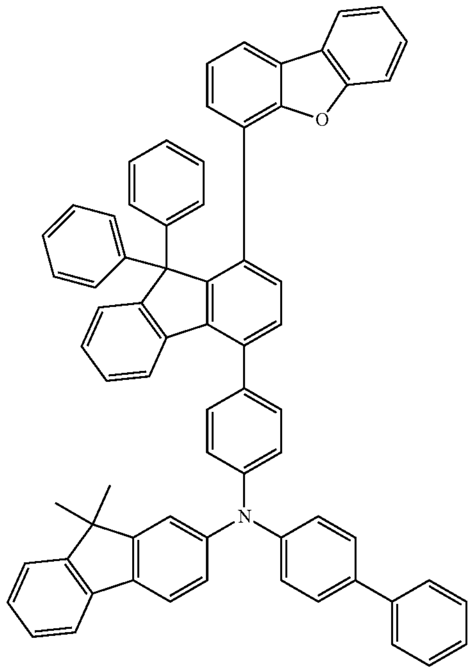
E-260
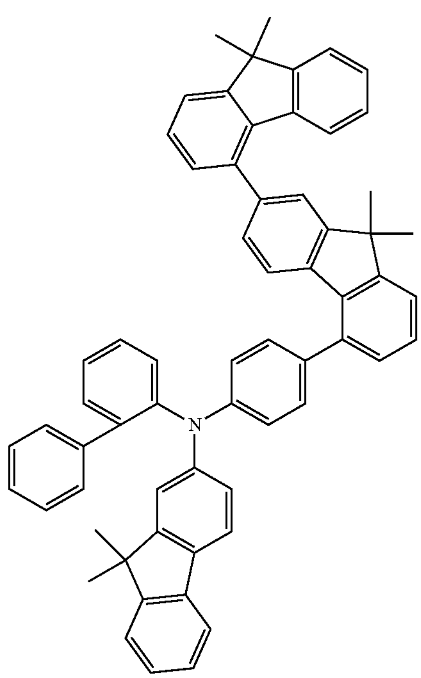
-continued
E-261
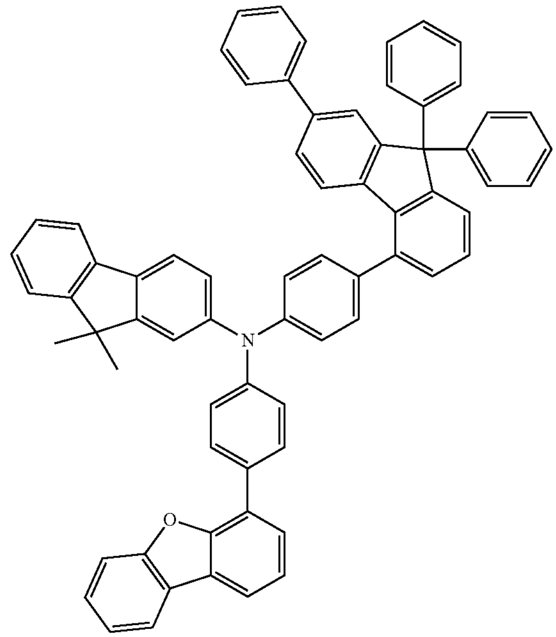
E-262
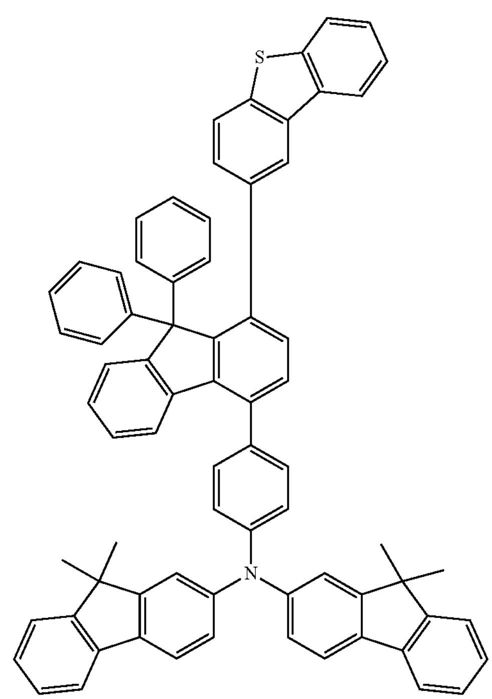

-continued
E-263
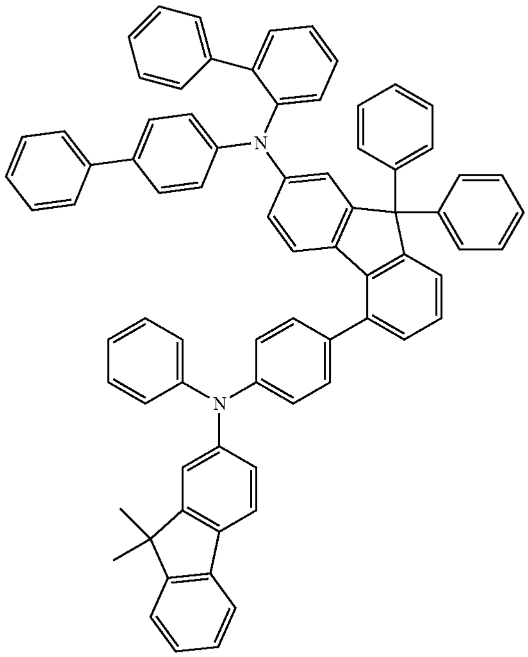
E-264
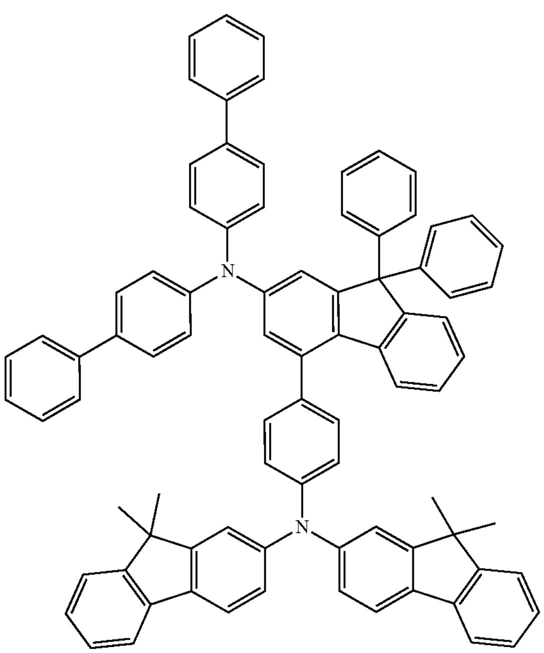
-continued
E-265
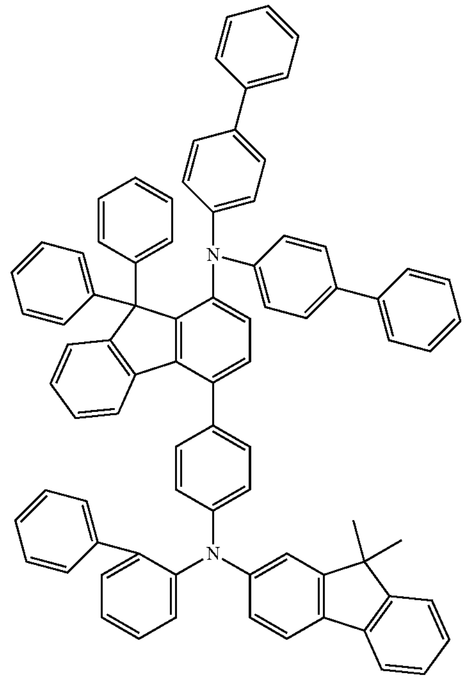
E-266
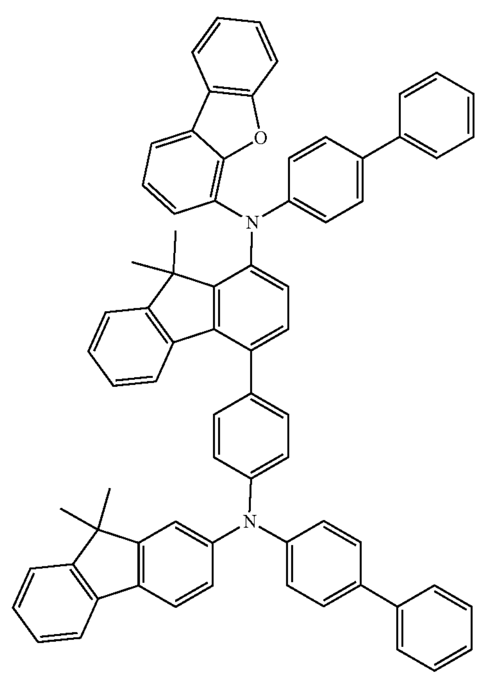

-continued

E-267

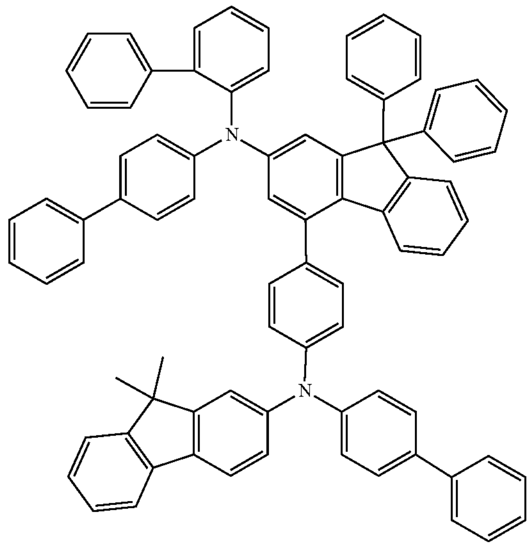

E-268

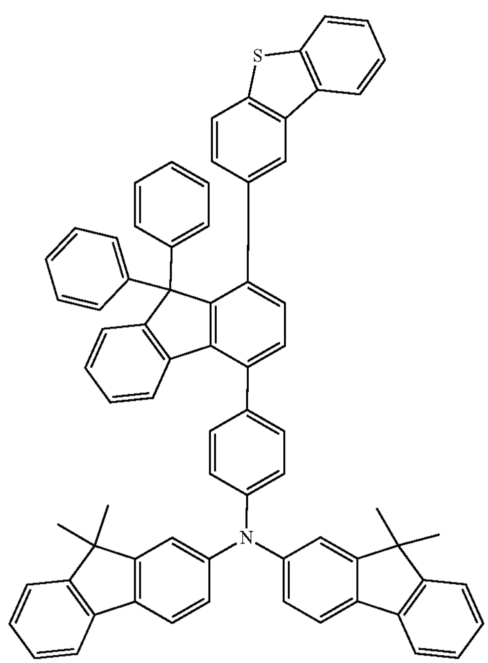

-continued

E-269

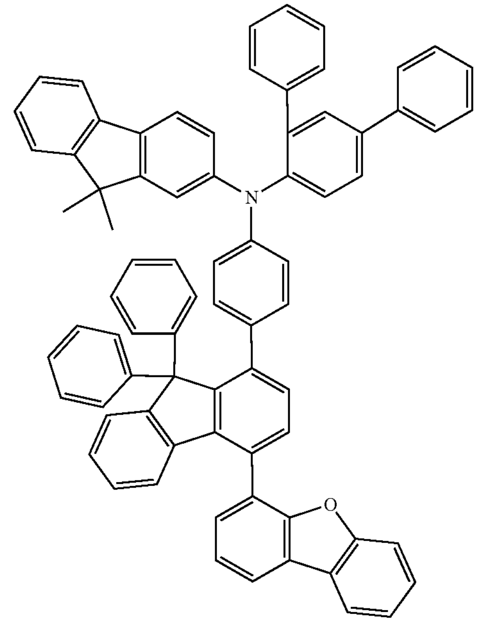

E-270

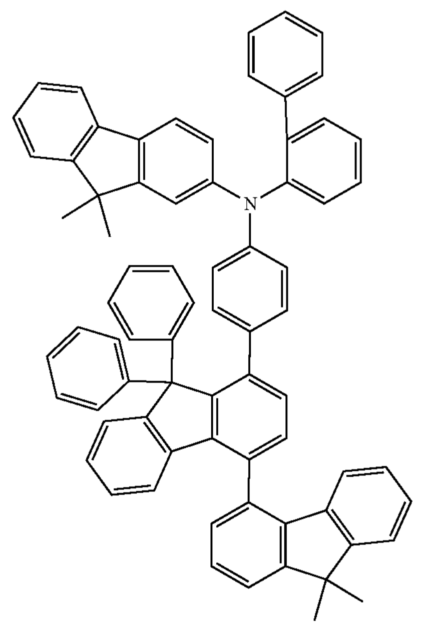

2. An organic light-emitting device comprising:

a substrate having a first sub-pixel region, a second sub-pixel region, and a third sub-pixel region;

a plurality of first electrodes, one on each of the first sub-pixel region, the second sub-pixel region, and the third sub-pixel region on the substrate;

a second electrode facing the plurality of first electrodes; and an organic layer between the first electrode and the second electrode, the organic layer comprising an emission layer and a hole transport region between the emission layer and the first electrode, wherein the emission layer consists of one host and one or more dopants, the one host consisting of a first compound selected from Compounds A-101 to A-221 and B-101 to B-230, the hole transport region comprises an emission auxiliary layer on the emission layer, a hole transport layer directly on the emission auxiliary layer, and a hole injection layer on the hole transport layer,
the emission auxiliary layer comprises a second compound selected from Compounds E-104 to E-113, E-115, E-118, E-120, E-122 to E-128, E-130, E-135, E-137 to E-157, E-159 to E-168, and E-259 to E-270:
A-101
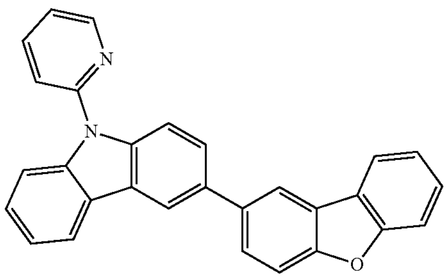
A-102
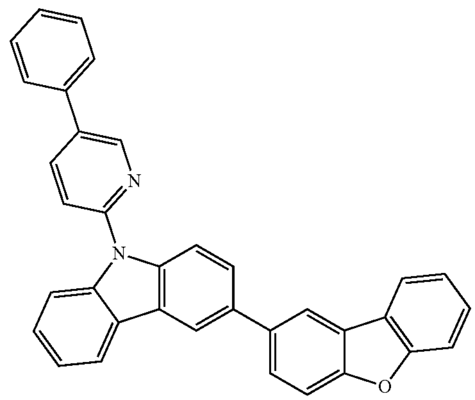
A-103
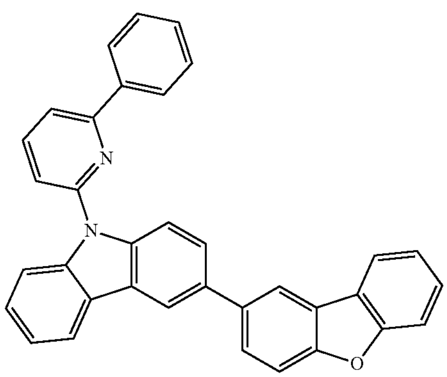
A-104
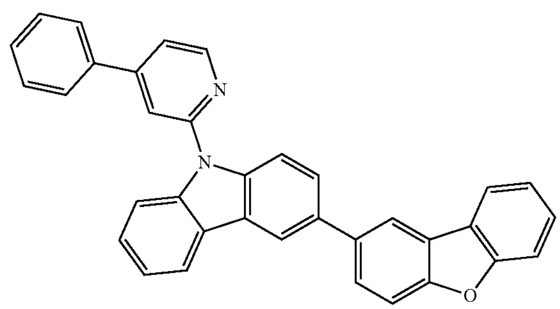
A-105
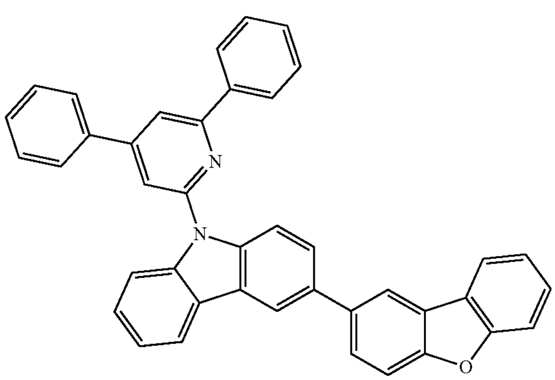

-continued
A-106
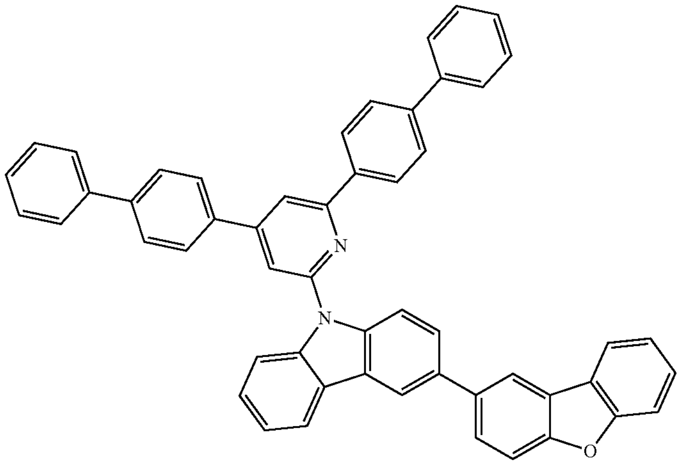
A-107
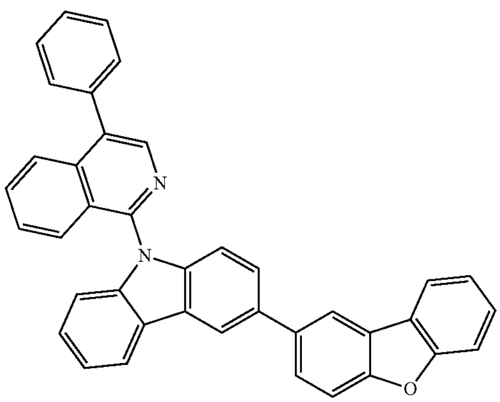
A-108
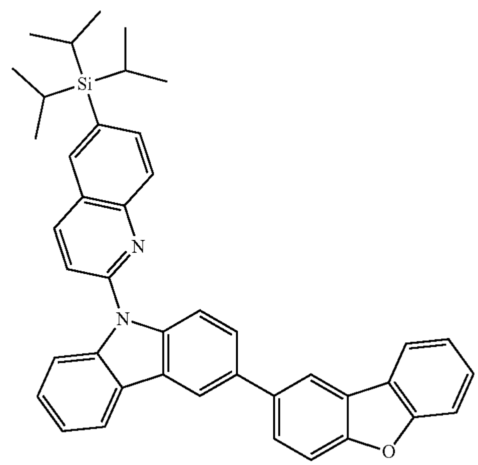
A-109
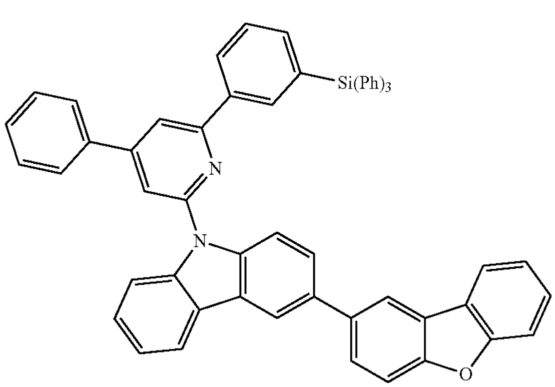
A-110
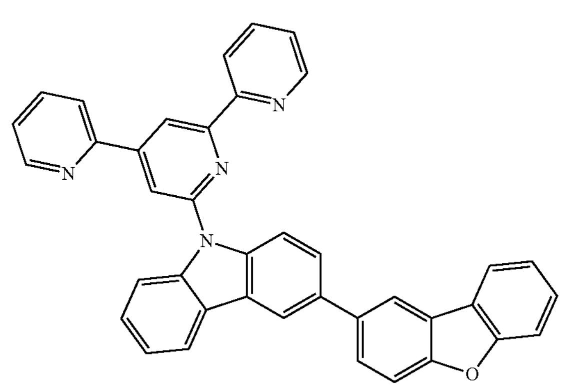

-continued
A-111
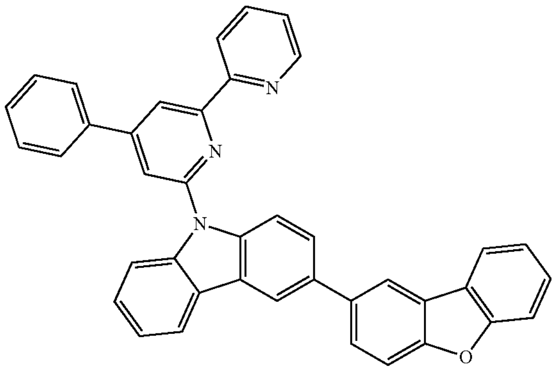
A-112
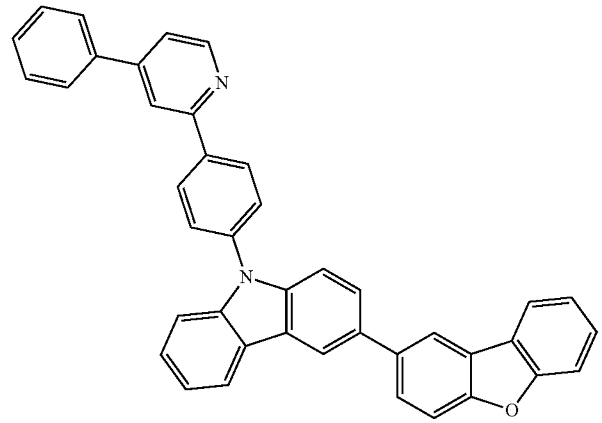
A-113
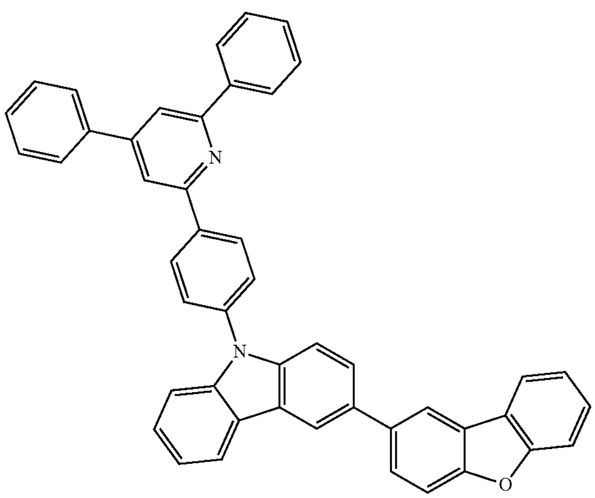
A-114
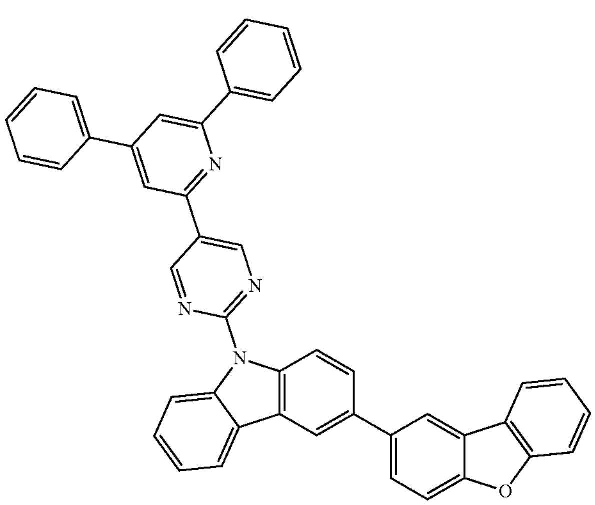

-continued
A-115
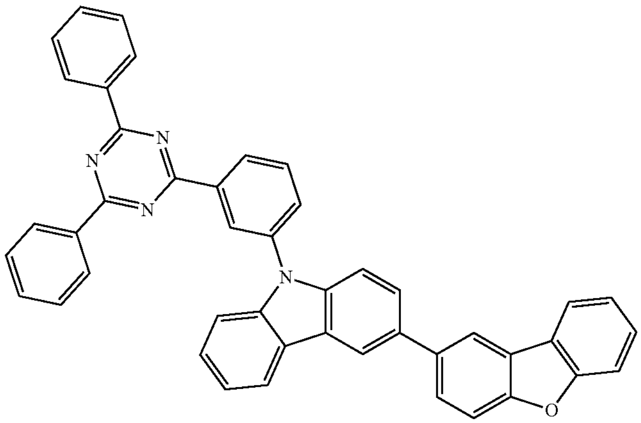
A-116
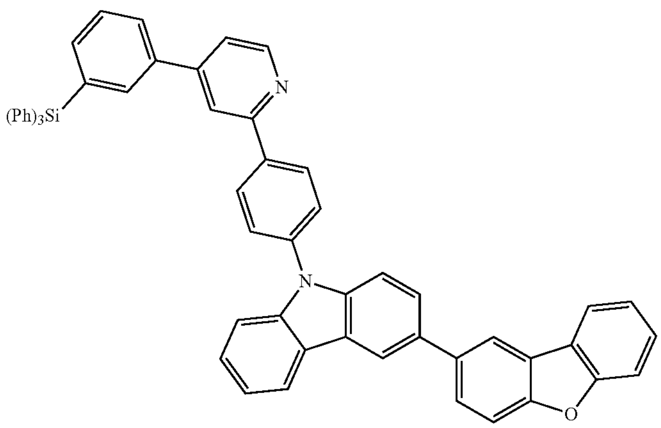
A-117
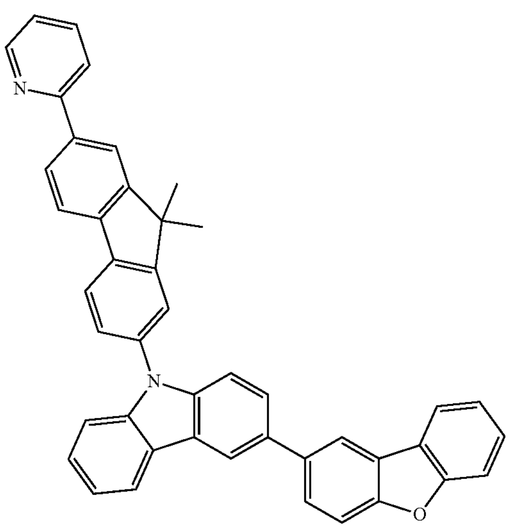
A-118
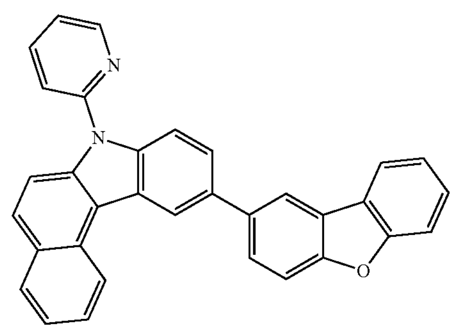

-continued
A-119
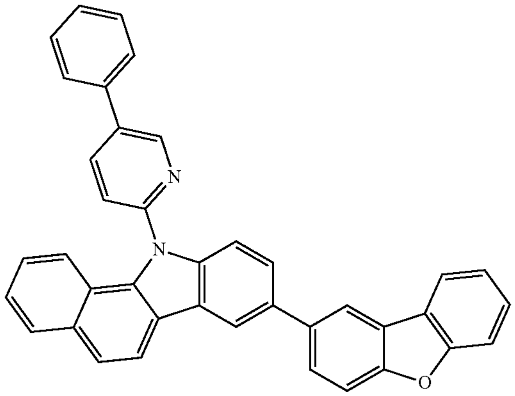
A-120
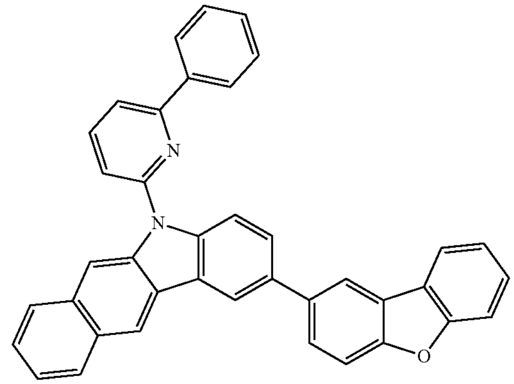
A-121
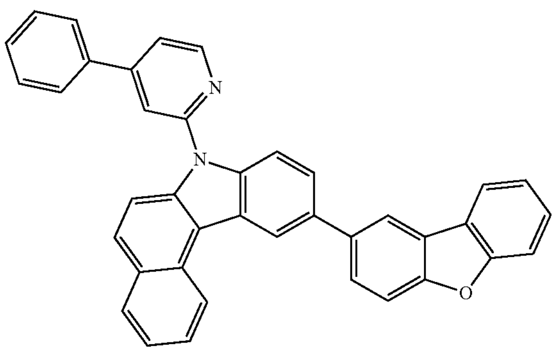
A-122
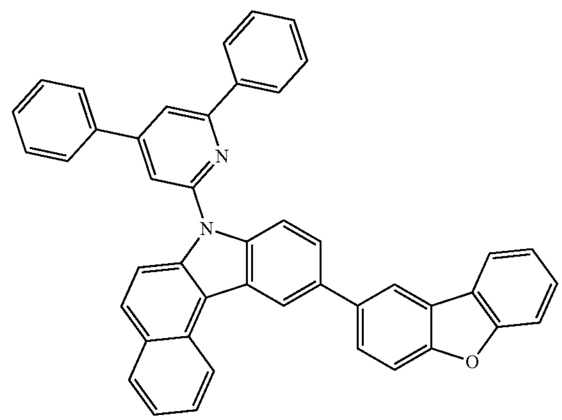
A-123
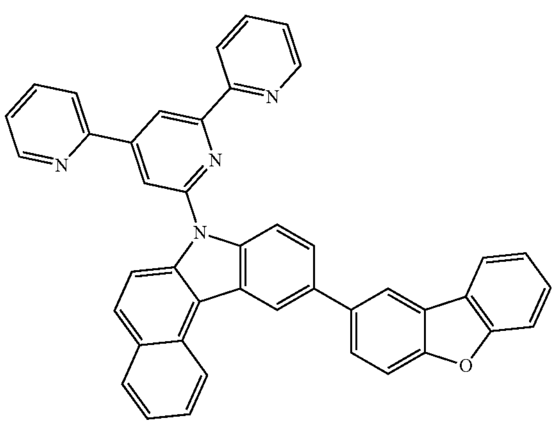
A-124
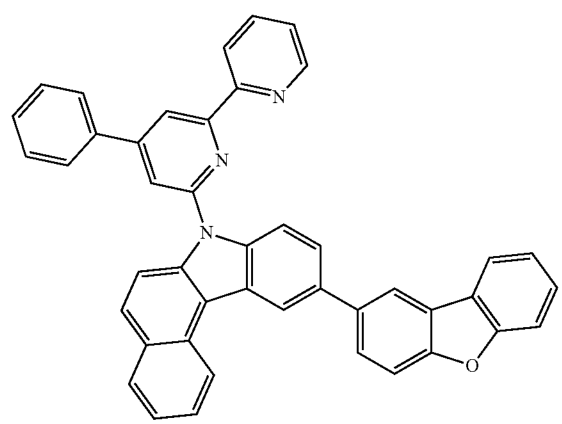

-continued
A-125
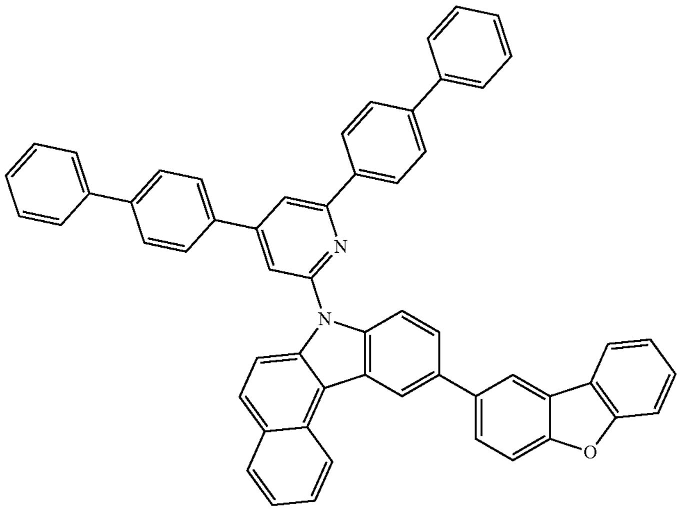
A-126
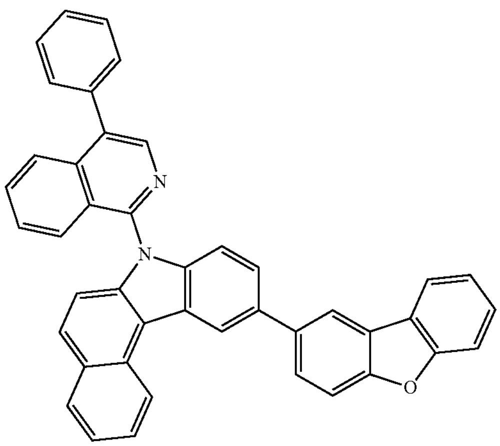
A-127
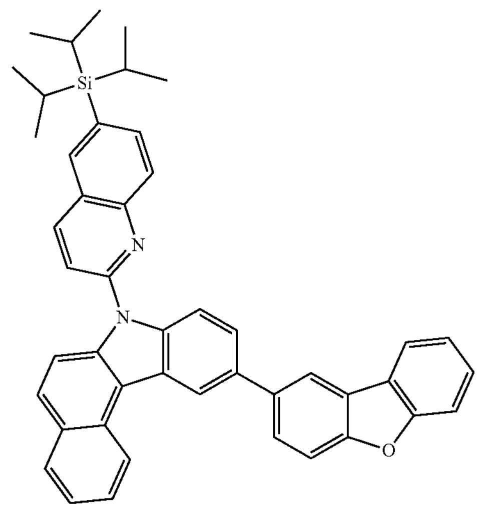
A-128
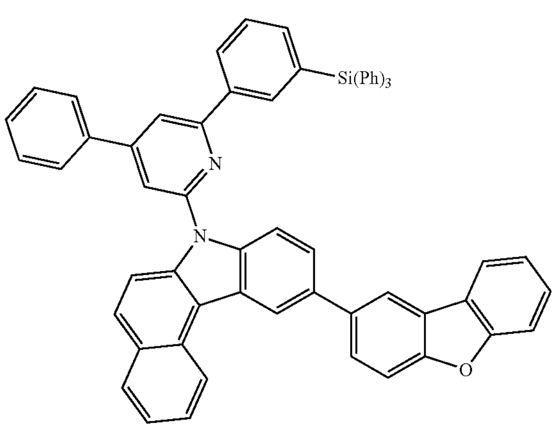
A-129
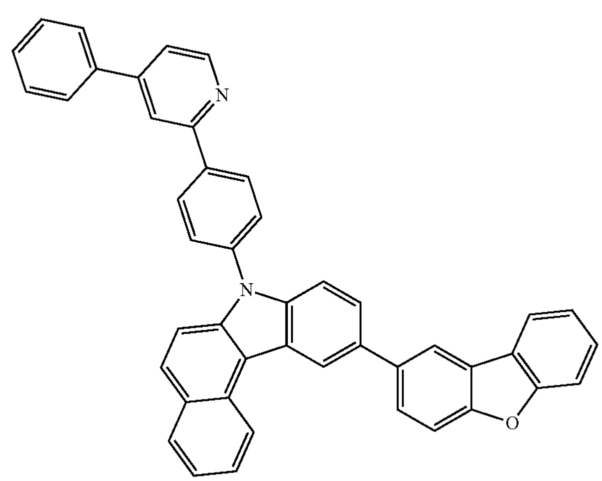

-continued
A-130
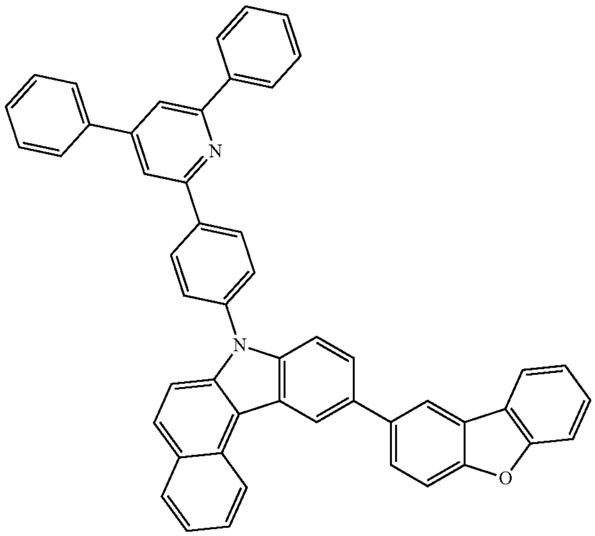
A-131
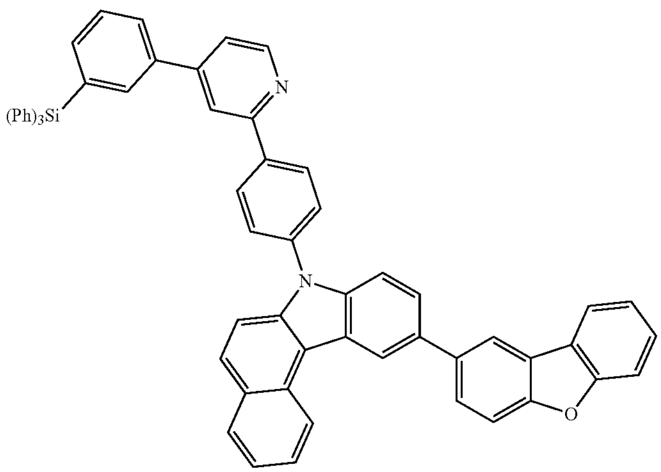
A-132
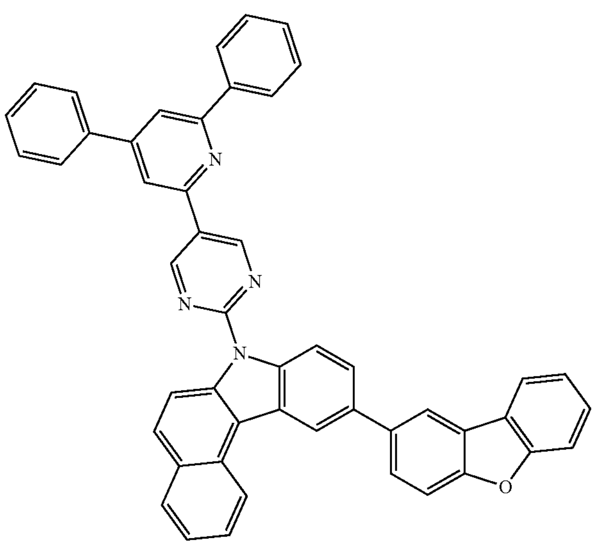

-continued
A-133
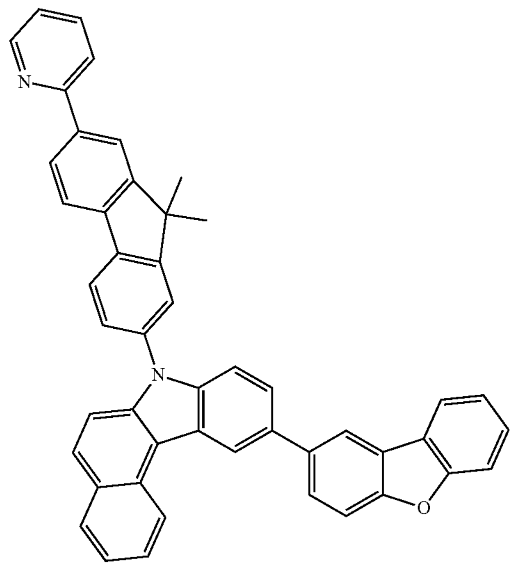
A-134
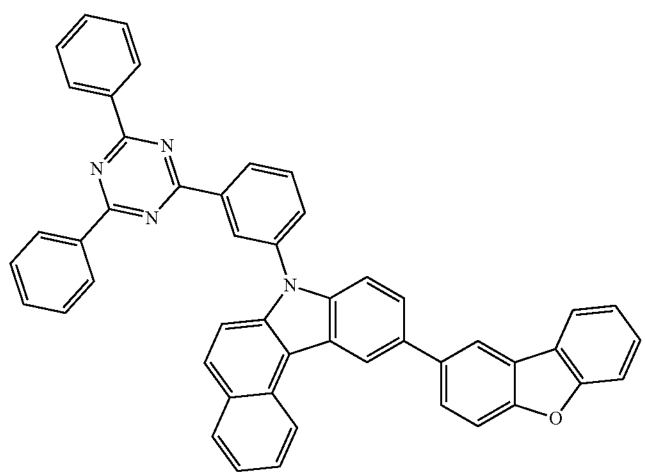
A-135
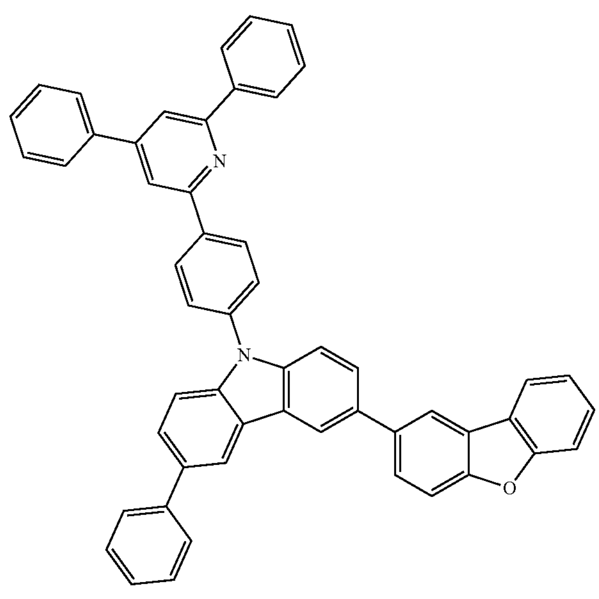

-continued
A-136
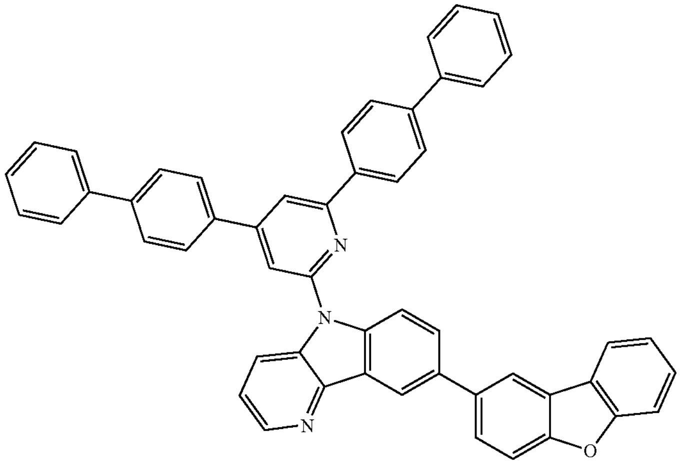
A-137
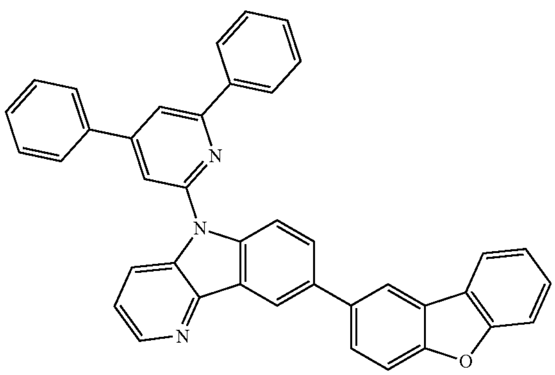
A-138
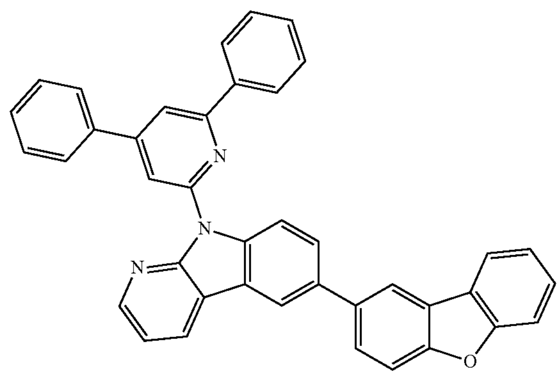
A-139
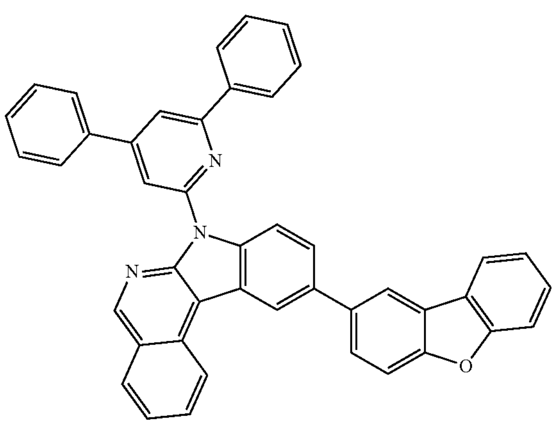
A-140
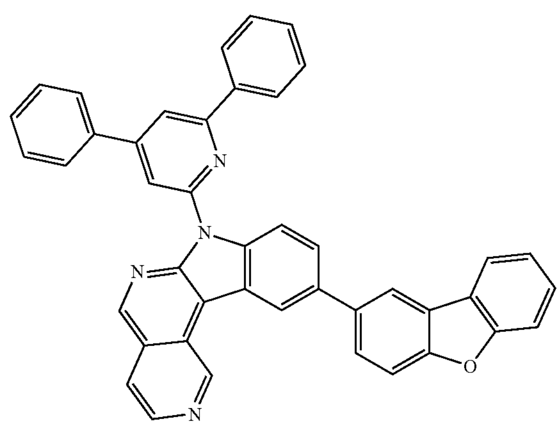

-continued
A-141
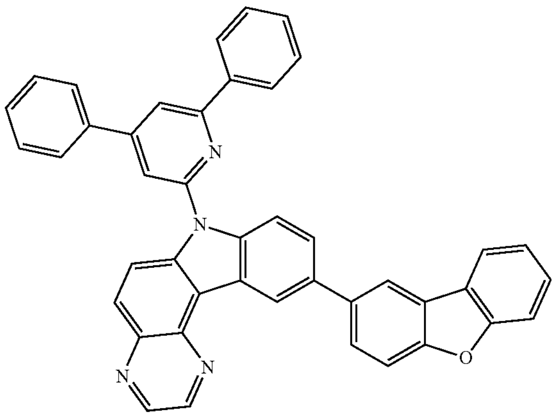
A-142
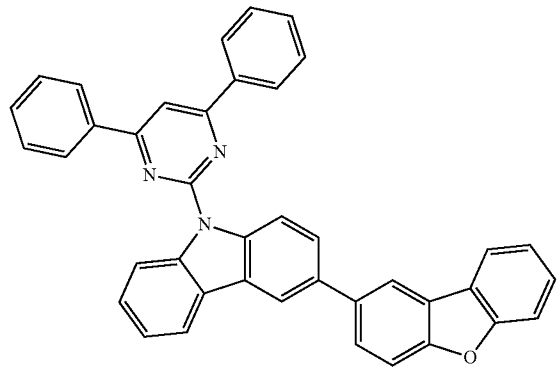
A-143
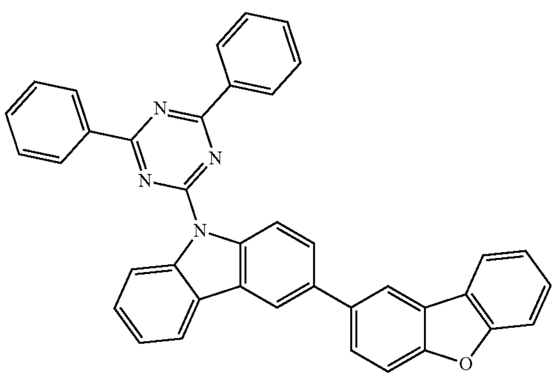
A-144
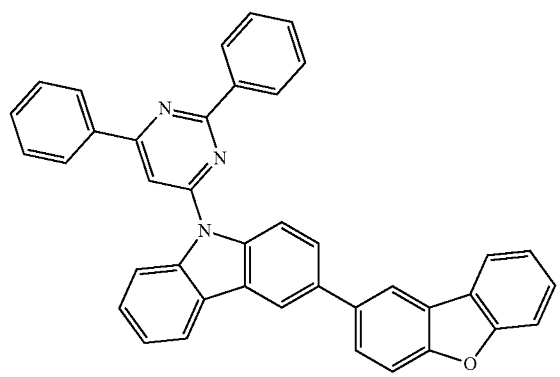
A-145
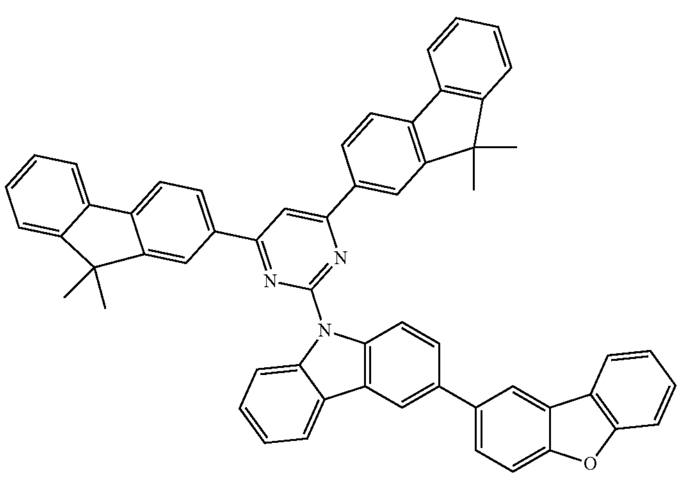

-continued
A-146
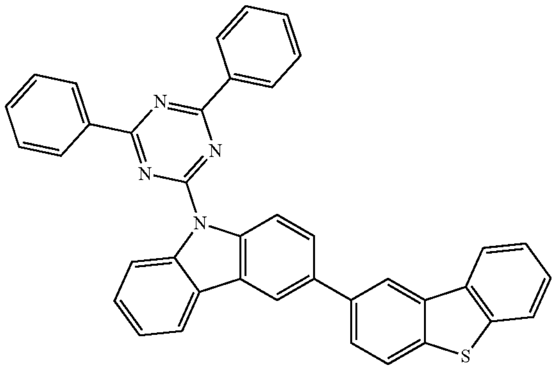
A-147
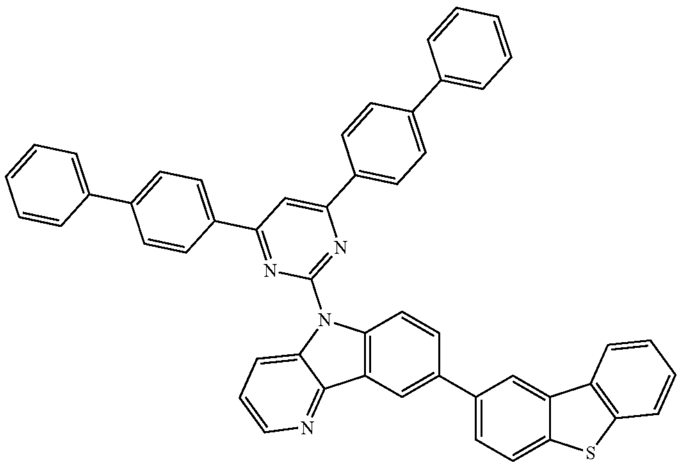
A-148
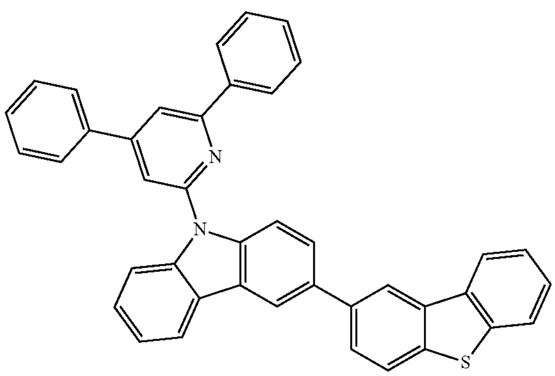
A-149
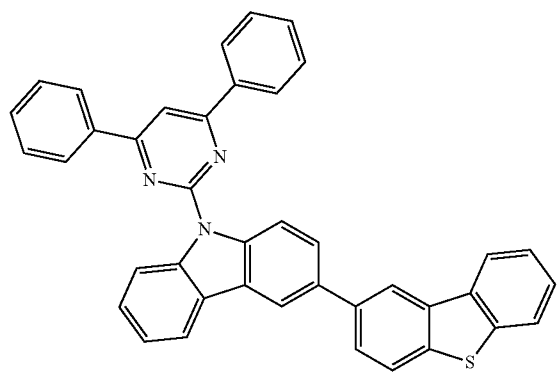
A-150
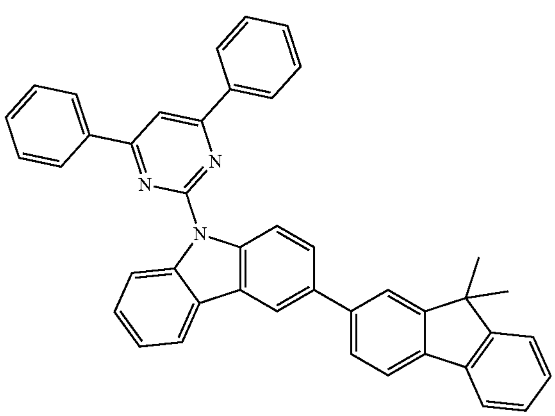
A-151
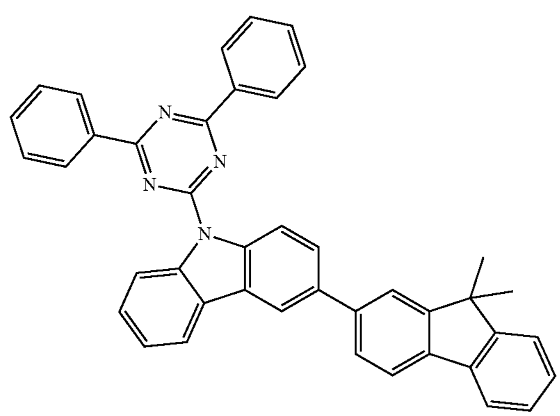

-continued
A-152
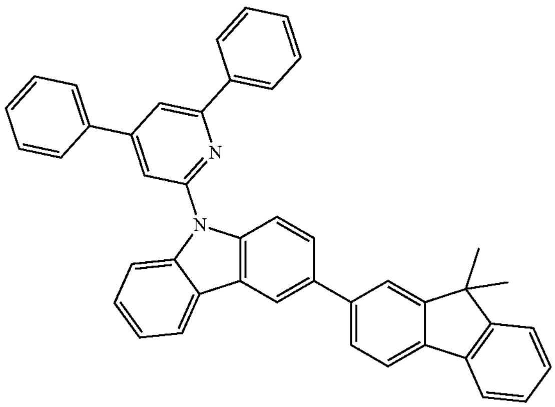
A-153
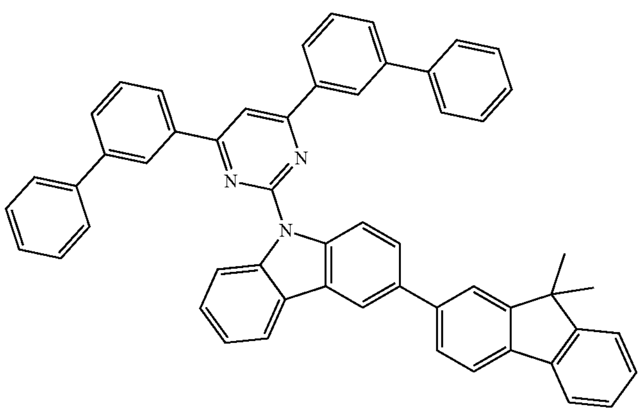
A-154
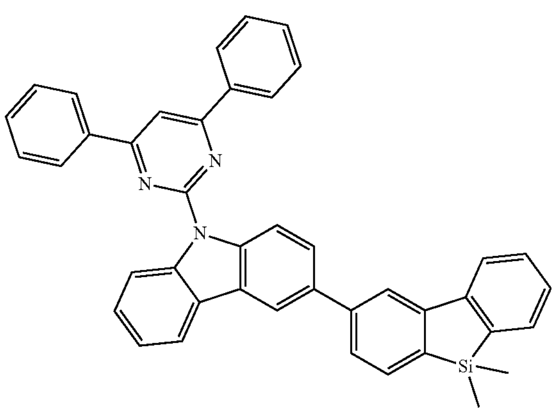
A-155
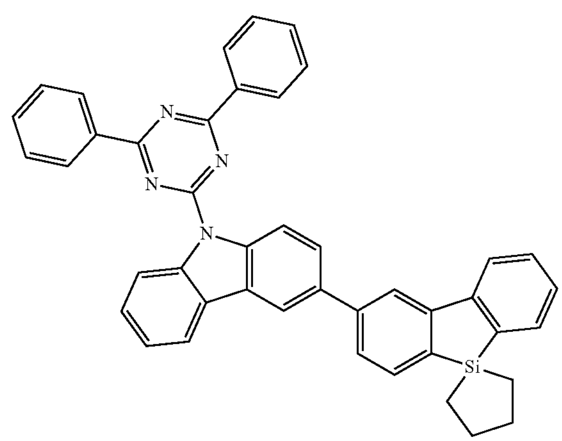

-continued
A-156
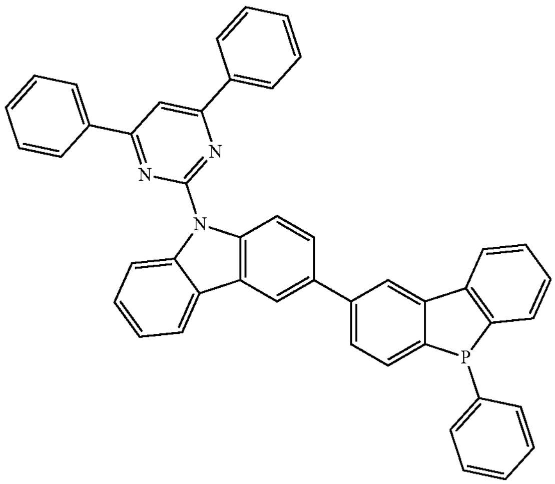
A-157
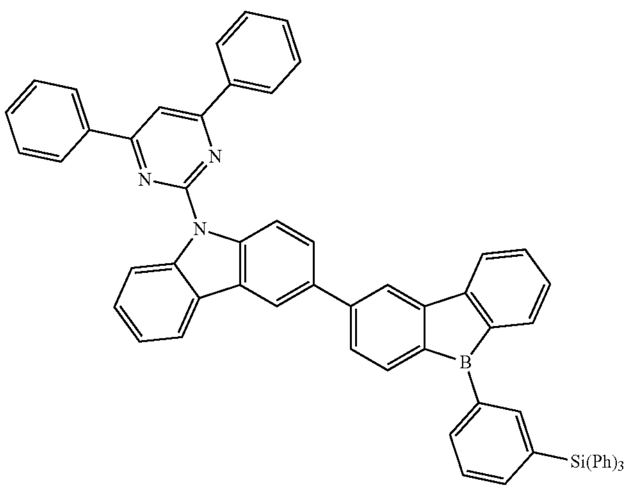
A-158
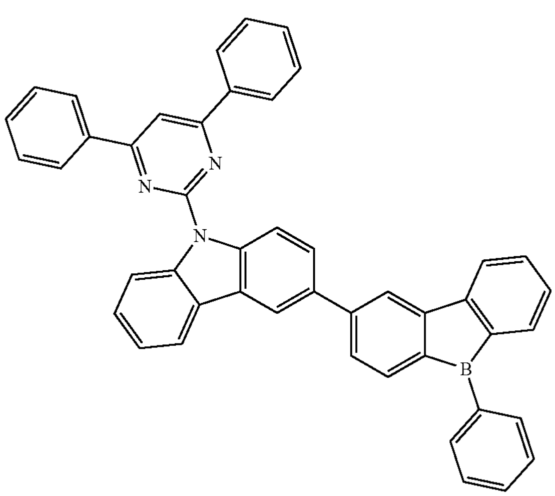
A-159
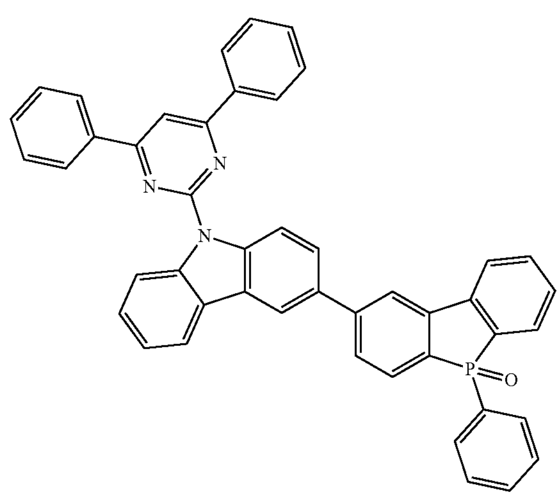

-continued
A-160
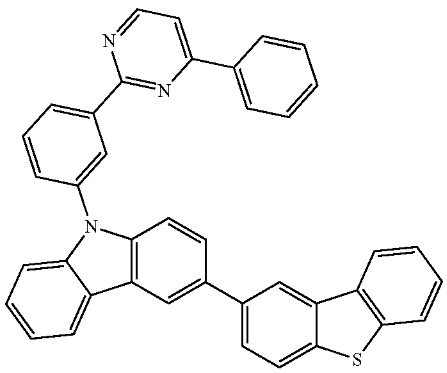
A-161
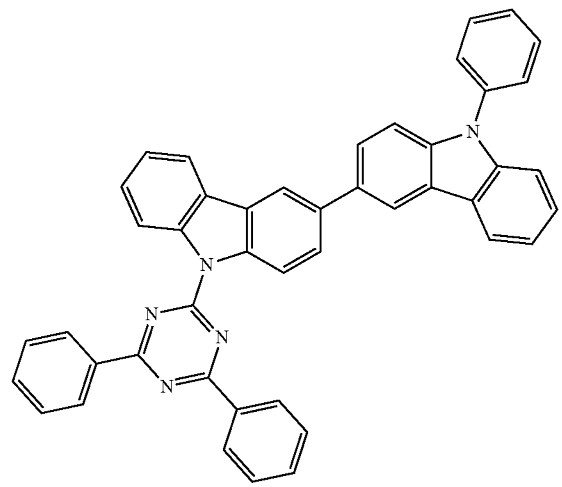
A-162
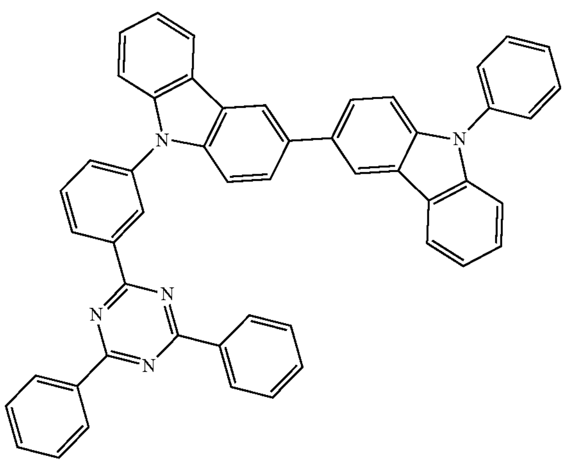
A-163
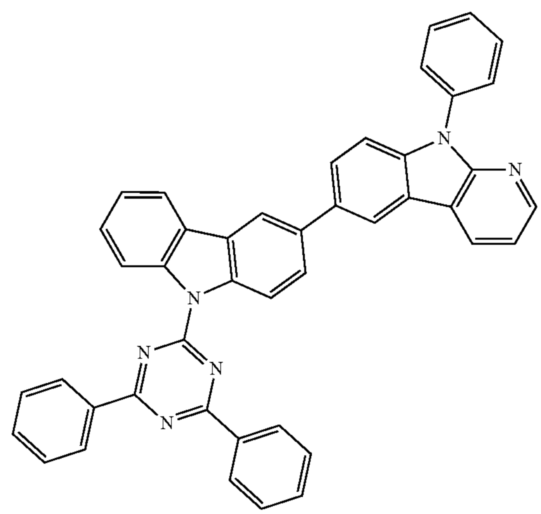
A-164
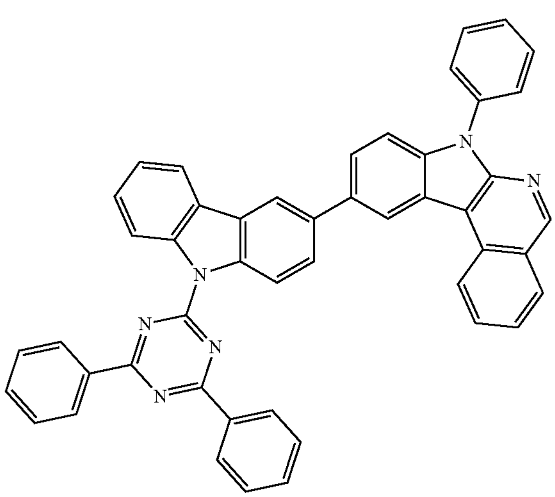
A-165
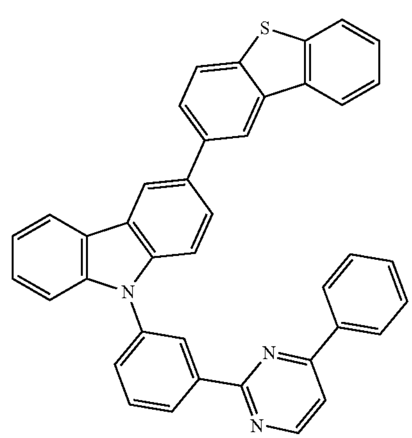

-continued
A-166
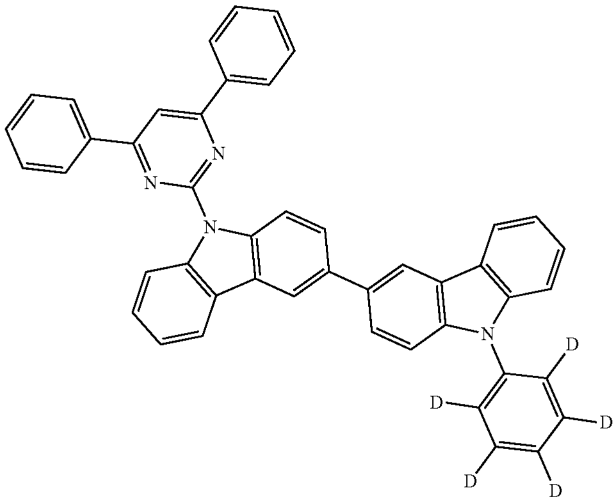
A-167
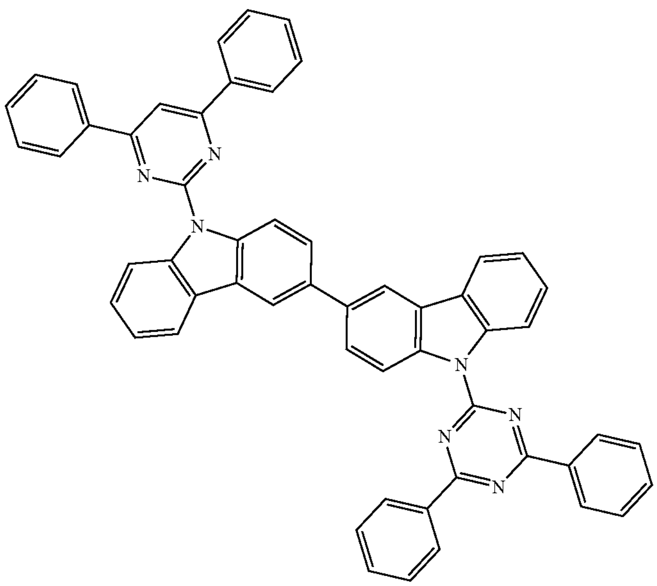
A-168
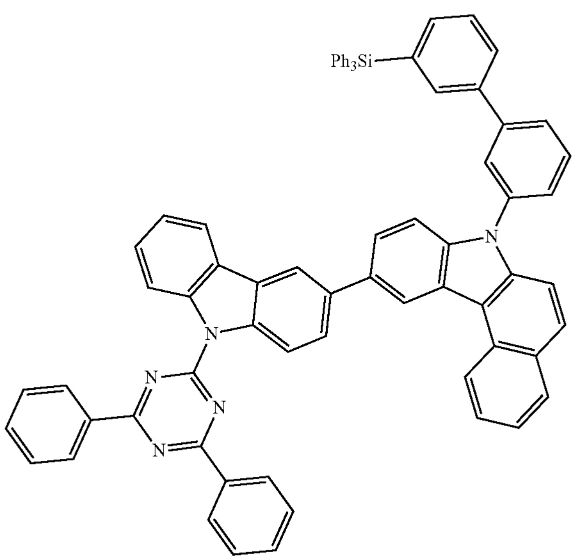
A-169
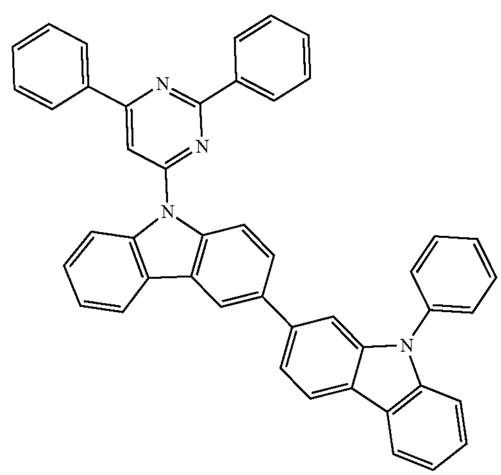

-continued
A-170
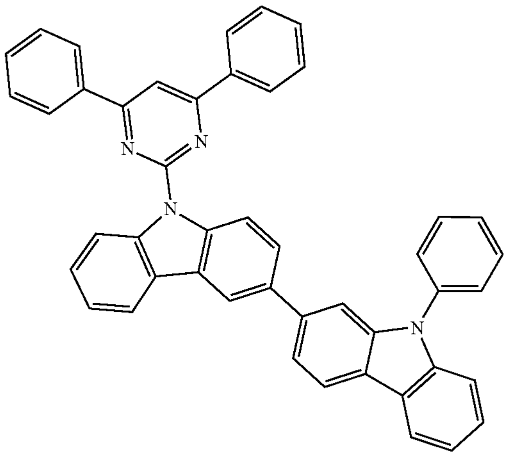
A-171
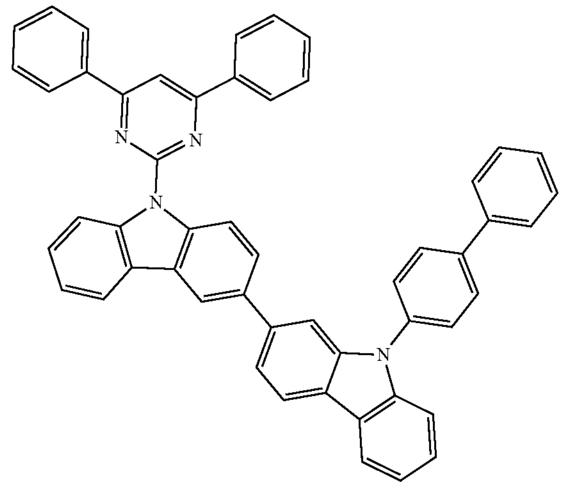
A-172
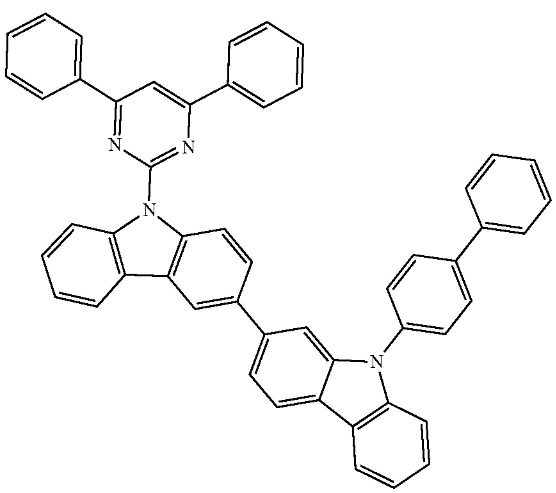
A-173
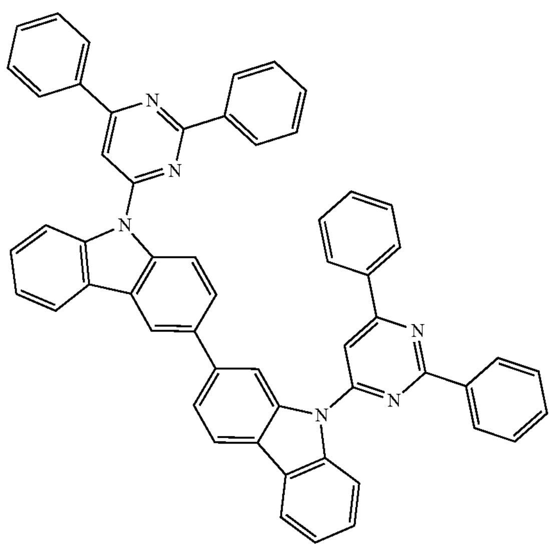
A-174
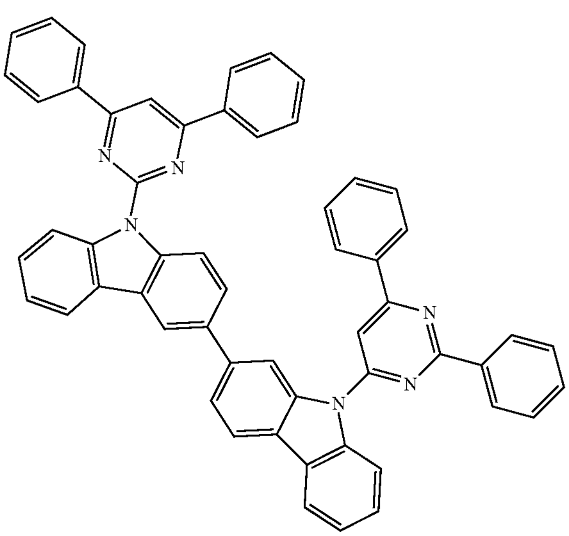

-continued
A-175
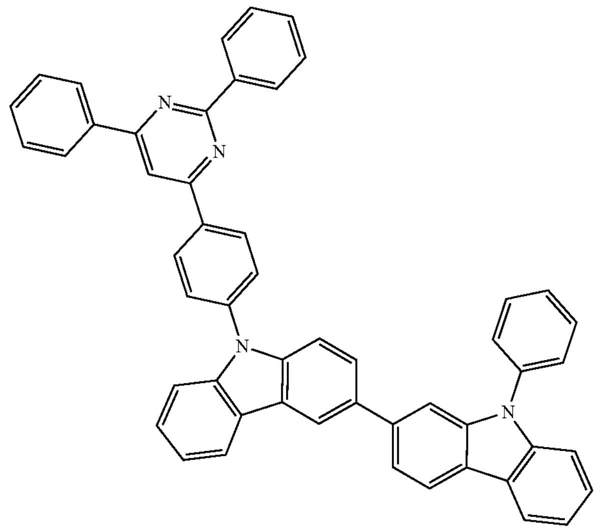
A-176
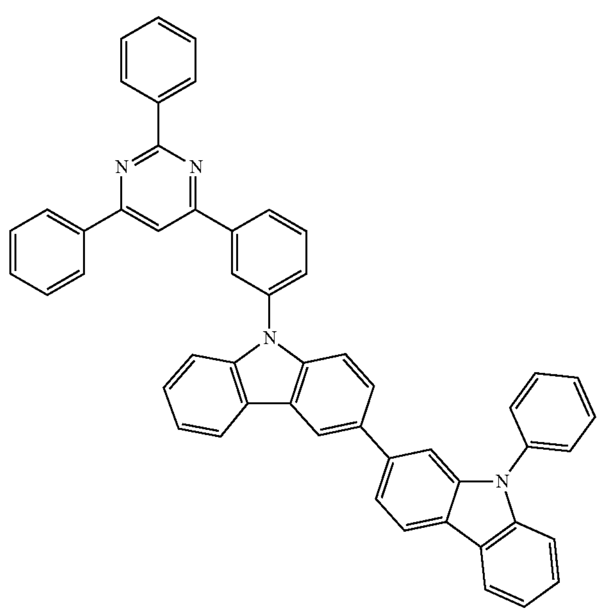

-continued
A-177
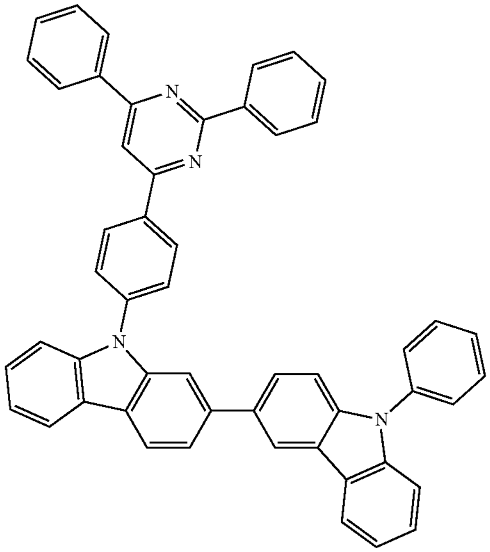
A-178
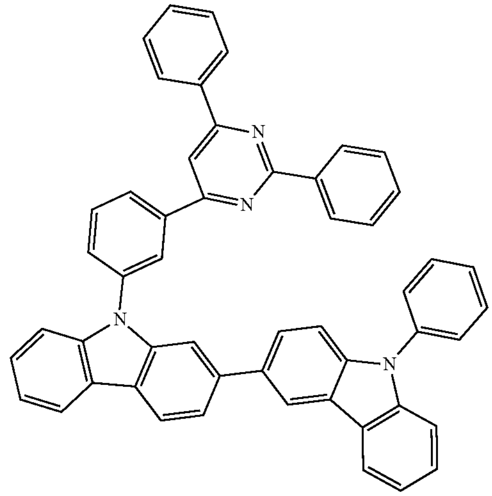
A-179
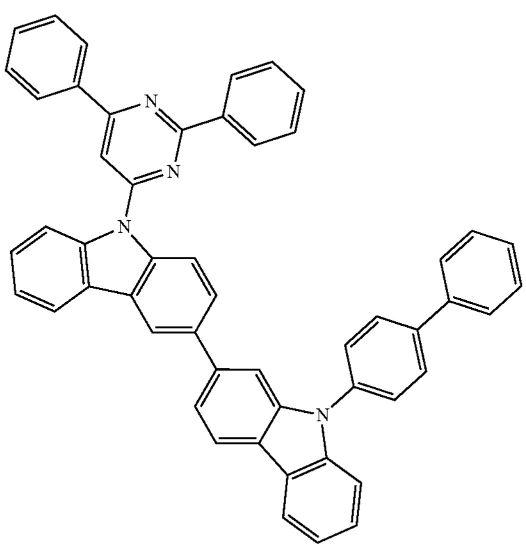

-continued
A-180
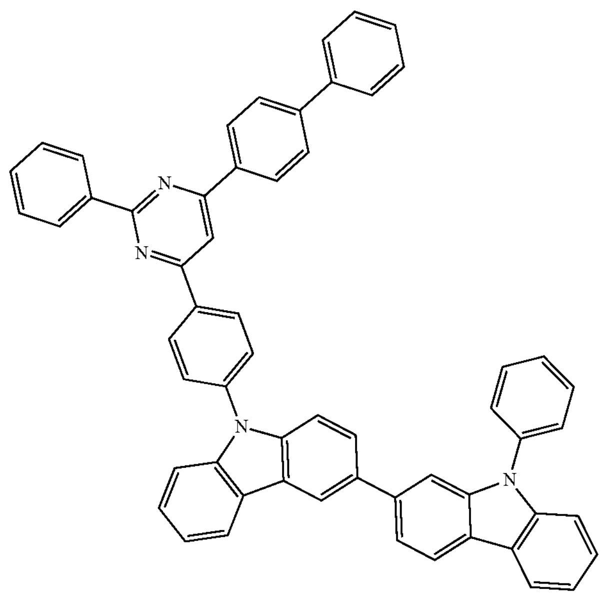
A-181
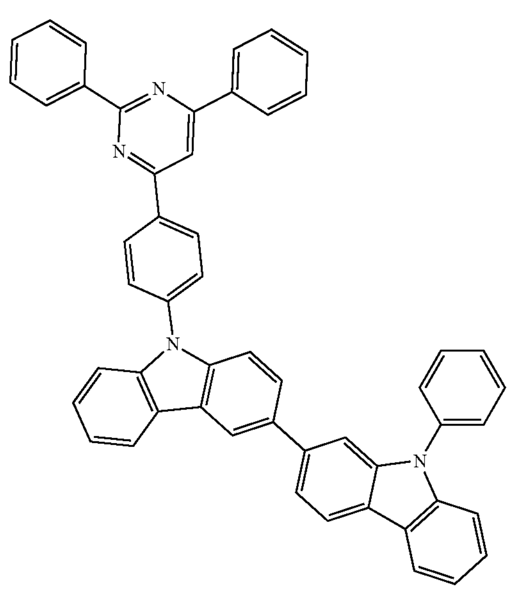
A-182
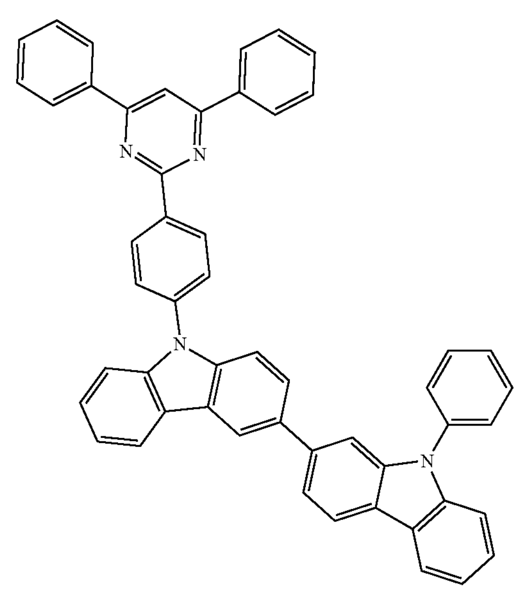

-continued
A-183
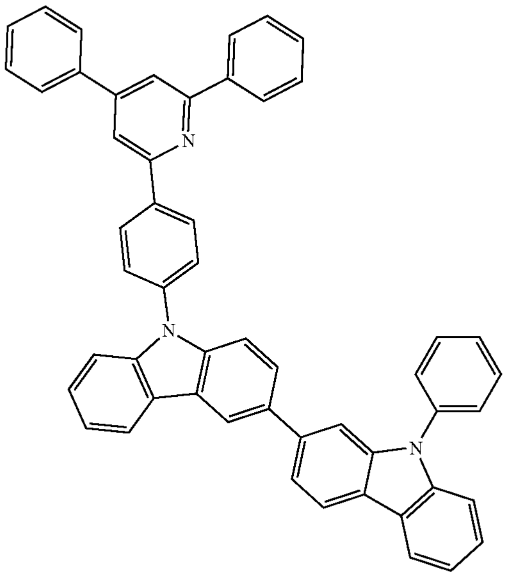
A-184
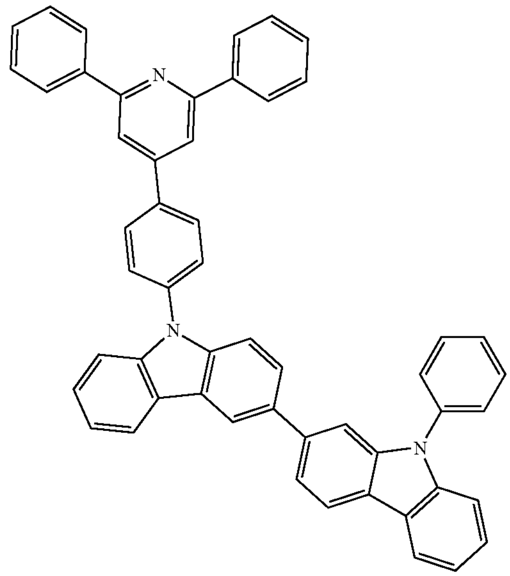
A-185
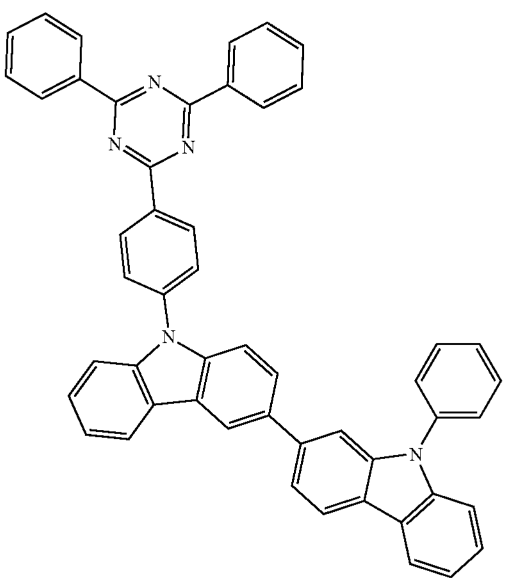
A-186
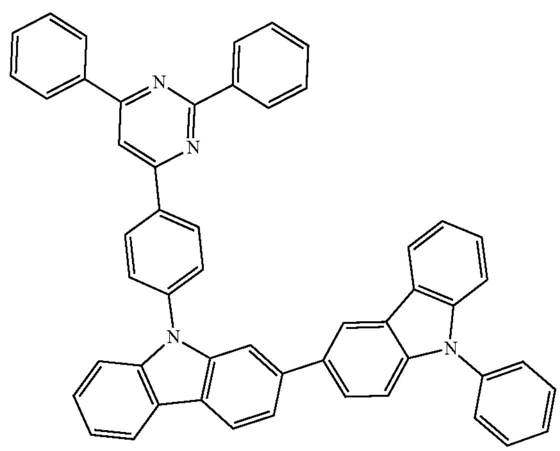
A-187
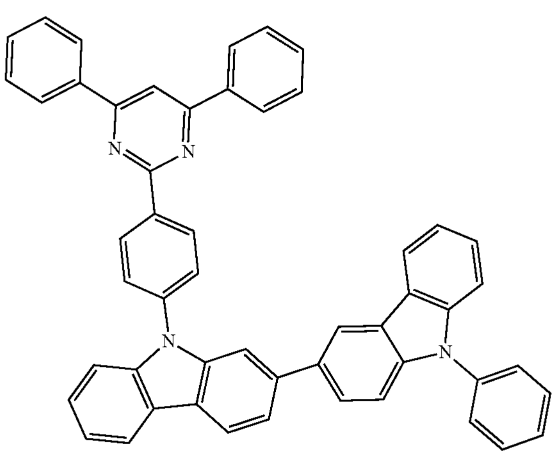
A-188
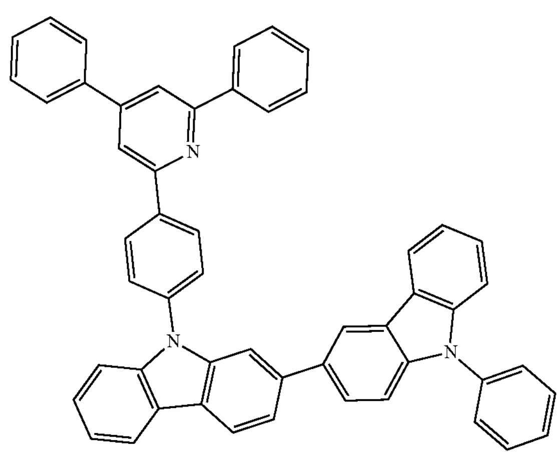

-continued
A-189
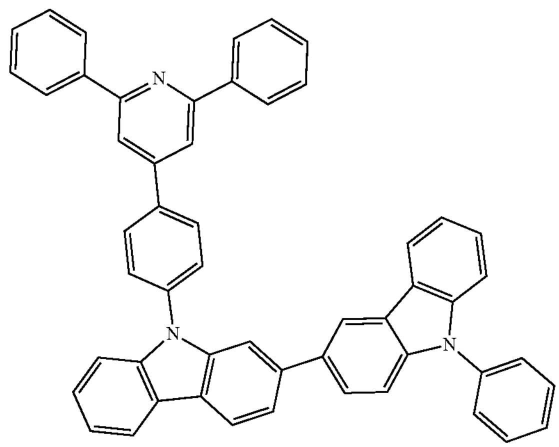
A-190
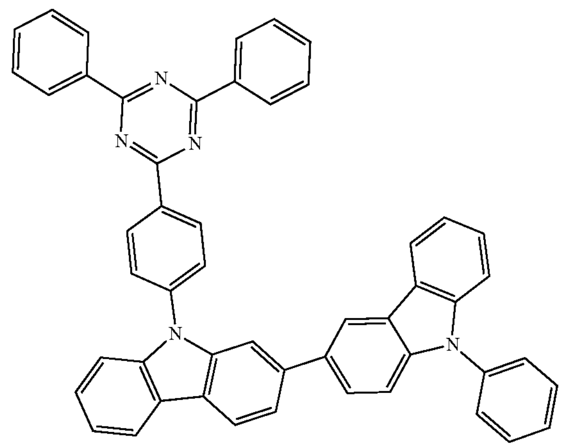
A-191
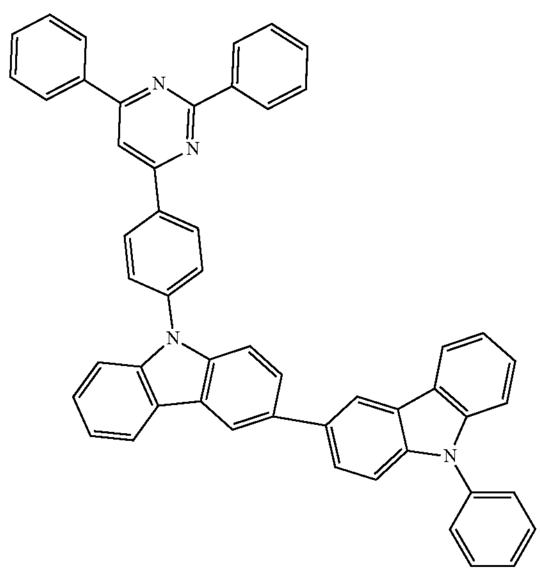
A-192
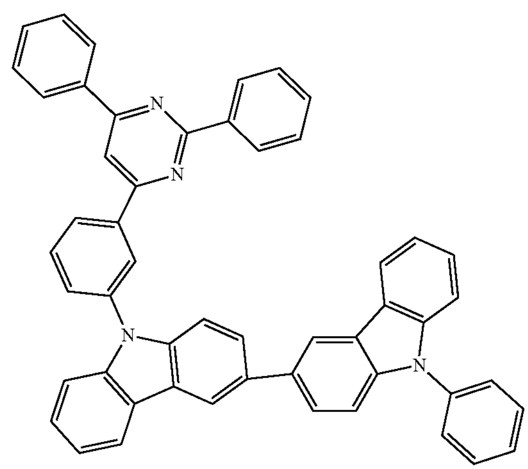
A-193
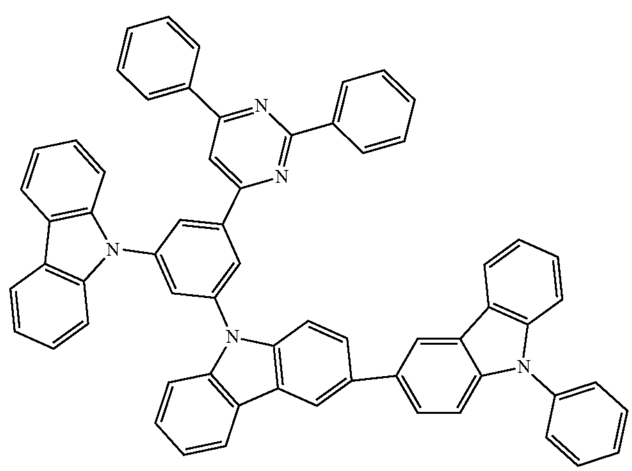

-continued
A-194
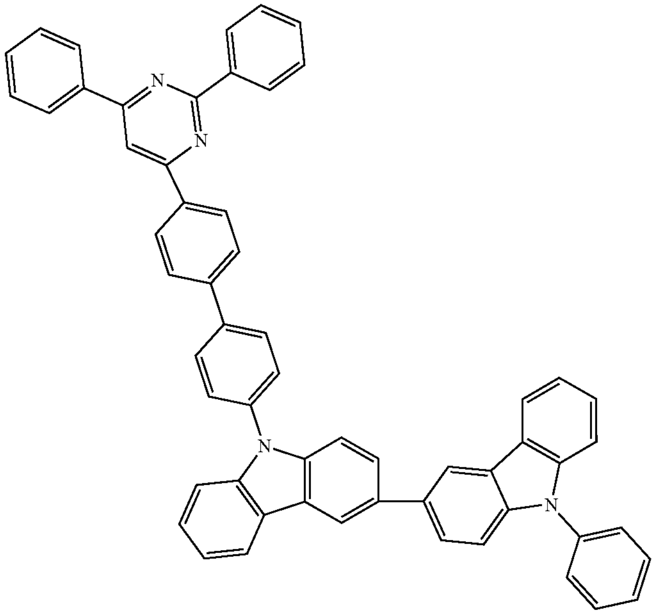
A-195
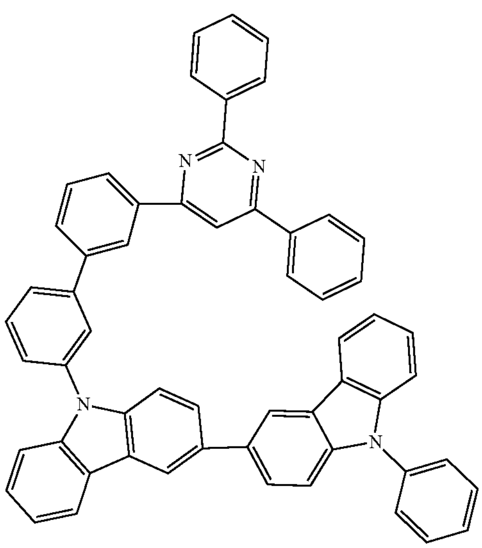
A-196
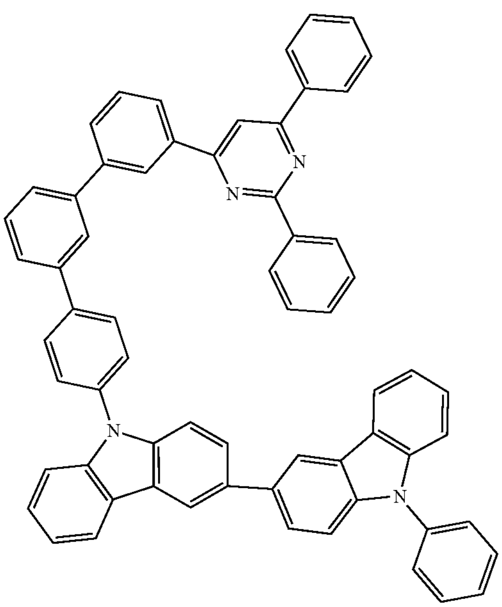

-continued
A-197
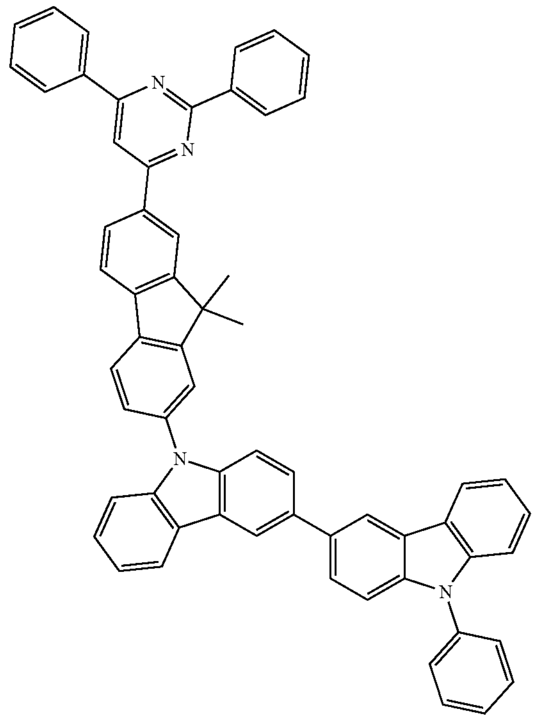
A-198
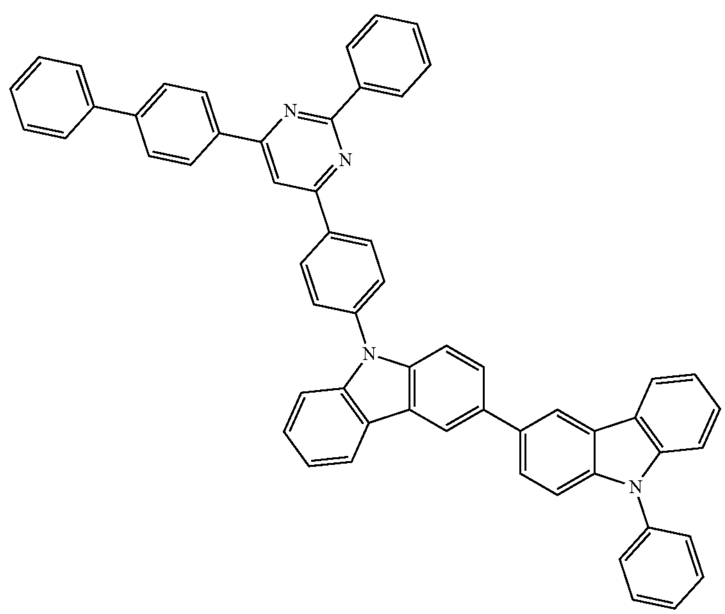

-continued
A-199
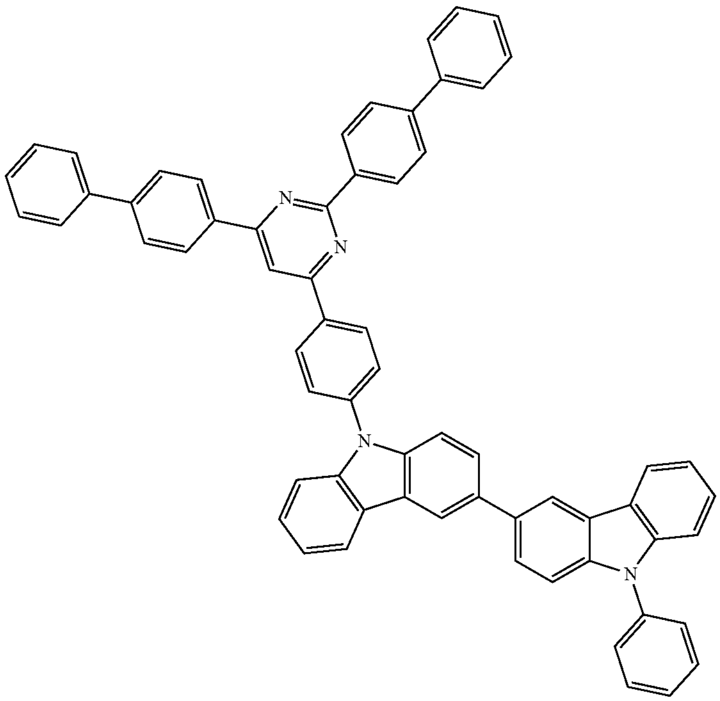
A-200
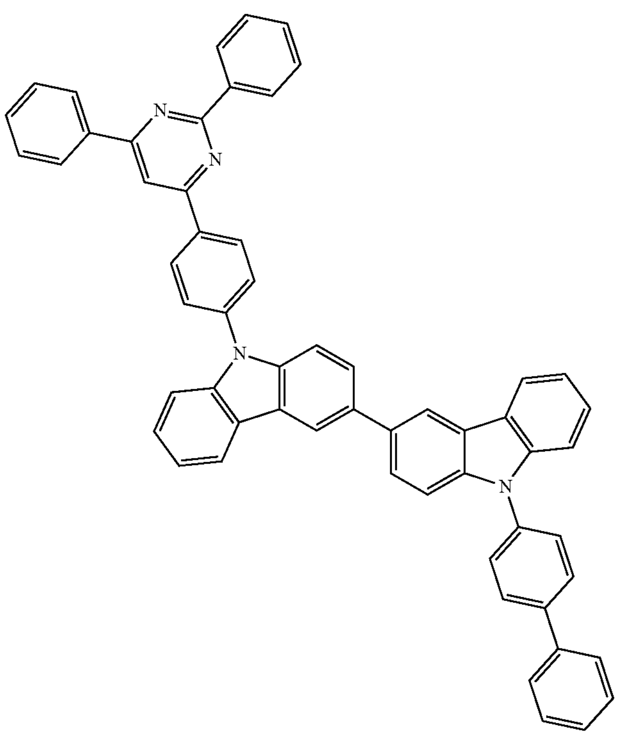

-continued
A-201
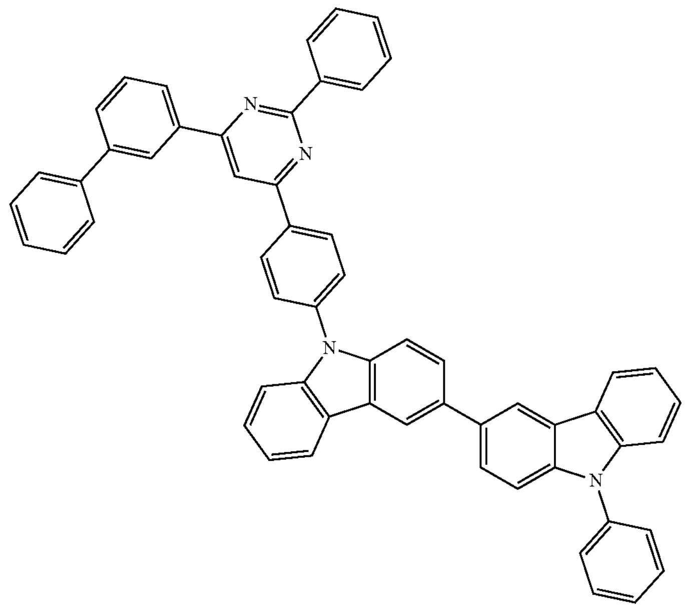
A-202
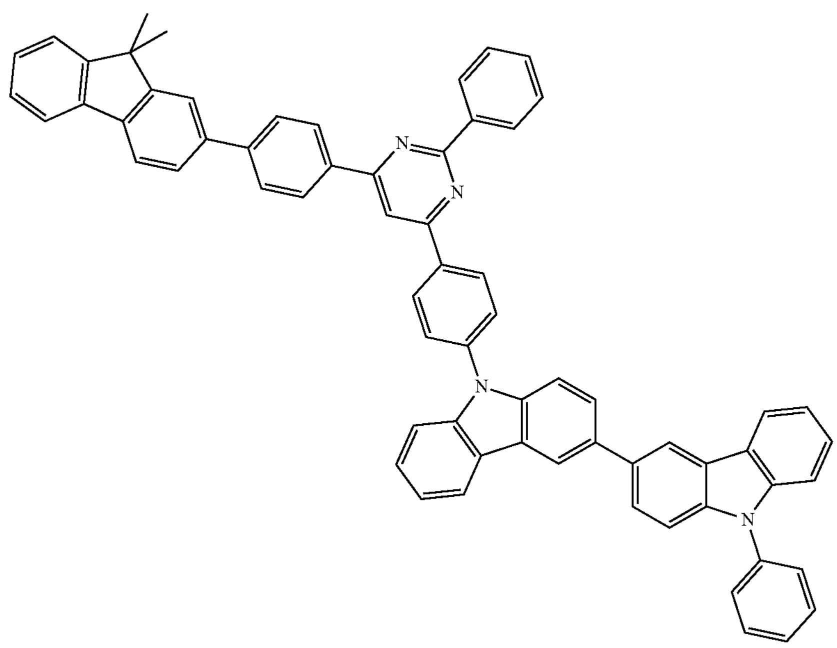

-continued
A-203
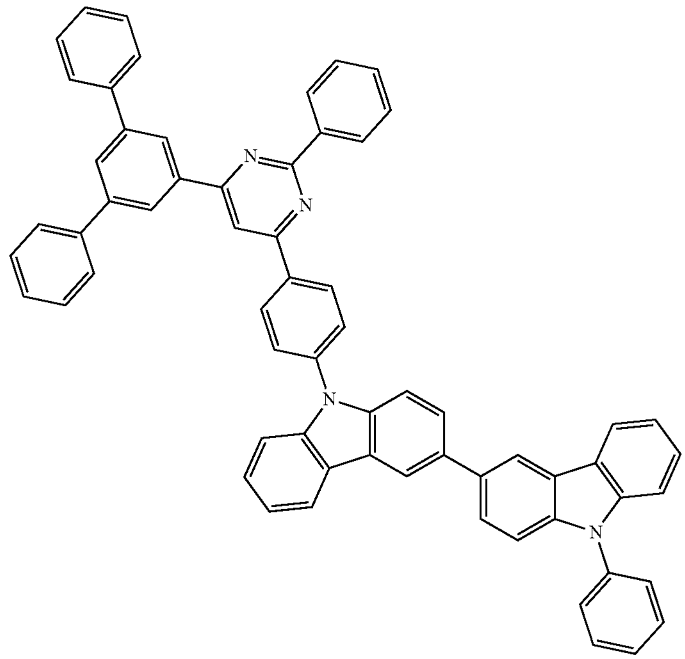
A-204
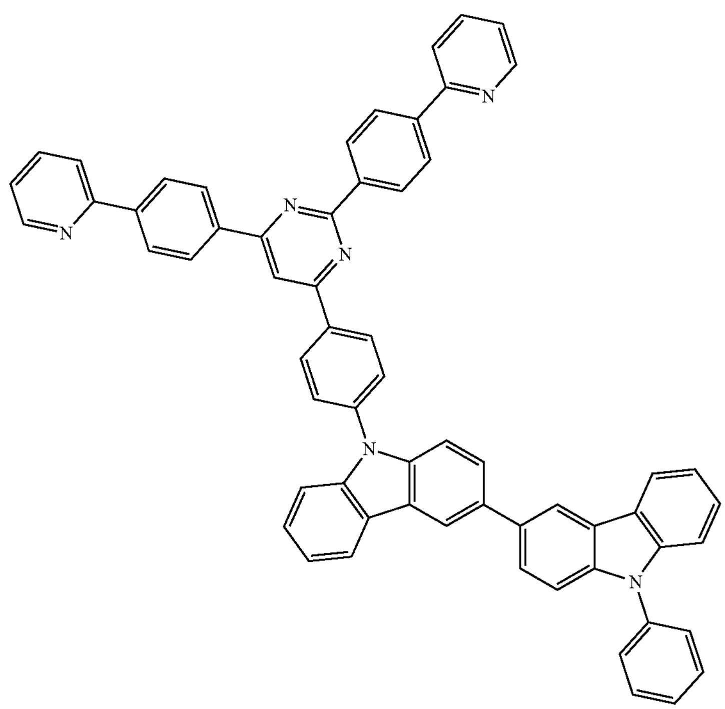

-continued
A-205
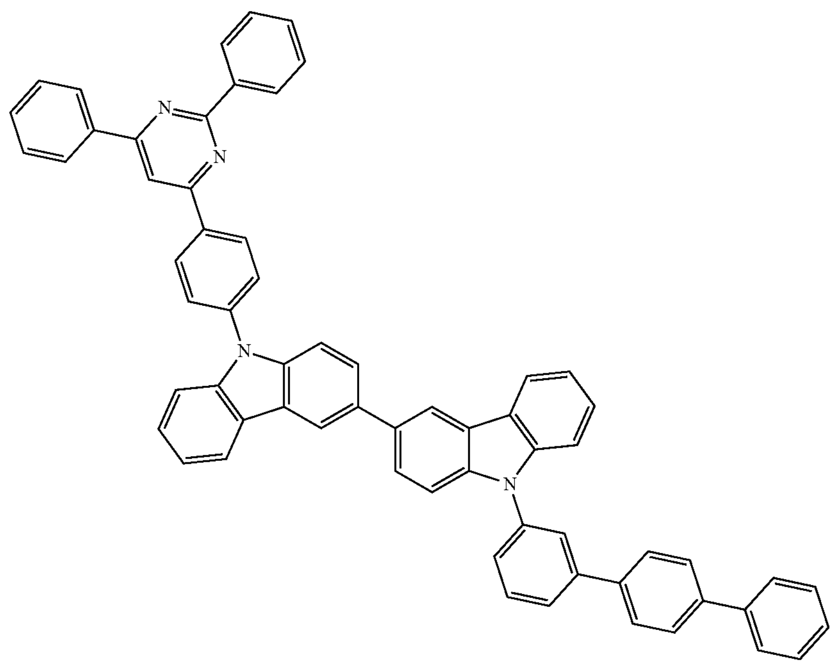
A-206
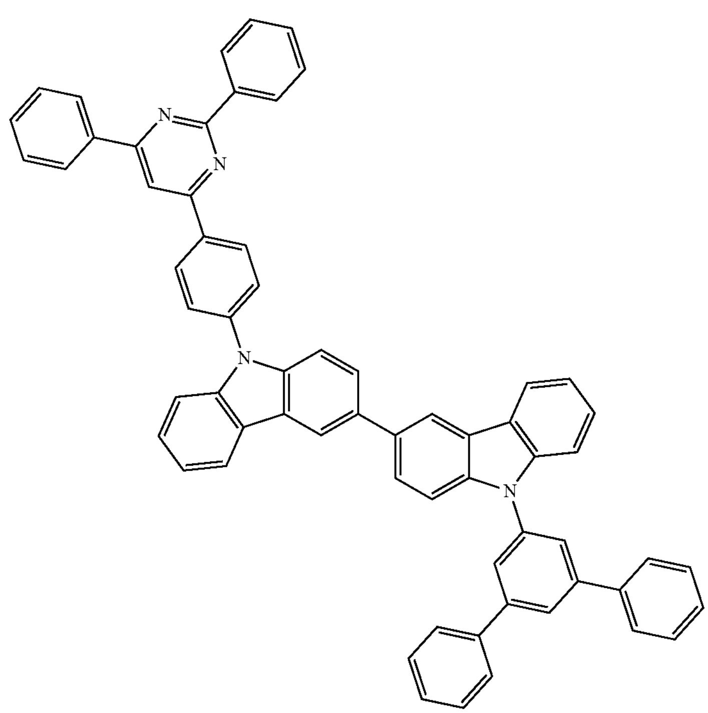

-continued
A-207
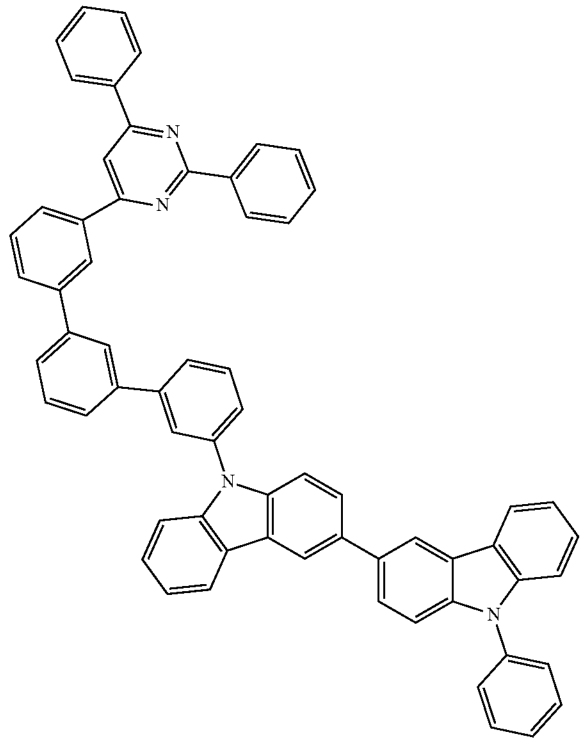
A-208
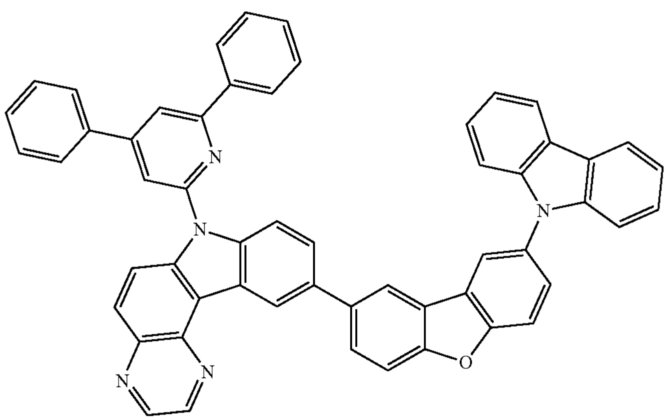
A-209
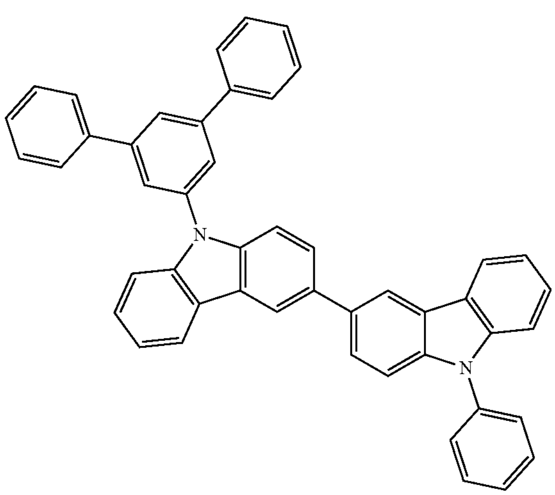

-continued
A-210
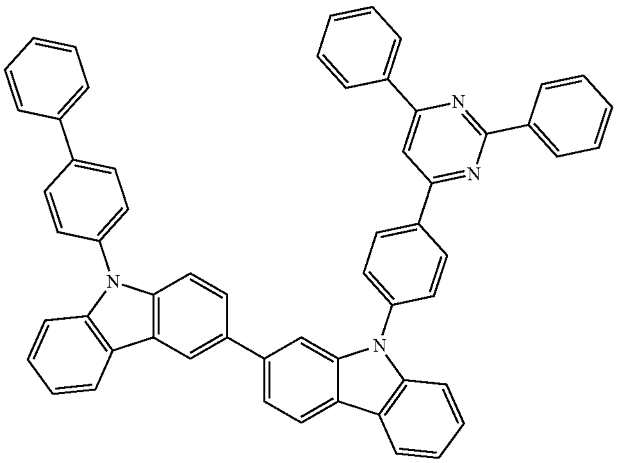
A-211
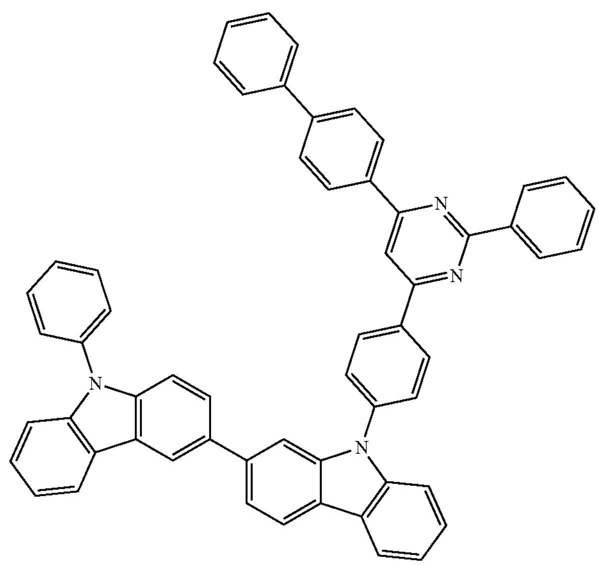
A-212
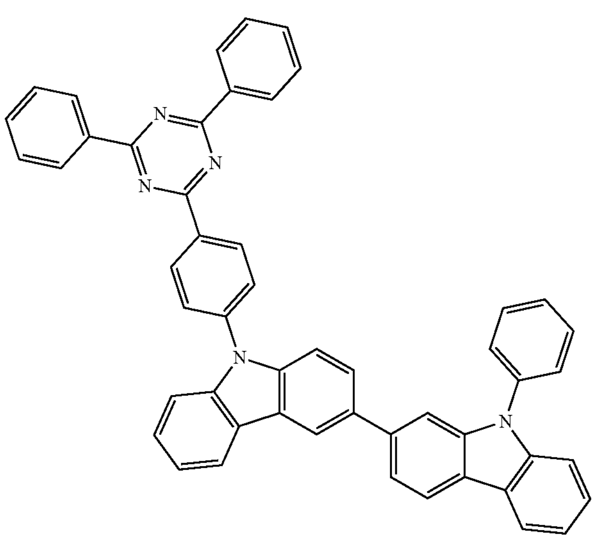

-continued
A-213
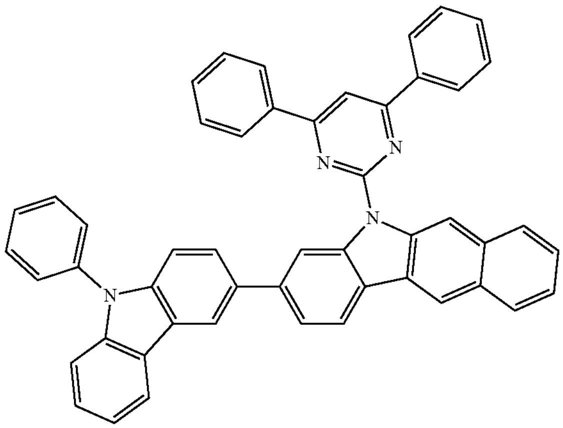
A-214
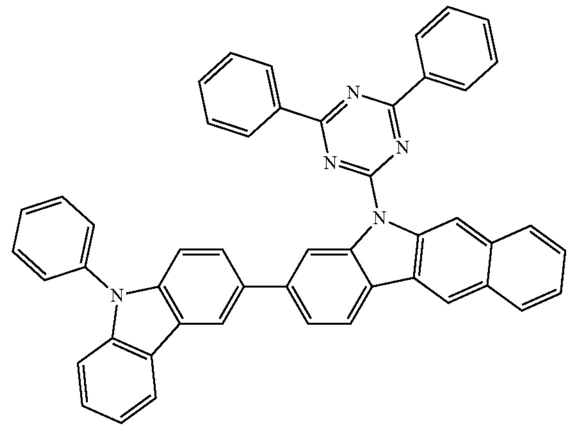
A-215
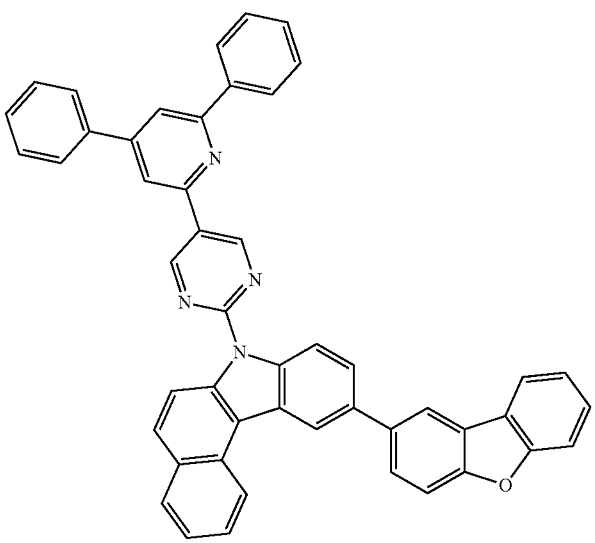
A-216
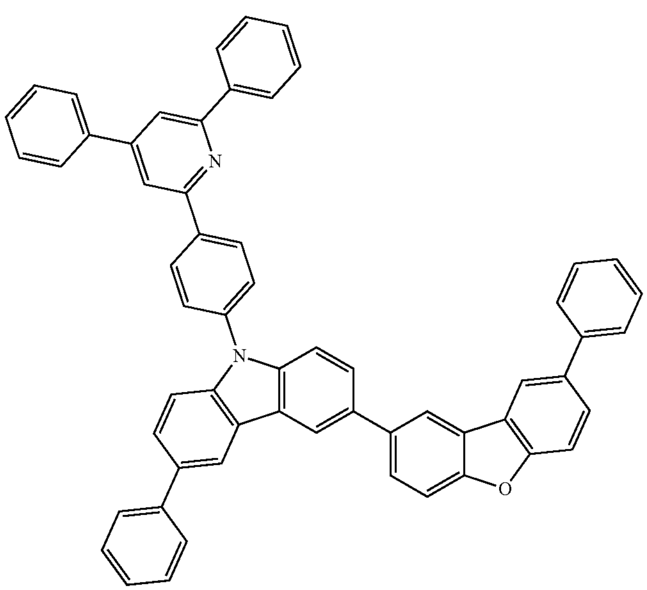

-continued
A-217
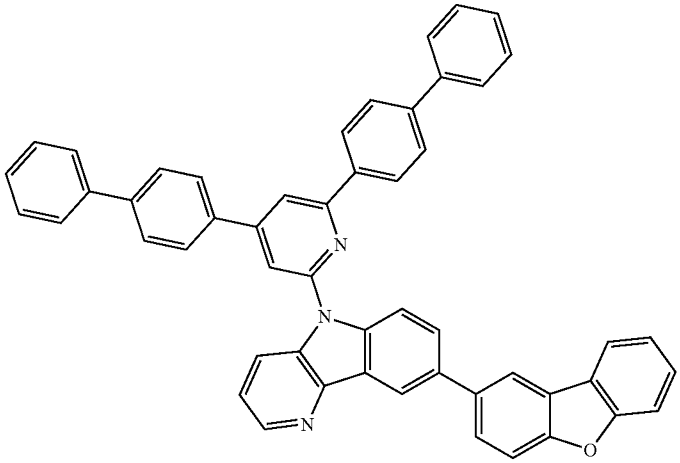
A-218
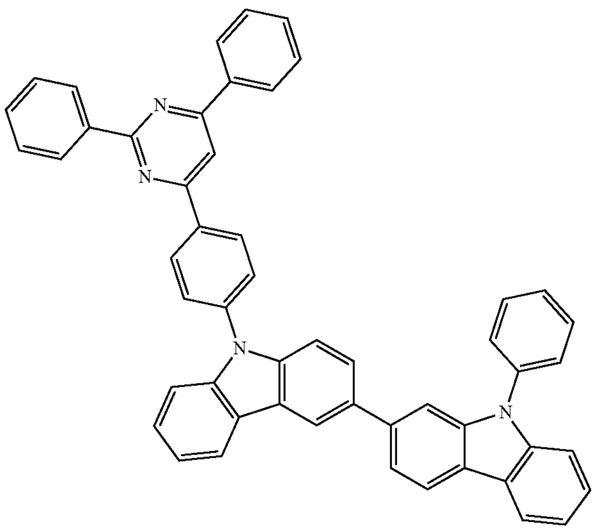
A-219
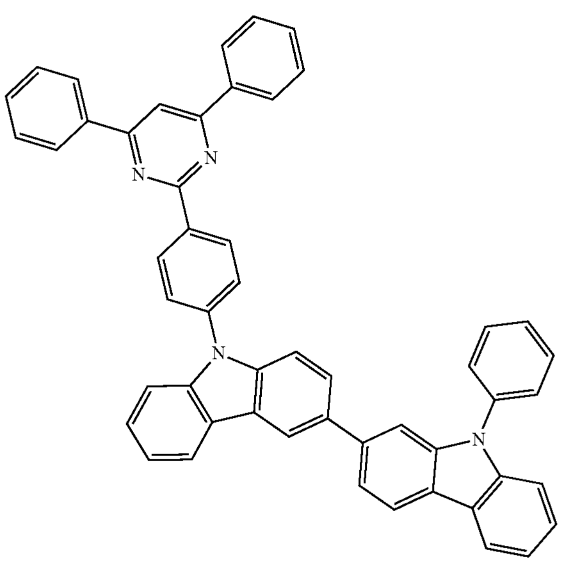
A-220
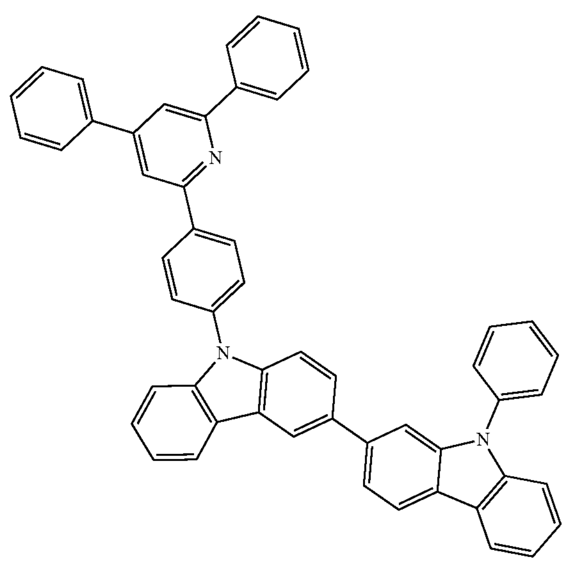

-continued
A-221
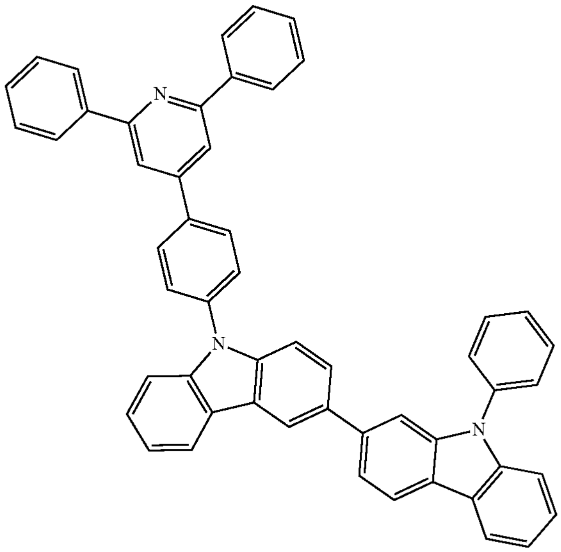
B-101
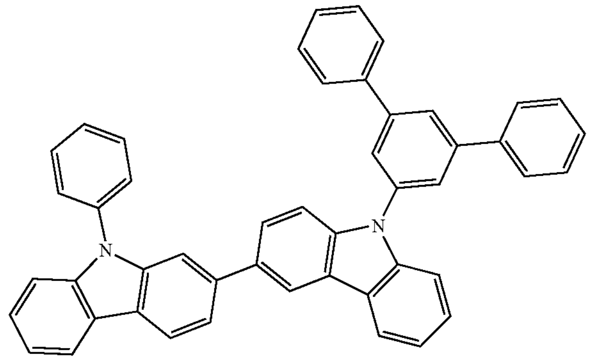
B-102
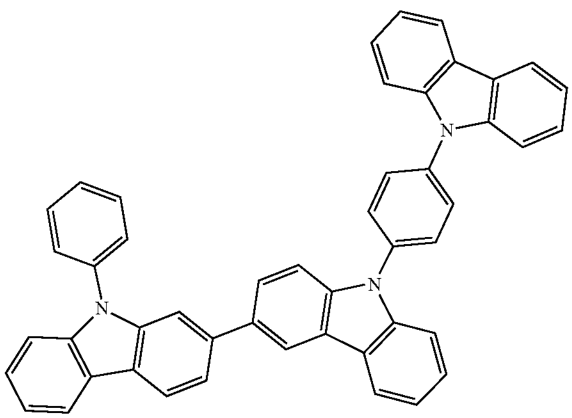
B-103
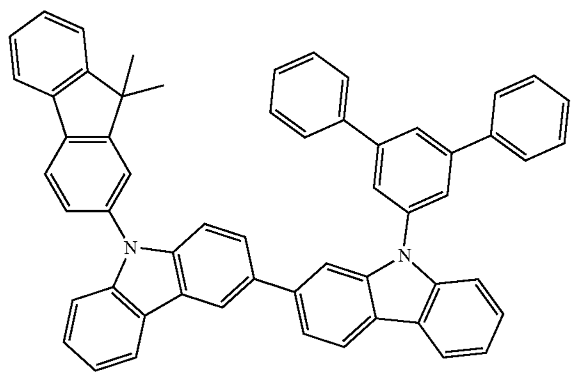
B-104
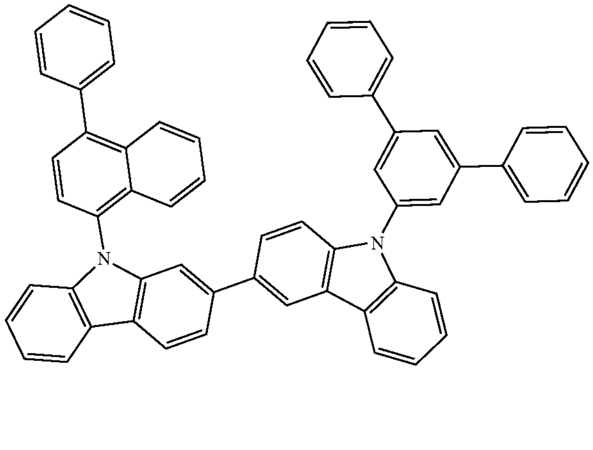
B-105
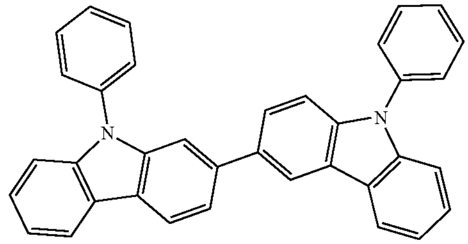

-continued
B-106
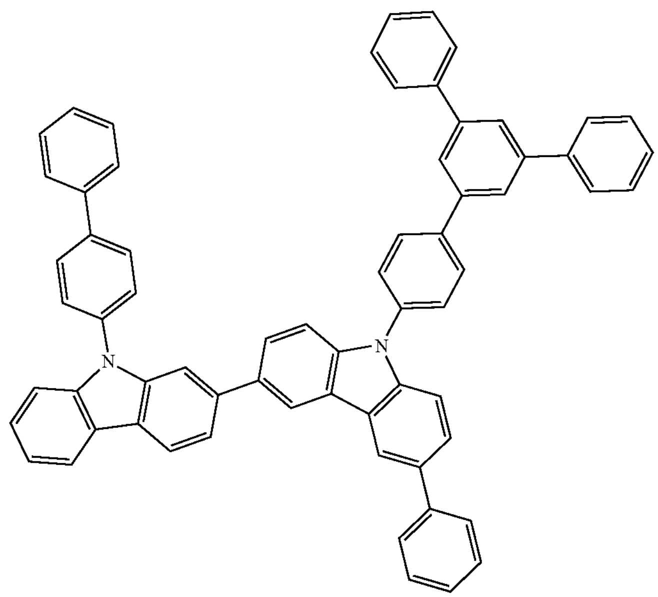
B-107
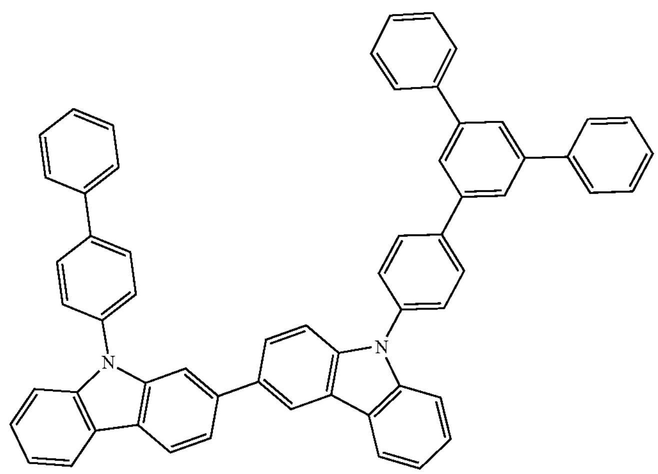
B-108
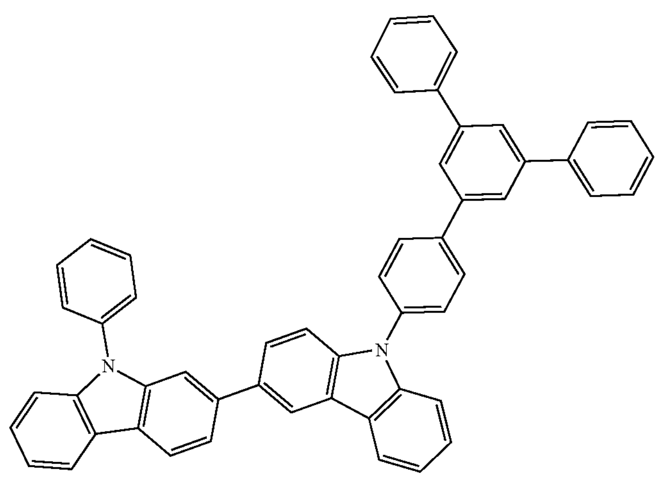

-continued
B-109
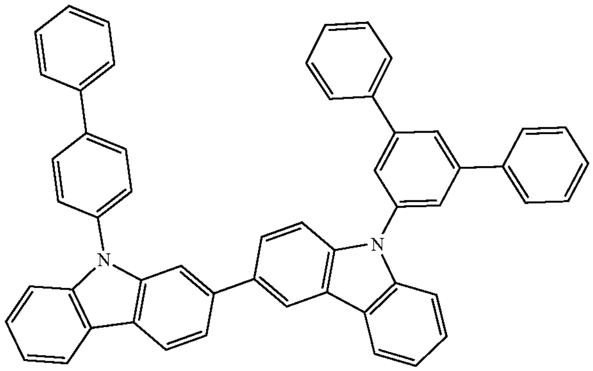
B-110
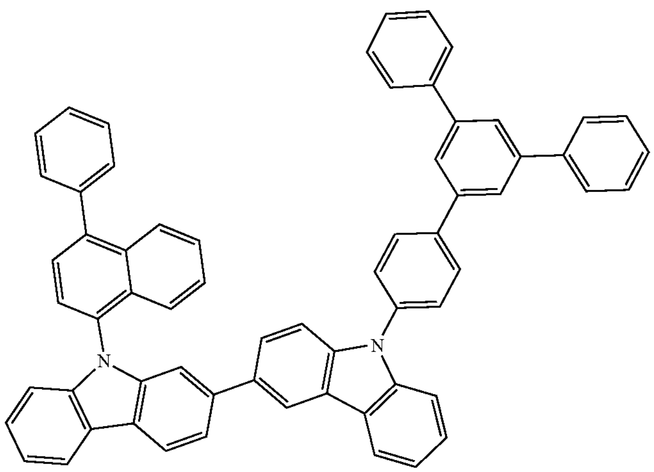
B-111
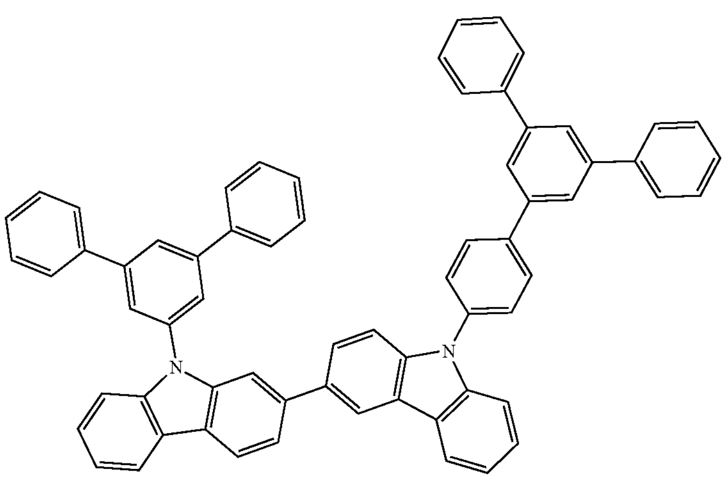

-continued
B-112
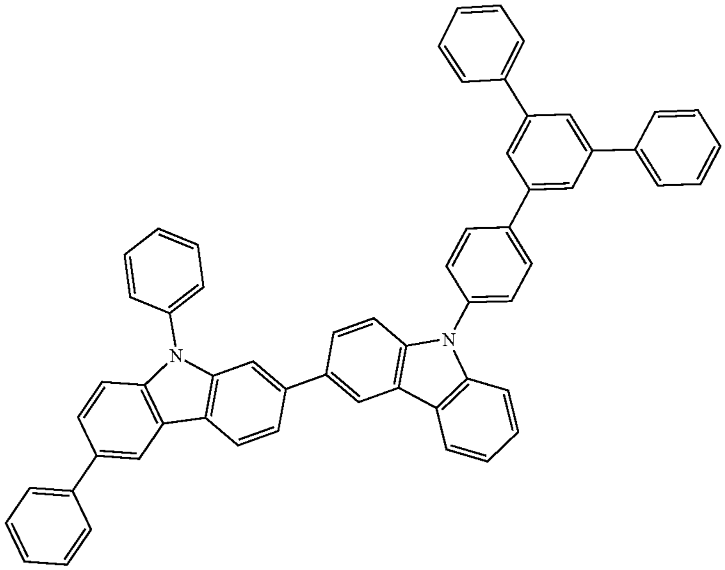
B-113
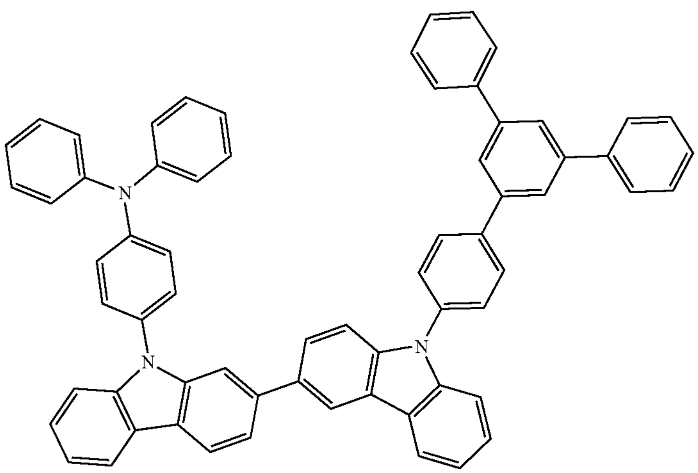
B-114
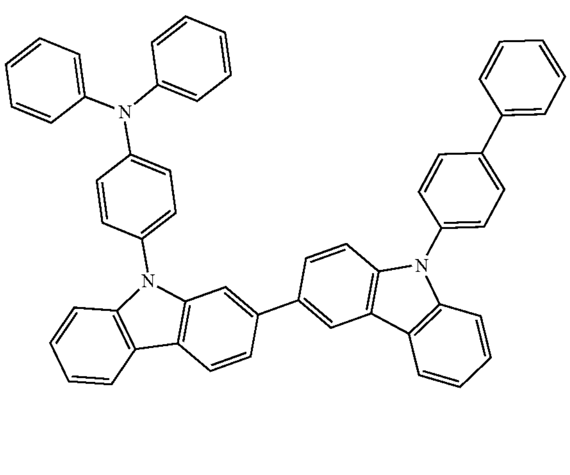
B-115
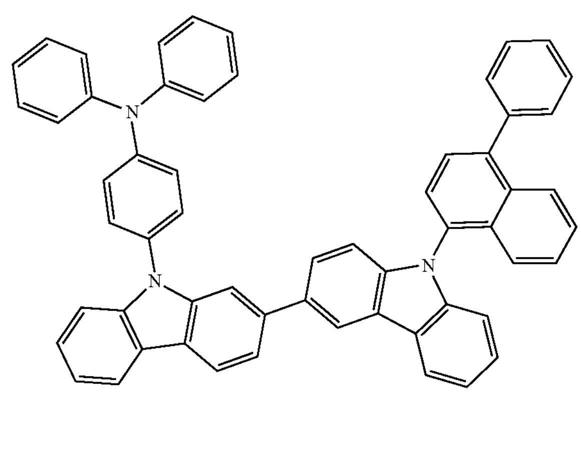

-continued
B-116
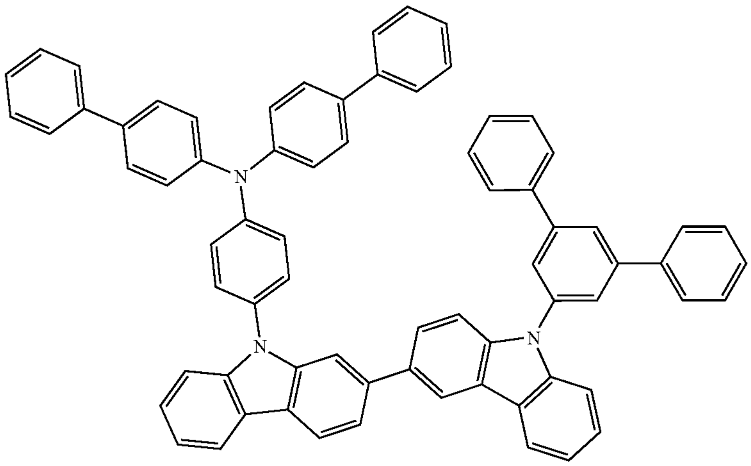
B-117
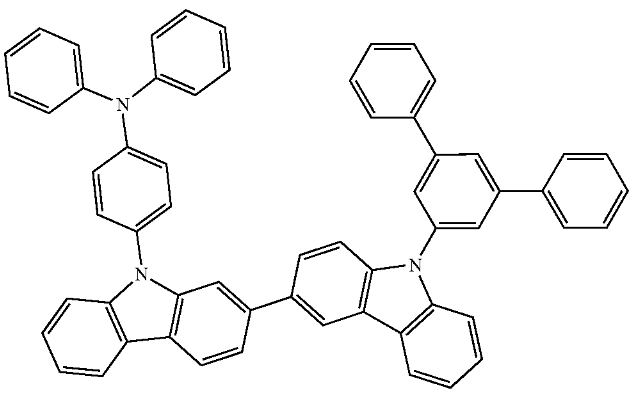
B-118
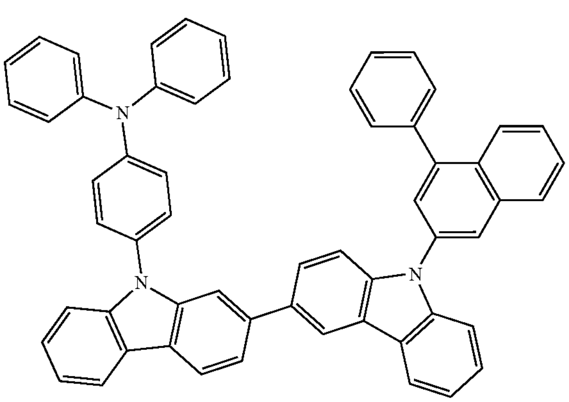
B-119
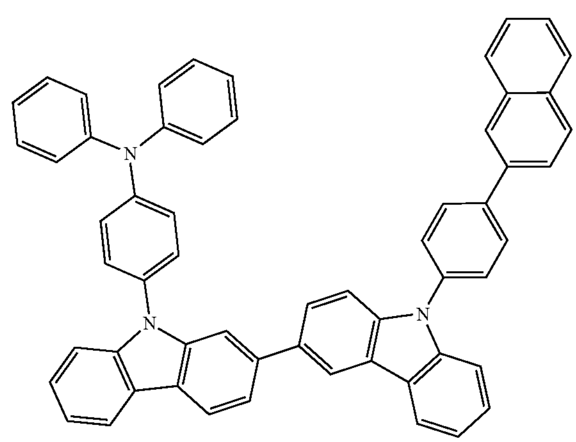

-continued
B-120
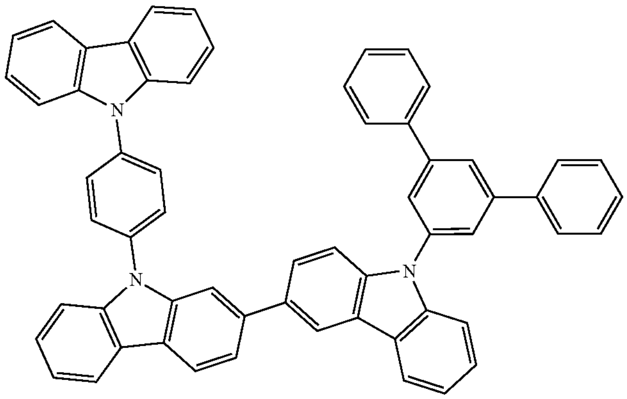
B-121
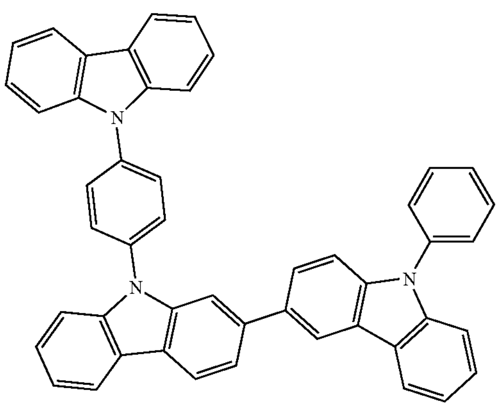
B-122
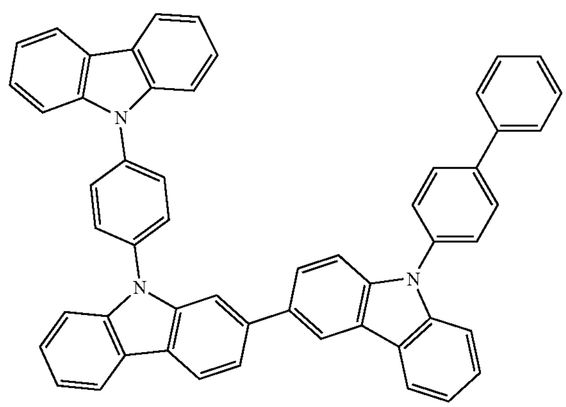
B-123
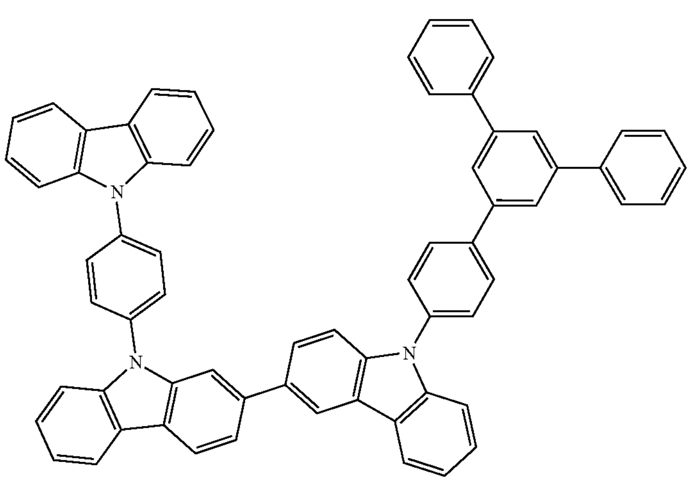

-continued
B-124
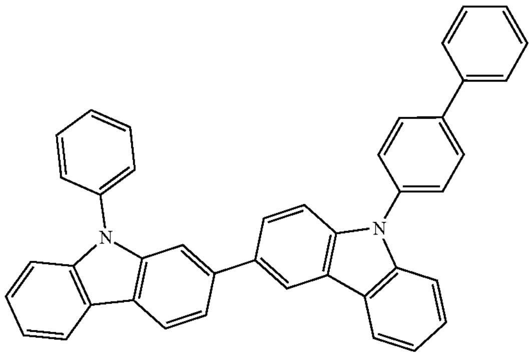
B-125
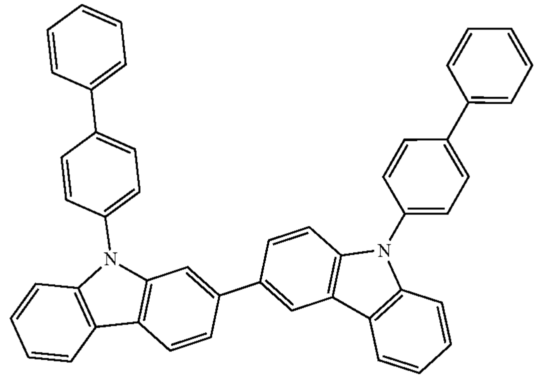
B-126
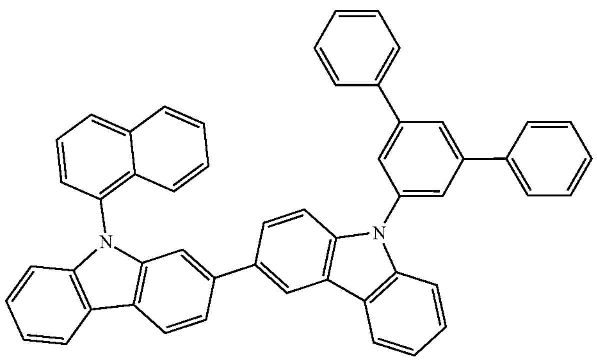
B-127
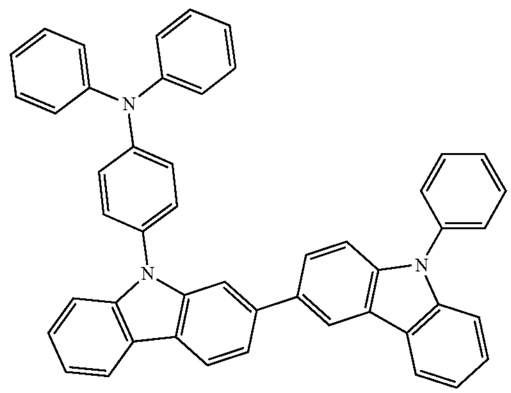
B-128
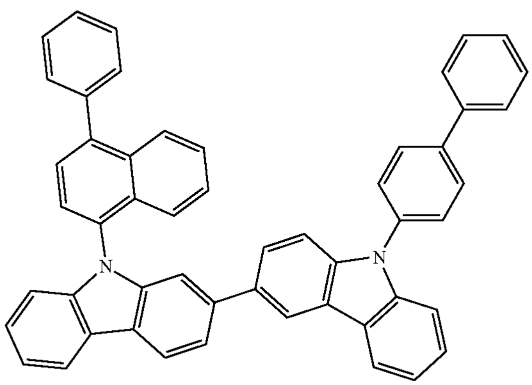
B-129
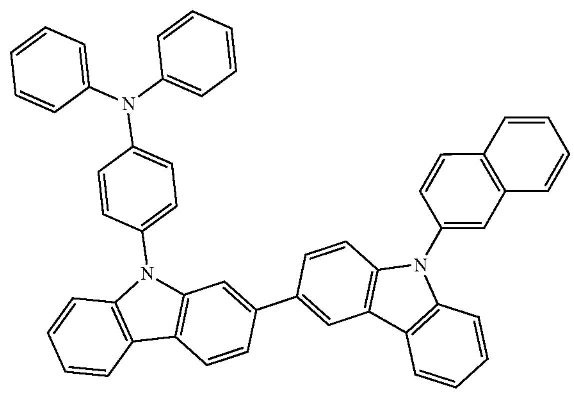
B-130
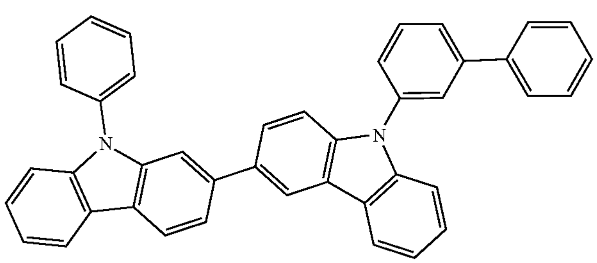
B-131
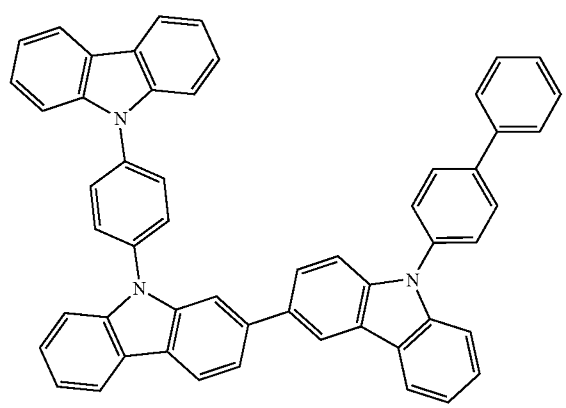

-continued
B-132
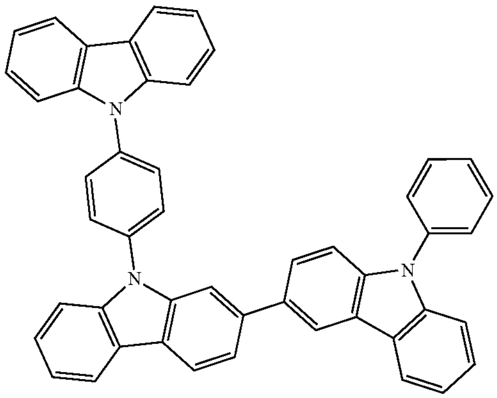
B-133
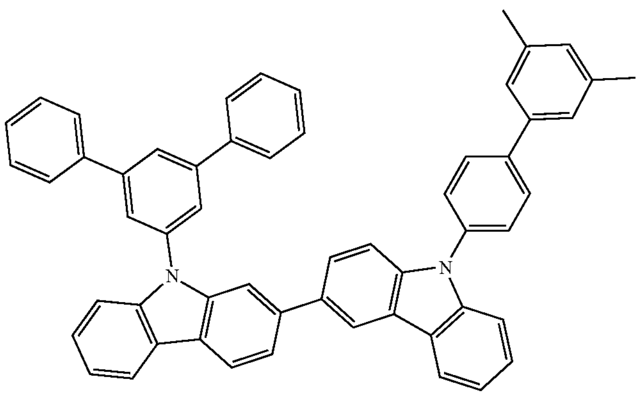
B-134
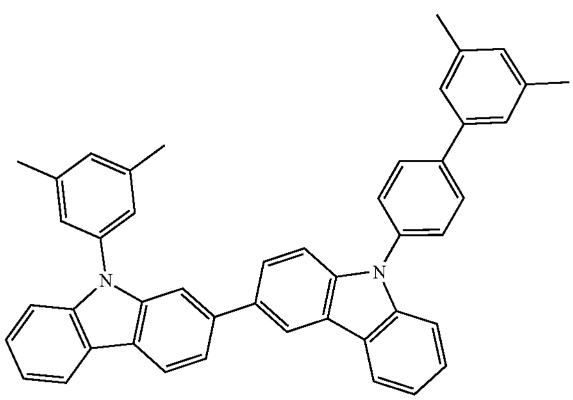
B-135
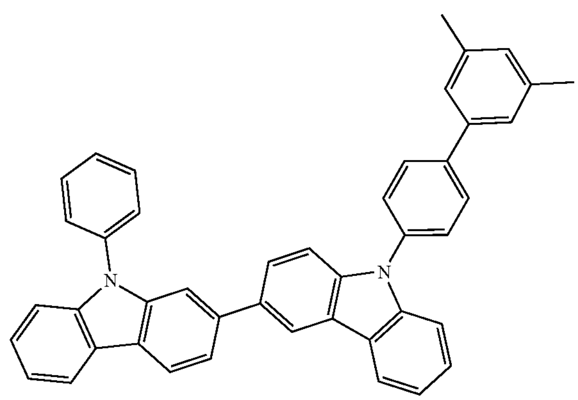
B-136
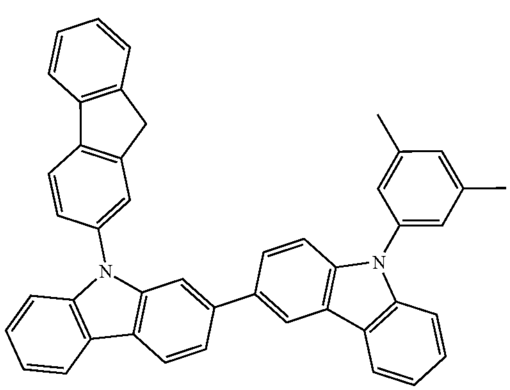
B-137
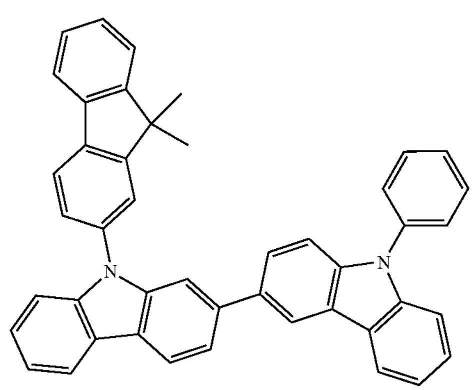

-continued
B-138
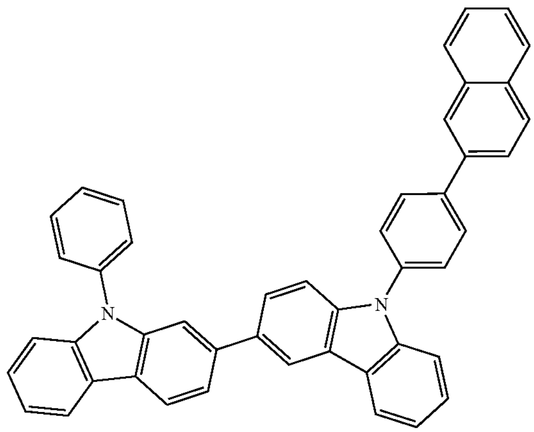
B-139
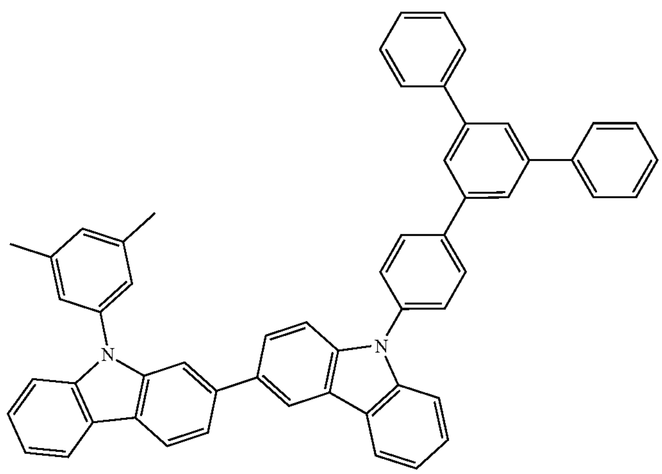
B-140
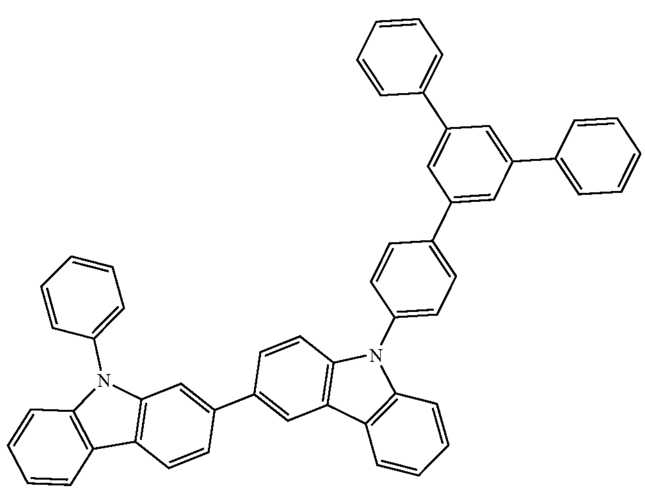

-continued
B-141
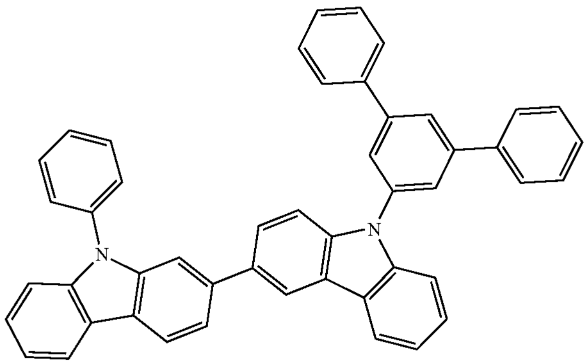
B-142
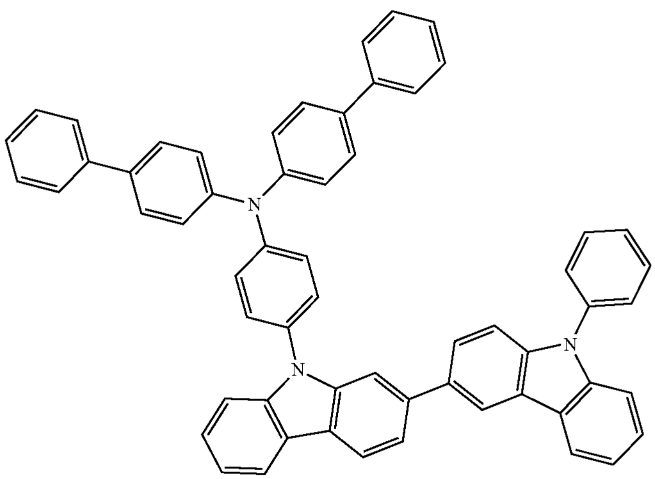
B-143
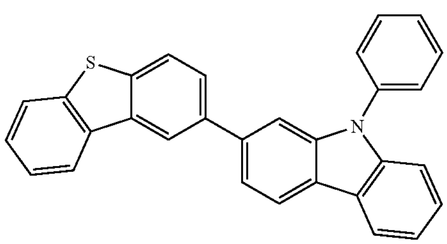
B-144
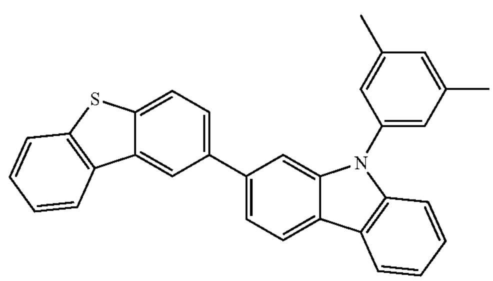
B-145
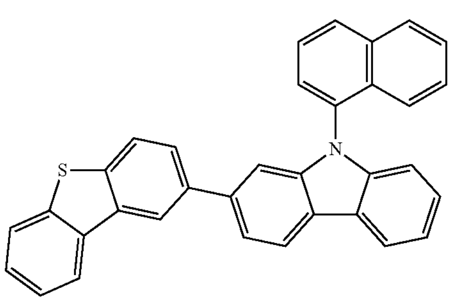
B-146
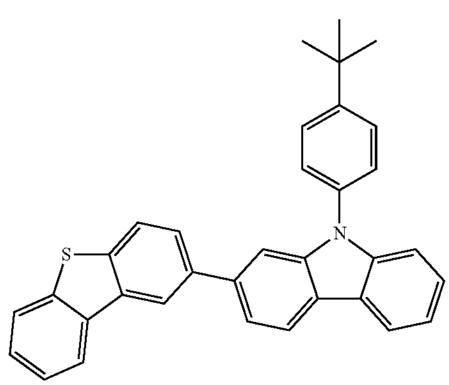

-continued
B-147
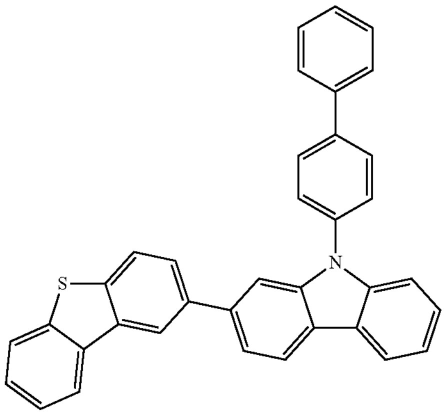
B-148
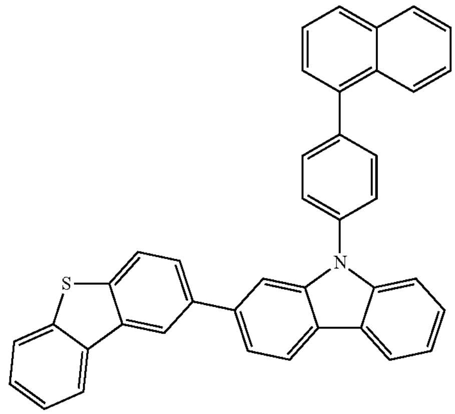
B-149
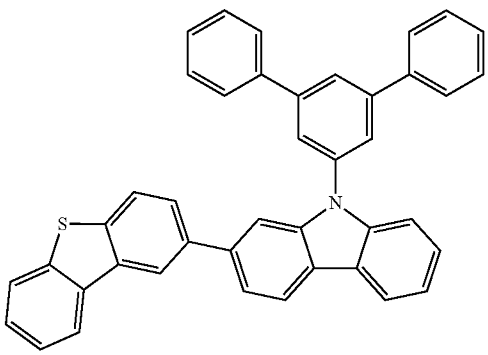
B-150
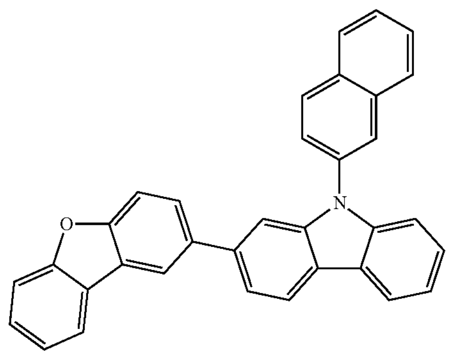
B-151
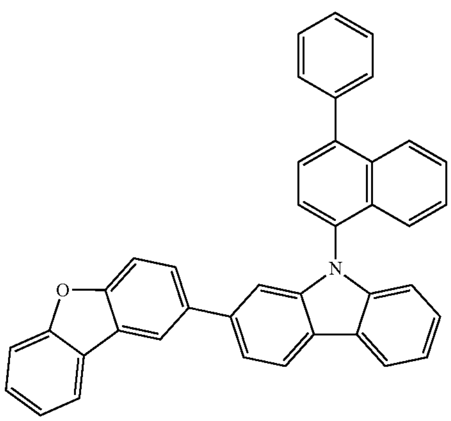
B-152
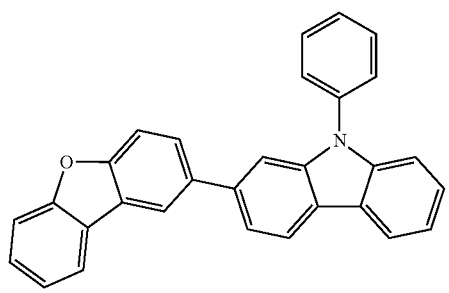
B-153
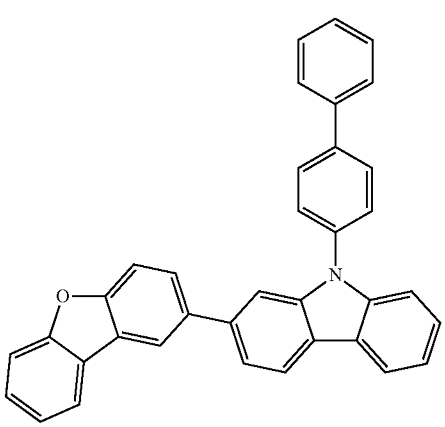
B-154
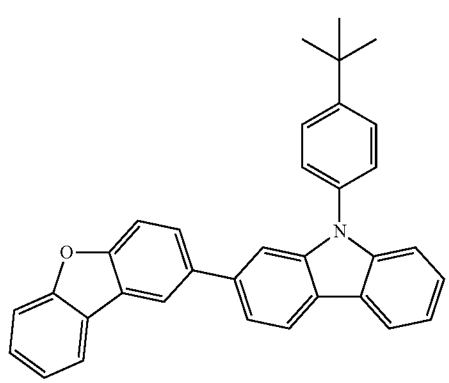

-continued
B-155
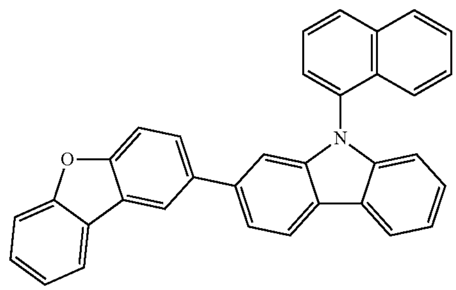
B-156
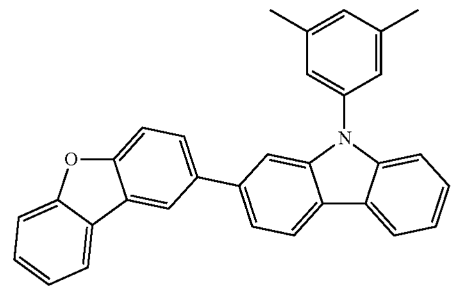
B-157
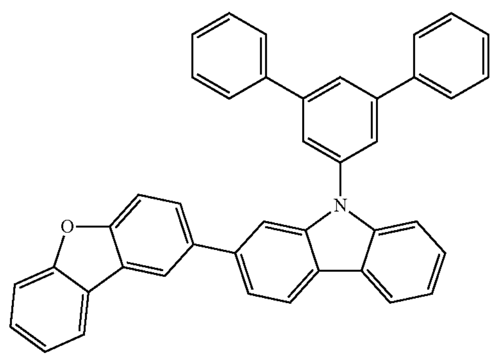
B-158
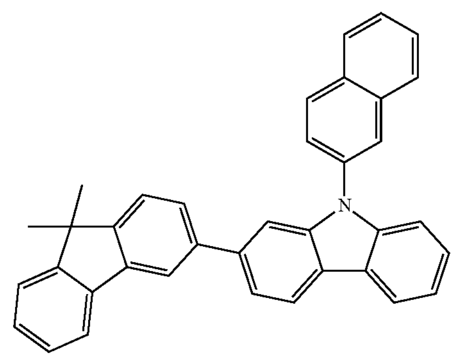
B-159
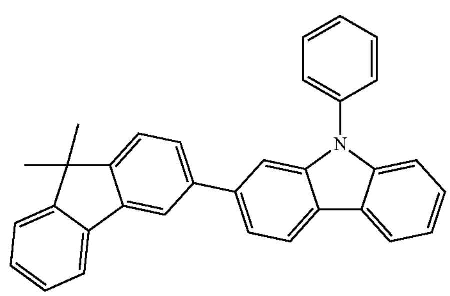
B-160
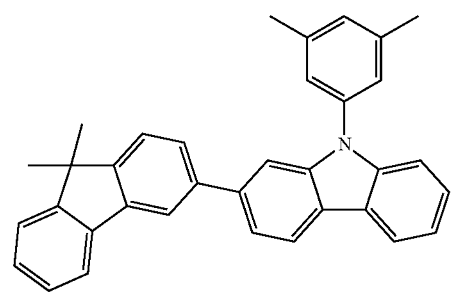
B-161
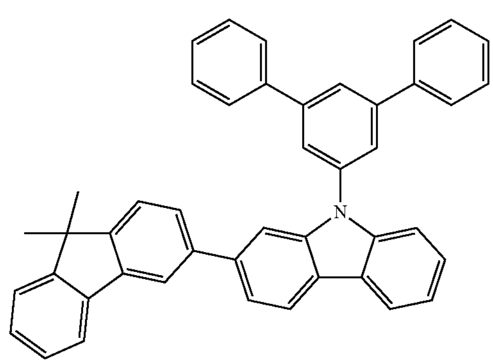
B-162
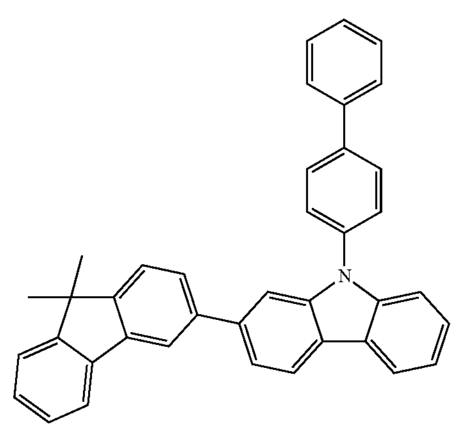

-continued
B-163
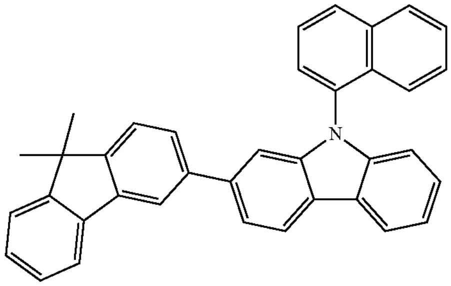
B-164
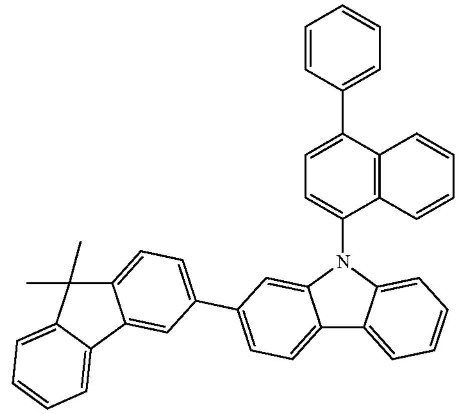
B-165
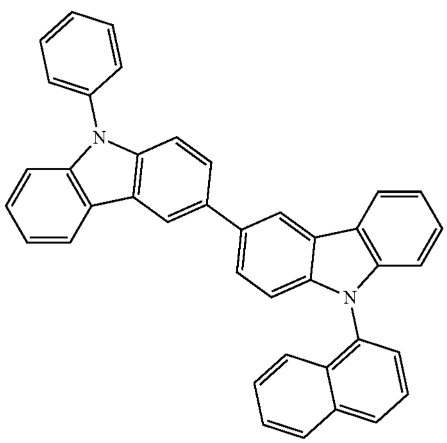
B-166
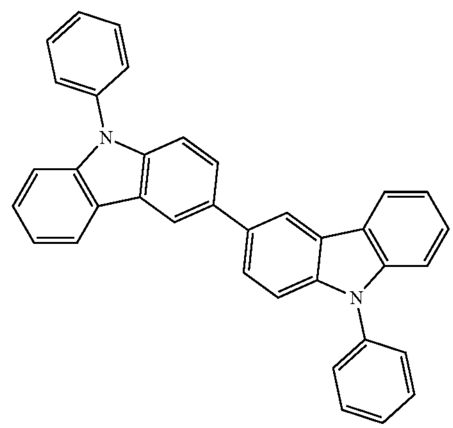
B-167
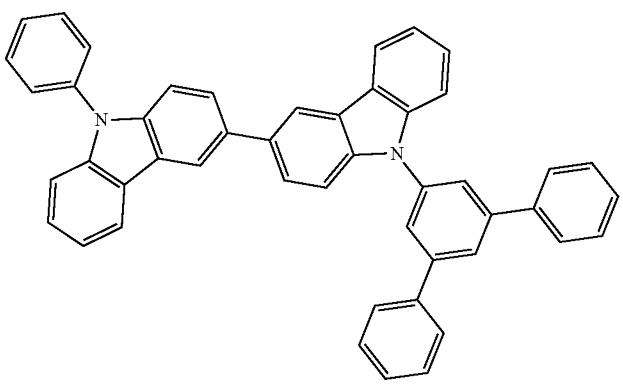
B-168
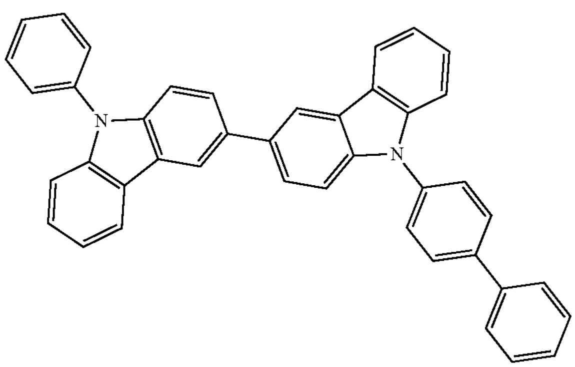

-continued
B-169
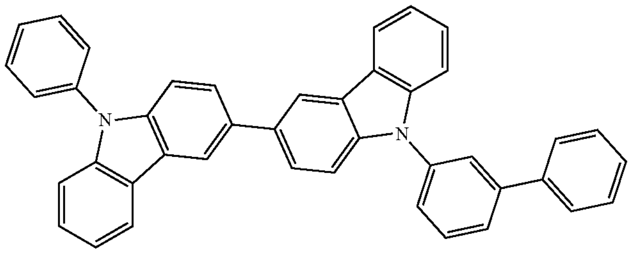
B-170
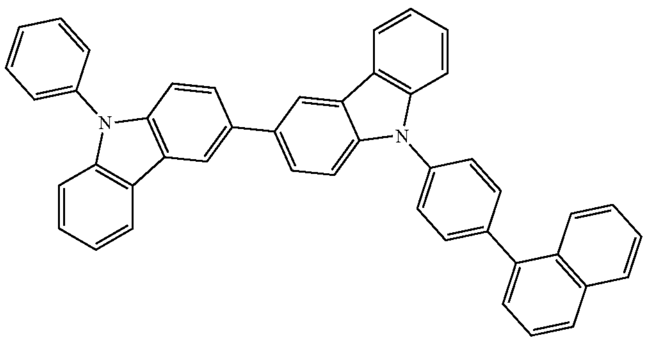
B-171
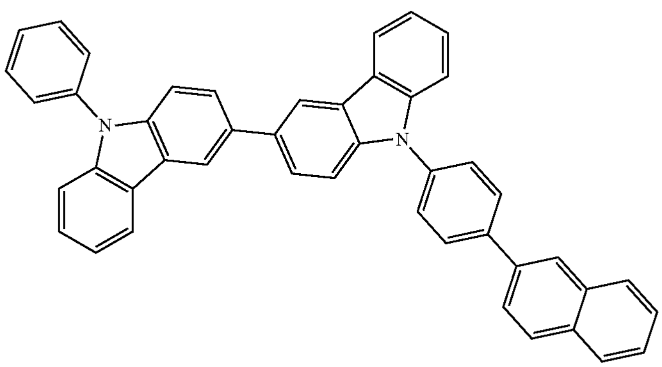
B-172
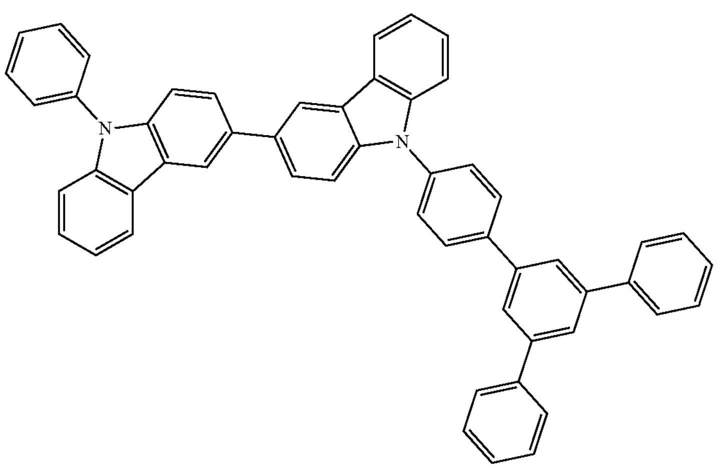

-continued
B-173
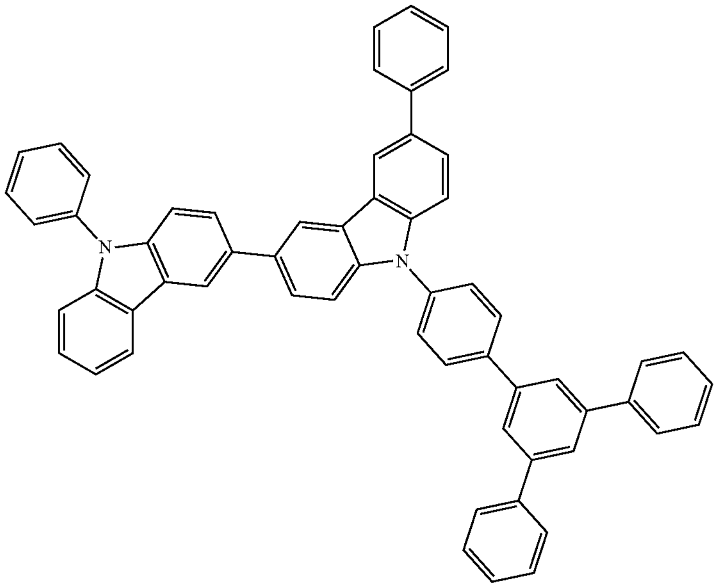
B-174
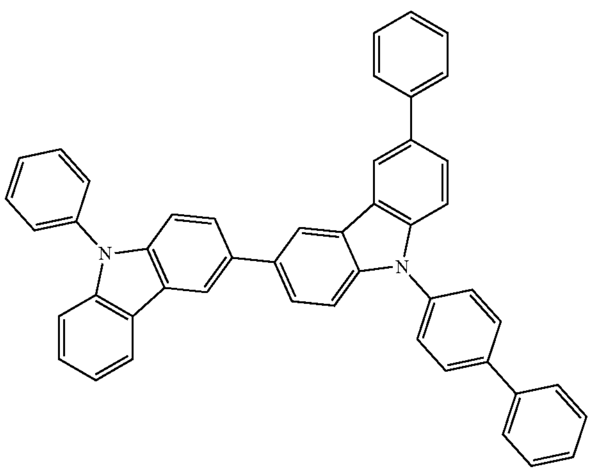
B-175
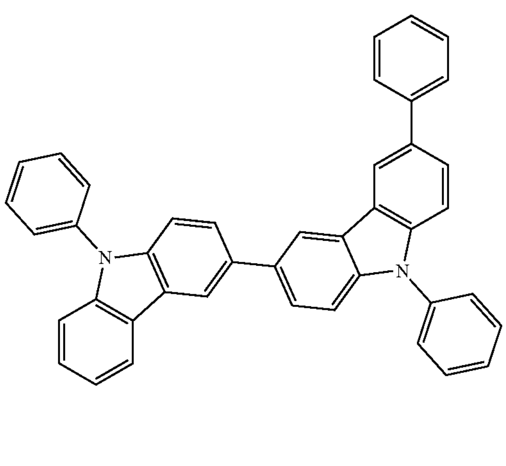

-continued
B-176
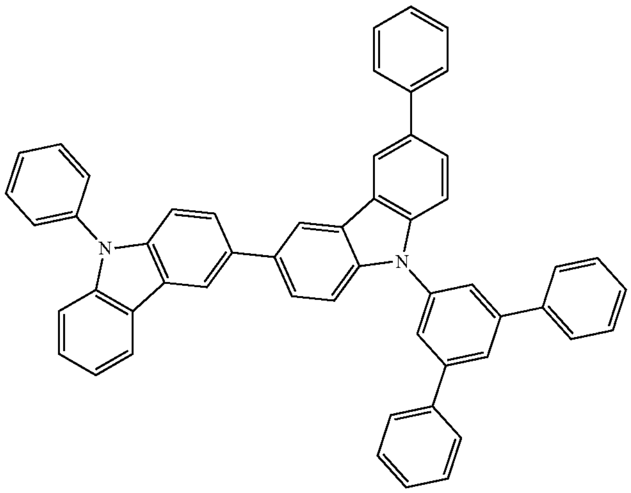
B-177
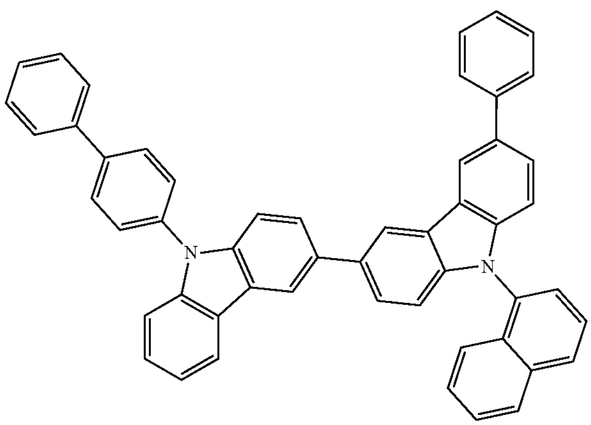
B-178
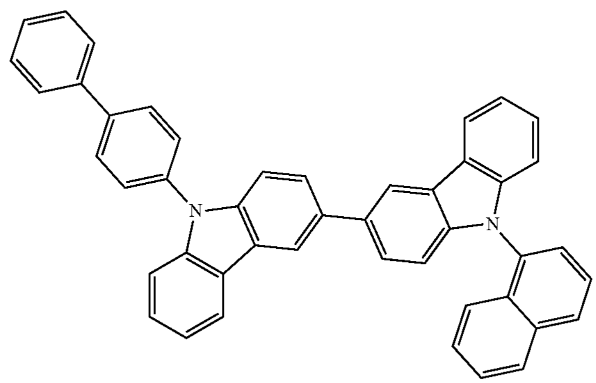
B-179
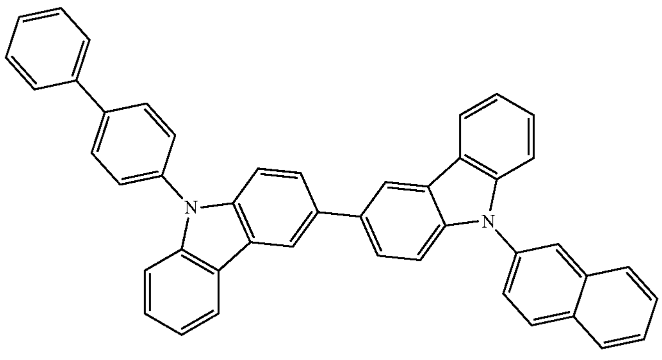

-continued
B-180
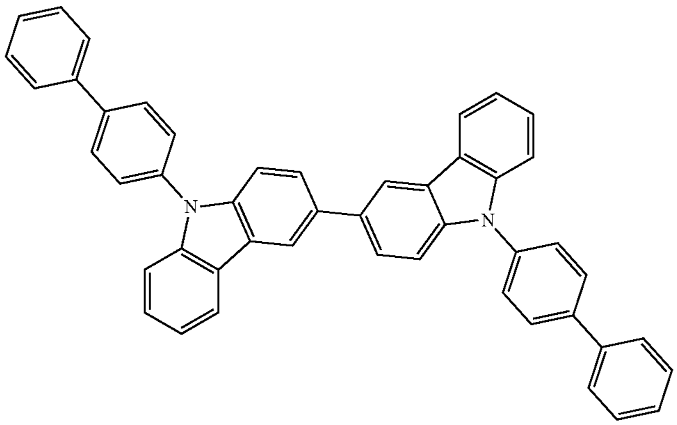
B-181
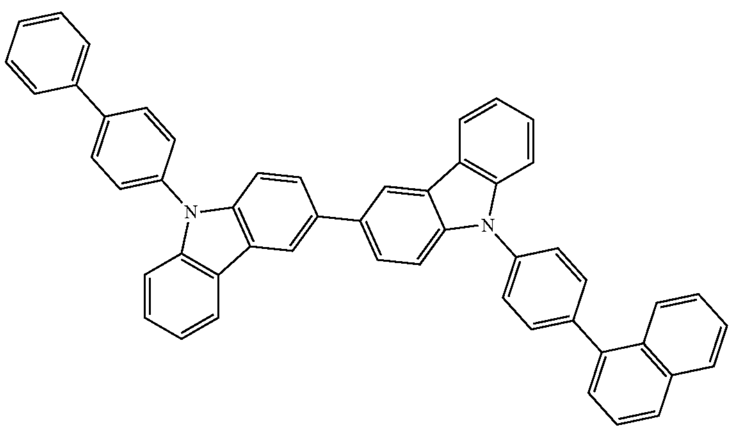
B-182
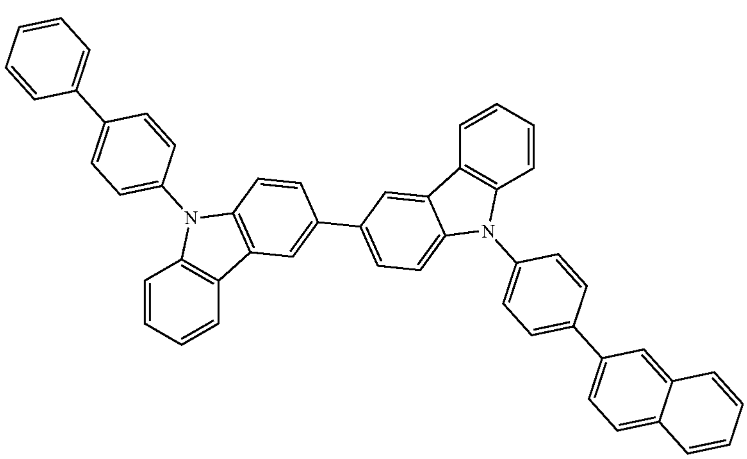

-continued
B-183
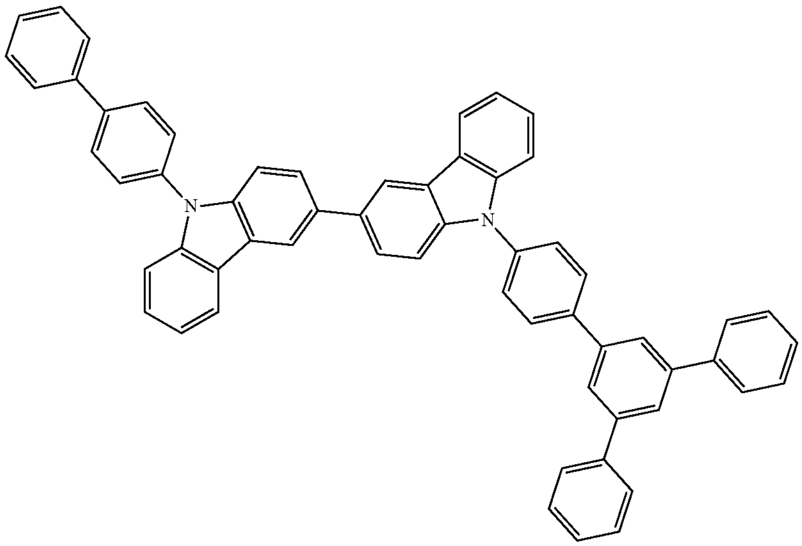
B-184
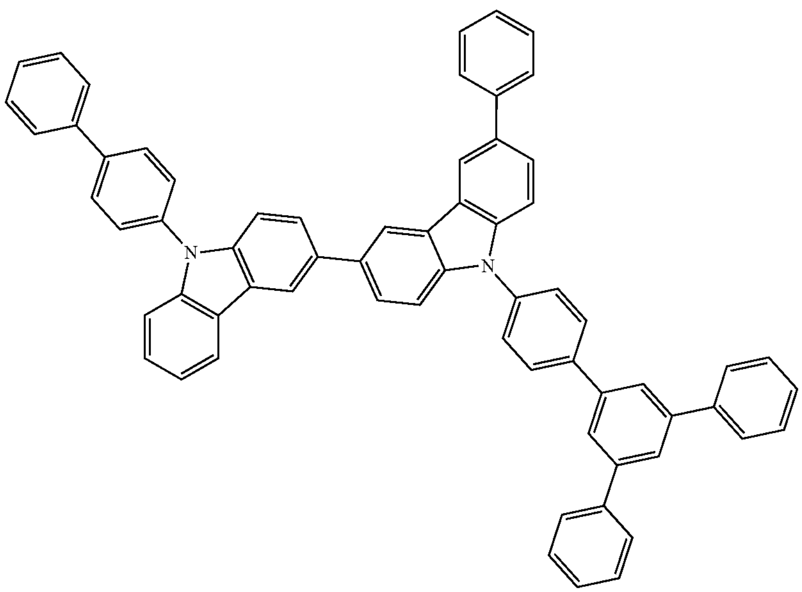
B-185
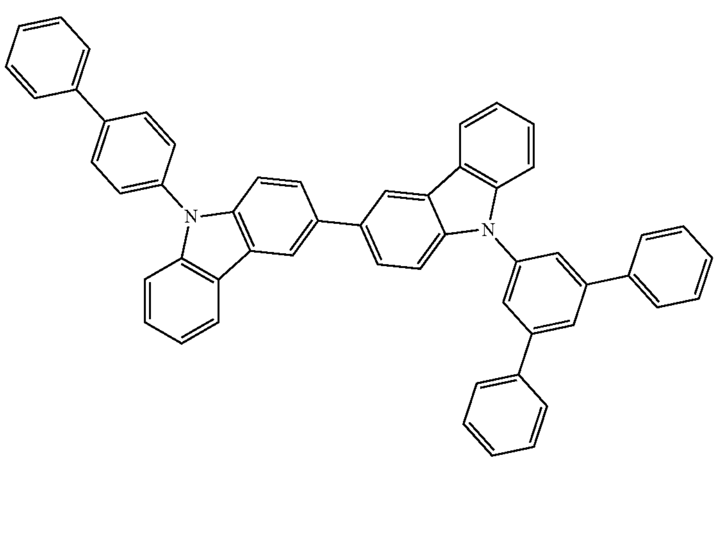

-continued
B-186
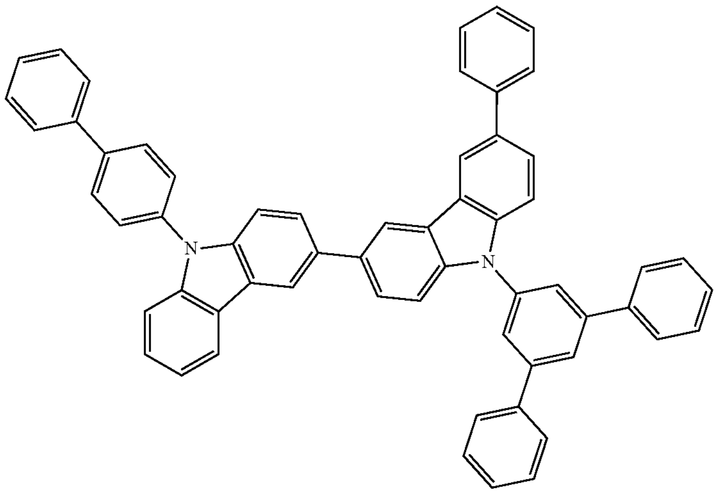
B-187
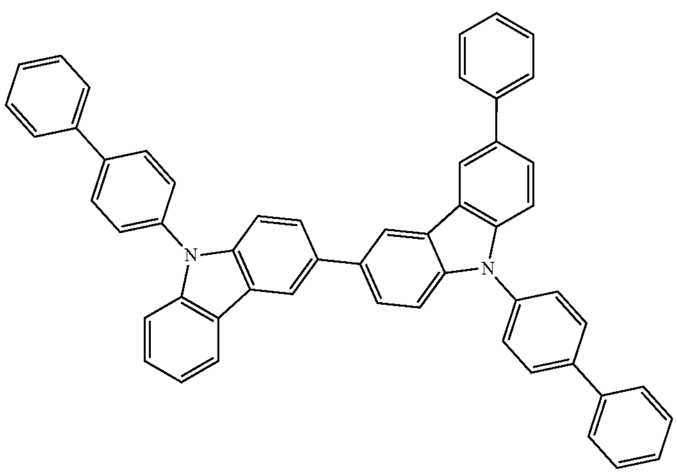
B-188
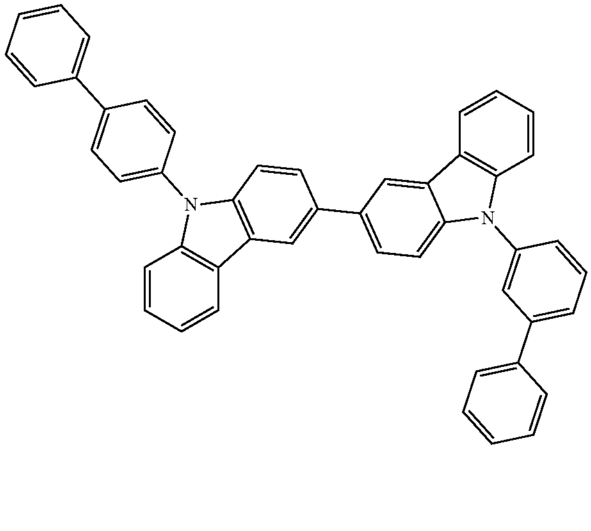

-continued
B-189
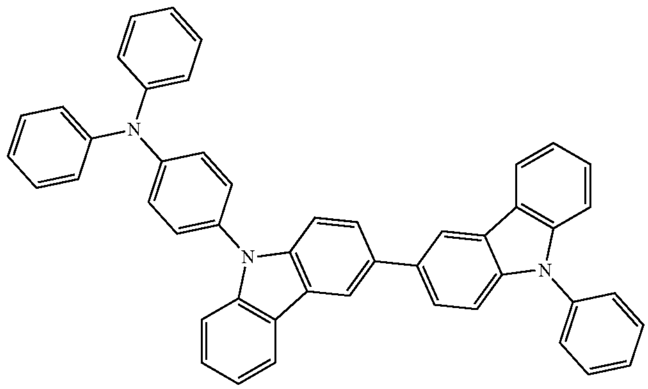
B-190
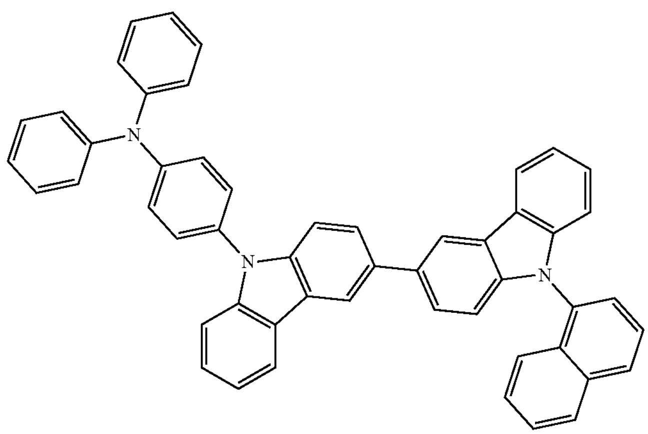
B-191
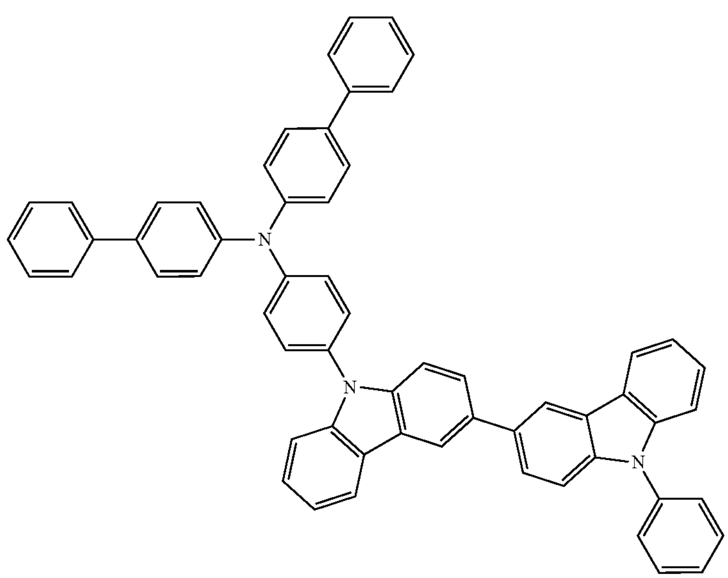

-continued
B-192
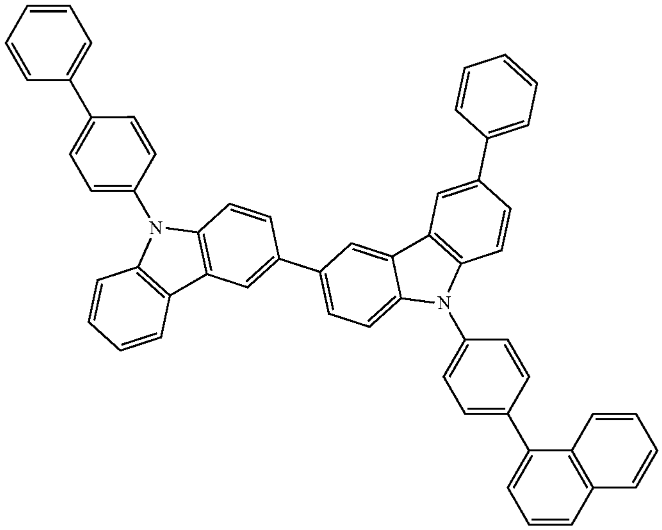
B-193
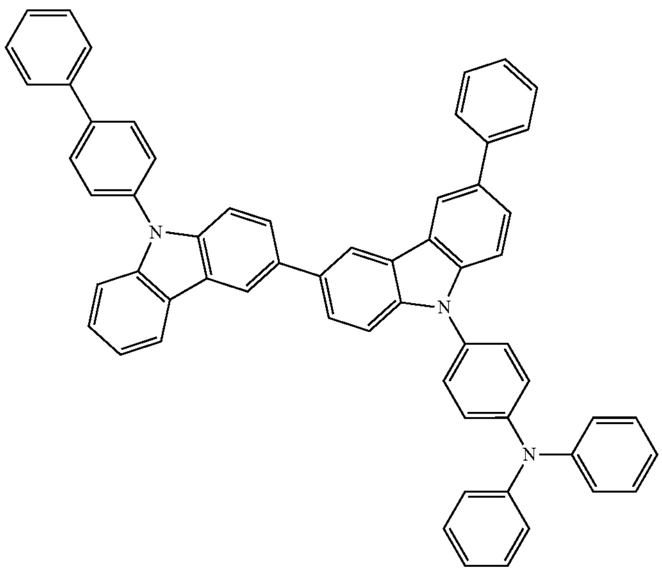
B-194
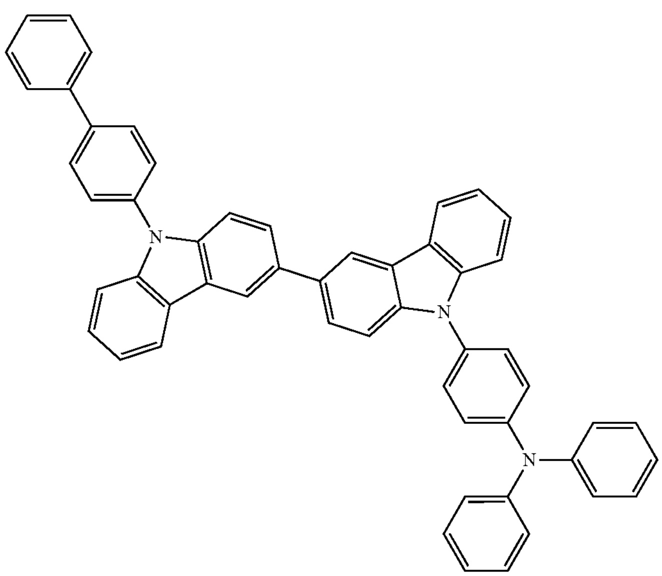

-continued
B-195
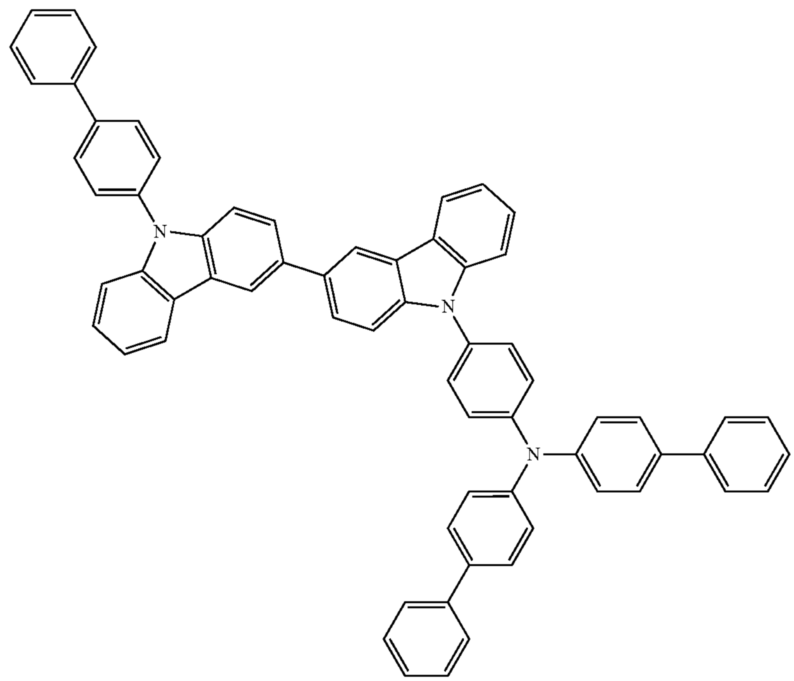
B-196
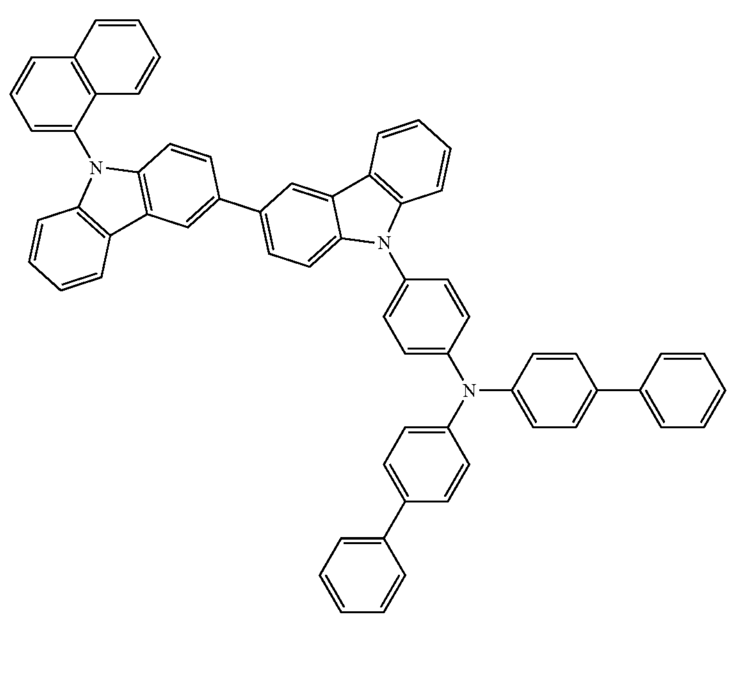

-continued
B-197
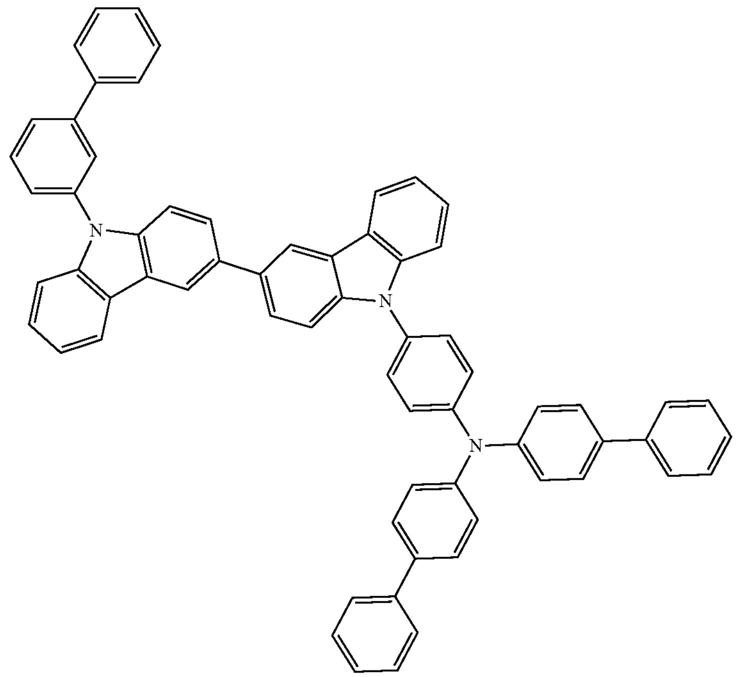
B-198
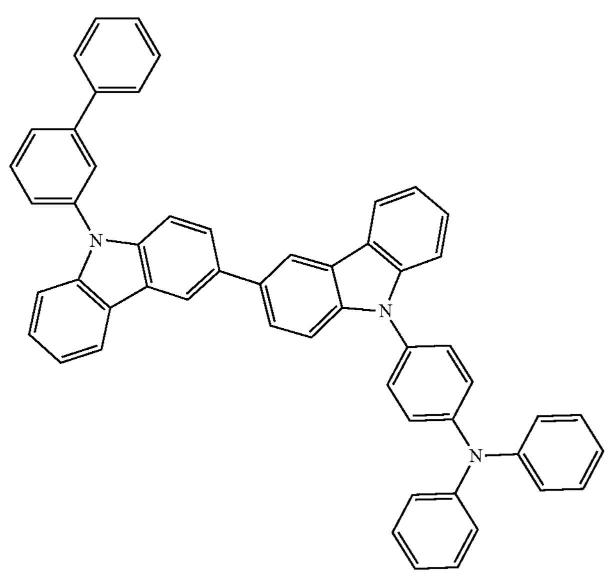

-continued
B-199
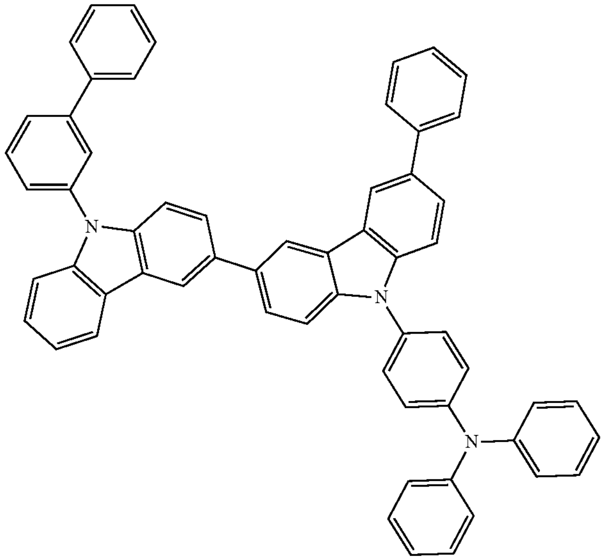
B-200
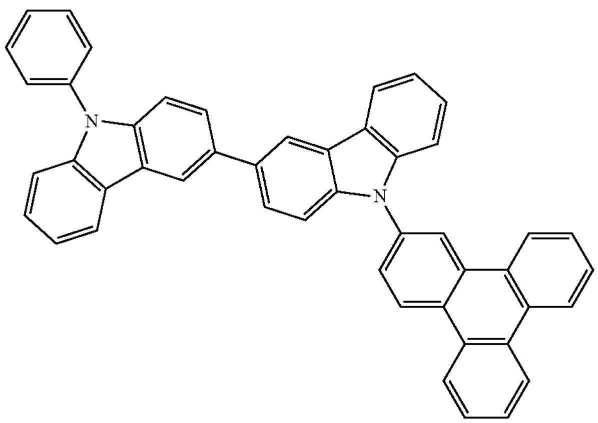
B-201
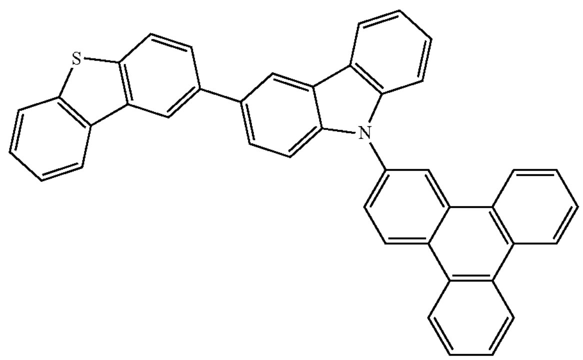
B-202
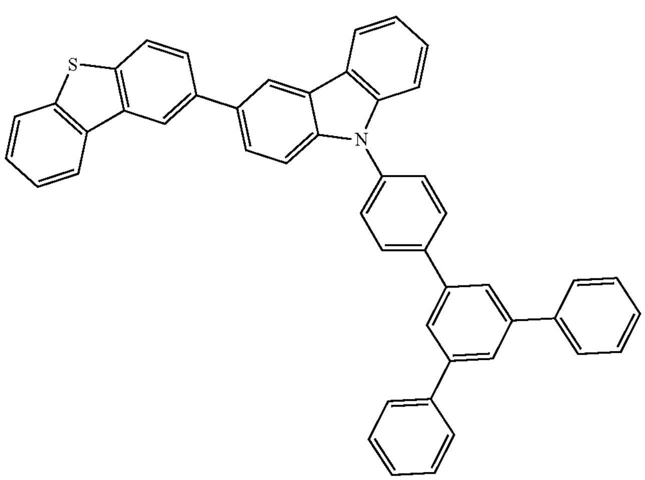

-continued
B-203
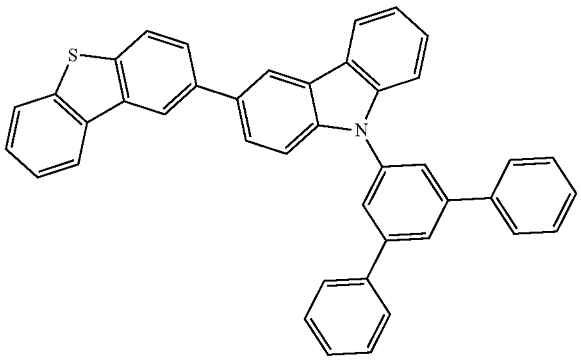
B-204
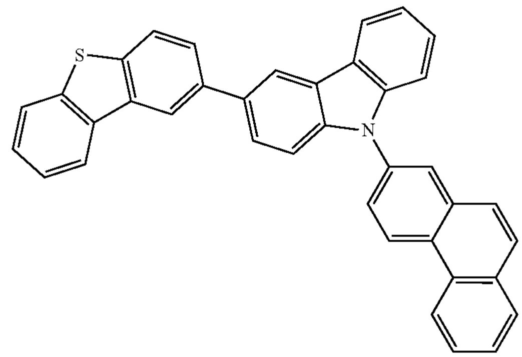
B-205
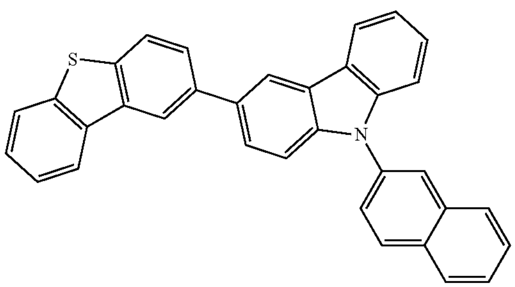
B-206
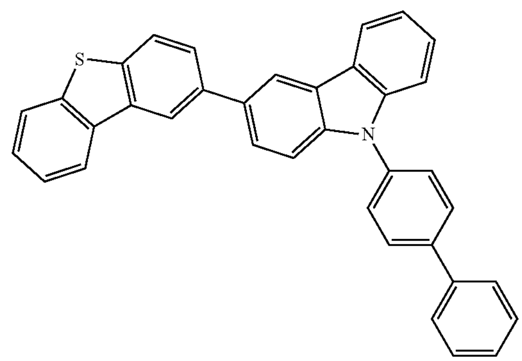
B-207
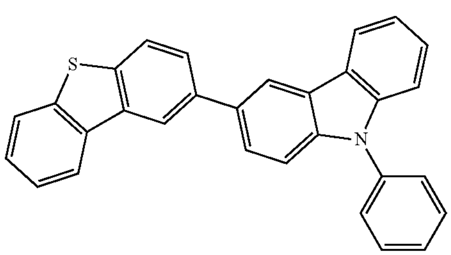
B-208
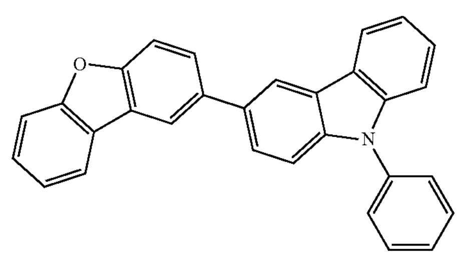
B-209
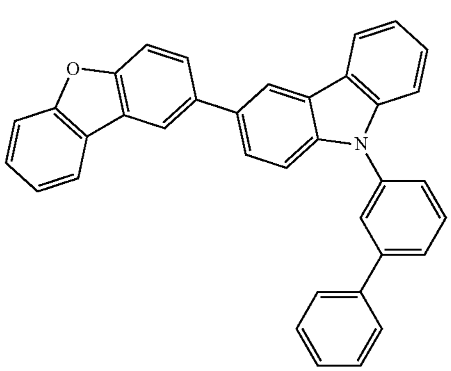
B-210
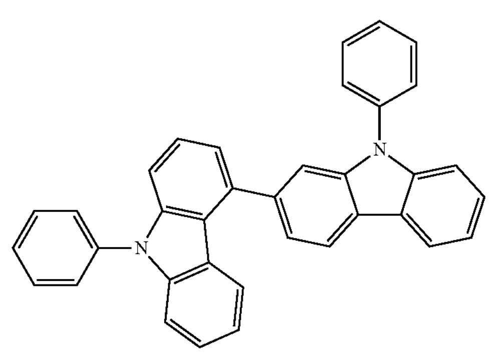

-continued
B-211
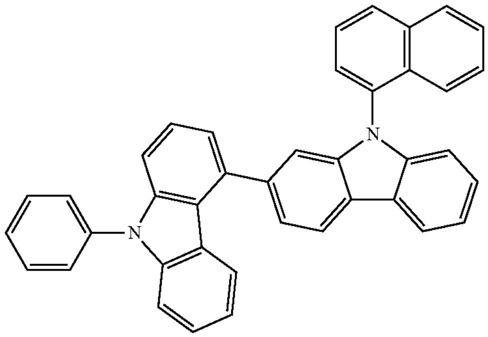
B-212
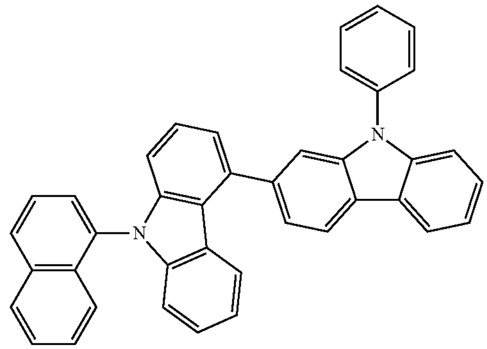
B-213
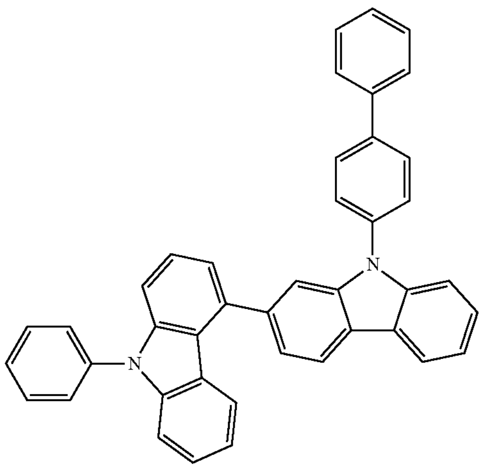
B-214
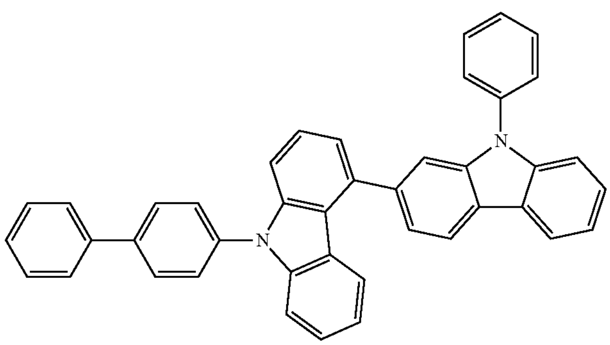
B-215
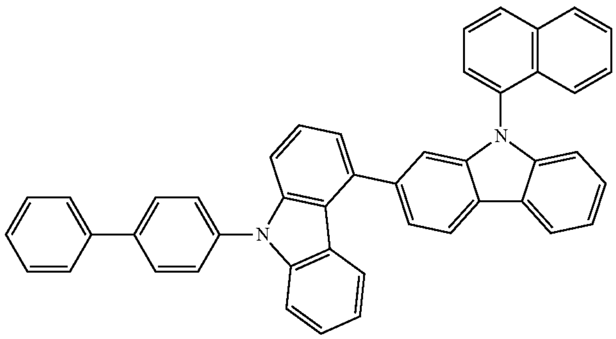

-continued
B-216
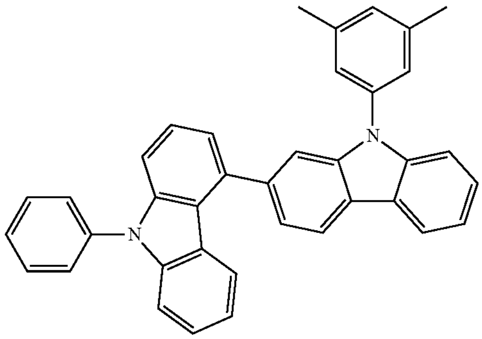
B-217
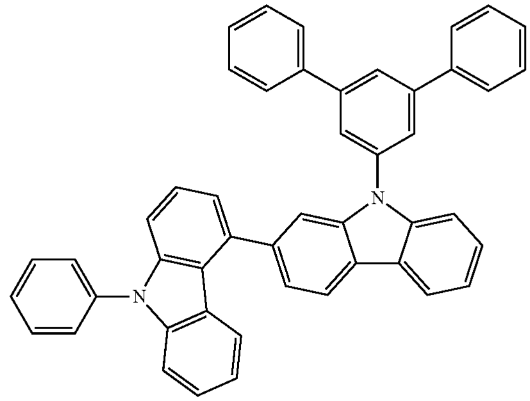
B-218
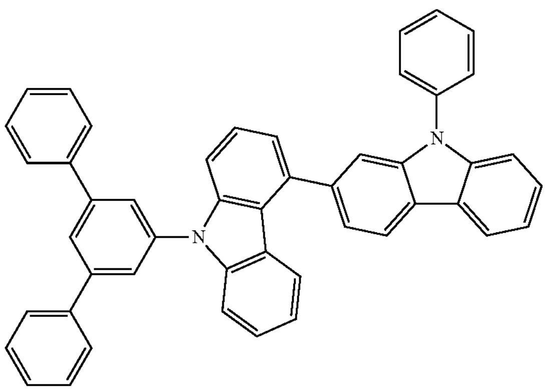
B-219
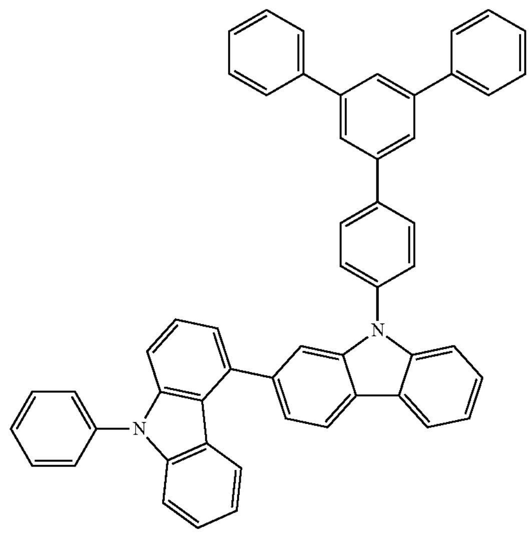
B-220
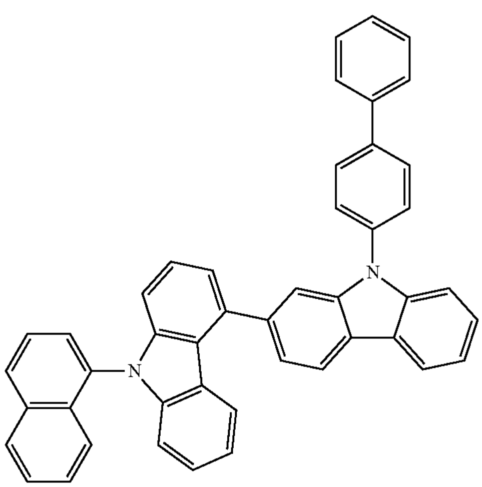
B-221
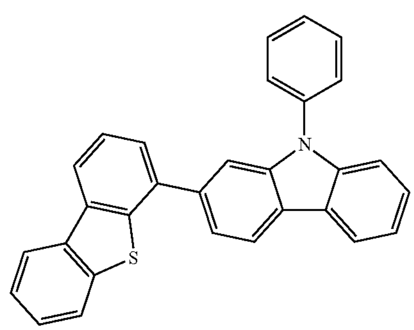

-continued
B-222
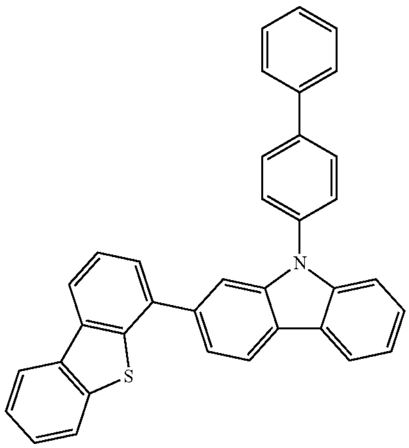
B-223
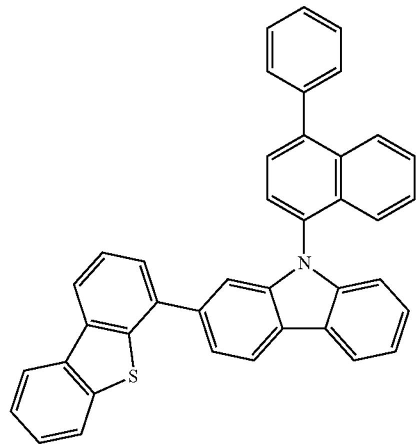
B-224
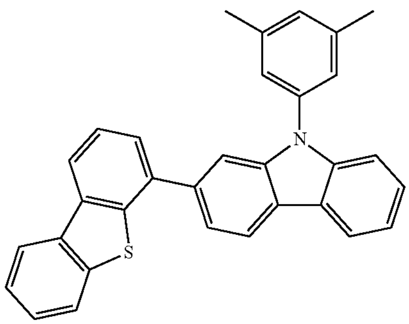
B-225
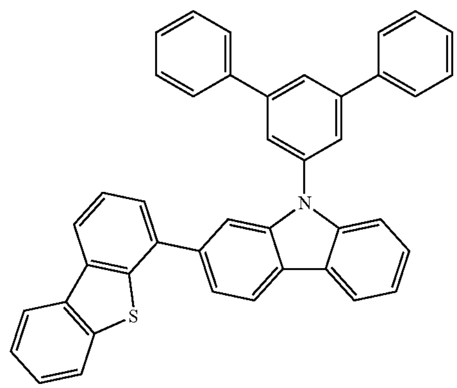
B-226
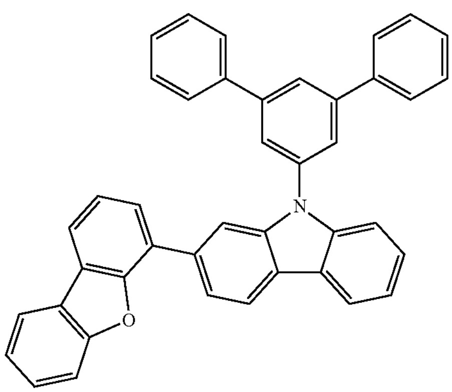
B-227
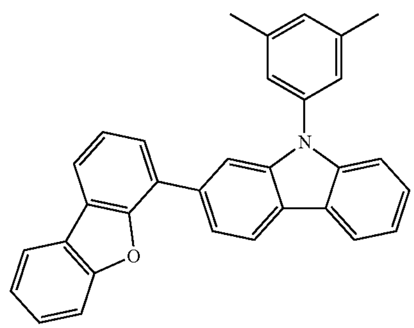
B-228
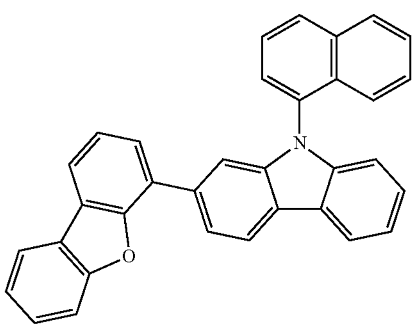
B-229
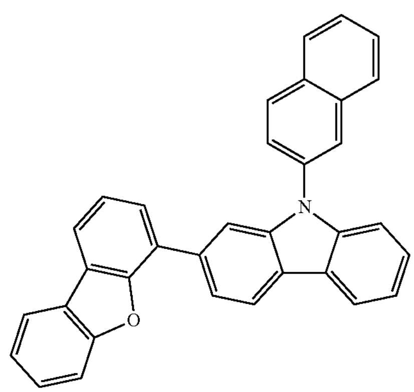

-continued
B-230
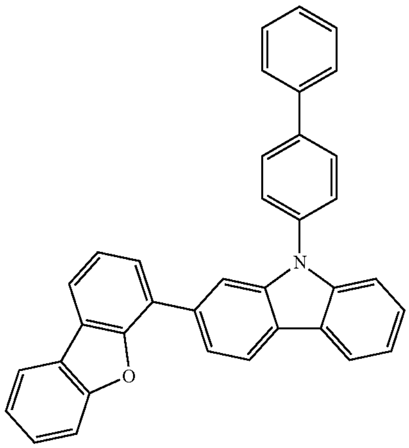
E-104
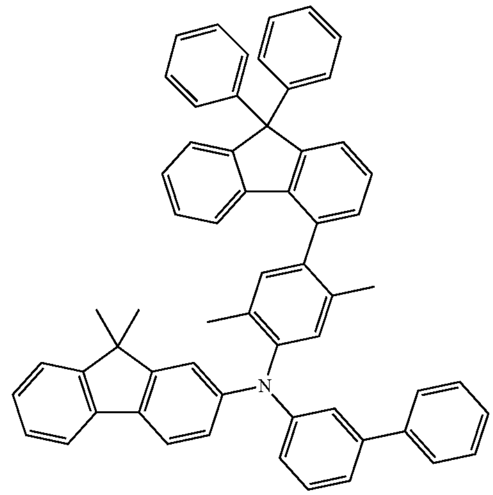
E-105
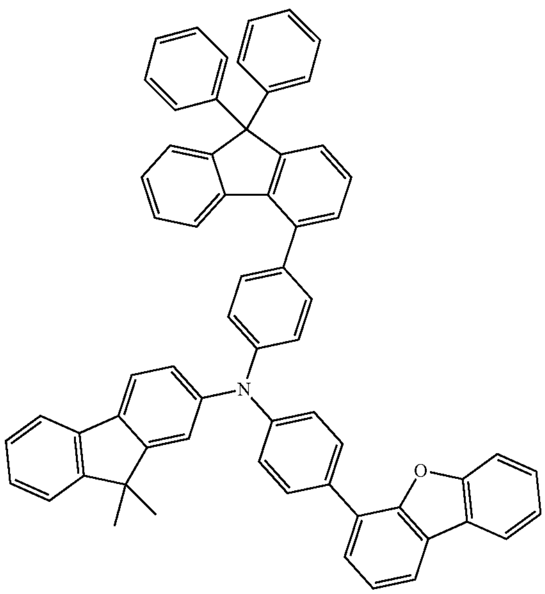
E-106
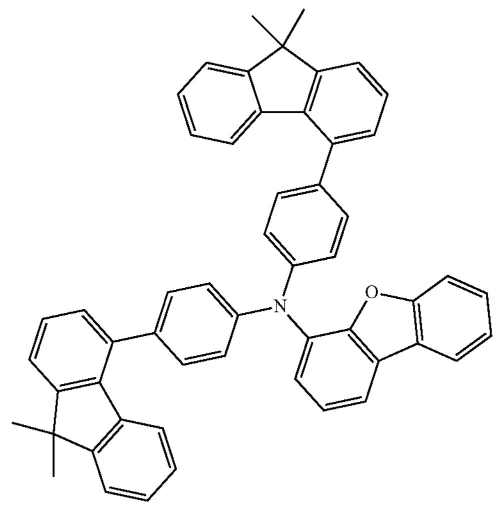
E-107
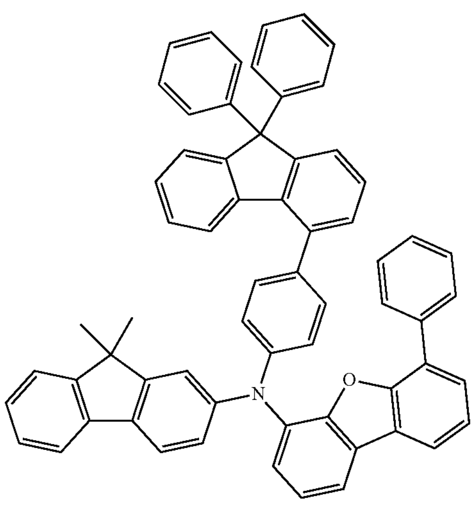
E-108
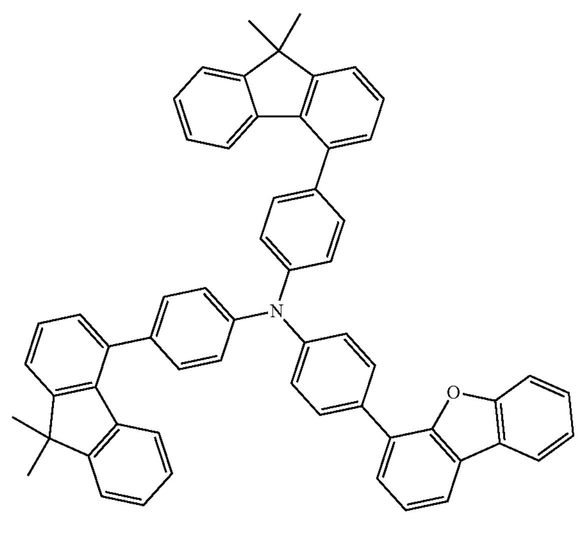

-continued
E-109
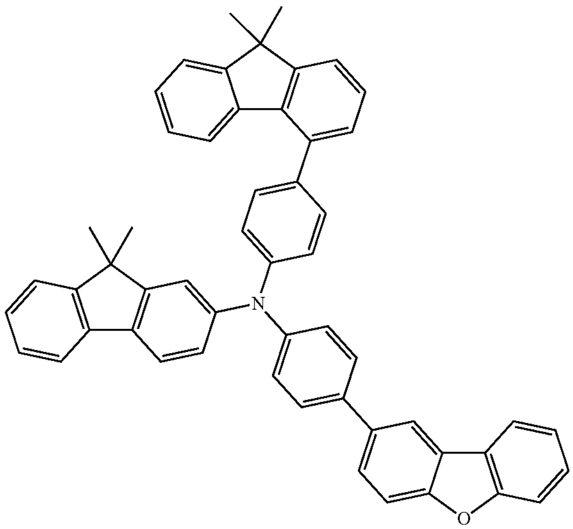
E-110
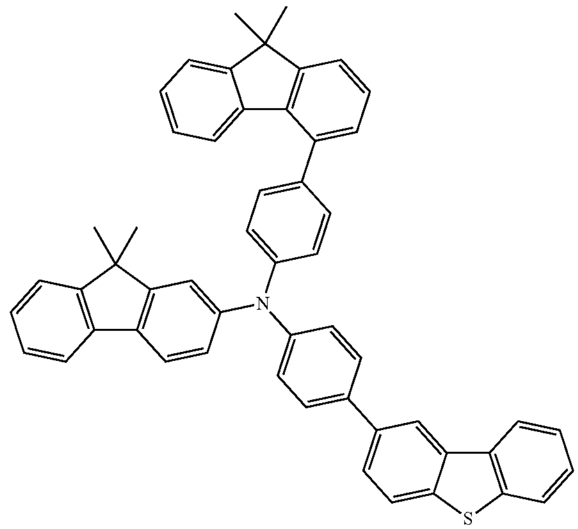
E-111
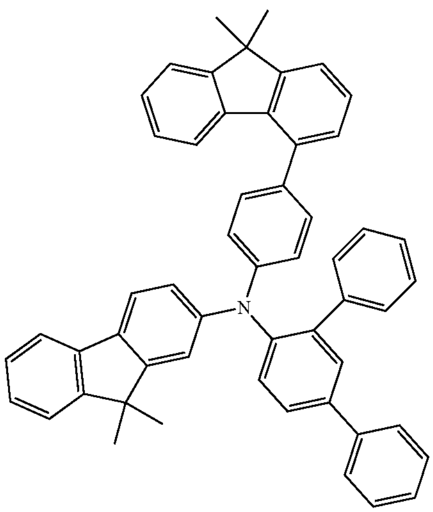
E-112
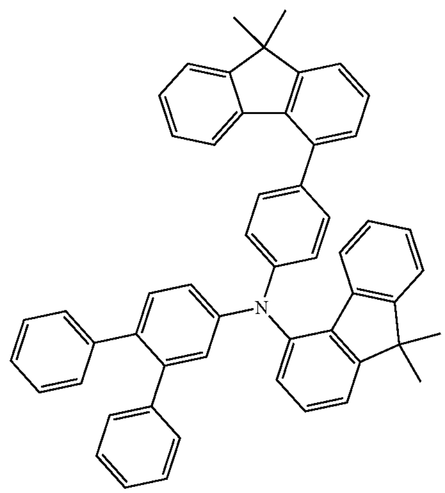
E-113
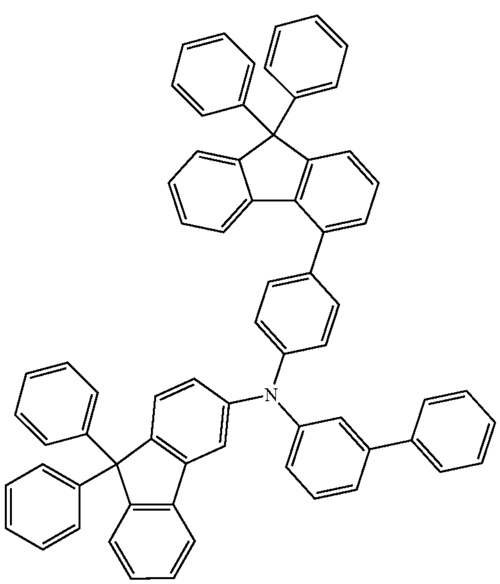
E-115
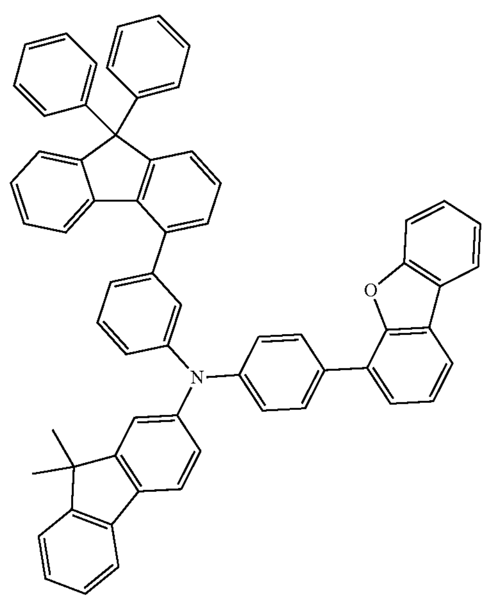

-continued
E-118
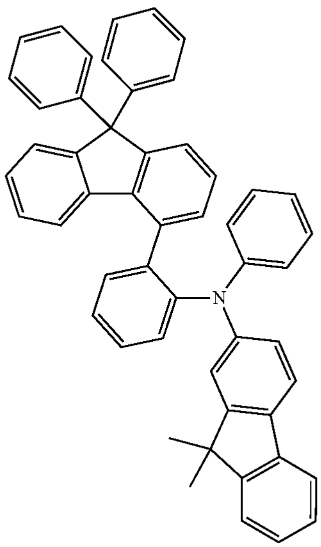
E-120
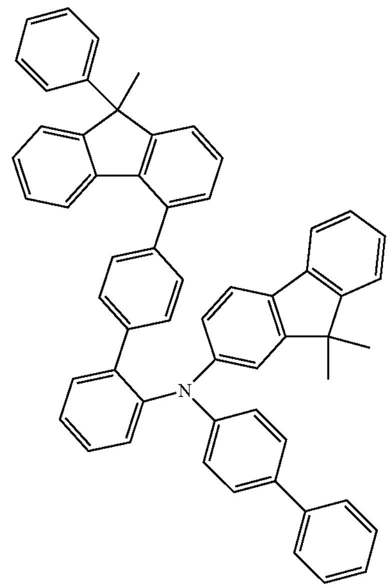
E-122
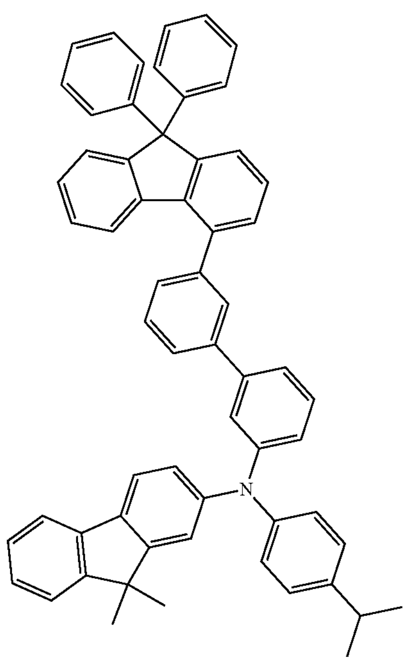
E-123
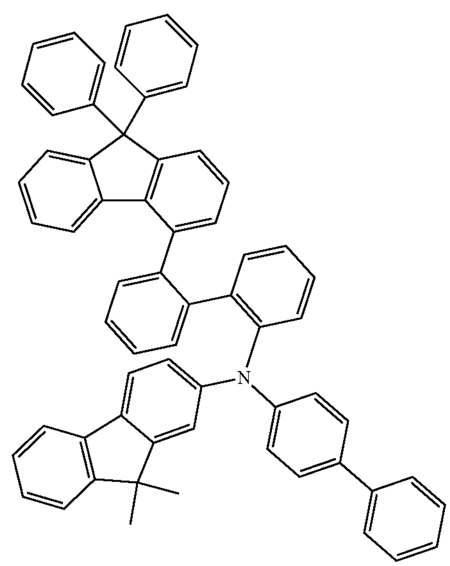

-continued
E-124
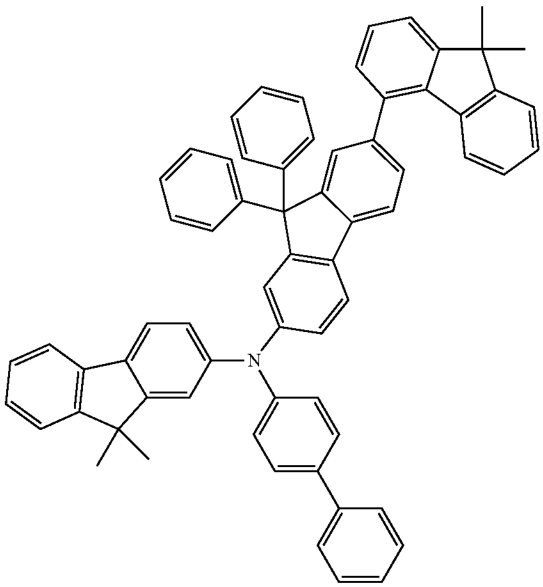
E-125
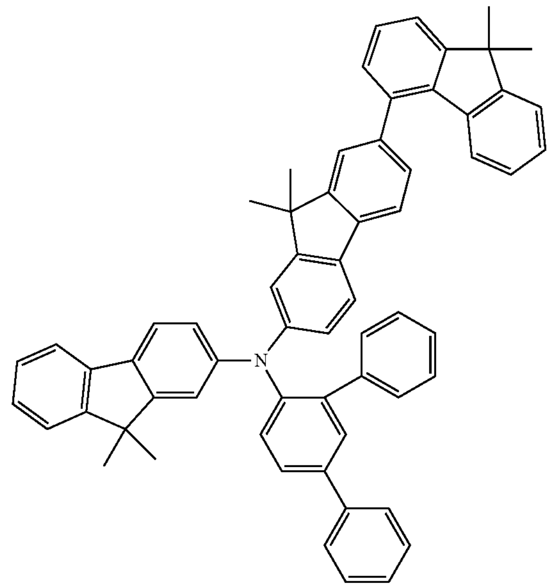
E-126
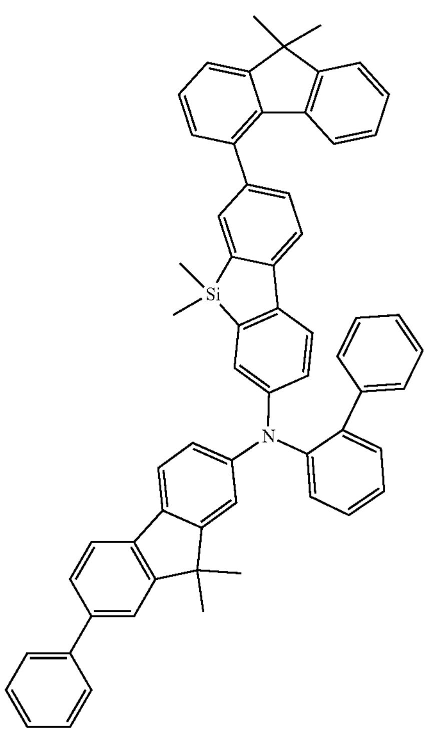
E-127
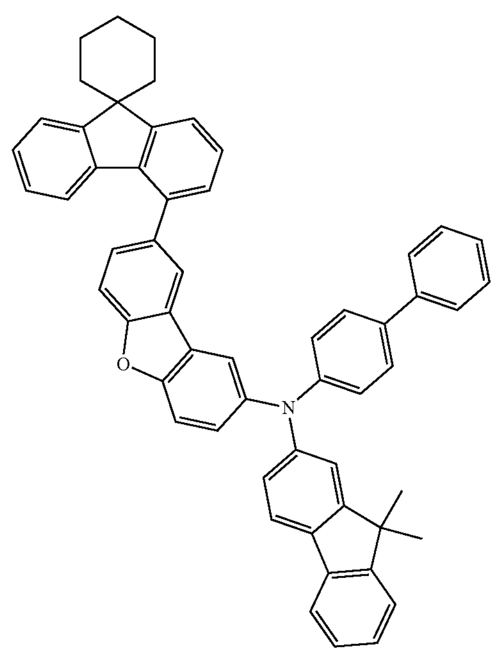

-continued
E-128
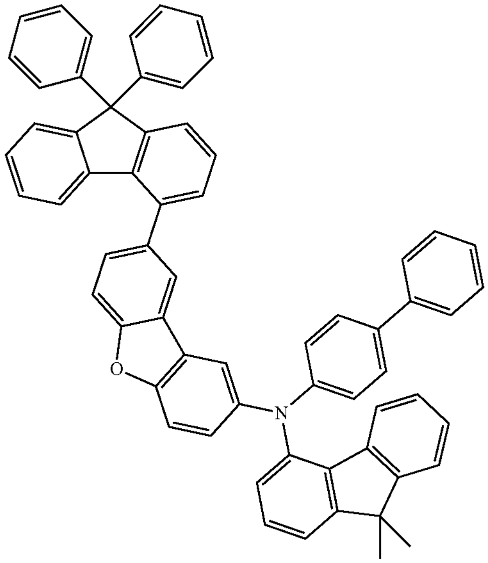
E-130
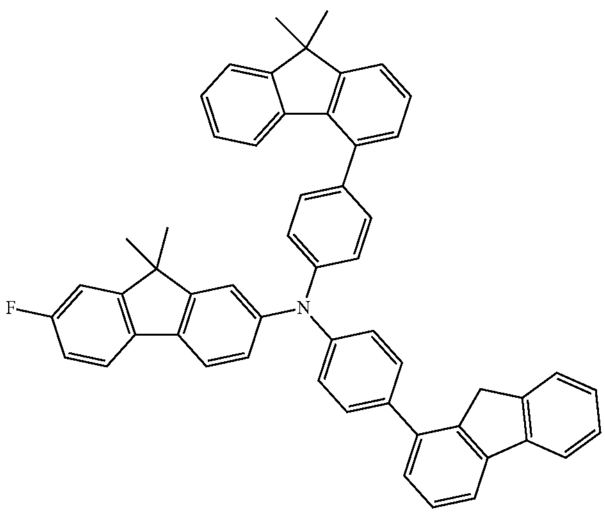
E-135
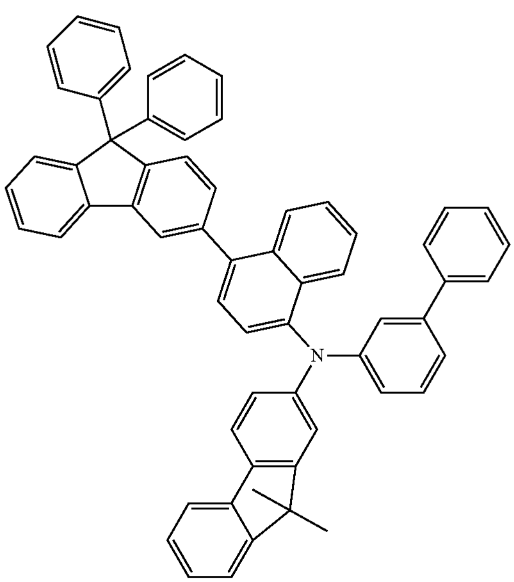
E-137
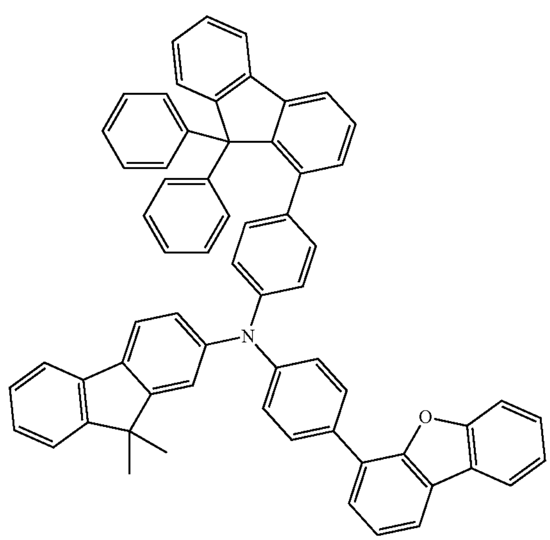

-continued
E-138
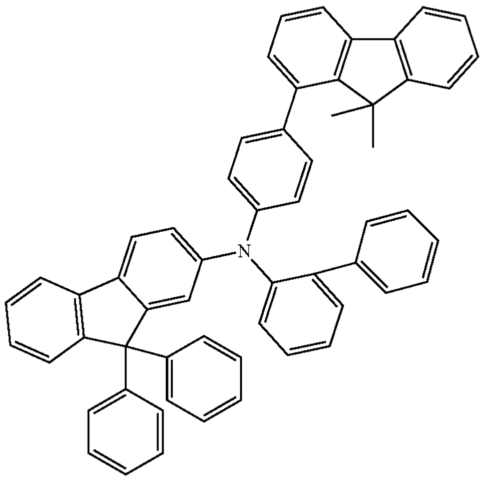
E-139
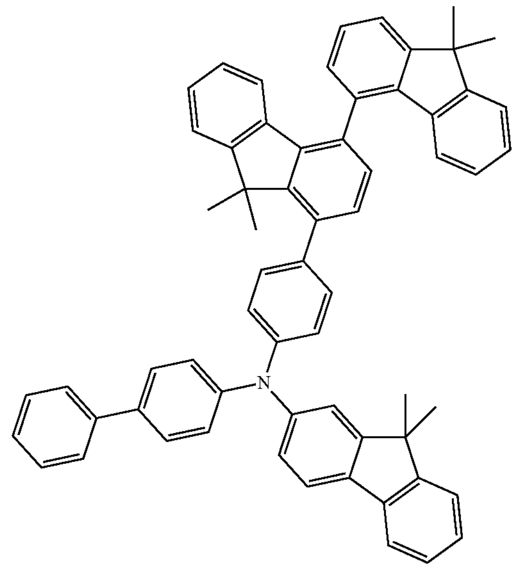
E-140
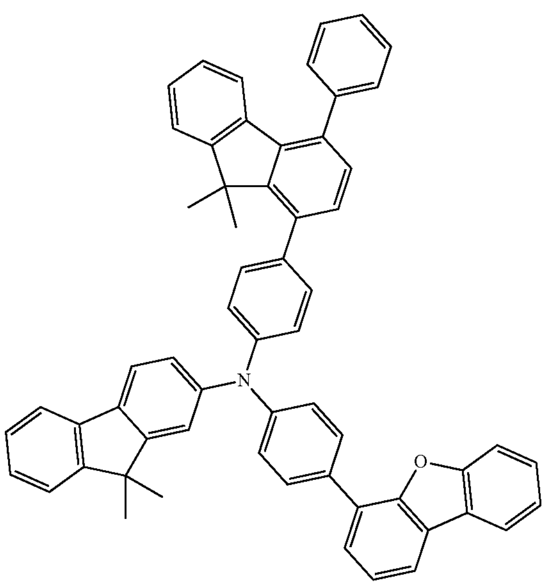
E-141
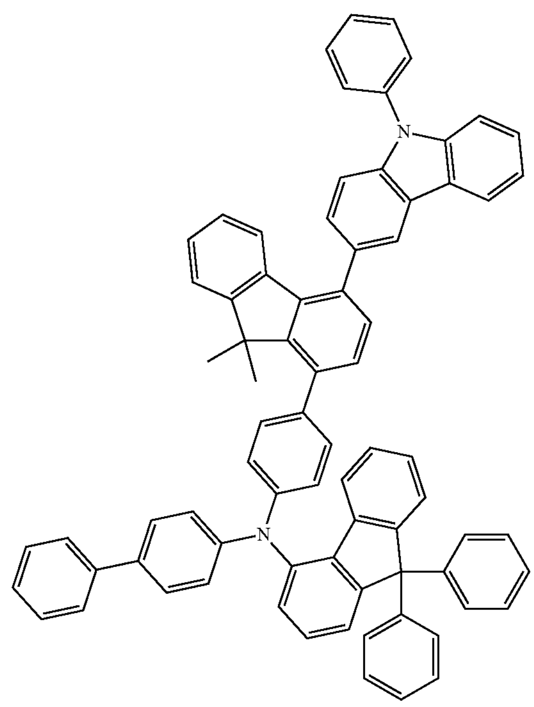

-continued
E-142
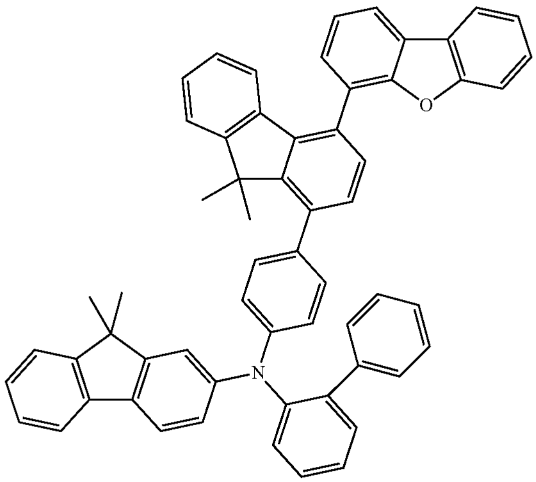
E-143
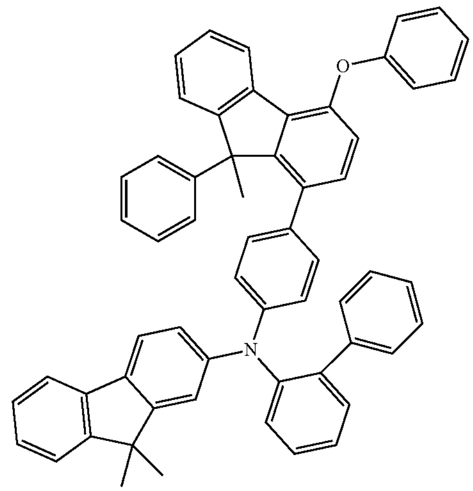
E-144
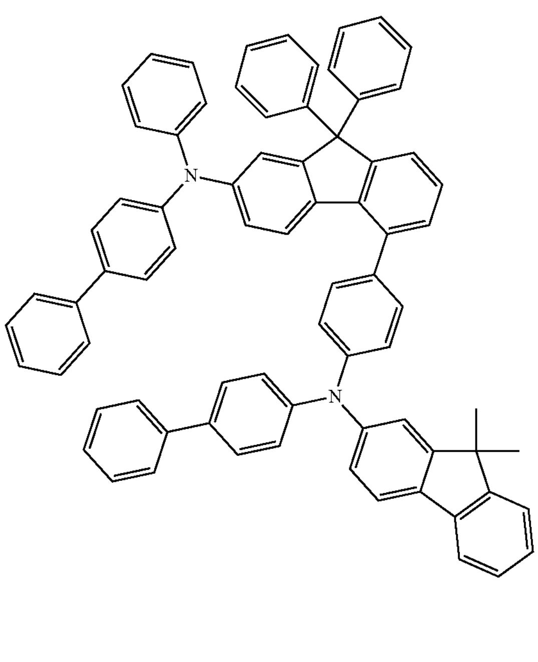
E-145
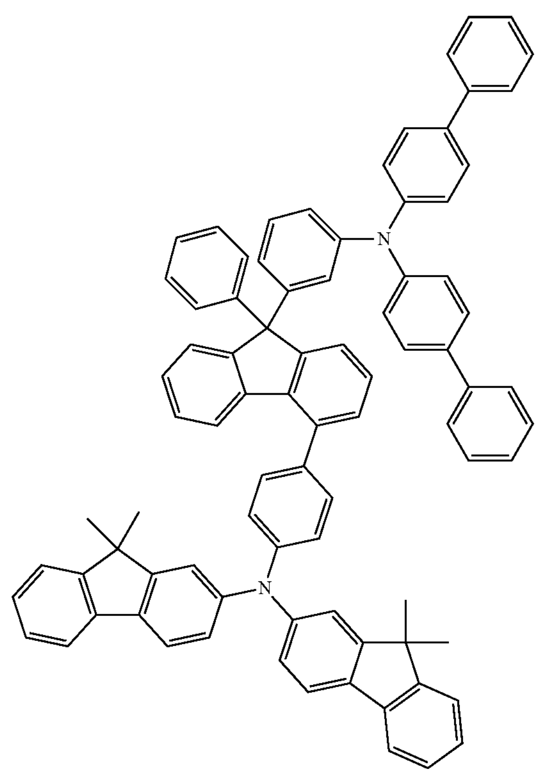

-continued
E-146
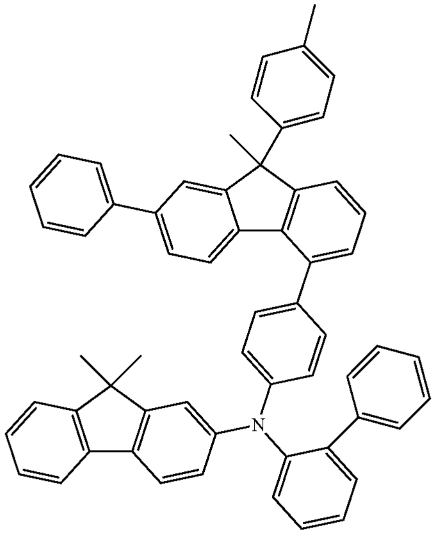
E-147
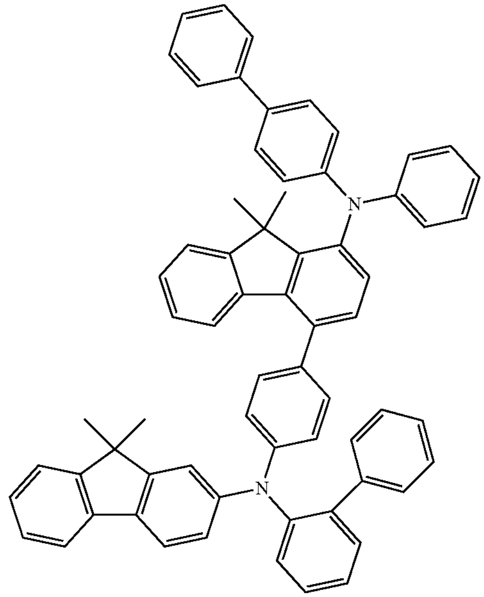
E-148
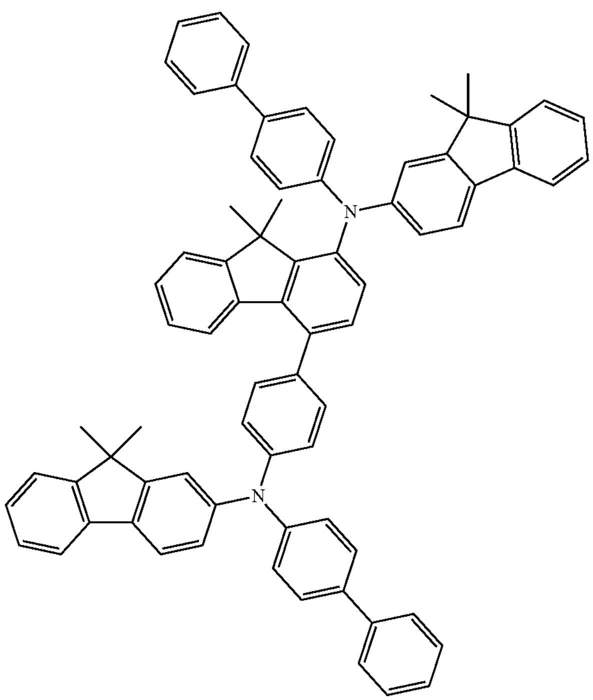

-continued
E-149
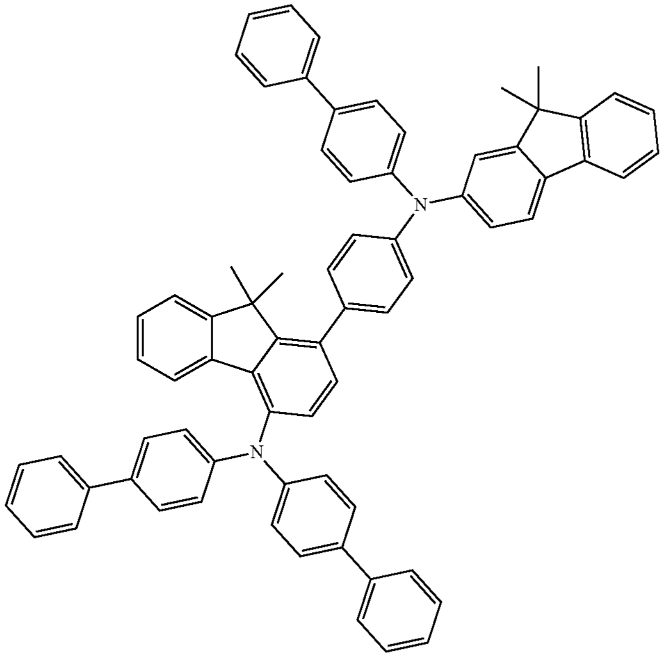
E-150
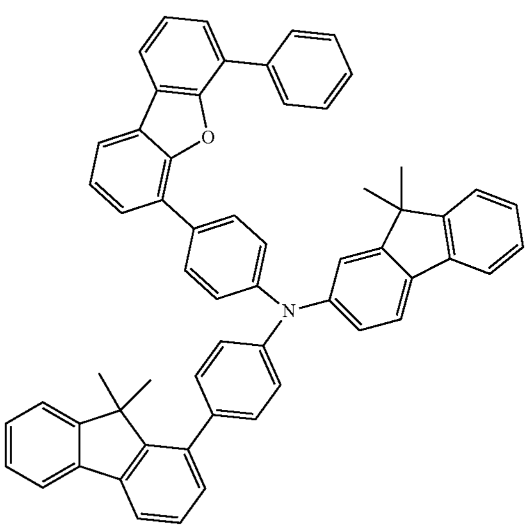
E-151
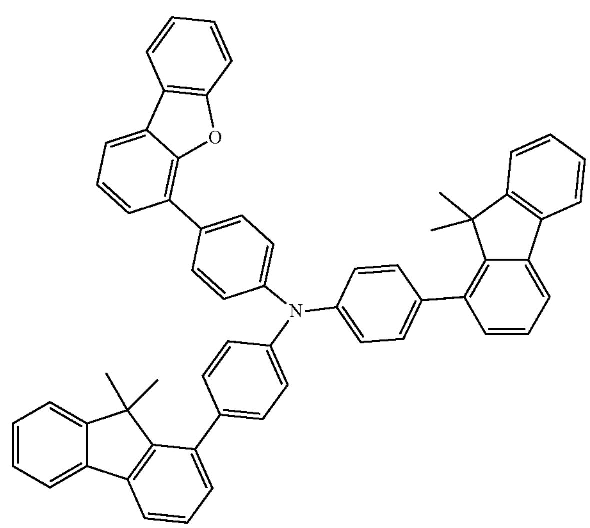

-continued
E-152
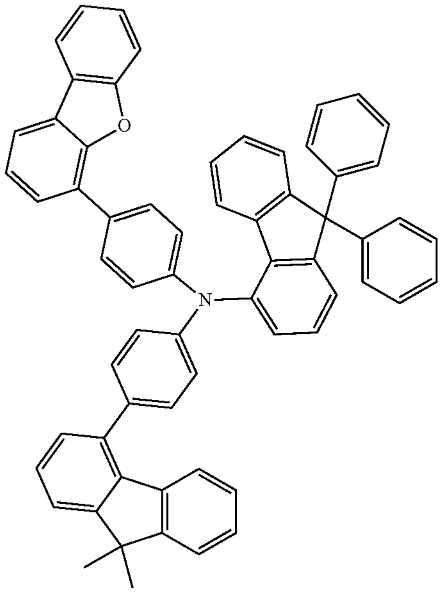
E-153
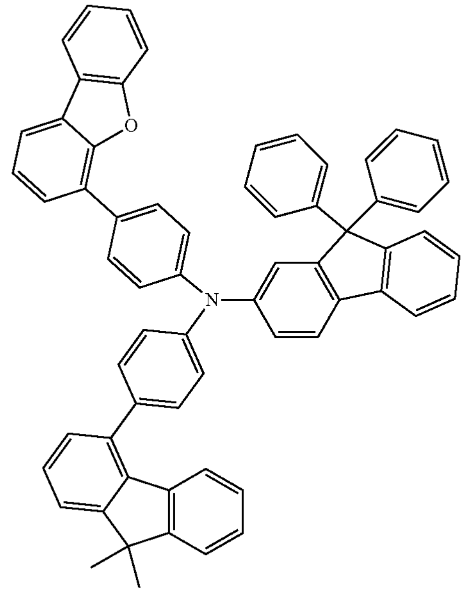
E-154
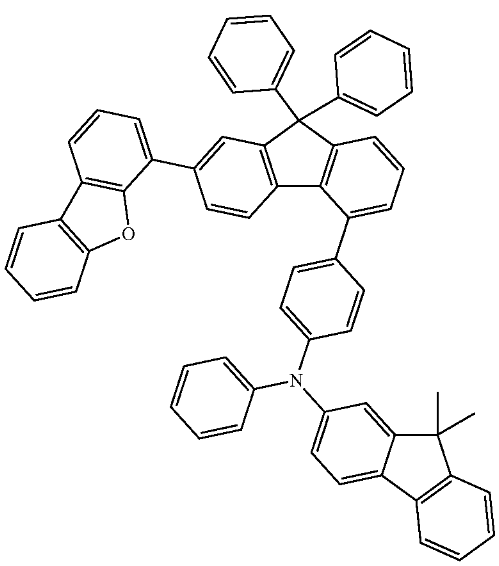
E-155
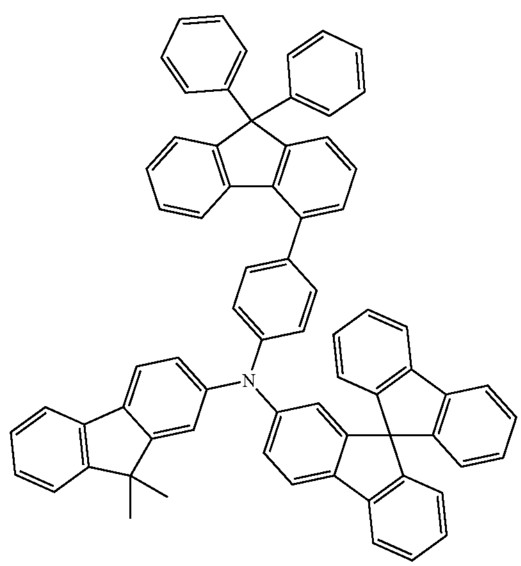

-continued
E-156
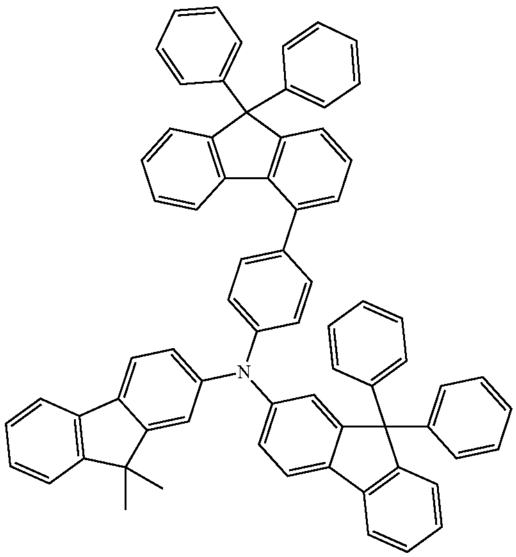
E-157
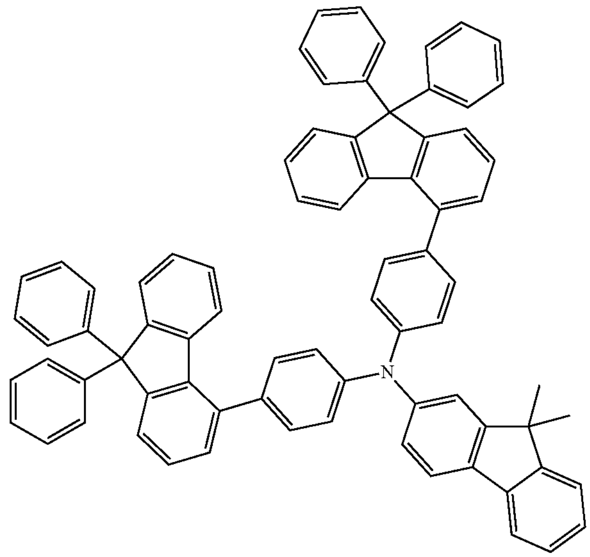
E-159
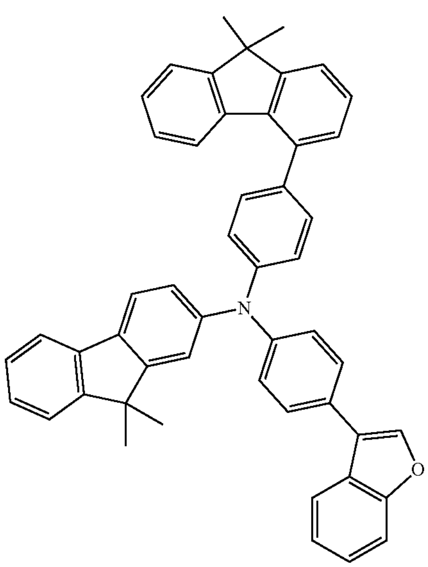
E-160
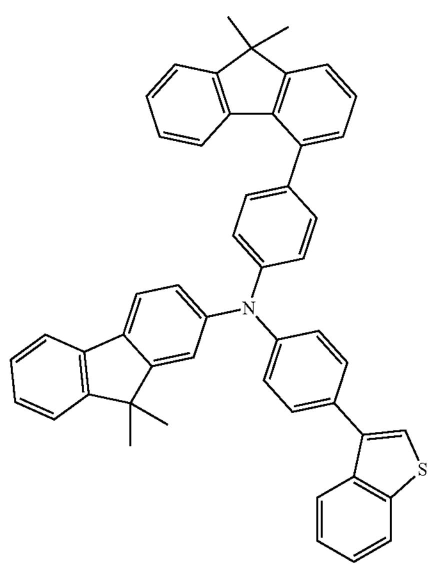

-continued
E-161
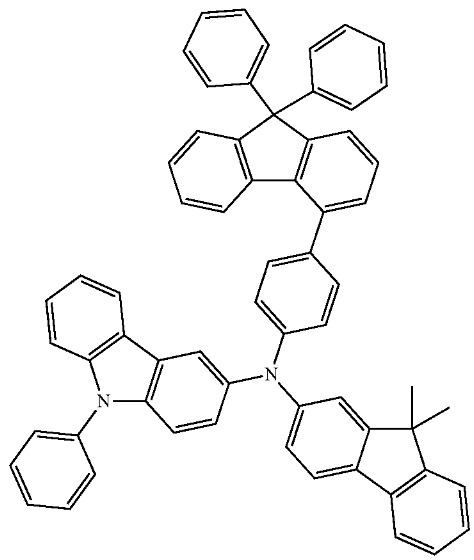
E-162
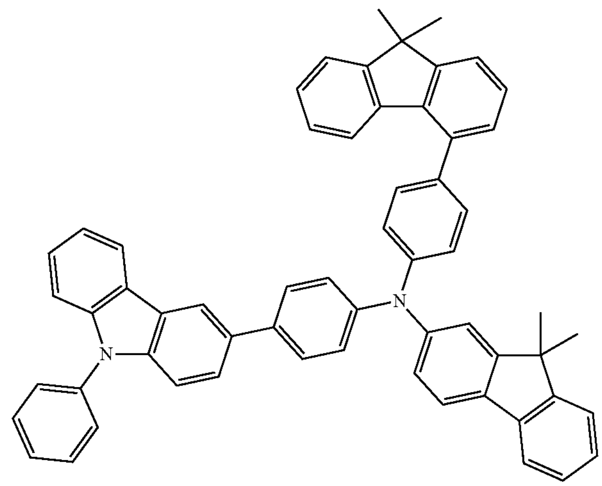
E-163
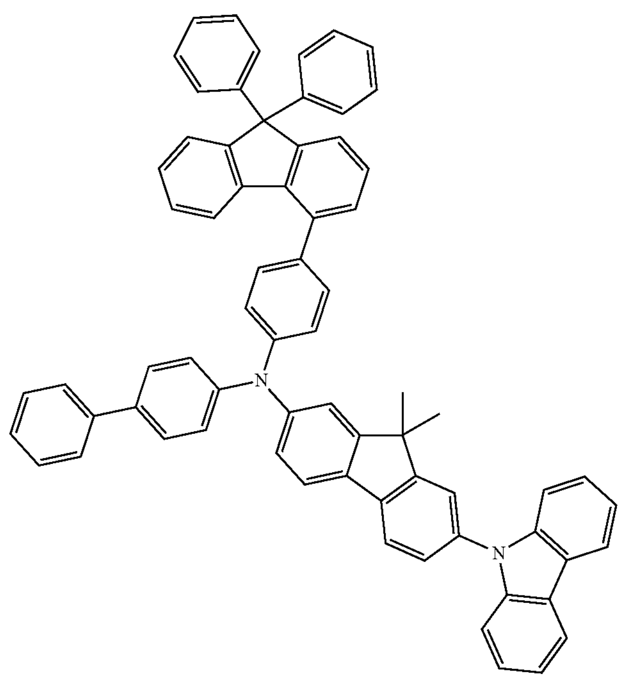

-continued
E-164
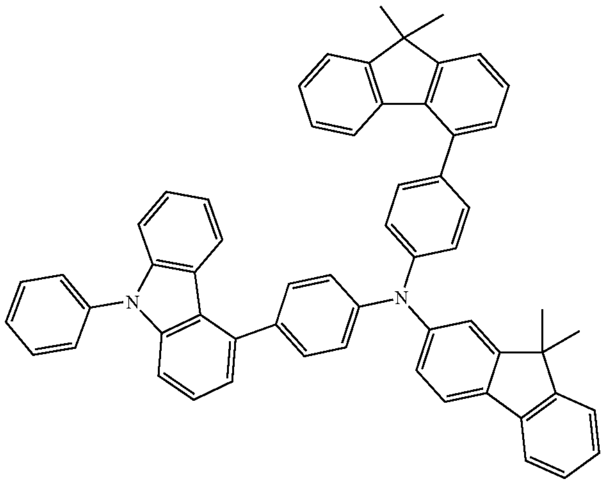
E-165
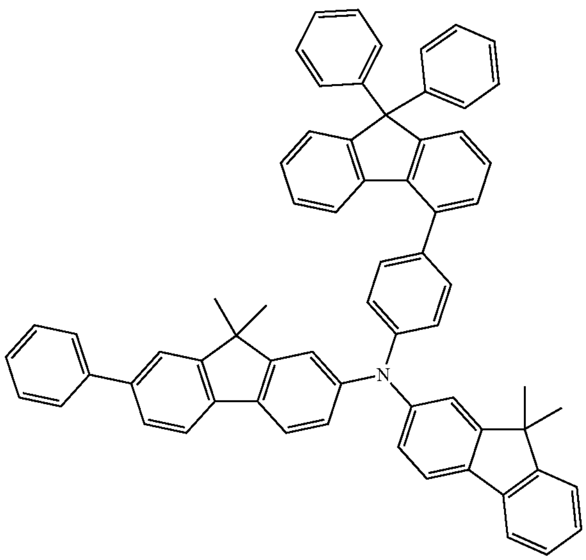
E-166
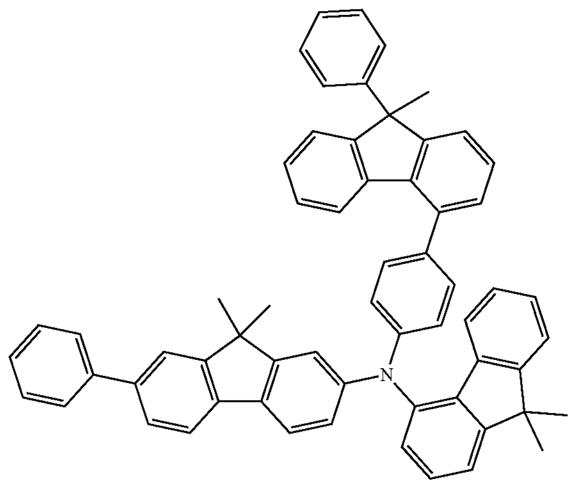
E-167
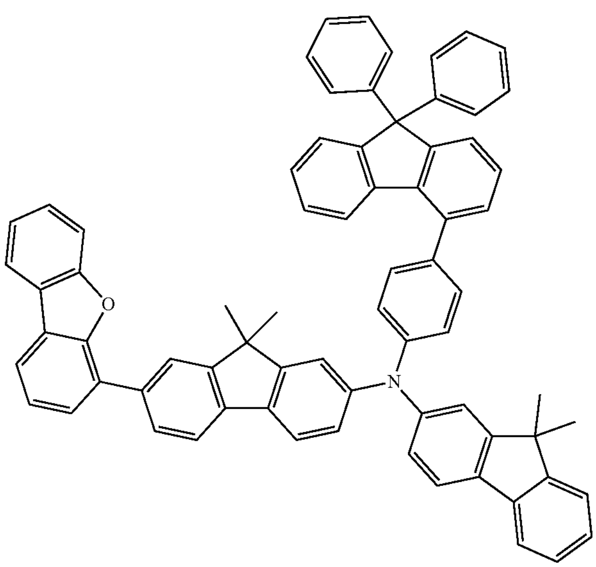
E-168
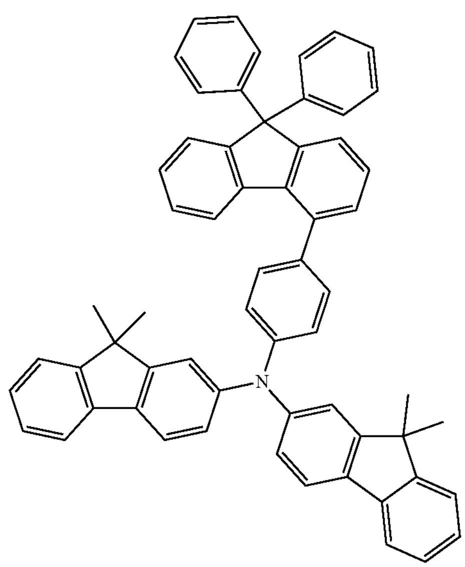

-continued
E-259
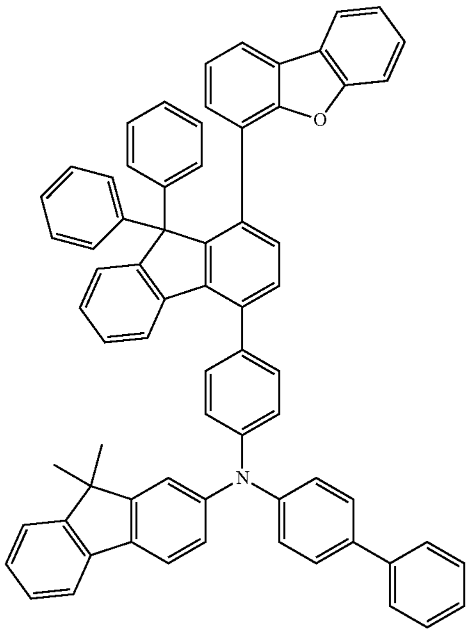
E-260
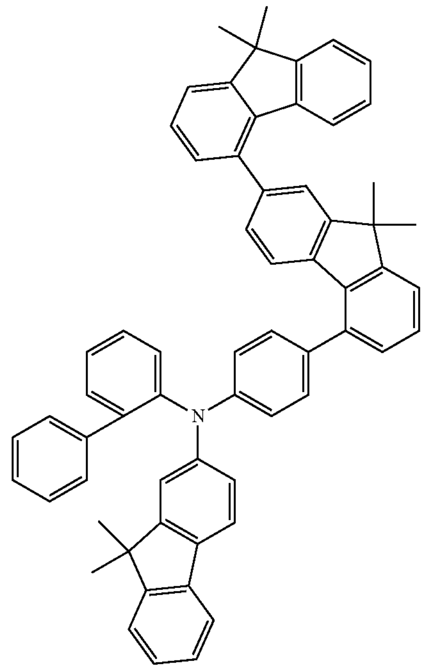
E-261
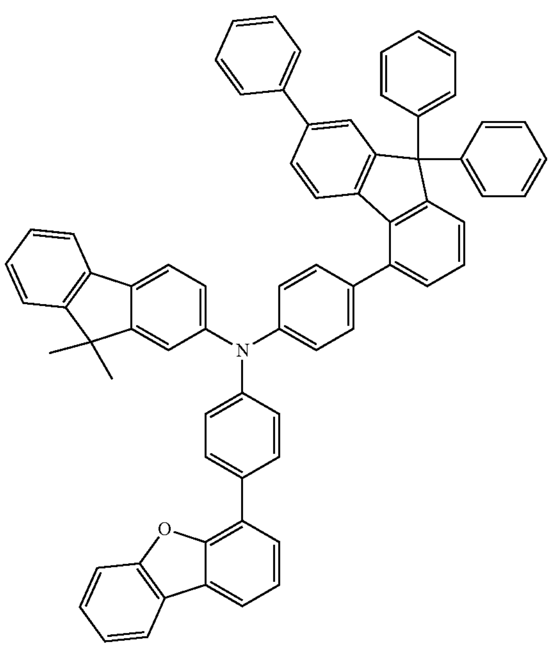
E-262
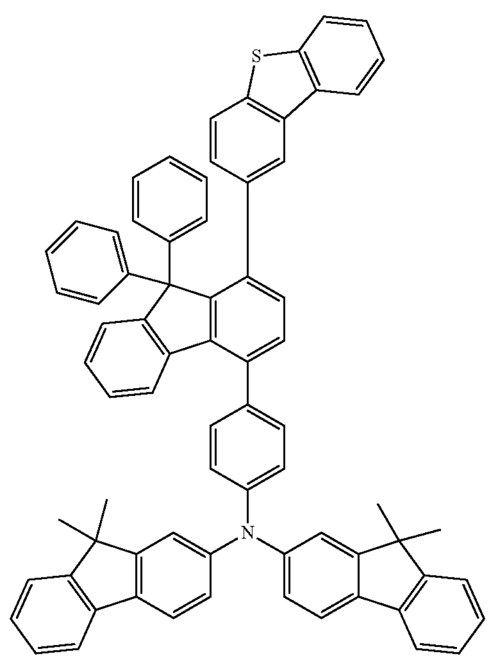

-continued
E-263
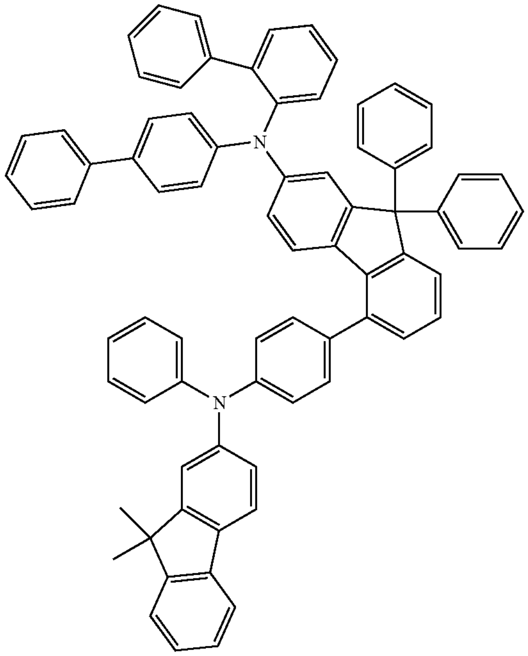
E-264
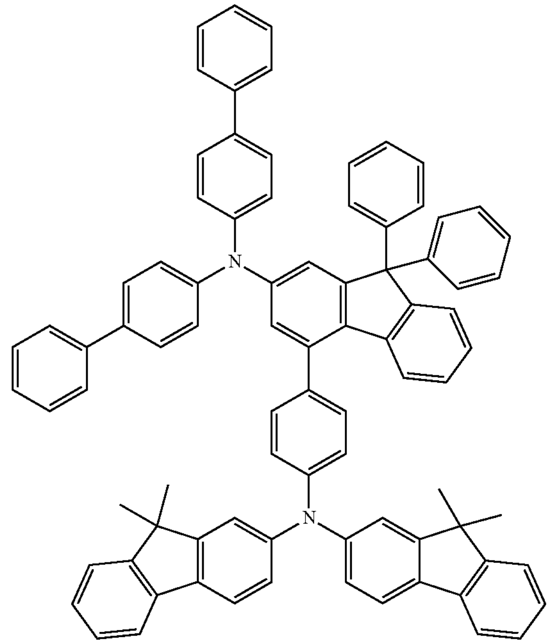
E-265
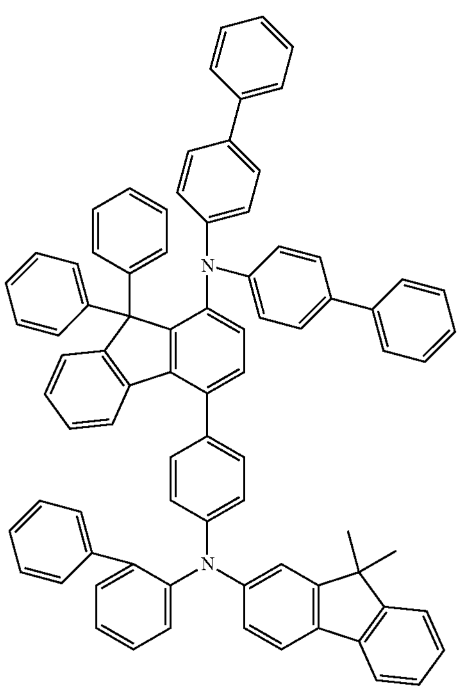
E-266
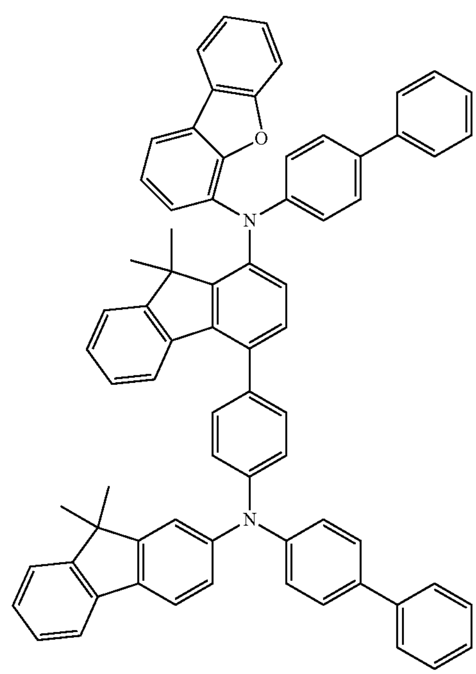

-continued

E-267

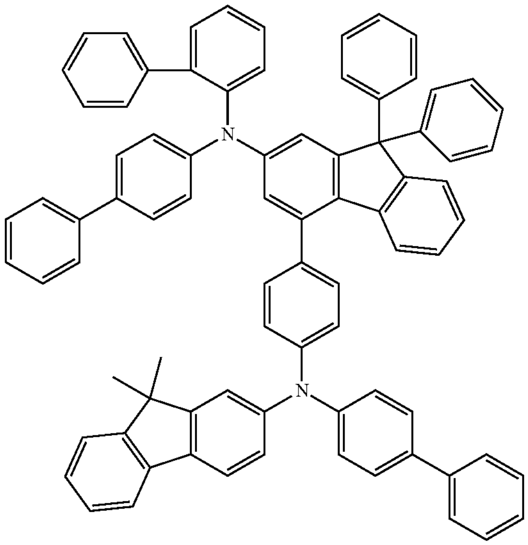

E-268

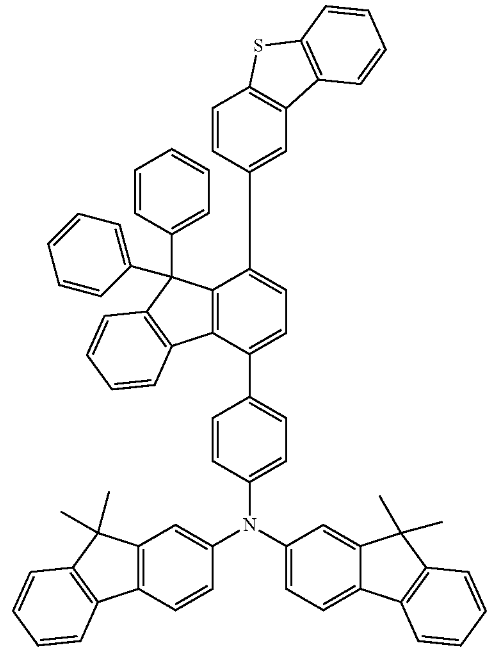

E-269

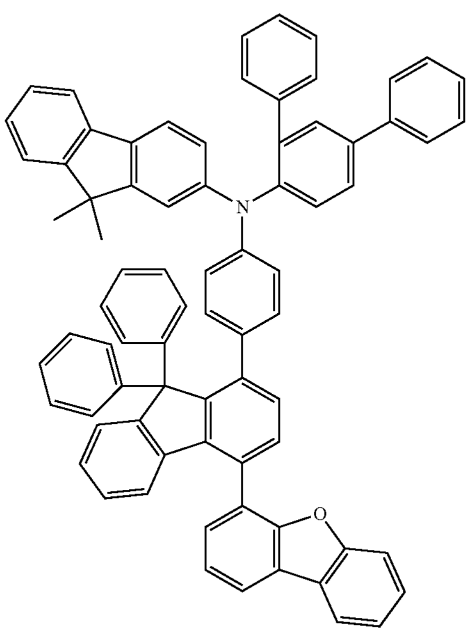

E-270

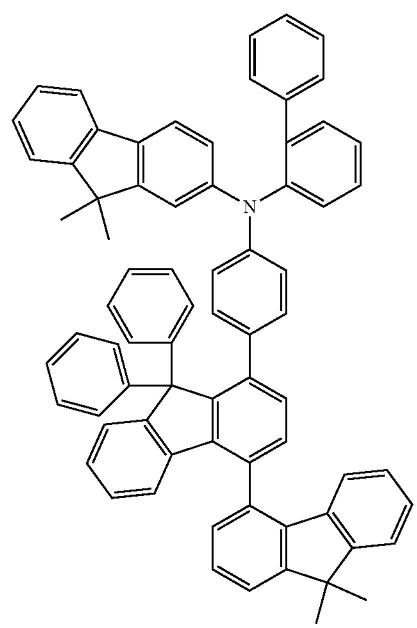

3. An organic light-emitting device comprising:

a first electrode;

a second electrode; and an organic layer between the first electrode and the second electrode, the organic layer comprising an emission layer and a hole transport region between the emission layer and the first electrode, wherein the emission layer consists of one host and one or more dopants, the one host consisting of a first compound selected from the group consisting of Compounds A-115, A-134, A-149, A-153, A-187, and A-213, the hole transport region comprises an emission auxiliary layer on the emission layer, a hole transport layer directly on the emission auxiliary layer, and a hole injection layer on the hole transport layer, and the emission auxiliary layer comprises a second compound selected from the group consisting of Compounds E-107, E-115, and E-154, -continued
A-115
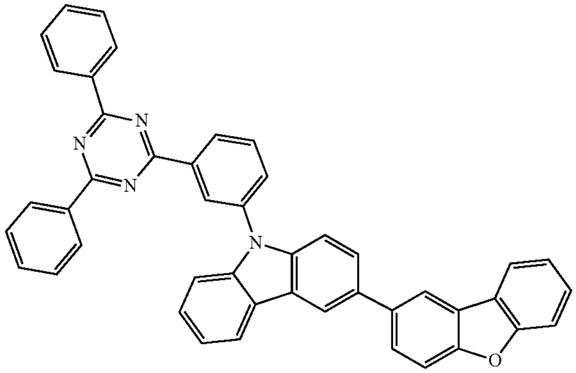
A-134
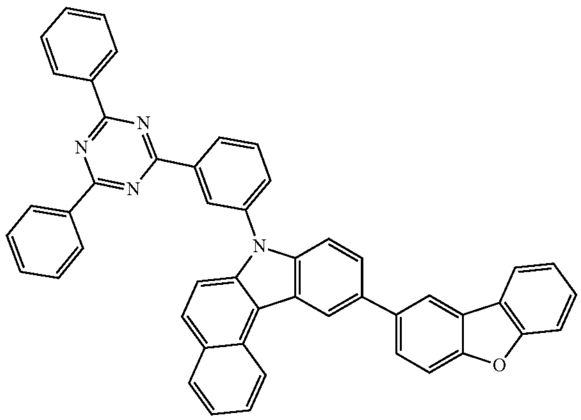
A-149
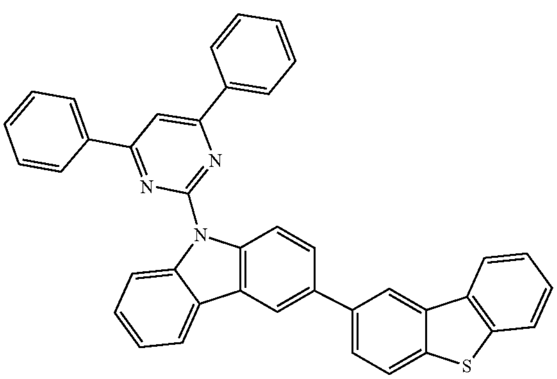
A-153
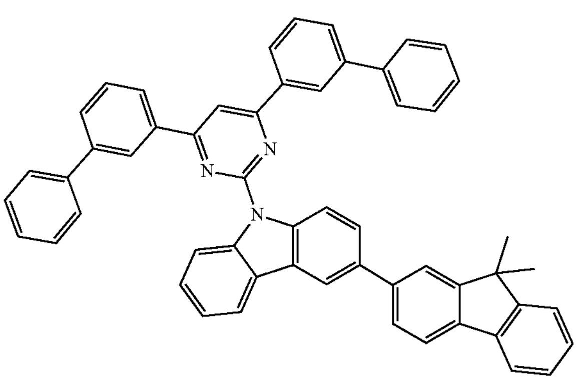
A-187
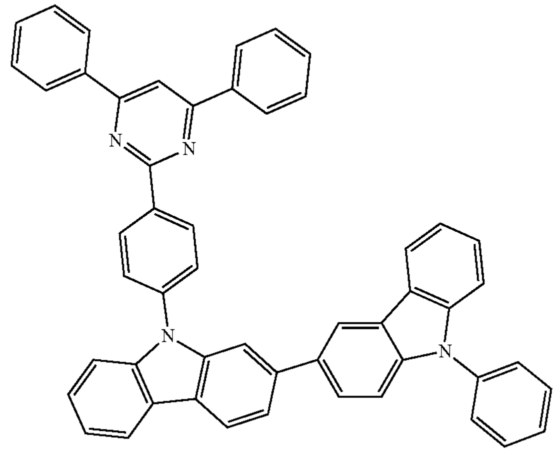
A-213
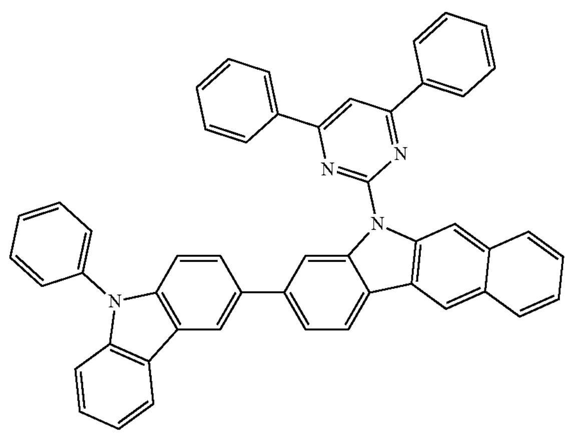
E-107
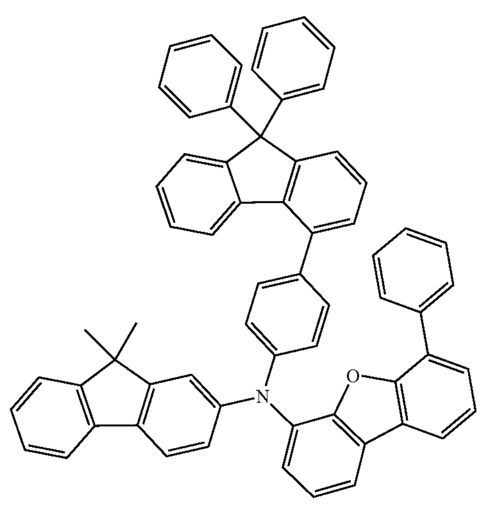

-continued
E-115
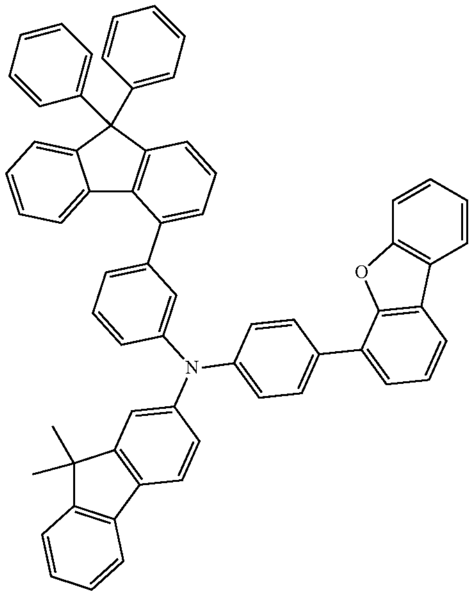
-continued
E-154
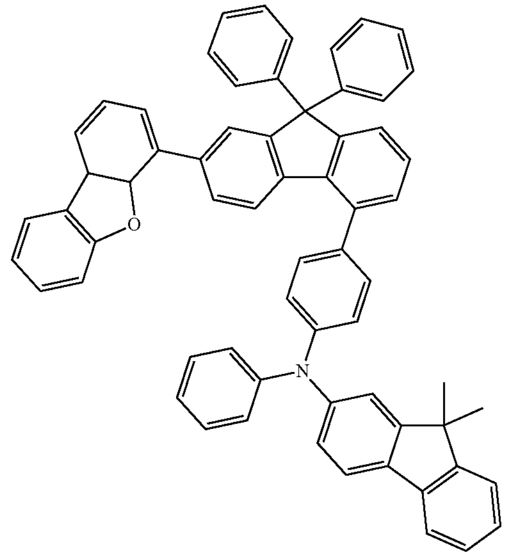
4. The organic light-emitting device of claim 3, wherein the emission auxiliary layer comprises compound E-154.
* * * * *

UNITED STATES PATENT AND TRADEMARK OFFICE

CERTIFICATE OF CORRECTION

PATENT NO. : 11,910,707 B2
APPLICATION NO. : 15/390210
DATED : February 20, 2024
INVENTOR(S) : Myeong-Suk Kim et al.

It is certified that error appears in the above-identified patent and that said Letters Patent is hereby corrected as shown below:

In the Claims

In Column 324, Lines 48-66, in Claim 1, in Compound A-172, delete

"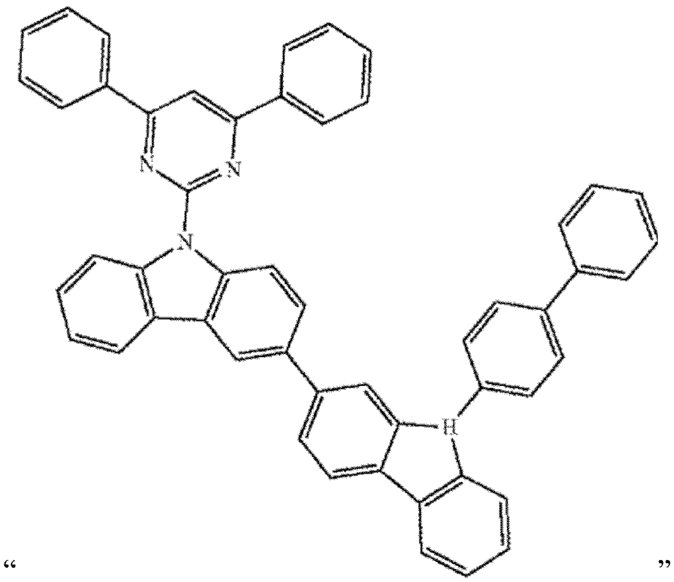

" and insert

Signed and Sealed this
Third Day of December, 2024

Katherine Kelly Vidal

Katherine Kelly Vidal
*Director of the United States Patent and Trademark Office*

-- 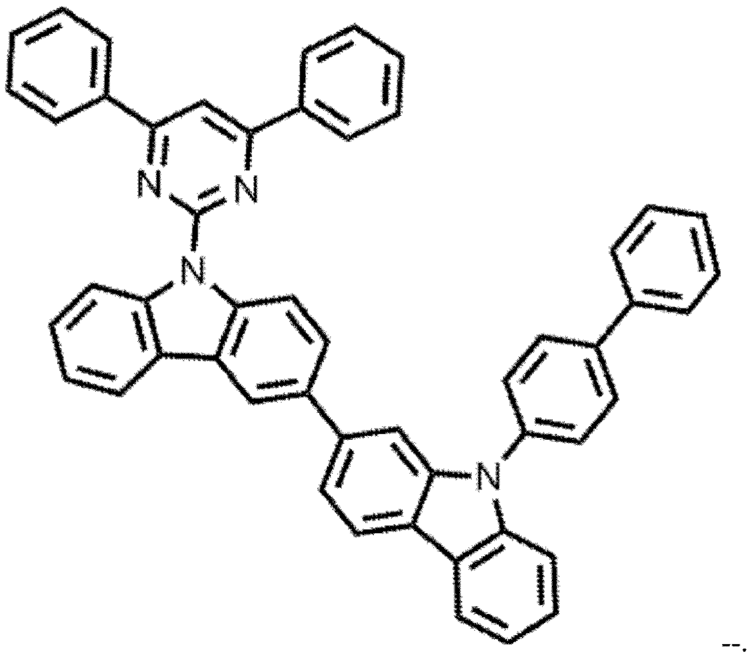 --.
In Column 430, Line 3, in Claim 2, in Compound A-159, delete
" 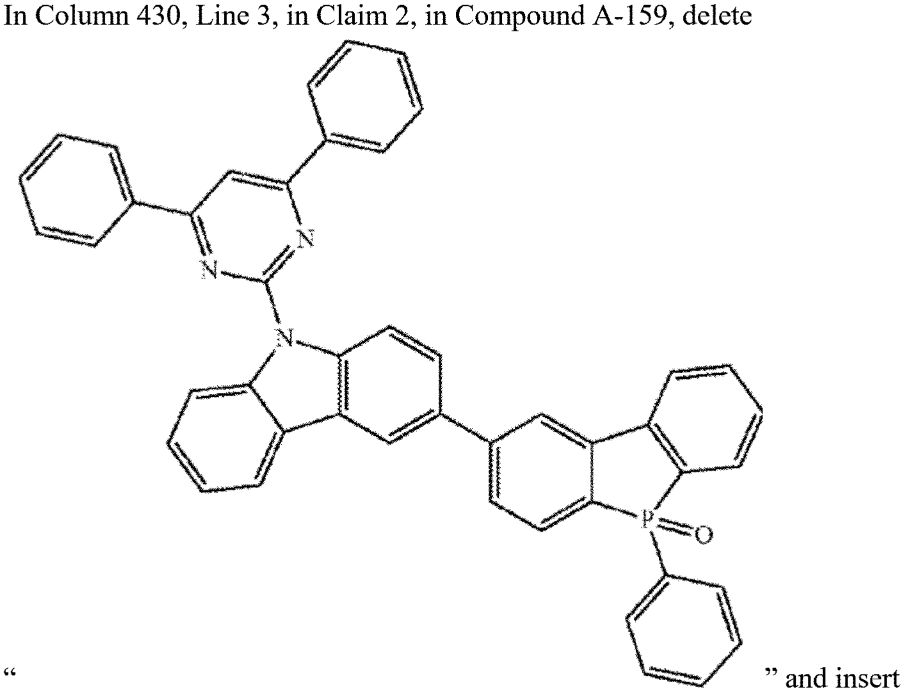 " and insert -- 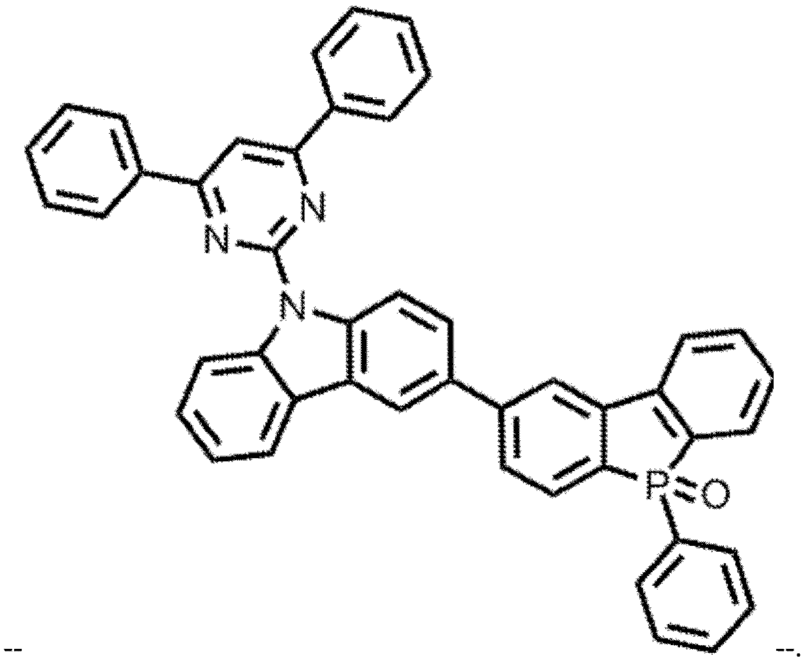 --.
In Column 436, Line 2, in Claim 2, in Compound A-171, delete
" 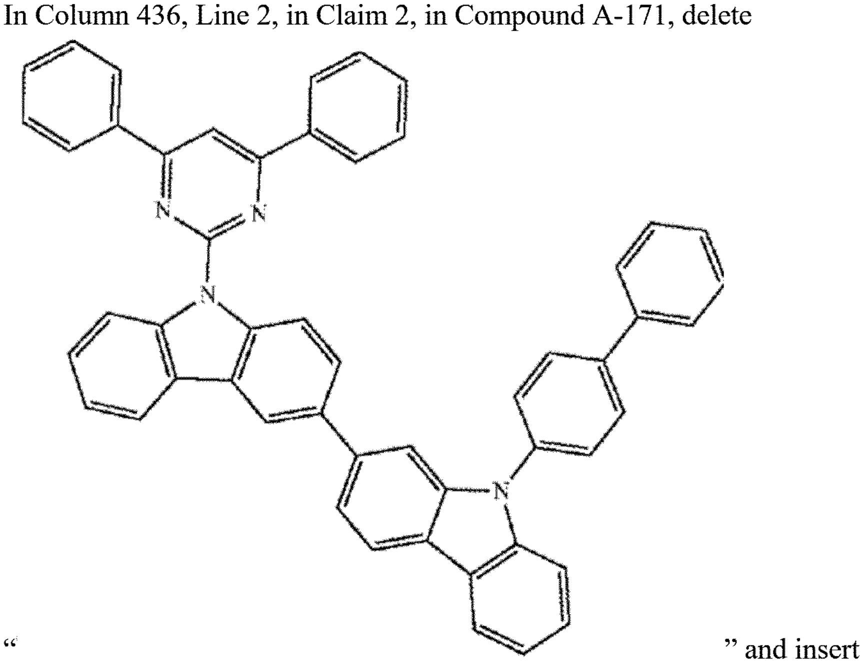 " and insert -- 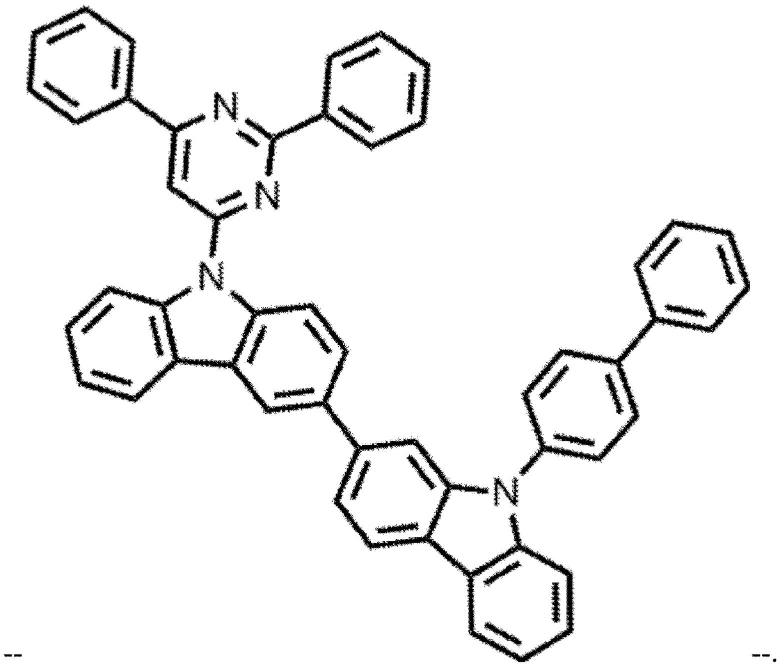 --.
In Column 481, Line 5, in Claim 2, in Compound B-136, delete
" 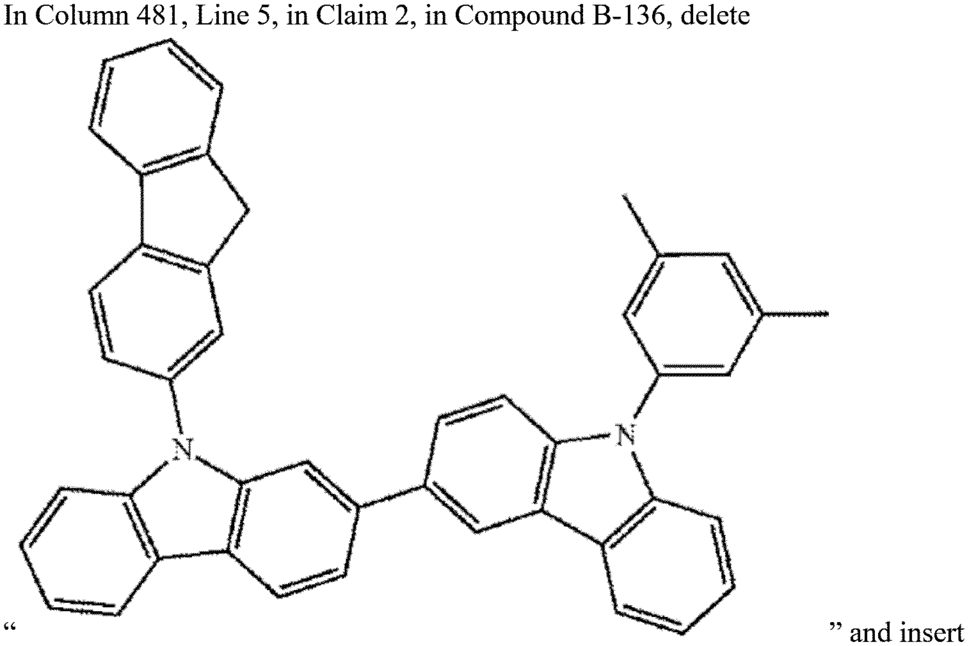 " and insert -- 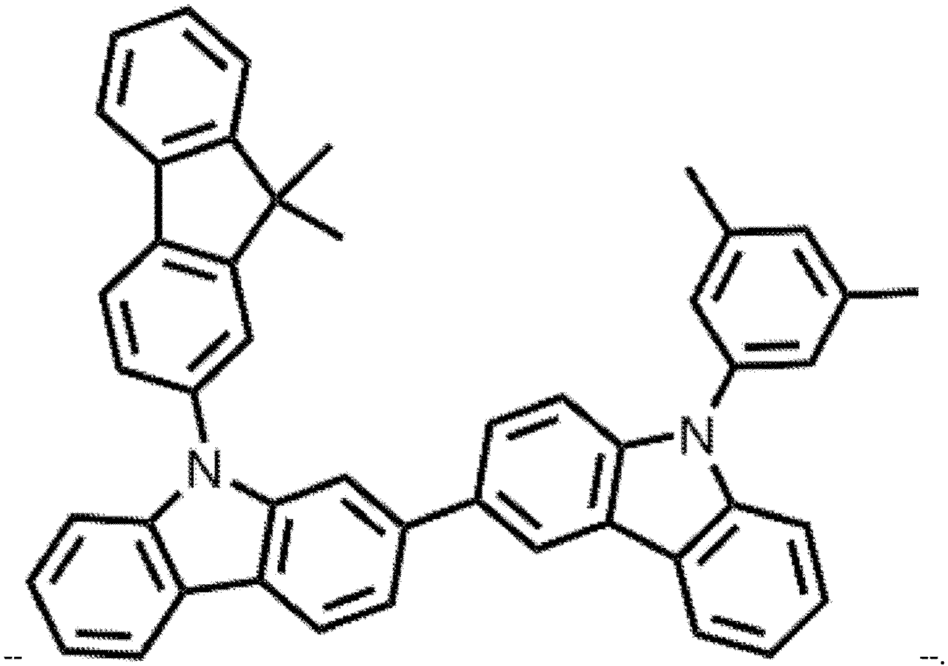 --.
In Column 516, Line 2, in Claim 2, in Compound B-204, delete
" 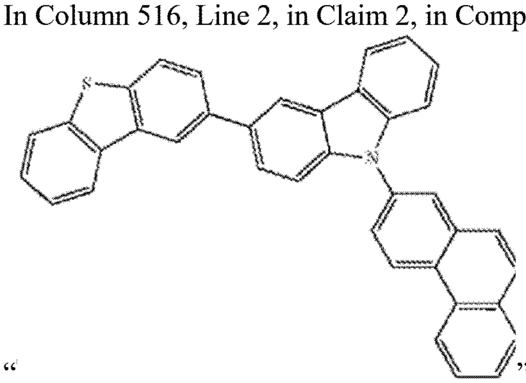 " and insert -- 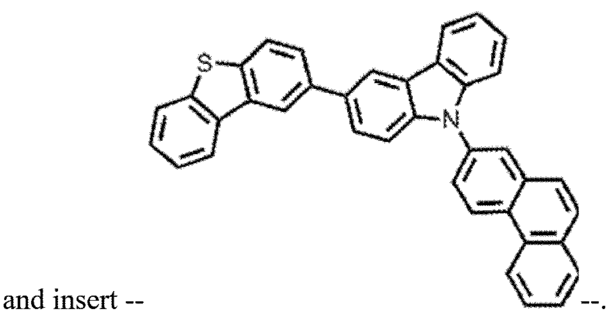 --.

In Column 531, Line 3, in Claim 2, in Compound E-130, delete
"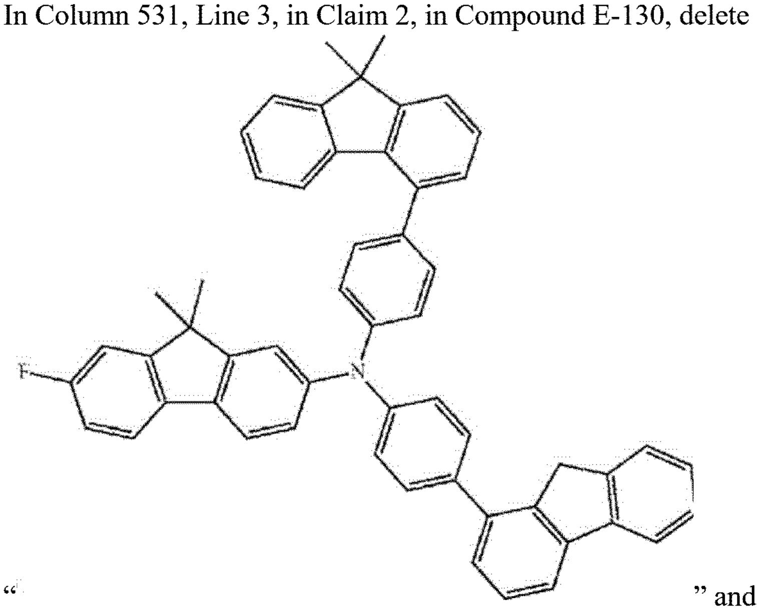" and insert
--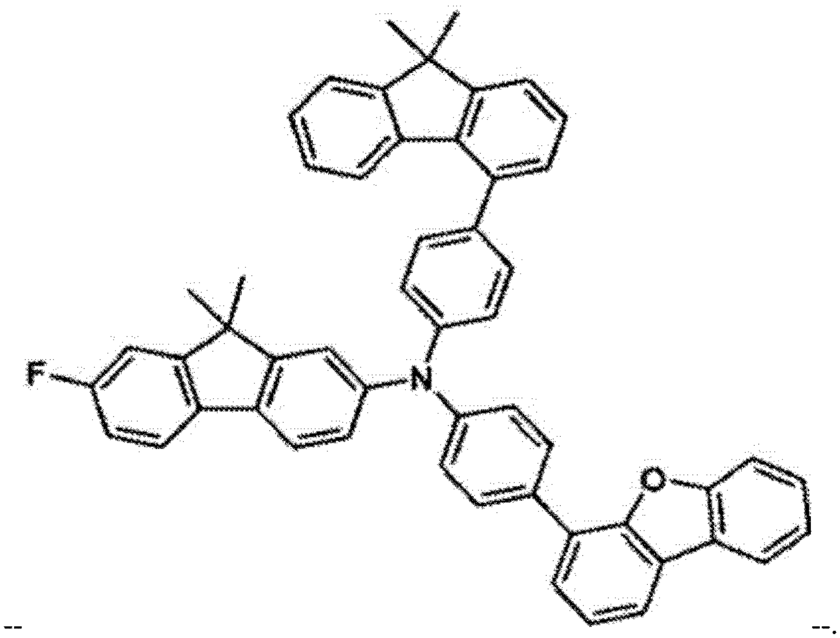--.

In Column 548, Line 4, in Claim 2, in Compound E-166, delete
"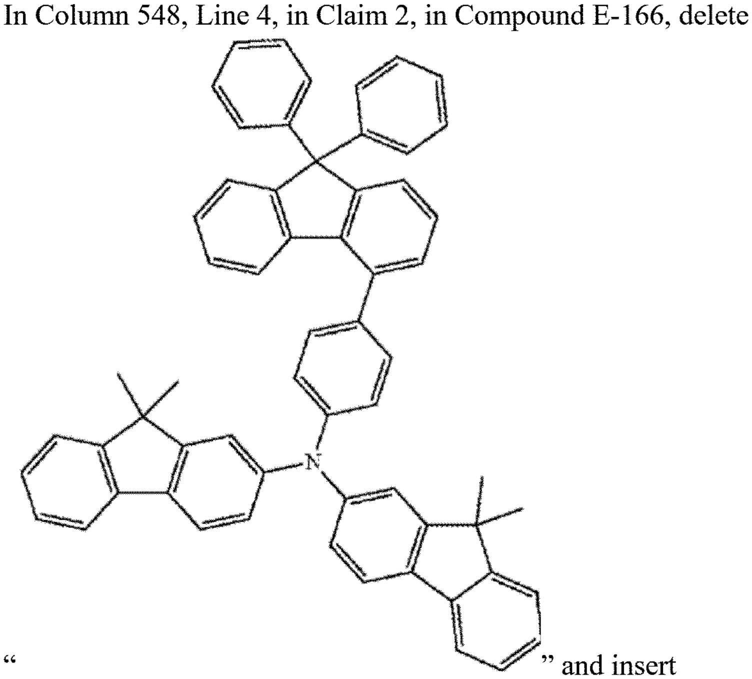" and insert
--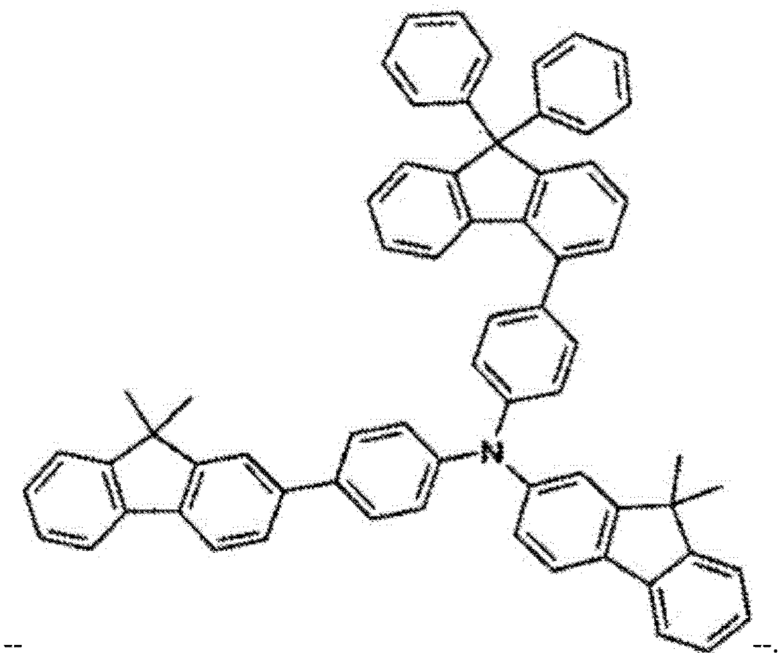--.

In Column 558, Lines 3-23, in Claim 3, in Compound E-154, delete
"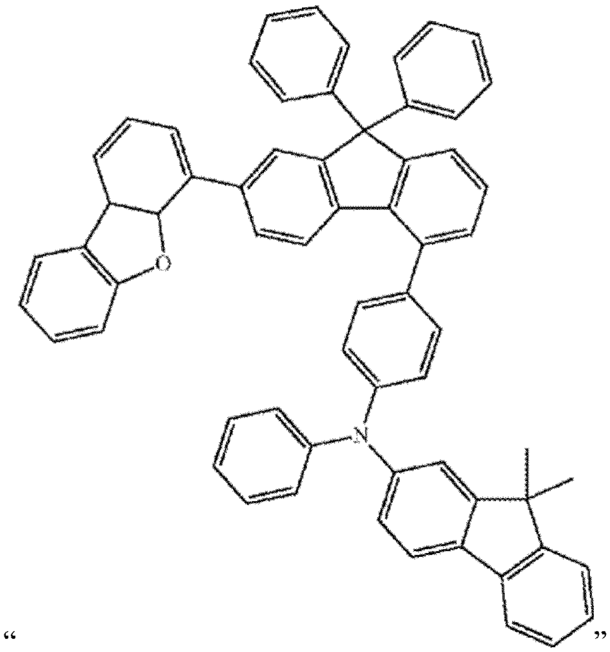" and insert
--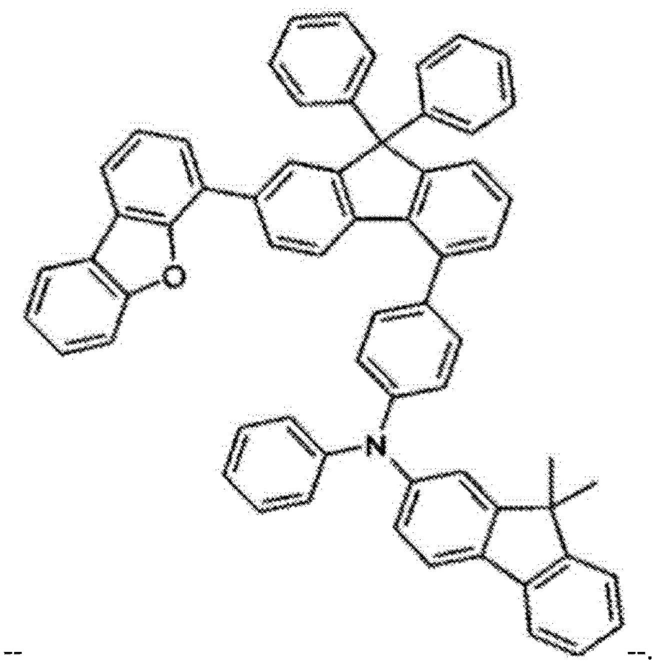--.